US009564598B2

(12) United States Patent
Ito et al.

(10) Patent No.: US 9,564,598 B2
(45) Date of Patent: Feb. 7, 2017

(54) ORGANIC LIGHT-EMITTING DEVICE

(71) Applicant: SAMSUNG DISPLAY CO., LTD., Yongin, Gyeonggi-Do (KR)

(72) Inventors: Naoyuki Ito, Yongin (KR); Seul-Ong Kim, Yongin (KR); Youn-Sun Kim, Yongin (KR); Dong-Woo Shin, Yongin (KR); Jung-Sub Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/497,267

(22) Filed: Sep. 25, 2014

(65) Prior Publication Data

US 2015/0318510 A1 Nov. 5, 2015

(30) Foreign Application Priority Data

May 2, 2014 (KR) ........................ 10-2014-0053616

(51) Int. Cl.
*H01L 51/50* (2006.01)
*H01L 27/32* (2006.01)
(Continued)

(52) U.S. Cl.
CPC ....... *H01L 51/0059* (2013.01); *H01L 27/3248* (2013.01); *H01L 51/006* (2013.01); *H01L 51/0052* (2013.01); *H01L 51/0054* (2013.01); *H01L 51/0058* (2013.01); *H01L 51/0067* (2013.01); *H01L 51/0072* (2013.01); *H01L 51/0074* (2013.01); *H01L 51/5028* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/0061* (2013.01); *H01L 51/0081* (2013.01); *H01L 51/0085* (2013.01); *H01L 51/506* (2013.01);
(Continued)

(58) Field of Classification Search
CPC ............. H01L 51/0545; H01L 51/0036; H01L 51/0541; H01L 51/5012; B82Y 10/00
See application file for complete search history.

(56) References Cited

U.S. PATENT DOCUMENTS

2007/0054151 A1 3/2007 Iwakuma et al.
2007/0099026 A1 * 5/2007 Lee .................... H01L 51/5036 428/690

(Continued)

FOREIGN PATENT DOCUMENTS

KR 10-2012-0092550 A 8/2012
KR 10-2013-0010056 A 1/2013

(Continued)

*Primary Examiner* — Allen Parker
*Assistant Examiner* — Long Le
(74) *Attorney, Agent, or Firm* — Lewis Roca Rothgerber Christie LLP

(57) ABSTRACT

An organic light-emitting device includes an anode, a cathode, and an organic layer between the anode and the cathode, wherein the organic layer includes a mixed organic layer, and the mixed organic layer includes at least two different compounds, and a triplet energy of at least one compound of the at least two different compounds is 2.2 eV or higher. The organic light-emitting device according to embodiments of the present invention may have a low driving voltage, a high efficiency, and a long lifespan.

18 Claims, 1 Drawing Sheet

(51) Int. Cl.
*H01L 51/52* (2006.01)
*H01L 51/00* (2006.01)

(52) U.S. Cl.
CPC ........ *H01L 51/5016* (2013.01); *H01L 51/5096* (2013.01); *H01L 2251/5384* (2013.01); *H01L 2251/552* (2013.01)

(56) References Cited

U.S. PATENT DOCUMENTS

| | | | | |
|---|---|---|---|---|
| 2008/0284318 | A1* | 11/2008 | Deaton | H01L 51/5016 313/504 |
| 2009/0230855 | A1* | 9/2009 | Kim | C07D 333/54 313/504 |
| 2010/0019232 | A1* | 1/2010 | Lee | H01L 51/5092 257/40 |
| 2010/0019663 | A1* | 1/2010 | Shin | C07D 209/56 313/504 |
| 2012/0126205 | A1 | 5/2012 | Kawamura et al. | |
| 2013/0001523 | A1 | 1/2013 | Chun et al. | |
| 2013/0207082 | A1 | 8/2013 | Cho et al. | |
| 2014/0001443 | A1* | 1/2014 | Lee | C07D 471/04 257/40 |
| 2015/0053933 | A1 | 2/2015 | Lee et al. | |
| 2015/0060793 | A1* | 3/2015 | Song | H01L 51/5044 257/40 |

FOREIGN PATENT DOCUMENTS

| | | | |
|---|---|---|---|
| KR | 10-2013-0093327 | A | 8/2013 |
| KR | 10-1363544 | B1 | 2/2014 |
| KR | 10-2014-0096897 | A | 8/2014 |
| KR | 10-2015-0024491 | | 3/2015 |
| WO | WO 2007/029403 | A1 | 3/2007 |
| WO | WO 2011/086941 | A1 | 7/2011 |
| WO | WO 2012/176818 | A1 | 12/2012 |

* cited by examiner

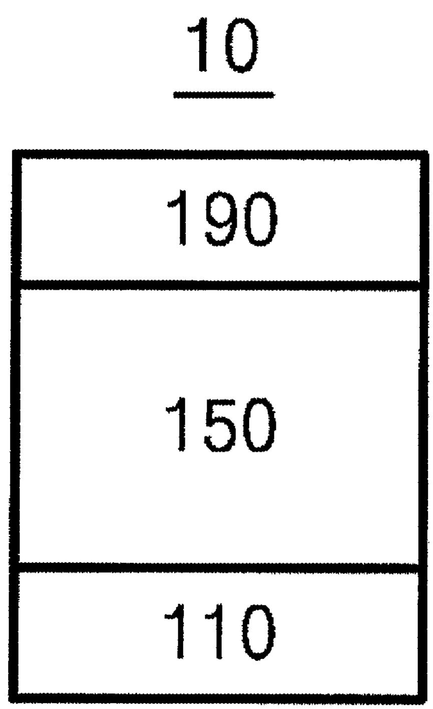
10
190
150
110

ORGANIC LIGHT-EMITTING DEVICE

CROSS-REFERENCE TO RELATED APPLICATION

This application claims priority to and the benefit of Korean Patent Application No. 10-2014-0053616, filed on May 2, 2014, in the Korean Intellectual Property Office, the disclosure of which is incorporated herein in its entirety by reference.

BACKGROUND

1. Field

One or more embodiments of the present invention relate to an organic light-emitting device.

2. Description of the Related Art

Organic light-emitting devices (OLEDs) are self-emitting devices that have advantages such as wide viewing angles, good contrast, quick response, high brightness, low driving voltage characteristics, and can provide multicolored images.

A typical organic light-emitting device has a structure including a first electrode, a hole transport region, an emission layer, an electron transport region, and a second electrode that are sequentially stacked on a substrate. Holes injected from the first electrode move to the emission layer via the hole transport region, and electrons injected from the second electrode move to the emission layer via the electron transport region. Carriers (i.e. the holes and electrons) recombine in the emission layer to generate excitons. When the excitons drop from an excited state to a ground state, light is emitted.

SUMMARY

One or more aspects of embodiments of the present invention are directed to a novel organic light-emitting device.

Additional aspects will be set forth in part in the description which follows and, in part, will be apparent from the description, or may be learned by practice of the presented embodiments.

According to one or more embodiments of the present invention, an organic light-emitting device includes an anode, a cathode, and an organic layer that includes an emission layer and is positioned between the anode and the cathode. The organic layer further includes i) a hole transport region between the anode and the emission layer and including at least one selected from a hole injection layer, a hole transport layer, a buffer layer, and an electron blocking layer; and ii) an electron transport region between the emission layer and the cathode and including at least one selected from a hole blocking layer, an electron transport layer, and an electron injection layer;

In one embodiment, a mixed organic layer is positioned between the emission layer and the electron transport region. The mixed organic layer includes at least two different compounds, and at least one compound selected from the at least two different compounds has a triplet energy of 2.2 eV or higher.

BRIEF DESCRIPTION OF THE DRAWINGS

These and/or other aspects will become apparent and more readily appreciated from the following description of the embodiments, taken in conjunction with the accompanying drawings in which:

The drawing is a schematic view of a structure of an organic light-emitting device according to an embodiment of the present invention.

DETAILED DESCRIPTION

Reference will now be made to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one selected from," when preceding a list of elements, modify the entire list of elements and do not modify the individual elements of the list. Further, the use of "may" when describing embodiments of the present invention refers to "one or more embodiments of the present invention."

According to an embodiment of the present invention, an organic light-emitting device includes an anode, a cathode, and an organic layer between the anode and the cathode and including an emission layer (EML).

The organic layer further includes i) a hole transport region between the anode and the EML and including at least one selected from a hole injection layer (HIL), a hole transport layer (HTL), a buffer layer, and an electron blocking layer (EBL); and ii) an electron transport region between the EML and the cathode and including at least one selected from a hole blocking layer (HBL), an electron transport layer (ETL), and an electron injection layer (EIL).

In one embodiment, a mixed organic layer is positioned between the EML and the electron transport region. The mixed organic layer includes at least two different compounds, and at least one compound selected from the at least two different compounds has a triplet energy of 2.2 eV or higher.

Deterioration in performance of an OLED device, such as, for example, increase in driving voltage, may be caused by accumulation of holes due to introduction of an additional layer between the EML and the ETL. In addition, recombination of the holes and electrons may predominantly occur at the side of the EML closer to the anode, where the electrons are accumulated, and as a result, light-emitting lifespan of the organic light-emitting device may deteriorate.

In general, a compound included in the organic layer of an organic light-emitting device includes an electron withdrawing group (EWG) capable of electron transfer and a hydrocarbon-based ring on a side of an anode from the EML. In contrast, the organic light-emitting device according to an embodiment of the present invention includes a mixed organic layer including at least two different compounds, and at least one compound selected from the at least two different compounds has a triplet energy of 2.2 eV or greater.

A triplet energy of the at least one compound may be 2.2 eV or greater, for example, from about 2.2 eV to about 4.0 eV, or from about 2.2 eV to about 3.8 eV. When the triplet energy of the at least one compound is within any of these ranges, the organic light-emitting device according to an embodiment of the present invention may have a low driving voltage, a high efficiency, and a long lifespan.

In one embodiment, the EML may be a phosphorescent EML.

In one embodiment, the EML may be a fluorescent EML.

In one embodiment, the mixed organic layer contacts the EML, and the triplet energy of the at least one compound in the mixed organic layer may be greater than a triplet energy of a dopant of the EML.

In one embodiment, the at least one compound may include an electron-transporting material or a hole-transporting material.

In one embodiment, the at least two different compounds include a hole-transporting compound and an electron-transporting compound, respectively, and a weight ratio of the hole-transporting compound to the electron-transporting compound in the mixed organic layer may be in the range of about 0.1:1 to about 10:1. When the weight ratio of the hole-transporting compound to the electron-transporting compound is within this range, the organic light-emitting device may have a low driving voltage, a high efficiency, and a long lifespan.

In one embodiment, the at least two different compounds may include a hole-transporting compound and an electron-transporting compound, respectively, and an electron affinity (EA1) of the hole-transporting compound may be less than an electron affinity (EA2) of the electron-transporting compound (EA1<EA2).

When the electron affinity (EA1) of the hole-transporting compound is less than the electron affinity (EA2) of the electron-transporting compound, the electrons injected from the anode and transported to the cathode may mainly pass through an electron-transporting material having a relatively large electron affinity, with some of the electrons being blocked by the hole-transporting material, which is additionally included in the cathode.

In an organic light-emitting device, electrons function as main carriers, and thus electron leakage may occur. However, when a hole-transporting material that blocks electrons is introduced between the EML and the ETL, the hole-transporting material may block some of the electrons in the mixed organic layer, thus contributing to balancing out the charges in the organic light-emitting device.

In one embodiment, the at least two different compounds may include at least two different.

In one embodiment, the EML may be a phosphorescent EML and may include an Ir, Pt, Cu, or Os-complex as a dopant.

In one embodiment, a thickness of the mixed organic layer may be about 5 Å to about 400 Å. For example, a thickness of the mixed organic layer may be about 5 Å to about 40 Å.

According to an embodiment of the present invention, the triplet energy of a mixed organic layer material responsible for the blocking function of the mixed organic layer is mainly determined by a backbone structure of the mixed organic layer material. When the mixed organic layer is adjacent to the triplet excitons generated in the EML, the triplet energy is transferred to whichever structure in each part of the backbone of the mixed organic layer material has the lowest triplet energy. Thus, in order to confine the generated excitons in the EML, the triplet energy of the mixed organic layer material needs to be high, and may be about 2.2 eV or greater.

An example of the mixed organic layer material having a backbone structure with a triplet energy of about 2.2 eV or greater may be benzene (3.66 ev), phenathrene (2.70 ev), naphthalene (2.63 ev), chrysene (2.48 ev), fluorene (2.94 ev), triphenylene (2.90 ev), fluoranthene (2.30 ev), carbazole (3.18 ev), dibenzofuran (2.97 ev), dibenzothiophene (2.99 ev), phenanthroline (2.75 ev), or benzoimidazole (3.31 ev).

Thus, the mixed organic layer material according to an embodiment of the present invention may be a compound with a high triplet energy or a compound with a high triplet energy backbone structure. A high triplet energy (T1) backbone structure may be one of structures below, but is not limited thereto:

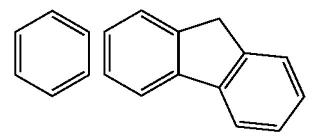

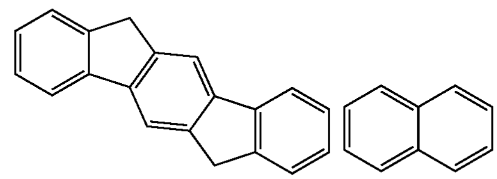

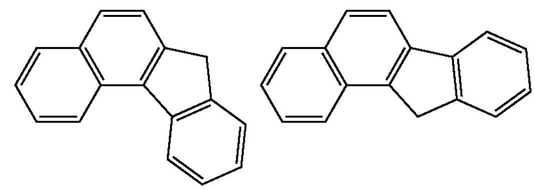

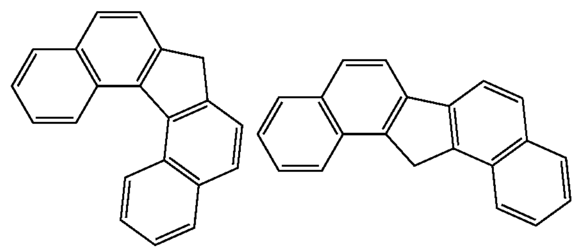

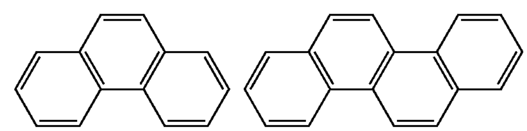

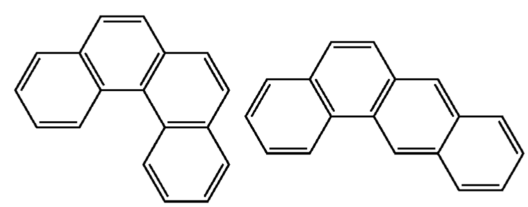

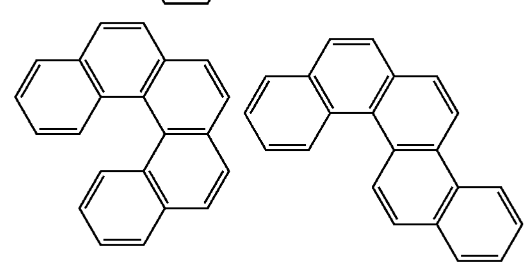

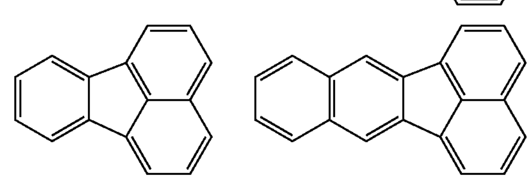

-continued
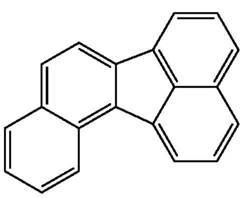
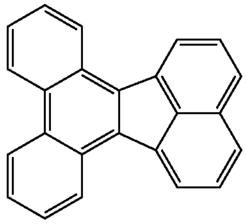
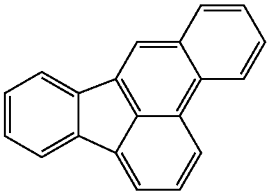
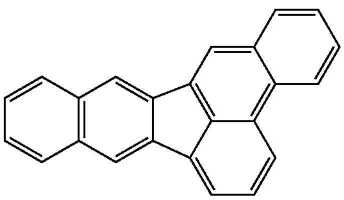
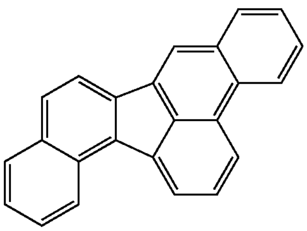
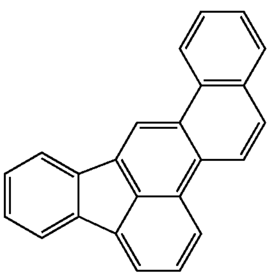
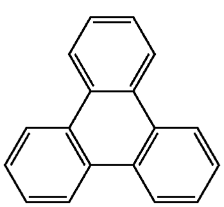
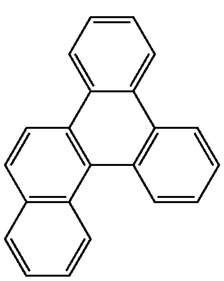
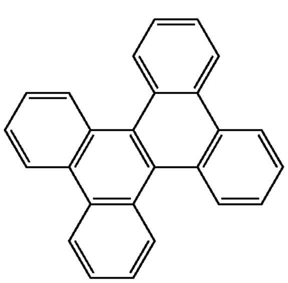
-continued
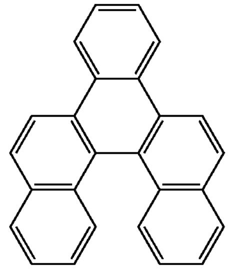
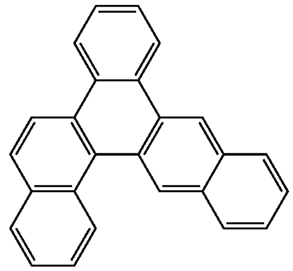
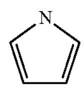
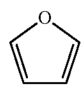
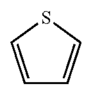
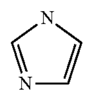
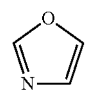
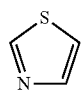
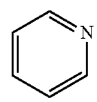
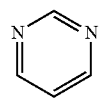
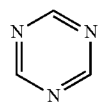
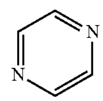
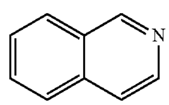
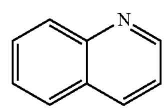
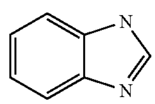
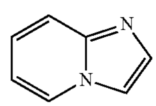
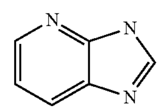
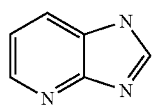
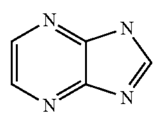
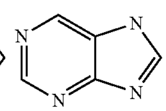
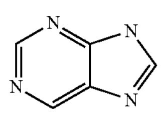
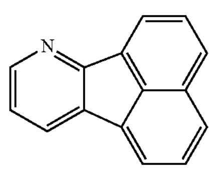
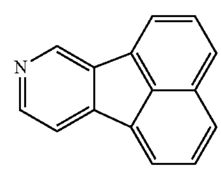
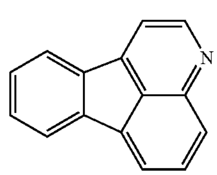
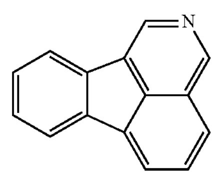
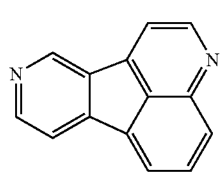
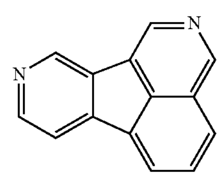

-continued
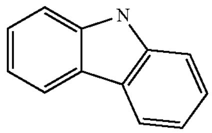
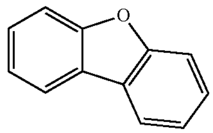
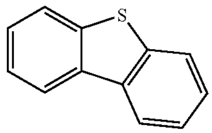
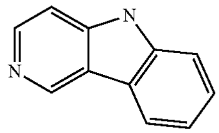
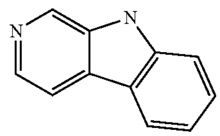
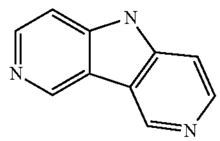
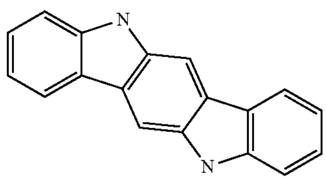
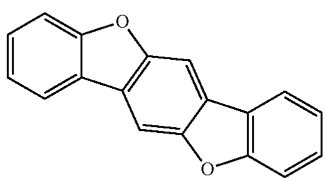
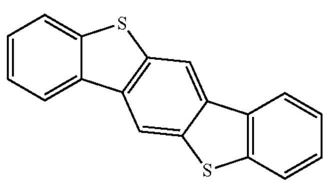
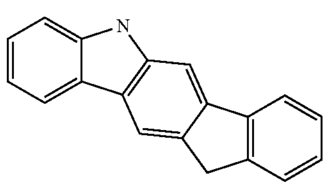
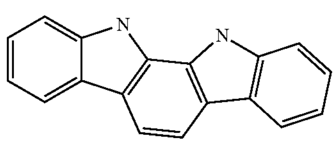
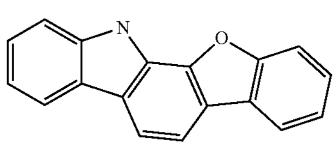
-continued
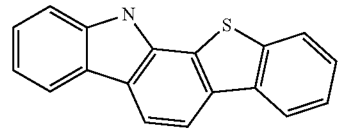
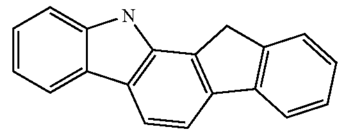
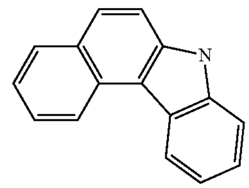
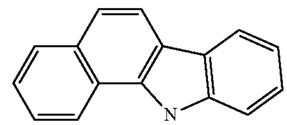
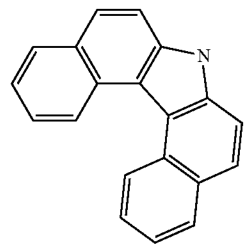
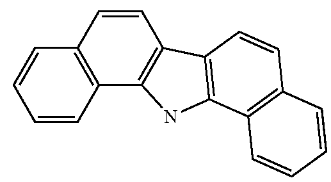
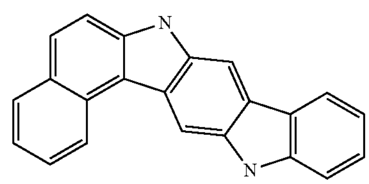
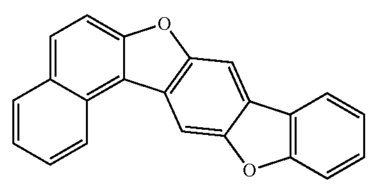
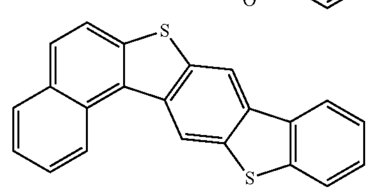
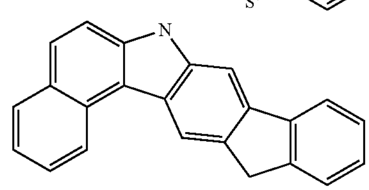
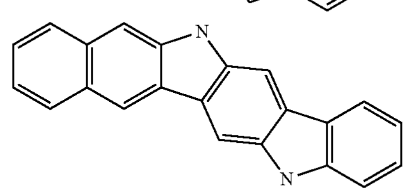

-continued
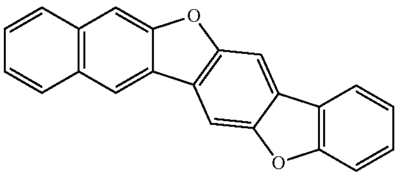
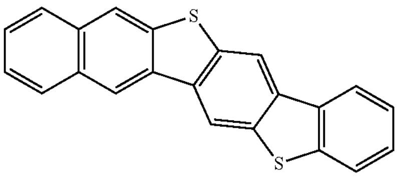
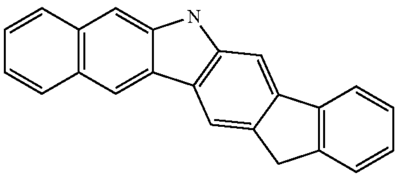
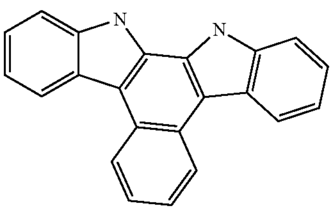
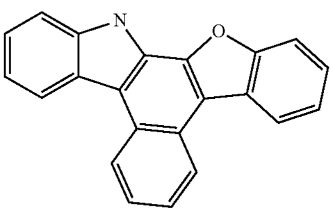
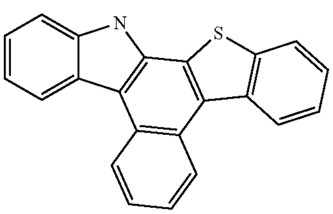
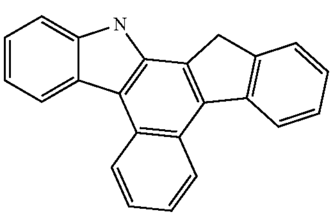
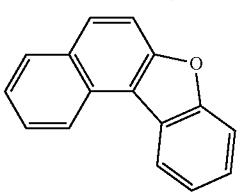
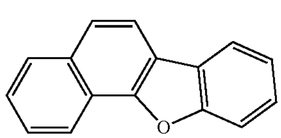
-continued
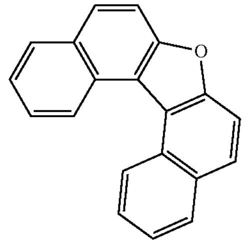
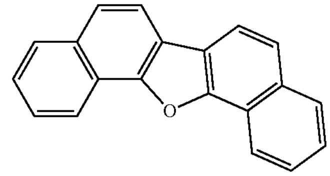
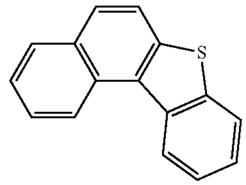
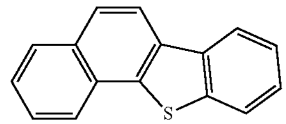
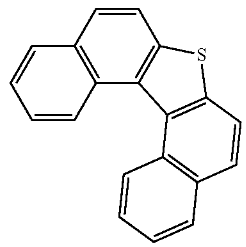
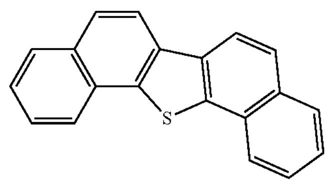
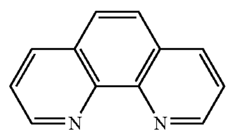
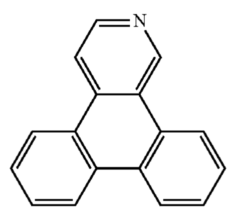
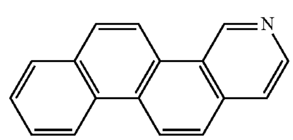
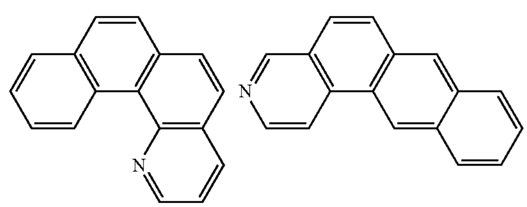
In one embodiment, the mixed organic layer may include at least two different compounds selected from compounds below:

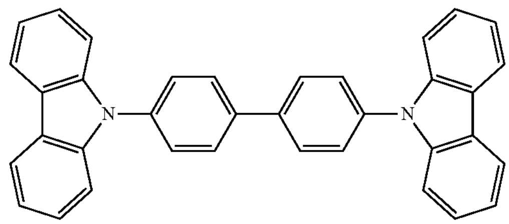
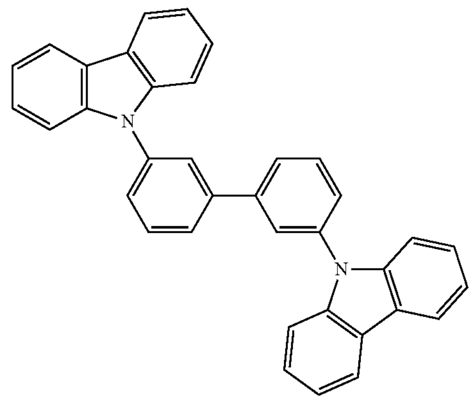
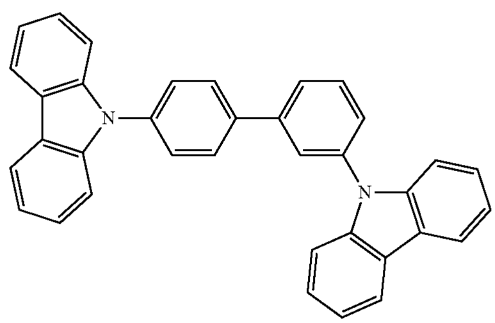
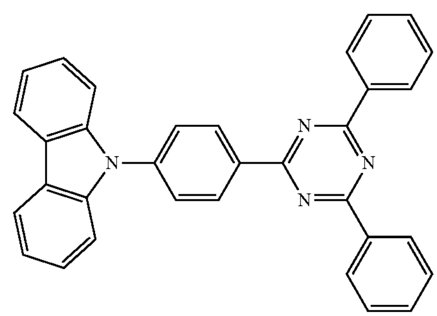
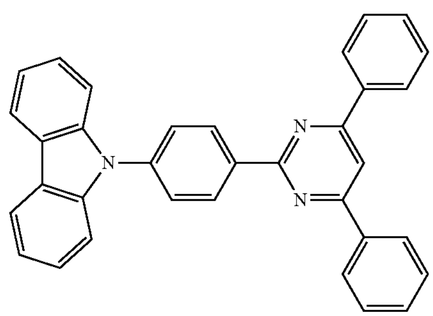
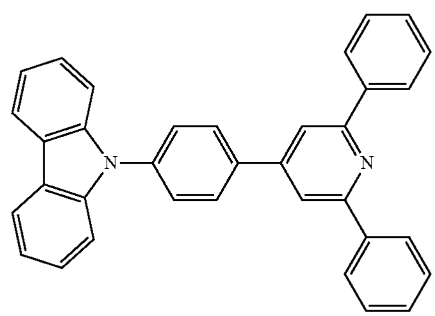
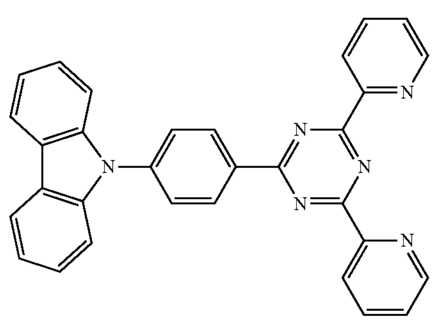
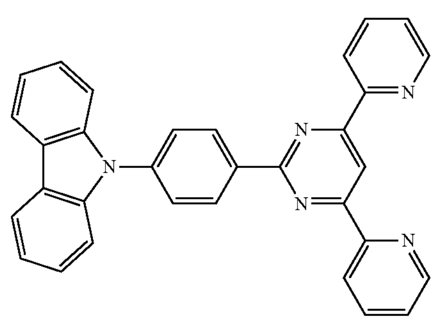
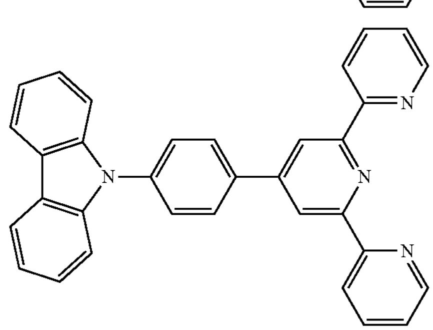
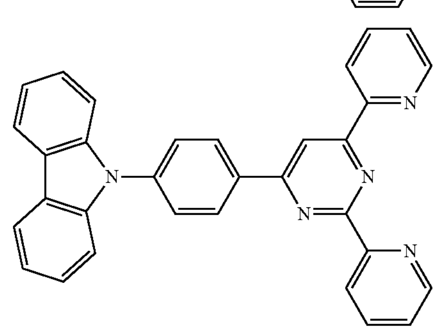

-continued
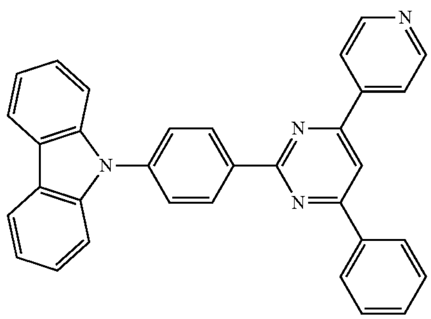
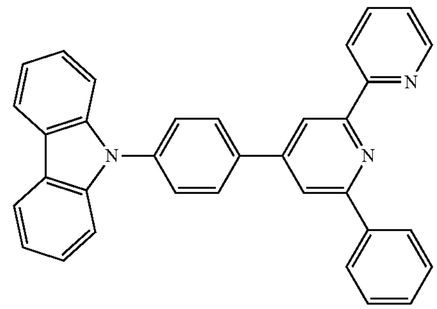
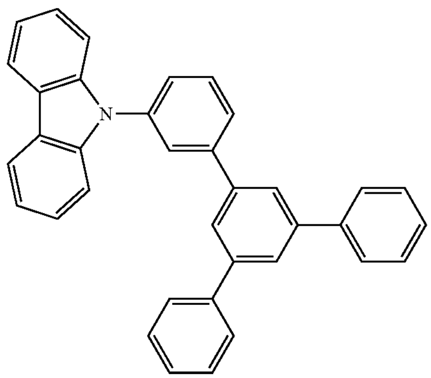
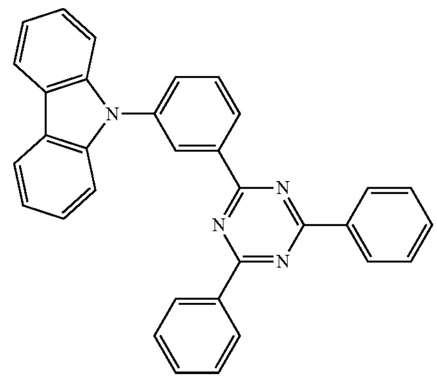
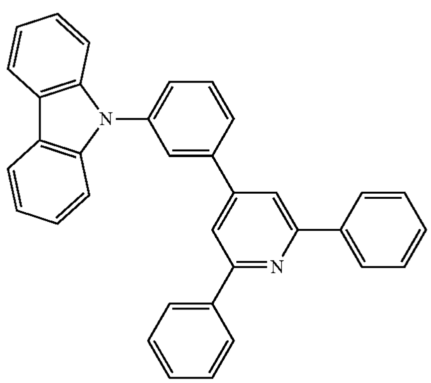
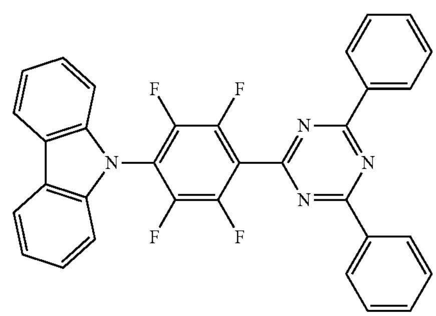
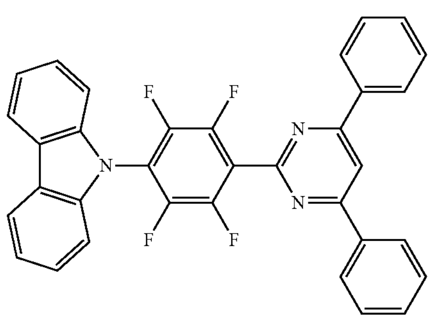
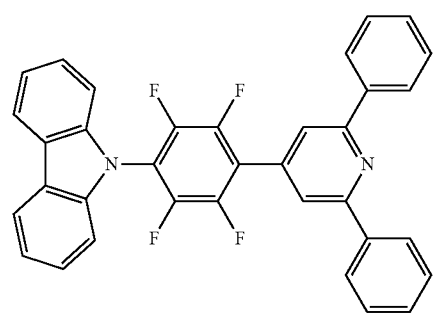
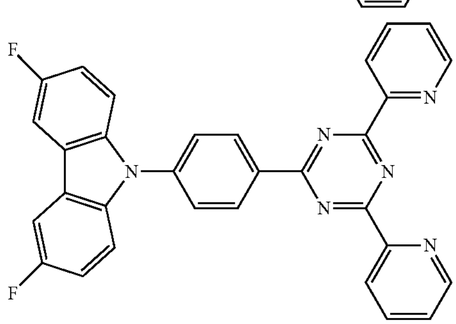
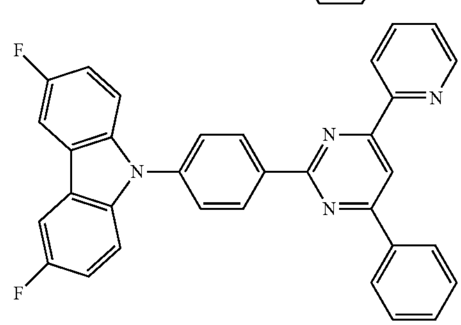

-continued
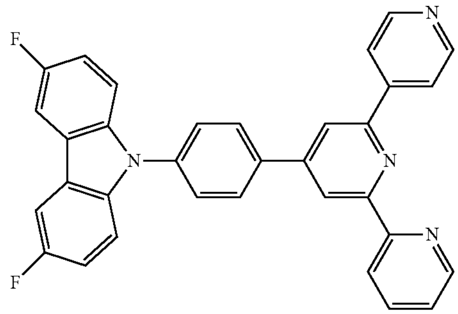
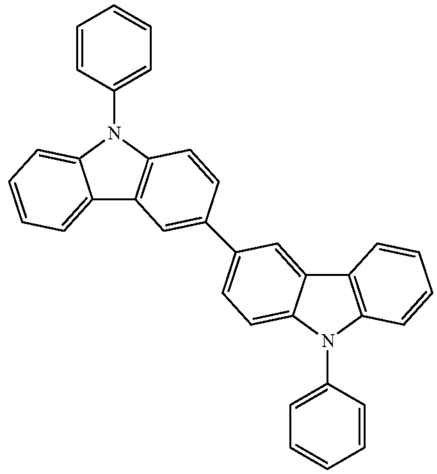
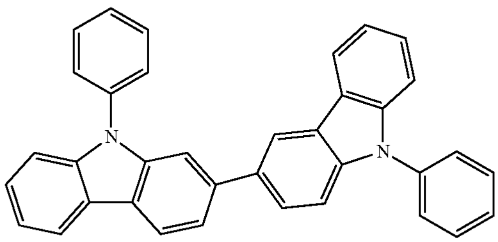
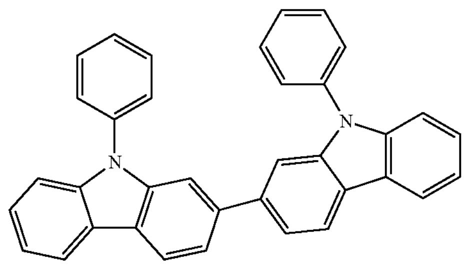
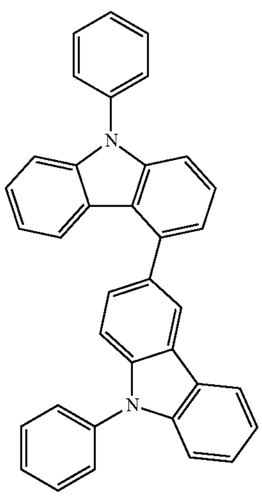
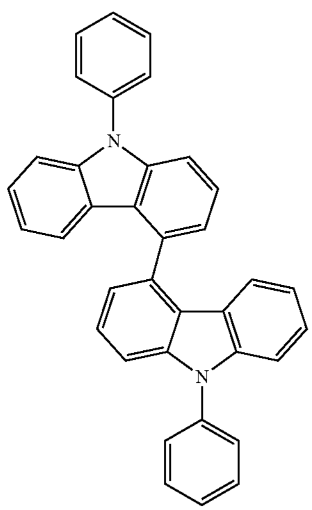
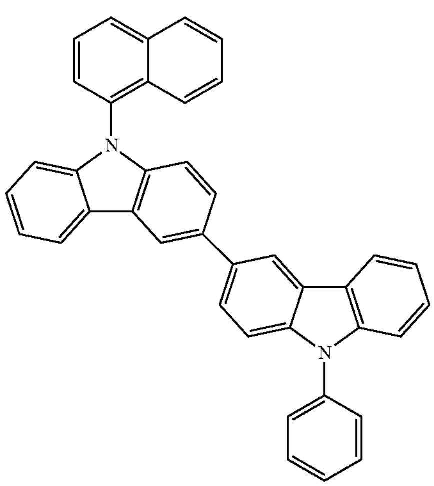
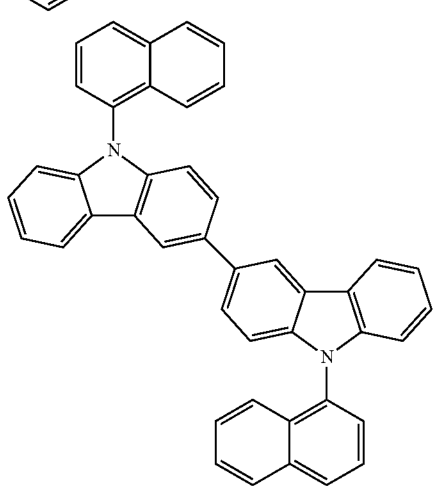

-continued
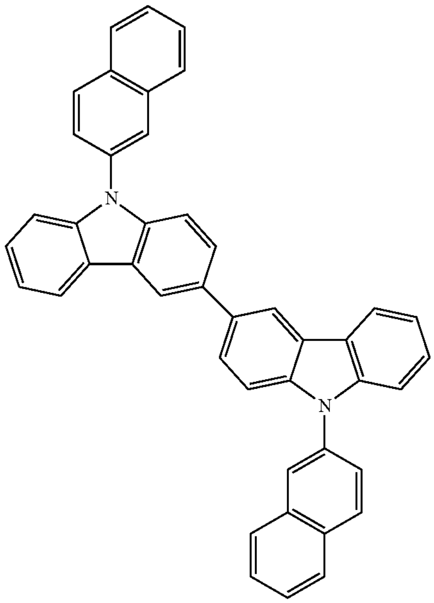
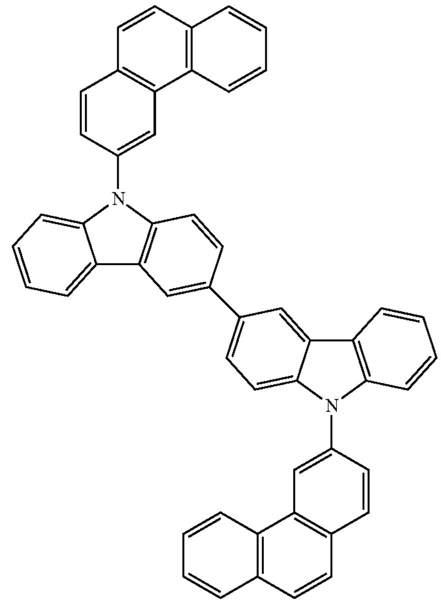
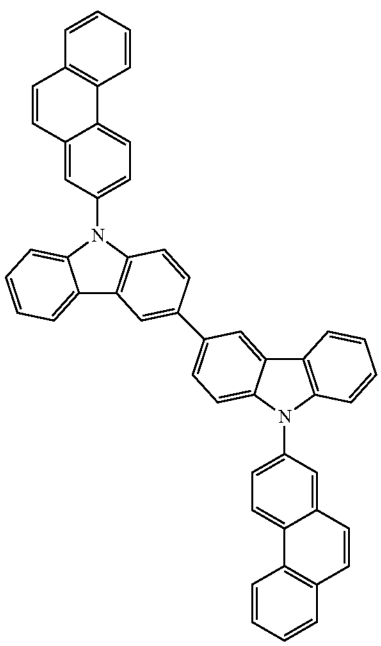
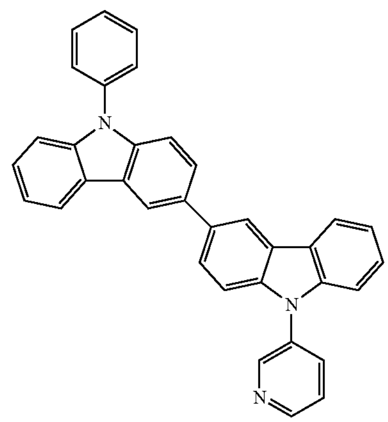
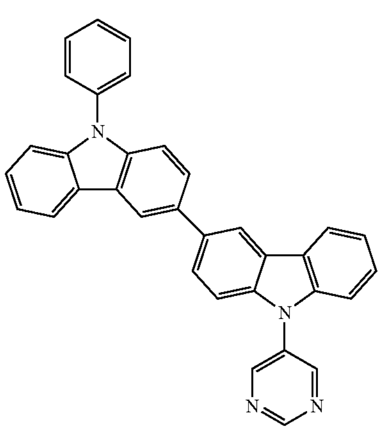
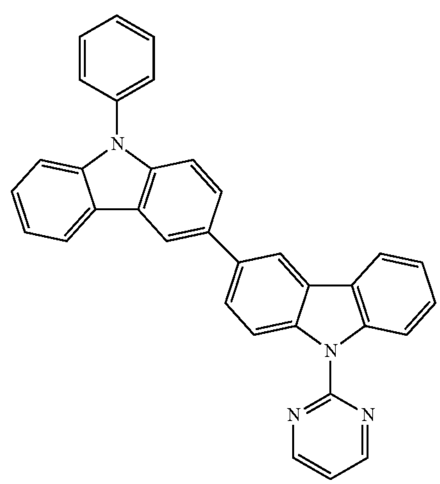

-continued
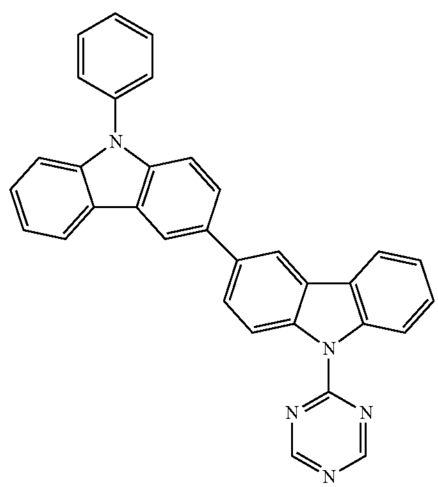
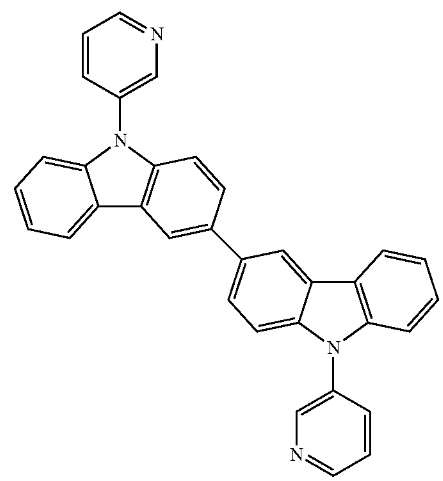
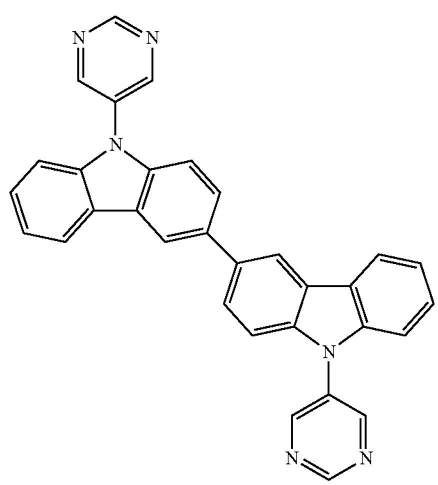
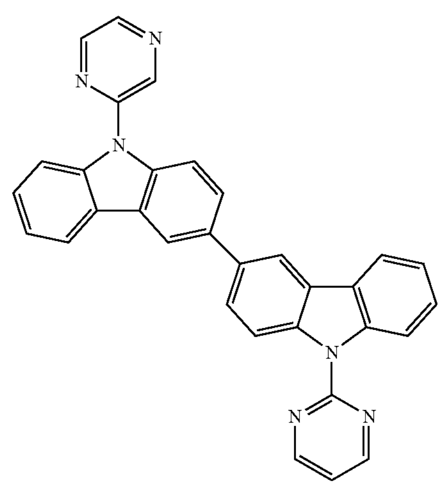
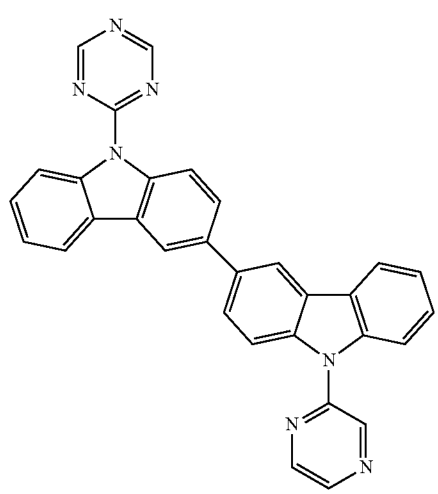
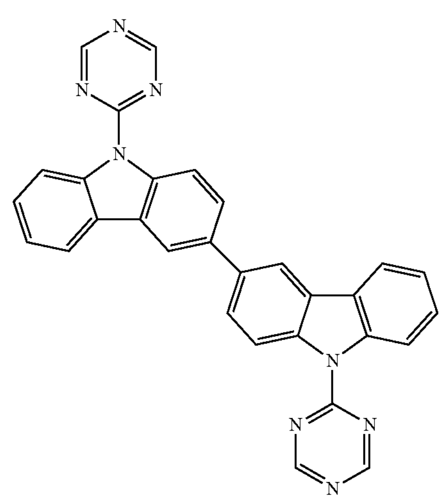

-continued
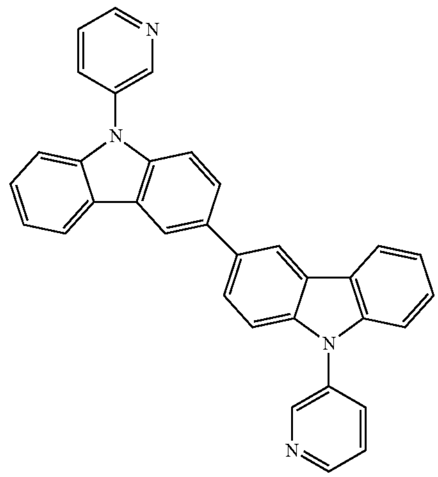
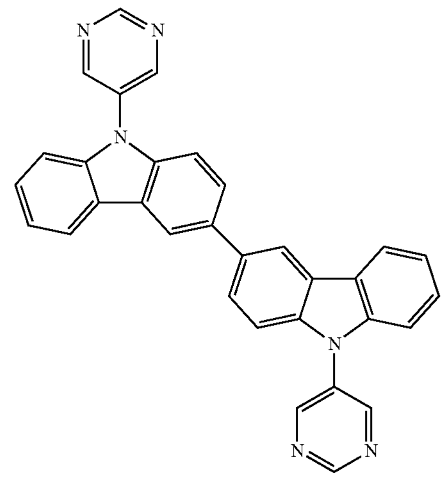
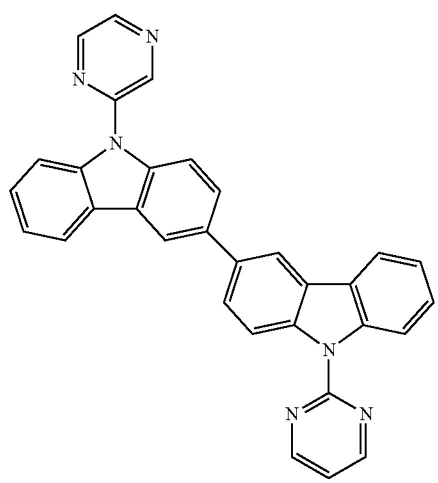
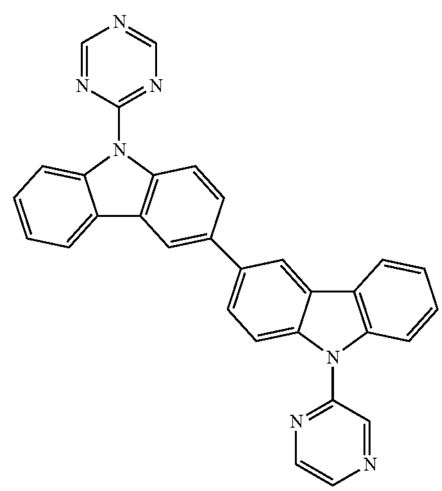
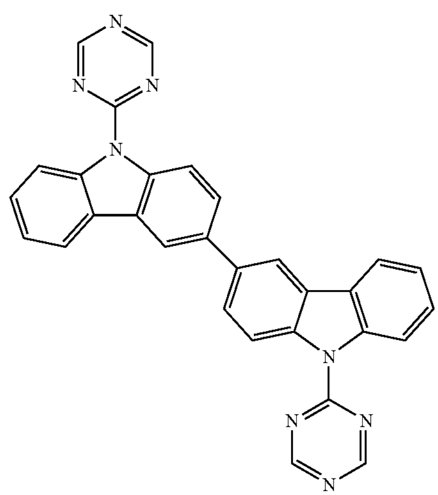
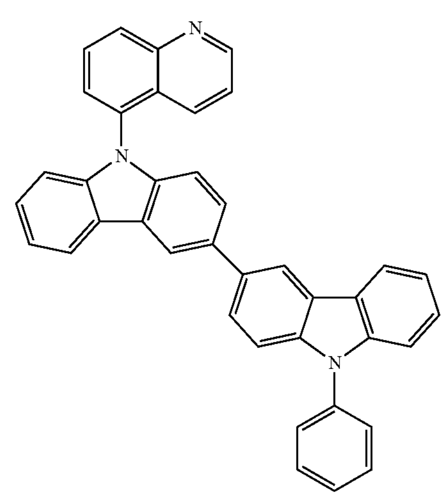

-continued
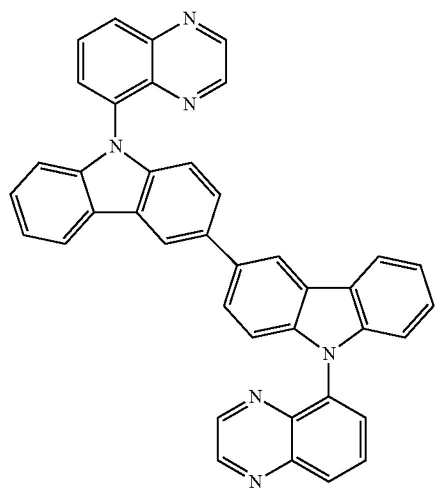
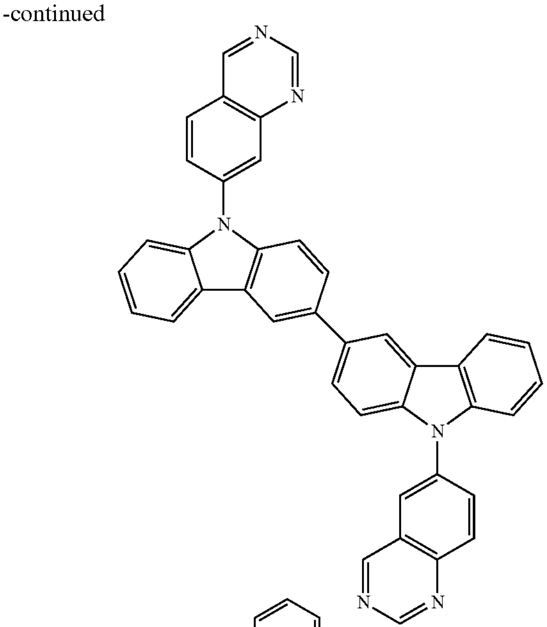
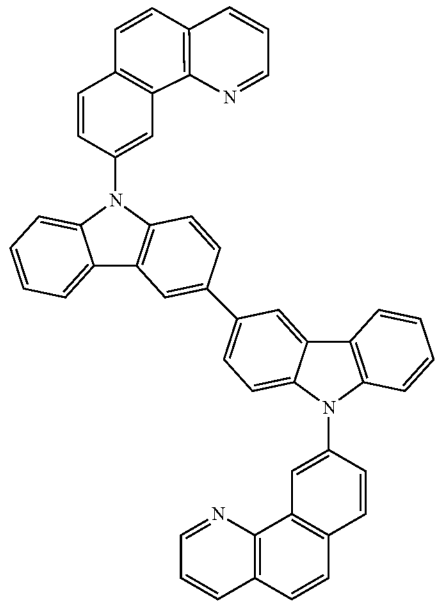
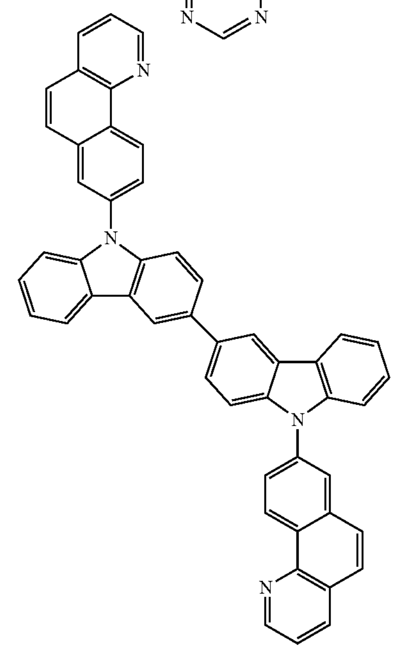
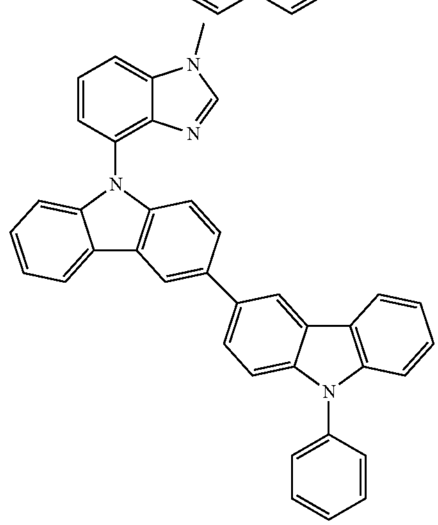
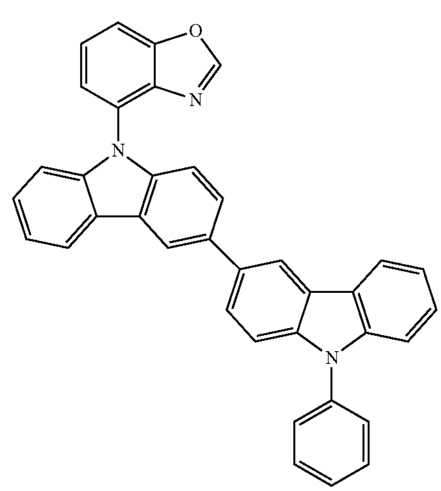

-continued
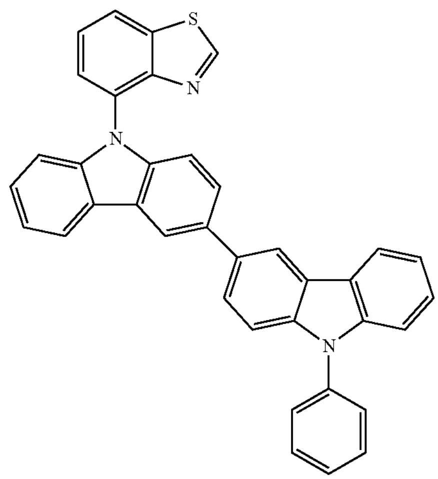
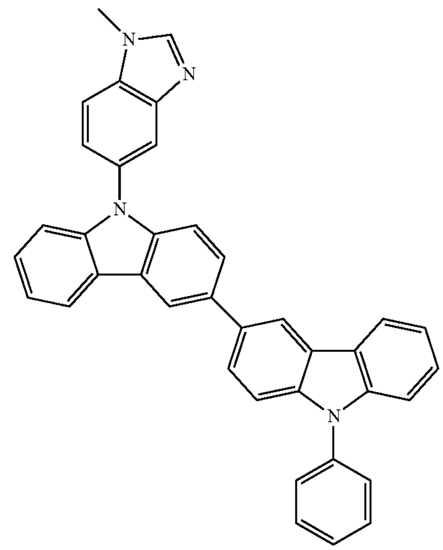
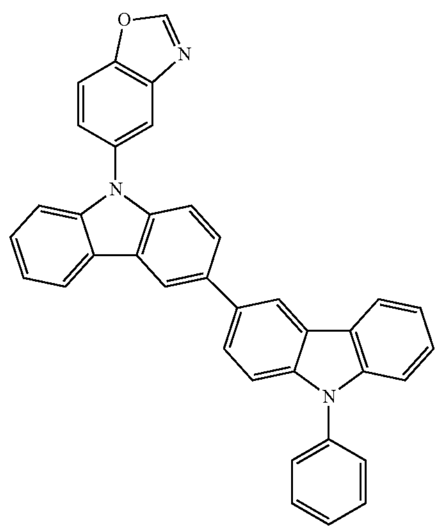
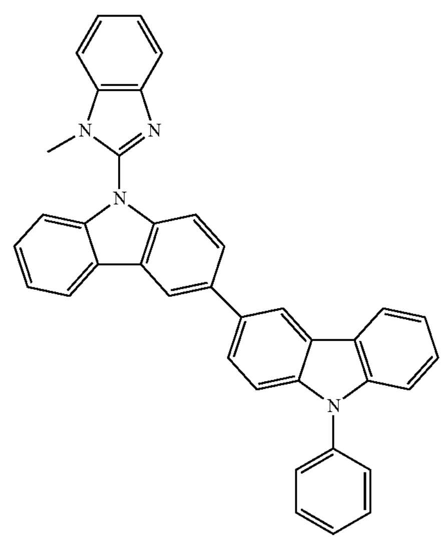
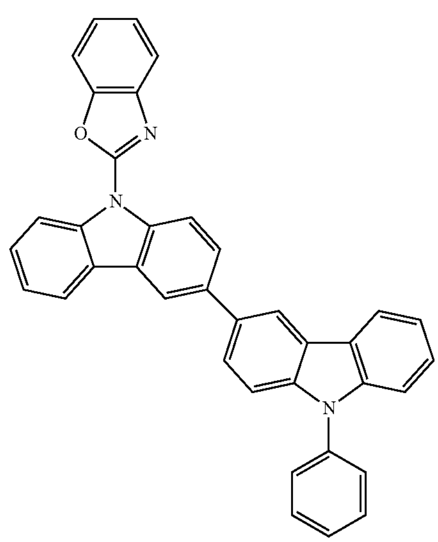
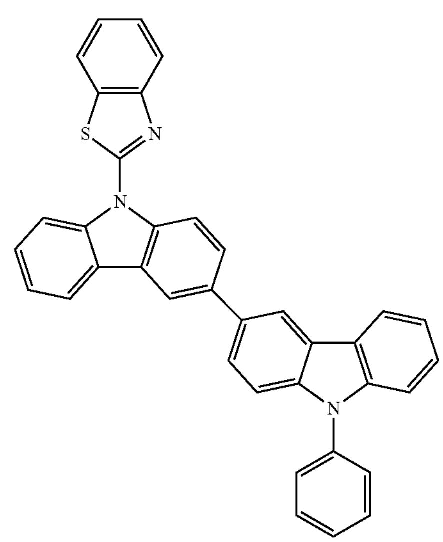

-continued
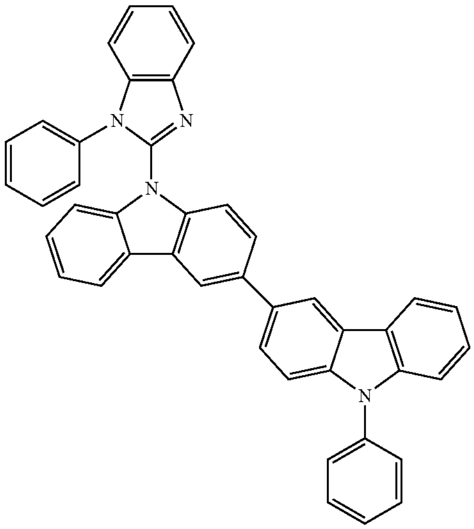
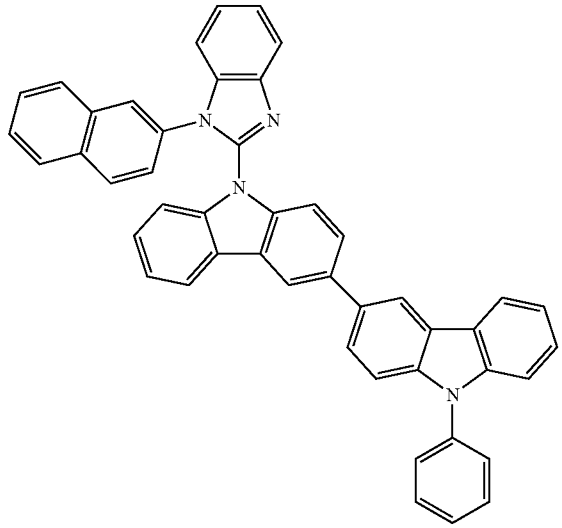
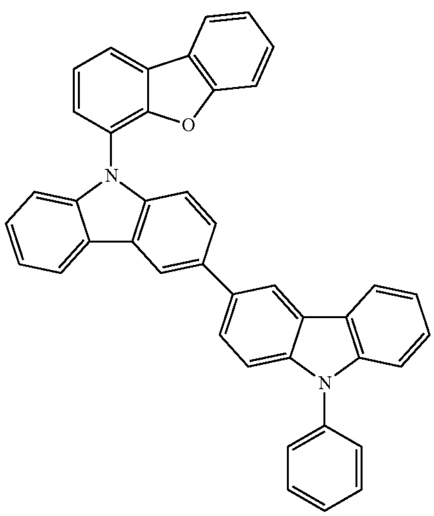
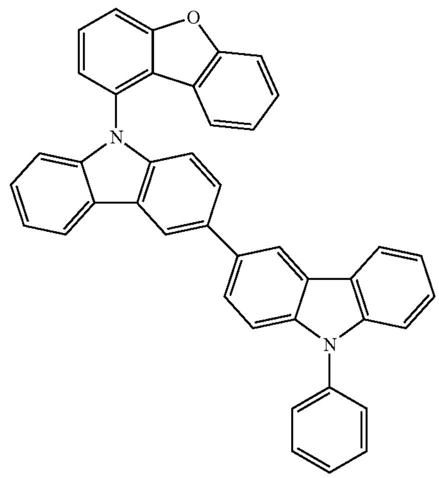
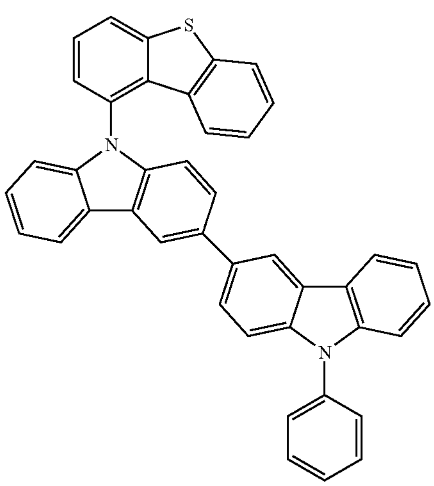
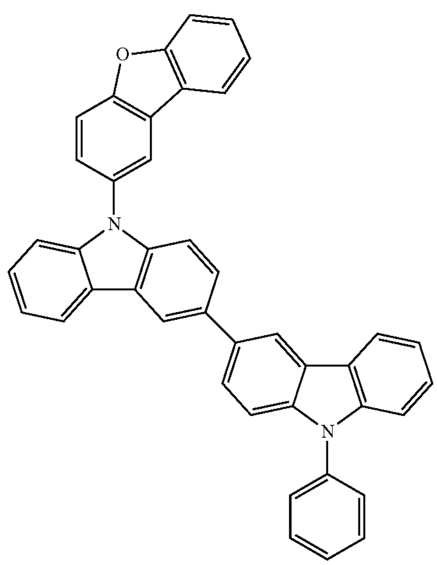

-continued
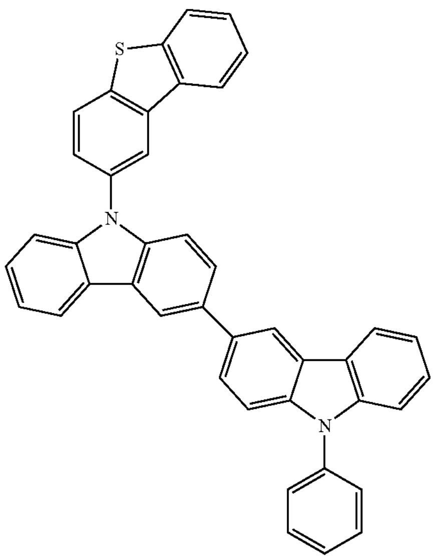
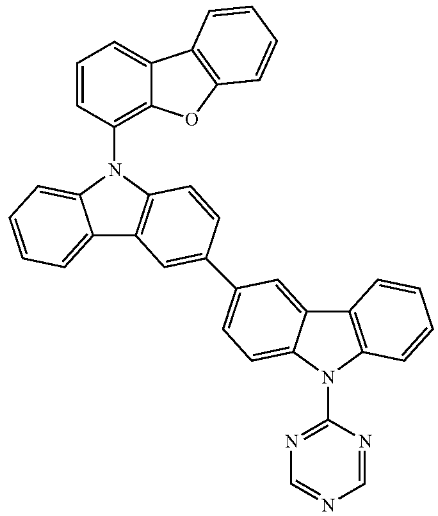
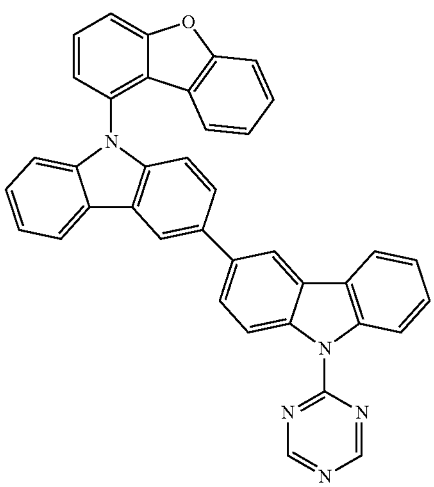
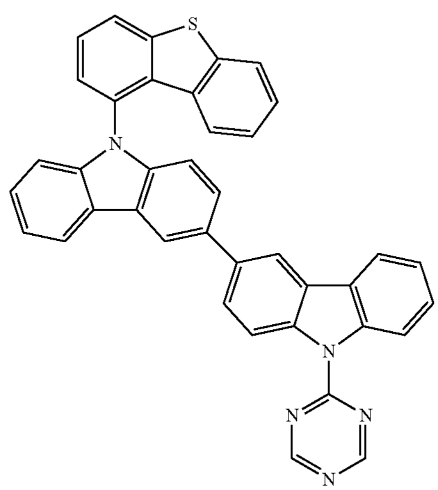
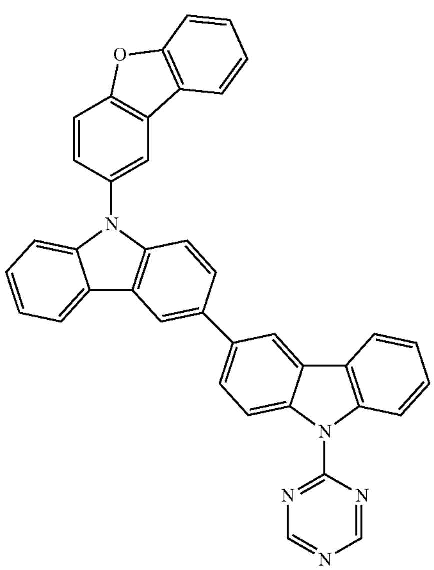
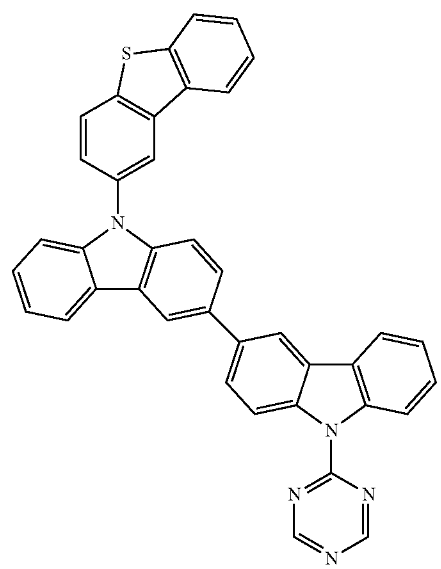

-continued
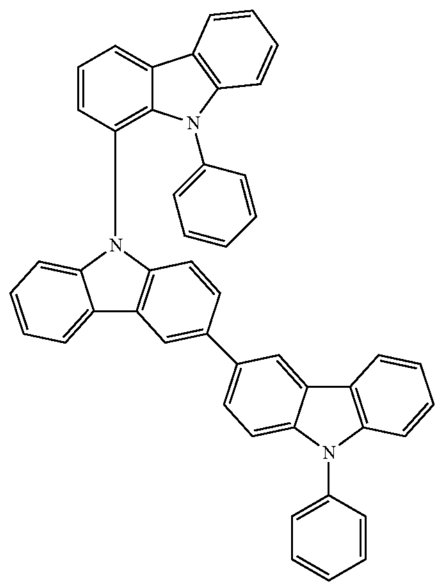
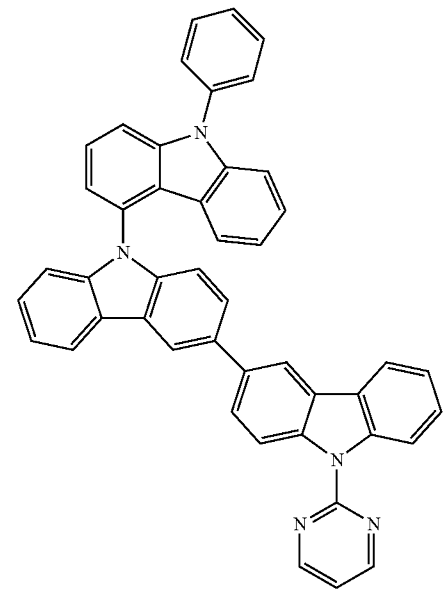
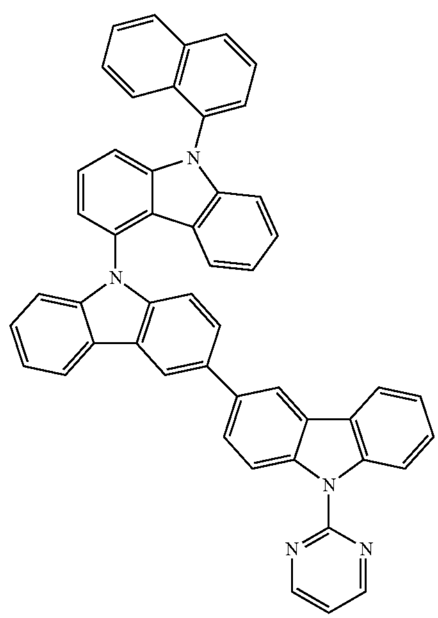

-continued
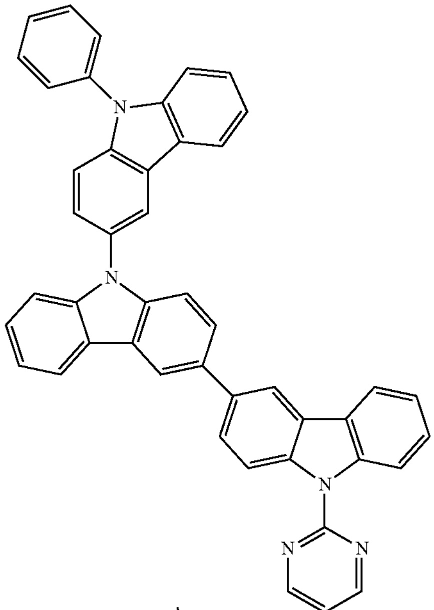
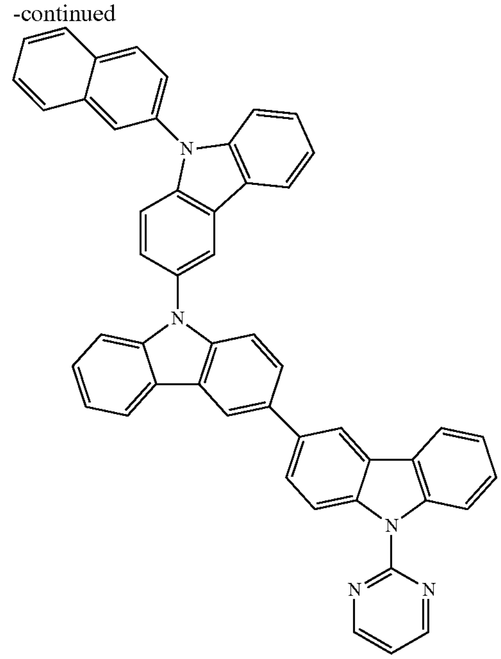
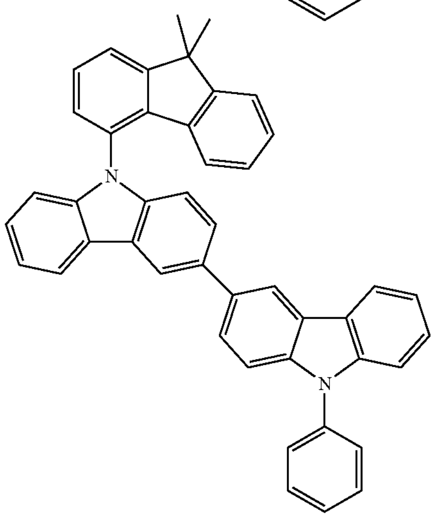
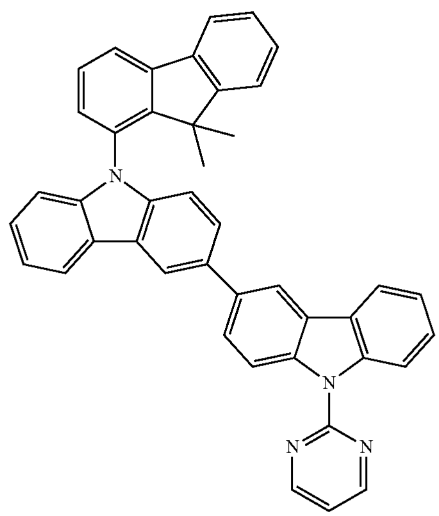
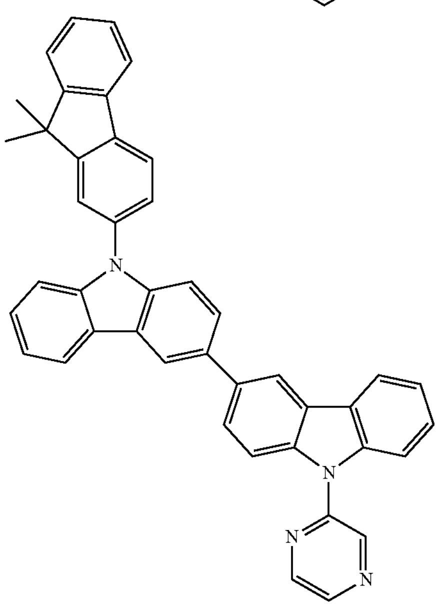
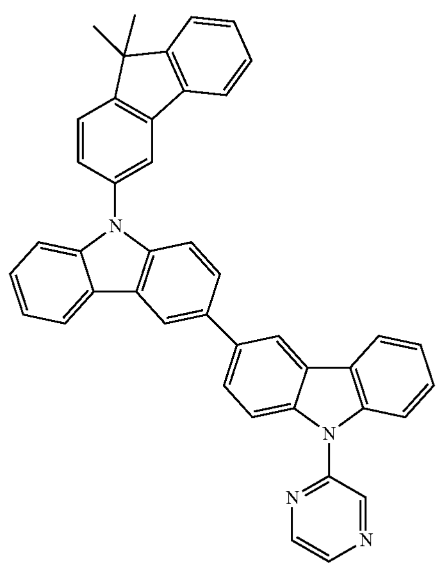

-continued
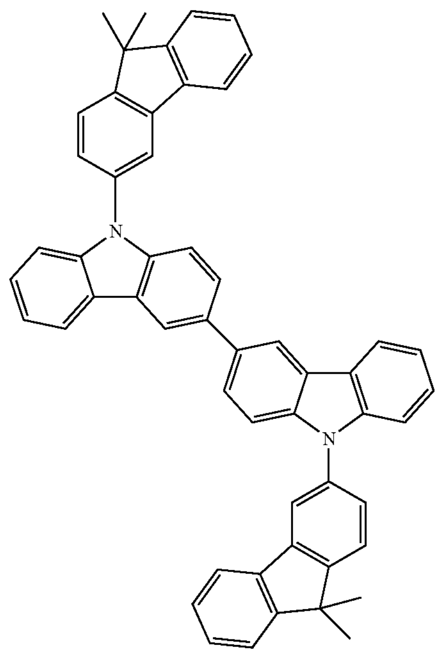
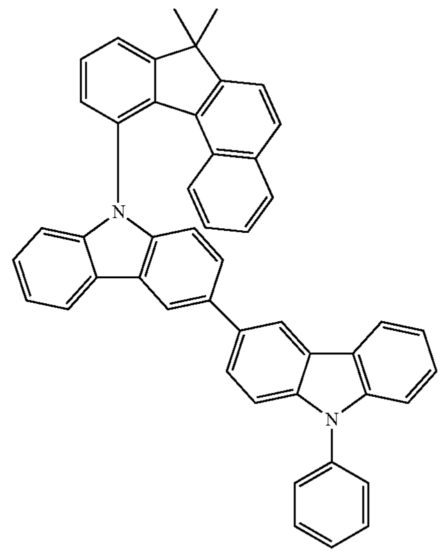
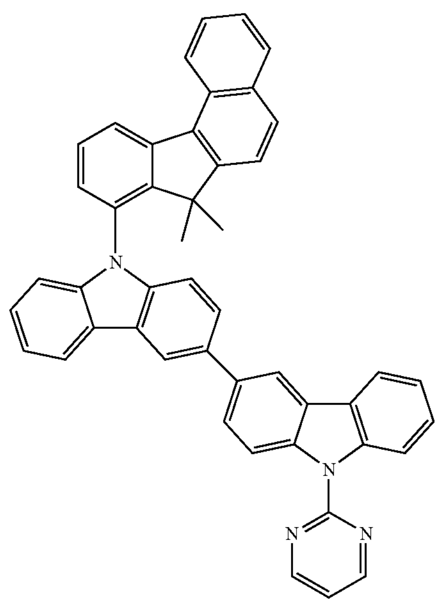
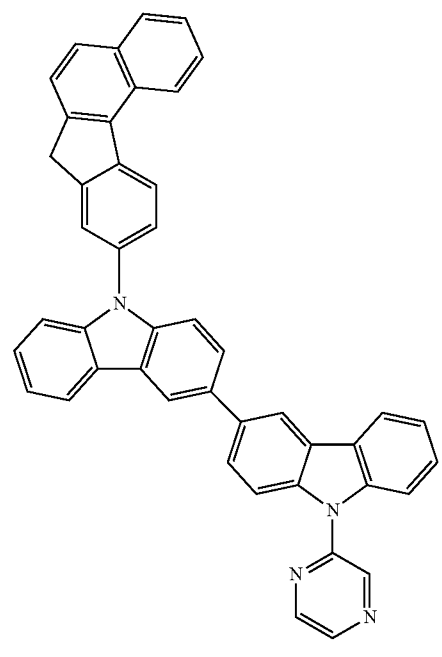

-continued
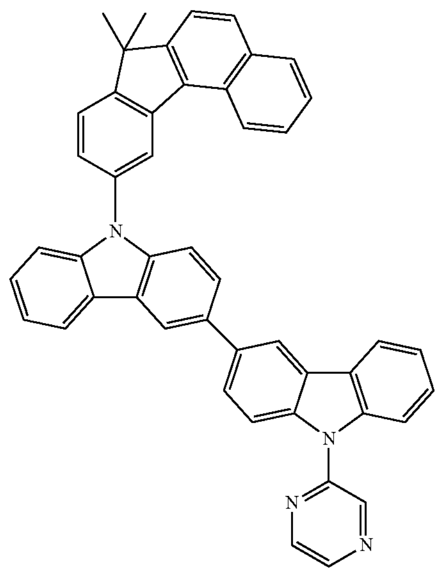
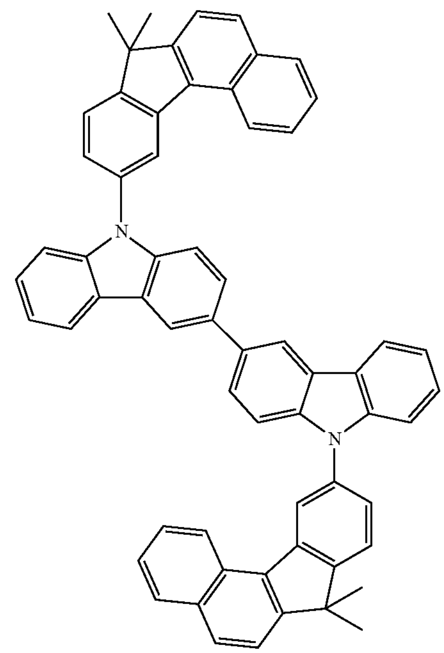
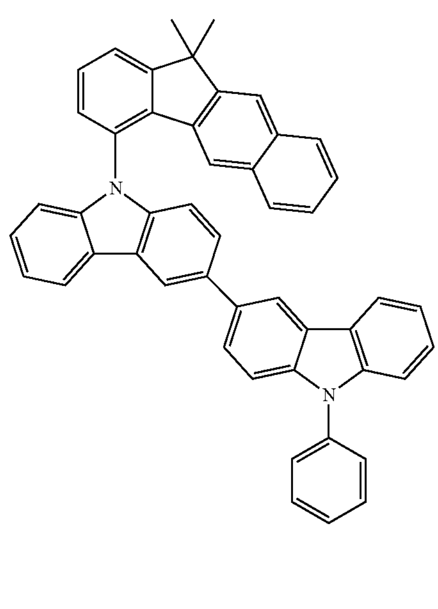

-continued
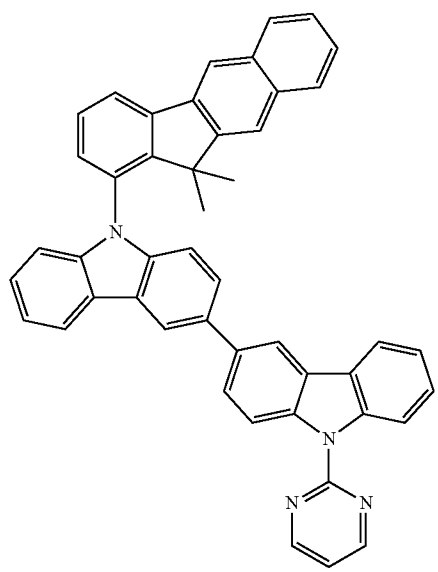
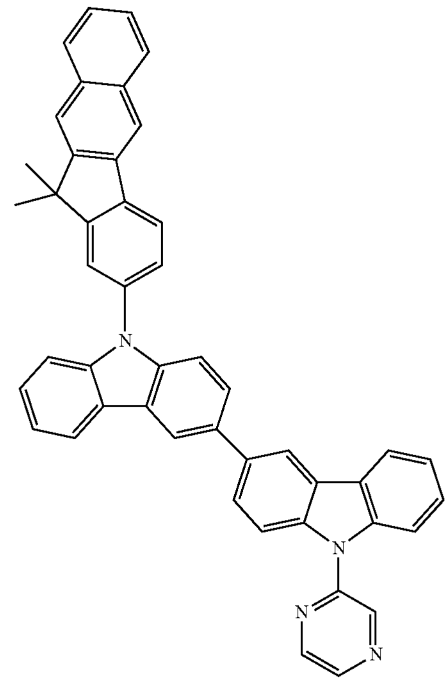
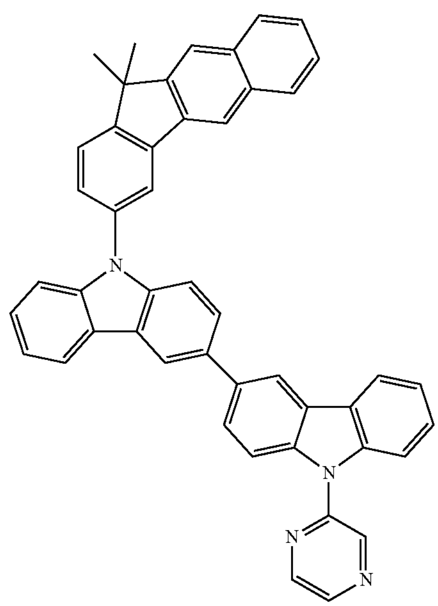
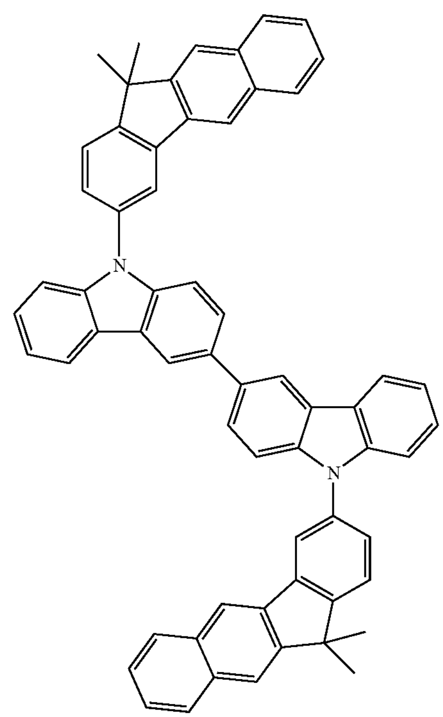

-continued
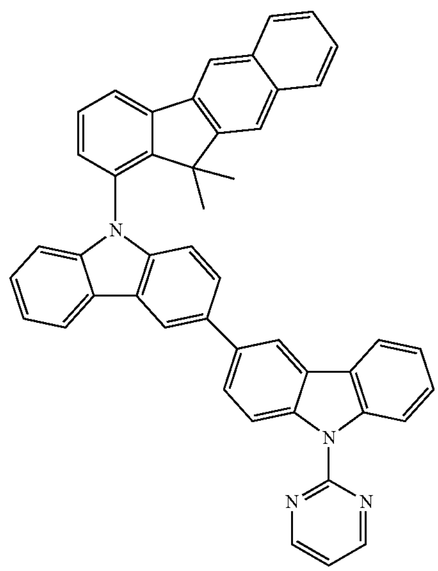
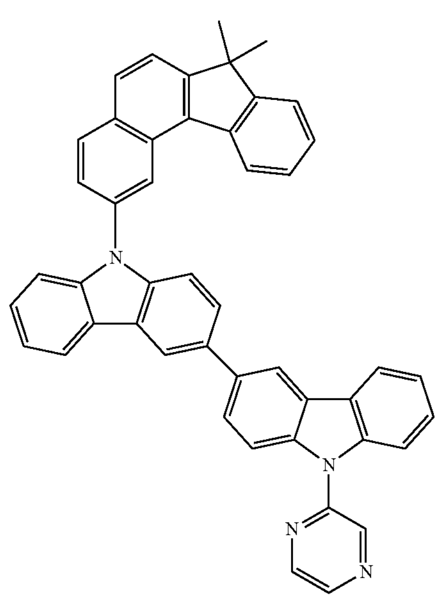
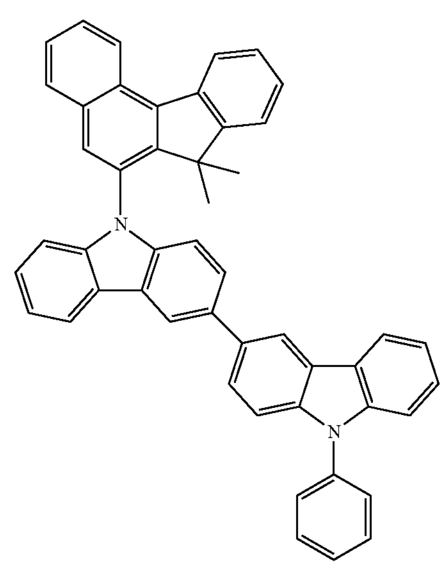

-continued
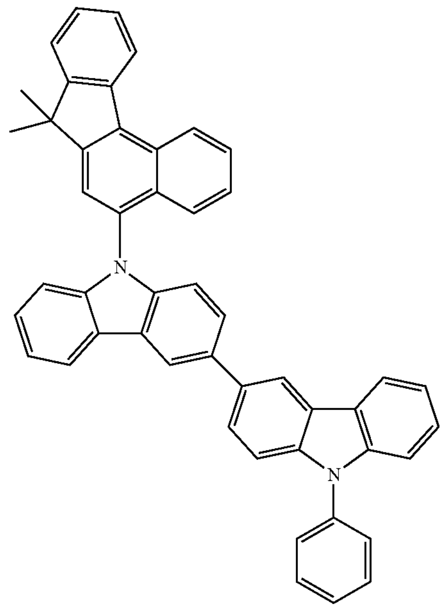
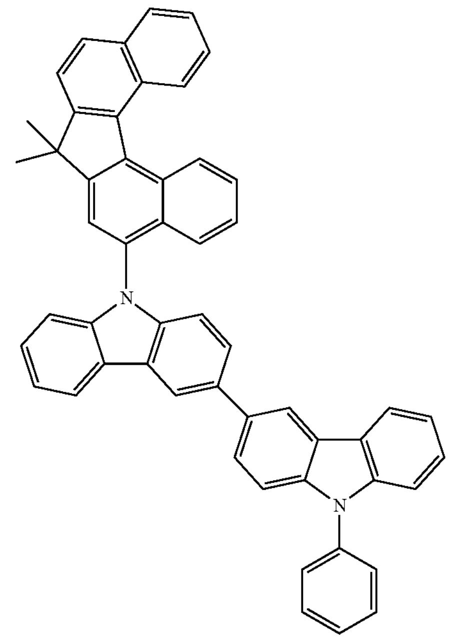
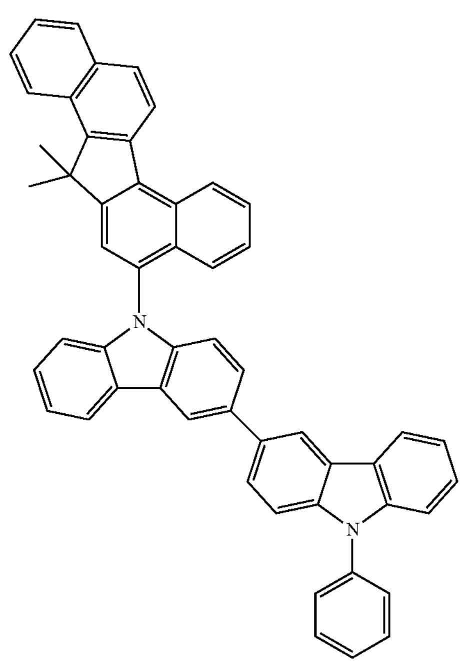
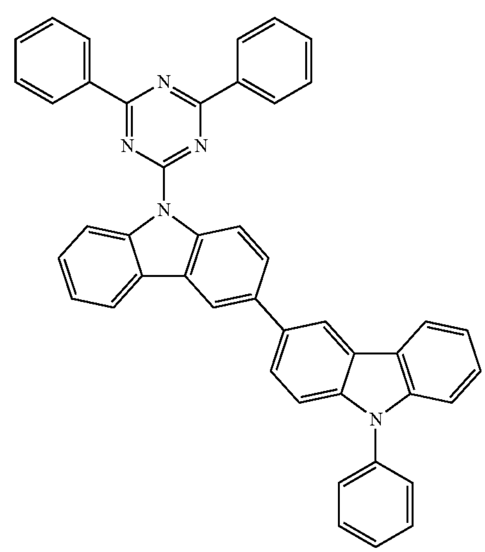

-continued
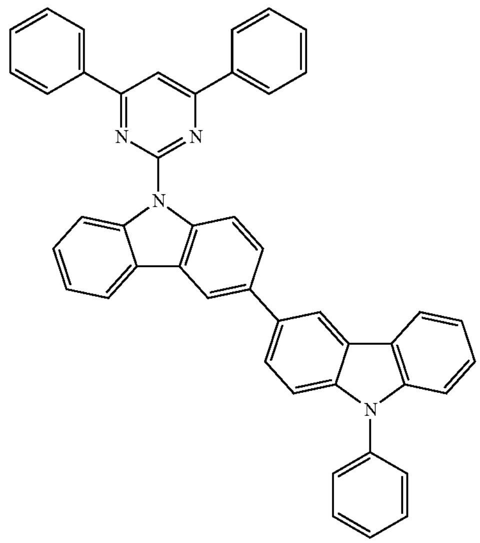
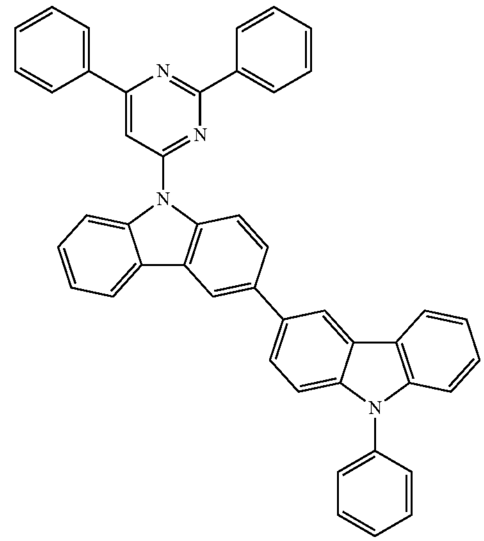
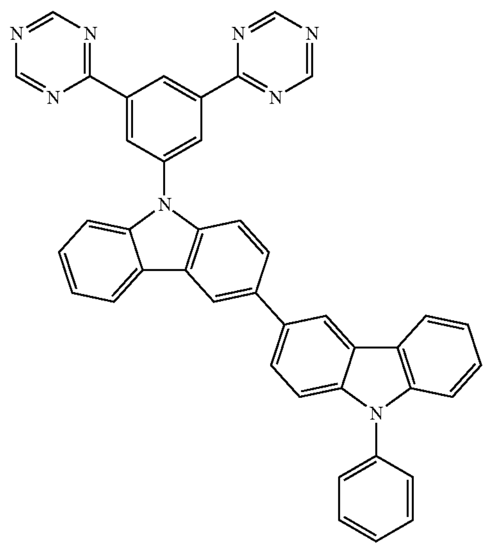
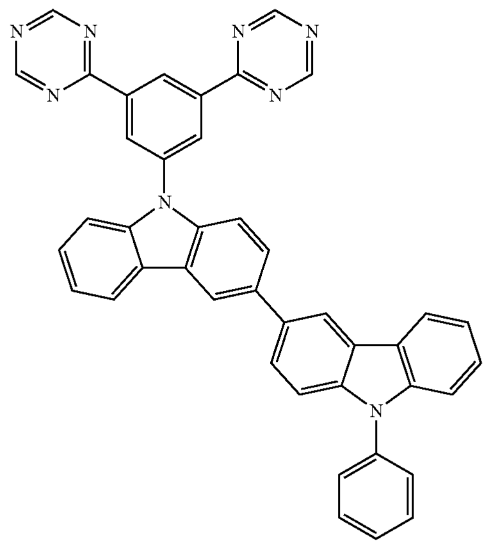
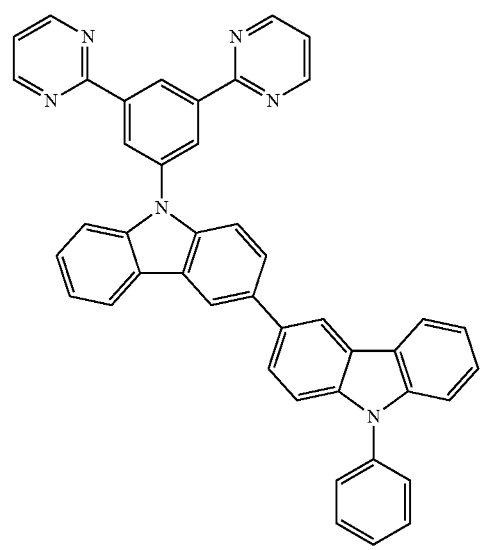

-continued
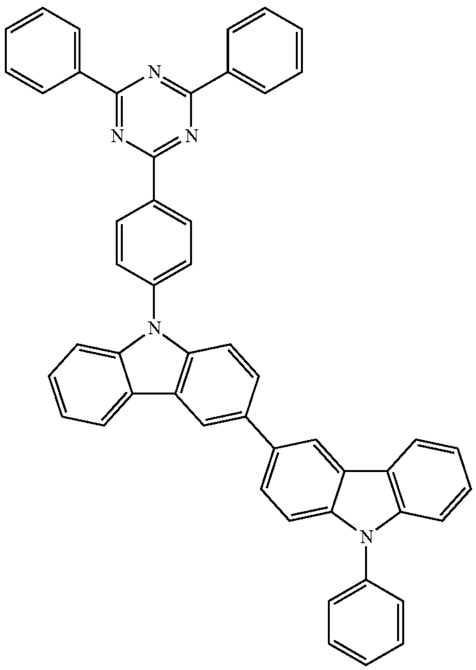
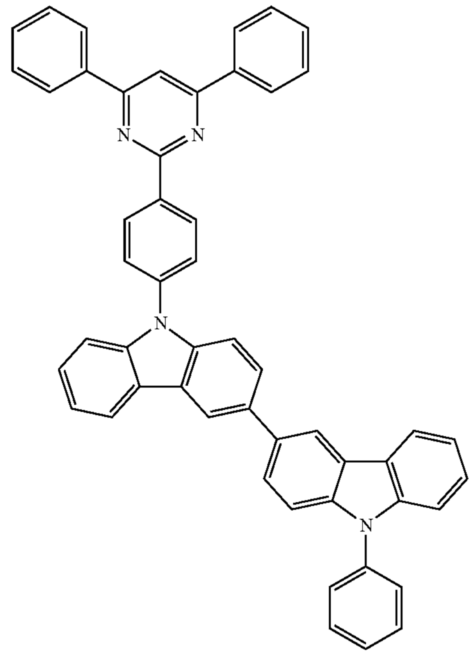
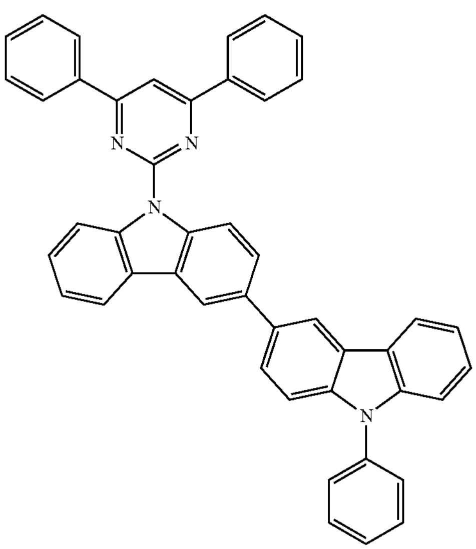

-continued
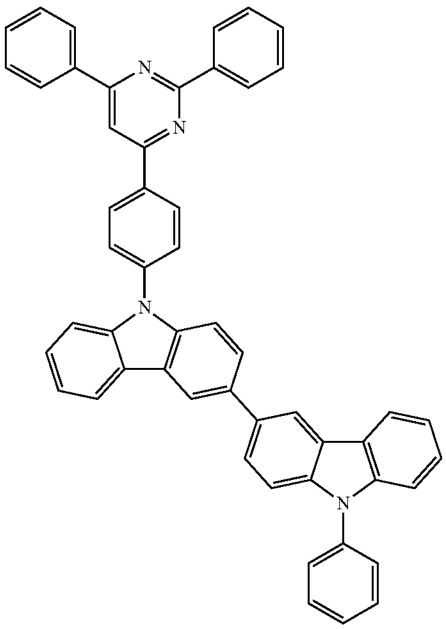
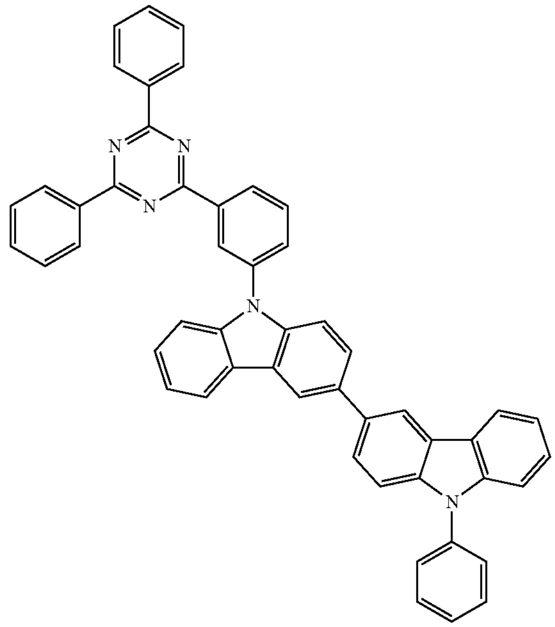
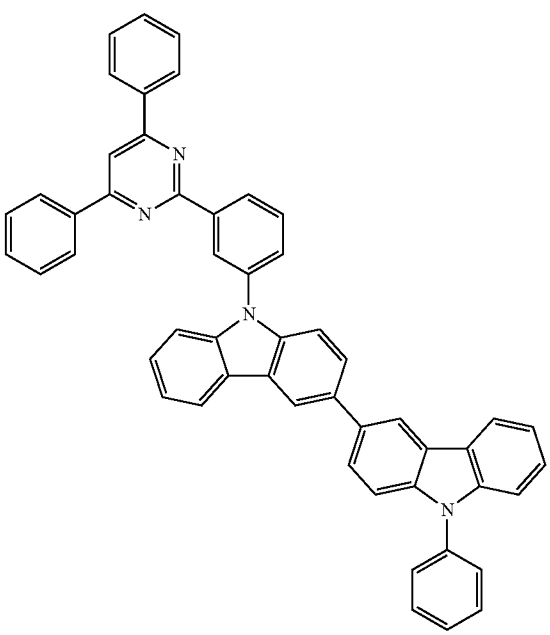
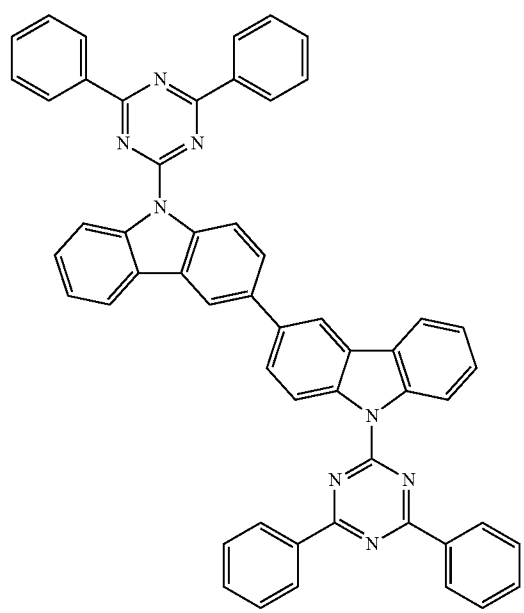

-continued
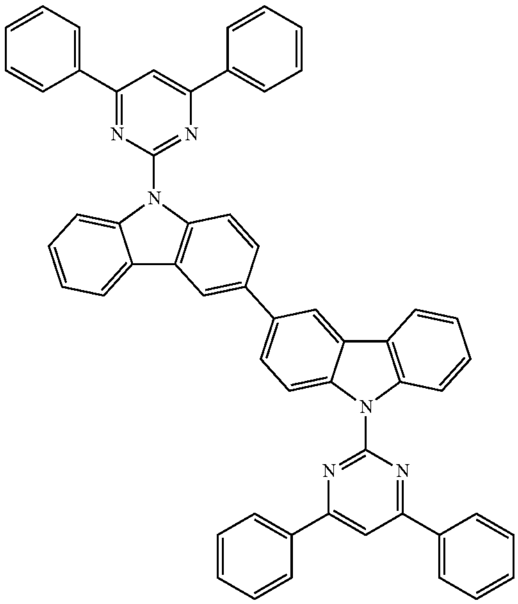
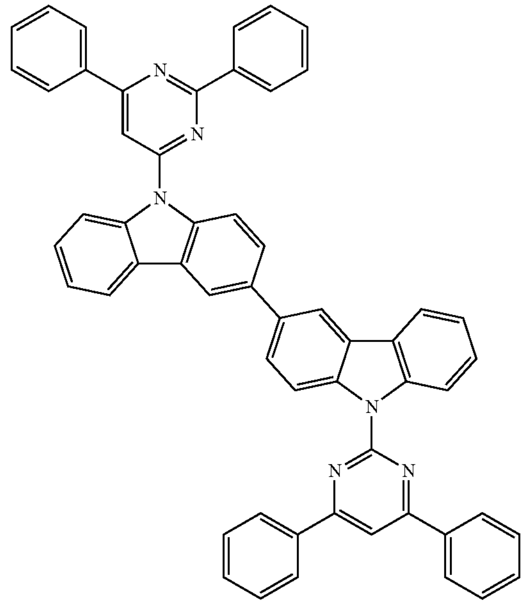
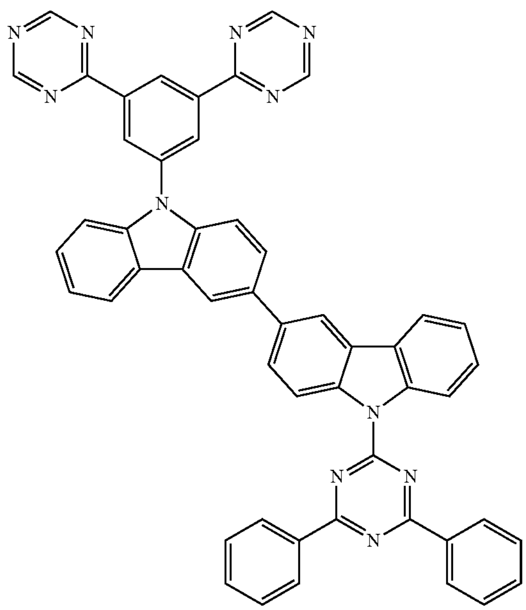
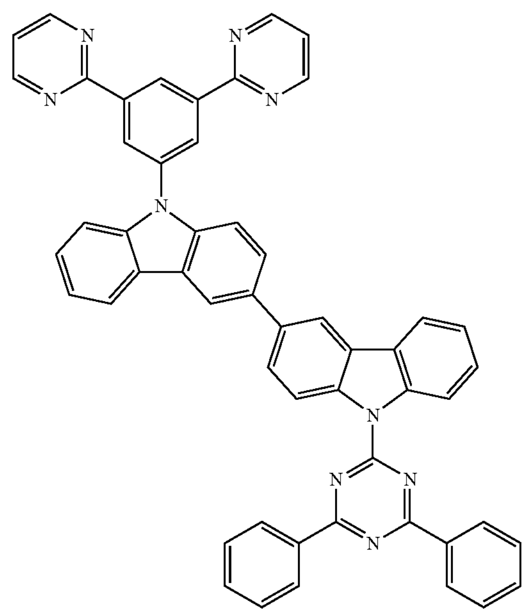
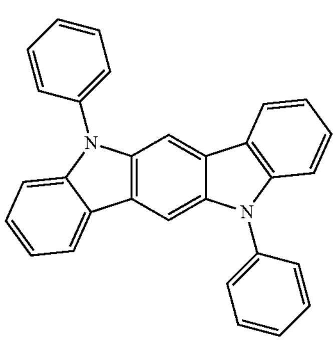
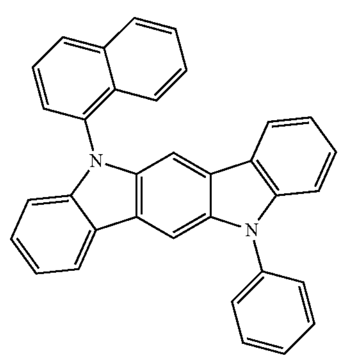
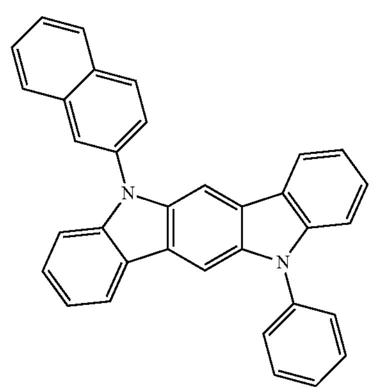

-continued
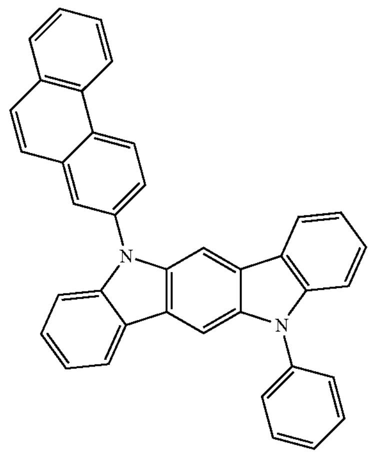
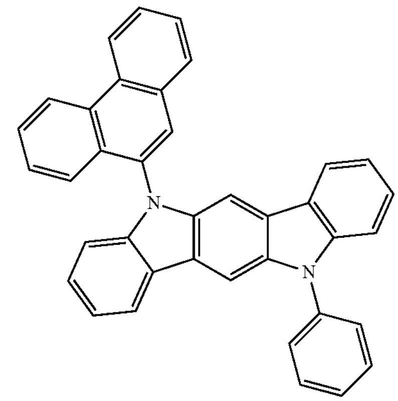
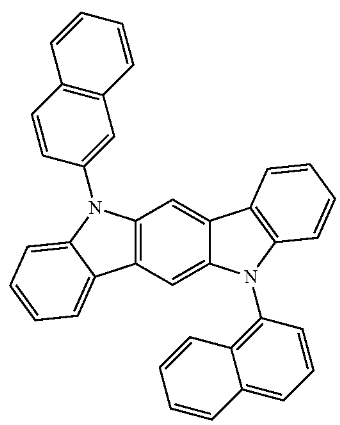
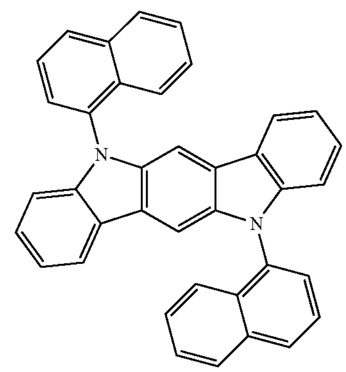
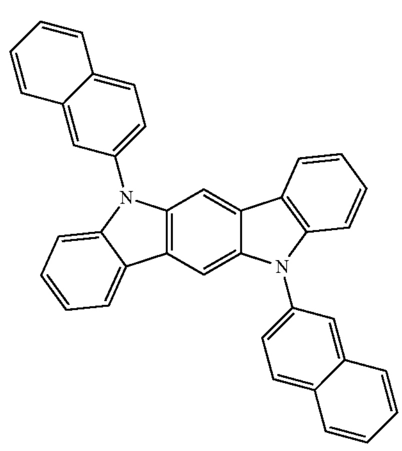
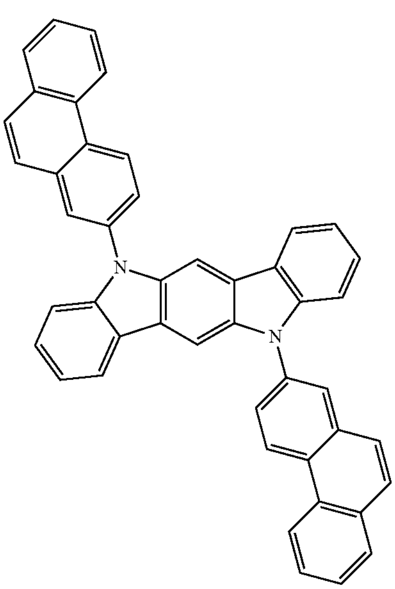

-continued
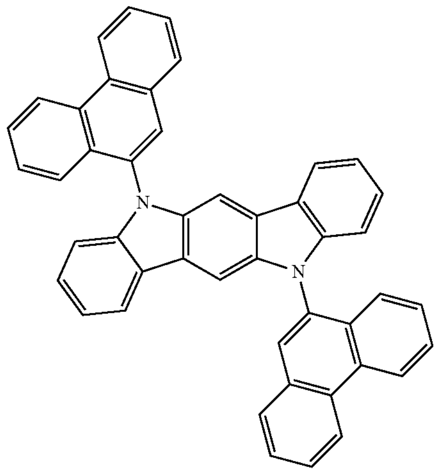
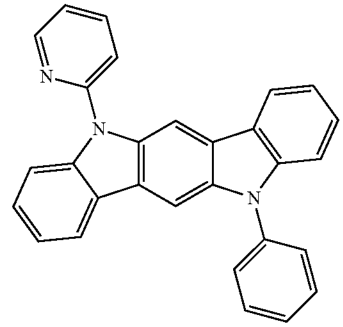
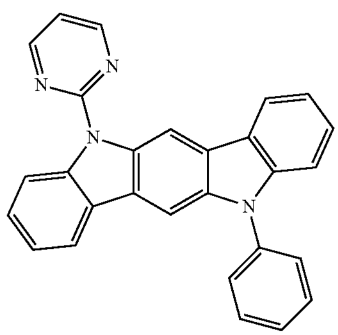
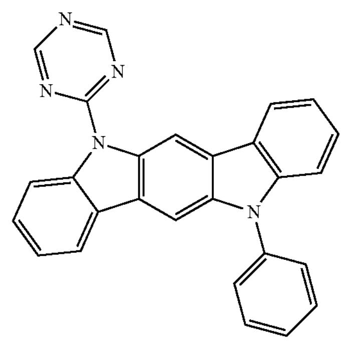
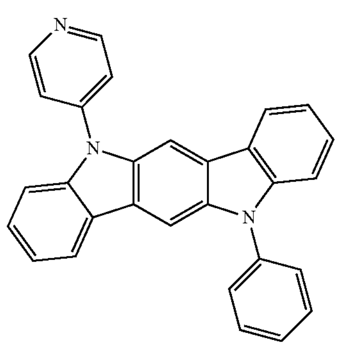
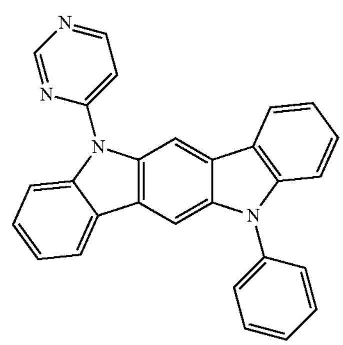
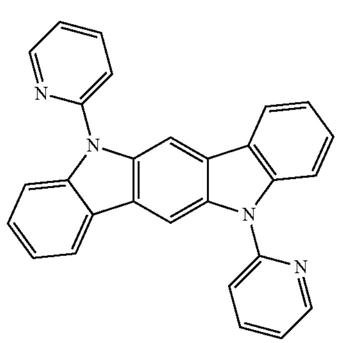
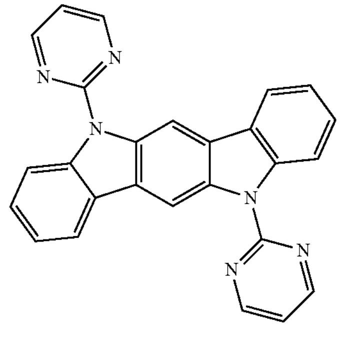

-continued
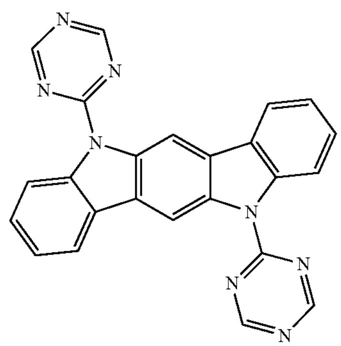
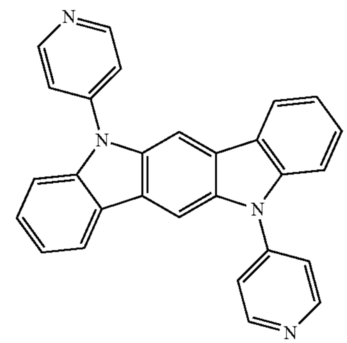
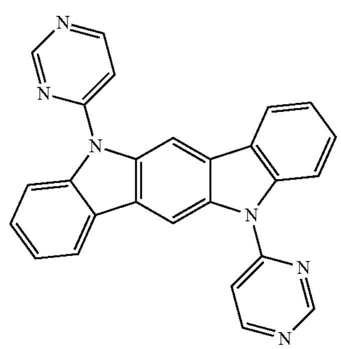
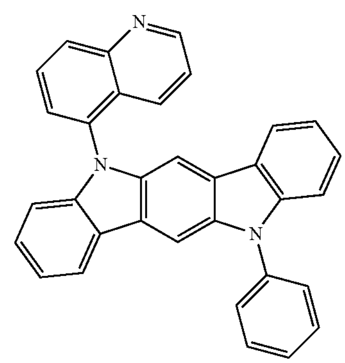
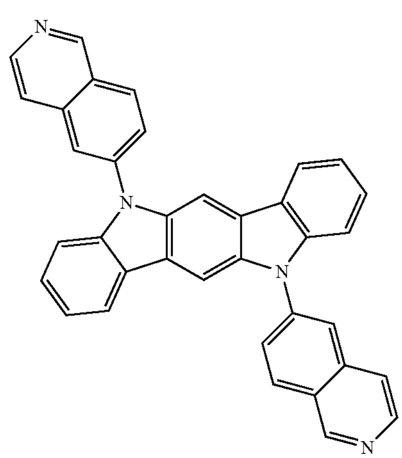
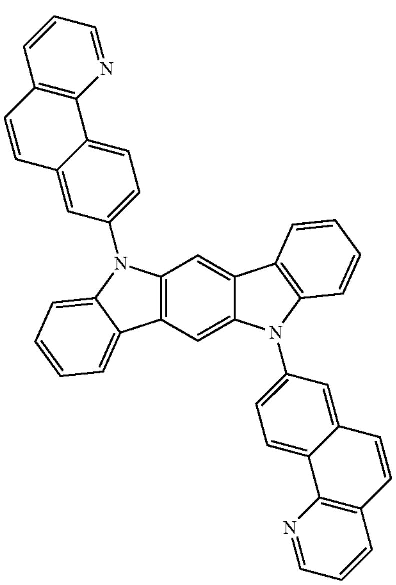

-continued
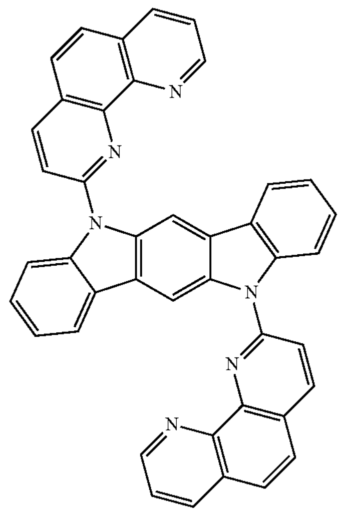
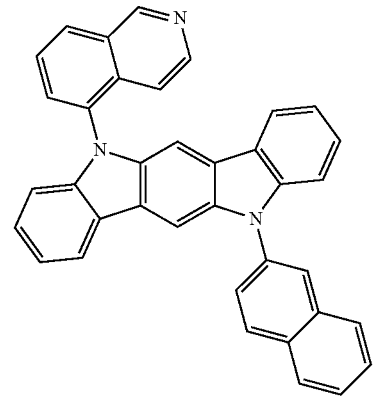
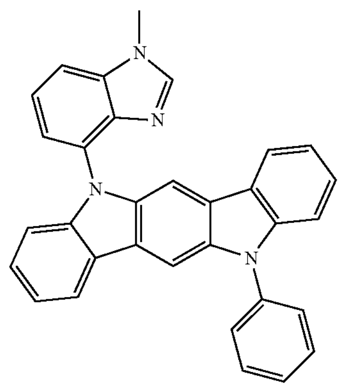
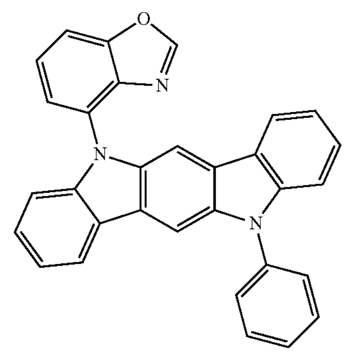
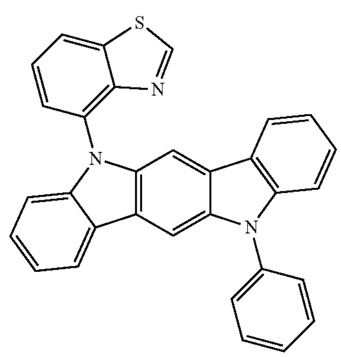
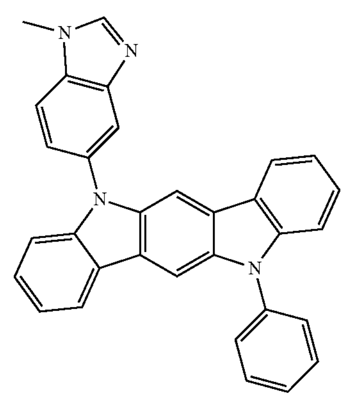
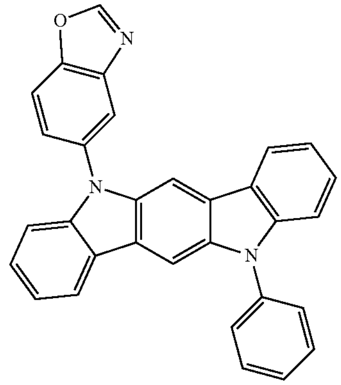
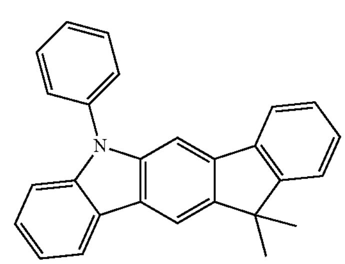

-continued
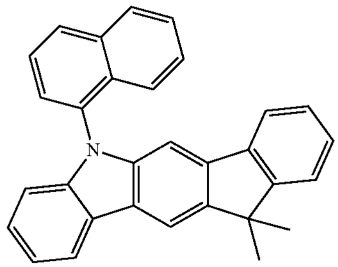
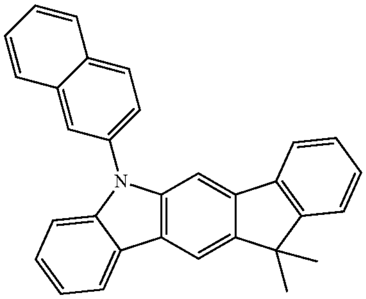
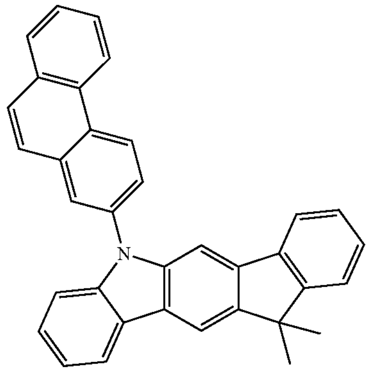
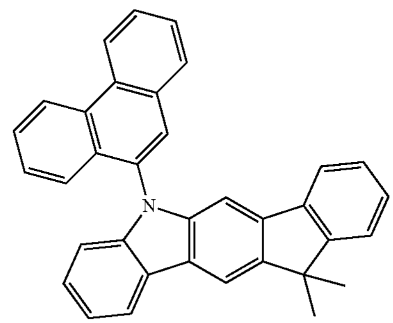
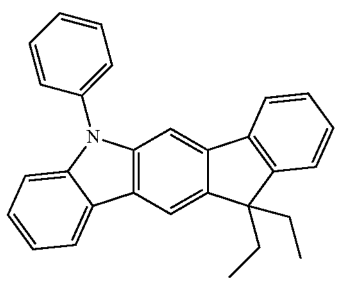
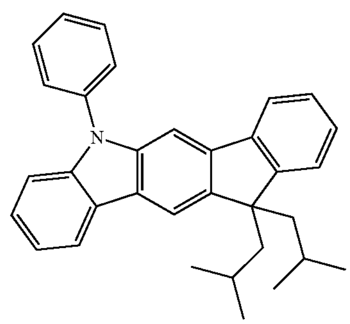
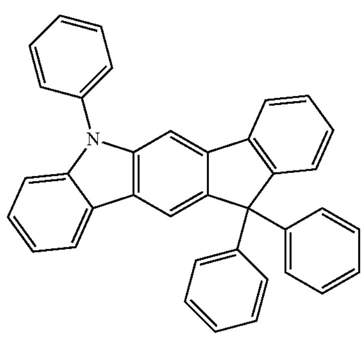
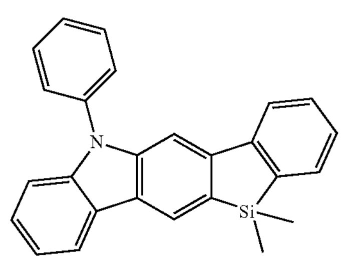
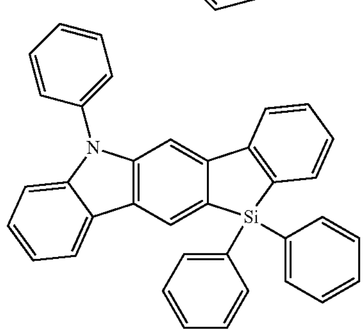
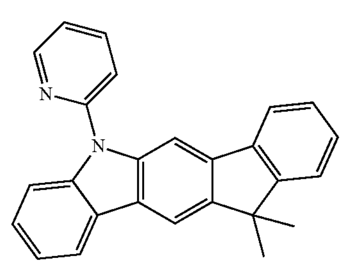

-continued
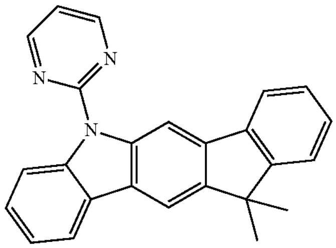
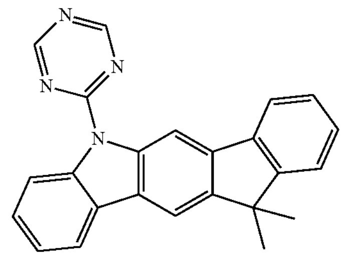
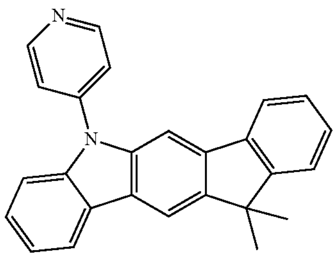
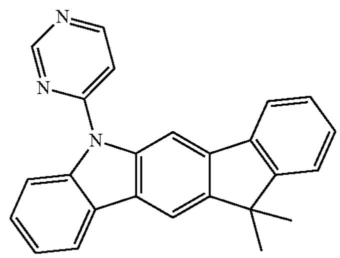
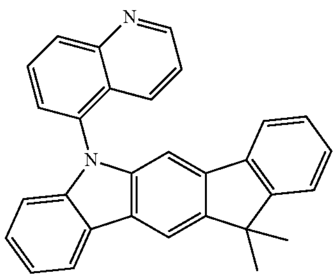
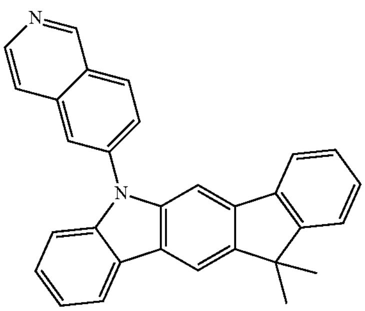
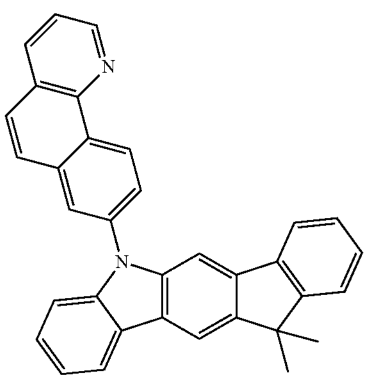
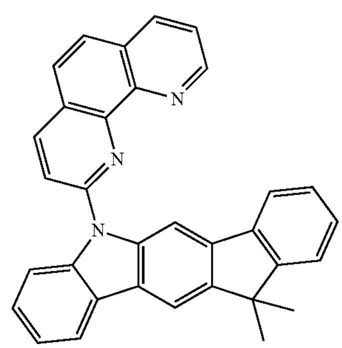
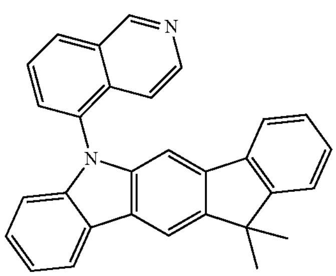
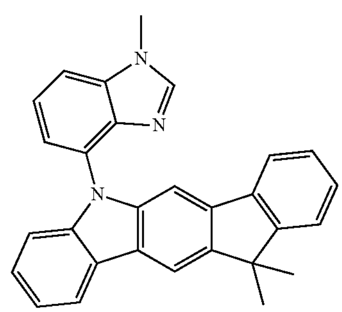

-continued
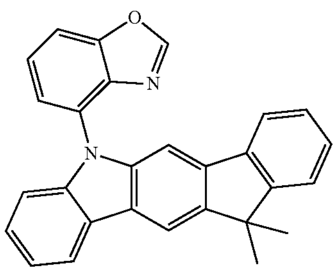
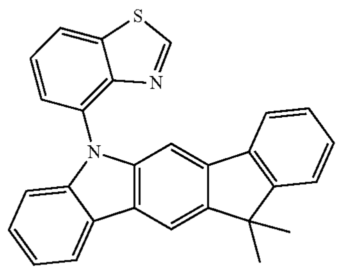
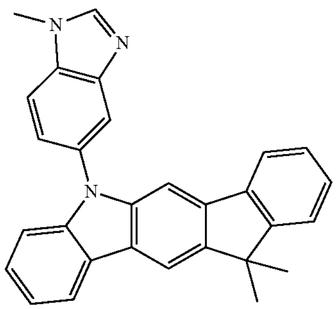
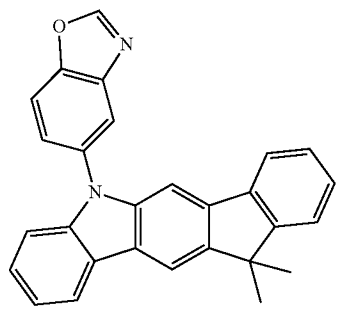
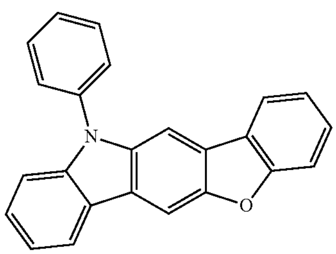
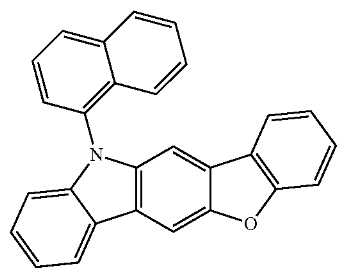
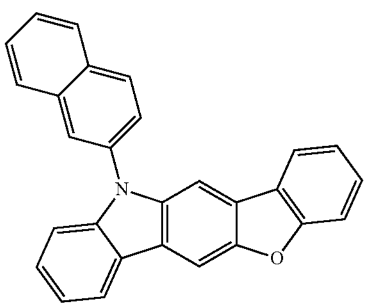
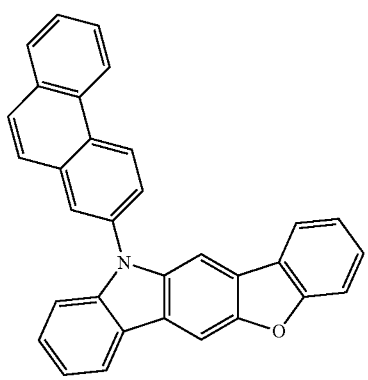
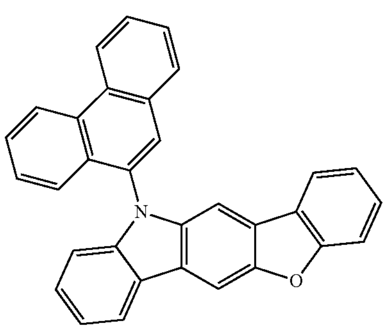
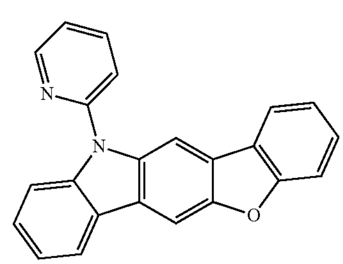

-continued
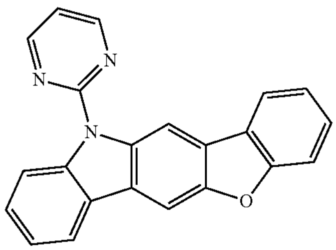
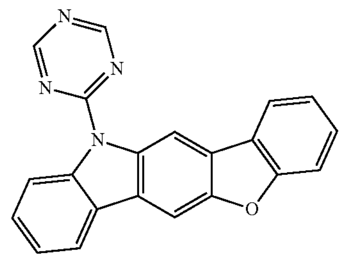
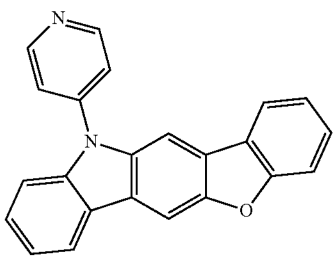
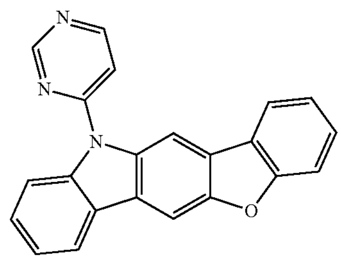
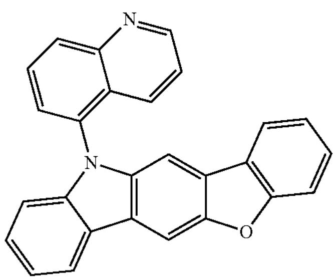
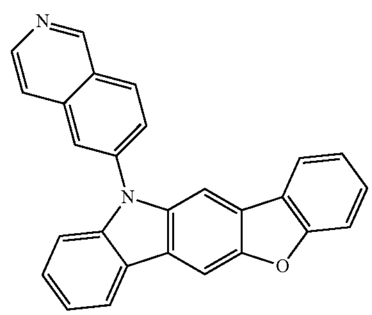
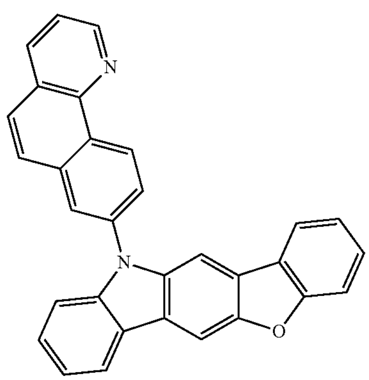
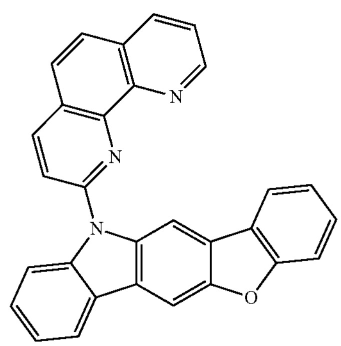
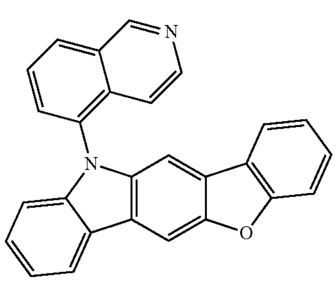
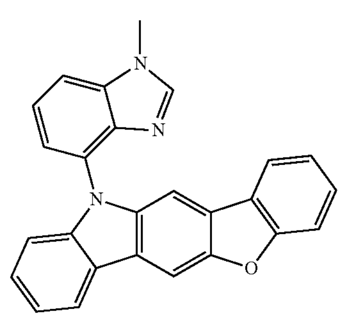

-continued
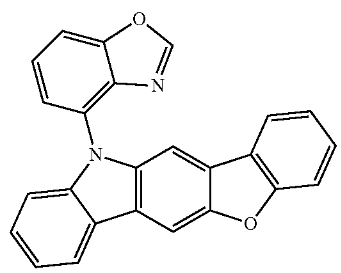
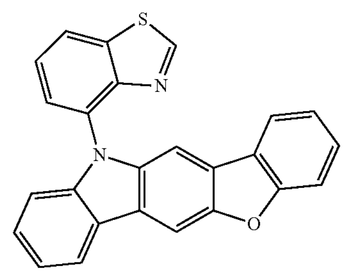
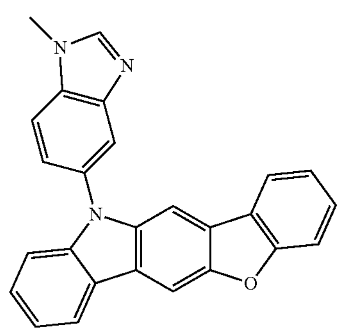
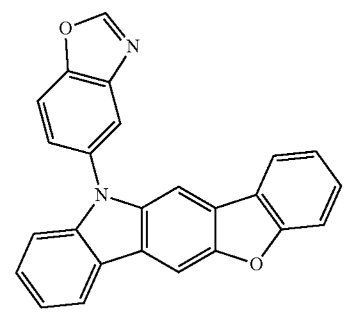
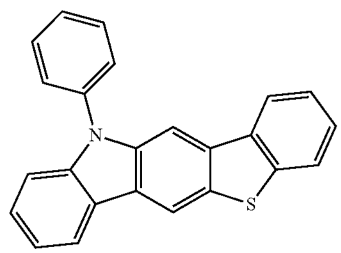
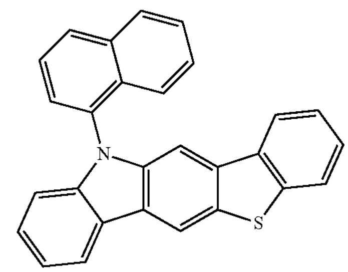
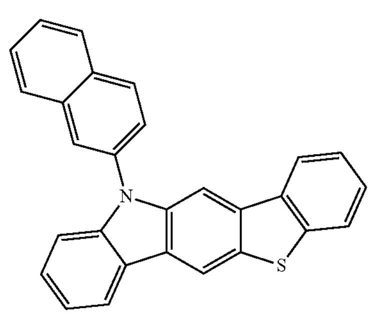
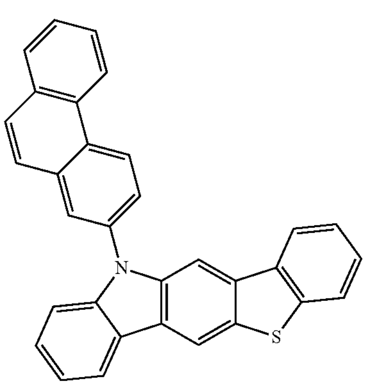
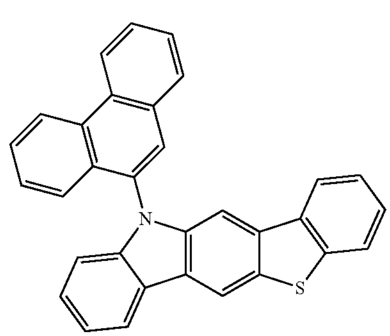
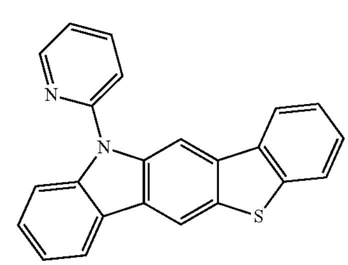

-continued
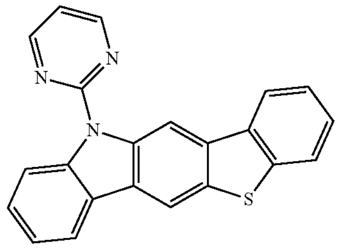
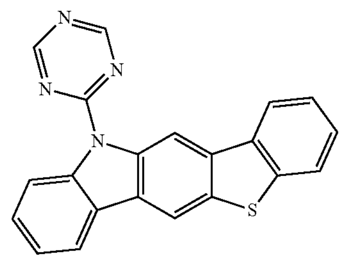
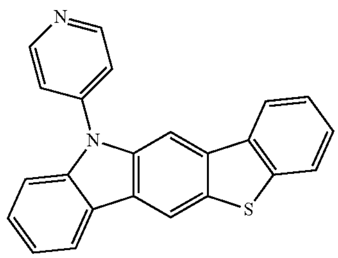
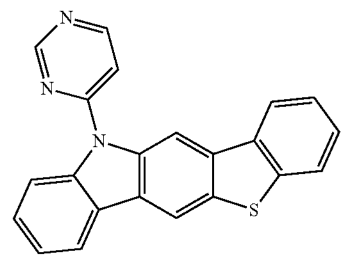
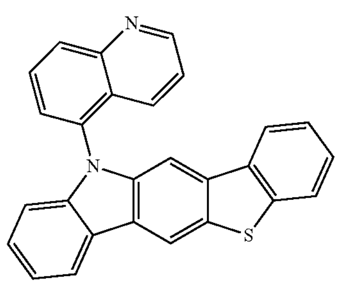
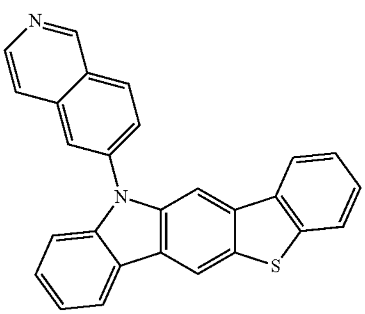
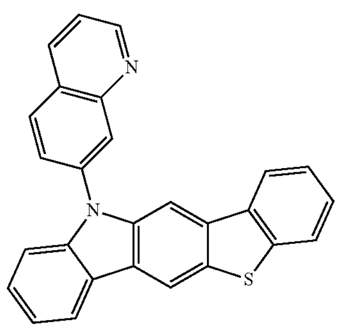
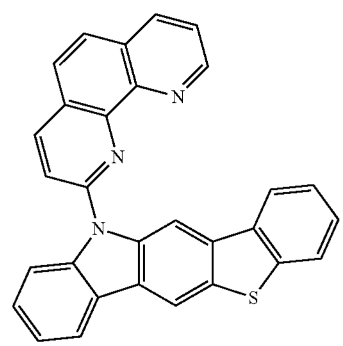
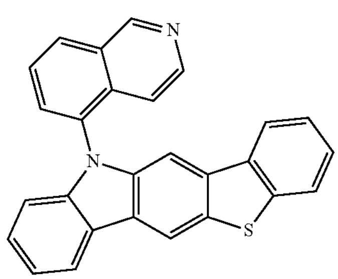

-continued
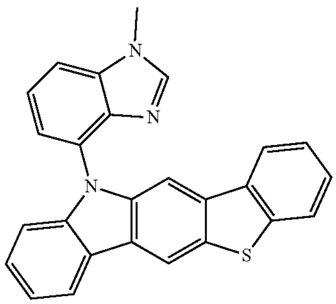
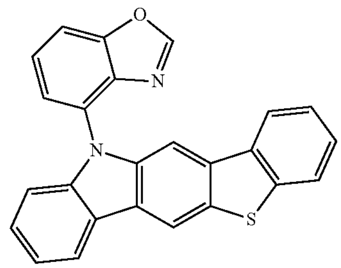
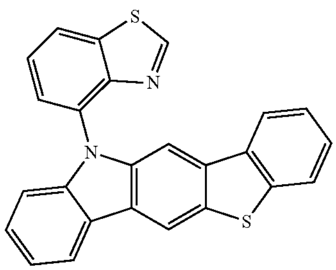
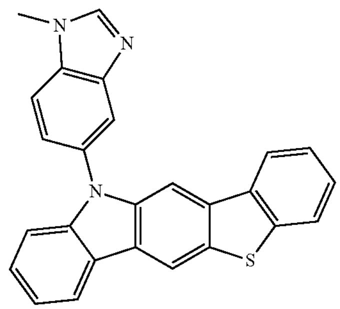
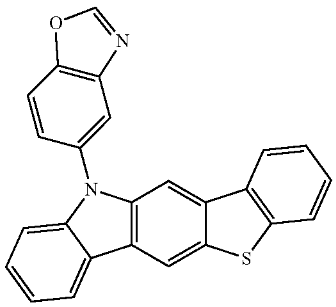
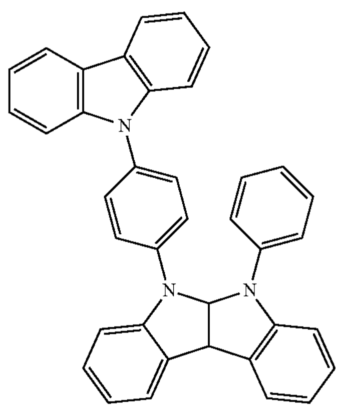
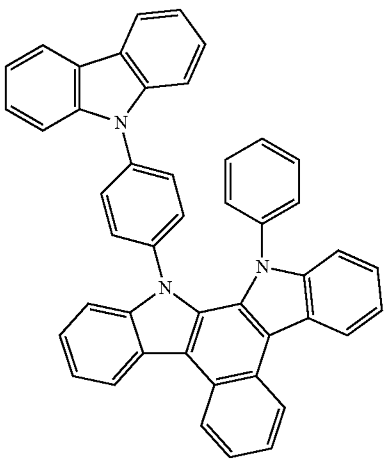
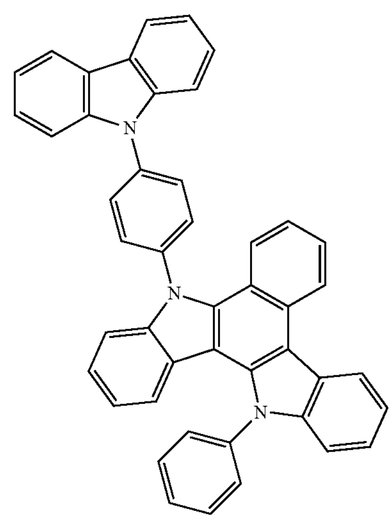

-continued
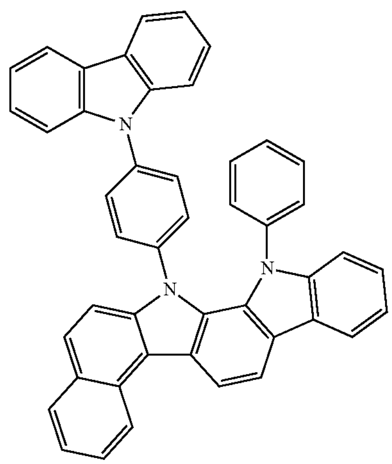
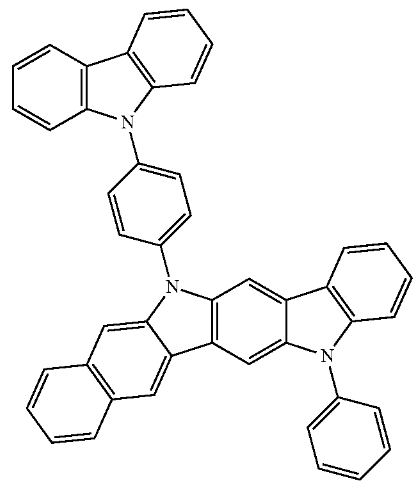
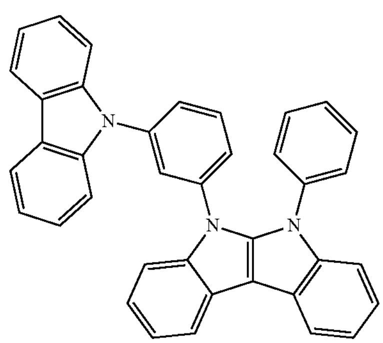
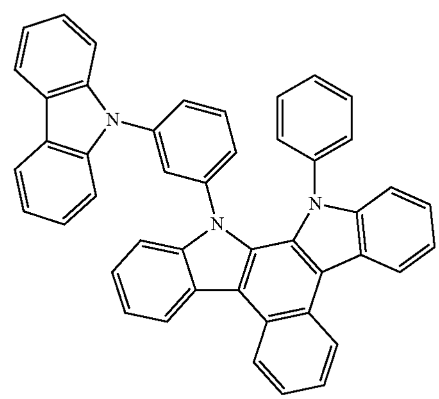
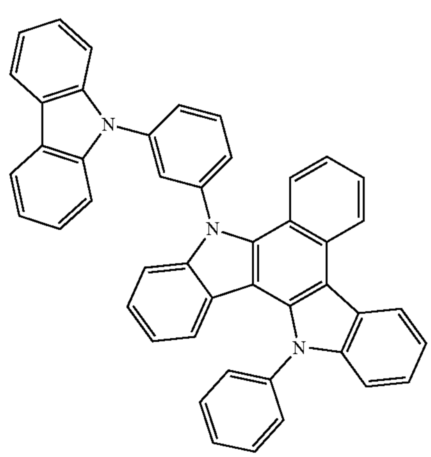
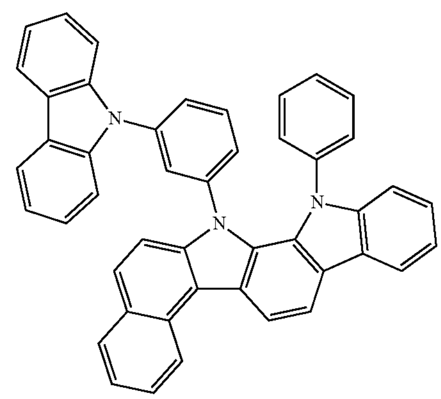

-continued
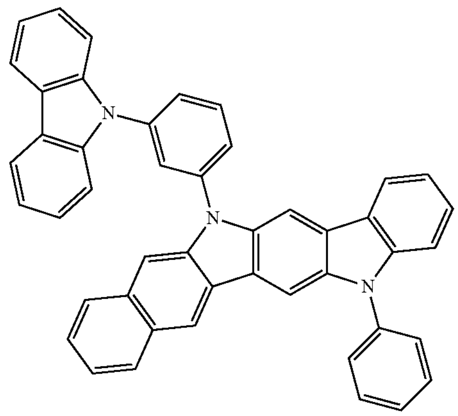
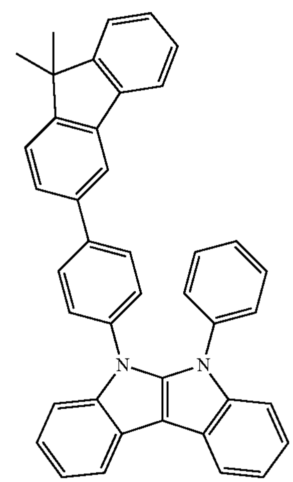
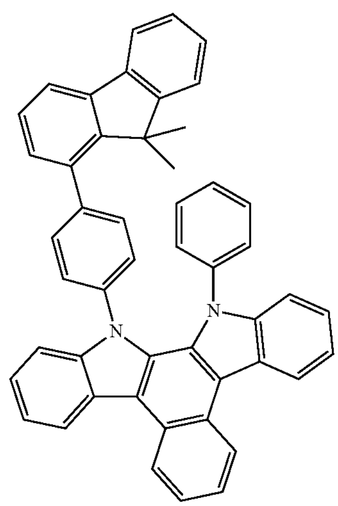
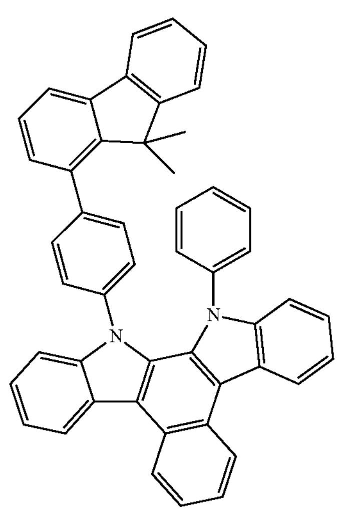
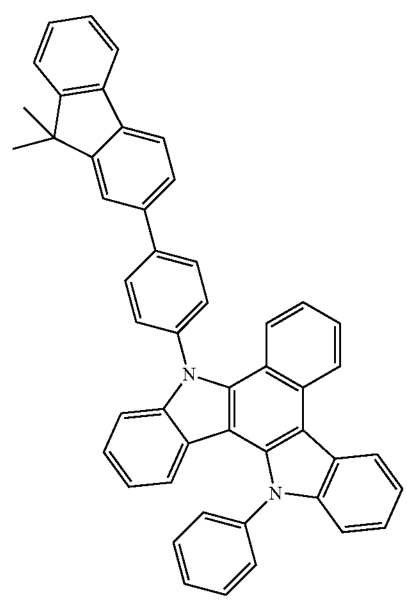

-continued
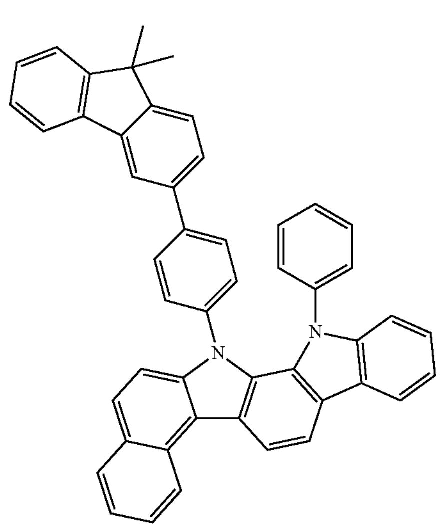
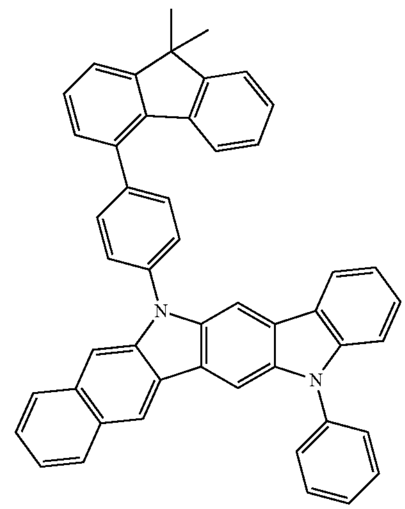
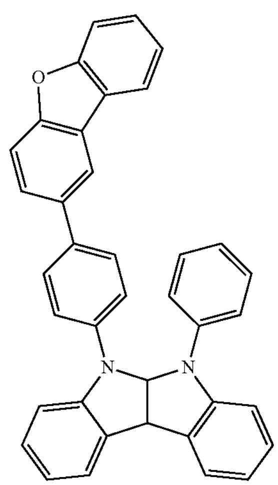
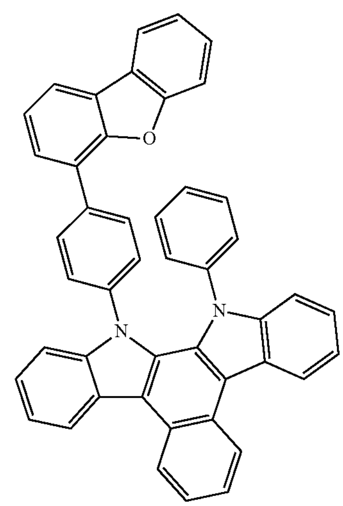
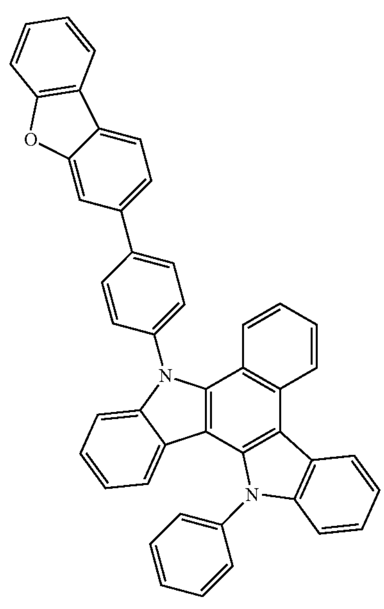
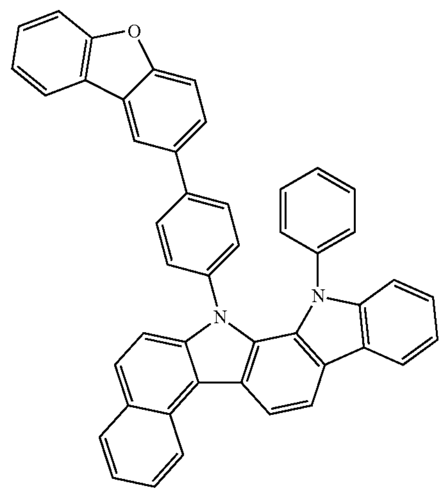

-continued
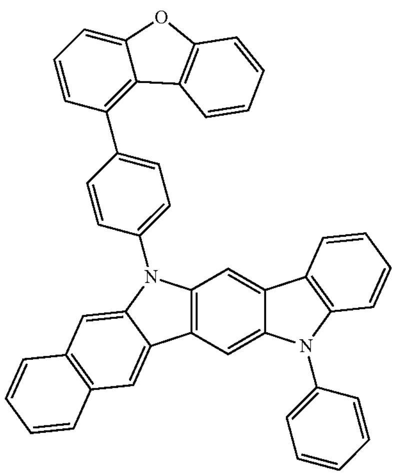
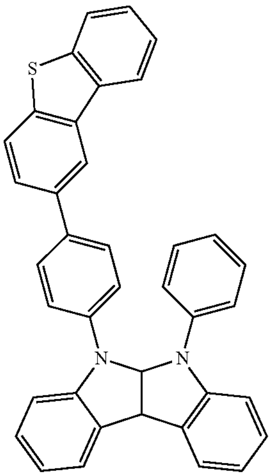
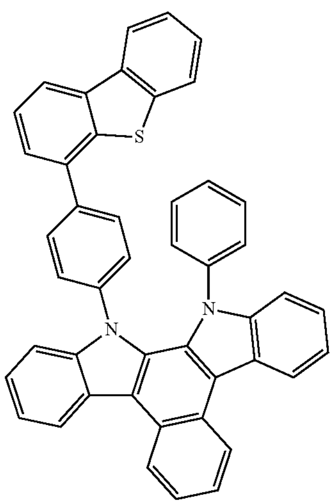
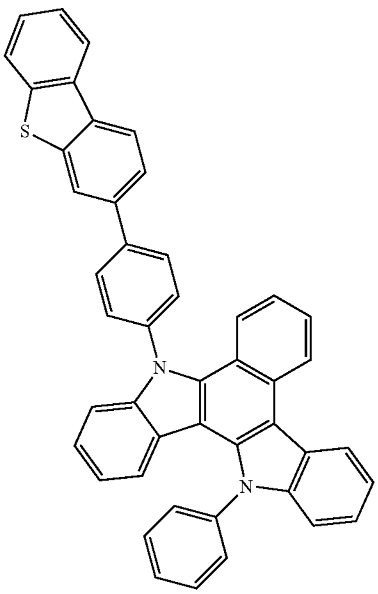
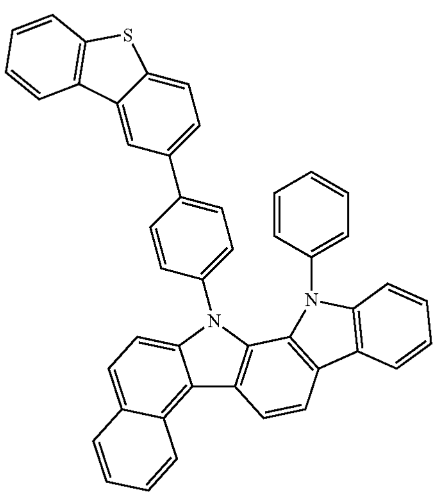
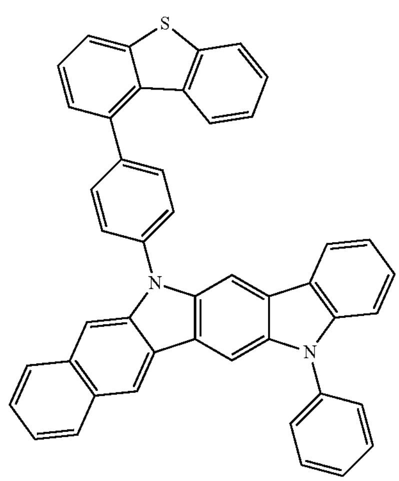

-continued
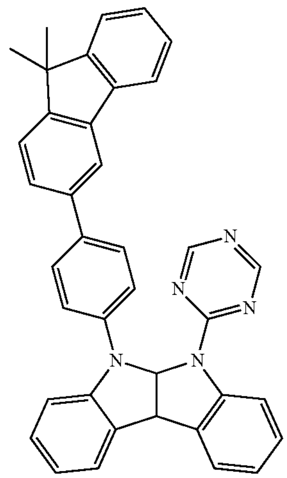
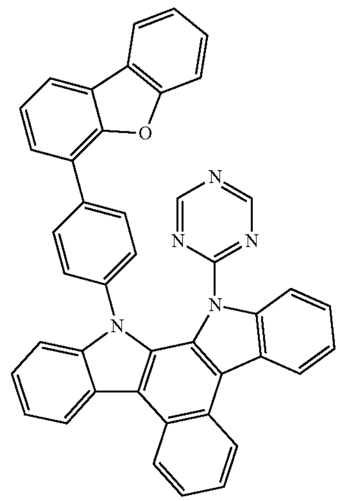
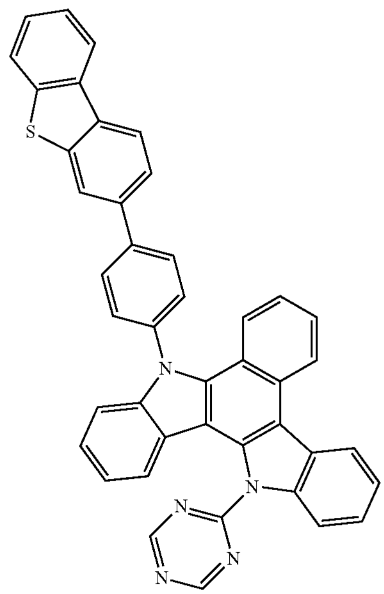
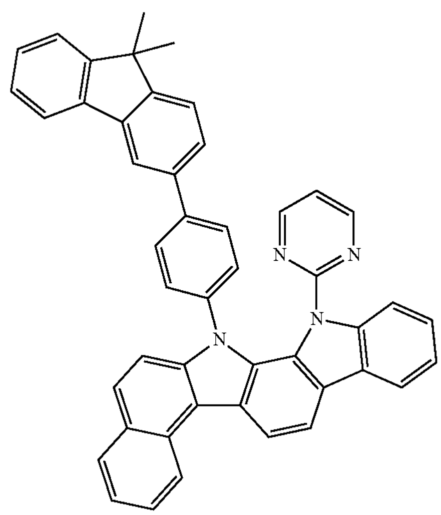
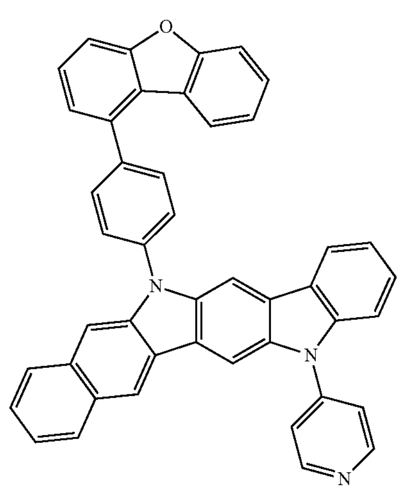
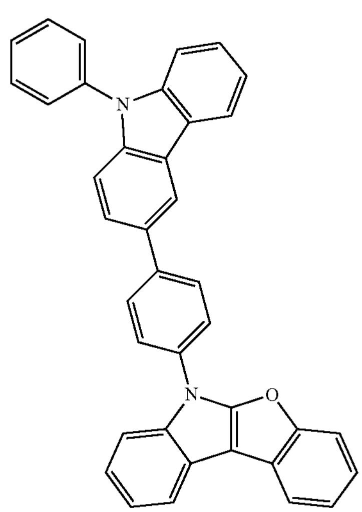

-continued
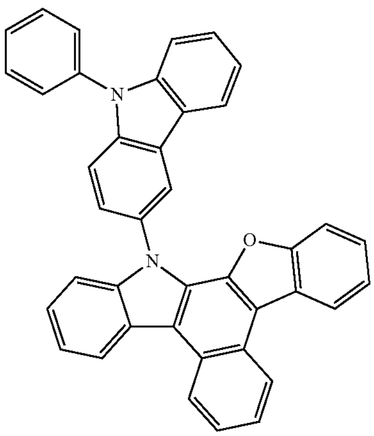
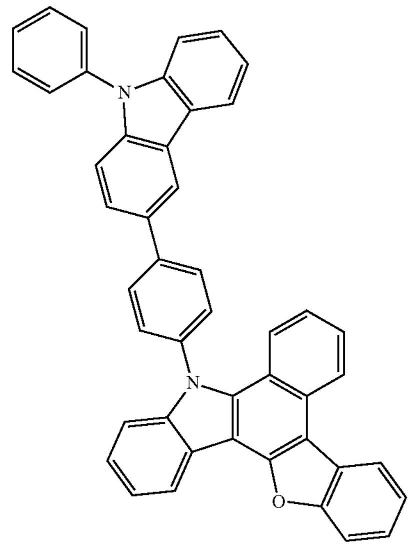
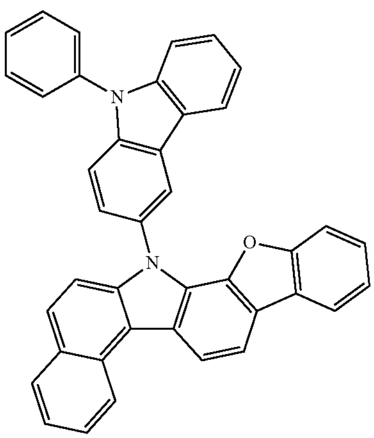
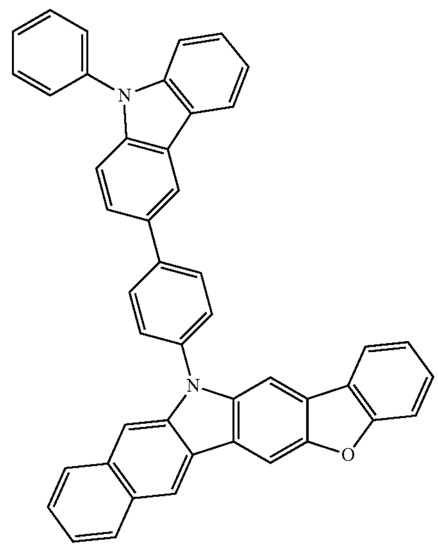
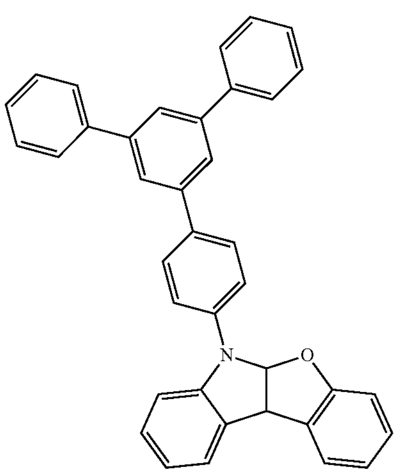
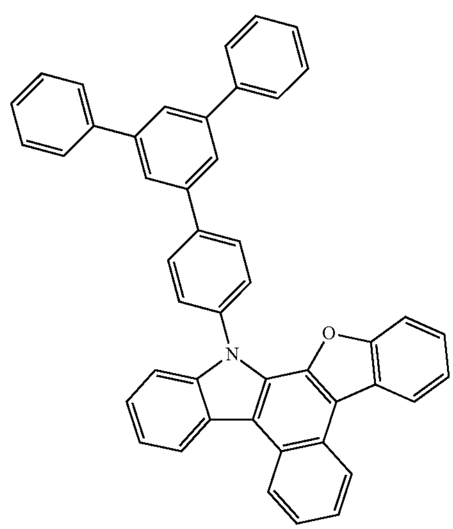

-continued
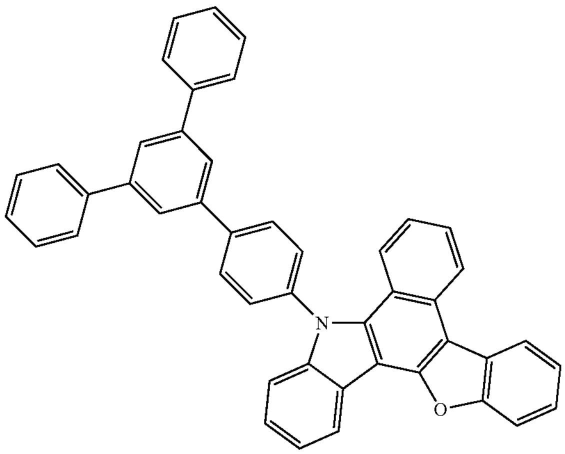
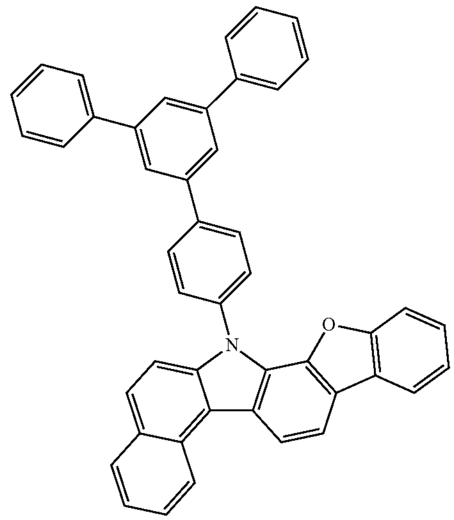
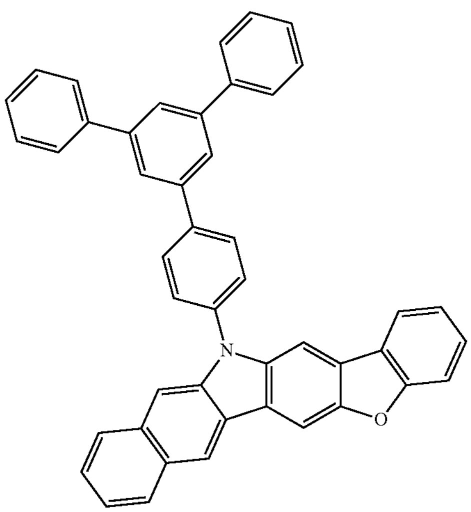
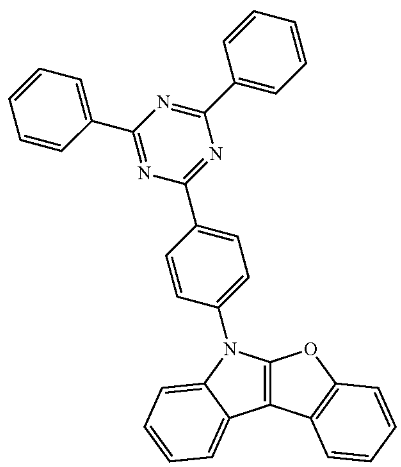
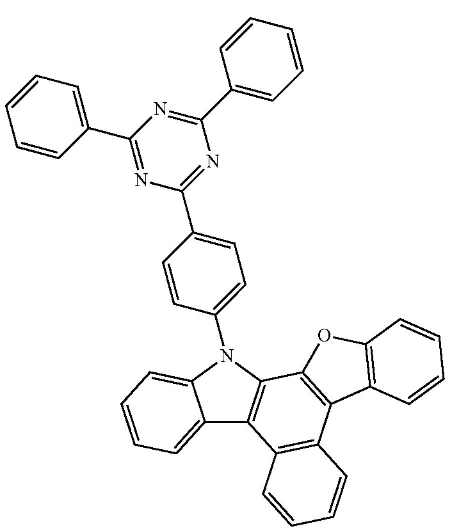
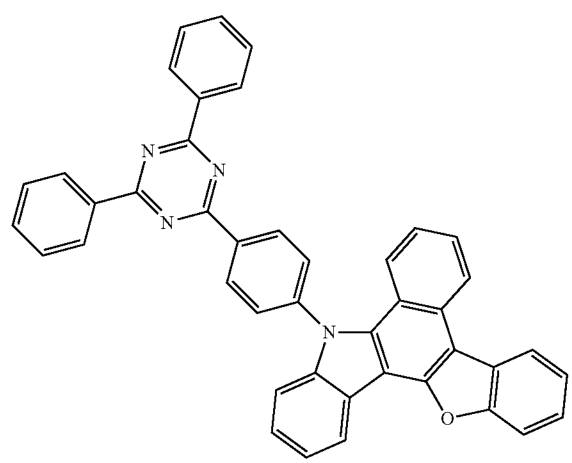

-continued
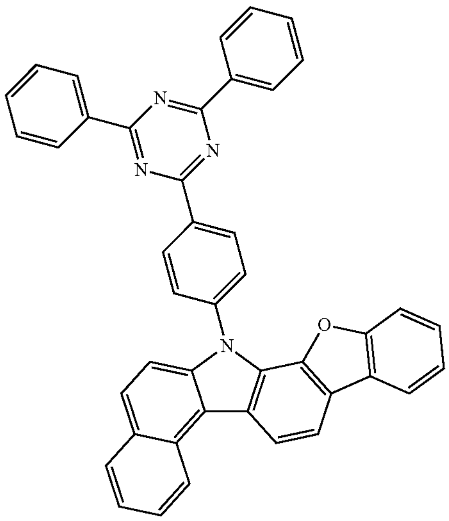
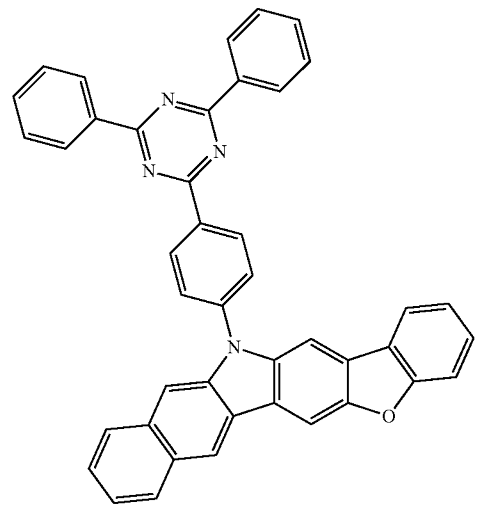
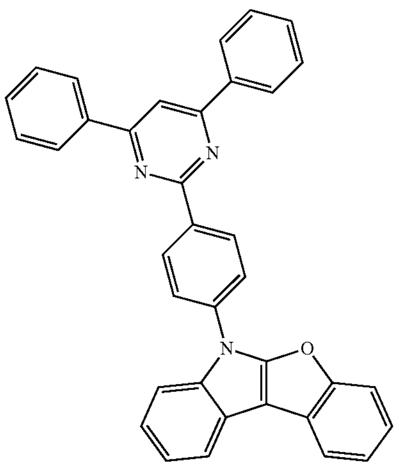
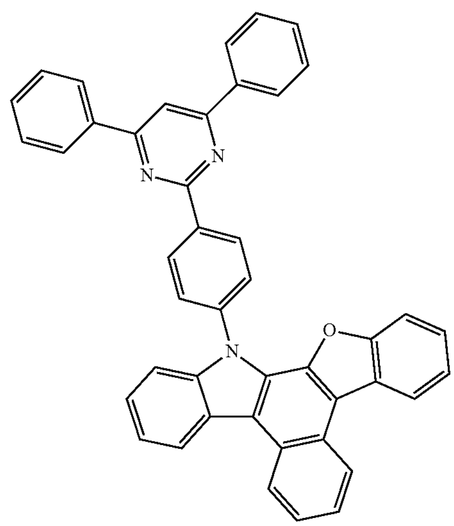
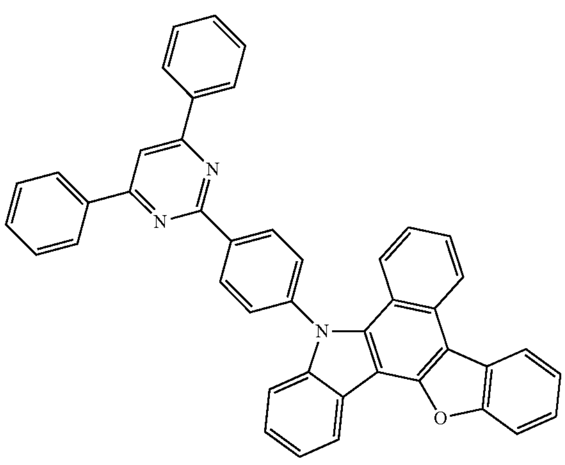
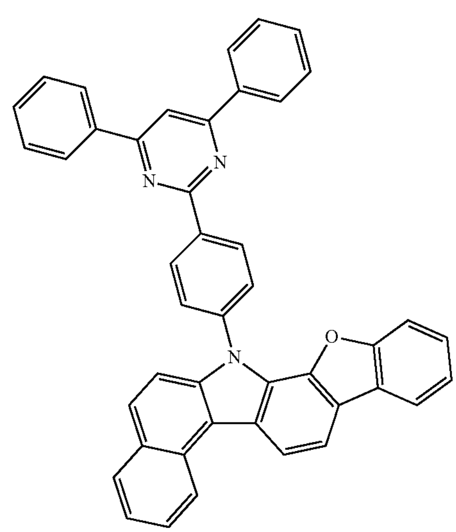

-continued
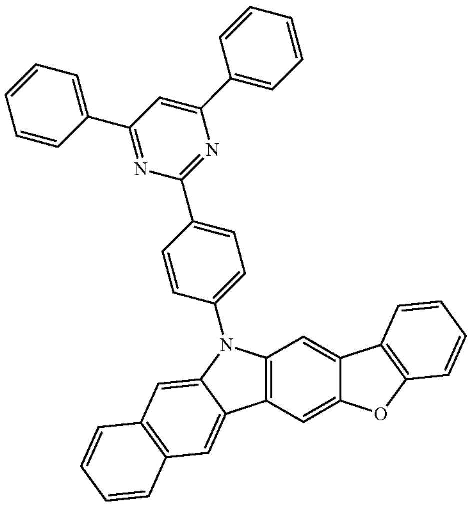
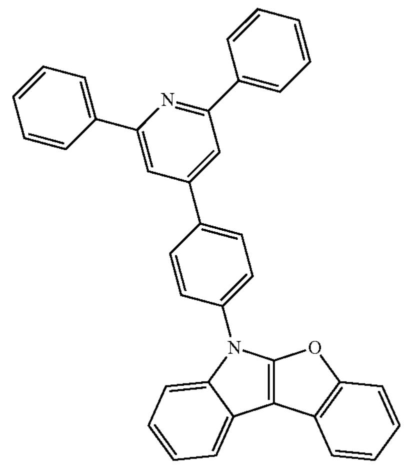
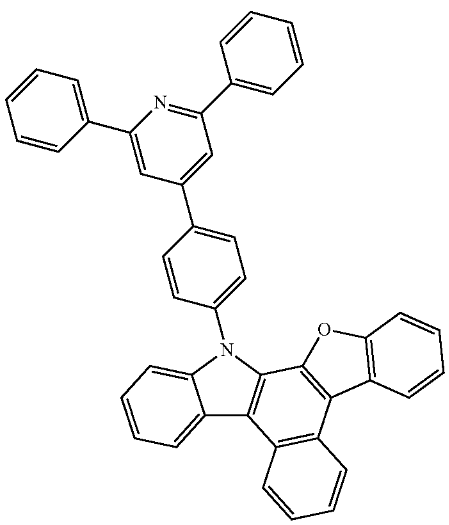
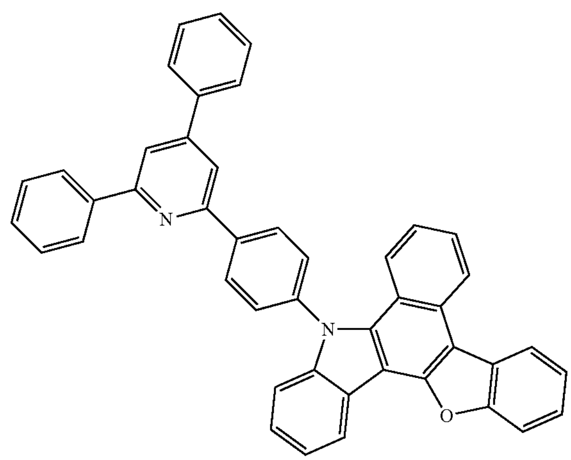
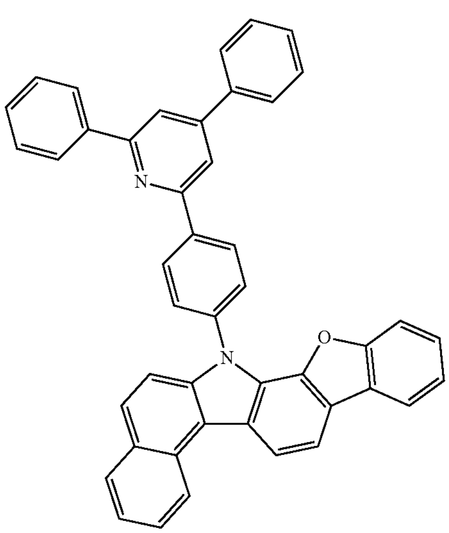
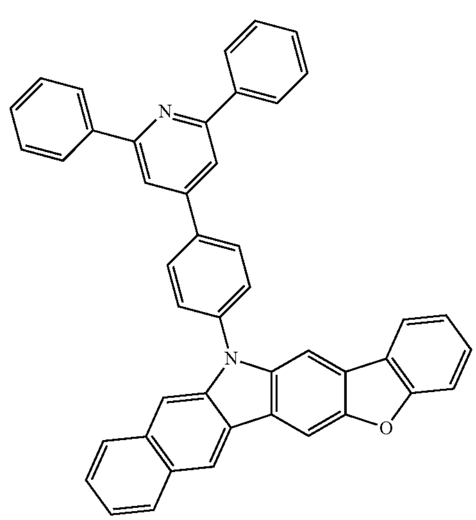

-continued
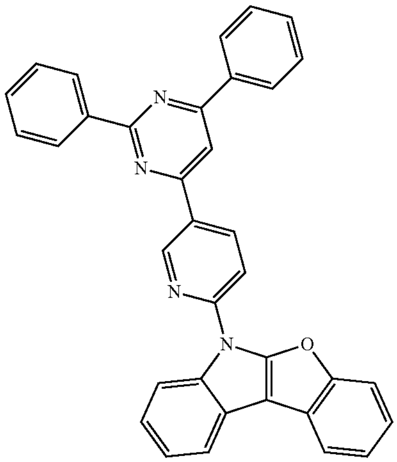
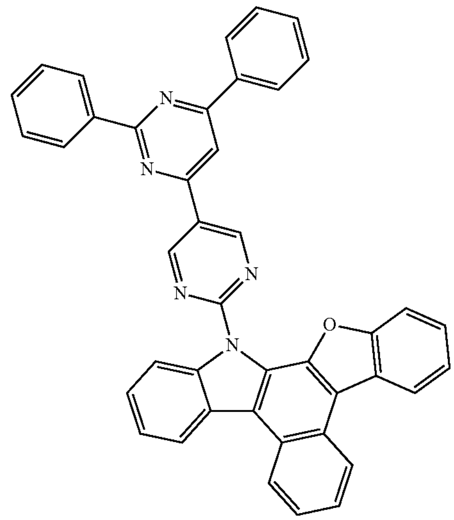
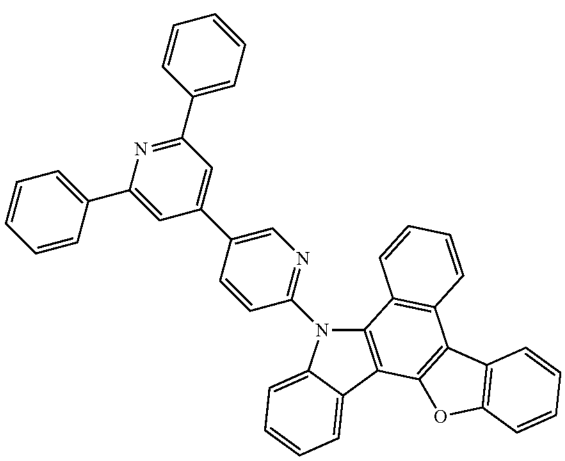
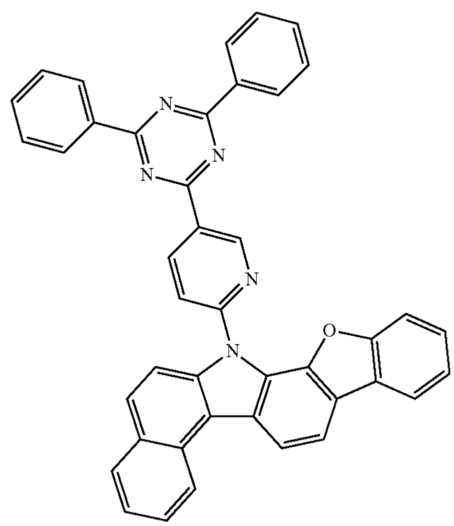
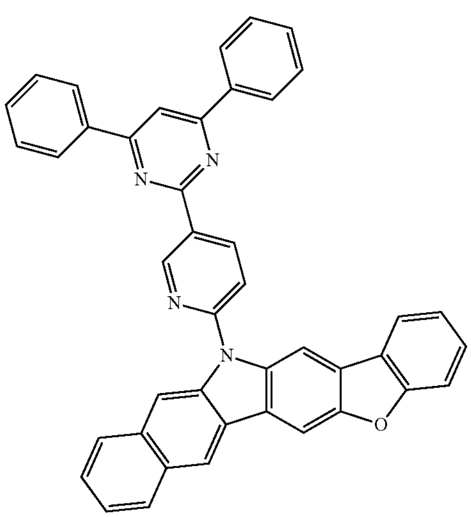
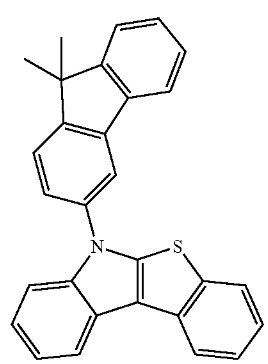

-continued
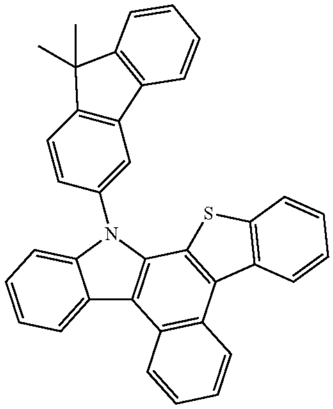
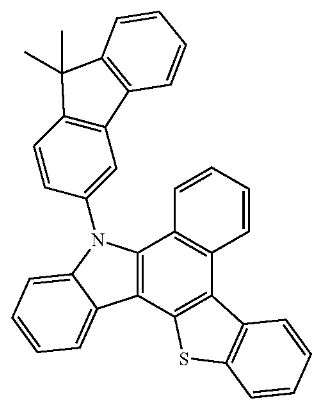
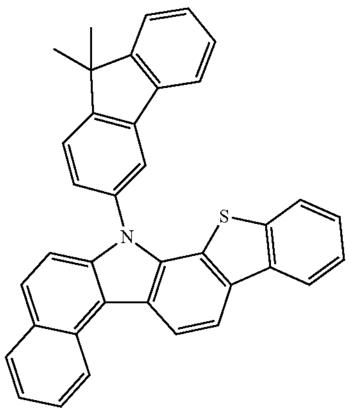
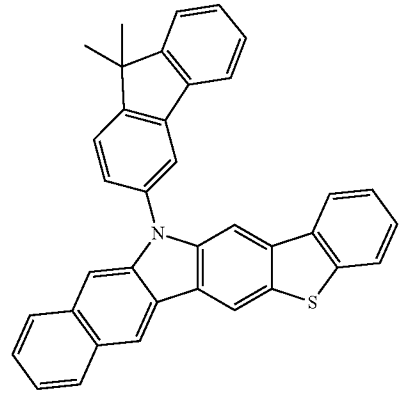
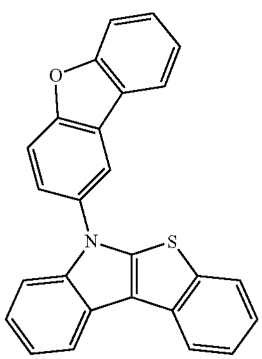
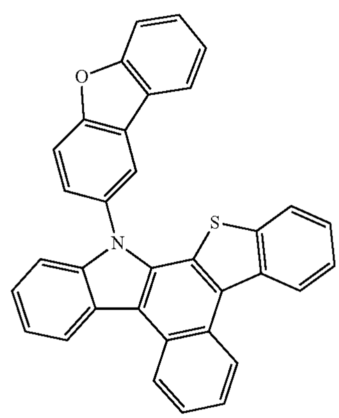
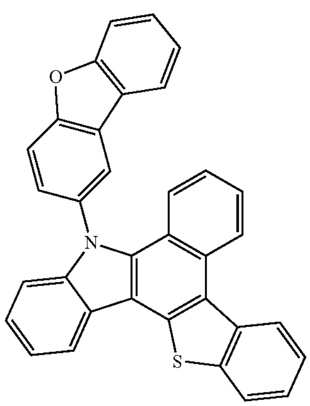
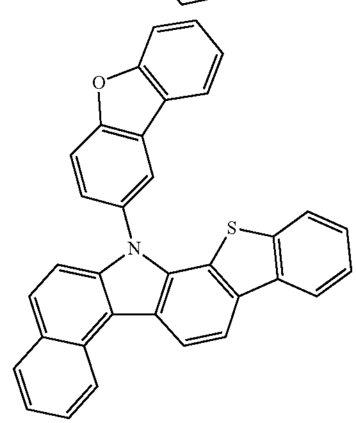

-continued
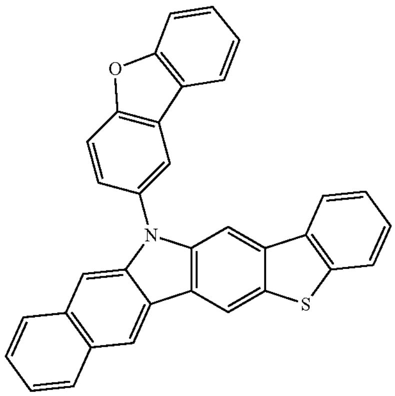
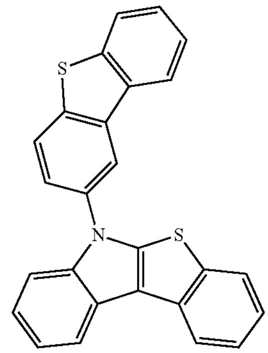
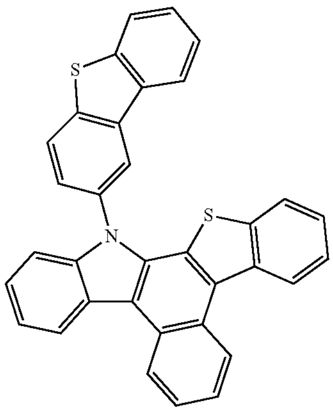
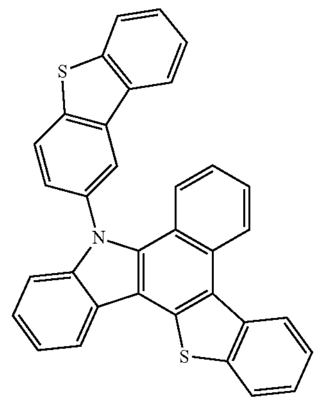
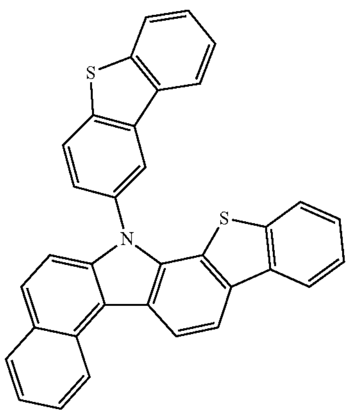
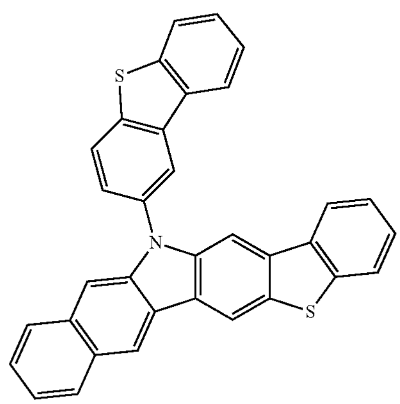
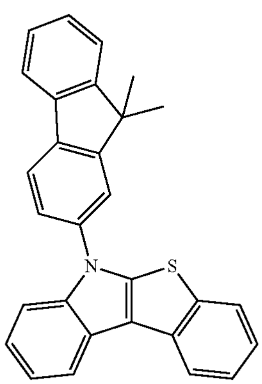
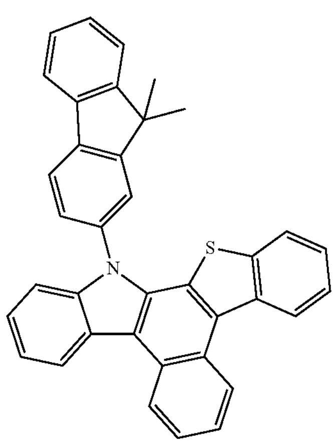
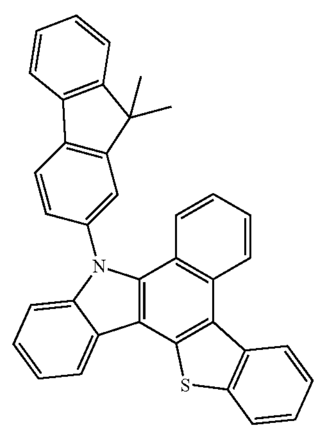

-continued
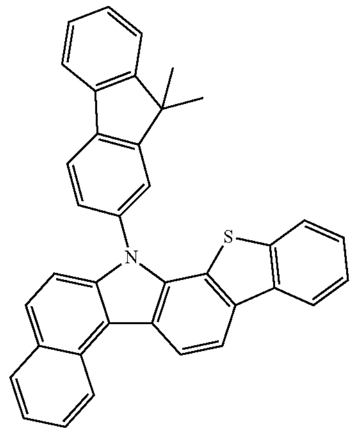
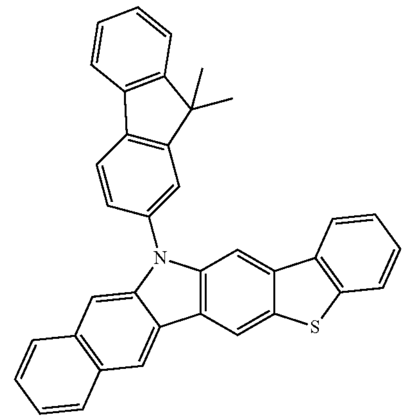
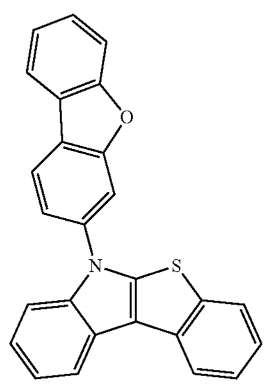
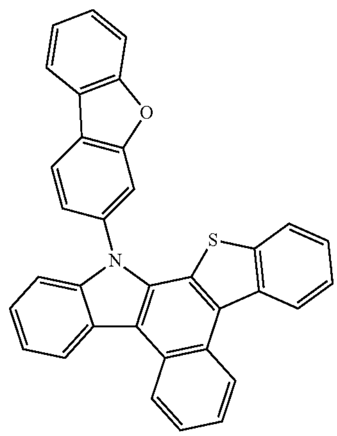
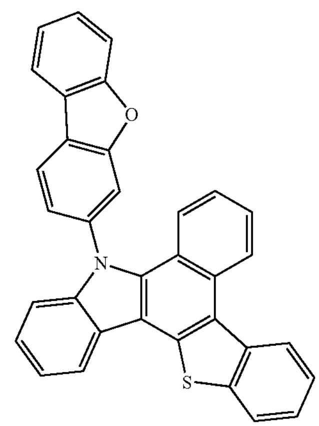
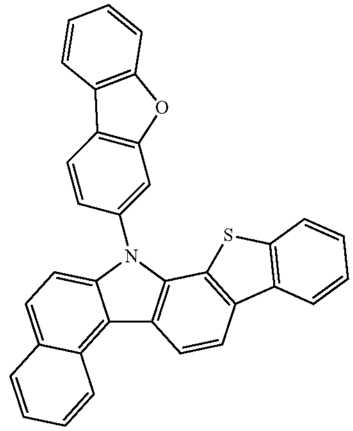
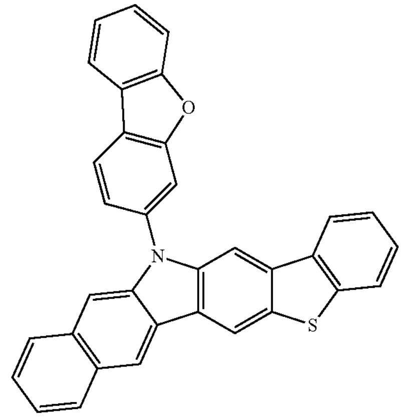

-continued
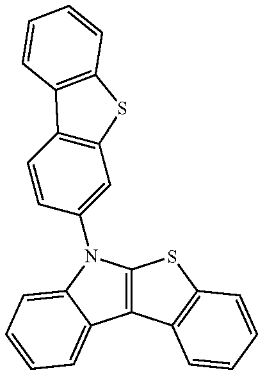
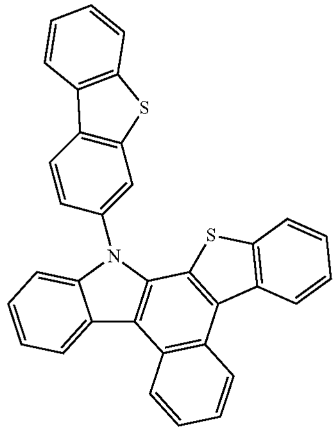
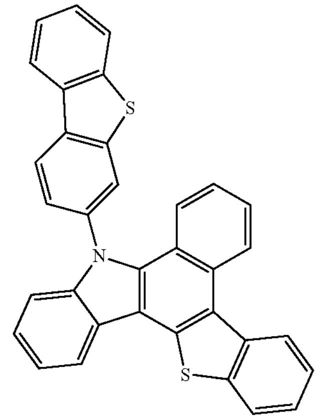
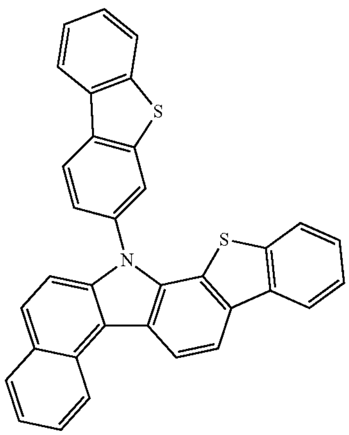
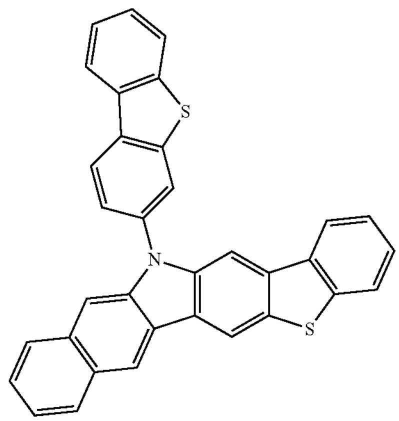
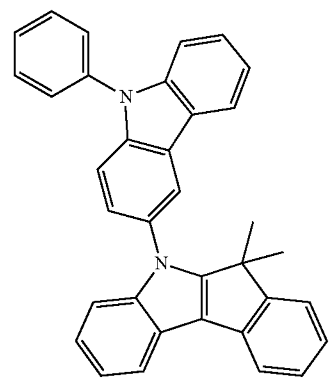
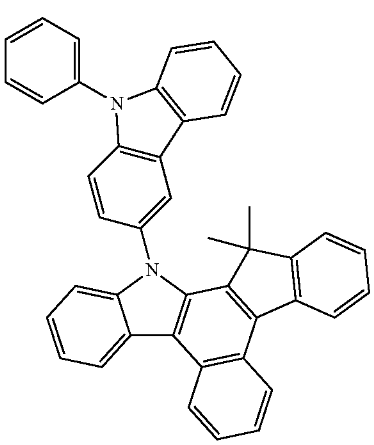
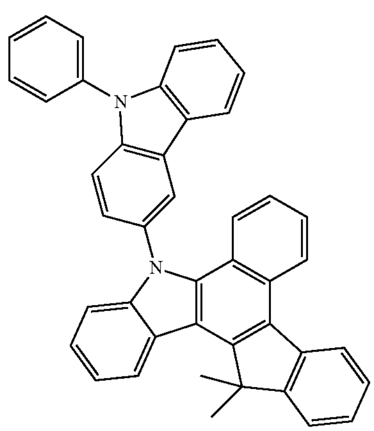
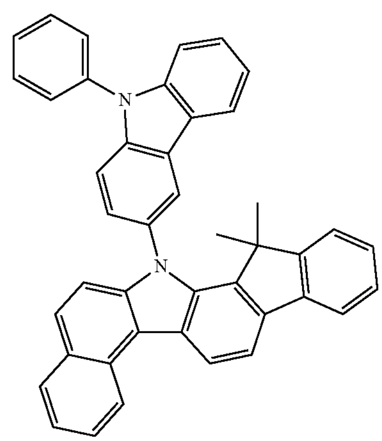

-continued
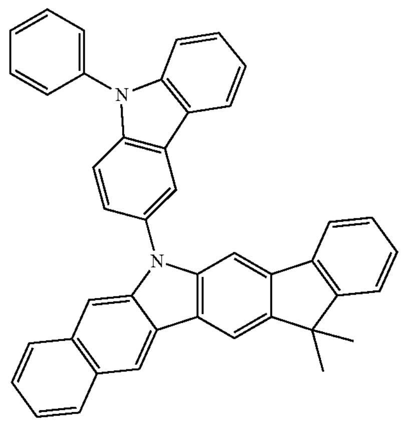
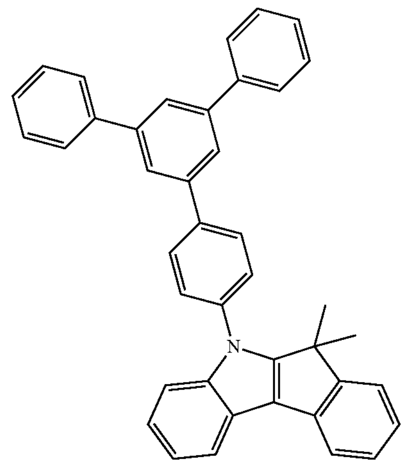
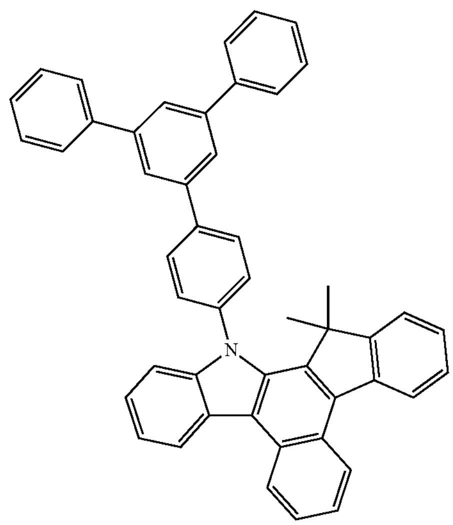
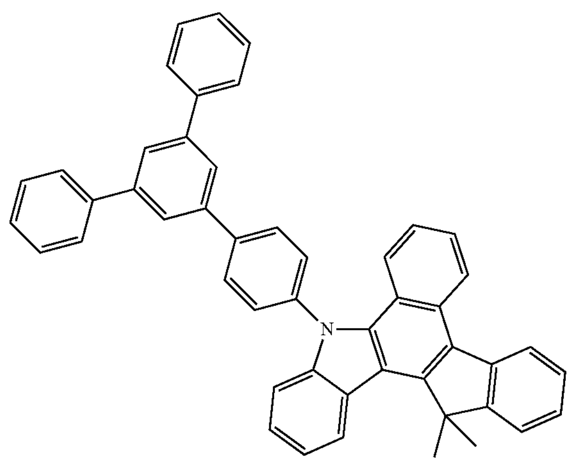
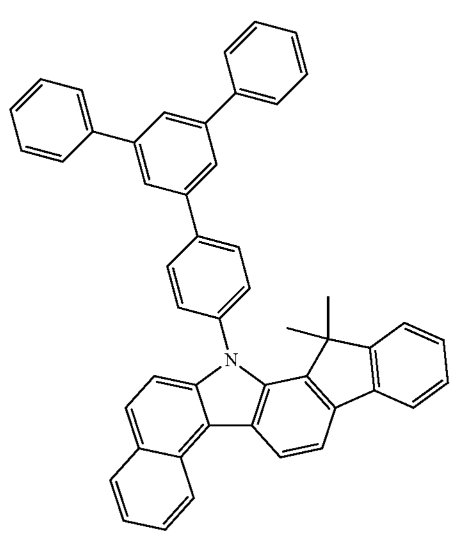
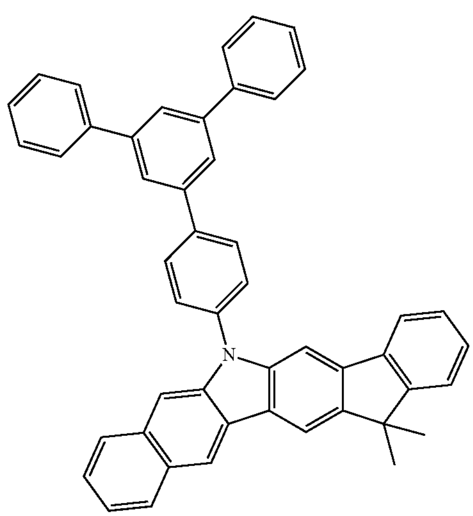

-continued
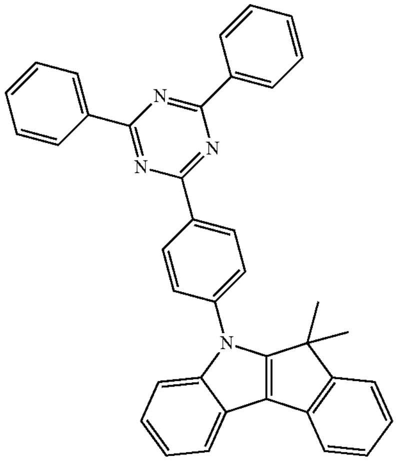
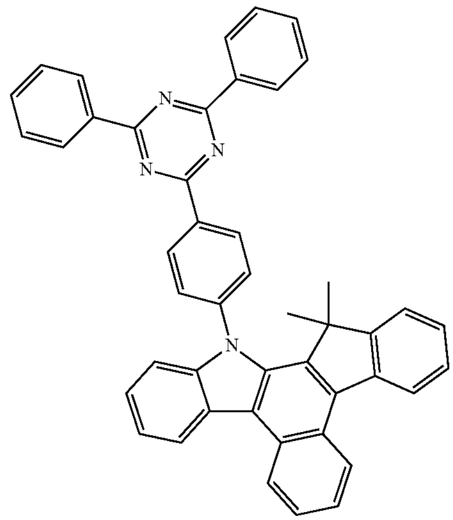
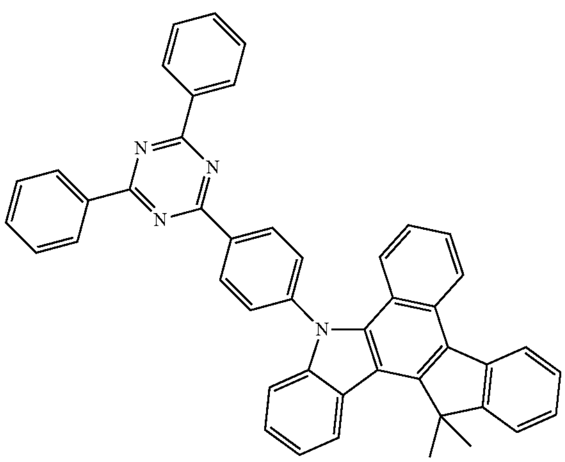
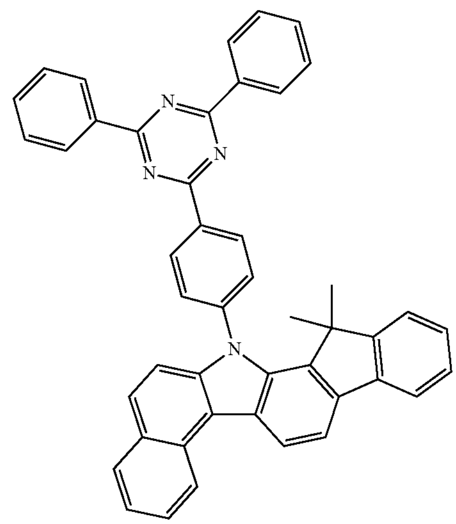
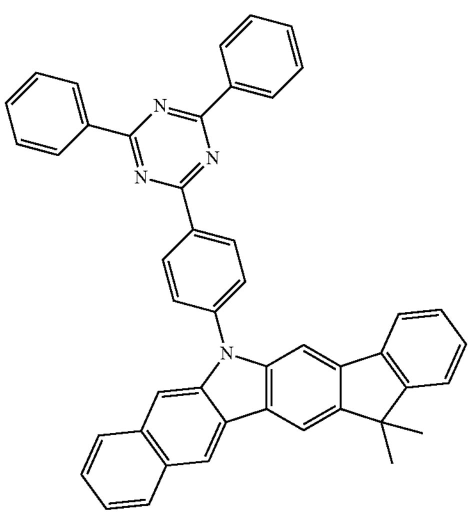
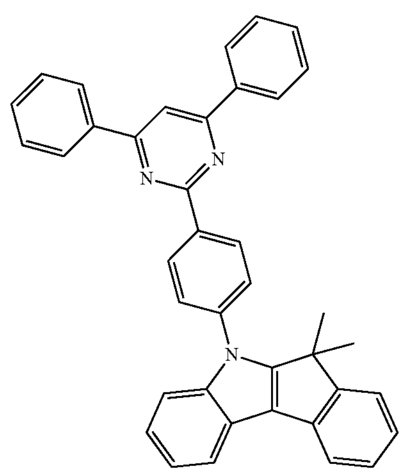

-continued
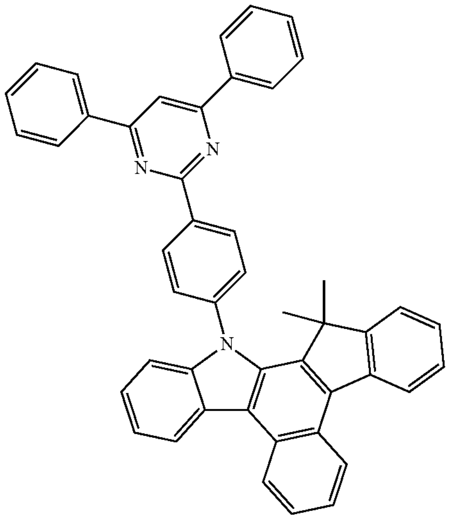
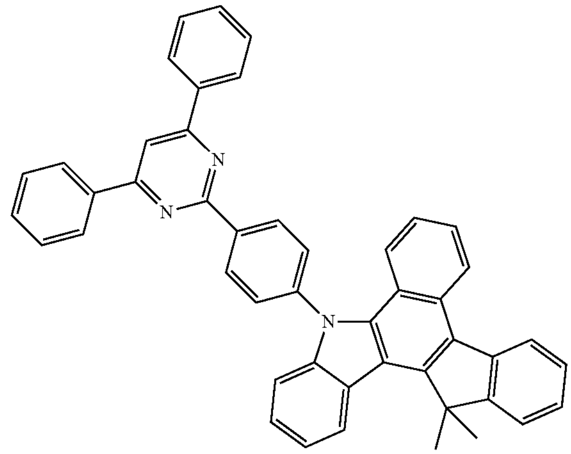
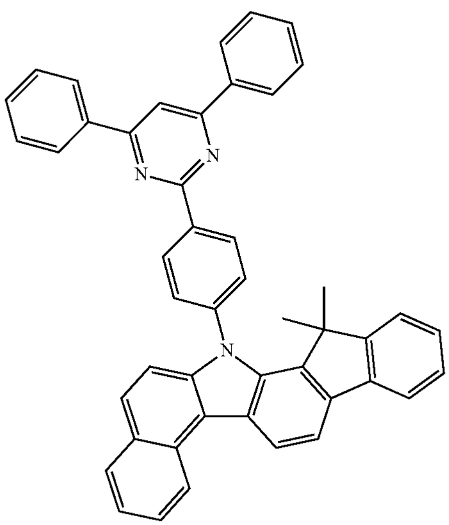
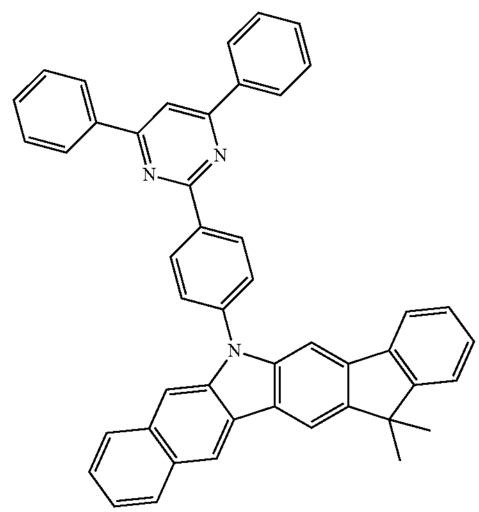
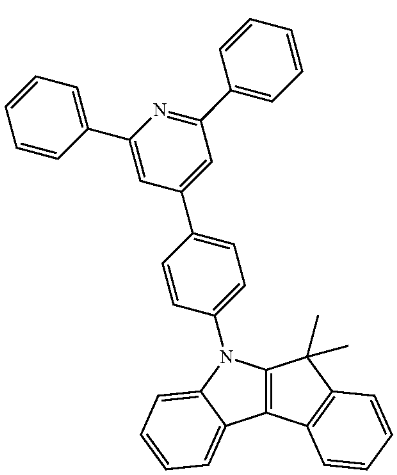
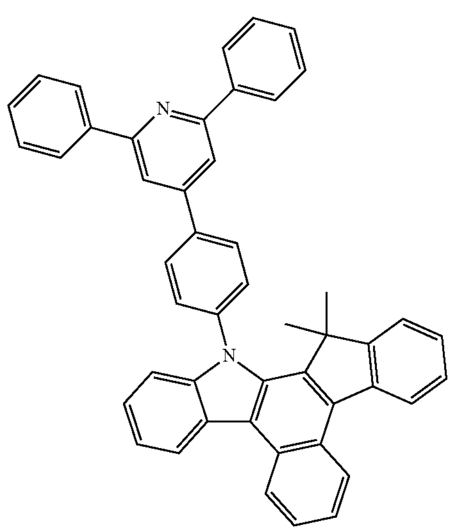

-continued
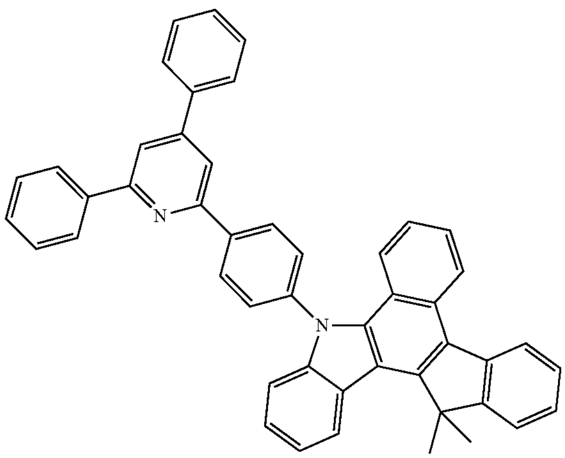
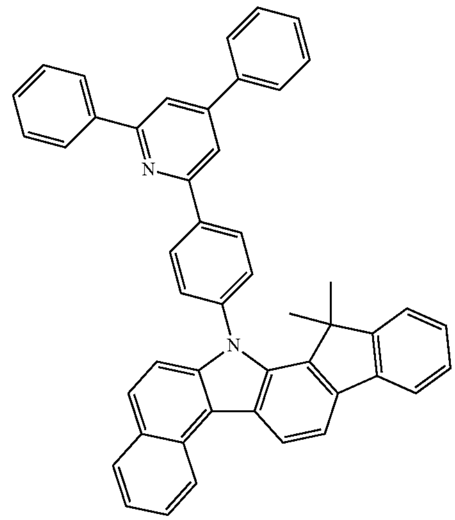
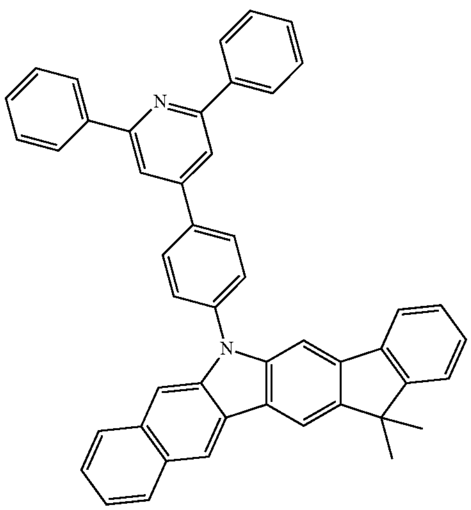
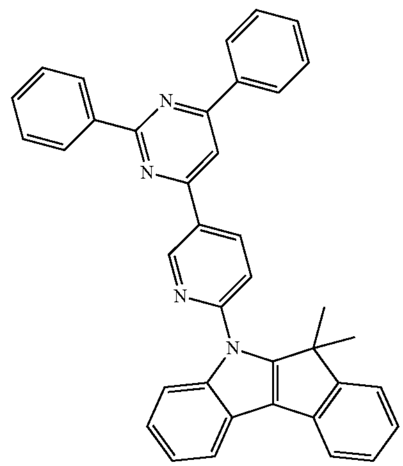
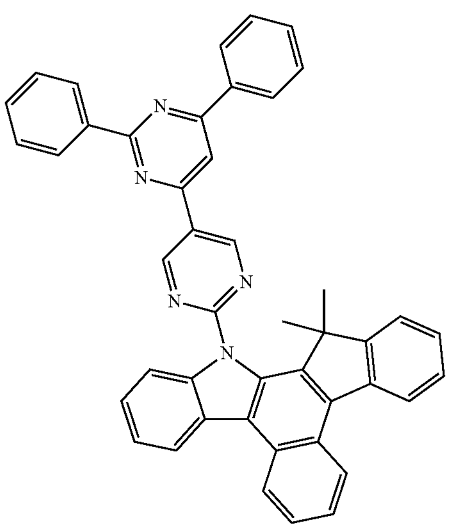
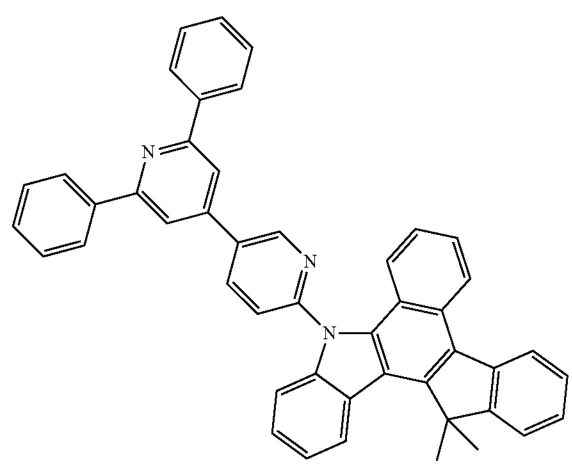

-continued
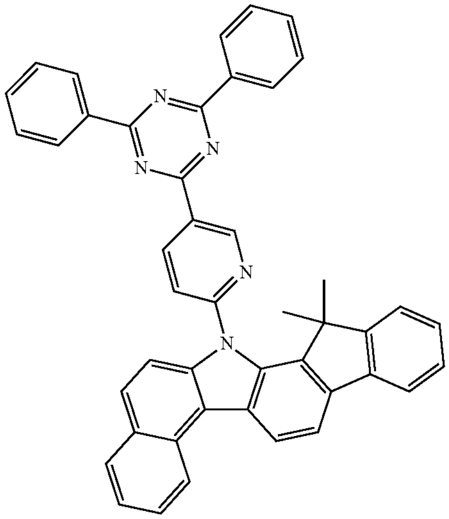
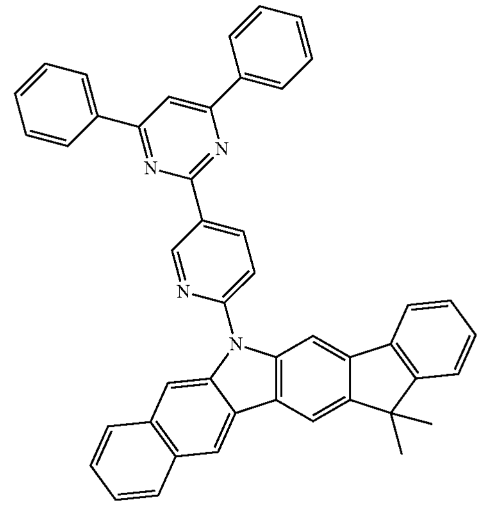
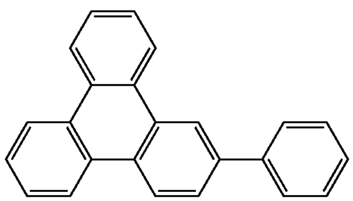
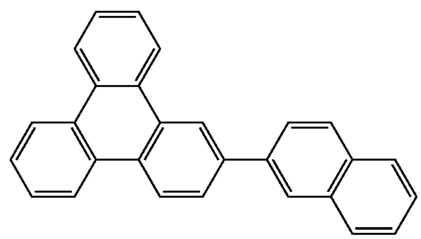
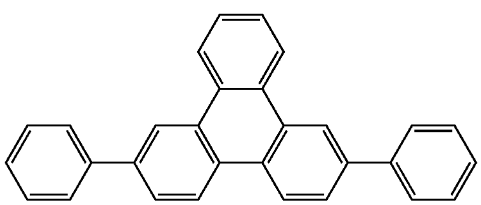
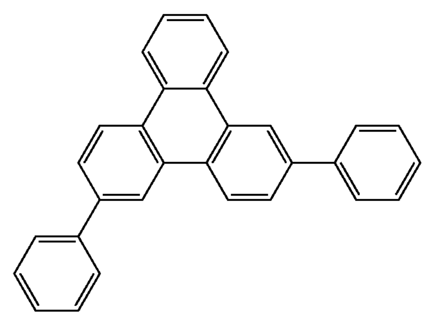
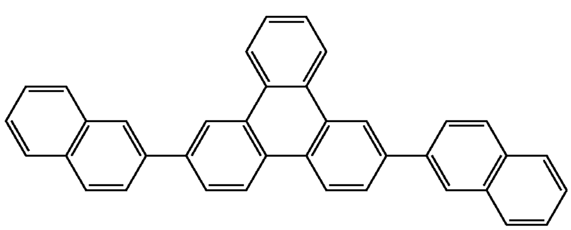
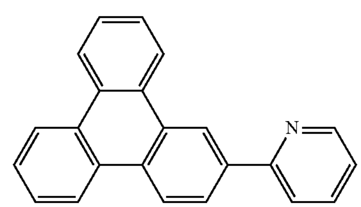
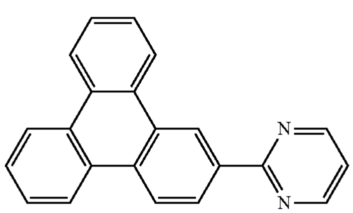
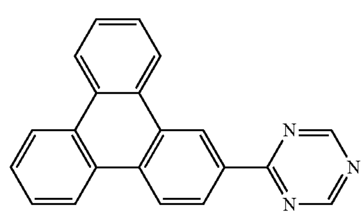

-continued
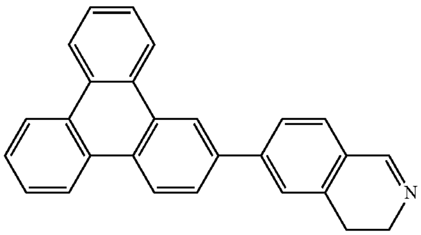
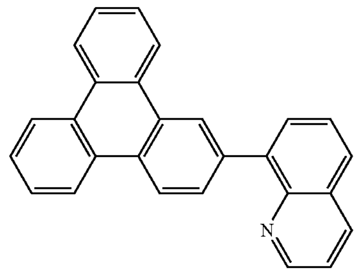
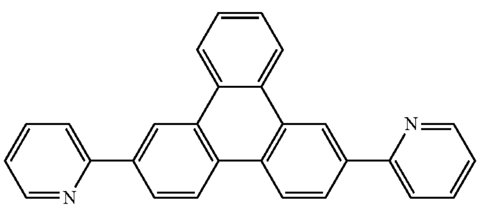
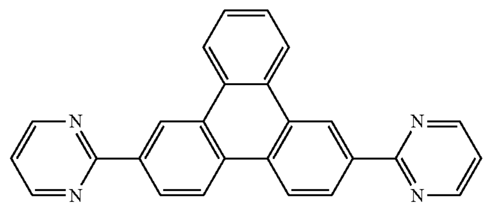
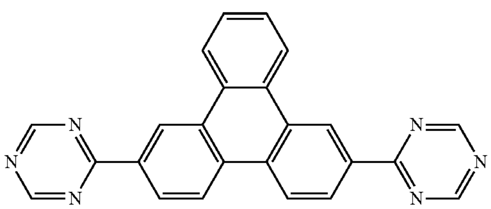
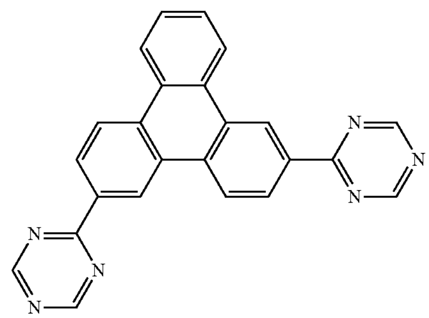
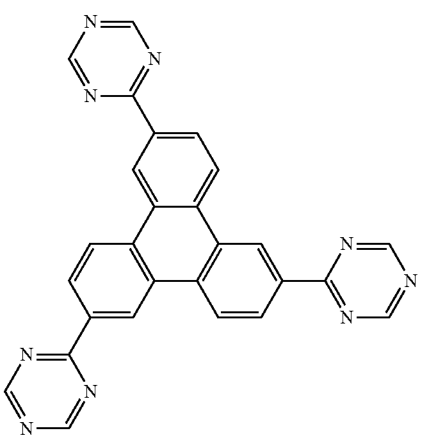
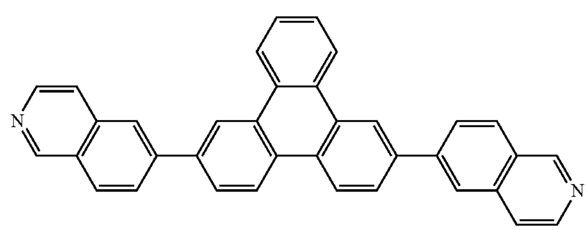
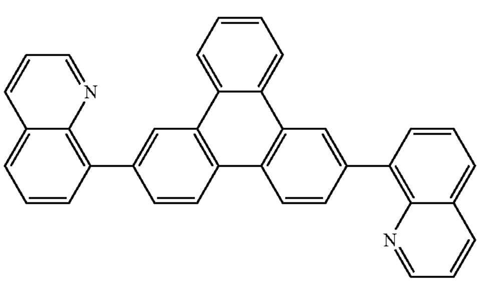
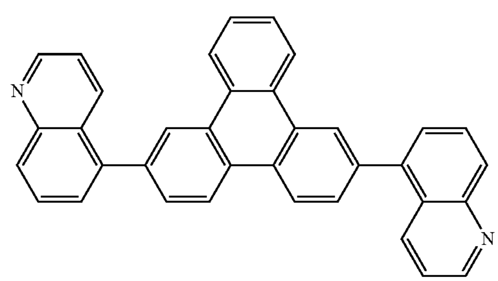

-continued
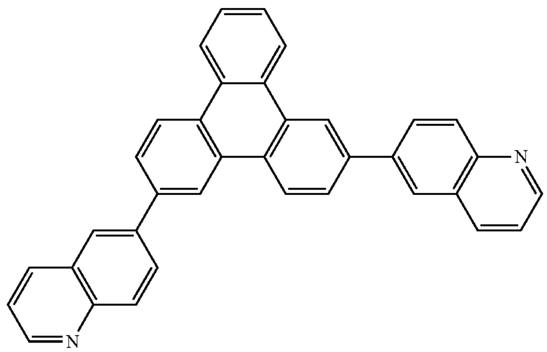
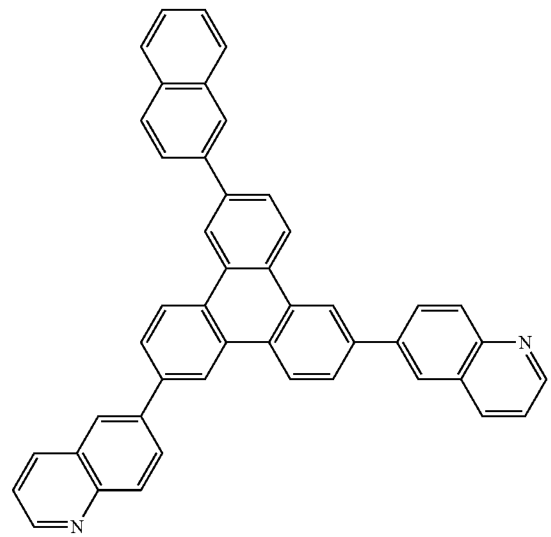
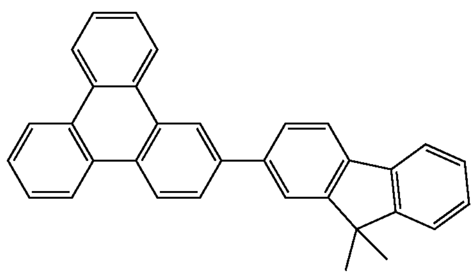
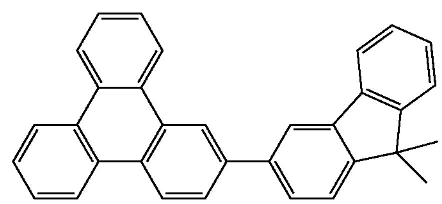
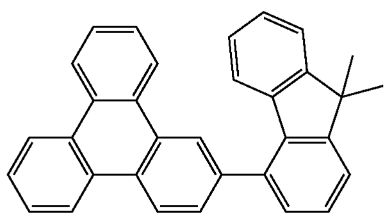
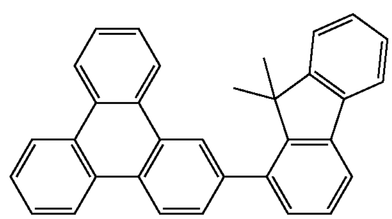
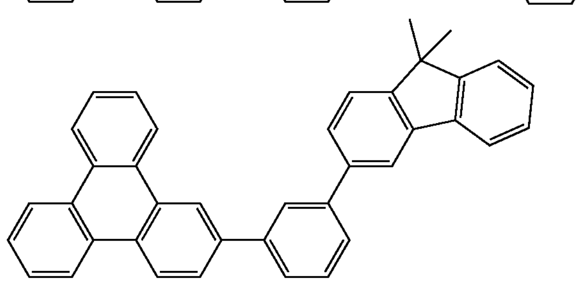
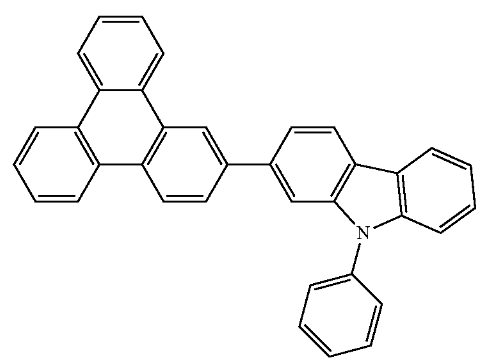
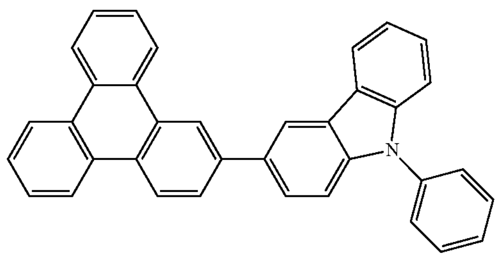
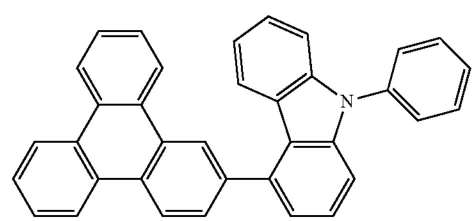

-continued
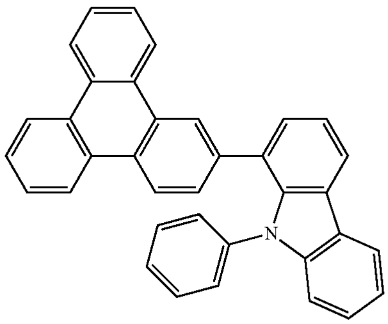
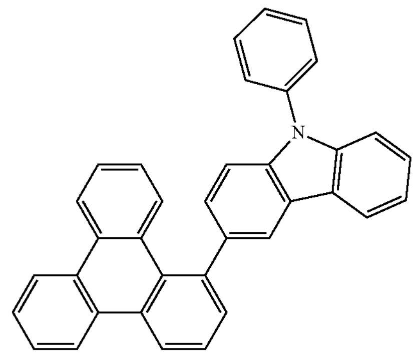
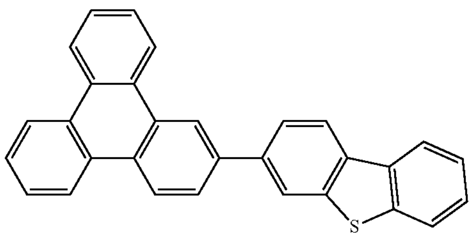
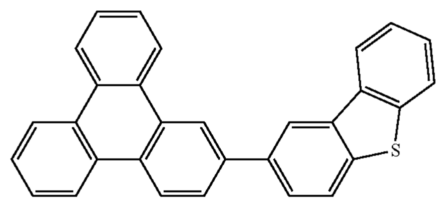
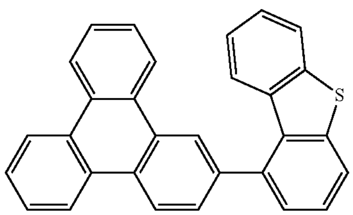
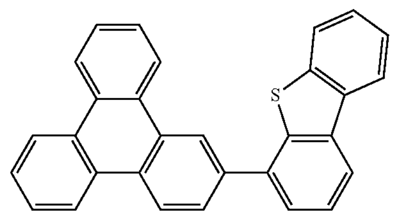
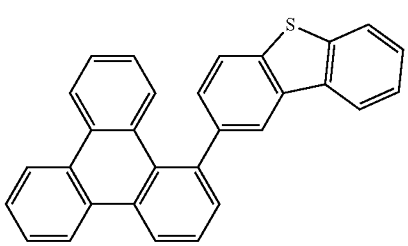
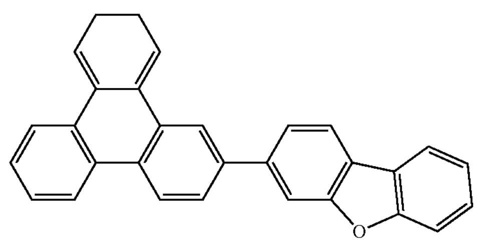
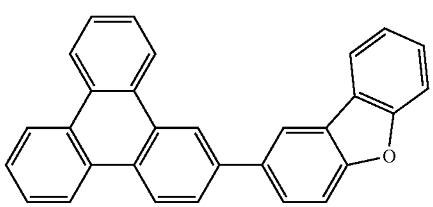
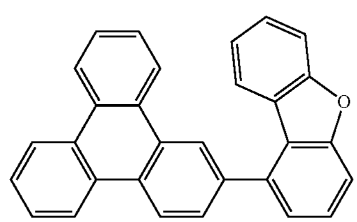
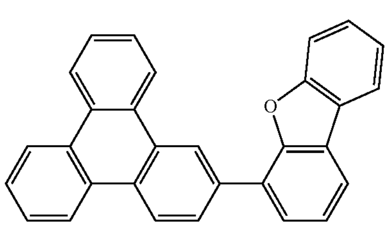
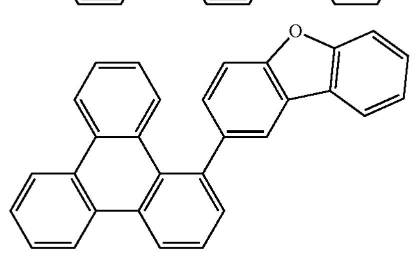

-continued
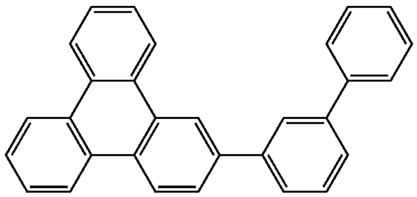
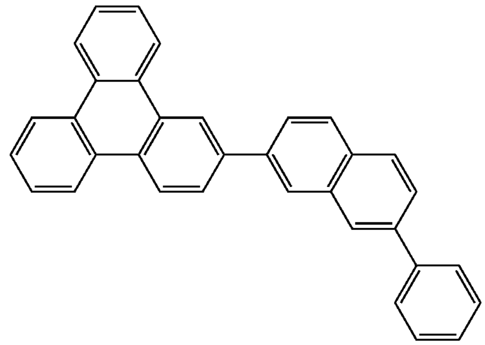
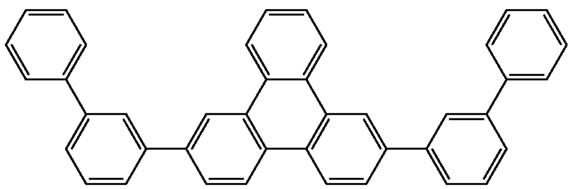
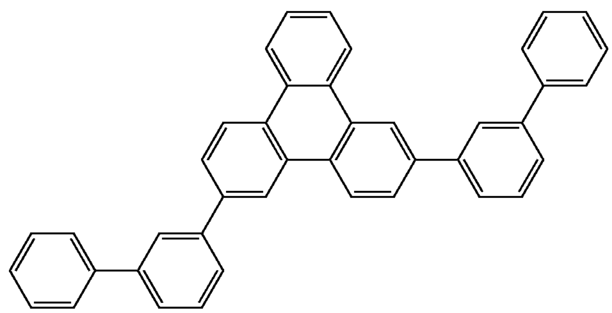
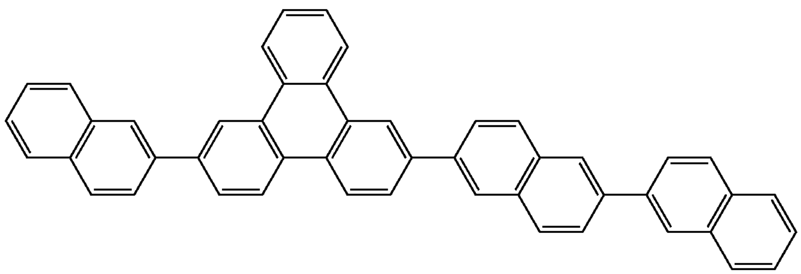
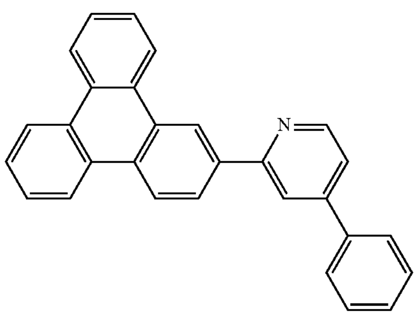
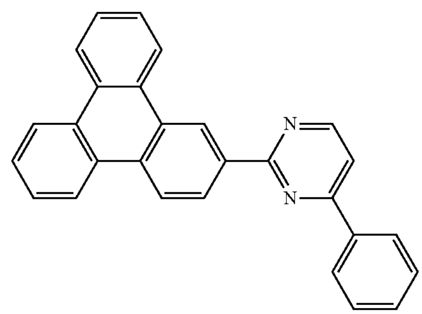
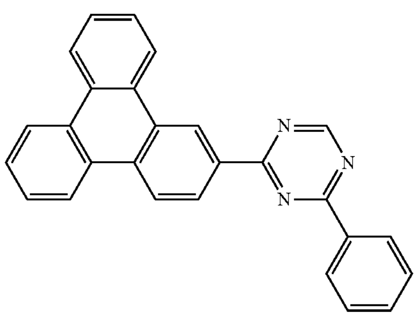
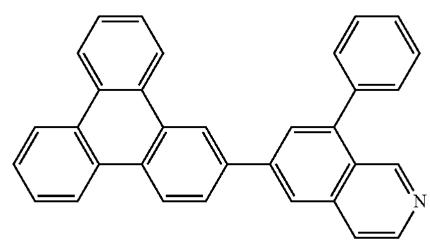

-continued
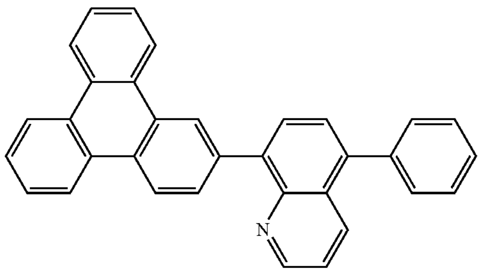
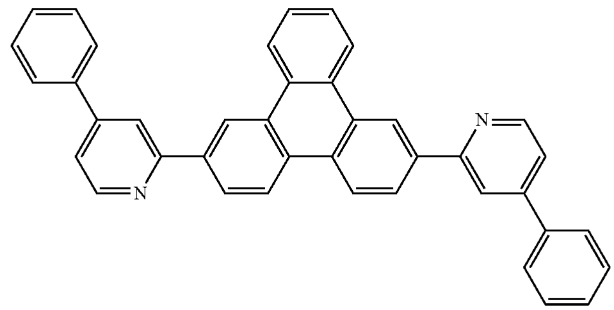
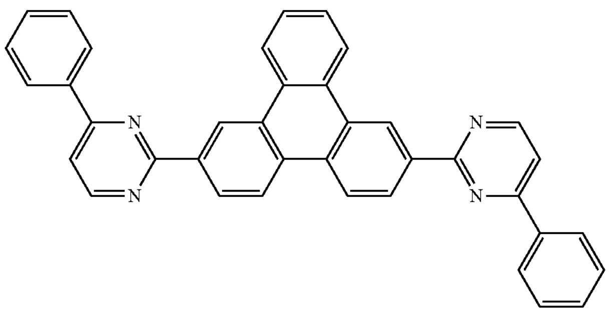
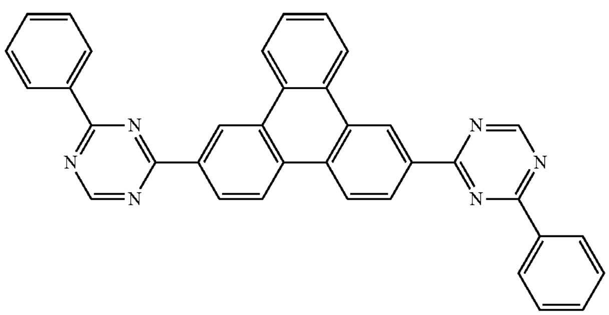
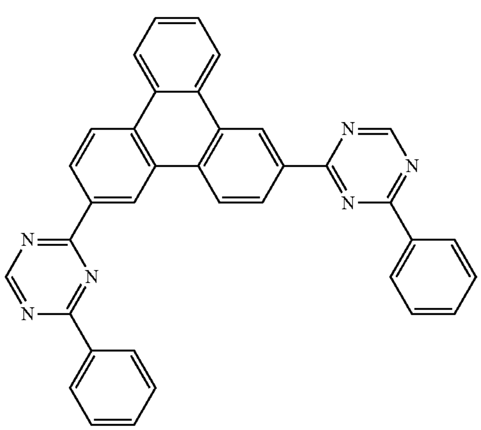
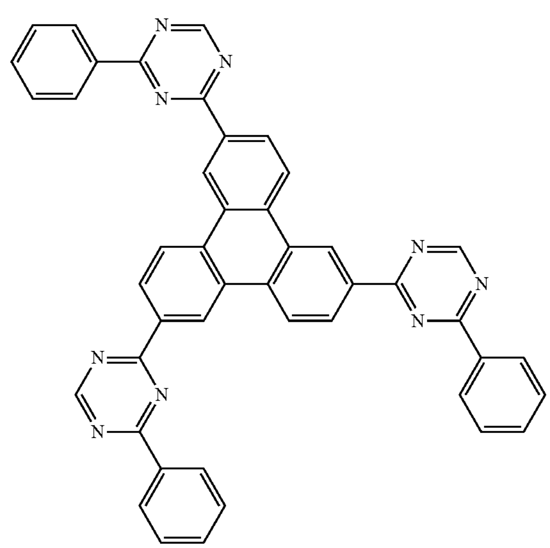

-continued
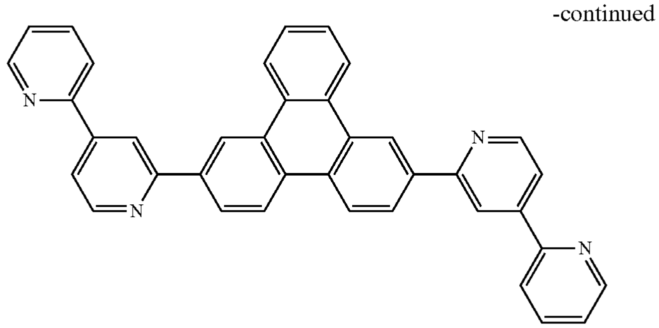
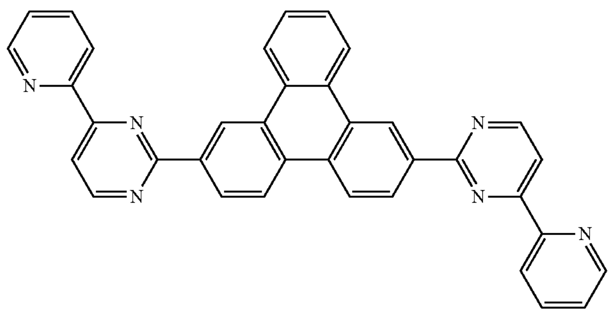
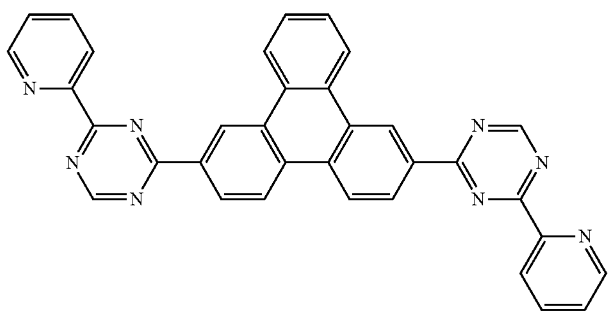
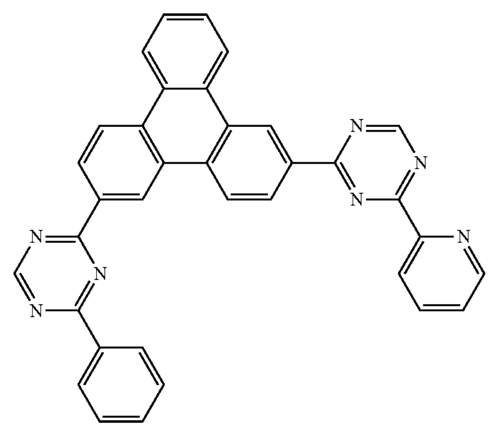
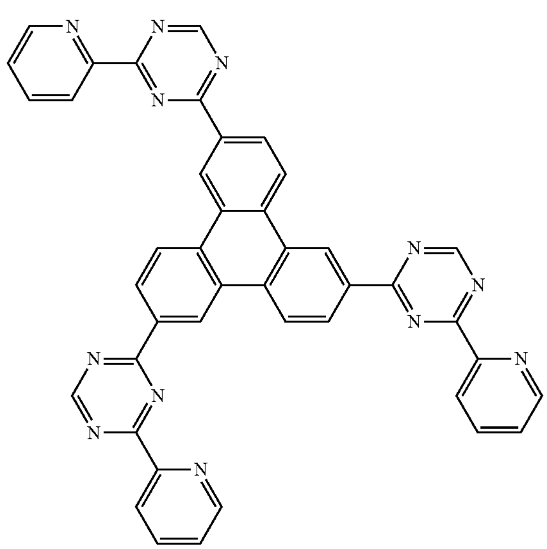
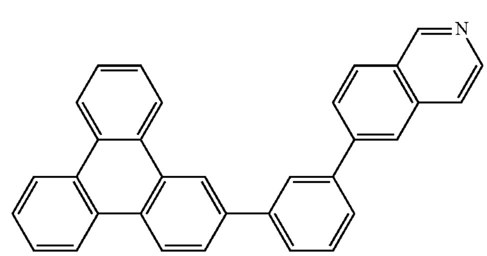

-continued
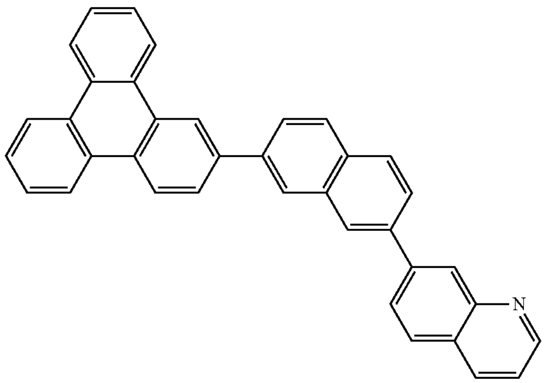
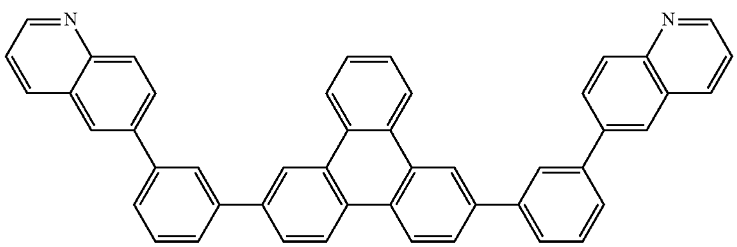
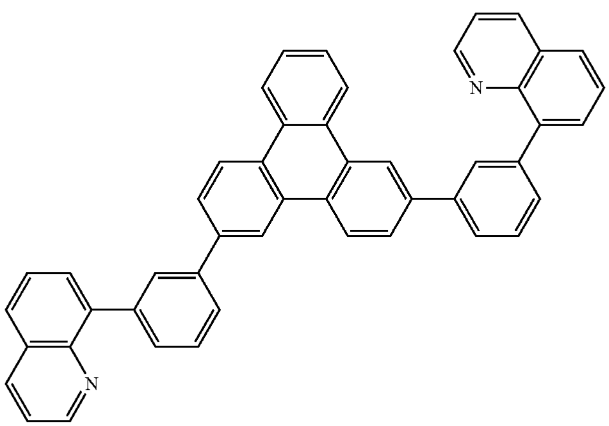
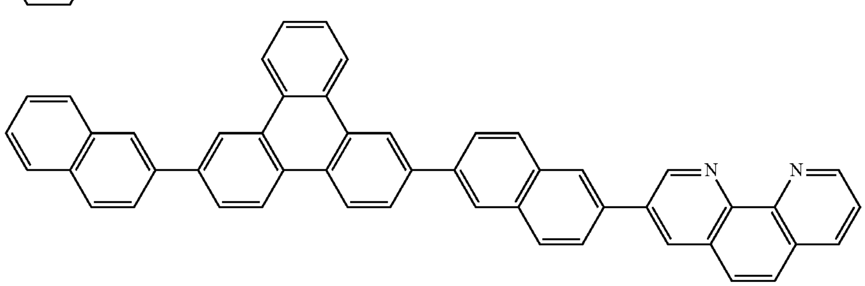
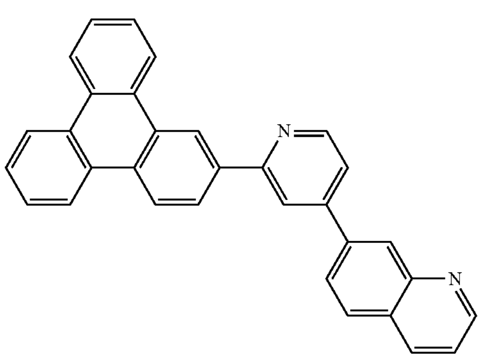
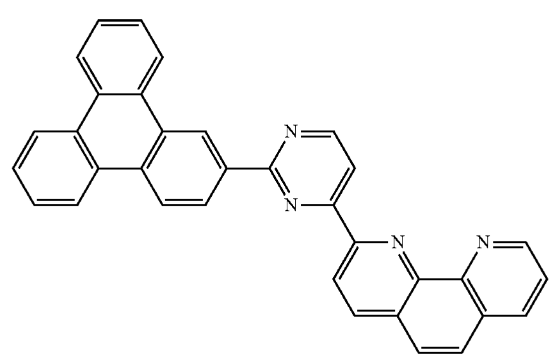

-continued
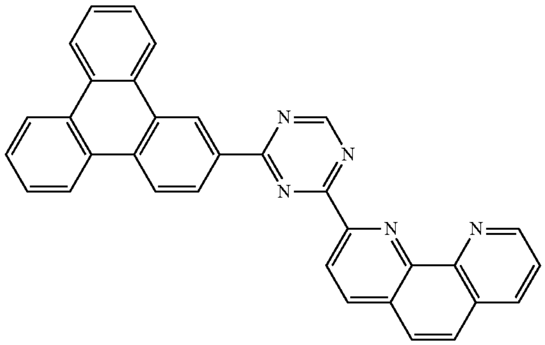
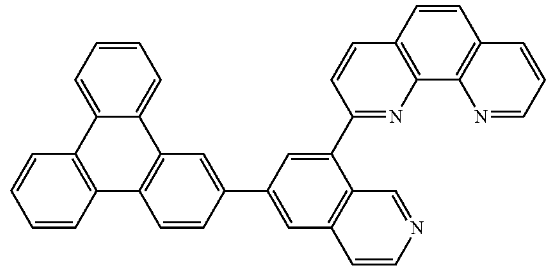
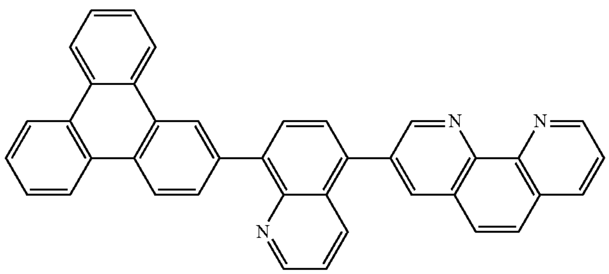
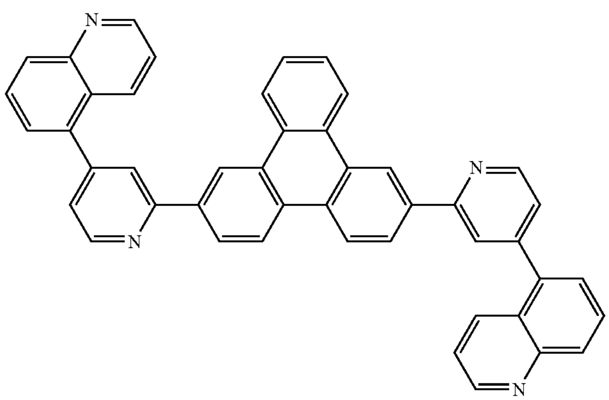
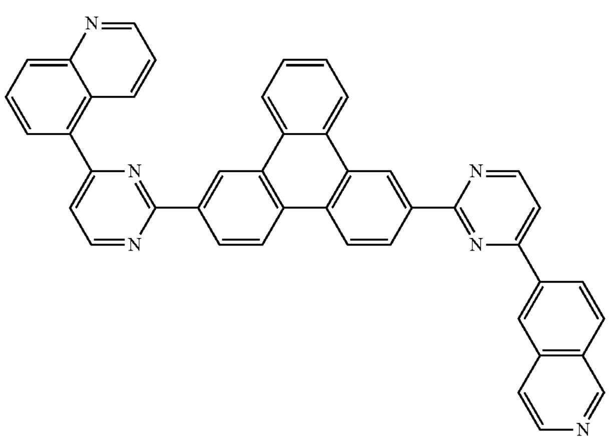

-continued
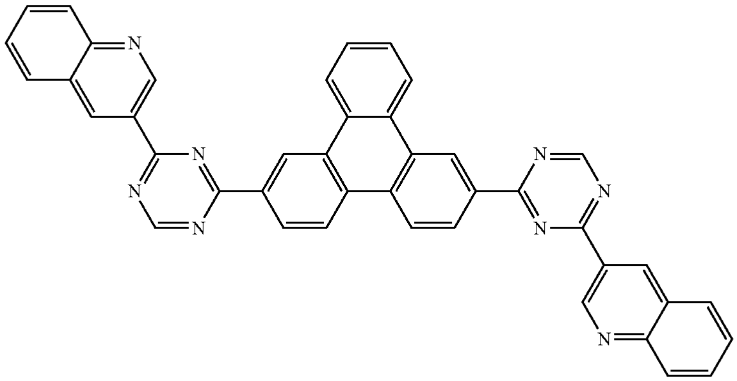
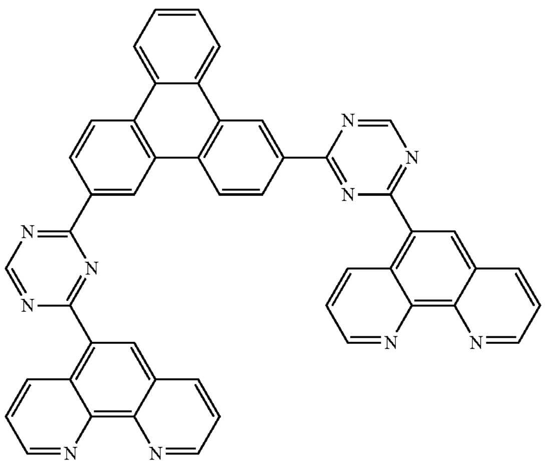
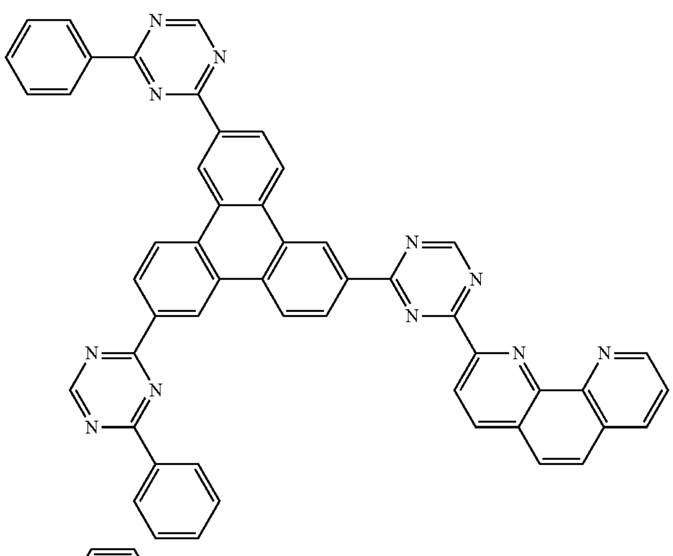
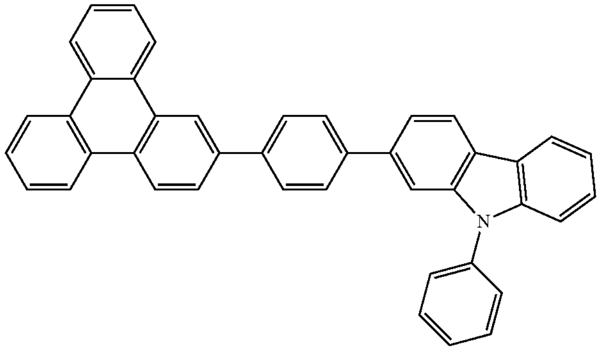

-continued
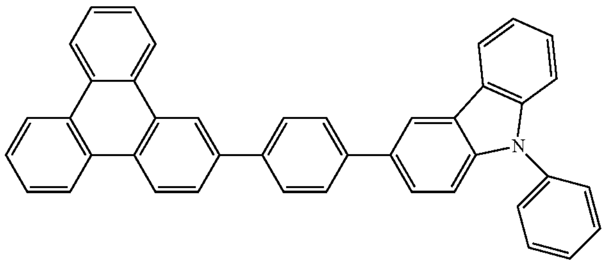
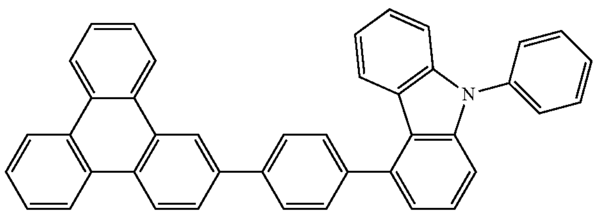
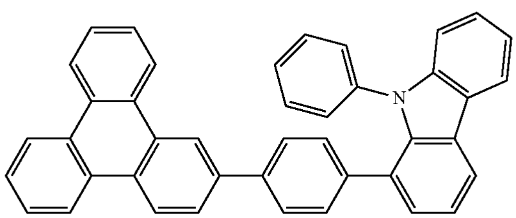
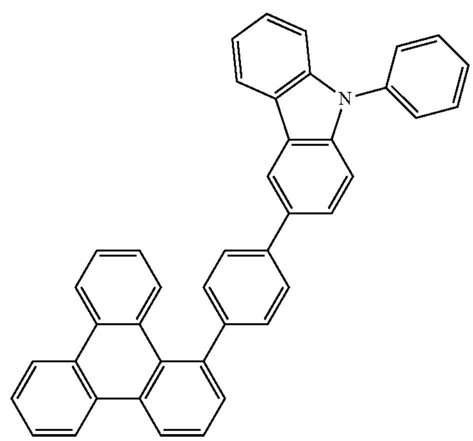
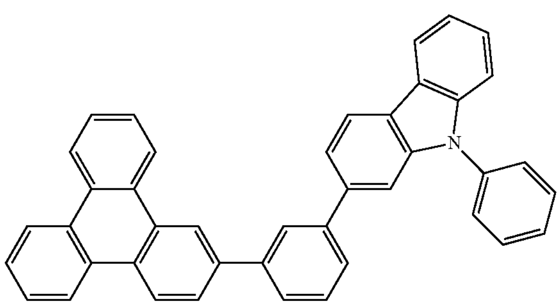
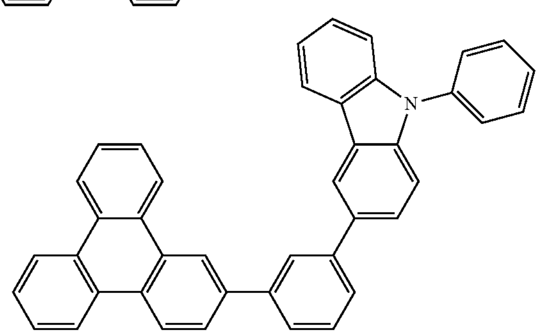
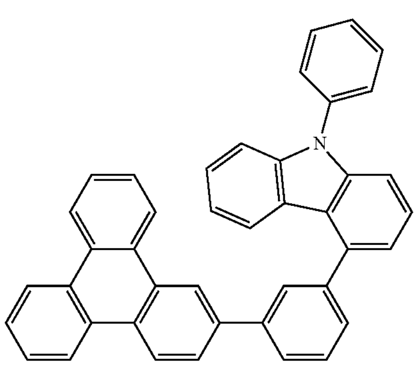
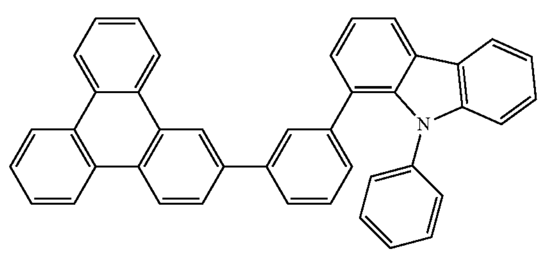

-continued
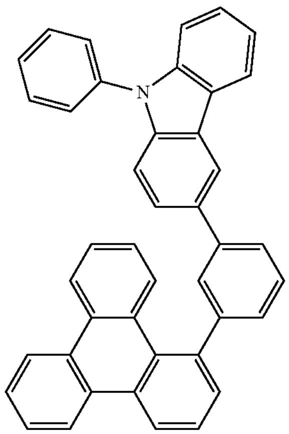
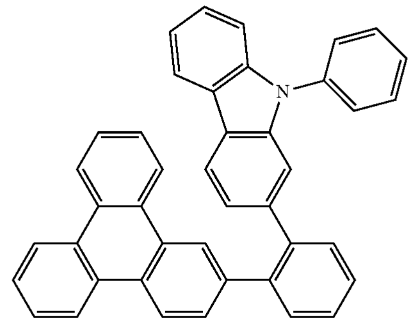
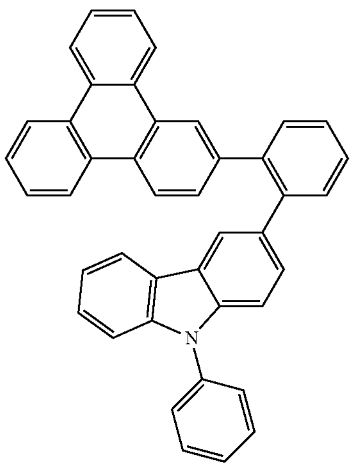
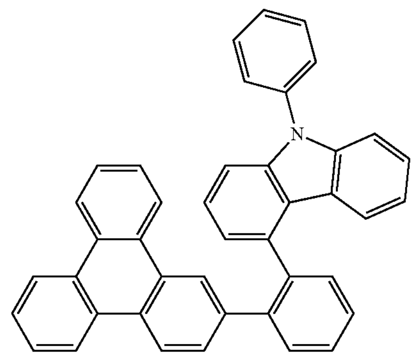
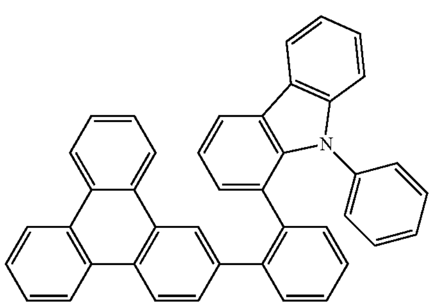
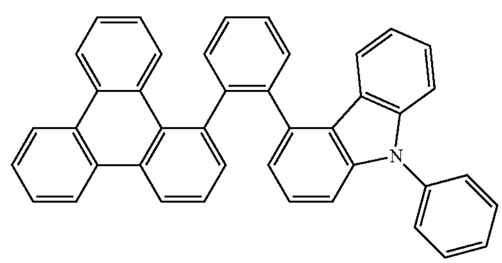
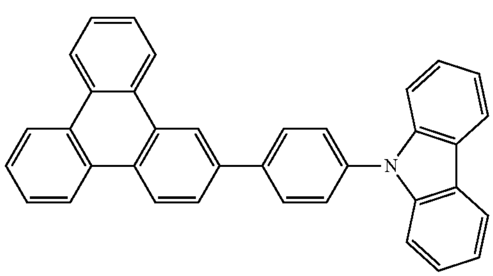
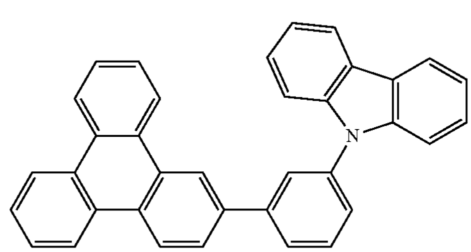

-continued
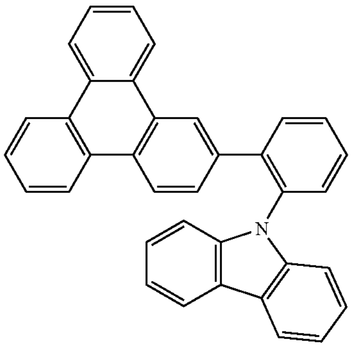
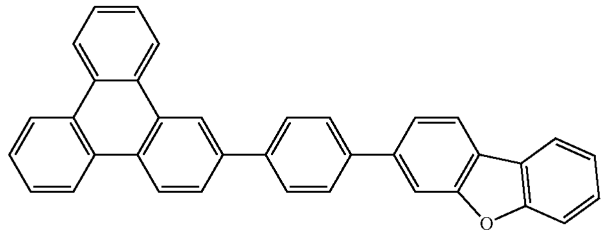
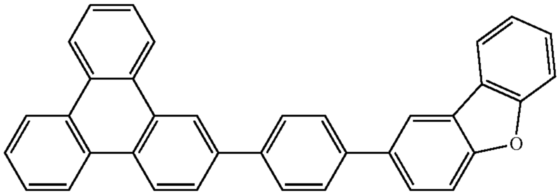
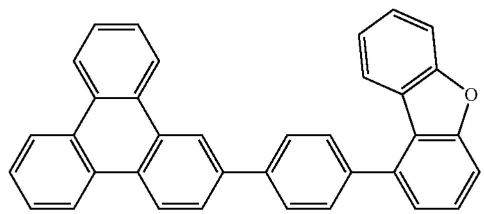
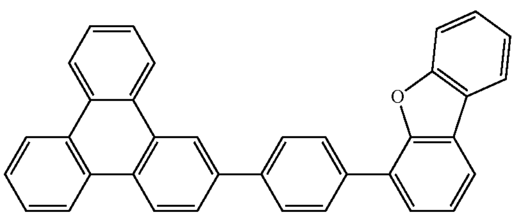
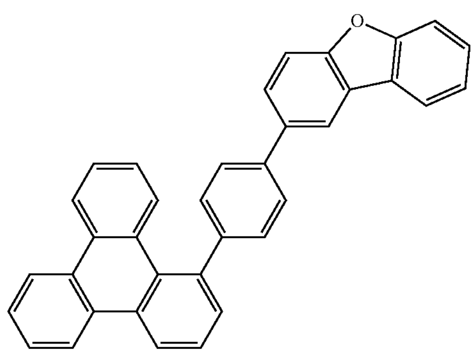
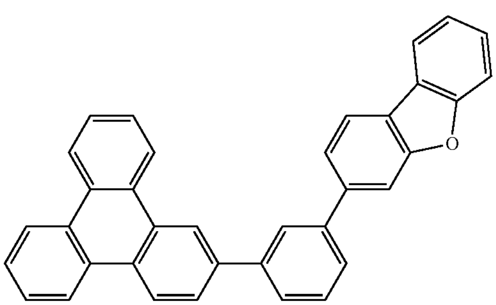
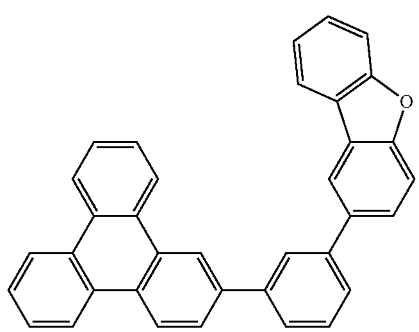
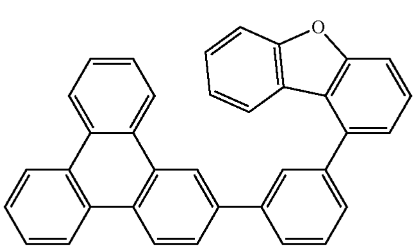
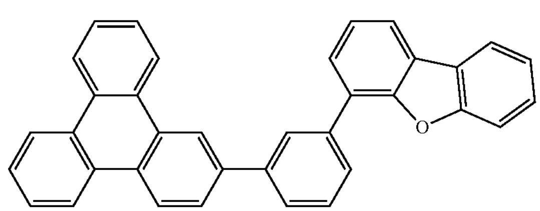

-continued
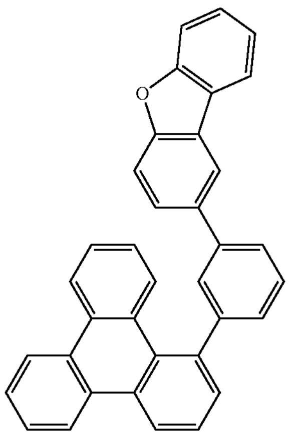
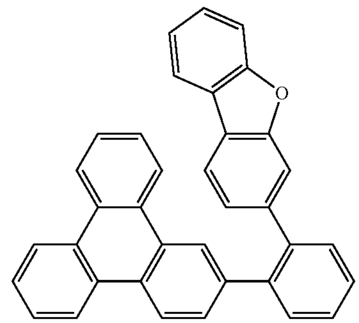
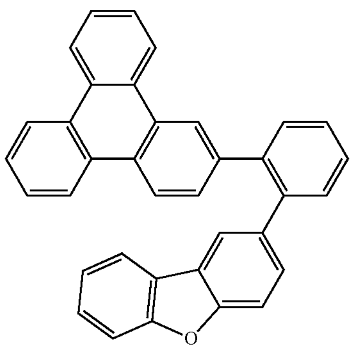
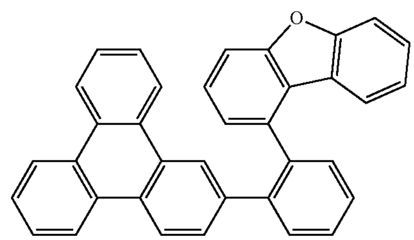
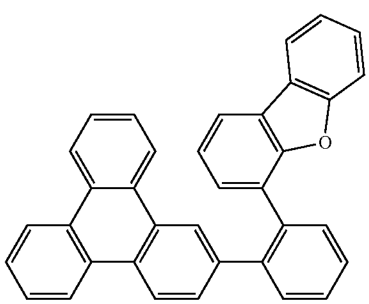
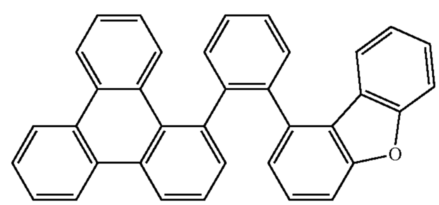
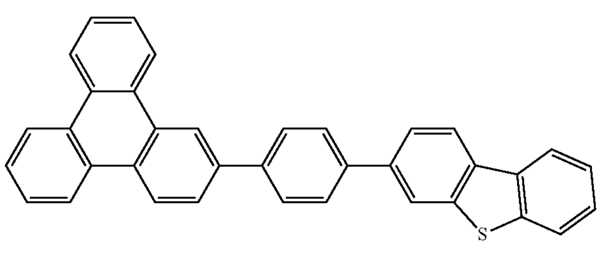
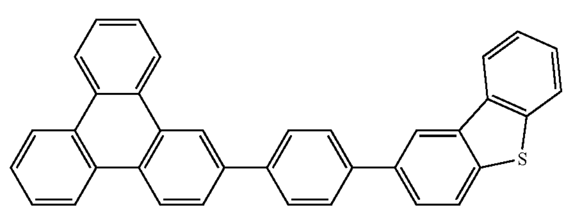
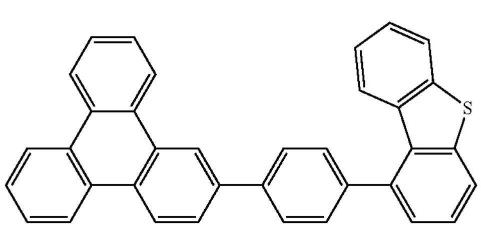
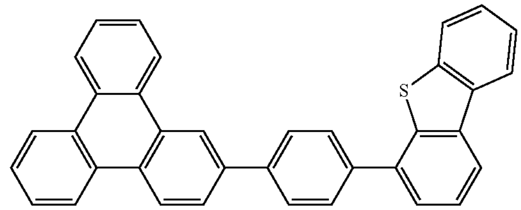

-continued
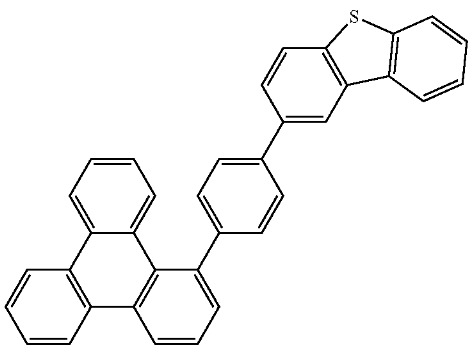
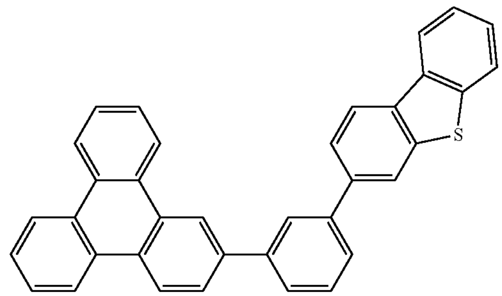
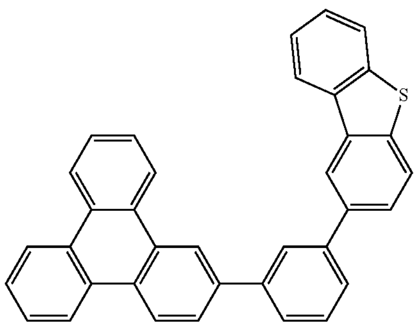
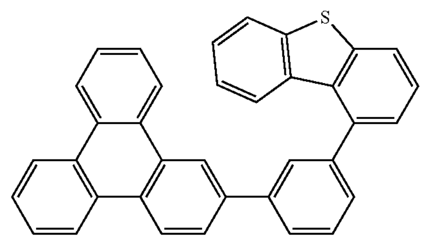
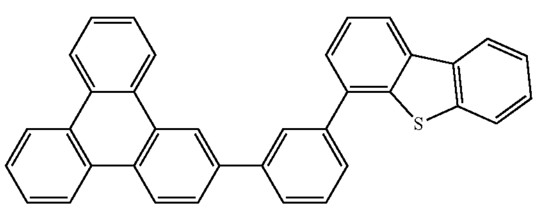
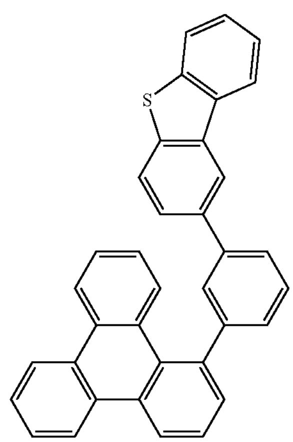
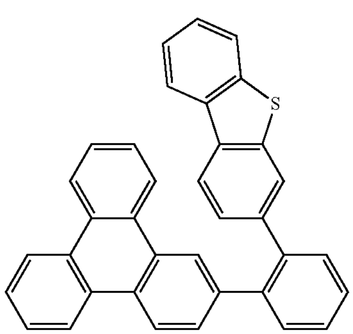
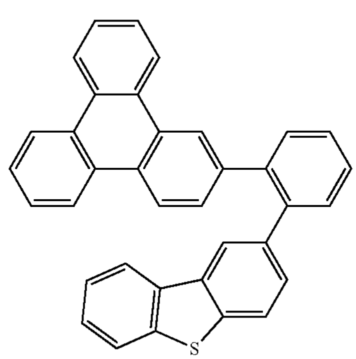

-continued
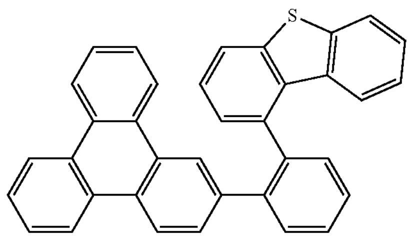
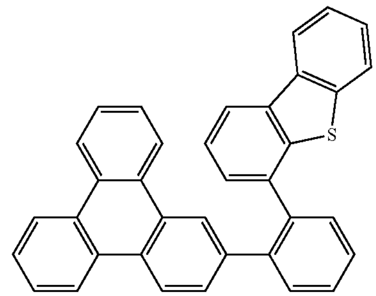
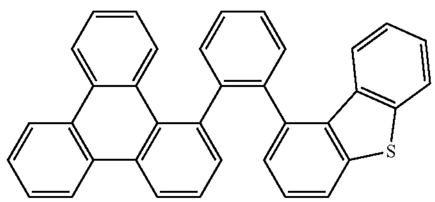
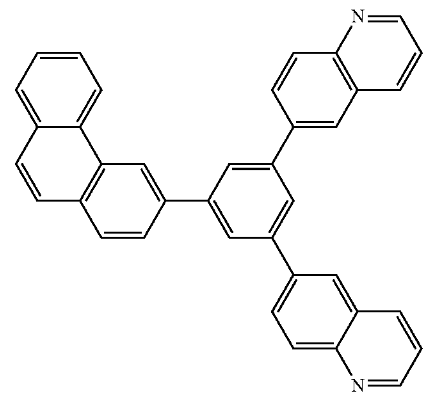
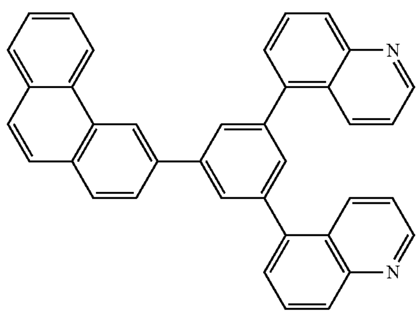
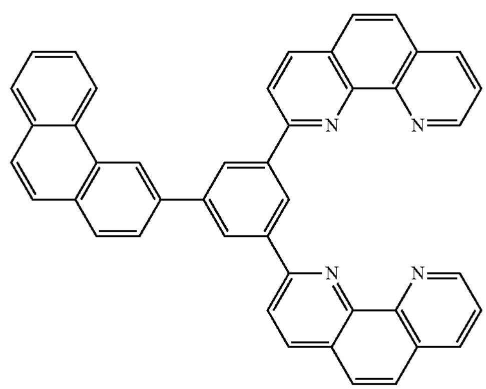
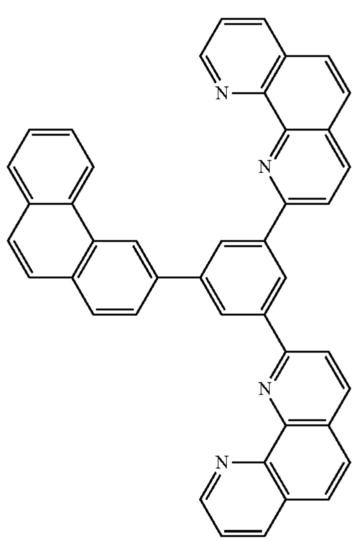
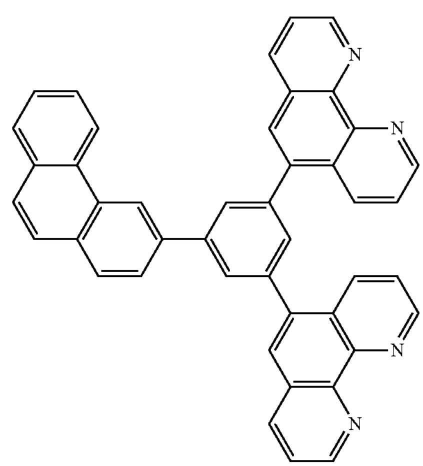

-continued
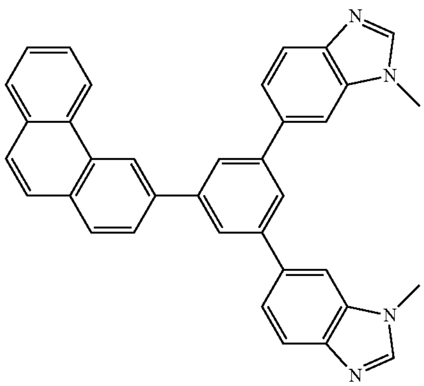
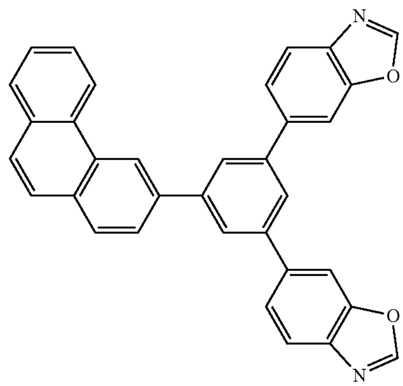
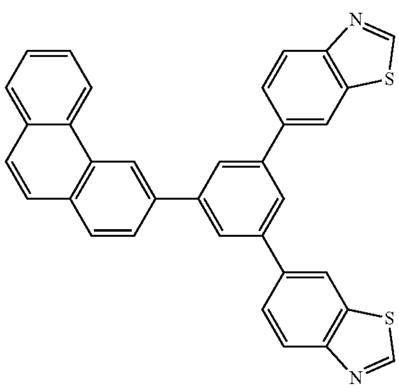
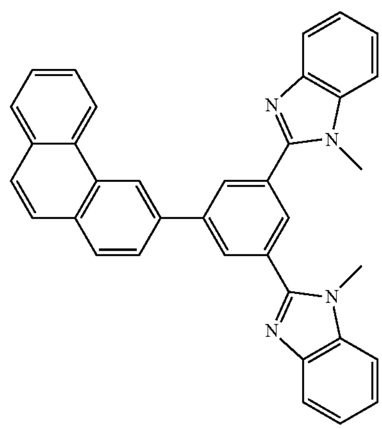
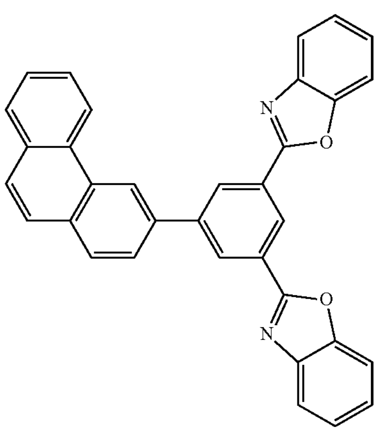
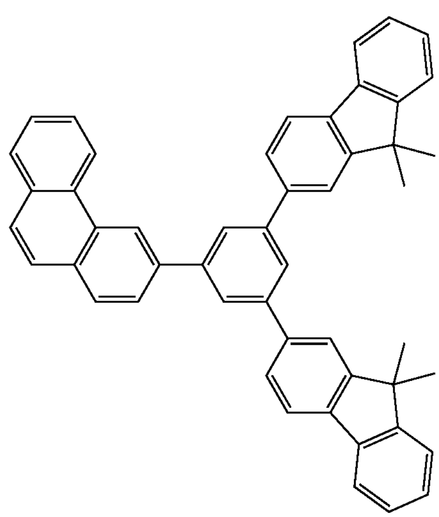

-continued
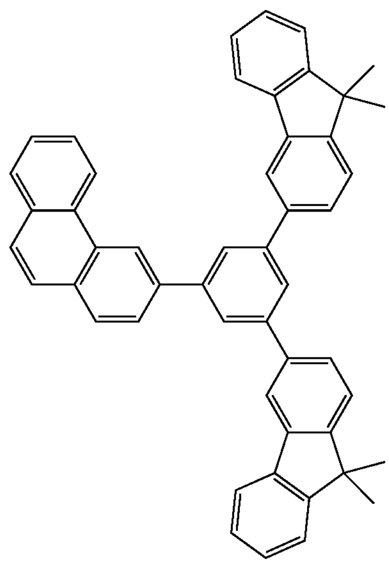
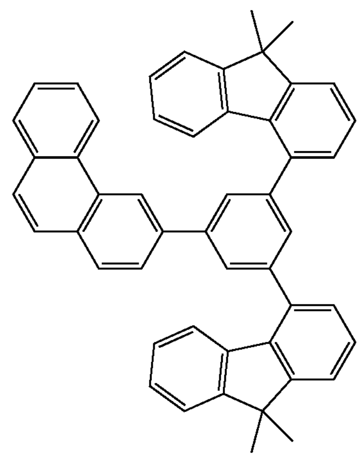
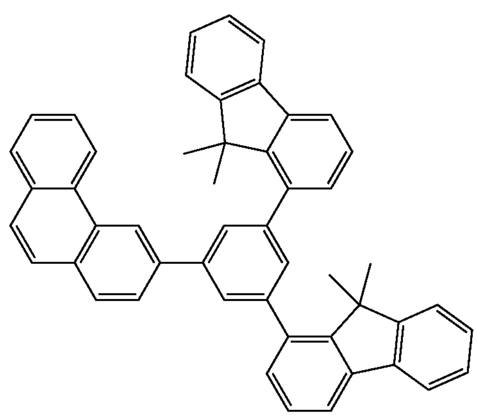
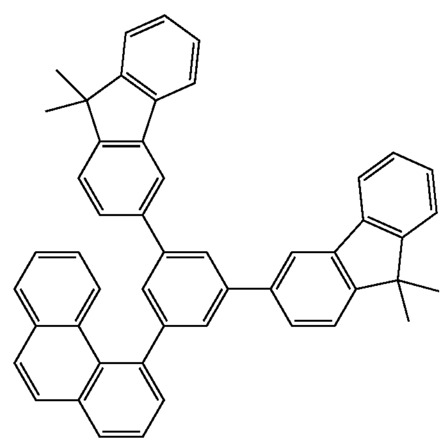
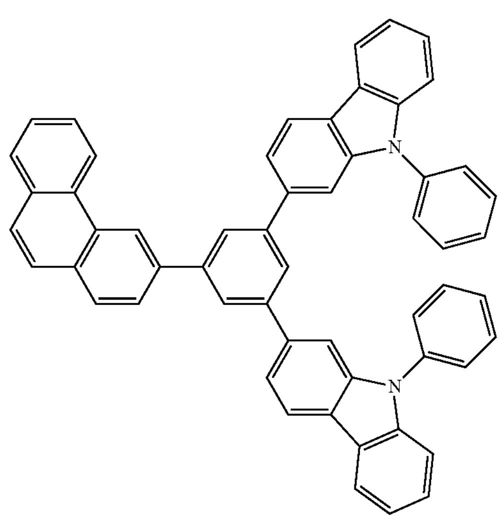
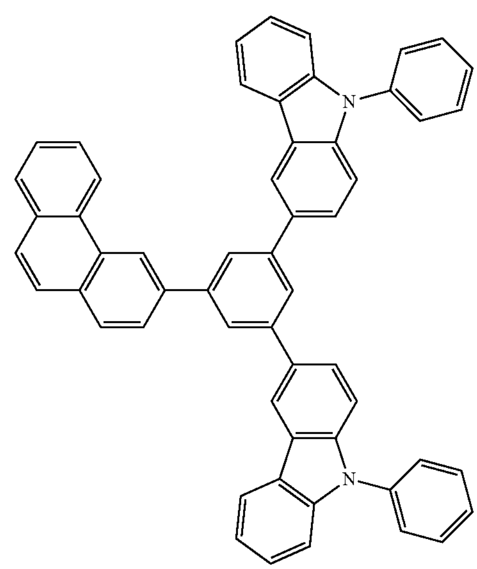

-continued
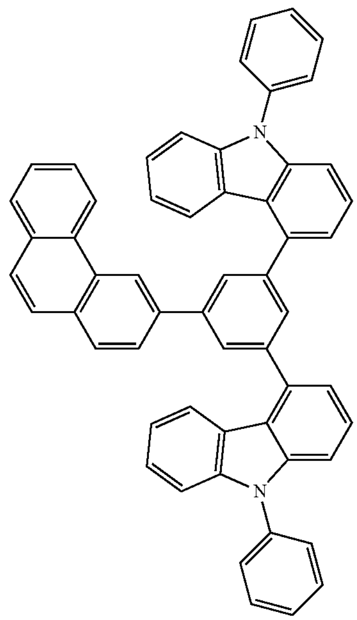
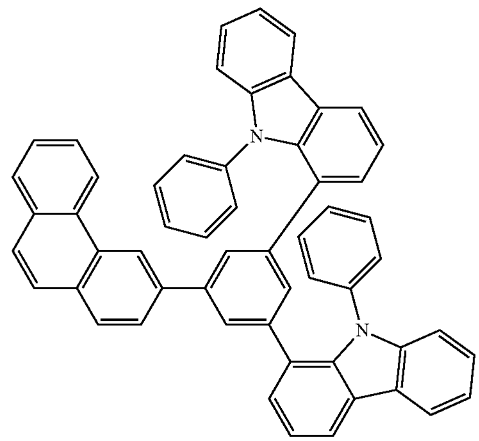
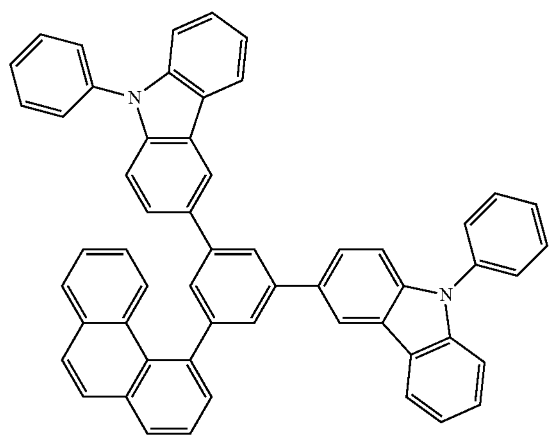
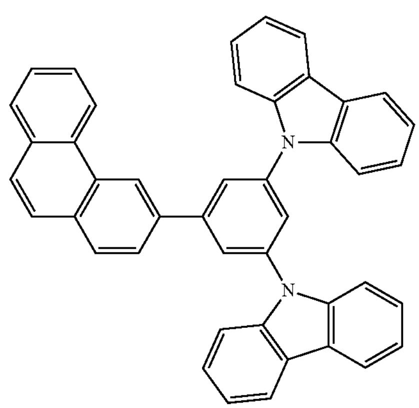
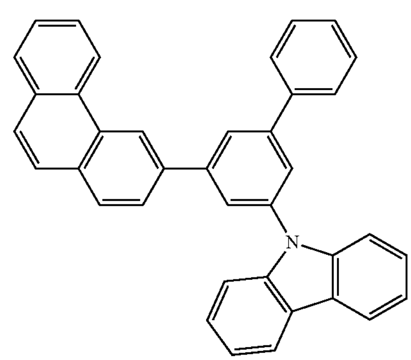

-continued
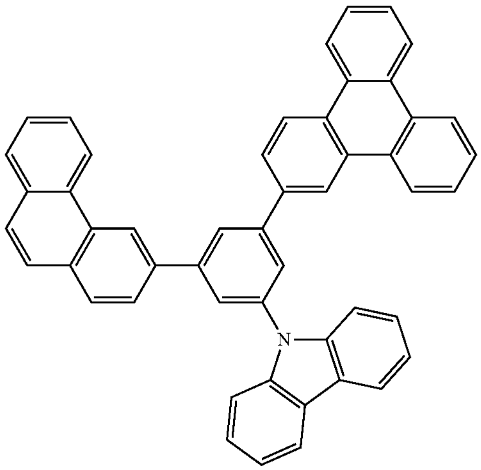
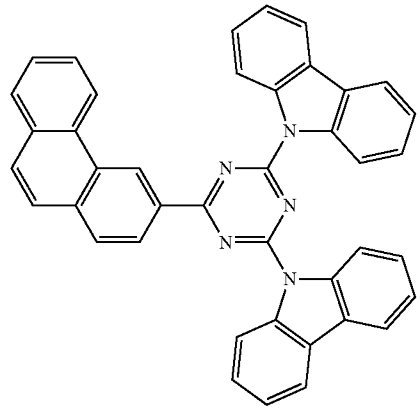
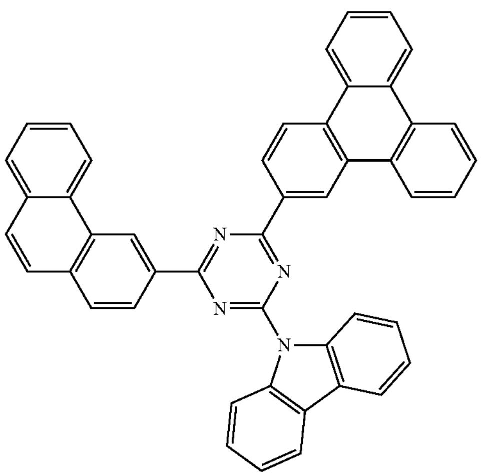
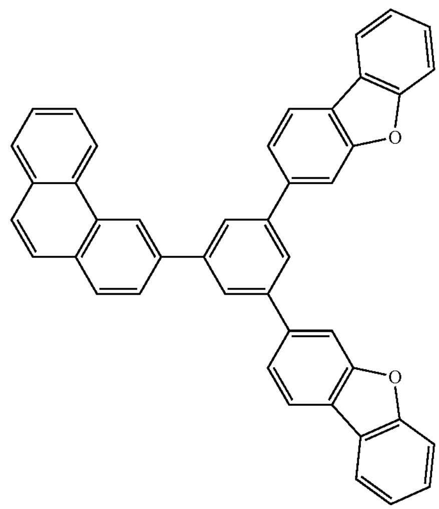
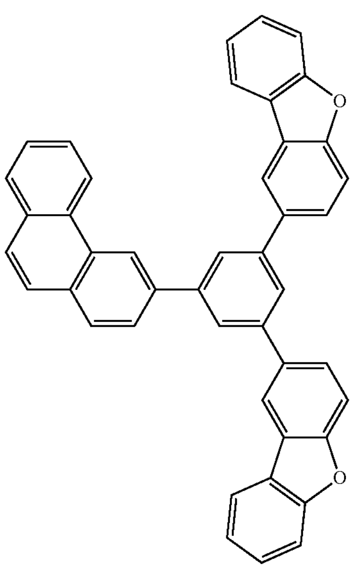
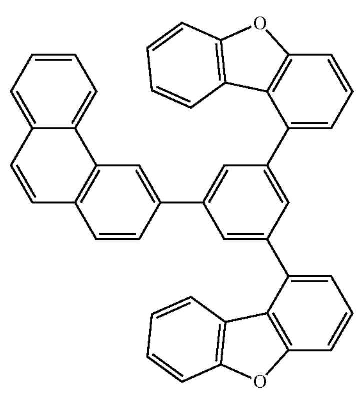

-continued
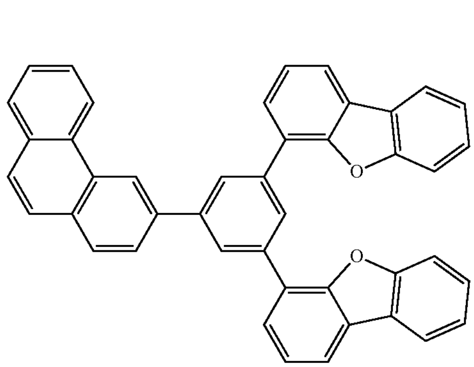
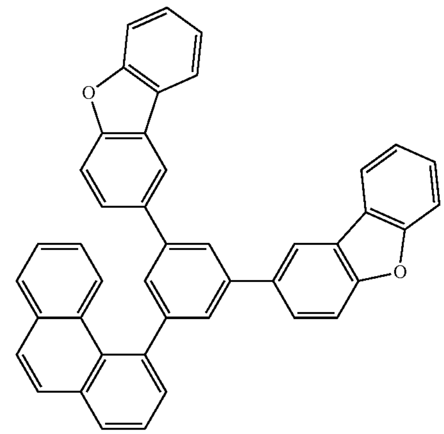
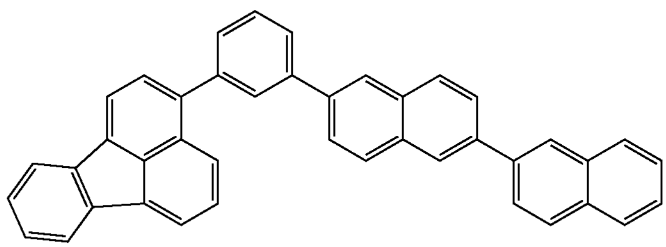
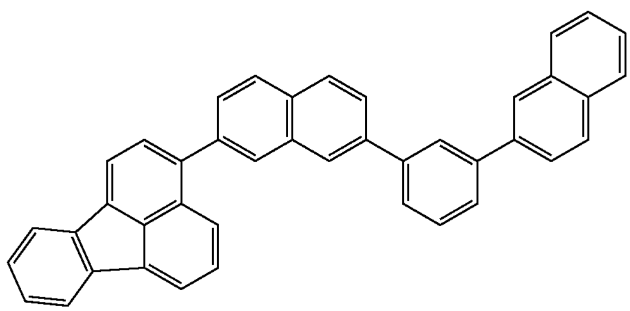
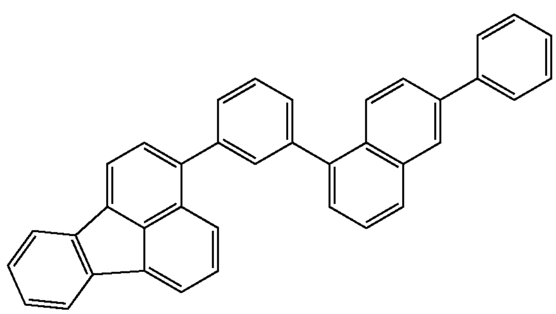
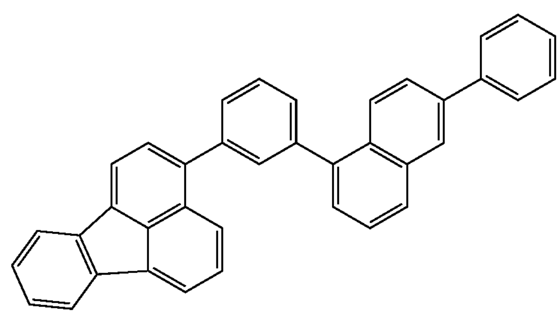
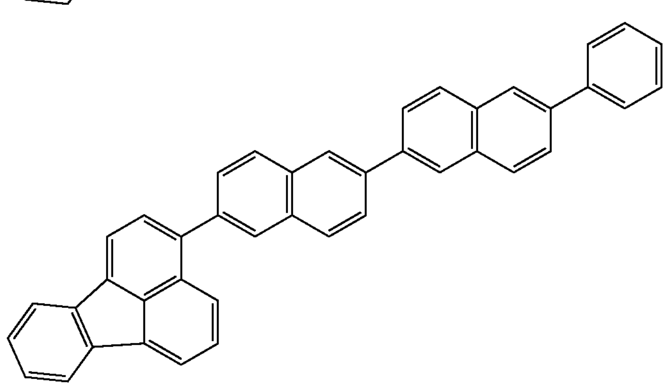

-continued
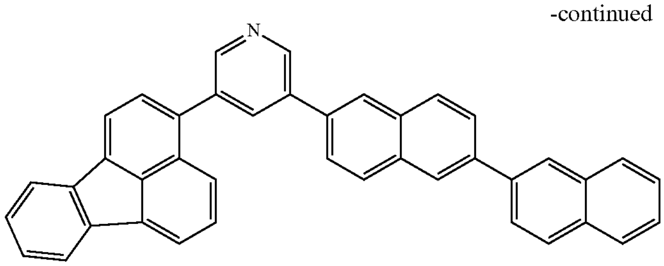
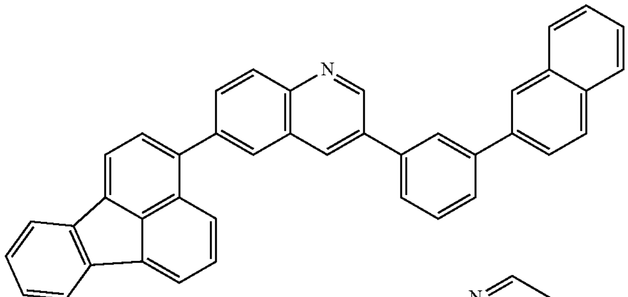
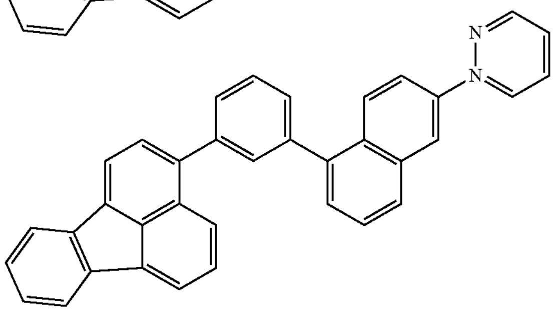
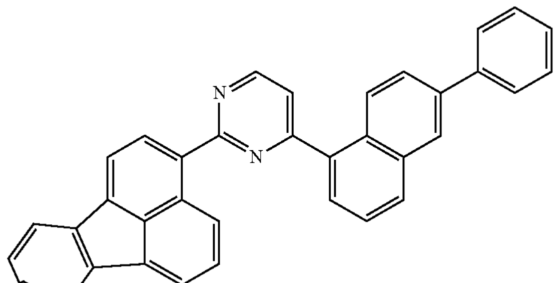
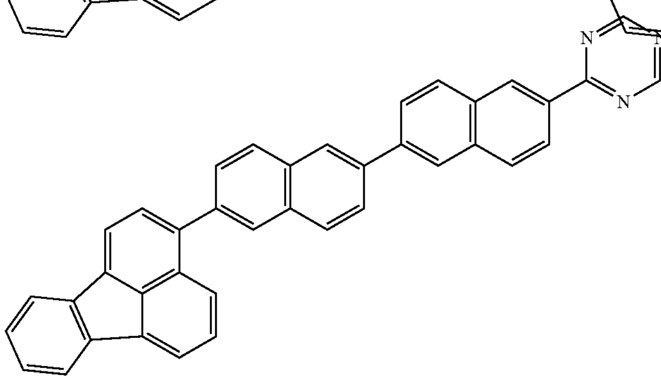
In one embodiment, the EML may include BD, $Ir(ppy)_3$, or $Ir(pq)_2acac$ as a dopant, but the dopant is not limited thereto:
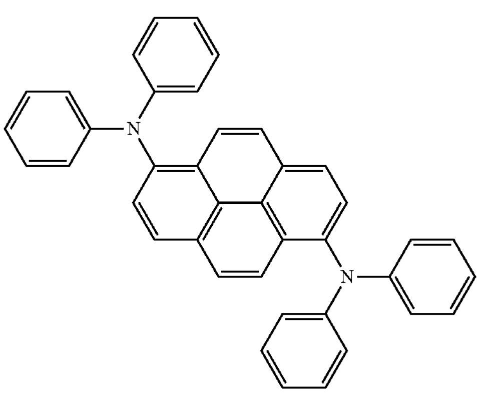
BD
-continued
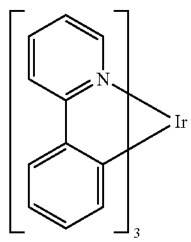
$Ir(ppy)_3$
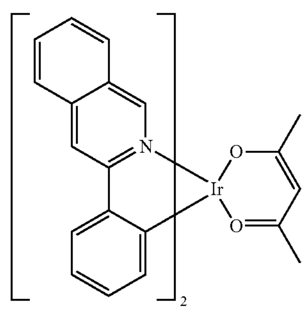
$Ir(pq)_2acac$
In one embodiment, the EML may include at least one compound selected from compounds below as a host, but the host is not limited thereto:

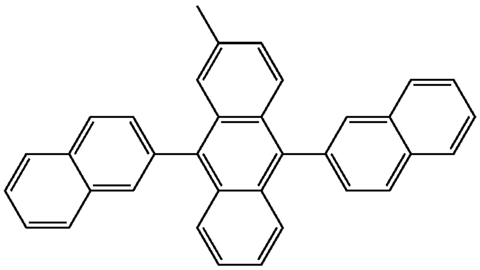

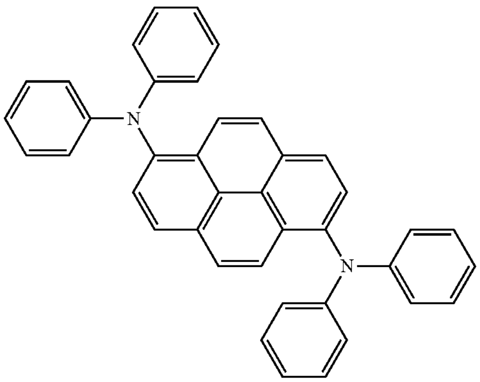

BD

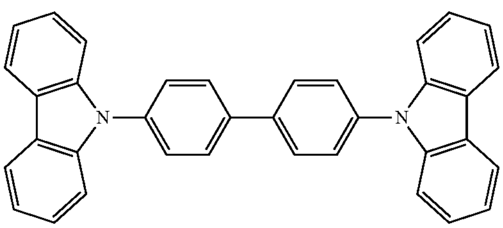

CBP

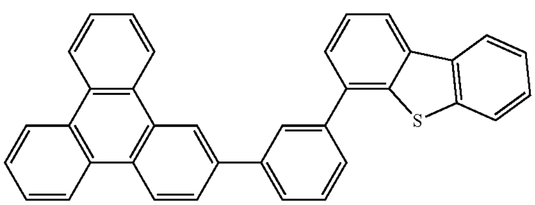

PH1

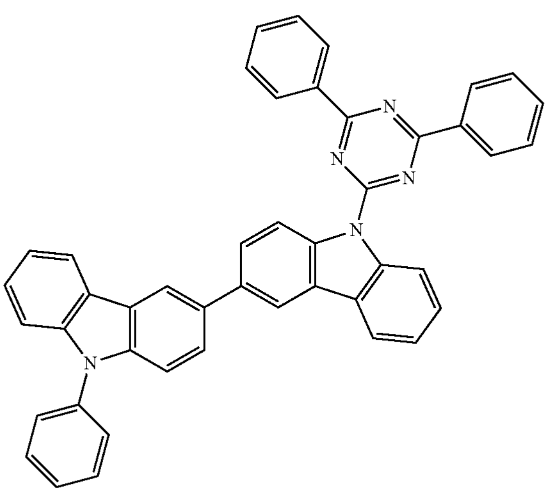

PH2

-continued

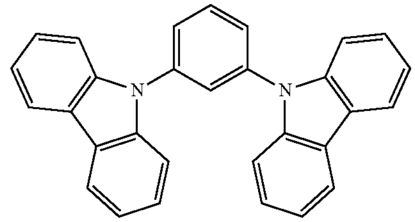

BF5

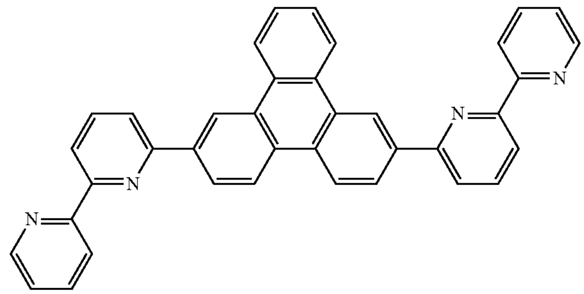

BF8

Hereinafter, the substituents as used herein will be described with respect to certain representative groups. The provided number of carbon atoms is not intended to limit the properties of the substituents. The substituents that are not defined in the present specification should be apparent to those of ordinary skill in the art based on the general definition of the substituents as provided herein.

As used herein, a $C_1$-$C_{60}$ alkyl group may refer to a monovalent linear or branched aliphatic hydrocarbon group. Non-limiting examples of the $C_1$-$C_{60}$ alkyl group include a methyl group, an ethyl group, a propyl group, an isobutyl group, a sec-butyl group, a tert-butyl group, a pentyl group, an iso-amyl group, and a hexyl group. As used herein, a $C_1$-$C_{60}$ alkylene group may refer to a divalent group that has the same structure as the $C_1$-$C_{60}$ alkyl group.

As used herein, a $C_1$-$C_{60}$ alkoxy group may refer to a monovalent group having a formula of $-OA_{101}$ (where $A_{101}$ is the $C_1$-$C_{60}$ alkyl group). Non-limiting examples of the $C_1$-$C_{60}$ alkoxy group include a methoxy group, an ethoxy group, and an isopropyloxy group.

As used herein, a $C_2$-$C_{60}$ alkenyl group may refer to a hydrocarbon chain having at least one carbon-carbon double bond at one or more positions along a carbon chain of the $C_2$-$C_{60}$ alkyl group. For example, the $C_2$-$C_{60}$ alkenyl group may include a terminal alkene and/or an internal alkene (e.g. in the middle or at an end of the $C_2$-$C_{60}$ alkyl group). Non-limiting examples of the $C_2$-$C_{60}$ alkenyl group include an ethenyl group, a propenyl group, and a butenyl group. As used herein, a $C_2$-$C_{60}$ alkenylene group may refer to a divalent group that has the same structure as the $C_2$-$C_{60}$ alkenyl group.

As used herein, a $C_2$-$C_{60}$ alkynyl group may refer to a hydrocarbon chain having at least one carbon-carbon triple bond at one or more positions along a carbon chain of the $C_2$-$C_{60}$ alkyl group. For example, the $C_2$-$C_{60}$ alkynyl group may include a terminal alkyne and/or an internal alkyne (e.g. in the middle or at an end of the $C_2$-$C_{60}$ alkyl group). Non-limiting examples of the $C_2$-$C_{60}$ alkynyl group include an ethynyl group and a propynyl group. As used herein, a $C_2$-$C_{60}$ alkynylene group may refer to a divalent group that has the same structure as the $C_2$-$C_{60}$ alkynyl group.

As used herein, a $C_3$-$C_{10}$ cycloalkyl group may refer to a $C_3$-$C_{10}$ monovalent saturated hydrocarbon monocyclic group. Non-limiting examples of the $C_3$-$C_{10}$ cycloalkyl group include a cyclopropyl group, a cyclobutyl group, a cyclopentyl group, a cyclohexyl group, and a cycloheptyl group. As used herein, a $C_3$-$C_{10}$ cycloalkylene group may refer to a divalent group that has the same structure as the $C_3$-$C_{10}$ cycloalkyl group.

As used herein, the $C_2$-$C_{10}$ heterocycloalkyl group may refer to a $C_2$-$C_{10}$ monovalent monocyclic group including at least one hetero atom selected from N, O, P, and S as a ring-forming atom, and carbon atoms as remaining ring-forming atoms. Non-limiting examples of the $C_2$-$C_{10}$ heterocycloalkyl group include a tetrahydrofuranyl group and a tetrahydrothiophenyl group. As used herein, a $C_2$-$C_{10}$ heterocycloalkylene group may refer to a divalent group that has the same structure as the $C_2$-$C_{10}$ heterocycloalkyl group.

As used herein, a $C_3$-$C_{10}$ cycloalkenyl group may refer to a $C_3$-$C_{10}$ monovalent monocyclic group that has at least one double bond in the ring, but does not have aromaticity. Non-limiting examples of the $C_3$-$C_{10}$ cycloalkenyl group include a cyclopentyl group, a cyclohexenyl group, and a cycloheptenyl group. As used herein, a $C_3$-$C_{10}$ cycloalkenylene group may refer to a divalent group that has the same structure as the $C_3$-$C_{10}$ cycloalkenyl group.

As used herein, a $C_2$-$C_{10}$ heterocycloalkenyl group may refer to a $C_2$-$C_{10}$ monovalent monocyclic group including at least one hetero atom selected from N, O, P, and S as a ring-forming atom and at least one double bond in the ring. Non-limiting examples of the $C_2$-$C_{10}$ heterocycloalkenyl group include a 2,3-hydrofuranyl group and a 2,3-hydrothiophenyl group. As used herein, a $C_2$-$C_{10}$ heterocycloalkenylene group may refer to a divalent group that has the same structure as the $C_2$-$C_{10}$ heterocycloalkenyl group.

As used herein, a $C_6$-$C_{60}$ aryl group may refer to a monovalent group having a $C_6$-$C_{60}$ carbocyclic aromatic system, and a $C_6$-$C_{60}$ arylene group may refer to a divalent group that has a $C_6$-$C_{60}$ carbocyclic aromatic system. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and/or the $C_6$-$C_{60}$ arylene group include at least two rings, the rings may be fused to each other.

As used herein, a $C_2$-$C_{60}$ heteroaryl group may refer to a monovalent group having a $C_2$-$C_{60}$ carbocyclic aromatic system and including at least one heteroatom selected from N, O, P, and S as a ring-forming atom, and carbon atoms as the remaining ring-forming atoms, and a $C_2$-$C_{60}$ heteroarylene group may refer to a divalent group having a $C_2$-$C_{60}$ carbocyclic aromatic system and including at least one heteroatom selected from N, O, P, and S as a ring-forming atom, and carbon atoms as the remaining ring-forming atoms. Non-limiting examples of the $C_2$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and/or a $C_2$-$C_{60}$ heteroarylene group include at least two rings, the rings may be fused to each other.

As used herein, a $C_6$-$C_{60}$ aryloxy group may refer to a —$OA_{102}$ group (where $A_{102}$ is the $C_6$-$C_{60}$ aryl group), and a $C_6$-$C_{60}$ arylthio group may refer to a —$SA_{103}$ group (where $A_{103}$ is the $C_6$-$C_{60}$ aryl group).

As used herein, a monovalent non-aromatic condensed polycyclic group may refer to a monovalent group that has at least two rings that are condensed to each other, each ring including only carbon atoms as ring-forming atoms (e.g., 8 to 60 carbon atoms), and does not have overall aromaticity.

Non-limiting examples of the non-aromatic condensed polycyclic group include a fluorenyl group. As used herein, a divalent non-aromatic condensed polycyclic group may refer to a divalent group that has the same structure as the monovalent non-aromatic condensed polycyclic group.

As used herein, a monovalent non-aromatic heterocondensed polycyclic group may refer to a monovalent group that has at least two rings that are condensed to each other, each ring including a heteroatom selected from N, O, P, and S as a ring-forming atom and carbon atoms as remaining ring-forming atoms (e.g., 2 to 60 carbon atoms), and does not have overall aromaticity. Non-limiting examples of the non-aromatic heterocondensed polycyclic group include a carbazolyl group. As used herein, a divalent non-aromatic heterocondensed polycyclic group may refer to a divalent group that has the same structure as the monovalent non-aromatic heterocondensed polycyclic group.

As used herein, at least one substituent of the substituted $C_3$-$C_{10}$ cycloalkylene group, substituted $C_2$-$C_{10}$ heterocycloalkylene group, substituted $C_3$-$C_{10}$ cycloalkenylene group, substituted $C_2$-$C_{10}$ heterocycloalkenylene group, substituted $C_6$-$C_{60}$ arylene group, substituted $C_2$-$C_{60}$ heteroarylene group, substituted divalent non-aromatic condensed polycyclic group, substituted divalent non-aromatic heterocondensed polycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_2$-$C_{60}$ heteroaryl group, substituted monovalent non-aromatic condensed polycyclic group, and/or substituted monovalent non-aromatic heterocondensed polycyclic group is selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and/or a $C_1$-$C_{60}$ alkoxy group;

a $C_1$-$C_{60}$ alkyl group, a $C_2$-$C_{60}$ alkenyl group, a $C_2$-$C_{60}$ alkynyl group, and/or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, a monovalent non-aromatic heterocondensed polycyclic group, —$N(Q_{11})(Q_{12})$, —$Si(Q_{13})(Q_{14})(Q_{15})$, and —$B(Q_{16})(Q_{17})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, and/or a monovalent non-aromatic heterocondensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, and/or a monovalent non-aromatic heterocondensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy, a $C_6$-$C_{60}$ arylthio, a $C_2$-$C_{60}$ heteroaryl group, a monovalent non-aromatic condensed polycyclic group, a monovalent non-aromatic heterocondensed polycyclic group, $N(Q_{21})(Q_{22})$, $—Si(Q_{23})(Q_{24})(Q_{25})$, and $—B(Q_{26})(Q_{27})$; and/or $—N(Q_{31})(Q_{32})$, $—Si(Q_{33})(Q_{34})(Q_{35})$, and/or $—B(Q_{36})(Q_{37})$;

$Q_{11}$ to $Q_{17}$, $Q_{21}$ to $Q_{27}$, and $Q_{31}$ to $Q_{37}$ are each independently selected from a hydrogen, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_2$-$C_{60}$ heteroaryl group, a monovalent non-aromatic condensed polycyclic group, and/or a monovalent non-aromatic heterocondensed polycyclic group.

In one embodiment, at least one substituent of the substituted $C_3$-$C_{10}$ cycloalkylene group, substituted $C_2$-$C_{10}$ heterocycloalkylene group, substituted $C_3$-$C_{10}$ cycloalkenylene group, substituted $C_2$-$C_{10}$ heterocycloalkenylene group, substituted $C_6$-$C_{60}$ arylene group, substituted $C_2$-$C_{60}$ heteroarylene group, substituted divalent non-aromatic condensed polycyclic group, substituted divalent non-aromatic heterocondensed polycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_2$-$C_{60}$ heteroaryl group, substituted monovalent non-aromatic condensed polycyclic group, and substituted monovalent non-aromatic heterocondensed polycyclic group is selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and/or a $C_1$-$C_{60}$ alkoxy group;

a $C_1$-$C_{60}$ alkyl group, a $C_2$-$C_{60}$ alkenyl group, a $C_2$-$C_{60}$ alkynyl group, and/or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a trlazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadlazolyl group, an imidazopyridinyl group, an imidazopyrimidinyl group, $—N(Q_{11})(Q_{12})$, $—Si(Q_{13})(Q_{14})(Q_{15})$, and $—B(Q_{16})(Q_{17})$;

a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a trilazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadlazolyl group, an imidazopyridinyl group, and/or an imidazopyrimidinyl group;

a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an Indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and/or an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, —$N(Q_{21})(Q_{22})$, —$Si(Q_{23})(Q_{24})(Q_{25})$, and —$B(Q_{26})(Q_{27})$; and/or —$N(Q_{31})(Q_{32})$, –$Si(Q_{33})(Q_{34})(Q_{35})$, and/or —$B(Q_{36})(Q_{37})$;

$Q_{11}$ to $Q_{17}$, $Q_{21}$ to $Q_{27}$, and $Q_{31}$ to $Q_{37}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a cyclopentyl group, a cyclohexyl group, a cycloheptyl group, a cyclopentenyl group, a cycloheptenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadlazolyl group, an imidazopyridinyl group, and/or an imidazopyrimidinyl group.

The term "Ph" used herein refers to a phenyl group, the term "Me" used herein refers to a methyl group, the term "Et" used herein refers to an ethyl group, and the term "ter-Bu" or "But" used herein refers to a tert-butyl group.

The expression "an organic layer includes at least one compound of Formula X" used herein may refer to an organic layer) including one compound of Formula X, or two or more different compounds of Formula X.

The term "organic layer" used herein may refer to a single layer and/or a plurality of layers between the first electrode and the second electrode in the organic light-emitting device. A material included in the organic layer is not limited to an organic material.

The drawing schematically illustrates a cross-sectional view of an organic light-emitting device 10 according to an embodiment of the present invention. The organic light-emitting device 10 includes a first electrode 110, an organic layer 150, and a second electrode 190.

Hereinafter, a structure and a preparation method of an organic light-emitting device are described by referring to the drawing.

In the organic light-emitting device 10 shown in the drawing, a substrate may be positioned on a first side (e.g. lower side) of the first electrode 110 or a second side (e.g. upper side) of the second electrode 190. The substrate may be a glass substrate or a transparent plastic substrate having good mechanical strength, thermal stability, transparency, surface smoothness, ease of handling, and water resistance.

The first electrode 110 may be formed by applying a first electrode material on the substrate by, for example, deposition or sputtering. When the first electrode 110 is an anode, the first electrode material may be selected from materials having a high work function and capable of easily injecting the holes. The first electrode 110 may be a reflective electrode, a semi-transparent electrode, or a transparent electrode. Non-limiting examples of the first electrode material may include indium-tin oxide (ITO), indium-zinc-oxide (IZO), tin oxide ($SnO_2$), and zinc oxide (ZnO). In embodiments where the first electrode 110 is a semi-transparent electrode or a reflective electrode, at least one selected from magnesium (Mg), aluminum (Al), aluminum-lithium (Al—Li), a Calcium (Ca), magnesium-indium (Mg—In), and magnesium-silver (Mg—Ag) may be selected as the first electrode material.

The first electrode 110 may have a single-layered structure or a multi-layered structure including at least two layers. In one embodiment, the first electrode 110 may have a three-layered structure of ITO/Ag/ITO, but the structure of the first electrode 110 is not limited thereto.

In one embodiment, the organic layer 150 is positioned on the first electrode 110 and includes an EML.

The organic layer 150 may further include a hole transport region between the first electrode 110 and the EML, an electron transport region between the EML and the second electrode 190, and a mixed organic layer between the EML and the electron transport region.

The hole transport region may include at least one selected from an HIL, an HTL, a buffer layer, and an EBL, and the electron transport region may include at least one selected from an HBL, an ETL, and an EIL, but the hole transport region and the electron transport region are not limited thereto.

The structure of the hole transport region may include a single layer structure formed of one material, a single layer structure formed of multiple different materials, or multiple layers structure formed of multiple different materials.

In one embodiment, the hole transport region may have a single layer structure formed of multiple different materials, for example, HIL/HTL, HIL/HTL/buffer layer, HIL/buffer layer, HTL/buffer layer, or HIL/HTL/EBL sequentially stacked on the first electrode 110, but the structure of the hole transport region is not limited thereto.

When the hole transport region includes an HIL, the HIL may be formed on the first electrode 110 using (utilizing) various methods such as, for example, vacuum deposition, spin coating, casting, Langmuir-Blodgett (LB) deposition, inkjet printing, laser printing, or laser induced thermal imaging (LITI).

When the HIL is formed by vacuum deposition, the deposition temperature may be about 100 to about 500° C., the degree of vacuum may be about $10^{-8}$ to about $10^{-3}$ torr, and the deposition speed may be about 0.01 to about 100 Å/sec, depending on the kind of compound for forming the HIL and the desired structure of the HIL.

When the HIL is formed by spin coating, the the coating speed may be about 2,000 rpm to about 5,000 rpm and the heat treatment temperature may be about 80° C. to about 200° C., depending on the kind of compound for forming the HIL and the desired structure of the HIL.

When the hole transport region includes an HTL, the HTL may be formed on the first electrode 110 or on the HIL using (utilizing) various methods such as, for example, vacuum deposition, spin coating, casting, LB deposition, inkjet printing, laser printing, or LITI. When the HTL is formed by vacuum deposition or spin coating, the deposition conditions and the coating conditions for forming the HTL may be similar to the deposition conditions and the coating conditions for forming the HIL.

The hole transport region may include at least one of m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine) (TCTA), polyaniline/Dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline)/poly(4-styrenesulfonate (PANI/PSS), a compound represented by Formula 201, and a compound represented by Formula 202:

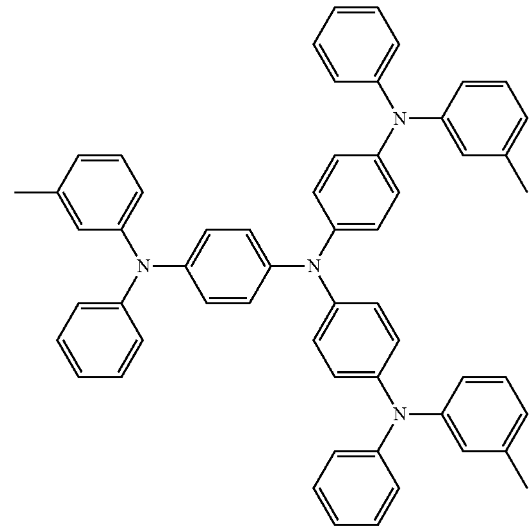

m-MTDATA

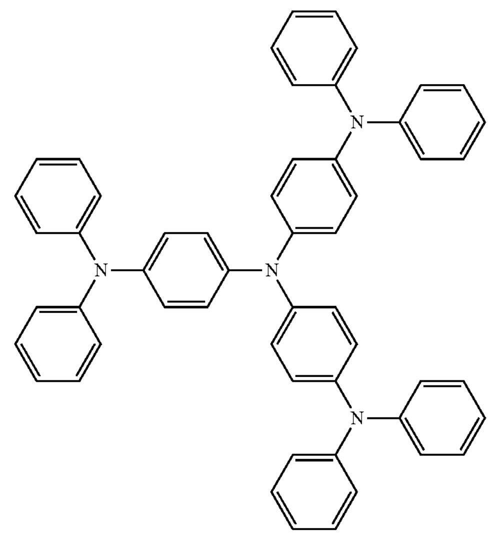

TDATA

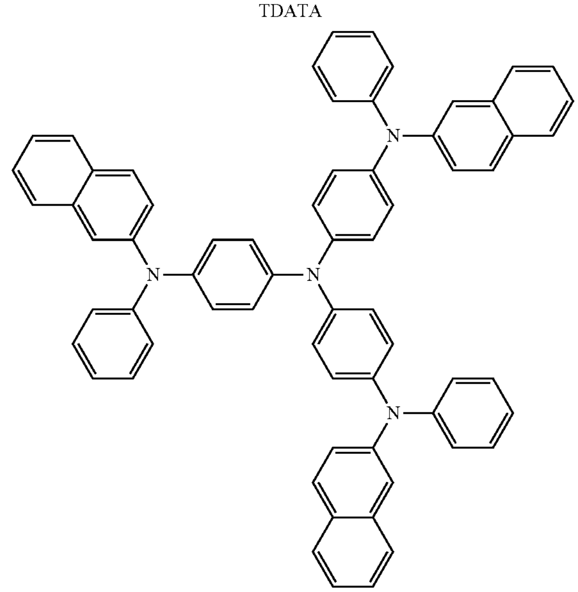

2-TNATA

-continued

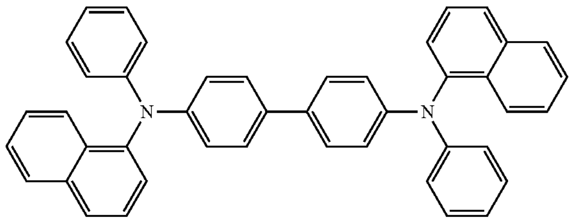

NPB

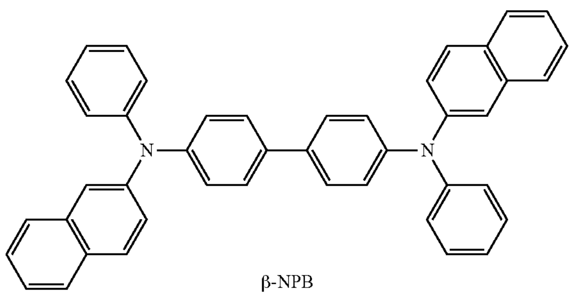

β-NPB

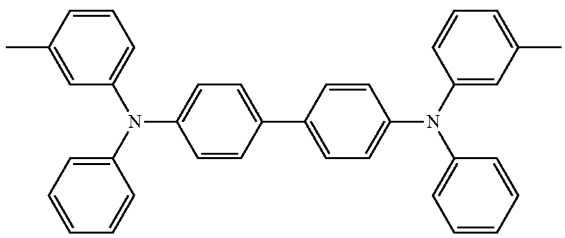

TPD

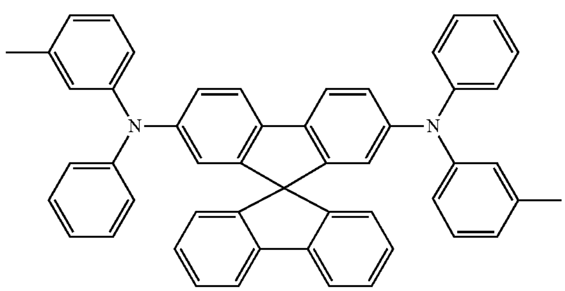

Spiro-TPD

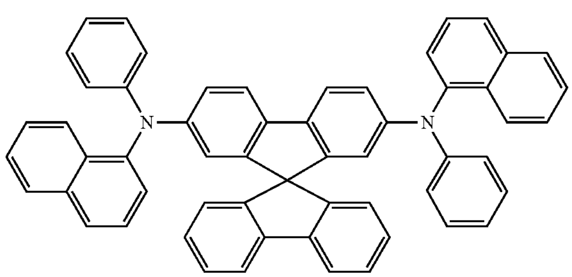

Spiro-NPB

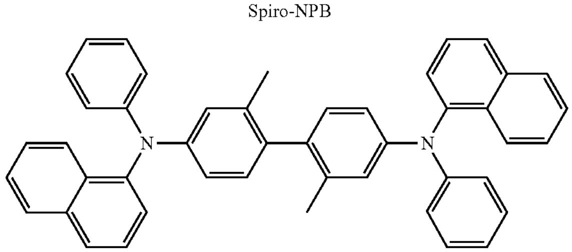

α-NPB

-continued

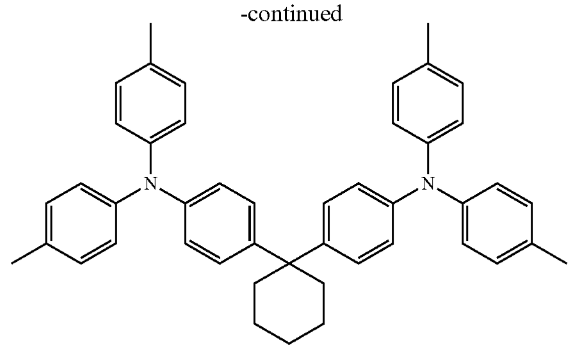

TAPC

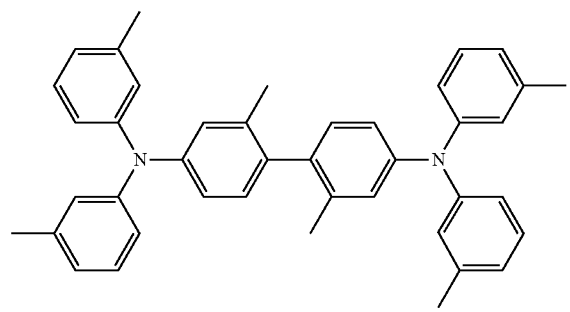

HMTPD

Formula 201

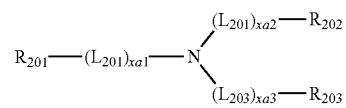

Formula 202

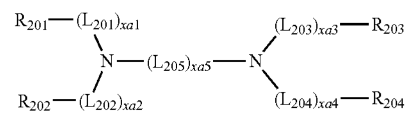

In Formulae 201 and 202, definitions of $L_{201}$ to $L_{205}$ may each independently be the same as the definition of $L_1$ as described in the present specification;

xa1 to xa4 are each independently selected from 0, 1, 2, and 3;

xa5 is selected from 1, 2, 3, 4, and 5; and $R_{201}$ to $R_{204}$ may be each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, a substituted or unsubstituted monovalent non-aromatic condensed polycyclic group, and/or a substituted or unsubstituted monovalent non-aromatic heterocondensed polycyclic group.

In one embodiment, in Formulae 201 and 202, $L_{201}$ to $L_{205}$ are each independently selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and/or a triazinylene group; and/or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and/or a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 are each independently selected from 0, 1, and 2;

xa5 is selected from 1, 2, and 3;

$R_{201}$ to $R_{204}$ are each independently selected from, but are not limited to, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

The compound represented by Formula 201 may be represented by Formula 201A below, but is not limited thereto:

Formula 201A

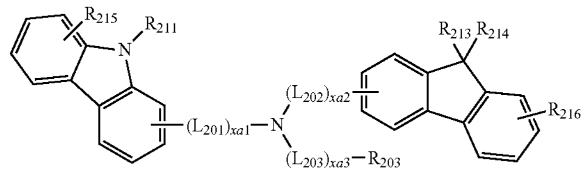

In one embodiment, the compound represented by Formula 201 may be represented by Formula 201A-1:

Formula 201A-1

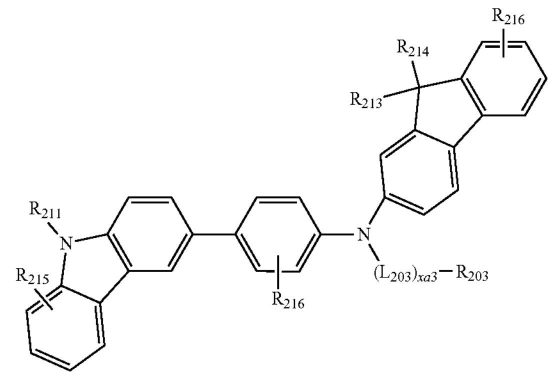

The compound represented by Formula 202 may be represented by Formula 202A, but is not limited thereto:

Formula 202A

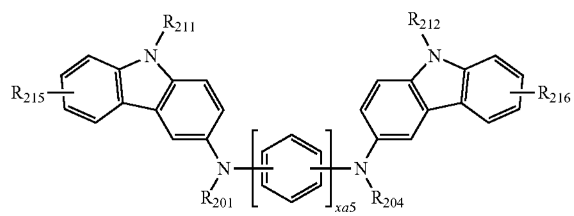

In Formulae 201A, 201A-1, and 202A, $L_{201}$ to $L_{203}$, xa1 to xa3, xa5, and $R_{202}$ to $R_{204}$ may be as defined in the present specification, definition of $R_{211}$ and $R_{212}$ may be the same as the definition of $R_{203}$, and $R_{213}$ to $R_{216}$ may be each independently selected from, but are not limited to, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and/or a monovalent non-aromatic hetero-condensed polycyclic group.

In one embodiment, in Formula 201A, 201A-1, and 202A, $L_{201}$ to $L_{203}$ are each independently selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and/or a triazinylene group; and/or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and/or a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 are each independently selected from 0 and 1;

$R_{203}$, $R_{211}$, and $R_{212}$ are each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from a $C_1$-$C_{20}$ alkyl group and/or a $C_1$-$C_{20}$ alkoxy group;

a $C_1$-$C_{20}$ alkyl group and/or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and/or a $C_1$-$C_{20}$ alkoxy group;

a $C_1$-$C_{20}$ alkyl group and/or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic add or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 is selected from 1 and 2.

In Formulae 201A and 201A-1, $R_{213}$ and $R_{214}$ may be linked to each other to form a saturated or unsaturated ring.

The compound represented by Formula 201 and the compound represented by Formula 202 may each independently include at least one of Compounds HT1 to HT20 below, but the compound represented by Formula 201 and the compound represented by Formula 202 are not limited thereto:

HT1

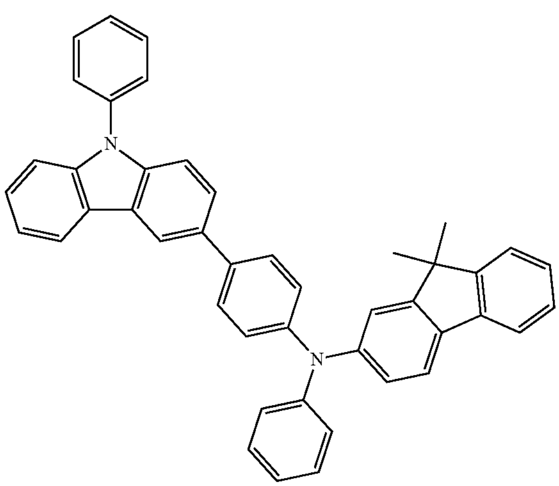

-continued

HT2

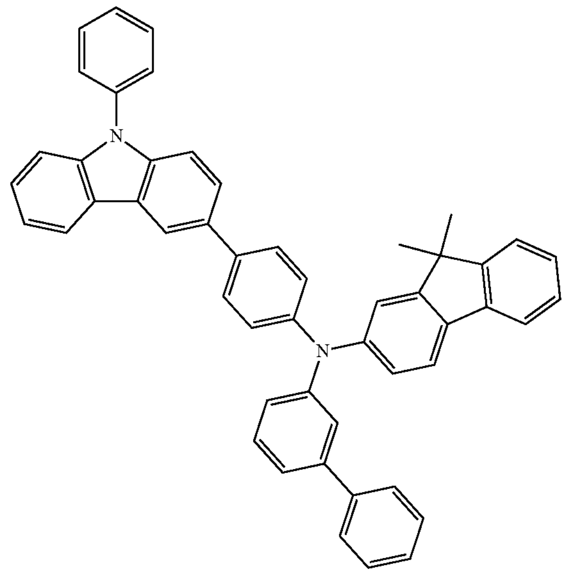

HT3

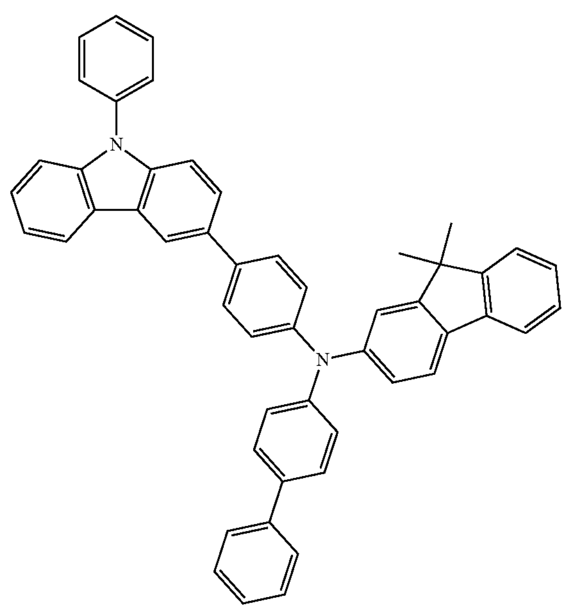

HT4
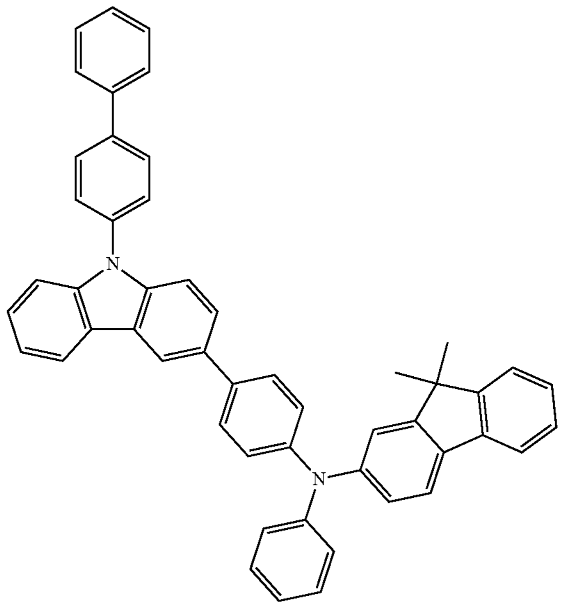
HT5
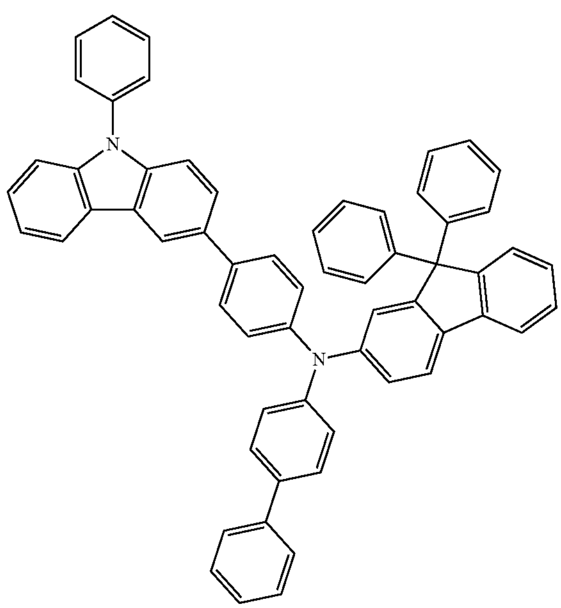
HT6
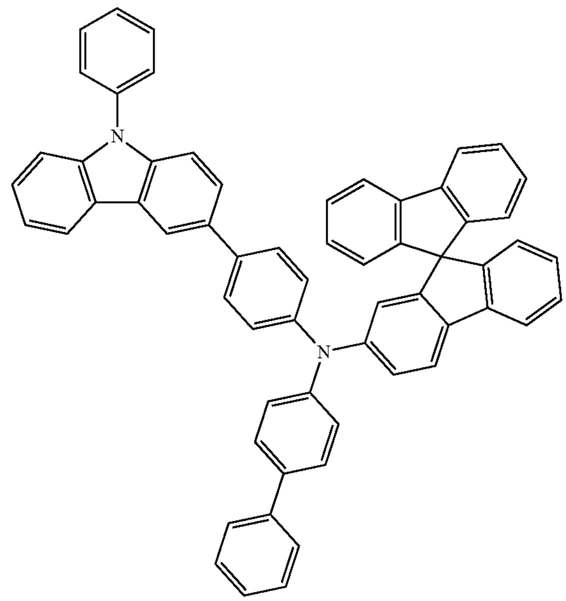
HT7
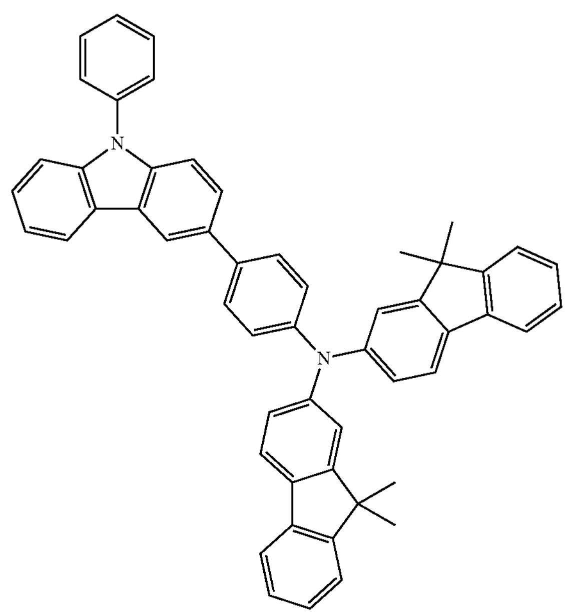

-continued
HT8
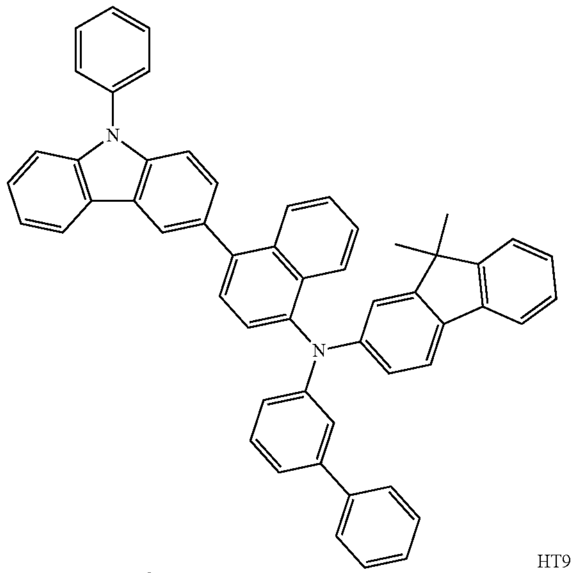
HT9
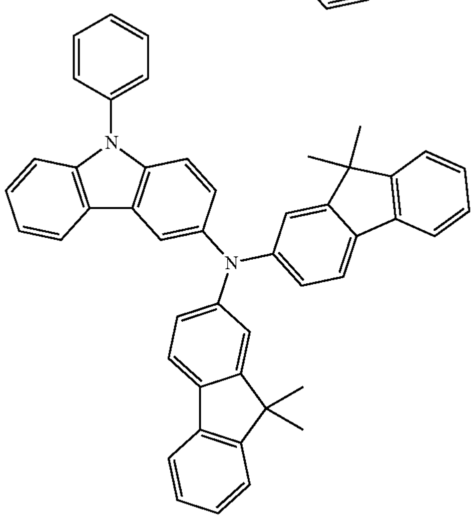
HT10
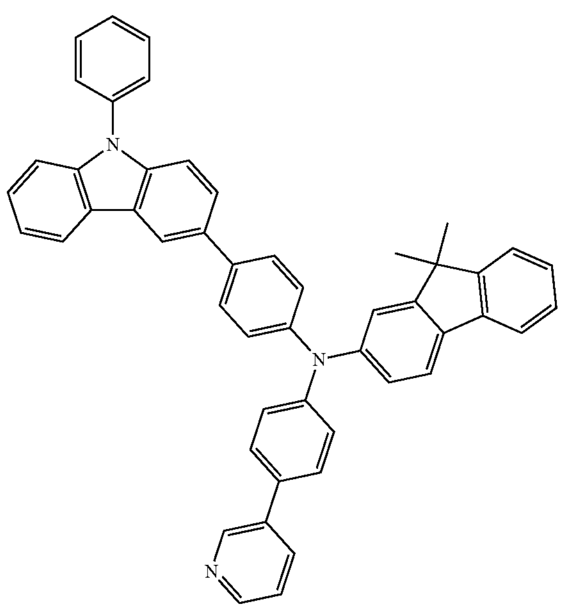
-continued
HT11
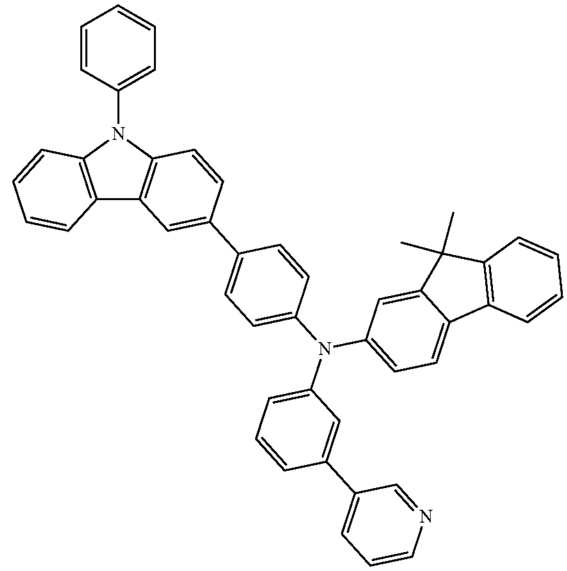
HT12
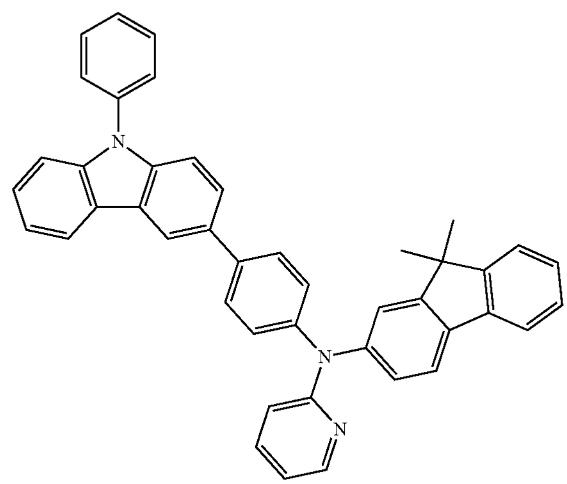
HT13
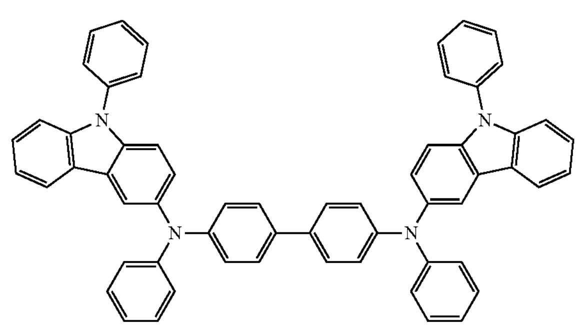

-continued

HT14

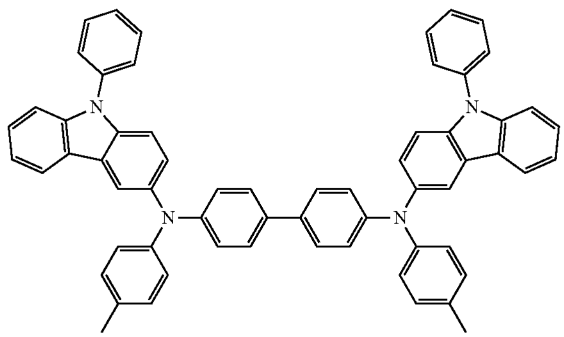

HT15

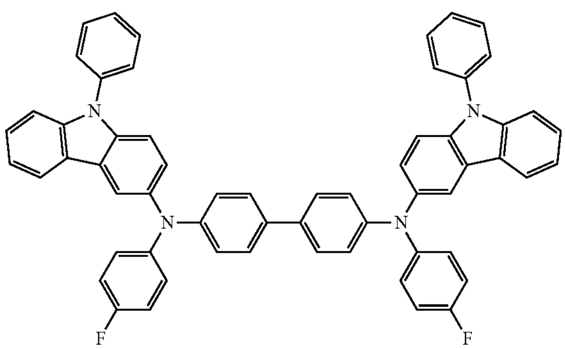

HT16

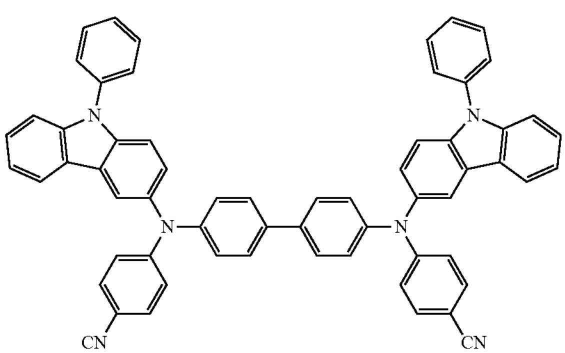

HT17

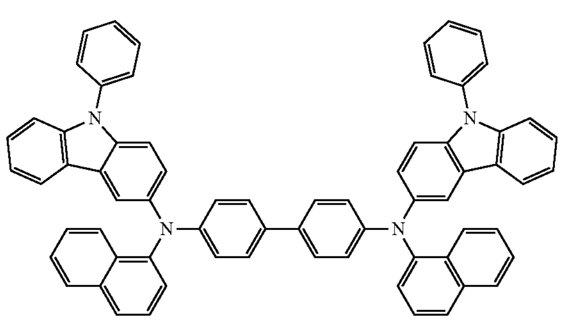

-continued

HT18

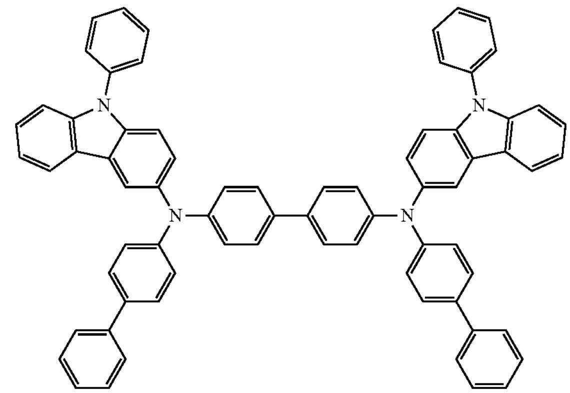

HT19

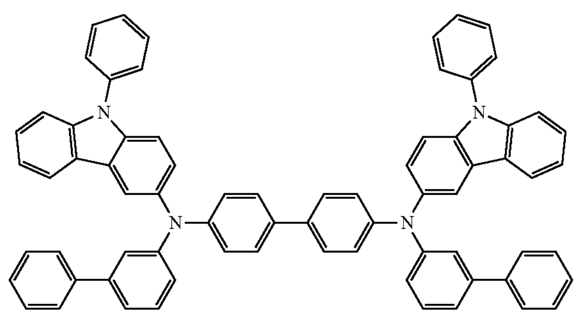

HT20

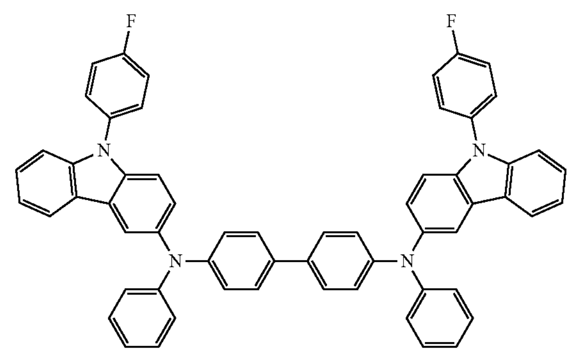

A thickness of the hole transport region may be about 100 Å to about 10,000 Å, for example, about 100 Å to about 1,000 Å. When the hole transport region includes both the HIL and the HTL, a thickness of the HIL may be about 100 Å to about 9,950 Å, for example, about 100 Å to about 950 Å, and a thickness of the HTL may be about 50 Å to about 2,000 Å, for example, about 100 Å to about 1,500 Å. When thicknesses of the hole transport region, the HIL, and the HTL are within any of these ranges, the organic light-emitting device may have satisfactory hole transporting properties without a substantial increase in driving voltage.

The hole transport region may further include a charge-generating material, in addition to the materials described above, to improve conductivity. The charge-generating material may be homogenously or inhomogeneously dispersed in the hole transport region.

The charge-generating material may be, for example, a p-dopant. The p-dopant may be one of a quinone derivative, a metal oxide, and/or a cyano group-containing compound, but the p-dopant is not limited thereto. Non-limiting examples of the p-dopant may include a quinone derivative, such as tetracyanoquinonedimethane (TCNQ) or 2,3,5,6-tetrafluoro-tetracyano-1,4-benzoquinondimethane (F4-TCNQ); a metal oxide, such as a tungsten oxide or a molybden oxide; and Compound HT-D1 below:

Compound HT-D1

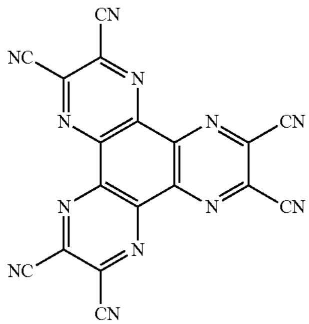

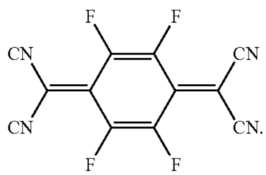

F4-TCNQ

The hole transport region may further include at least one of a buffer layer and an EBL, in addition to the HIL and the HTL. The buffer layer may increase light-emitting efficiency by compensating an optical resonance distance according to the wavelength of light emitted from the EML. The buffer layer may include a material included in the hole transport region. The EBL may block injection of electrons from the electron transport region.

The HTL may include a first hole transport layer and a second hole transport layer, and the first hole transport layer and the second hole transport layer may be formed of the same material or of different from each other materials.

The EML may be formed on the first electrode 110 or on the hole transport region using (utilizing) various methods such as, for example, vacuum deposition, spin coating, casting, LB deposition, inkjet printing, laser printing, or LITI. When the EML is formed by vacuum deposition or spin coating, the deposition conditions and the coating conditions for forming the EML may be similar to the deposition conditions and the coating conditions for forming the HIL.

When the organic light-emitting device 10 is a full-color organic light-emitting device, the EML may be patterned into individual sub-pixels, such as a red EML, a green EML, and a blue EML. Alternatively, the EML may have a stacked structure of the red EML, the green EML, and the blue EML, or a single layer structure including a red light-emitting material, a green light-emitting material, and a blue light-emitting material formed as a single layer and capable of emitting white light.

The EML may include a host and a dopant.

Non-limiting examples of the host may include at least one of TPBi, TBADN, ADN (herein, also referred to as "DNA"), CBP, CDBP, and TCP:

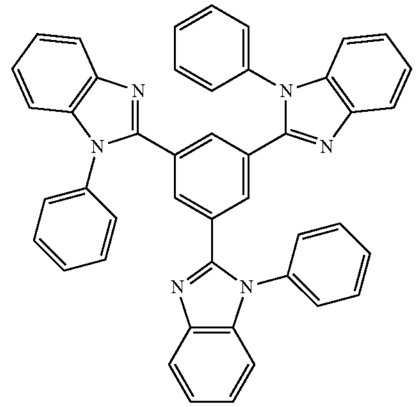

TPBi

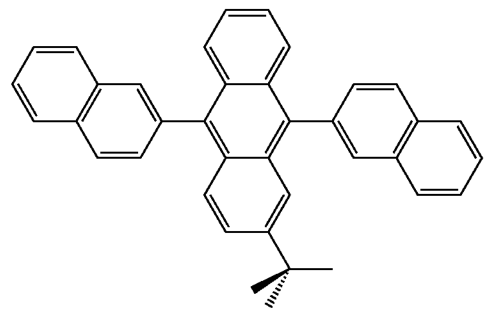

TBADN

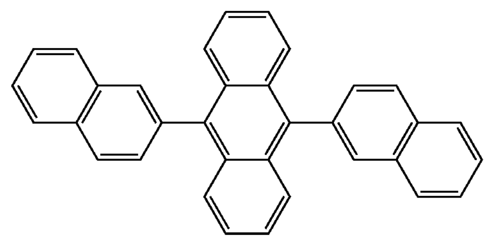

ADN

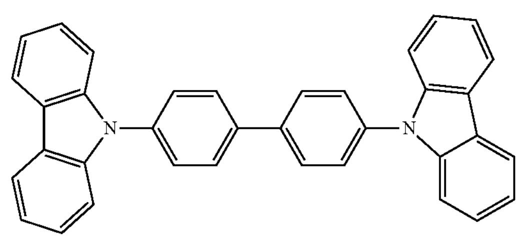

CBP

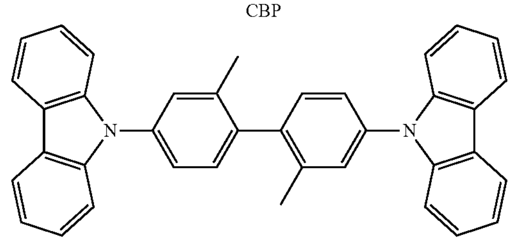

CDBP

-continued

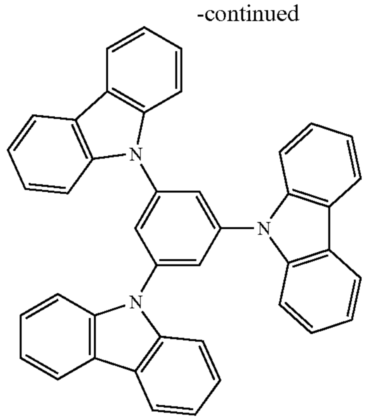

TCP

The host may include a compound represented by Formula 301:

$Ar_{301}$-[$(L_{301})_{xb1}$-$R_{301}$]$_{xb2}$ Formula 301

In Formula 301, $Ar_{301}$ is selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and/or an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and/or an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, and —Si($Q_{301}$)($Q_{302}$)($Q_{303}$) (where $Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, and/or a $C_2$-$C_{60}$ heteroaryl group);

definition of $L_{301}$ may be the same as the definition of $L_{201}$ as described in the present specification;

$R_{301}$ is selected from a $C_1$-$C_{20}$ alkyl group and/or a $C_1$-$C_{20}$ alkoxy group;

a $C_1$-$C_{20}$ alkyl group and/or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 is selected from 0, 1, 2, and 3; and xb2 is selected from 1, 2, 3, and 4.

In one embodiment, in Formula 301, $L_{301}$ is selected from a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and/or a chrysenylene group; and/or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and/or a chrysenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

$R_{301}$ is selected from a $C_1$-$C_{20}$ alkyl group and/or a $C_1$-$C_{20}$ alkoxy group;

a $C_1$-$C_{20}$ alkyl group and/or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a naphthyl group, a fluorenyl group, a spiro-fluorenyl group, a benzofluorenyl group, a dibenzo-fluorenyl group, a phenanthrenyl group, an anthracenyl group, a pyrenyl group, and/or a chrysenyl group; and/or a phenyl group, a naphthyl group, a fluorenyl group, a spiro-fluorenyl group, a benzofluorenyl group, a dibenzo-fluorenyl group, a phenanthrenyl group, an anthracenyl group, a pyrenyl group, and/or a chrysenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, but $R_{301}$ is not limited thereto.

For example, the host may include a compound represented by Formula 301A:

Formula 301A

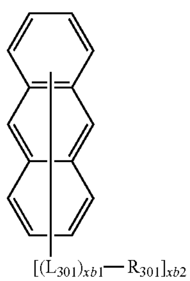

In Formula 301A, definitions of the substituents may be as described in the present specification.

The compound represented by Formula 301A may include at least one of Compounds H1 to H42, but the compound represented by Formula 301A is not limited thereto:

H1

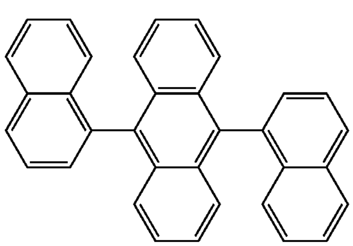

H2

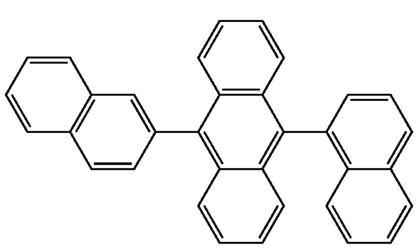

-continued

H3

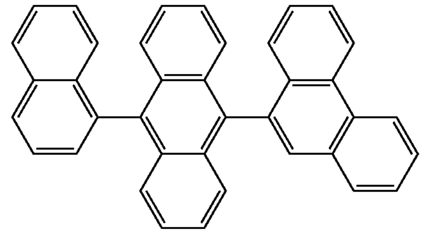

H4

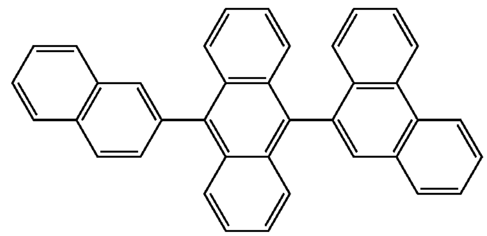

H5

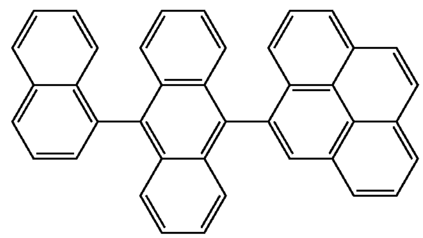

H6

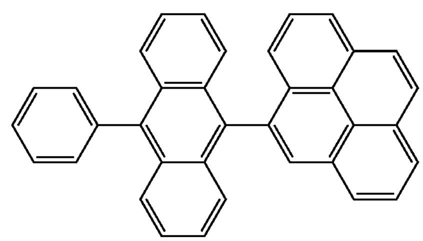

H7

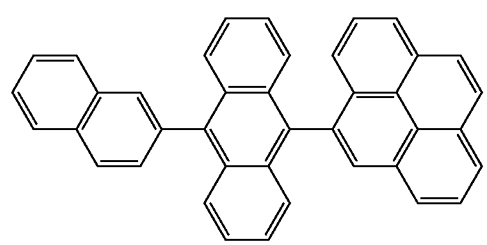

H8

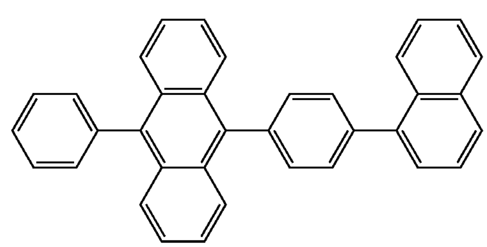

-continued
H9
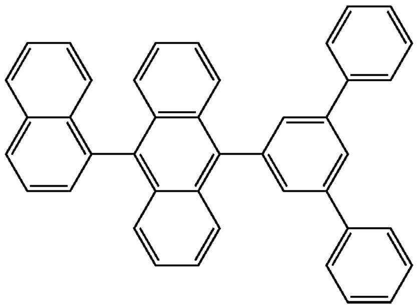
H10
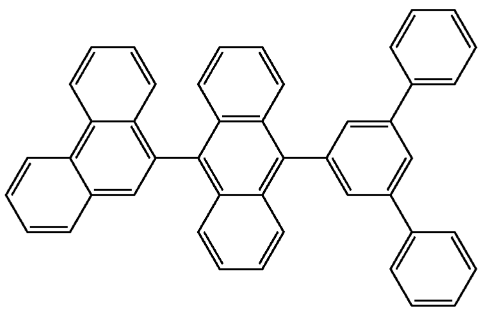
H11
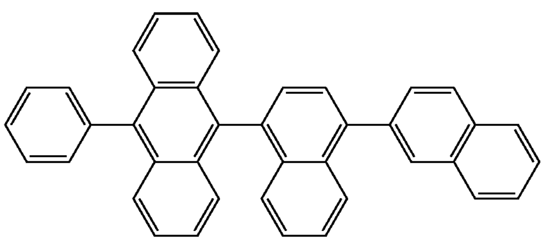
H12
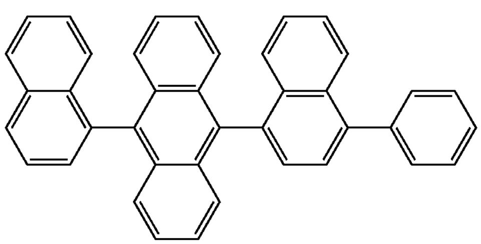
H13
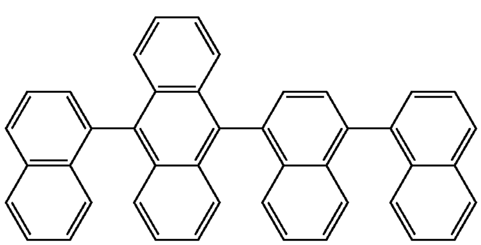
H14
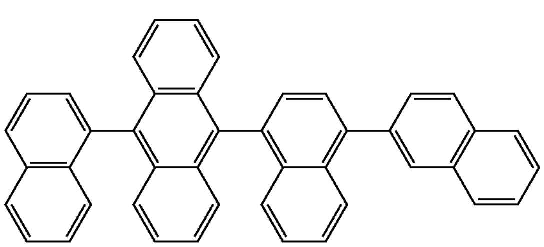
-continued
H15
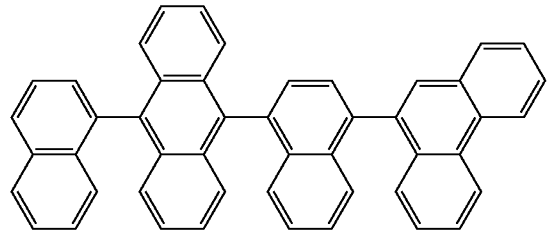
H16
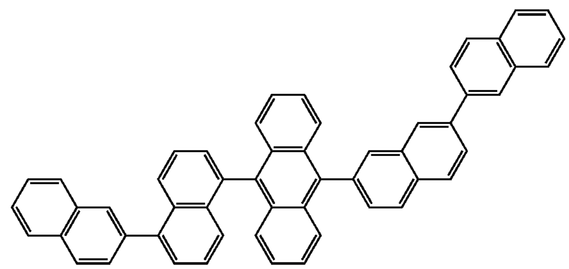
H17
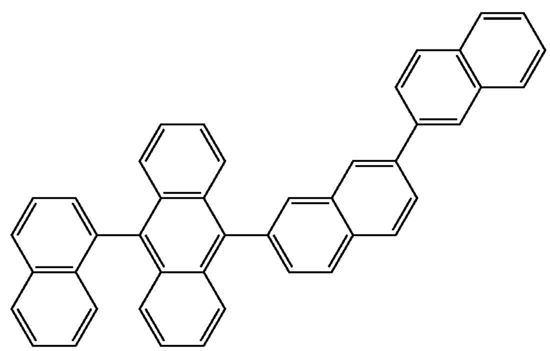
H18
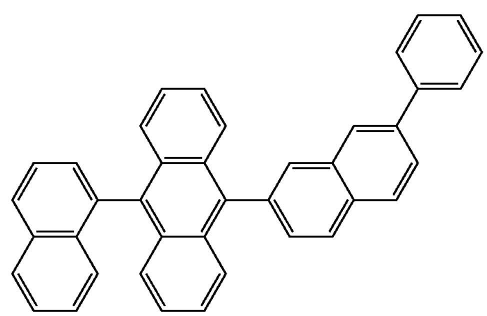
H19
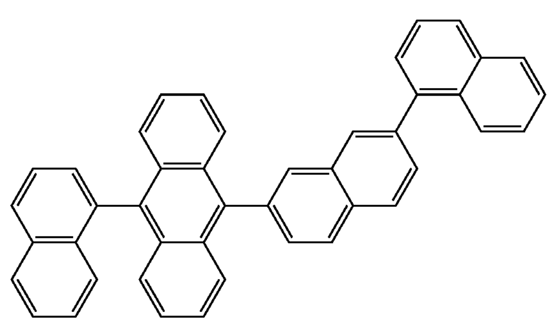

-continued
H20
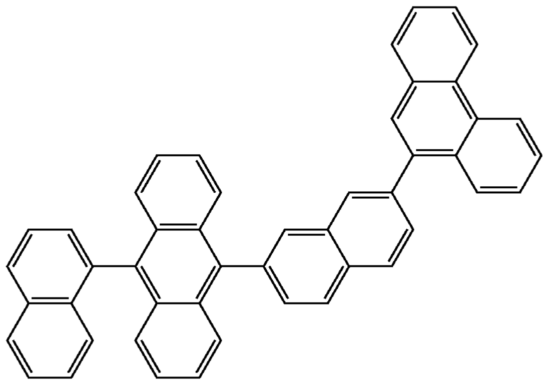
H21
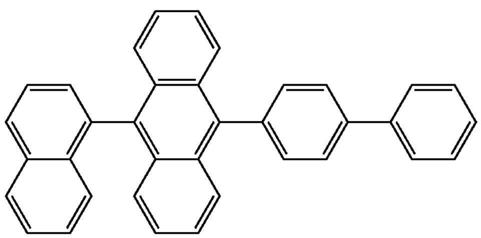
H22
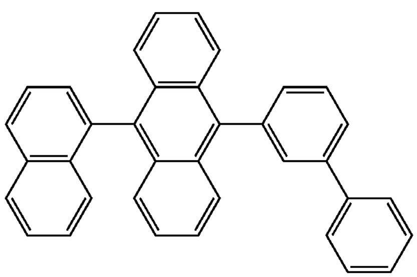
H23
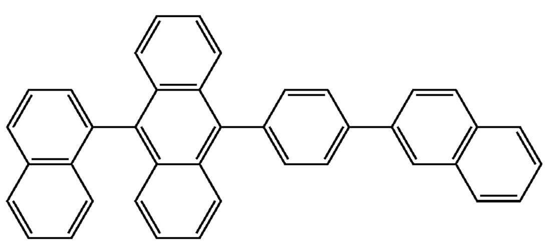
H24
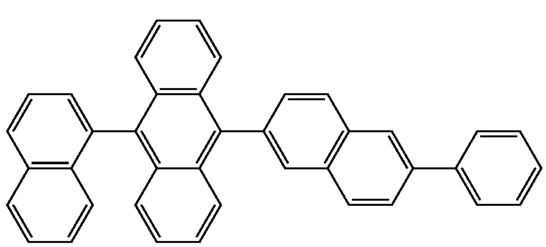
-continued
H25
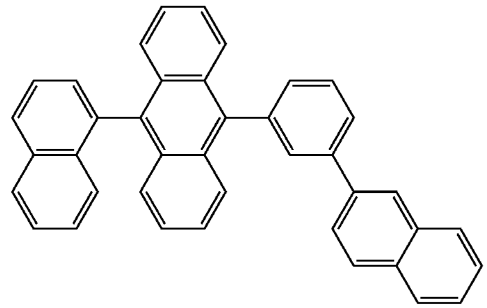
H26
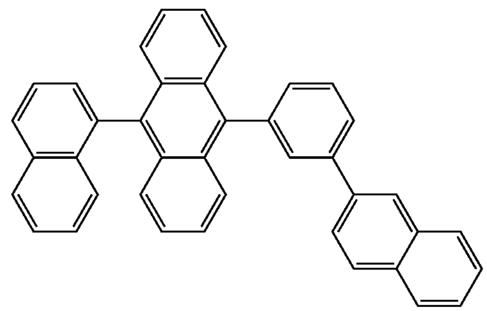
H27
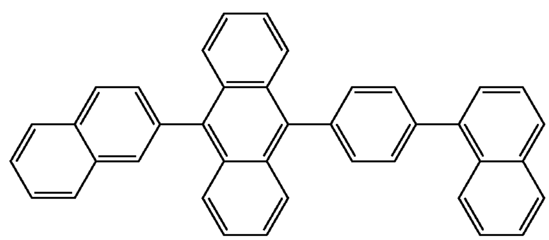
H28
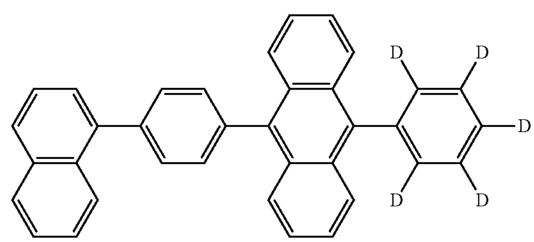
H29
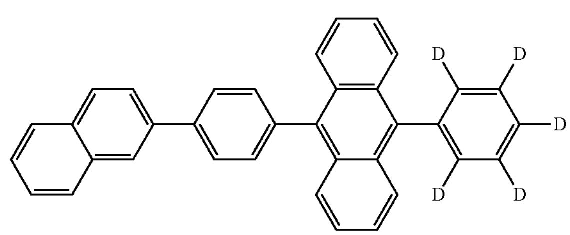
H30
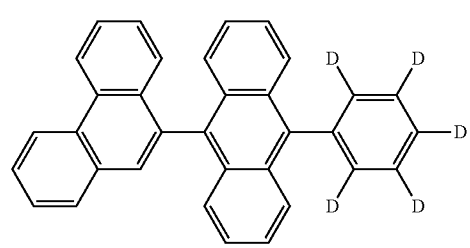

-continued
H31
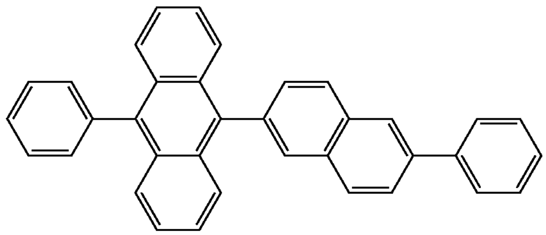
H32
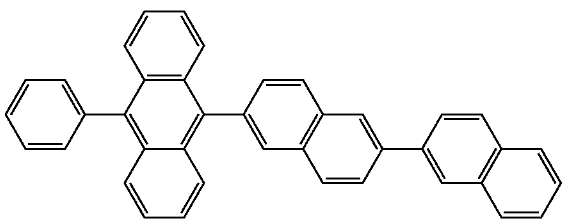
H33
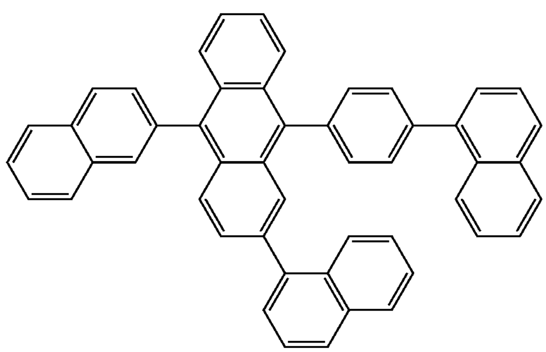
H34
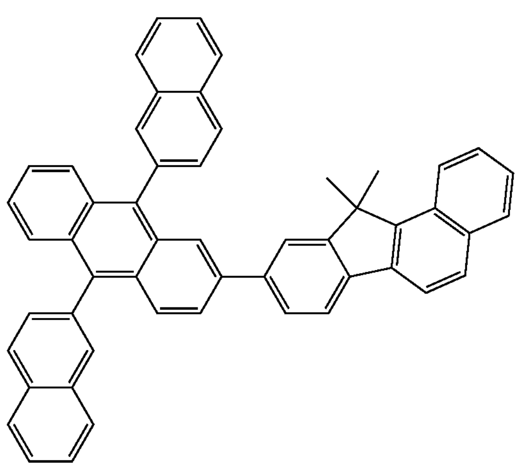
-continued
H35
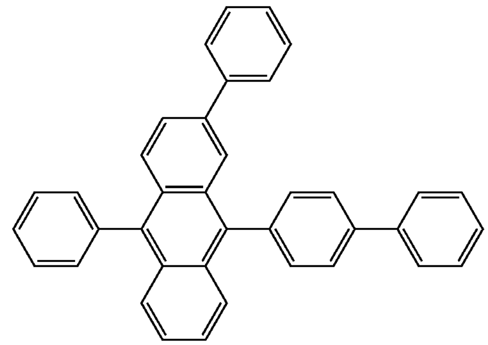
H36
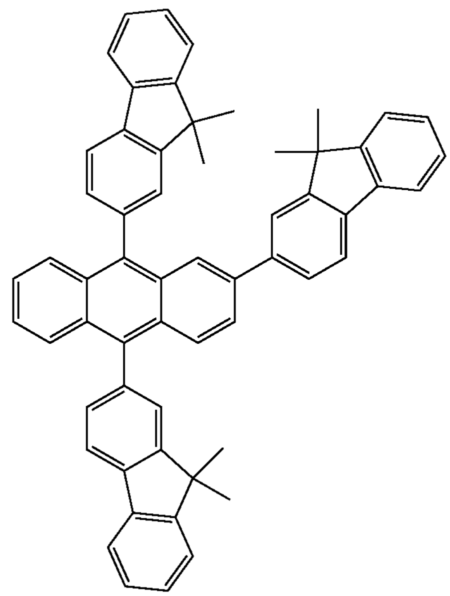
H37
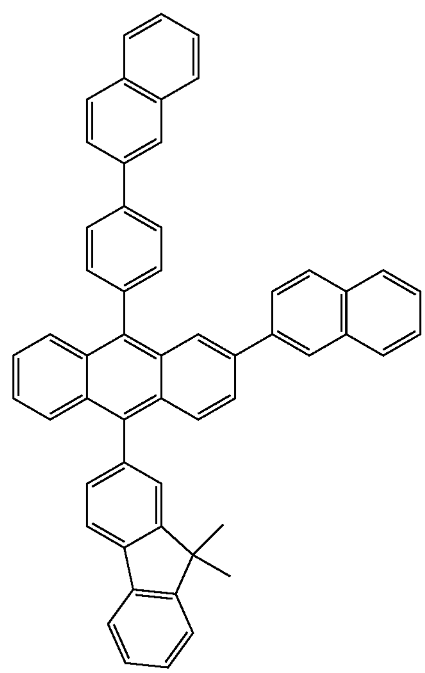

-continued
H38
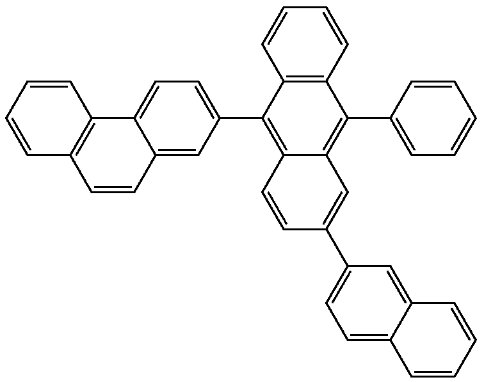
H39
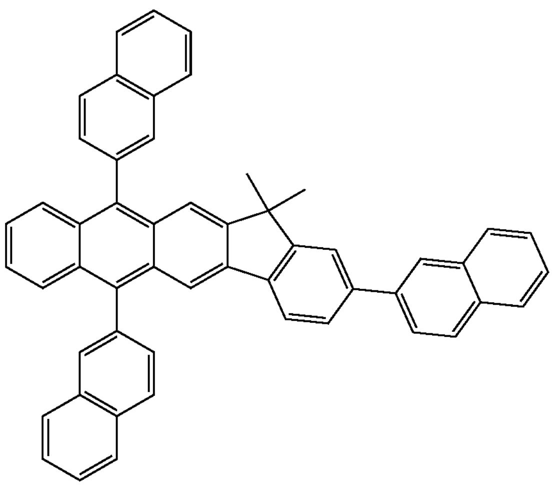
H40
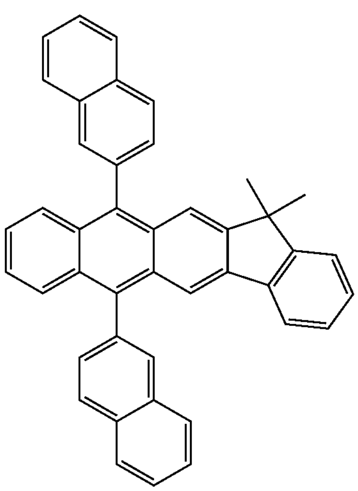
-continued
H41
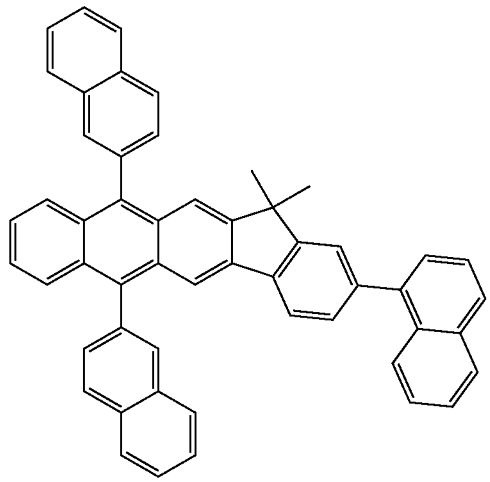
H42
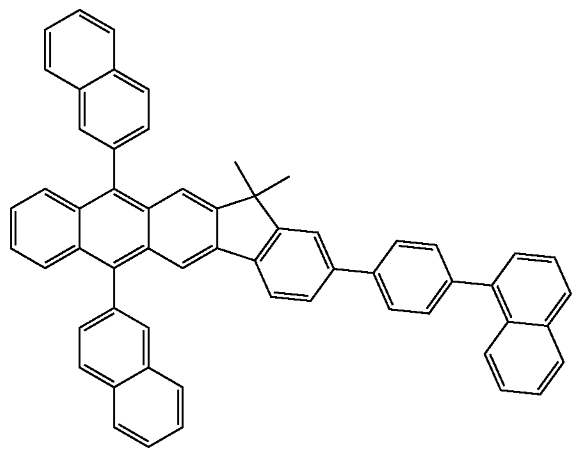
Additionally, the host may include at least one of Compounds H43 to H49, but the host is not limited thereto:
H43
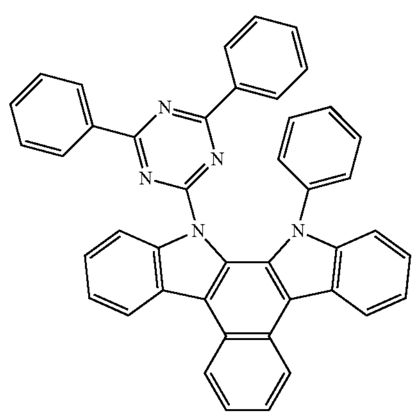

H44
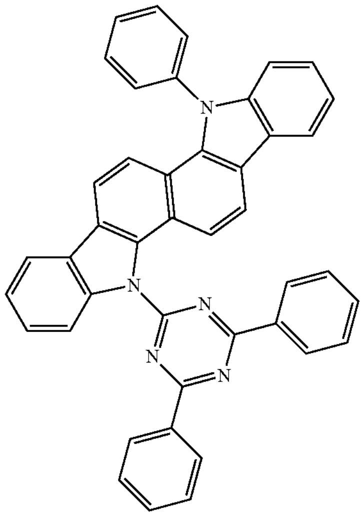
H45
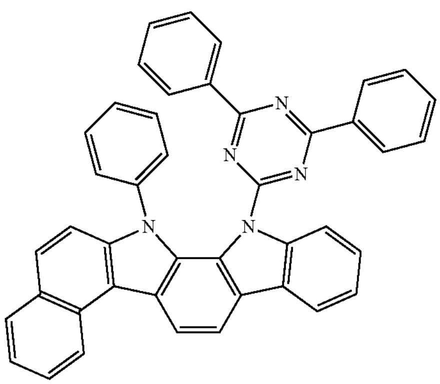
H46
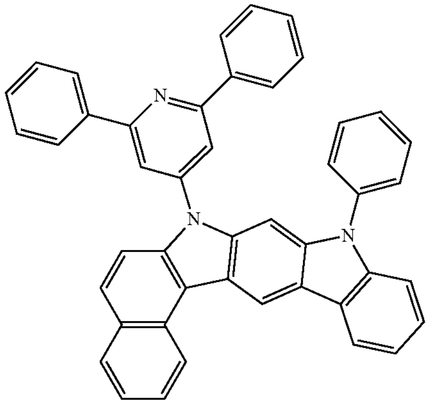
H47
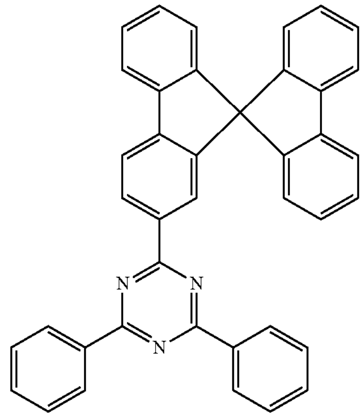
H48
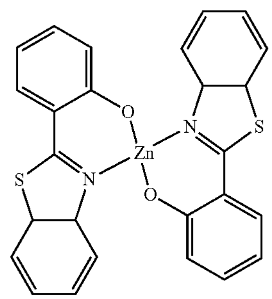
H49
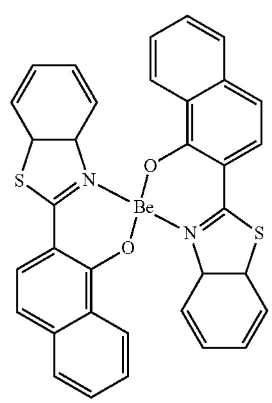
The dopant may include at least one of a fluorescent dopant and a phosphorescent dopant.
The phosphorescent dopant may include an organic metal complex represented by Formula 401:

Formula 401

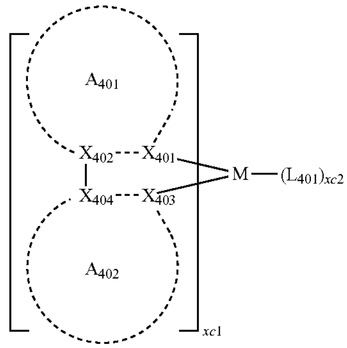

In Formula 401,

M is selected from iridium (Ir), platinum (Pt), osmium (Os), titanium (Ti), zirconium (Zr), hafnium (Hf), europium (Eu), terbium (Tb), and/or thulium (Tm);

$X_{401}$ to $X_{404}$ are each independently a nitrogen atom or a carbon atom;

rings $A_{401}$ and $A_{402}$ are each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiophene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isoxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiophene, a substituted or unsubstituted isobenzothiophene, a substituted or unsubstituted benzoxazole, a substituted or unsubstituted isobenzoxazole, a substituted or unsubstituted triazole, a substituted or unsubstituted oxadiazole, a substituted or unsubstituted triazine, a substituted or unsubstituted dibenzofuran, and a substituted or unsubstituted dibenzothiophene;

at least one substituent of the substituted benzene, substituted naphthalene, substituted fluorene, substituted spiro-fluorene, substituted indene, substituted pyrrole, substituted thiophene, substituted furan, substituted imidazole, substituted pyrazole, substituted thiazole, substituted isothiazole, substituted oxazole, substituted isoxazole, substituted pyridine, substituted pyrazine, substituted pyrimidine, substituted pyridazine, substituted quinoline, substituted isoquinoline, substituted benzoquinoline, substituted quinoxaline, substituted quinazoline, substituted carbazole, substituted benzoimidazole, substituted benzofuran, substituted benzothiophene, substituted isobenzothiophene, substituted benzoxazole, substituted isobenzoxazole, substituted triazole, substituted oxadiazole, substituted triazine, substituted dibenzofuran, and/or substituted dibenzothiophene is selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and/or a $C_1$-$C_{60}$ alkoxy group;

a $C_1$-$C_{60}$ alkyl group, a $C_2$-$C_{60}$ alkenyl group, a $C_2$-$C_{60}$ alkynyl group, and/or a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycydclic group, —N($Q_{401}$)($Q_{402}$), —Si($Q_{403}$)($Q_{404}$)($Q_{405}$), and —B($Q_{406}$)($Q_{407}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group and/or a monovalent non-aromatic heterocondensed polycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and/or a monovalent non-aromatic heterocondensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, —N($Q_{411}$)($Q_{412}$), —Si($Q_{413}$)($Q_{414}$)($Q_{415}$), and —B($Q_{416}$)($Q_{417}$); and/or —N($Q_{421}$)($Q_{422}$), —Si($Q_{423}$)($Q_{424}$)($Q_{425}$), and/or —B($Q_{428}$)($Q_{427}$), where $Q_{401}$ to $Q_{407}$, $Q_{411}$ to $Q_{417}$, and $Q_{421}$ to $Q_{427}$ are defined as $Q_{11}$ to $Q_{17}$, $Q_{21}$ to $Q_{27}$, and $Q_{31}$ to $Q_{37}$ above;

$L_{401}$ is an organic ligand;

xc1 is selected from 1, 2, and 3; and xc2 is selected from 0, 1, 2, and 3.

In one embodiment, $L_{401}$ is a monovalent, divalent, or trivalent organic ligand. For example, $L_{401}$ may be selected from a halogen ligand, such as Cl or F, a diketone ligand, such as acetylacetonate, 1,3-diphenyl-1,3-propanedionate, 2,2,6,6-tetramethyl-3,5-heptanedionate, or hexafluoroacetonate, a carboxylic acid ligand, such as picolinate, dimethyl-3-pyrazolecarboxylate, or benzoate, a carbon monoxide ligand, an isonitrile ligand, a cyano ligand, and/or a phosphorus ligand, such as phosphine or phosphite, but $L_{401}$ is not limited thereto.

In Formula 401, when $A_{401}$ has at least two substituents, the at least two substituents of $A_{401}$ may be linked to each other to form a saturated or unsaturated ring.

In Formula 401, when $A_{402}$ has at least two substituents, the at least two substituents of $A_{402}$ may be linked to each to and form a saturated or unsaturated ring.

In Formula 401, when xc1 is 2 or greater, a plurality of ligands,

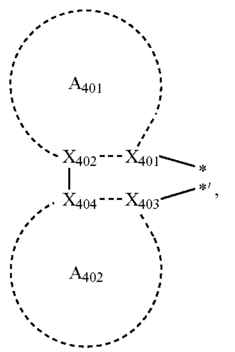

may be identical to or different from each other, and $A_{401}$ and $A_{402}$ of one ligand may be linked to $A_{401}$ and $A_{402}$ of an adjacent ligand, respectively, directly (e.g. via a single bond) or via a connection group (e.g., a $C_1$-$C_5$ alkylene group, —N(R')— (where, R' is $C_1$-$C_{10}$alkyl group or a $C_6$-$C_{20}$ aryl group), or —C(═O)—).

In one embodiment, the phosphorescent dopant may be selected from Compounds PD1 to PD74 below, but is not limited thereto:

PD1

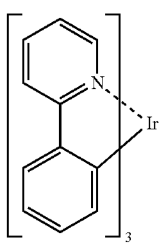

PD2

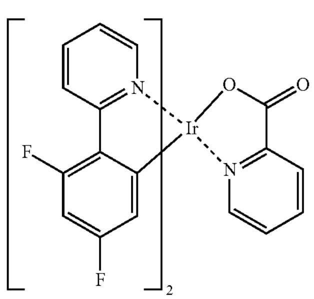

-continued

PD3

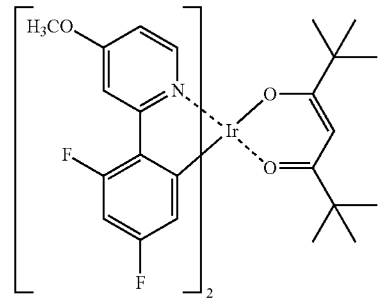

PD4

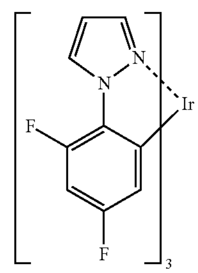

PD5

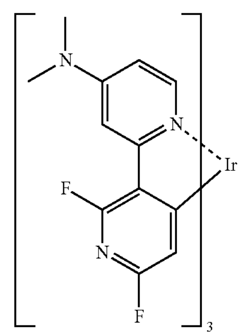

PD6

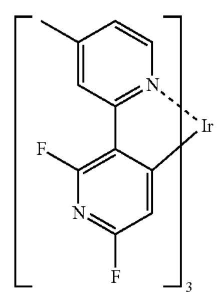

PD7

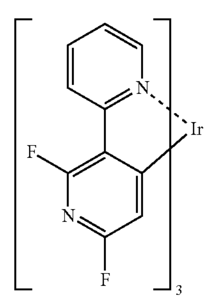

-continued
PD8
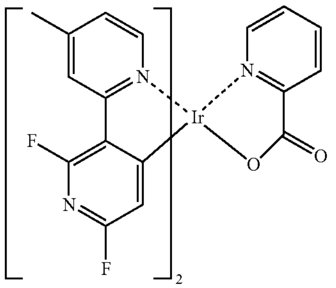
PD9
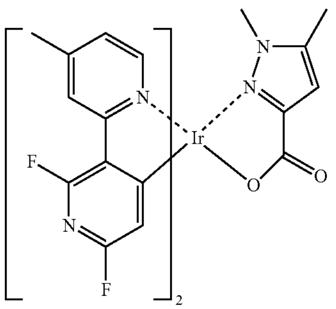
PD10
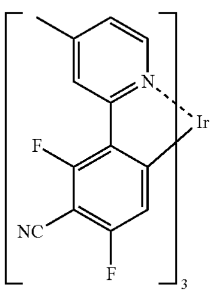
PD11
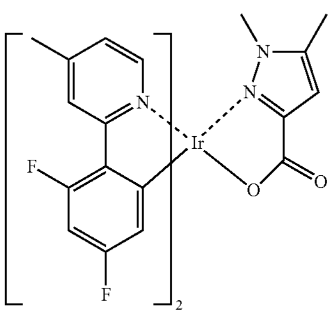
PD12
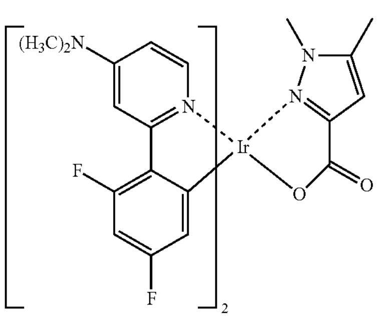
-continued
PD13
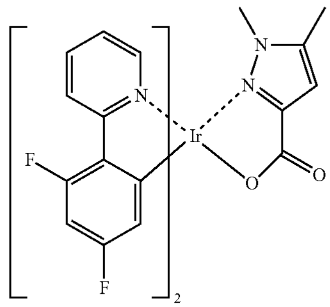
PD14
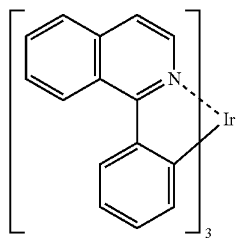
PD15
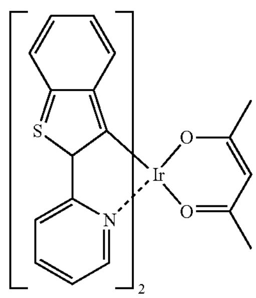
PD16
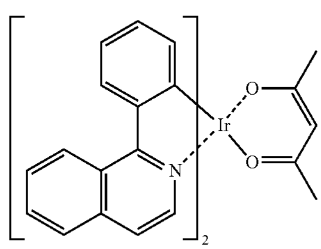
PD17
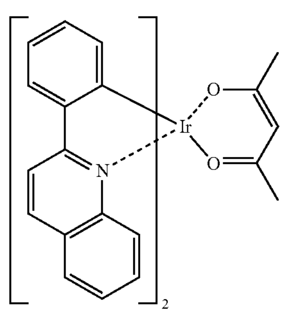

-continued
PD18
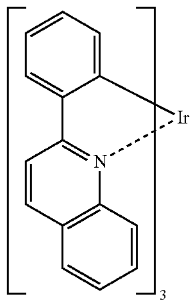
PD19
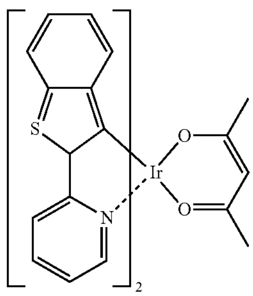
PD20
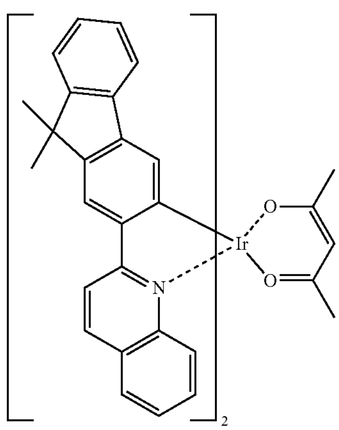
PD21
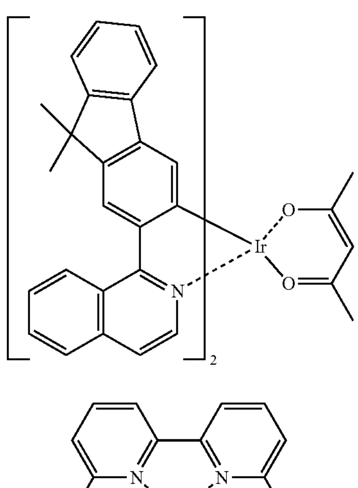
PD22
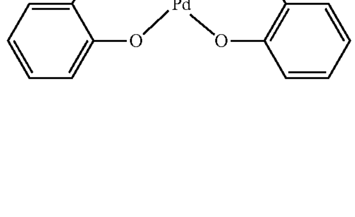
-continued
PD23
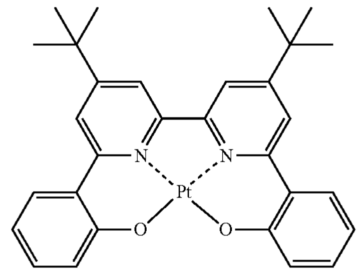
PD24
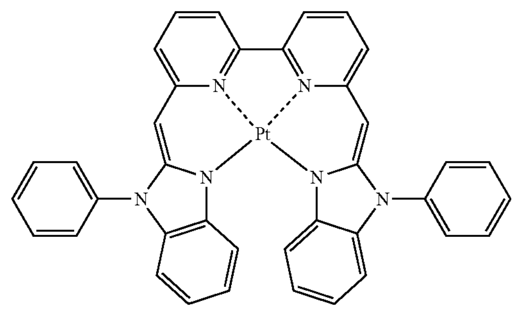
PD25
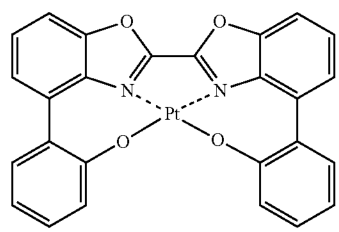
PD26
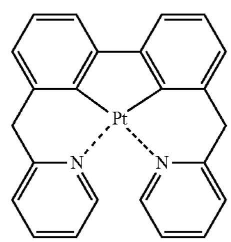
PD27
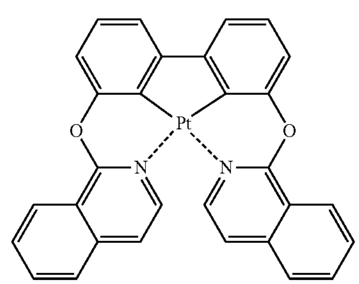
PD28
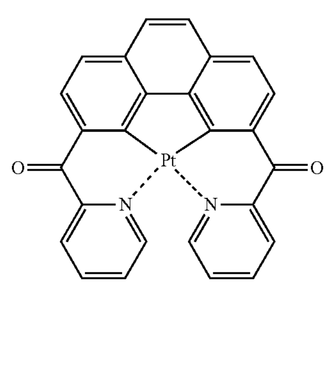

-continued
PD29
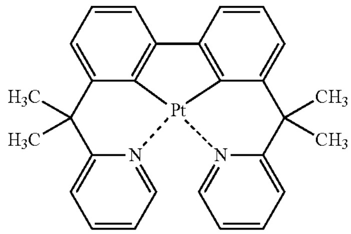
PD30
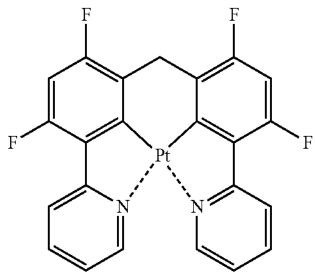
PD31
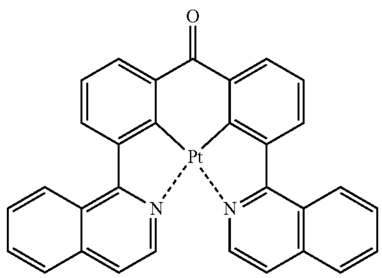
PD32
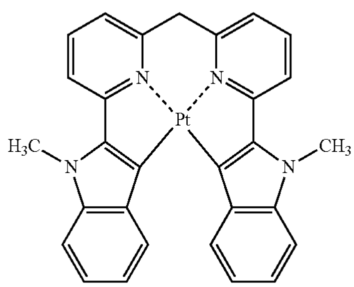
PD33
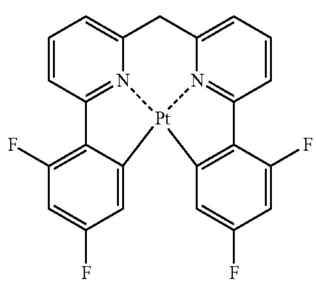
PD34
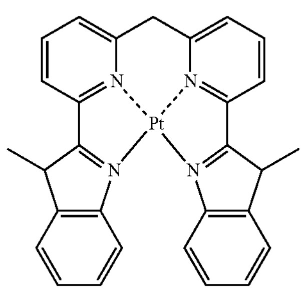
-continued
PD35
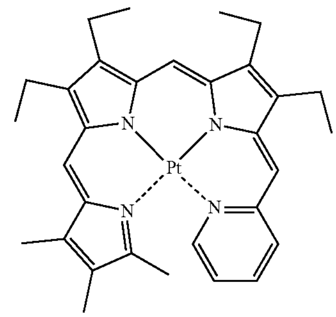
PD36
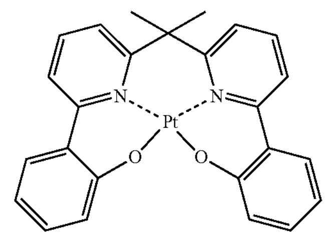
PD37
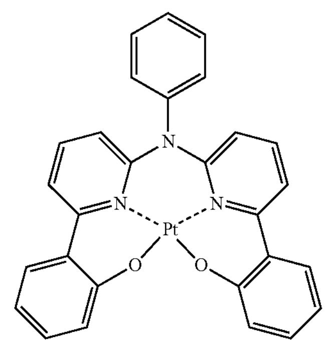
PD38
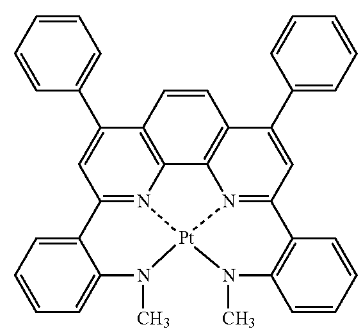
PD39
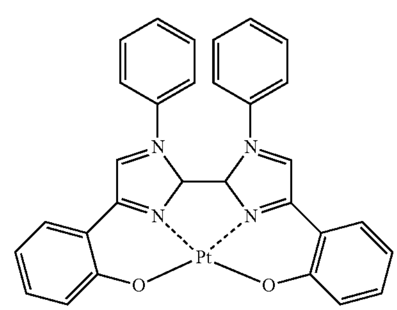

PD40
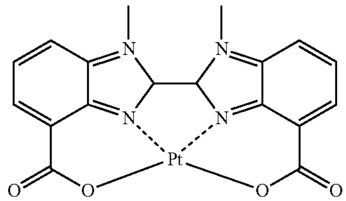
PD41
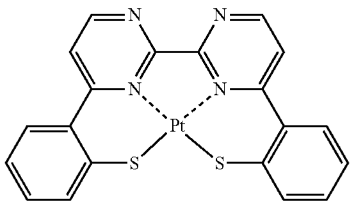
PD42
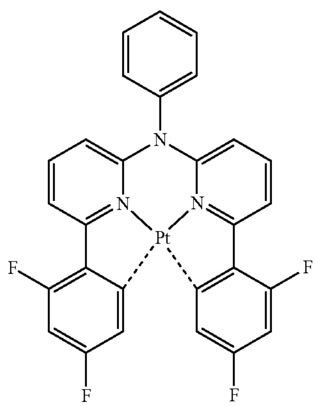
PD43
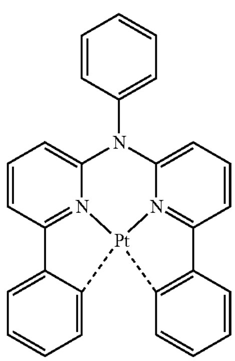
PD44
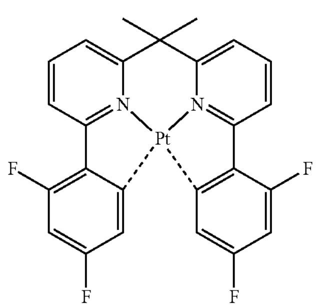
PD45
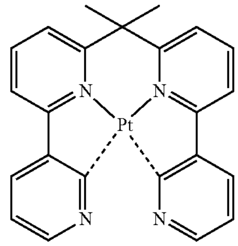
PD46
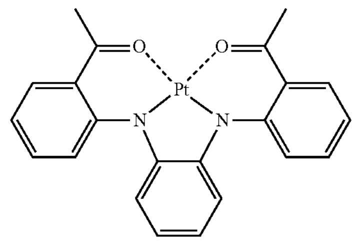
PD47
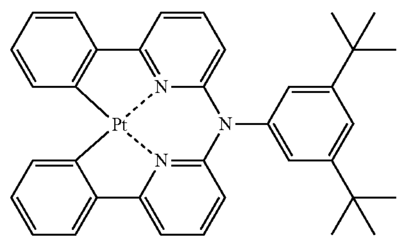
PD48
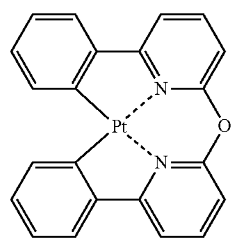
PD49
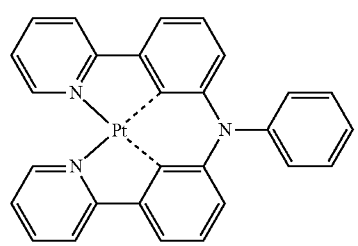
PD50
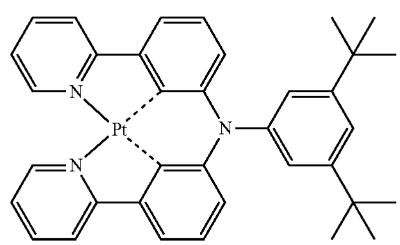

-continued
PD51
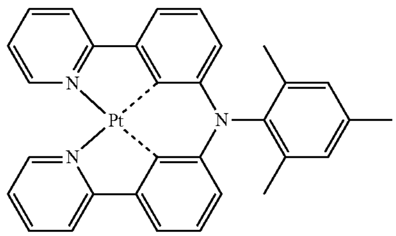
PD52
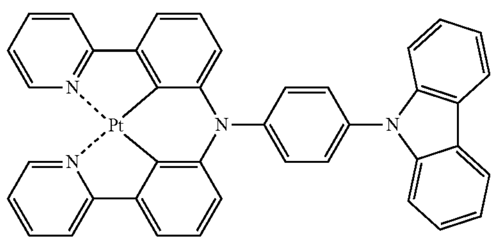
PD53
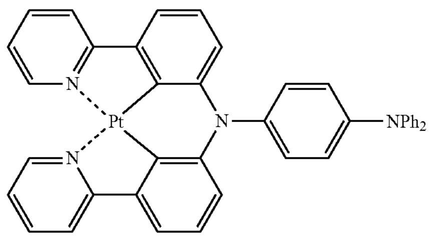
PD54
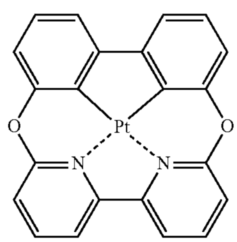
PD55
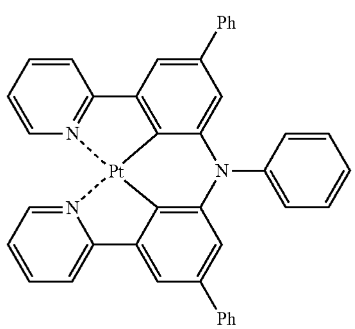
PD56
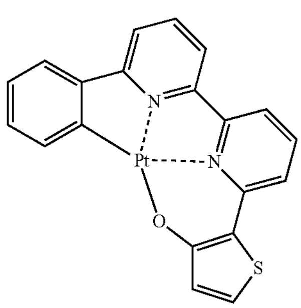
-continued
PD57
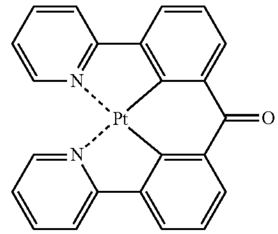
PD58
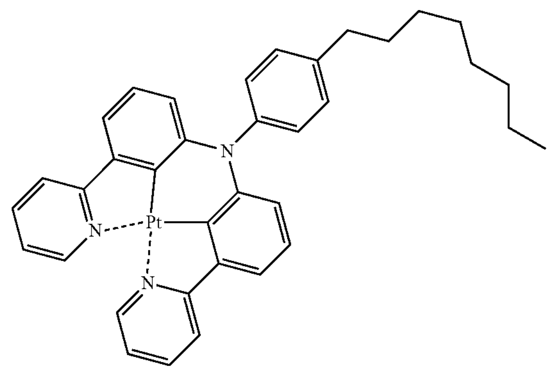
PD59
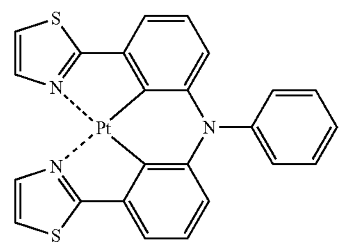
PD60
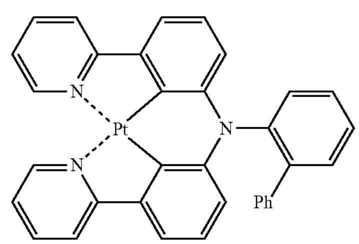
PD61
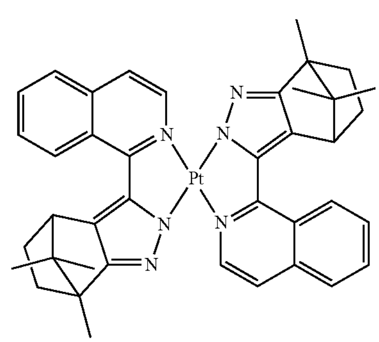

-continued
PD62
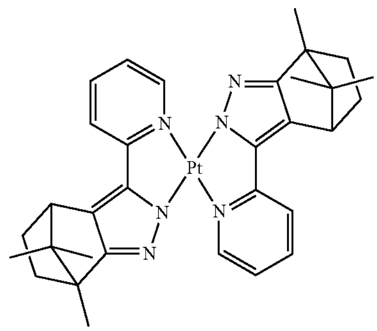
PD63
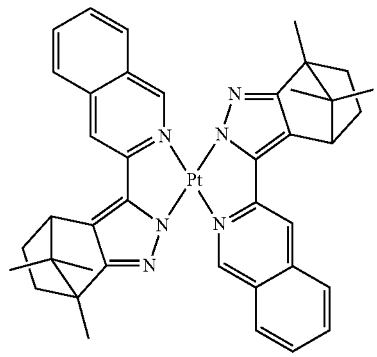
PD64
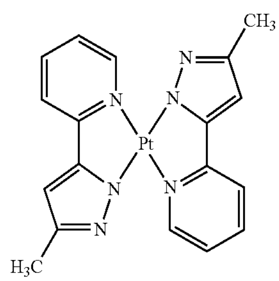
PD65
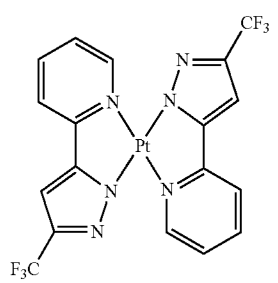
PD66
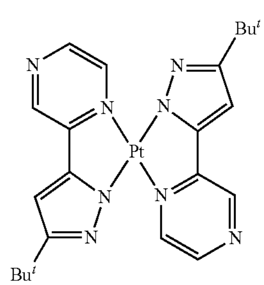
-continued
PD67
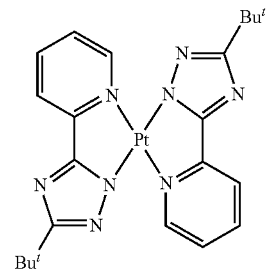
PD68
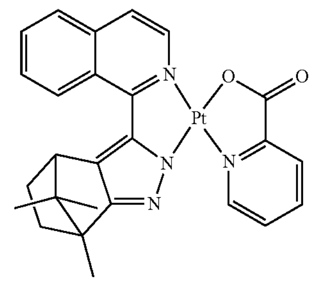
PD69
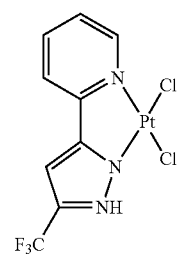
PD70
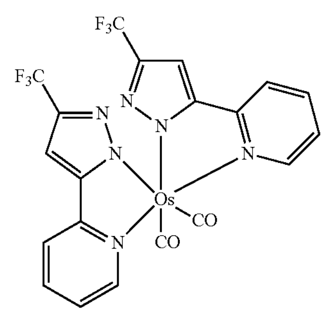
PD71
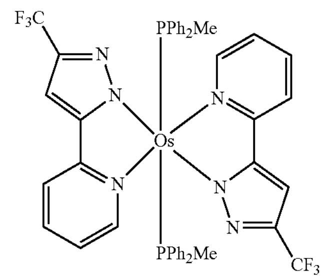

-continued
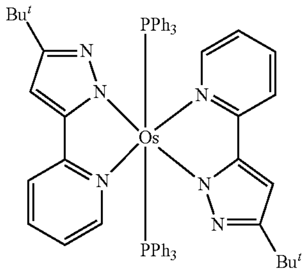
PD72
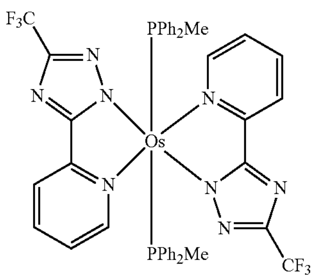
PD73
-continued
PD74
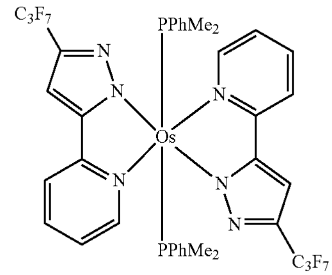
Additionally, the phosphorescent dopant may include PtOEP illustrated below:
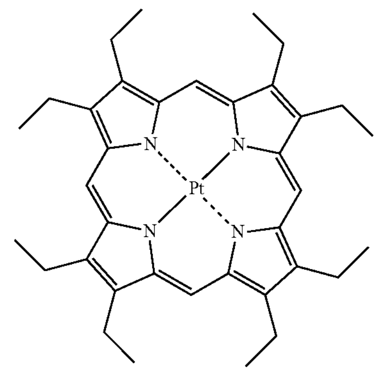
PtOEP
The fluorescent dopant may include at least one of DPVBi, BDAVBi, TBPe, DCM, DCJTB, Coumarin 6, and C545T below:
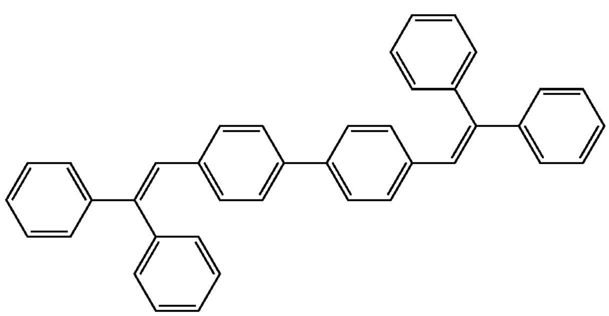
DPVBi
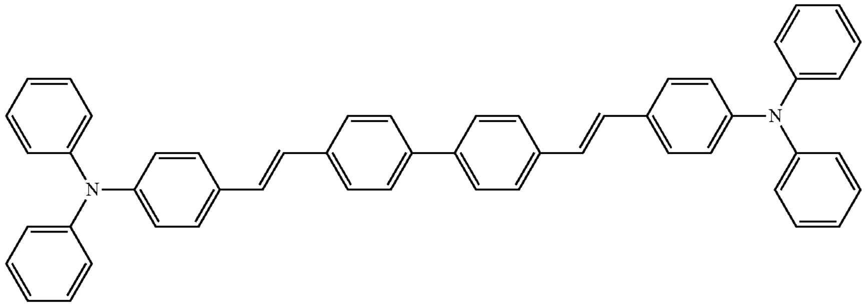
BDAVBi -continued

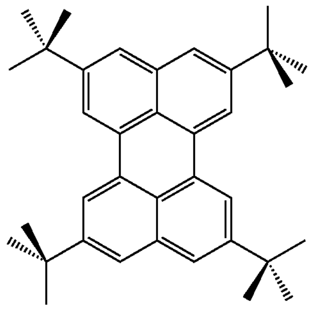

TBPe

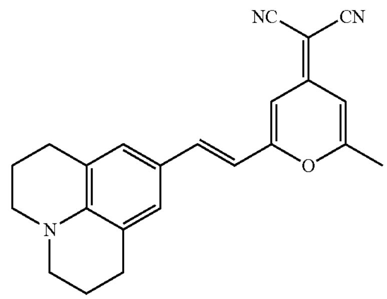

DCM

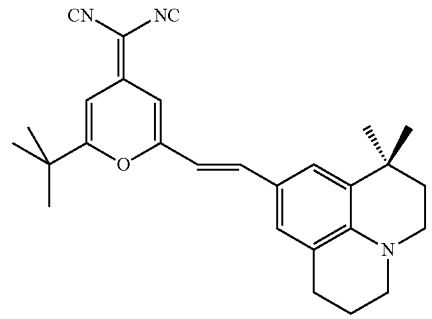

DCJTB

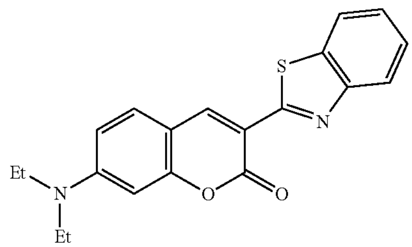

Coumarin 6

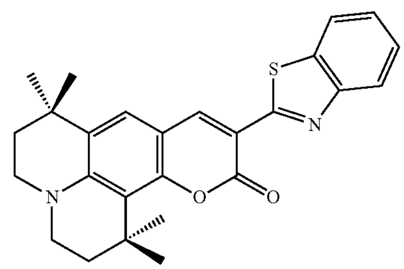

C545T

Additionally, the fluorescent dopant may include a compound represented by Formula 501 below:

Formula 501

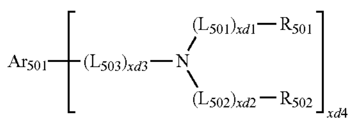

In Formula 501, $Ar_{501}$ is selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene group, a pentaphene, and/or an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and/or an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, and —Si($Q_{501}$)($Q_{502}$)($Q_{503}$) (where, $Q_{501}$ to $Q_{503}$ are each independently selected from a hydrogen, a $C_1$-$C_{60}$ alkyl group, a $C_2$-$C_{60}$ alkenyl group, a $C_6$-$C_{60}$ aryl group, and/or a $C_2$-$C_{60}$ heteroaryl group);

definitions of $L_{501}$ to $L_{503}$ may be each independently the same as the definition of $L_{201}$;

$R_{501}$ and $R_{502}$ are each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and/or a dibenzothiophenyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and/or a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 are each independently selected from 0, 1, 2, and 3;

xb4 is selected from 1, 2, 3, and 4.

The fluorescent host may include at least one of Compounds FD1 to FD8, but is not limited thereto:
FD1
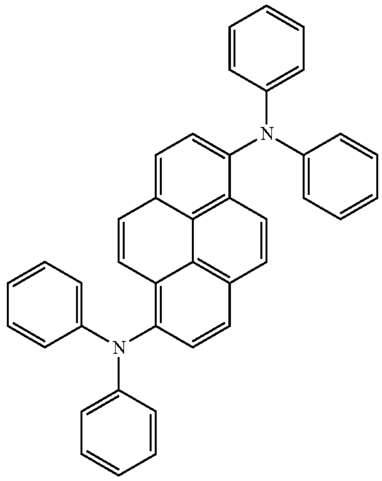
FD2
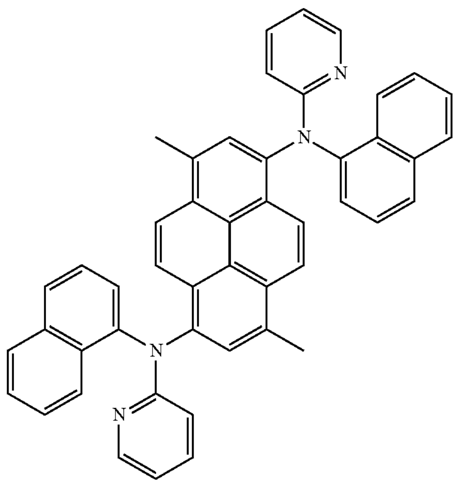
FD3
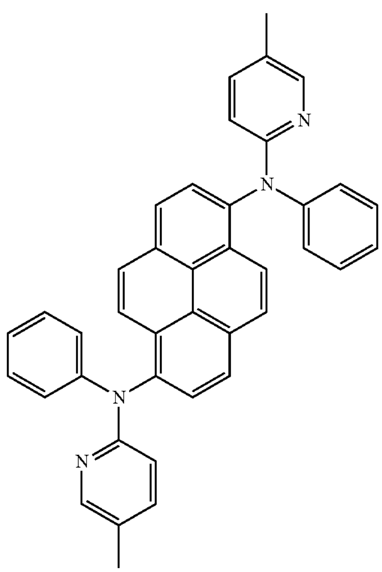
-continued
FD4
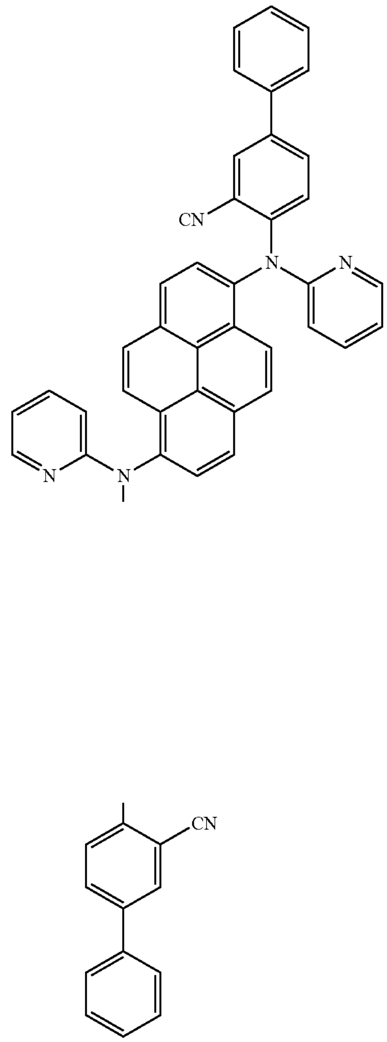
FD5
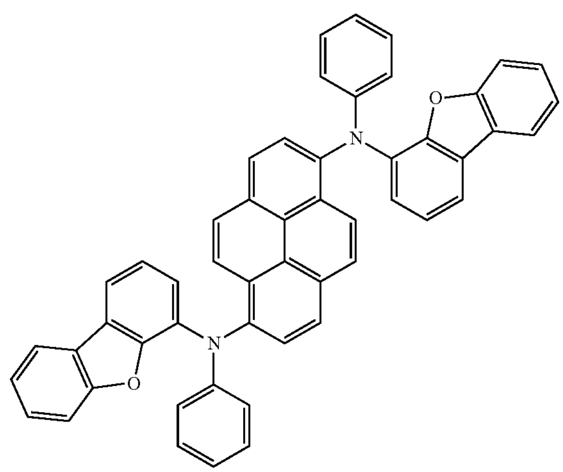

-continued

FD6

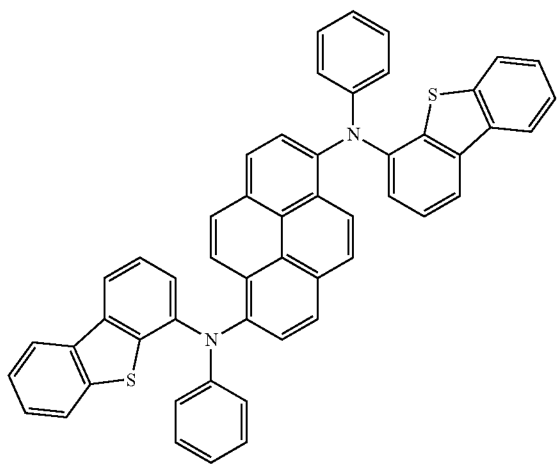

FD7

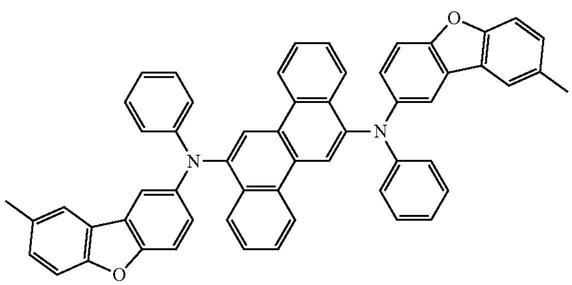

FD8

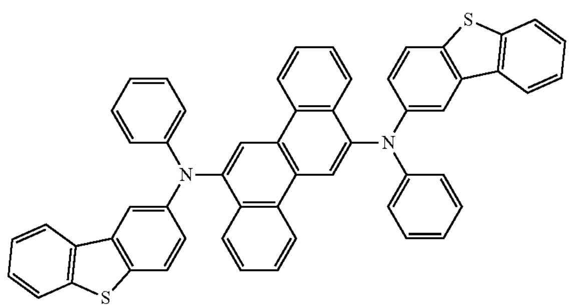

The dopant may be present in the EML in an amount of about 0.01 part to about 15 parts by weight, based on about 100 parts by weight of the host, but the amount of the dopant is not limited thereto.

A thickness of the EML may be about 100 Å to about 1,000 Å, for example, about 200 Å to about 600 Å. When the thickness of the EML is within any of these ranges, light-emitting properties of the organic light-emitting device may be improved, without a substantial increase in driving voltage.

The mixed organic layer may be on the EML.

The mixed organic layer may be formed on the EML using (utilizing) various methods such as, for example, vacuum deposition, spin coating, casting, LB deposition, inkjet printing, laser printing, or LITI. When the mixed organic layer is formed by methods such as vacuum deposition or spin coating, the deposition conditions and the coating conditions for forming the mixed organic layer may be similar to the deposition conditions and the coating conditions for forming the HIL.

A compound for forming the mixed organic layer may be as described above.

A thickness of the mixed organic layer may be about 5 Å to about 400 Å, for example, about 10 Å to about 40 Å. When the thickness of the mixed organic layer is within any of these ranges, light-emitting properties of the organic light-emitting device may be improved, without a substantial increase in driving voltage.

A weight ratio of the hole-transporting compound to the electron-transporting compound in the mixed organic layer may be in the range of about 0.1:1 to about 10:1, but the respective amounts of the hole-transporting compound and the electron-transporting compound in the mixed organic layer are not limited thereto.

An electron transport region may be positioned on the mixed organic layer.

The electron transport region may include at least one selected from an HBL, an ETL, and an EIL, but is not limited thereto.

For example, the electron transport region may have a structure of ETL/EIL or EBL/ETL/EIL, sequentially stacked on the EML or on the mixed organic layer, but the structure of the electron transport region is not limited thereto.

In one embodiment, the organic layer 150 of the organic light-emitting device 10 includes an electron transport region between the EML and the second electrode 190. The electron transport region may include at least one of an ETL and an EIL.

The ETL may include at least one selected from bathocuproine (BCP), bathophenanthroline (Bphen), $Alq_3$, Balq, TAZ, and NTAZ below:

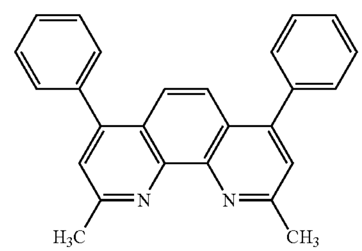

BCP

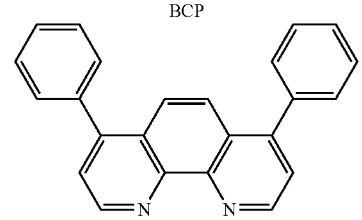

Bphen

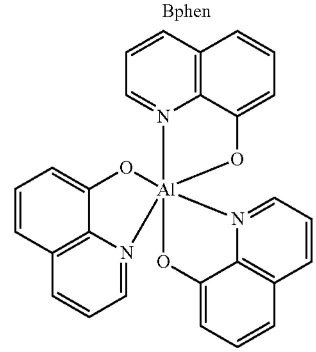

$Alq_3$

-continued

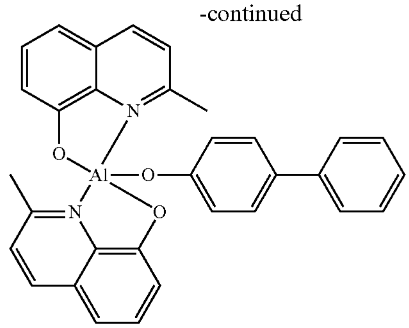

BAlq

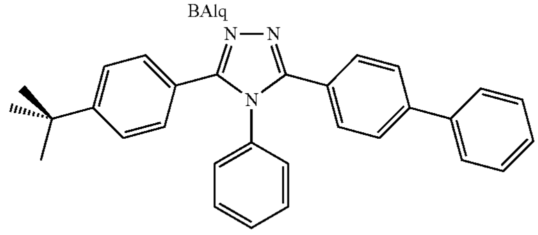

TAZ

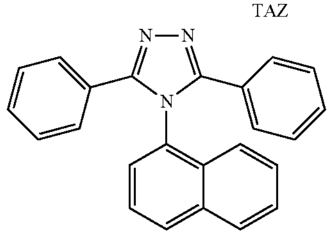

NTAZ

Additionally, the ETL may include at least one compound selected from a group of compounds represented by Formula 601 and Formula 602:

$$Ar_{601}\text{-}[(L_{601})_{xe1}\text{-}E_{601}]_{xe2} \qquad \text{Formula 601}$$

In Formula 601, $Ar_{601}$ is selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and/or an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and/or an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic heterocondensed polycyclic group, and —$Si(Q_{301})(Q_{302})(Q_{303})$ (where, $Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, and/or a $C_2$-$C_{60}$ heteroaryl group);

definition of $L_{601}$ may be the same as the definition of $L_{201}$ above;

$E_{601}$ is selected from a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadlazolyl group, an imidazopyridinyl group, and/or an imidazopyrimidinyl group; and/or a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadlazolyl group, an imidazopyridinyl group, and/or an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadlazolyl group, an imidazopyridinyl group, and an imidazopyrimidinyl group;

xe1 is selected from 0, 1, 2, and 3;

xe2 is selected from 1, 2, 3, and 4.

Formula 602

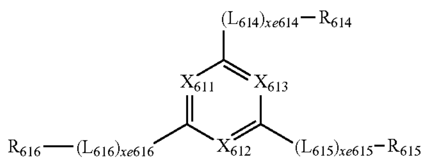

In Formula 602, $X_{611}$ is N or C-$(L_{611})_{xe611}$-$R_{611}$, $X_{612}$ is N or C-$(L_{612})_{xe612}$-$R_{612}$, $X_{613}$ is N or C-$(L_{613})_{xe613}$-$R_{613}$, and at least one of $X_{611}$ to $X_{613}$ is N;

definitions of each of $L_{611}$ to $L_{616}$ may be the same as the definition of $L_{201}$ as described in the present specification;

$R_{611}$ to $R_{616}$ are each independently selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 are each independently selected from 0, 1, 2, and 3.

The compound represented by Formula 601 and the compound represented by Formula 602 may be each independently selected from compounds ET1 to ET15:

ET1

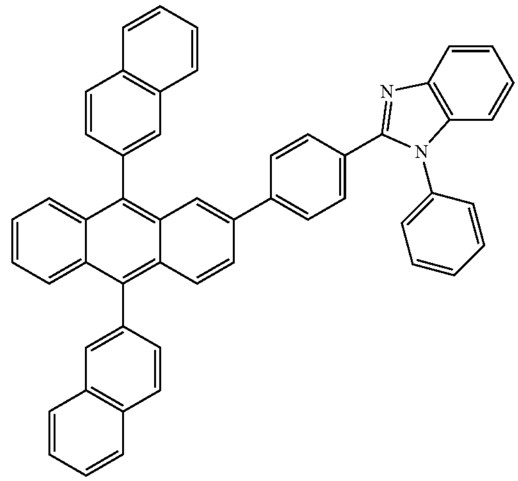

ET2

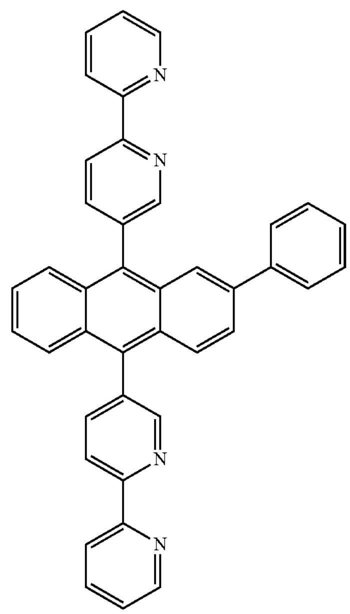

ET3

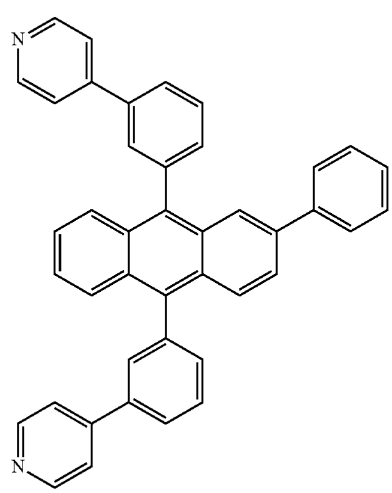

-continued
ET4
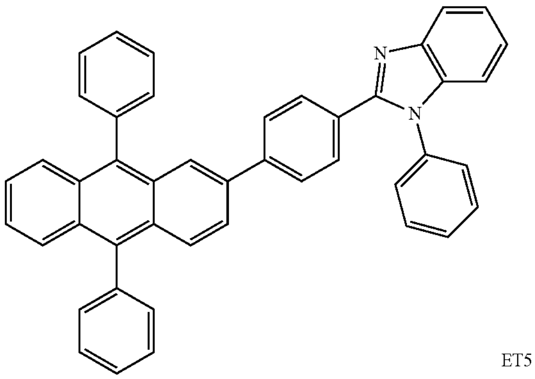
ET5
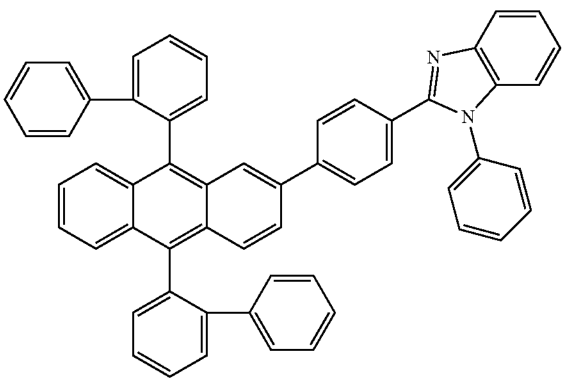
ET6
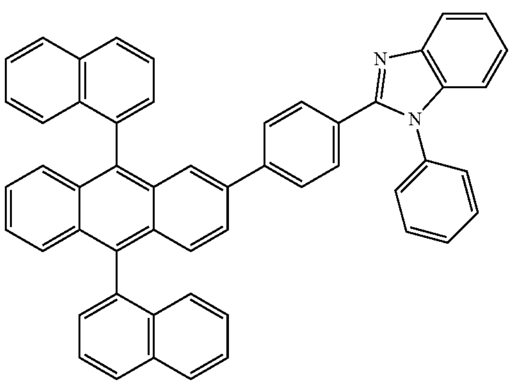
ET7
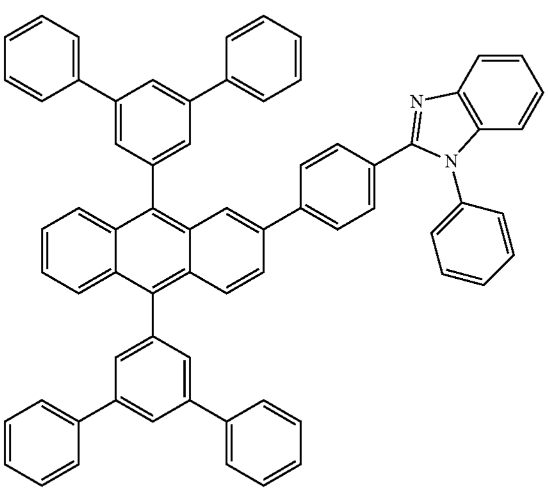
-continued
ET8
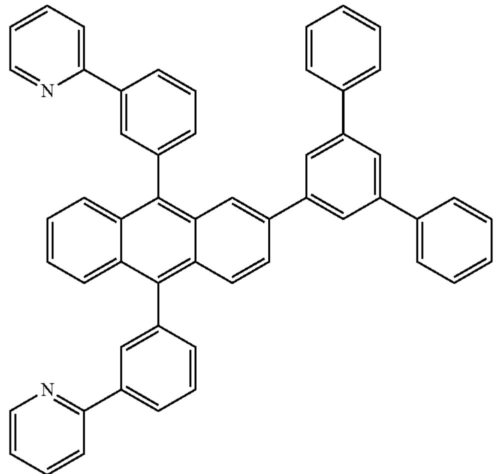
ET9
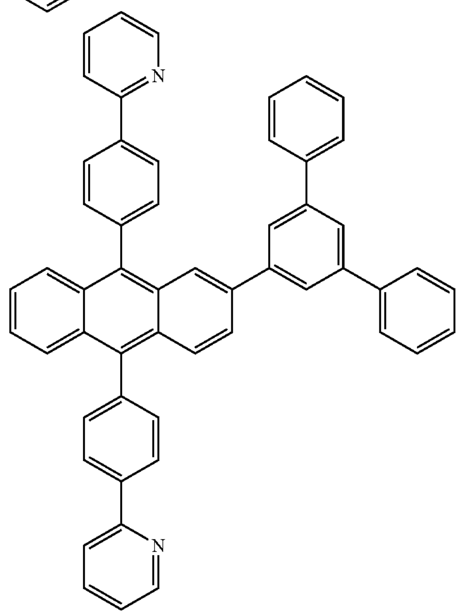
ET10
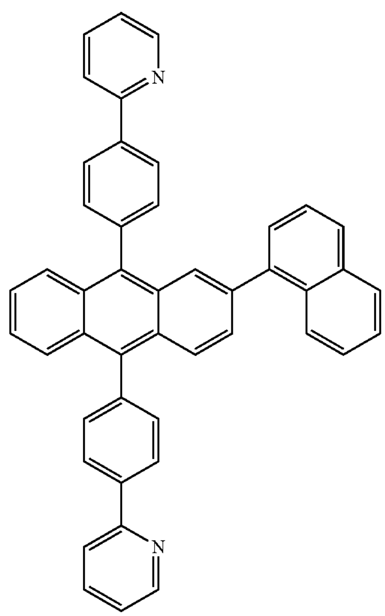

-continued

ET11

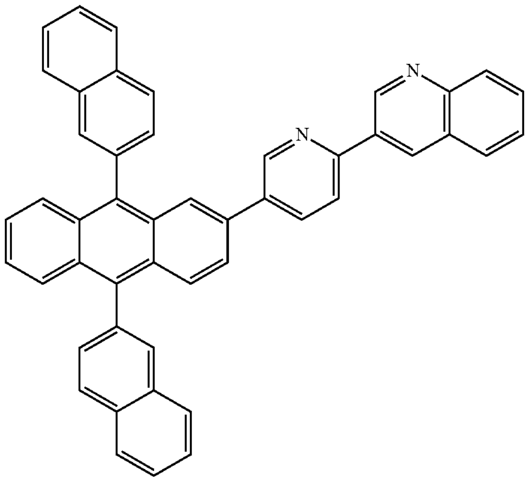

ET12

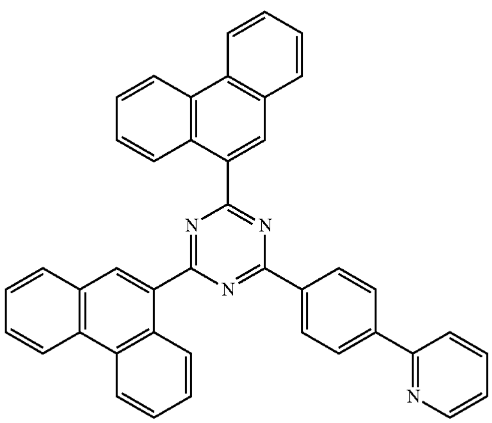

ET13

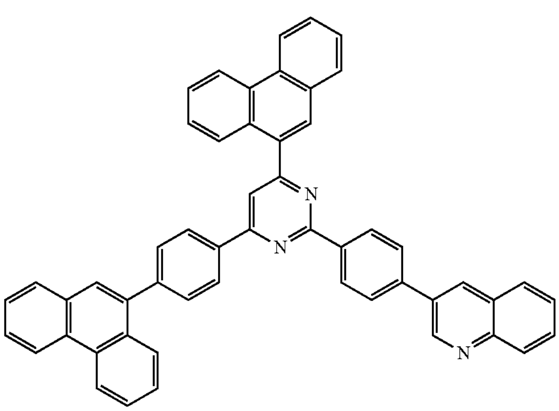

-continued

ET14

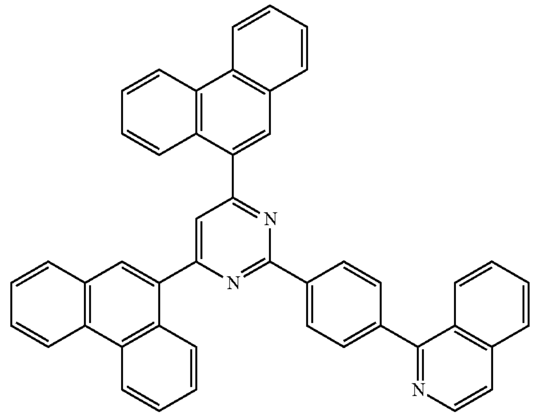

ET15

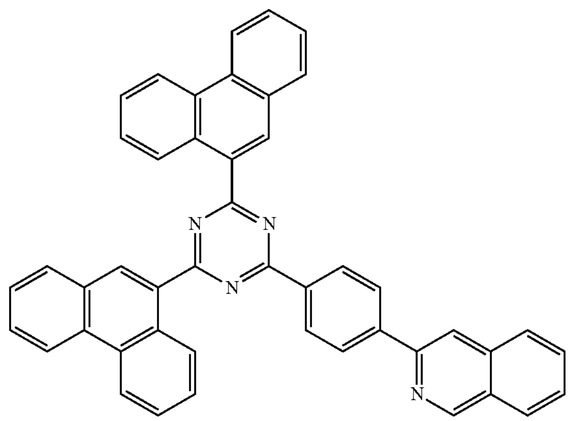

A thickness of the ETL may be about 100 Å to about 1,000 Å, for example, about 150 Å to about 500 Å. When the thickness of the ETL is within any of these ranges, electron transporting properties of the organic light-emitting device may be Improved, without a substantial increase in driving voltage.

The ETL may further include a metal-containing material, in addition to the materials described above.

The metal-containing material may include a Li-complex. The Li-complex may include, for example, compound ET-D1 (lithium quinolate (LiQ)) or ET-D2:

ET-D1

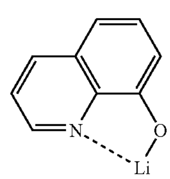

-continued

ET-D2

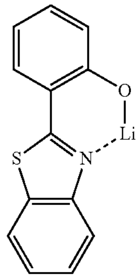

The electron transport region may include an HBL. When the EML includes a phosphorescent dopant, the HBL may prevent triplet excitons or holes from diffusing into the ETL.

When the electron transport region includes the HBL, the HBL may be formed on the EML using (utilizing) various methods such as, for example, vacuum deposition, spin coating, casting, LB deposition, inkjet printing, laser printing, or LITI. When the HBL is formed by methods such as vacuum deposition or spin coating, the deposition conditions and the coating conditions for forming the HBL may be similar to the deposition conditions and the coating conditions for forming the HIL.

The HBL may include, for example, at least one of BCP and Bphen below, but is not limited thereto:

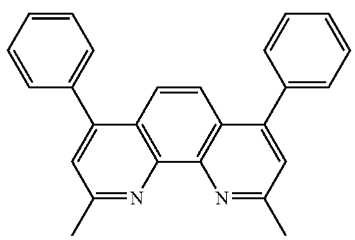

BCP

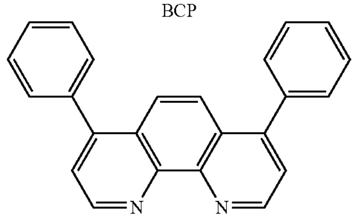

Bphen

A thickness of the HBL may be about 20 Å to about 1,000 Å, for example, about 30 Å to about 300 Å. When the thickness of the HBL is within any of these ranges, the organic light-emitting device may exhibit good hole blocking properties, without a substantial increase in driving voltage.

The electron transport region may include an ETL. The ETL may be formed on the EML or the HBL using (utilizing) various methods such as, for example, vacuum deposition, spin coating, casting, LB deposition, inkjet printing, laser printing, or LITI. When the ETL is formed by methods such as vacuum deposition or spin coating, the deposition conditions and the coating conditions for forming the ETL may be similar to the deposition conditions and the coating conditions for forming the HIL.

The electron transport region may include an EIL that may facilitate the injection of electrons from the second electrode 190.

The EIL may be formed on the ETL using (utilizing) various methods such as, for example, vacuum deposition, spin coating, casting, LB deposition, inkjet printing, laser printing, or LITI. When the EIL is formed by vacuum deposition or spin coating, the deposition conditions and the coating conditions for forming the EIL may be similar to the deposition conditions and the coating conditions for forming the HIL.

The EIL may include at least one selected from LiF, NaCl, CsF, $Li_2O$, BaO, and LiQ, but is not limited thereto.

A thickness of the EIL may be about 1 Å to about 100 Å, for example, about 3 Å to about 90 Å. When the thickness of the EIL is within any of these ranges, the organic light-emitting device may exhibit good electron injecting properties, without a substantial increase in driving voltage.

In one embodiment, the second electrode 190 is on the organic layer 150. The second electrode 190 may be a cathode, which is an electron injection electrode. When the second electrode 190 is a cathode, a material for forming the second electrode 190 may include a metal, an alloy, an electric conducting compound, all having a low work function, and/or a mixture thereof. For example, the second electrode 190 may be a thin film formed of lithium (Li), magnesium (Mg), aluminum (Al), aluminum-lithium (Al—Li), calcium (Ca), magnesium-indium (Mg—In), and/or magnesium-silver (Mg—Ag), but the second electrode 190 is not limited thereto. Also, ITO and/or IZO may be used (utilized) as a material for forming the second electrode 190. The second electrode 190 may be a reflective electrode, a semitransparent electrode, or a transparent electrode.

The organic layer of the organic light-emitting device according to embodiments of the present invention may be formed by a deposition method of the compound according to embodiments of the present invention, or by a wet method in which the organic light-emitting device is coated with the compound according to embodiments of the present invention that is first prepared as a solution.

The organic light-emitting device according to embodiments of the present invention may be included in various types (kinds) of flat panel displays, for example, a passive matrix organic light-emitting display apparatus and/or an active matrix organic light-emitting display apparatus. When the organic light-emitting device is included in an active matrix organic light-emitting display apparatus, the first electrode located on the side of the substrate is a pixel electrode and may be electrically connected to a source electrode or a drain electrode of a thin film transistor. In one embodiment, the organic light-emitting device may be included in a flat panel display that may display images on both surfaces.

Although the organic light-emitting device has been described with reference to the drawing, the organic light-emitting device of embodiments of the present invention is not limited thereto.

Hereinafter, embodiments are illustrated with reference to certain examples. However, these examples are provided for illustrative purposes only, and should not in any sense be interpreted as limiting the scope of the present disclosure (the compounds used in the following examples can be obtained by one skilled in the art).

EXAMPLES

Preparation of Blue Light Emitting Device

ITO/HTM (120)/Host+ BD 5% (30)/Mixed Organic Layer (20)/Alq3 (20)/LiF (1)/Al (200)

Example 1-1

A transparent electrode of an Indium tin oxide (ITO) having a thickness of 120 nm was formed on a glass substrate to prepare a cathode. Then, ultrasonic cleaning and pretreatment (UV-$O_3$ treatment and heat-treatment) were performed on the resulting cathode.

Compound HTM (illustrated below) was deposited at a thickness of about 120 nm as an HTL on the pretreated cathode. Then, compound MADN (illustrated below) as a host, and compound BD as a dopant material, were co-deposited on the HTL in a total amount of 5% to form an EML having a thickness of about 30 nm. Compound BF1 (illustrated below) and compound BF9 (Illustrated below) were deposited on the EML at a ratio of 1:1 to form a mixed organic layer having a thickness of about 20 nm, and then Alq was deposited on the mixed organic layer as an ETL having a thickness of about 20 nm. Next, lithium fluoride was deposited on the ETL to form an EIL having a thickness of about 1 nm, and subsequently, aluminum was deposited at a thickness of about 200 nm on the EIL, thereby manufacturing an organic light-emitting device.

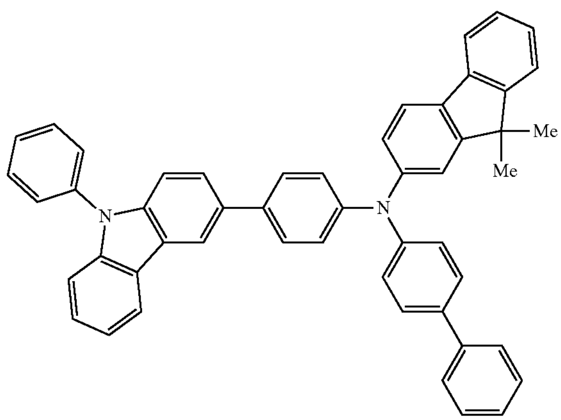

HTM

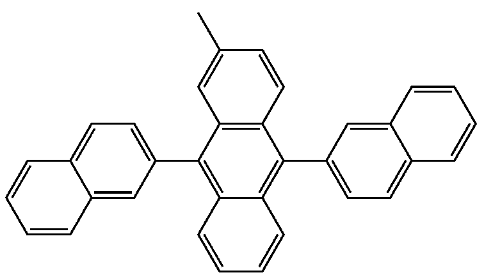

MADN

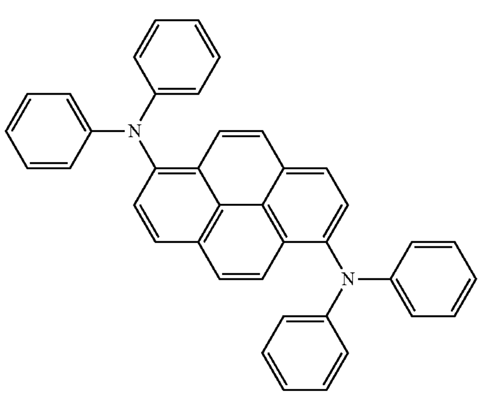

BD

-continued

BF1

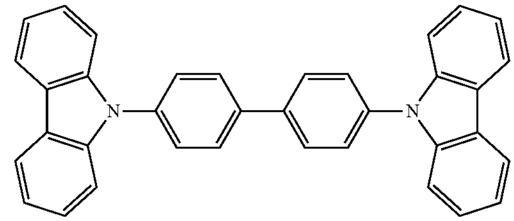

BF2

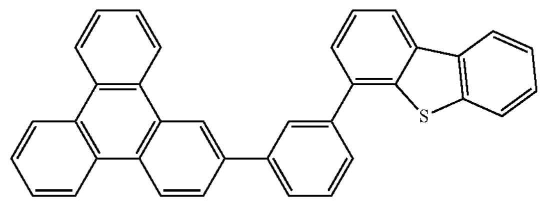

BF3

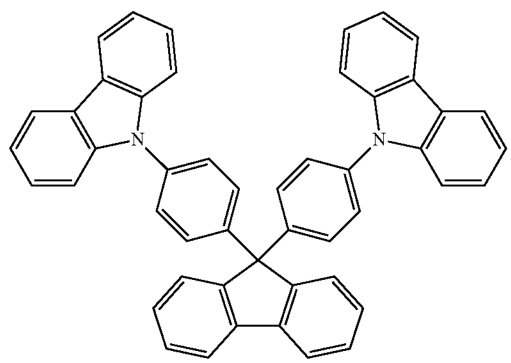

BF4

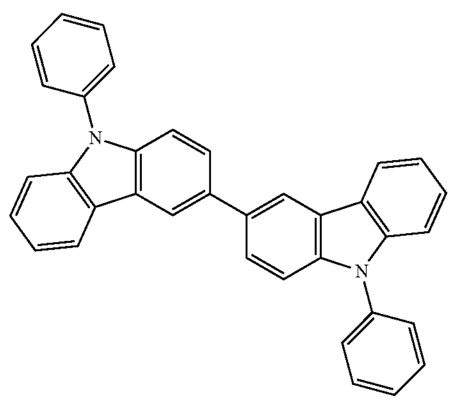

BF5

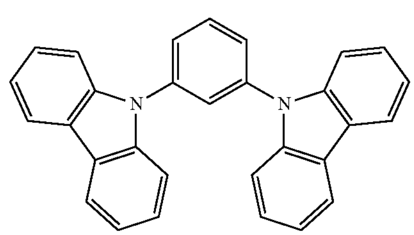

-continued

BF6

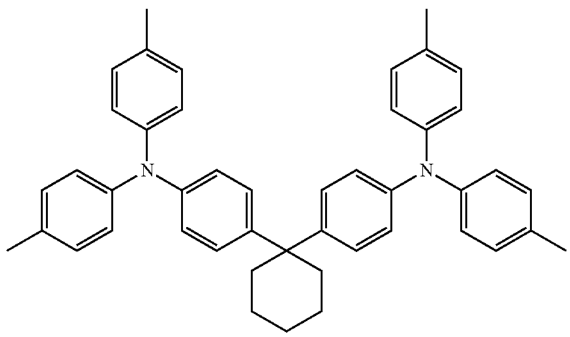

BF7

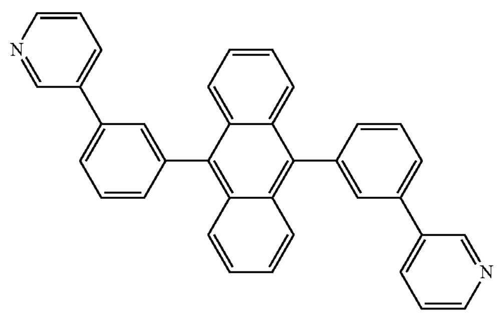

BF8

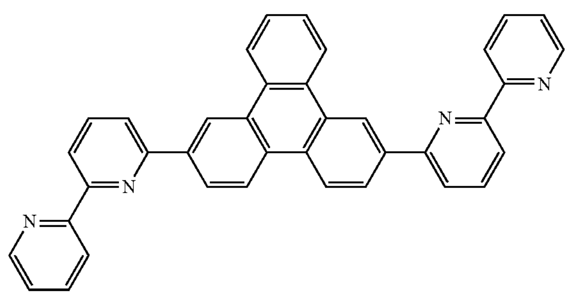

BF9

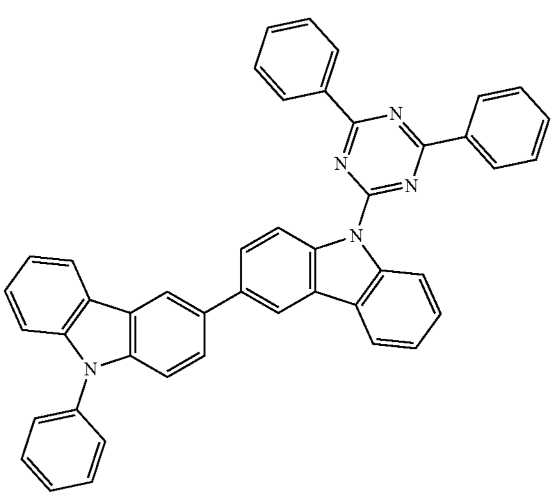

-continued

BF10

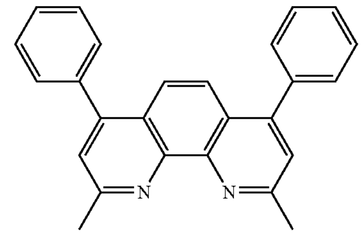

BF11

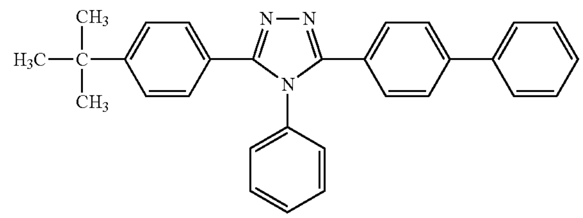

BF12

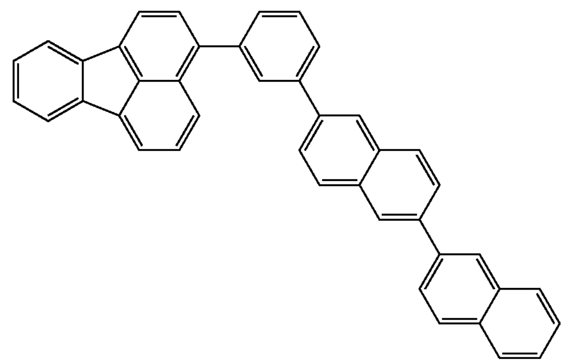

Material Properties of the mixed organic layer were measured using (utilizing) the following methods, and the results are shown in Table 1.

(1) Ionization Potential (IP)

An organic material was irradiated with light, and the amount of electrons generated by charge separation was measured.

(2) Energy Gap (Eg)

Energy gaps were measured from edges of the UV absorption spectra of the materials.

(3) Electron Affinity (EA)

Electron affinities were calculated using the following equation:

$$EA(eV)=IP-Eg,$$

where IP is the ionization potential calculated in (1) and Eg is the energy gap calculated in (2).

(4) Triplet Energy (ET)

A conversion equation for calculating triplet energy (ET) is as follows:

$$ET(eV)=1239.85/\lambda edge,$$

where λedg denotes a wavelength value at a point of intersection of a tangent and a horizontal axis, where the tangent is according to a slope of a short wavelength side of a phosphorescent spectrum.

TABLE 1

| Material | EA (eV) | IP (eV) | Eg (eV) | ET (eV) |
|---|---|---|---|---|
| BF1 | 3 | 6.1 | 3.1 | 2.67 |
| BF2 | 2.21 | 5.84 | 3.63 | 2.64 |
| BF3 | 2.1 | 5.5 | 3.4 | 2.9 |
| BF4 | 2.35 | 5.67 | 3.32 | 2.87 |
| BF5 | 2.4 | 5.9 | 3.5 | 3 |
| BF6 | 2 | 5.5 | 3.5 | 2.9 |
| BF7 | 2.8 | 5.9 | 3.1 | 1.8 |
| BF8 | 2.5 | 5.7 | 3.2 | 2.6 |
| BF9 | 2.77 | 5.49 | 2.72 | 2.67 |
| BF10 | 2.9 | 6.4 | 3.5 | 2.5 |
| BF11 | 2.7 | 6.3 | 3.6 | 2.7 |
| BF12 | 3 | 6.12 | 3.12 | 2.27 |

Examples 1-2 to 1-14 and Comparative Examples 1 to 3

ITO/HTM (120)/Host+ BD 5% (30)/Mixed Organic Layer (20)/Alq3 (20)/LiF (1)/Al (200)

Organic light-emitting devices for each of Examples 1-2 to 1-14 and Comparative Examples 1 to 3 were manufactured as in Example 1-1, except that the mixed organic layers were formed as shown in Table 2.

TABLE 2

| | EML | Buffer | Efficiency (cd/A) | Driving voltage (V) | T90 (hr) |
|---|---|---|---|---|---|
| Example 1-1 | MADN + BD | BF1 + BF9 | 5.5 | 4.5 | 98 |
| Example 1-2 | MADN + BD | BF2 + BF9 | 5.9 | 4.5 | 110 |
| Example 1-3 | MADN + BD | BF3 + BF9 | 5.7 | 4.6 | 85 |
| Example 1-4 | MADN + BD | BF4 + BF9 | 5.8 | 4.5 | 106 |
| Example 1-5 | MADN + BD | BF5 + BF9 | 5.5 | 4.6 | 94 |
| Example 1-6 | MADN + BD | BF6 + BF9 | 5.6 | 4.5 | 86 |
| Example 1-7 | MADN + BD | BF4 + BF7 | 5.6 | 4.3 | 81 |
| Example 1-8 | MADN + BD | BF5 + BF8 | 5.8 | 4.4 | 103 |
| Example 1-9 | MADN + BD | BF6 + BF8 | 5.5 | 4.4 | 98 |
| Example 1-10 | MADN + BD | BF4 + BF10 | 5.7 | 4.4 | 92 |
| Example 1-11 | MADN + BD | BF4 + BF11 | 5.4 | 4.3 | 78 |
| Example 1-12 | MADN + BD | BF4 + BF12 | 5.6 | 4.6 | 96 |
| Example 1-13 | MADN + BD | BF7 + BF9 | 5.4 | 4.2 | 82 |
| Example 1-14 | MADN + BD | BF8 + BF9 | 5.6 | 4.3 | 98 |
| Comparative Example 1 | MADN + BD | Alq3 | 4.5 | 4.8 | 35 |
| Comparative Example 2 | MADN + BD | BF7 | 4.8 | 4.7 | 48 |
| Comparative Example 3 | MADN + BD | BF4 | 4.8 | 5.0 | 29 |

Efficiencies (cd/A), driving voltages (V), and lifespans (hour) of the organic light-emitting devices prepared in Examples 1-2 to 1-14 and Comparative Examples 1 to 3 were each evaluated, and the results are shown in Table 2.

Preparation of Green Light Emitting Device

ITO/HTM (120)/Host+ Ir(ppy)3_10% (30)/Mixed Organic Layer (20)/Alq3 (20)/LiF (1)/Al (200)

Examples 2-1 to 2-6 and Comparative Examples 4 to 6

Organic light-emitting devices were manufactured as in Example 1-1, except that the EML, the host, the dopant, and the mixed organic layer were formed as shown in Table 3, and the dopant material $Ir(ppy)_3$ was deposited at a concentration of 10%, instead of 5%. When the host is formed of two different compounds, a weight ratio of the compounds is 1:1.

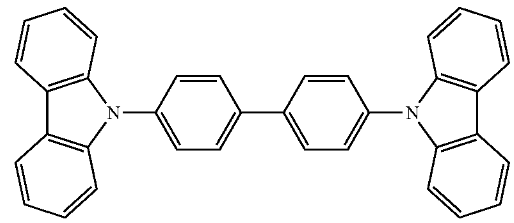

CBP

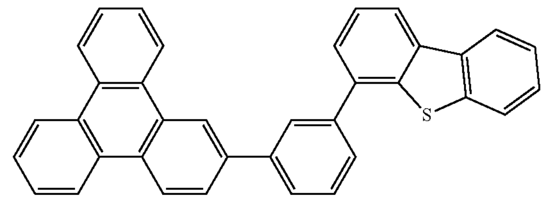

PH1

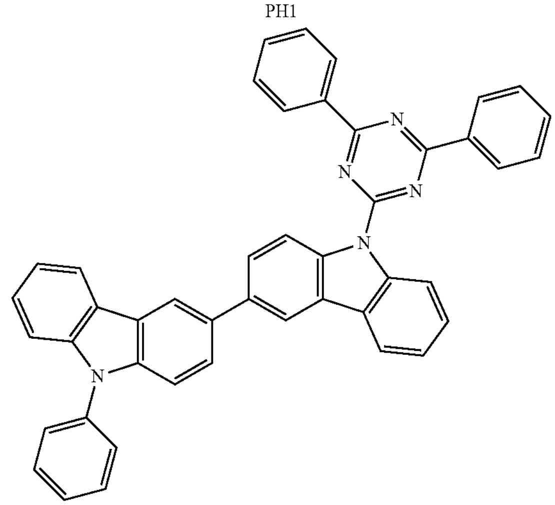

PH2

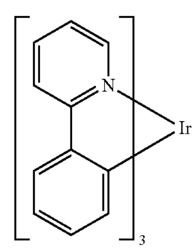

$Ir(ppy)_3$

TABLE 3

| | EML | Buffer | Efficiency (cd/A) | Driving voltage (V) | T90 (hr) |
|---|---|---|---|---|---|
| Example 2-1 | CBP + Ir(ppy)3 | BF4 + BF7 | 55 | 4.8 | 165 |
| Example 2-2 | CBP + Ir(ppy)3 | BF5 + BF8 | 57 | 5.0 | 138 |
| Example 2-3 | CBP + Ir(ppy)3 | BF6 + BF8 | 55 | 4.8 | 151 |
| Example 3-1 | PH1 + Ir(ppy)3 | BF4 + BF7 | 57 | 5.2 | 181 |
| Example 3-2 | PH1 + Ir(ppy)3 | BF5 + BF8 | 58 | 5.1 | 144 |
| Example 3-3 | PH1 + Ir(ppy)3 | BF6 + BF8 | 55 | 5.1 | 160 |
| Example 4-1 | PH2 + Ir(ppy)3 | BF4 + BF7 | 61 | 4.5 | 120 |
| Example 4-2 | PH2 + Ir(ppy)3 | BF5 + BF8 | 63 | 4.8 | 137 |
| Example 4-3 | PH2 + Ir(ppy)3 | BF6 + BF8 | 60 | 4.7 | 118 |
| Example 5-1 | CBP + PH1 + Ir(ppy)3 | BF4 + BF7 | 68 | 4.5 | 177 |
| Example 5-2 | CBP + PH1 + Ir(ppy)3 | BF5 + BF8 | 66 | 4.5 | 201 |
| Example 5-3 | CBP + PH1 + Ir(ppy)3 | BF6 + BF8 | 65 | 4.6 | 165 |

TABLE 3-continued

| | EML | Buffer | Efficiency (cd/A) | Driving voltage (V) | T90 (hr) |
|---|---|---|---|---|---|
| Example 6 | BF5 + BF8 + Ir(ppy)3 | BF5 + BF8 | 63 | 4.3 | 173 |
| Comparative Example 4 | CBP + Ir(ppy)3 | Alq3 | 44 | 5.7 | 49 |
| Comparative Example 5 | CBP + Ir(ppy)3 | BF7 | 48 | 5.3 | 66 |
| Comparative Example 6 | CBP + Ir(ppy)3 | BF4 | 52 | 6.1 | 87 |

Efficiencies (cd/A), driving voltages (V), and lifespans (hour) of the organic light-emitting devices prepared in Examples 2-1 to 2-6 and Comparative Examples 4 to 6 were each evaluated, and the results are shown in Table 3.

Preparation of Red Light Emitting Device

ITO/HTM (120)/Host+ Ir(pq)2acac_5% (30)/Mixed Organic Layer (20)/Alq3 (20)/LiF (1)/Al (200)

Examples 7-1 to 9-3 and Comparative Examples 7 to 9

Organic light-emitting devices were manufactured as in Example 1-1, except that the EML, the host, the dopant, and the mixed organic layer were formed as shown in Table 4, and the dopant material Ir(pq)2acac was deposited at a concentration of 5%.

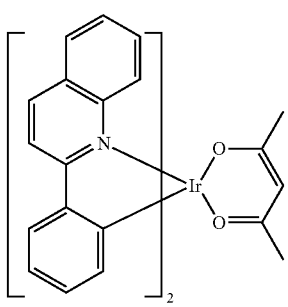

Ir(pq)$_2$acac

TABLE 4

| | EML | Buffer | Efficiency (cd/A) | Driving voltage (V) | T90 (hr) |
|---|---|---|---|---|---|
| Example 7-1 | CBP + Ir(pq)2acac | BF4 + BF7 | 23.1 | 5.3 | 151 |
| Example 7-2 | CBP + Ir(pq)2acac | BF5 + BF8 | 22.5 | 5.4 | 163 |
| Example 7-3 | CBP + Ir(pq)2acac | BF6 + BF8 | 24.3 | 5.3 | 170 |
| Example 8-1 | PH1 + Ir(pq)2acac | BF4 + BF7 | 23.3 | 5.4 | 225 |
| Example 8-2 | PH1 + Ir(pq)2acac | BF5 + BF8 | 21.8 | 5.5 | 166 |
| Example 8-3 | PH1 + Ir(pq)2acac | BF6 + BF8 | 24.0 | 5.5 | 191 |
| Example 9-1 | PH2 + Ir(pq)2acac | BF4 + BF7 | 25.1 | 5.1 | 243 |
| Example 9-2 | PH2 + Ir(pq)2acac | BF5 + BF8 | 24.8 | 5.0 | 288 |
| Example 9-3 | PH2 + Ir(pq)2acac | BF6 + BF8 | 23.5 | 4.9 | 260 |
| Comparative Example 7 | CBP + Ir(pq)2acac | Alq3 | 15.3 | 5.9 | 118 |
| Comparative Example 8 | CBP + Ir(pq)2acac | BF7 | 19.8 | 5.3 | 95 |
| Comparative Example 9 | CBP + Ir(pq)2acac | BF4 | 18.0 | 6.5 | 76 |

Efficiencies (cd/A), driving voltages (V), and lifespans (hour) of the organic light-emitting devices prepared in Examples 7-1 to 9-3 and Comparative Examples 7 to 9 were each evaluated, and the results are shown in Table 4.

Referring to the results shown in Tables 2 to 4, the organic light-emitting devices prepared in Examples 1-1 to 9-3 showed improved efficiency and lifespan characteristics compared to those of the organic light-emitting devices prepared in Comparative Examples 1 to 9.

As described above, the organic light-emitting device according to one or more embodiments of the present invention may have a low driving voltage, a high efficiency, and a long lifespan.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the FIGURES, it will be understood by those of ordinary skill in the art that various changes in form and details may be made therein without departing from the spirit and scope of the present disclosure as defined by the following claims and equivalents thereof.

What is claimed is:

1. An organic light-emitting device comprising an anode;

a cathode; and an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL) and at least one selected from a hole blocking layer (HBL) and an electron injection layer (EIL), wherein a mixed organic layer is between the EML and the electron transport layer (ETL) and comprises at least two different compounds, a triplet energy of at least one compound of the at least two different compounds being 2.2 eV or greater, wherein the mixed organic layer is in contact with the EML and the ETL, and wherein the at least one compound is an electron-transporting material or a hole-transporting material.

2. The organic light-emitting device of claim 1, wherein the triplet energy of the at least one compound is greater in level than a triplet energy of a dopant in the EML.

3. The organic light-emitting device of claim 1, wherein the at least two different compounds comprise a hole-transporting compound and an electron-transporting compound, and a weight ratio in the mixed organic layer of the hole-transporting compound to the electron-transporting compound is about 0.1:1 to about 10:1.

4. The organic light-emitting device of claim 1, wherein the at least two different compounds comprise a hole-transporting compound and an electron-transporting compound, and an electron affinity of the hole-transporting compound is less than an electron affinity of the electron-transporting compound.

5. The organic light-emitting device of claim 1, wherein the at least two different compounds comprise at least two different electron-transporting compounds.

6. The organic light-emitting device of claim 1, wherein the at least one compound having a triplet energy of about 2.2 eV or higher comprises one of the backbones below:

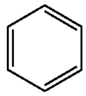
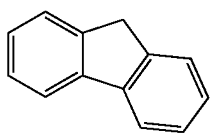
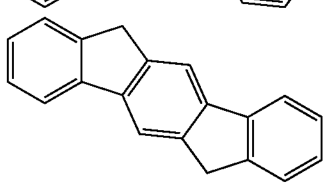
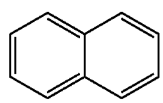
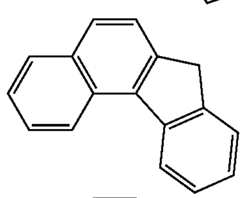
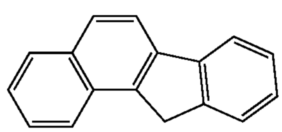
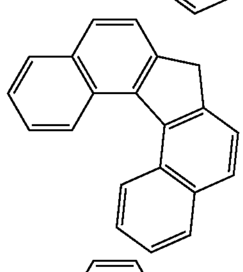
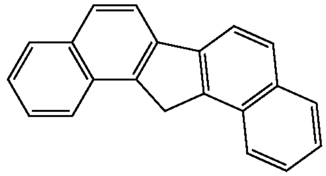
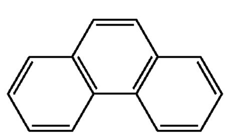
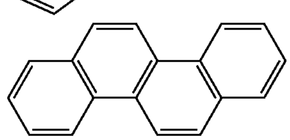

-continued

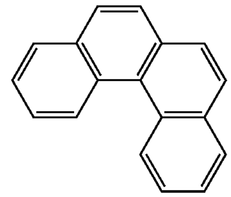
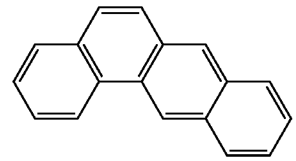
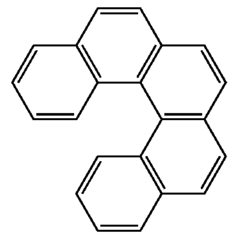
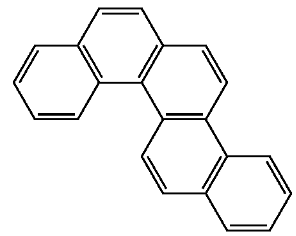
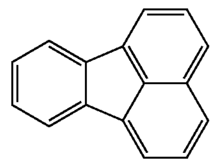
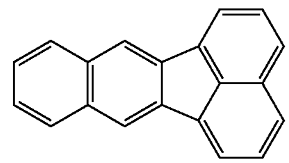
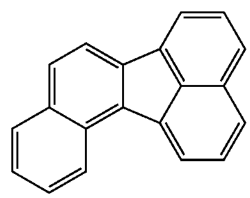
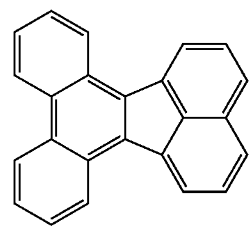
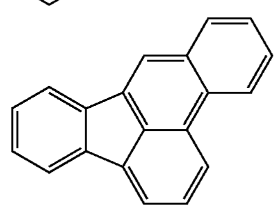
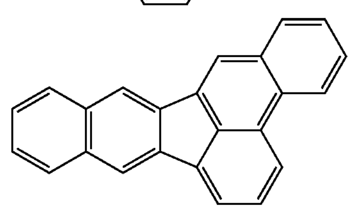
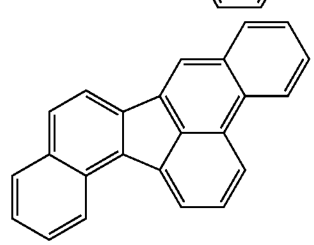
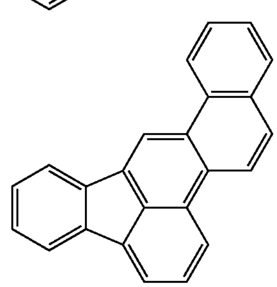
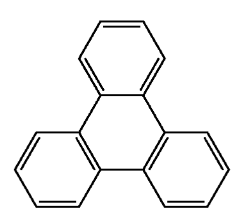

-continued
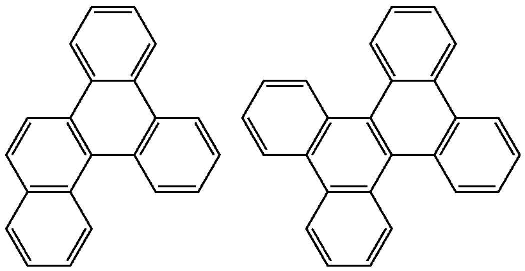
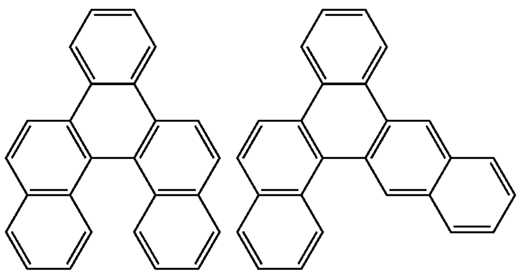
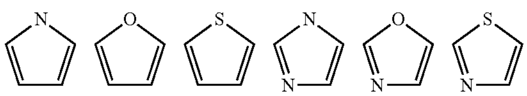
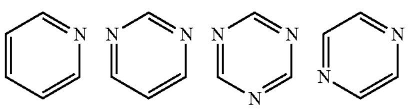
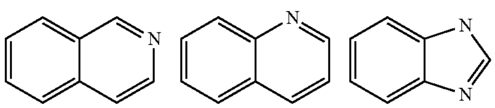
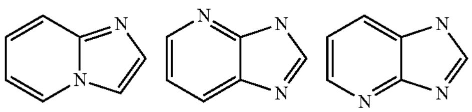
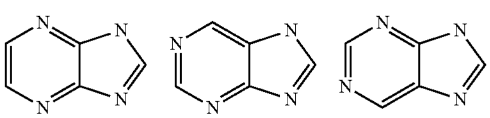
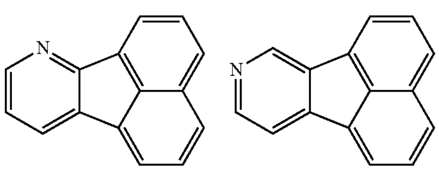
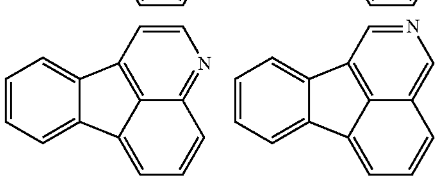
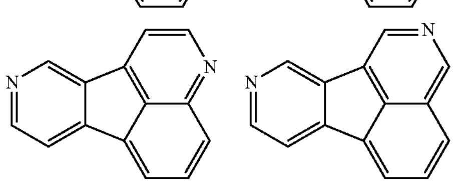
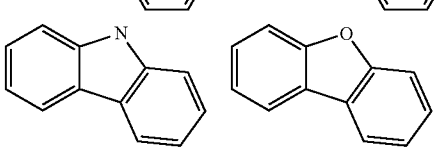
-continued
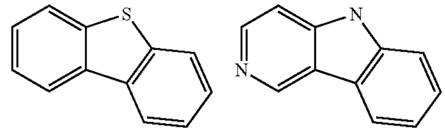
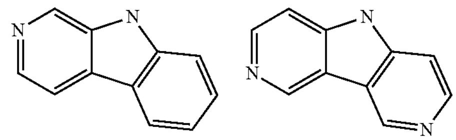
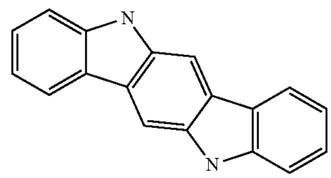
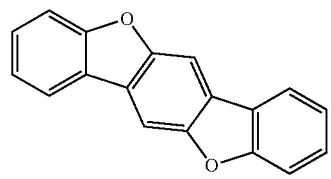
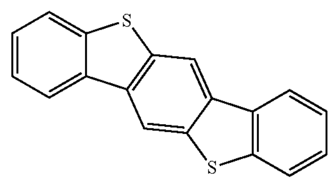
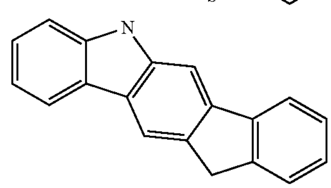
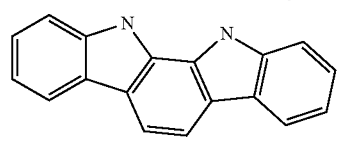
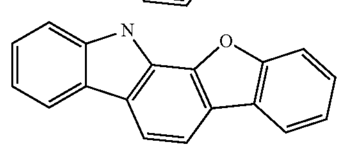
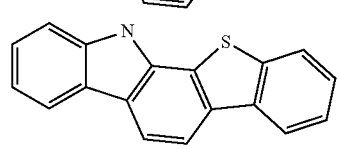
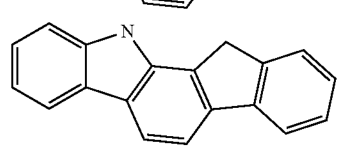
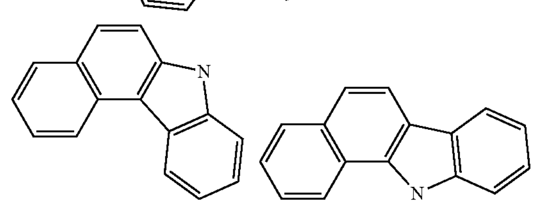

-continued
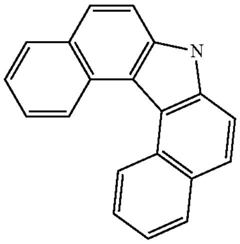
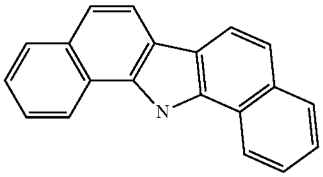
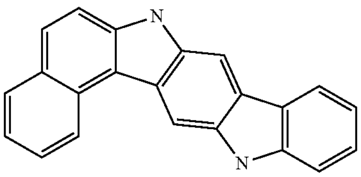
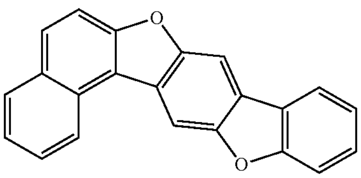
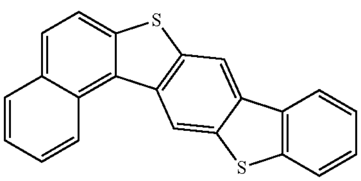
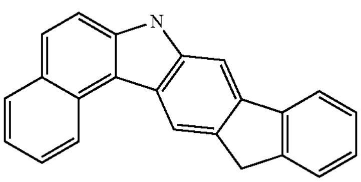
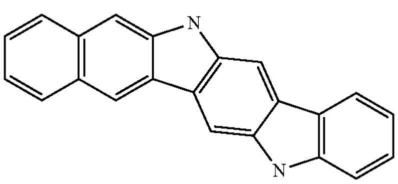
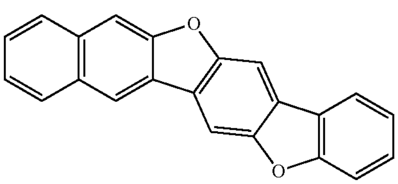
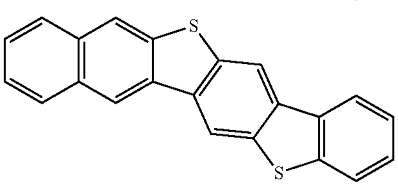
-continued
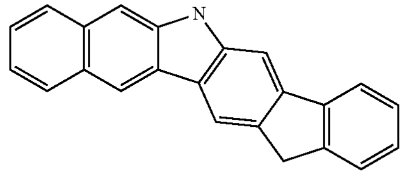
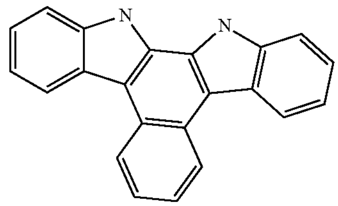
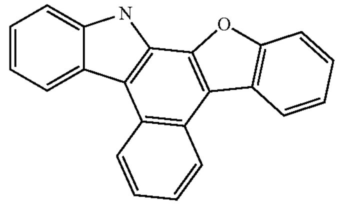
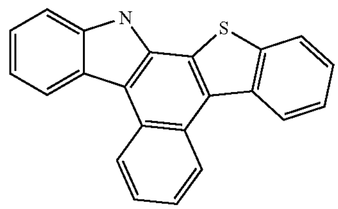
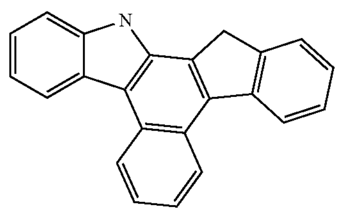
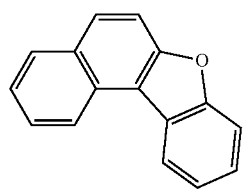
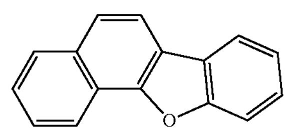
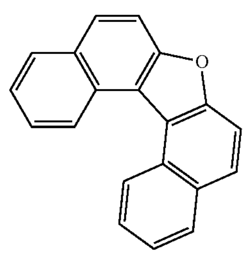
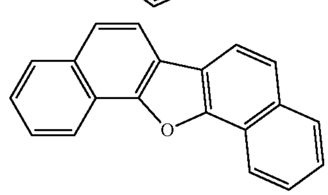

-continued
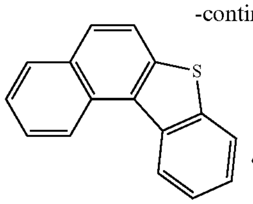
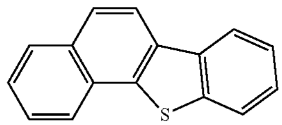
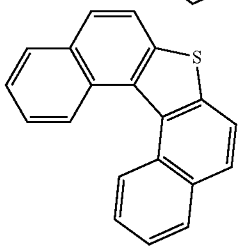
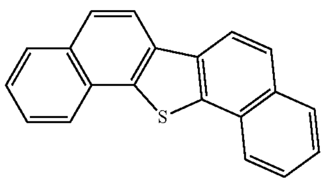
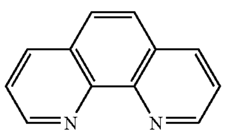
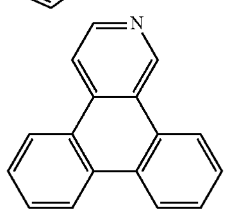
-continued
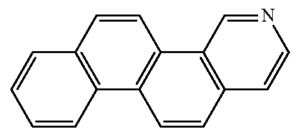
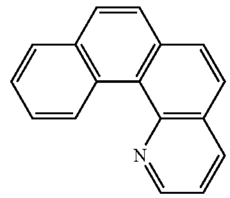
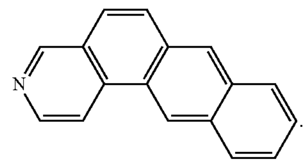
7. The organic light-emitting device of claim 1, wherein the EML is a phosphorescent EML and comprises an Ir-complex, a Pt-complex, a Cu-compex, or an Os-complex as a dopant.
8. The organic light-emitting device of claim 1, wherein the mixed organic layer comprises at least two compounds selected from compounds below:
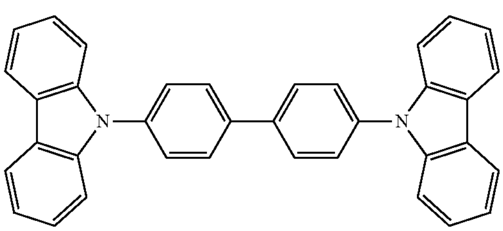
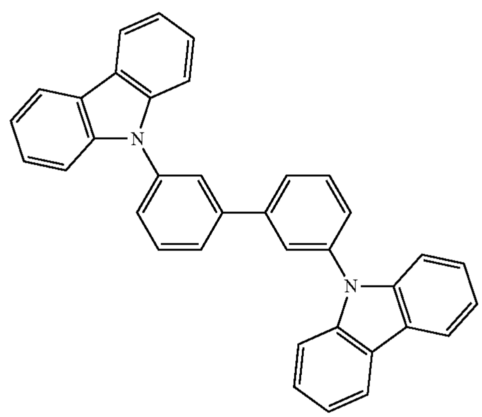
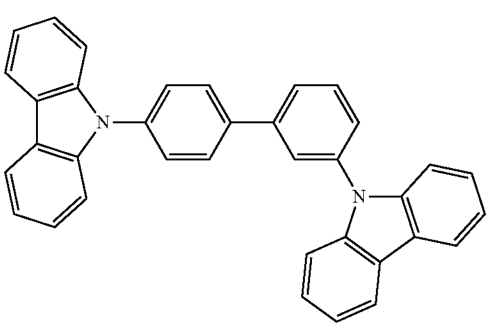
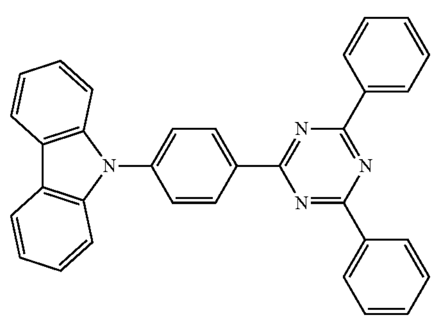

-continued
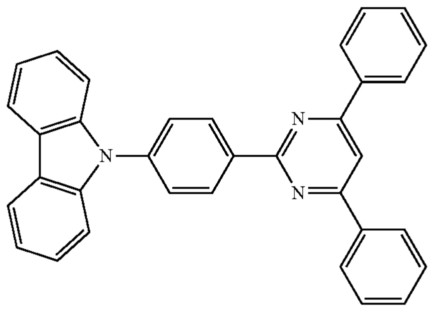
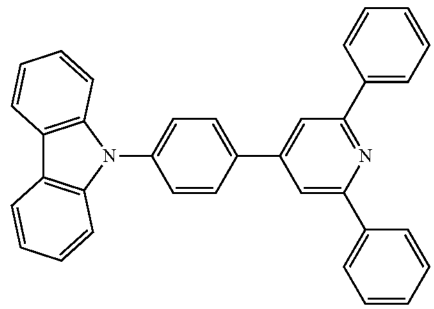
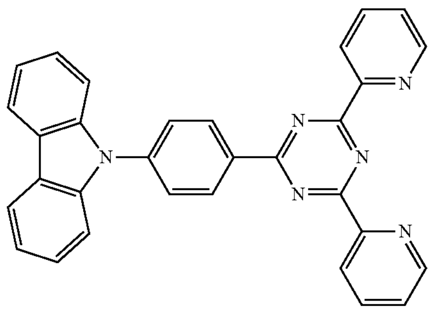
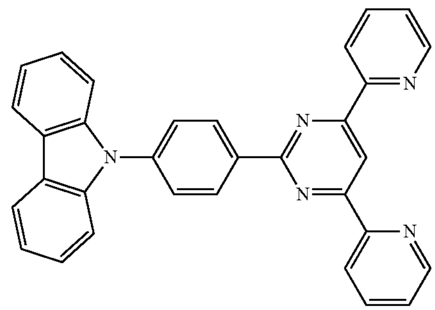
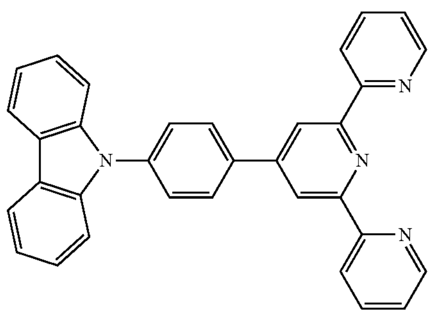
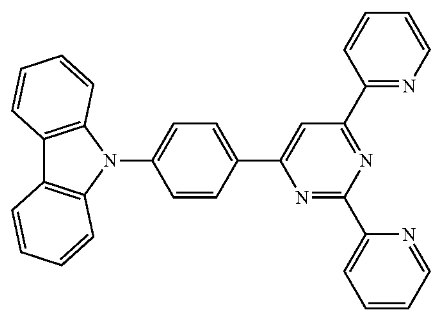
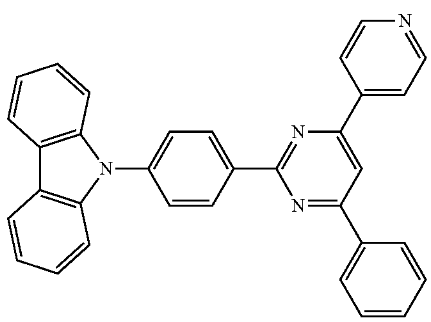
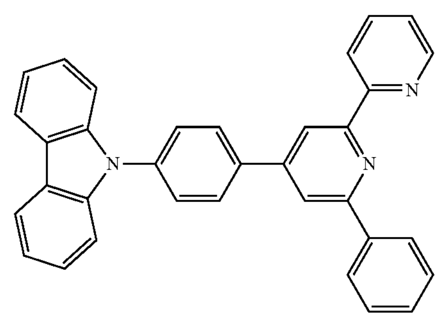
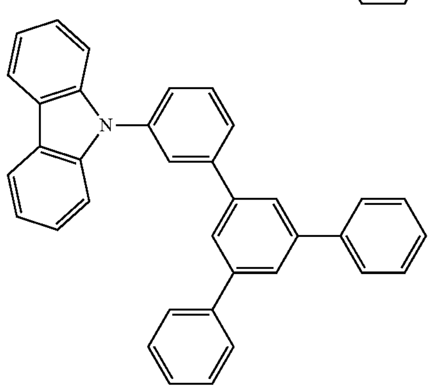
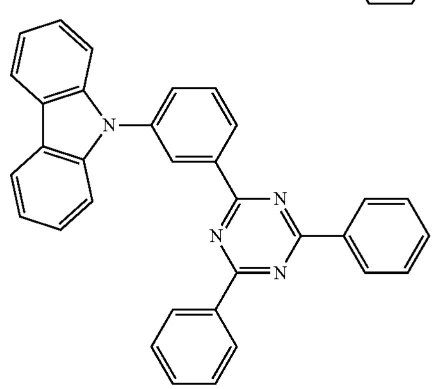

-continued
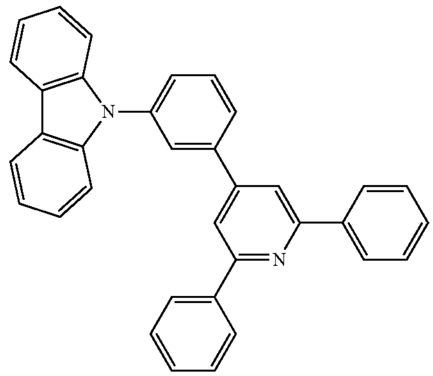
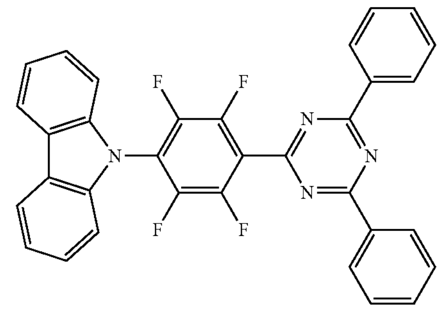
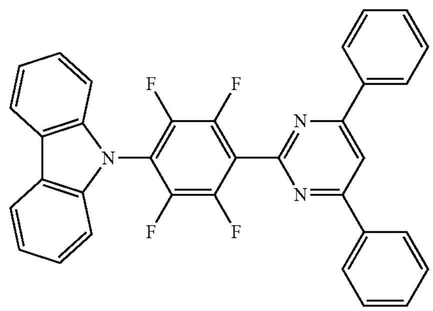
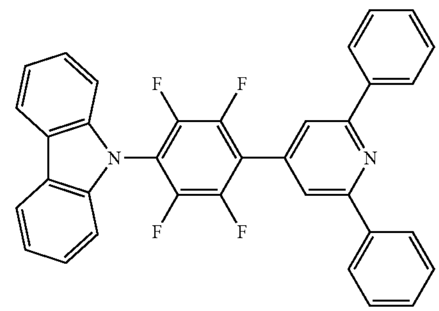
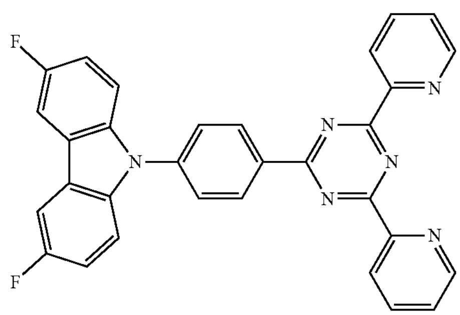
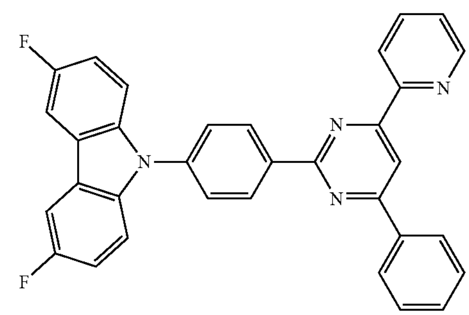
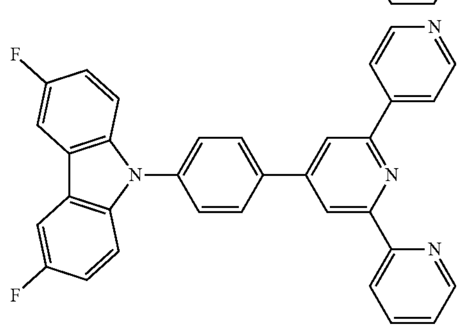
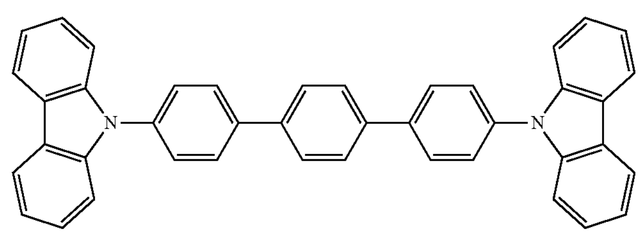
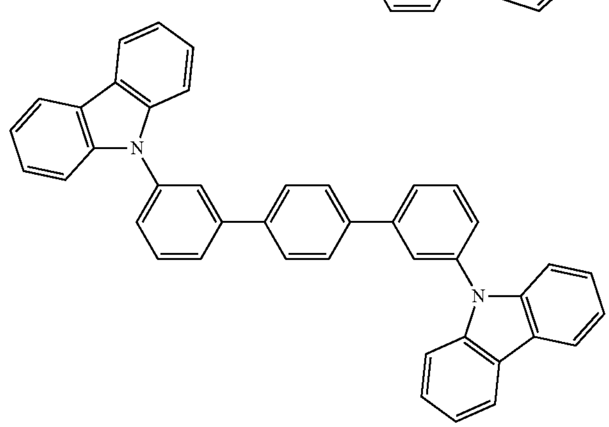

-continued
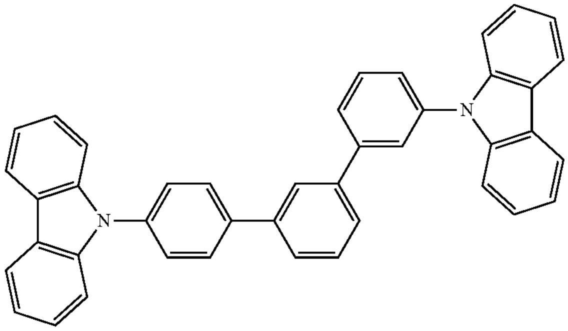
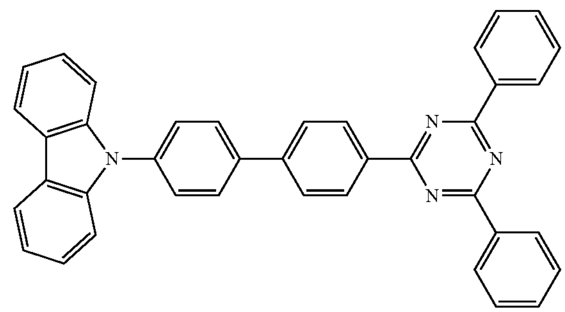
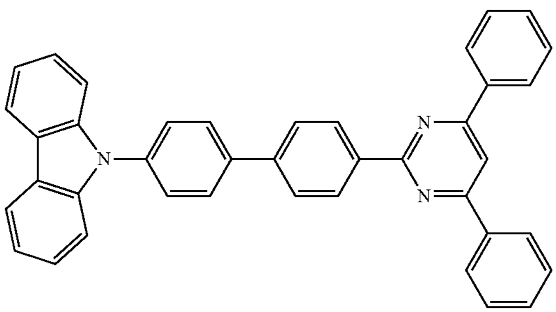
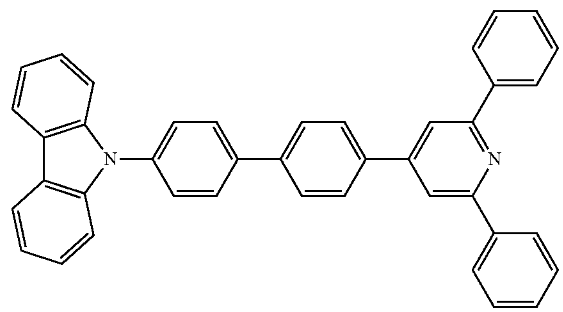
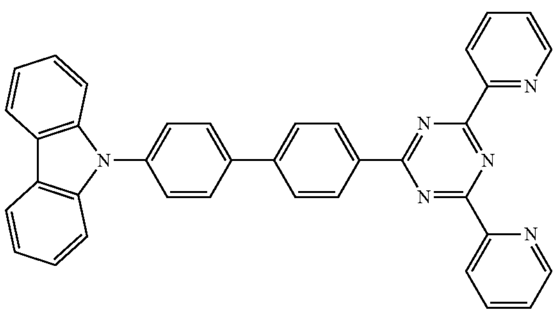
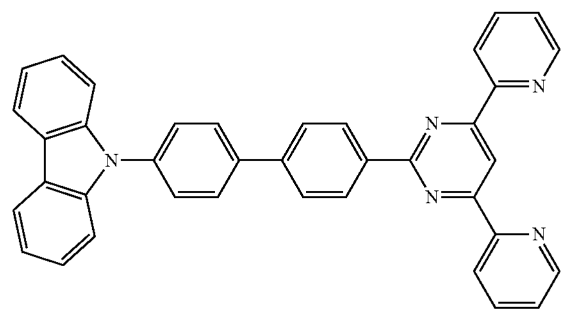
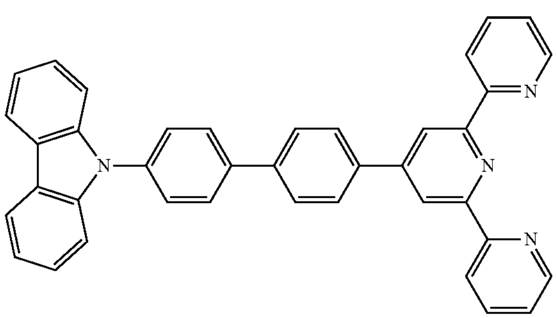
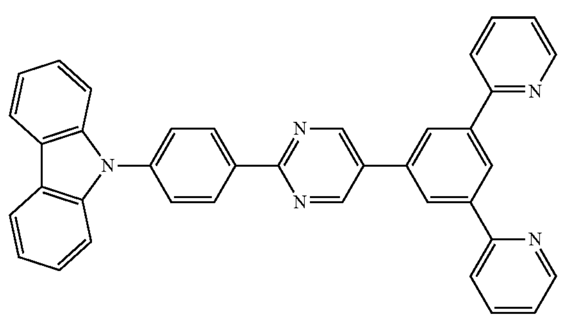
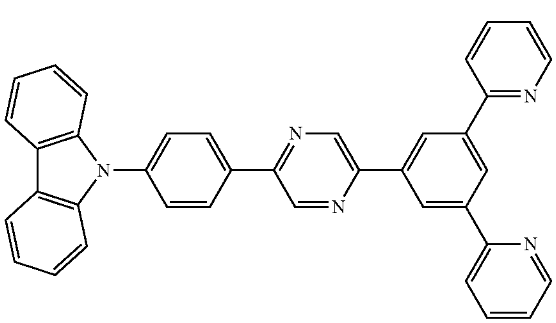
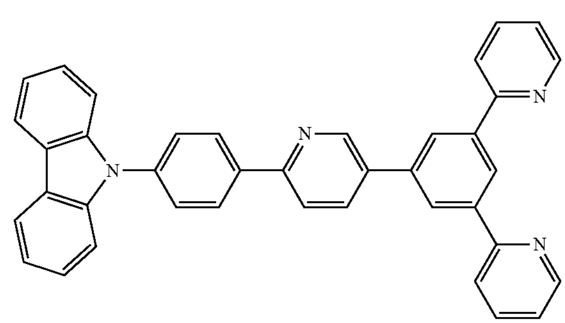

-continued
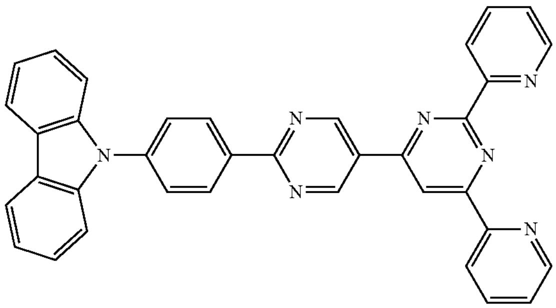
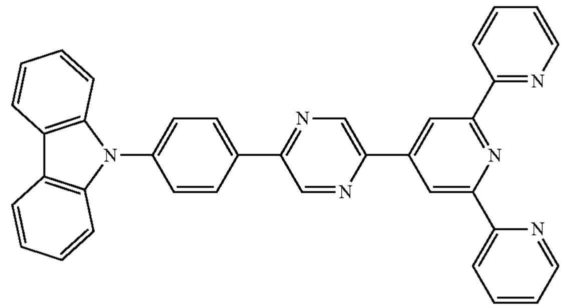
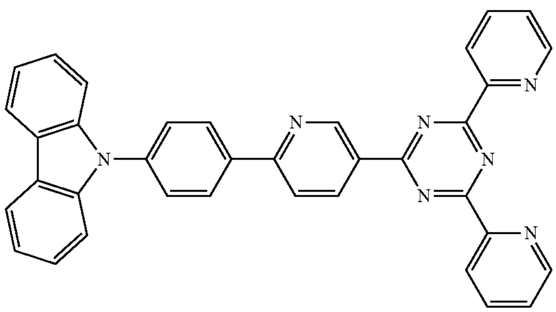
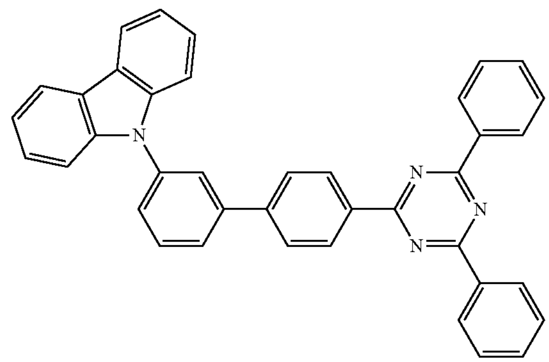
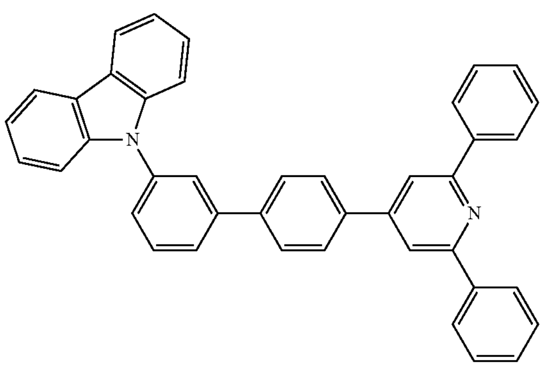
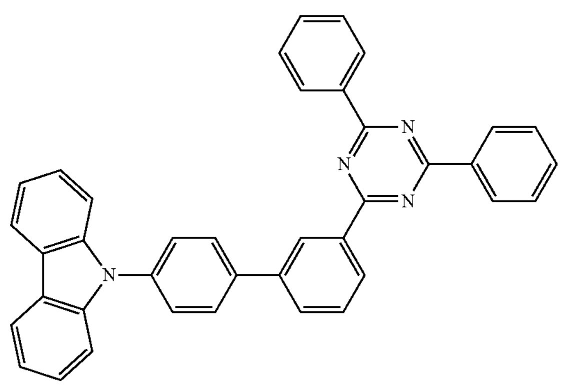
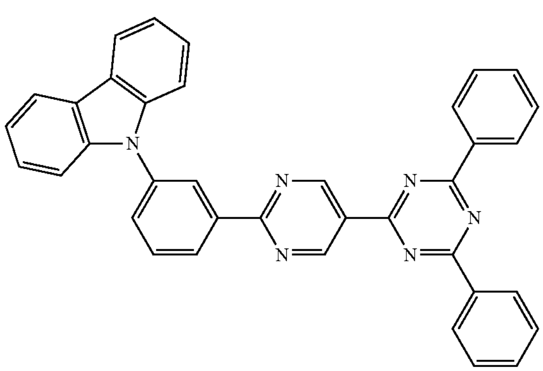
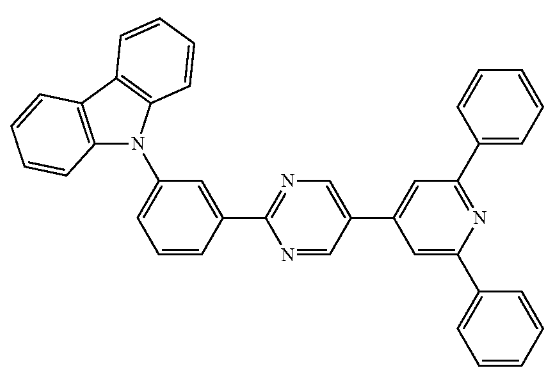

-continued
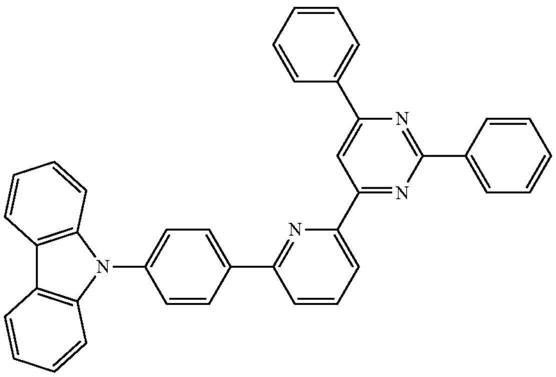
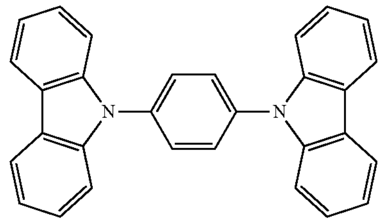
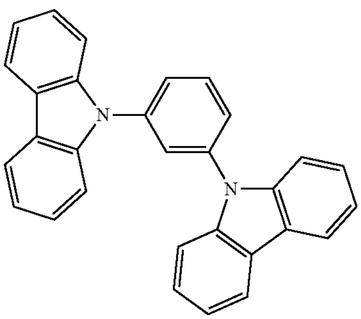
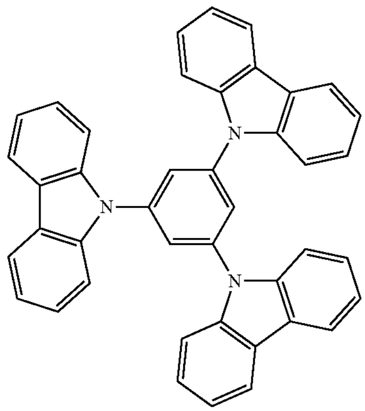
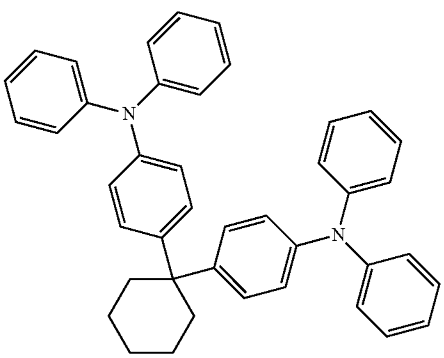
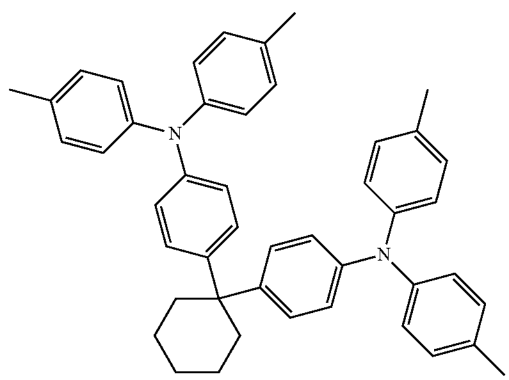
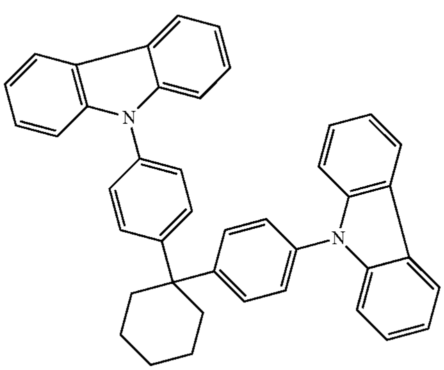
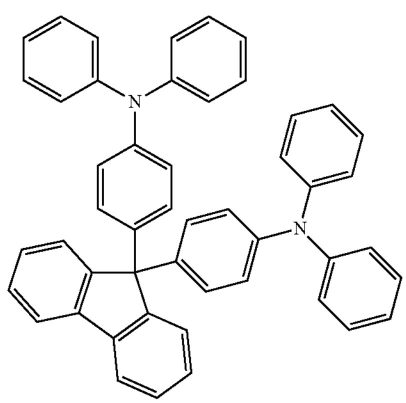

-continued
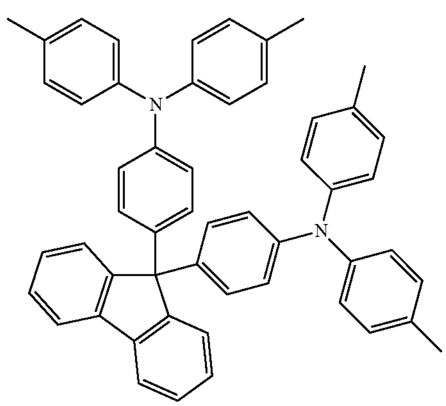
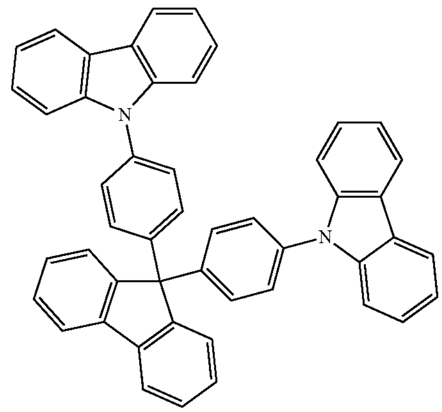
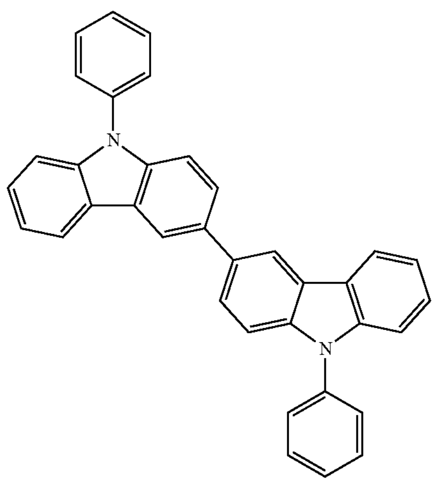
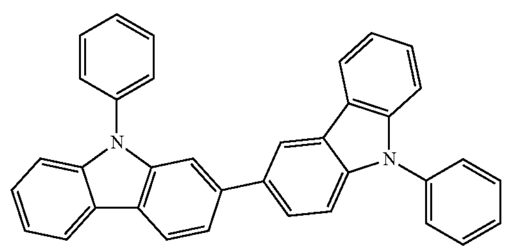
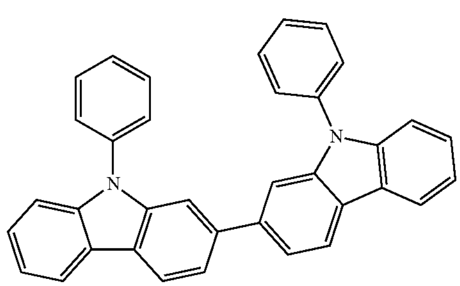
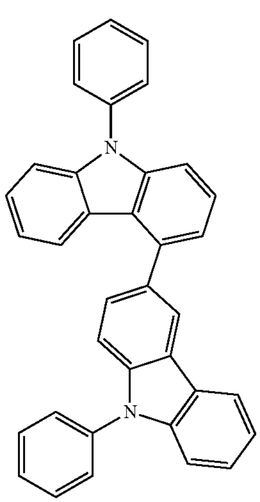
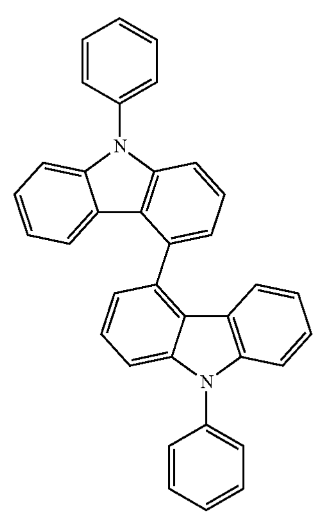

-continued
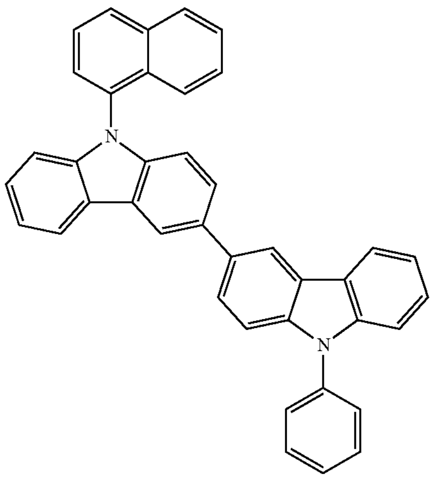
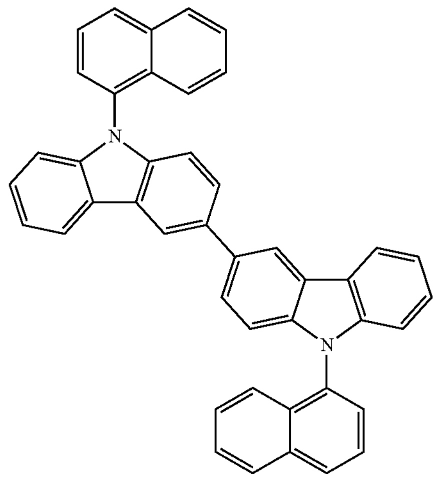
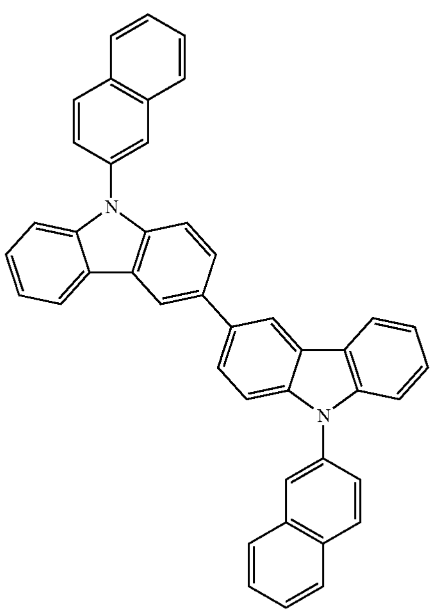
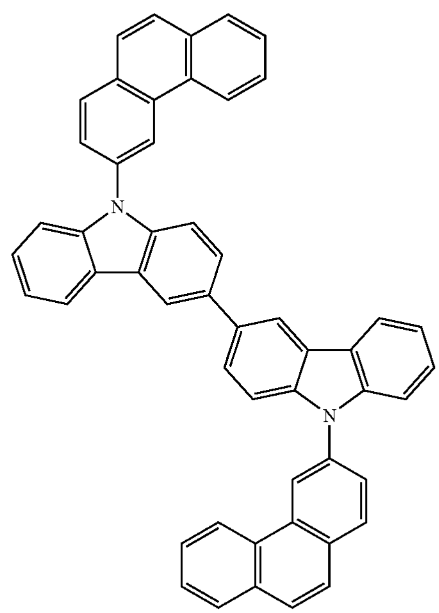

-continued
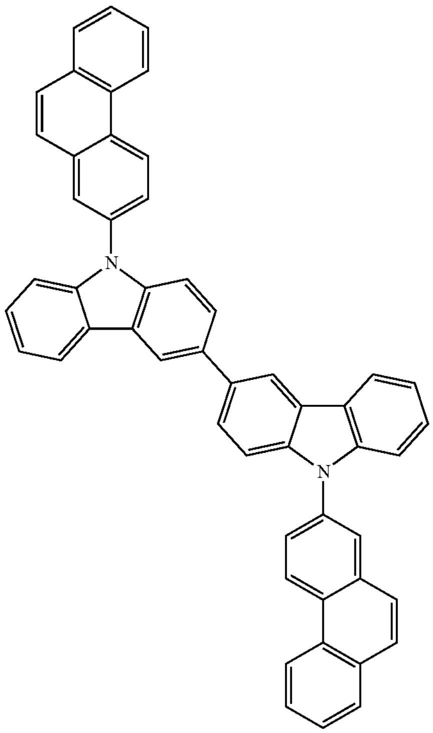
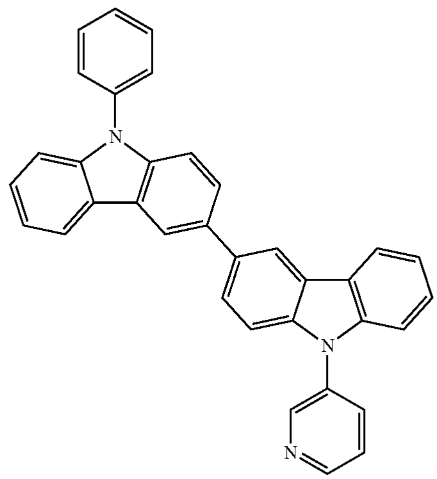
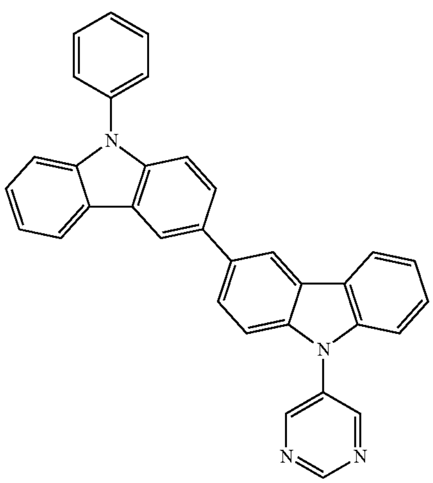
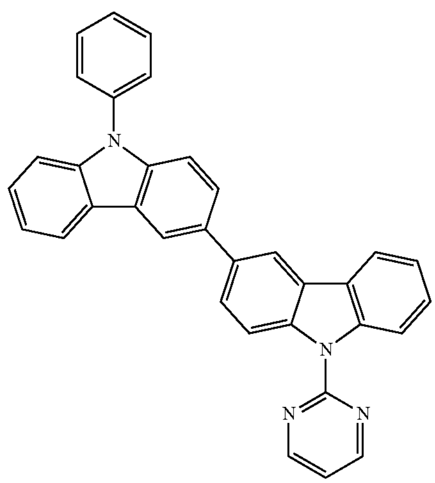
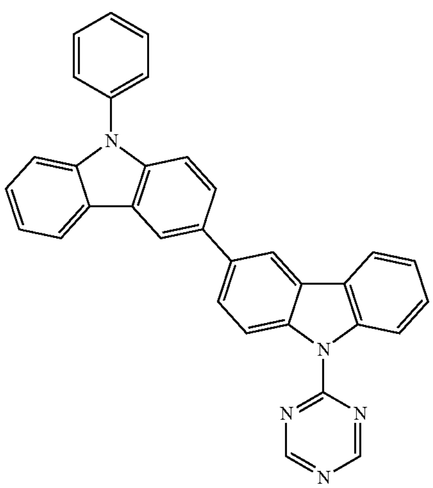
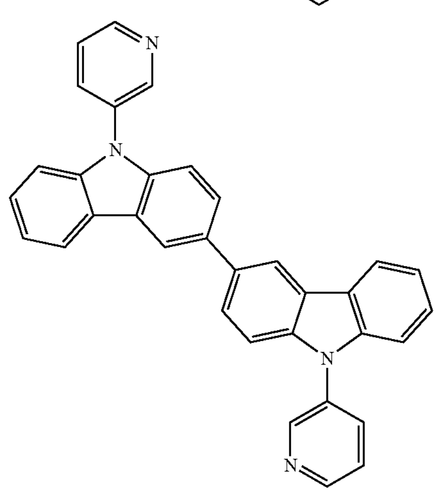

-continued
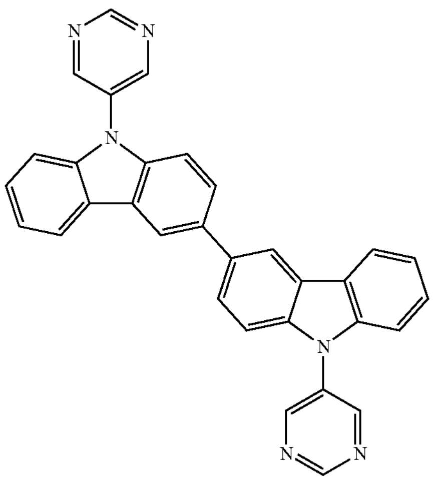
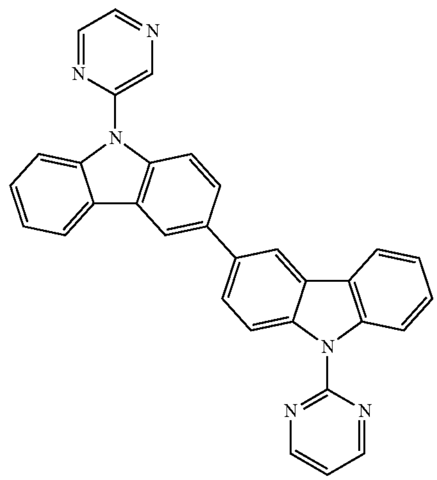
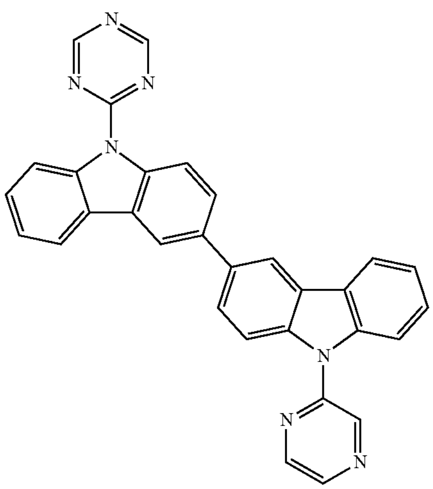
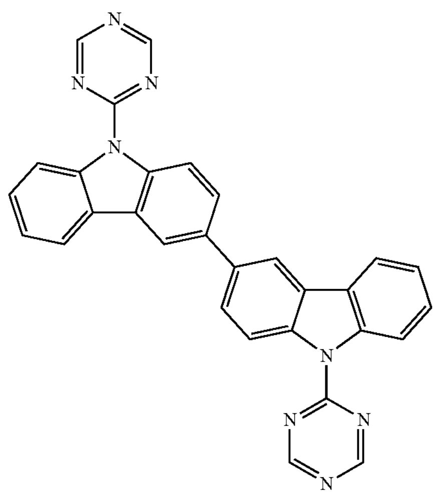
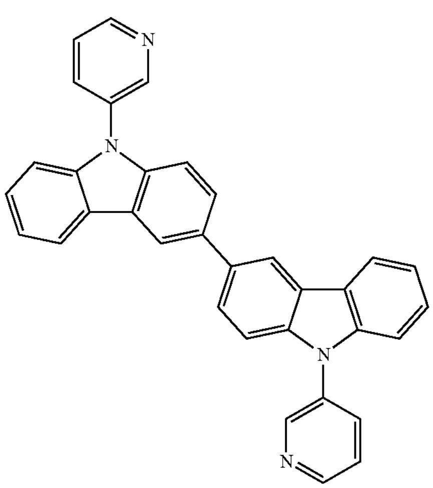
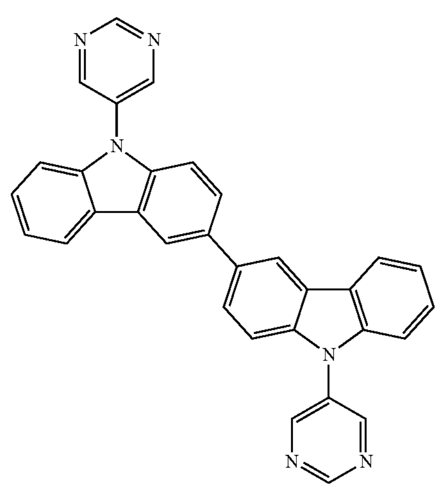

-continued
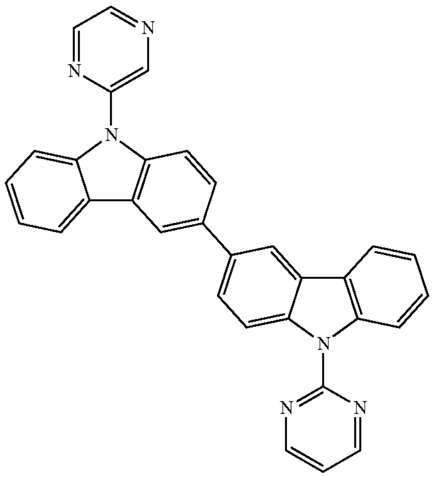
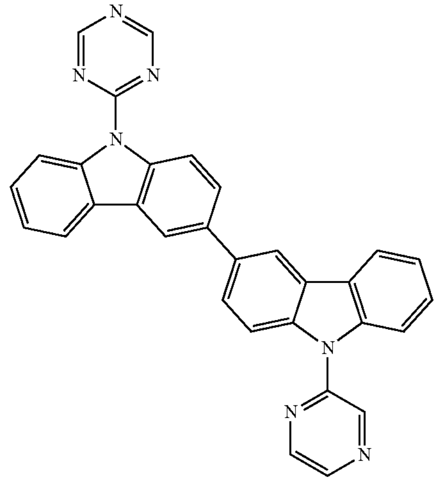
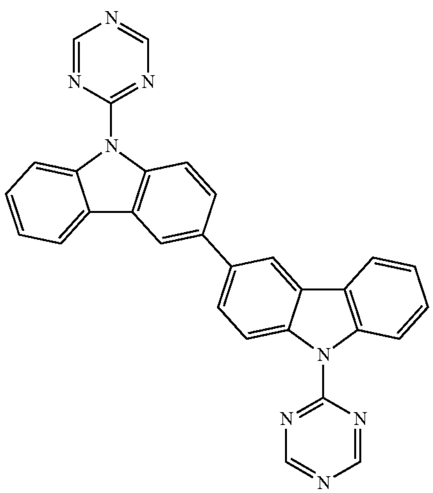
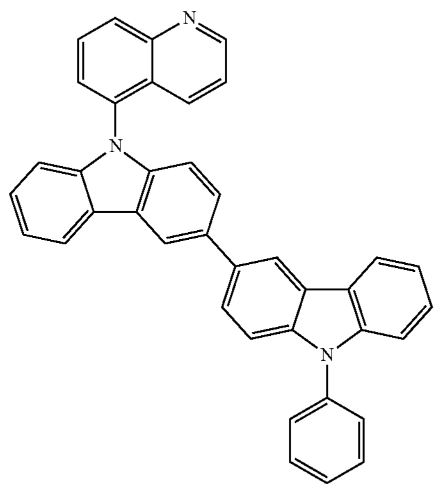
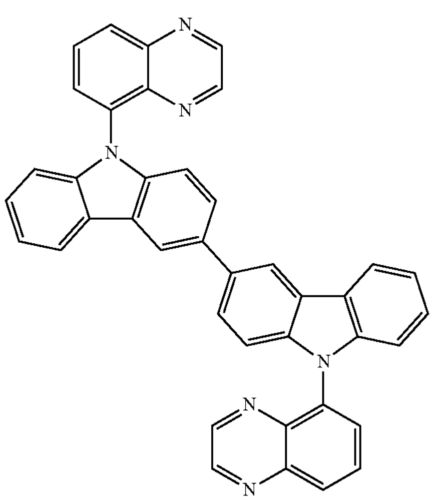
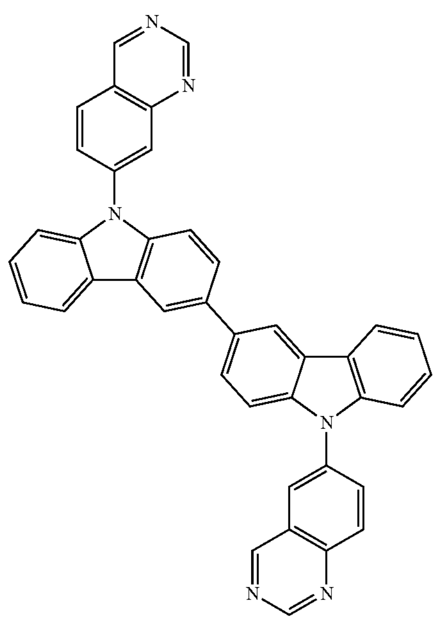

-continued
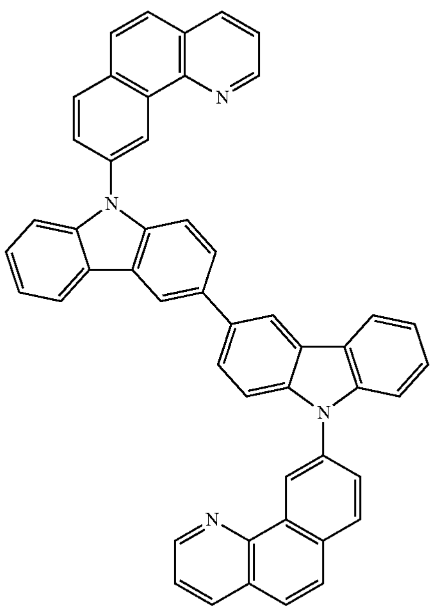
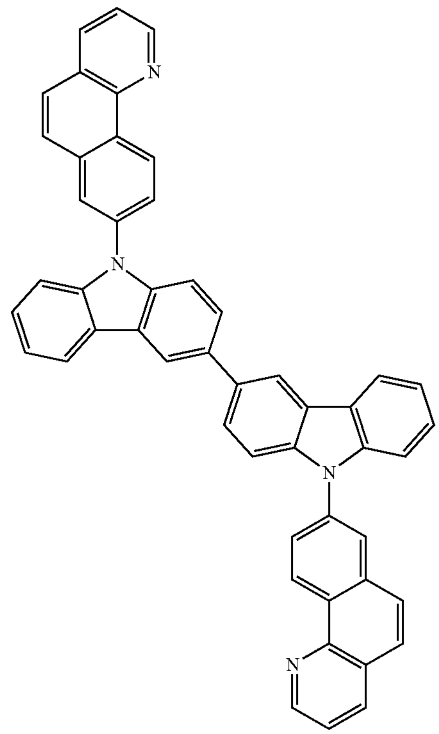
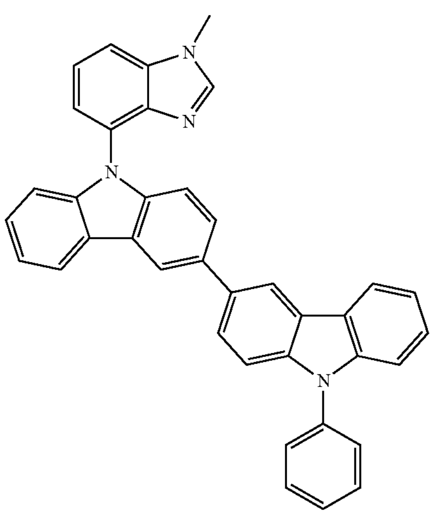
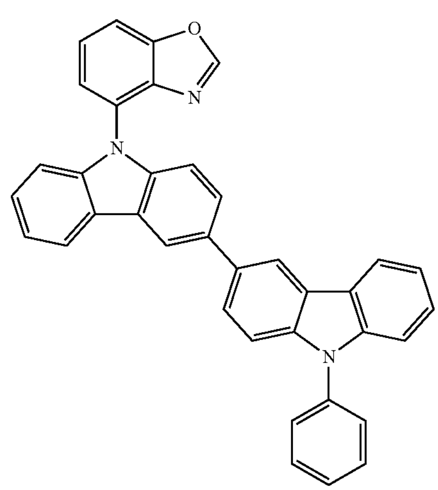

-continued
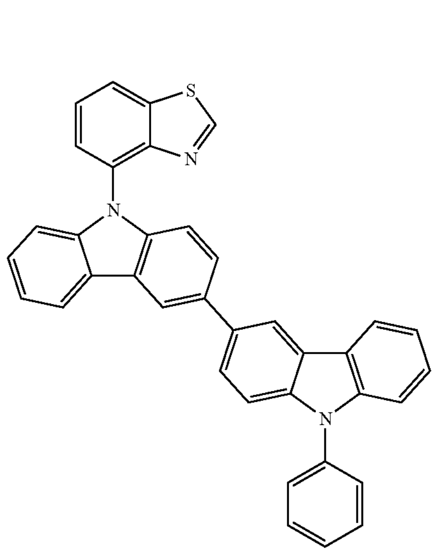
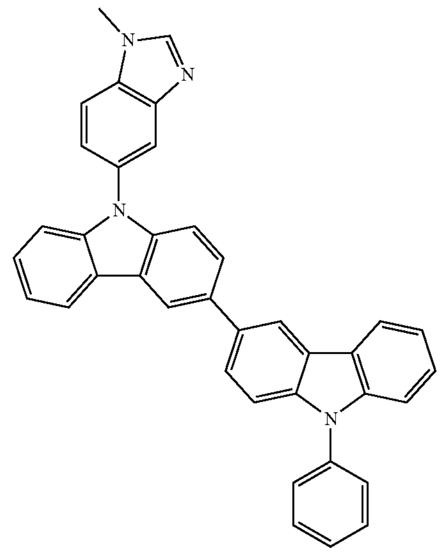
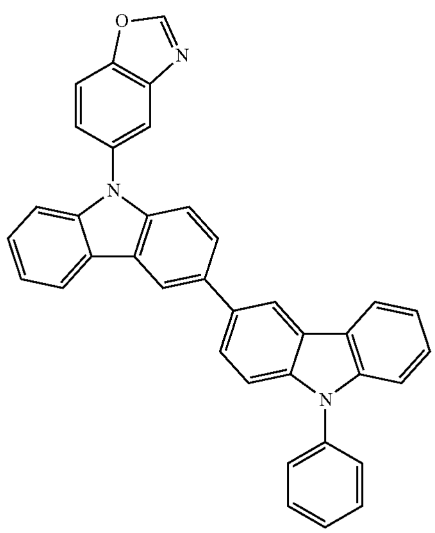
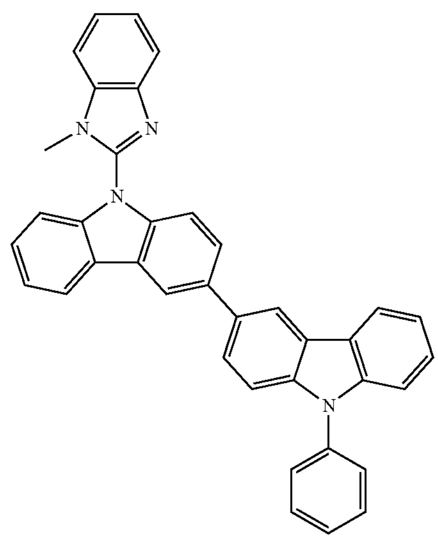
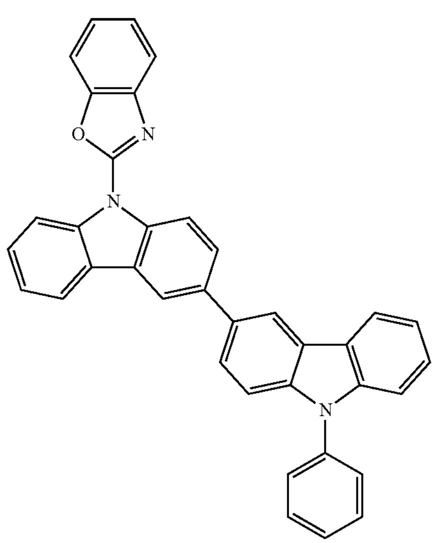
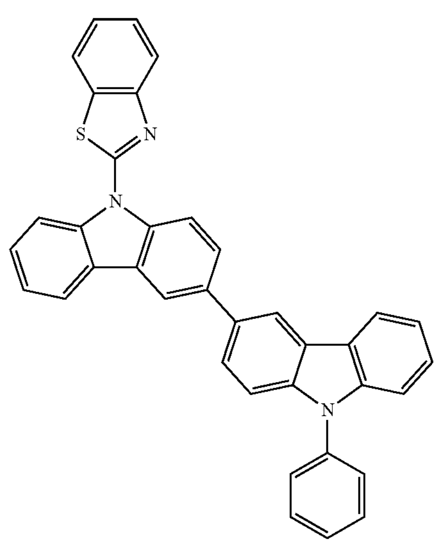

-continued
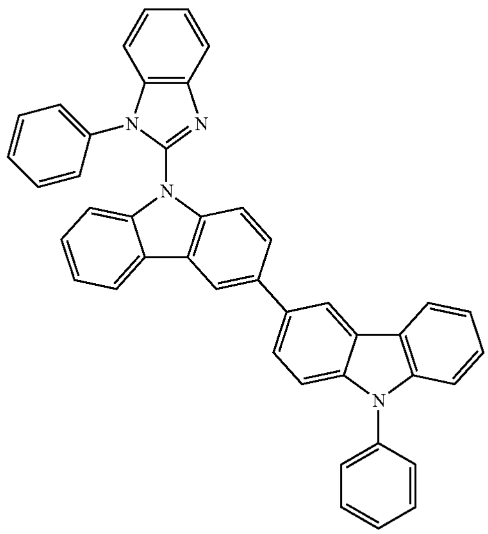
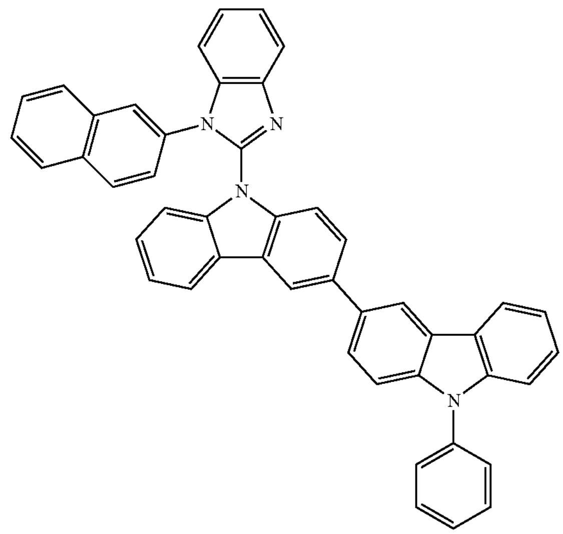
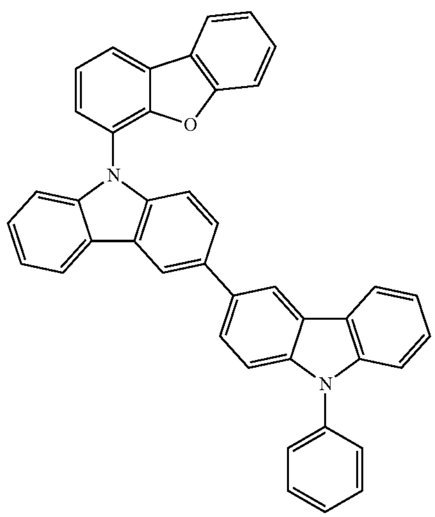
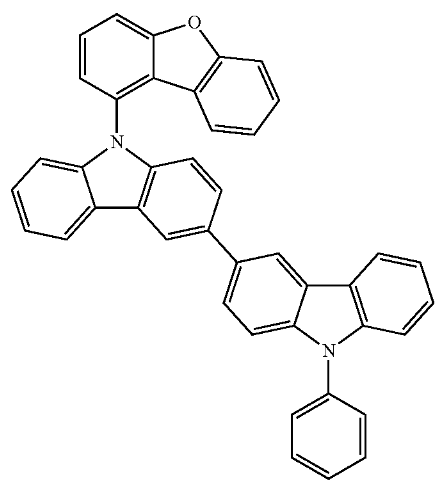
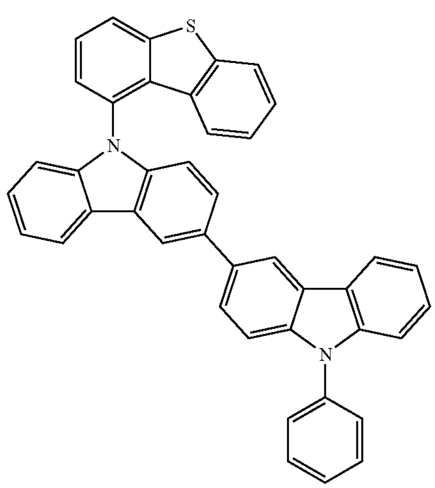
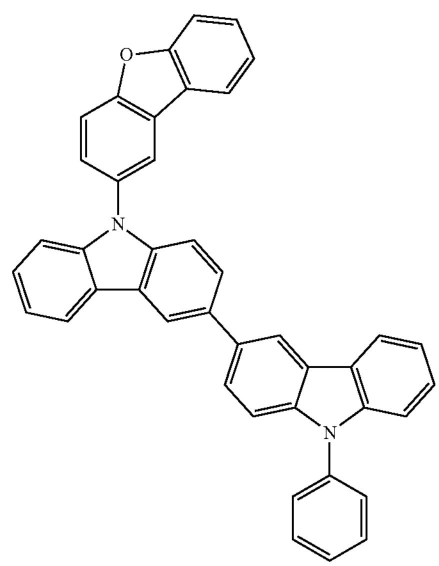

-continued
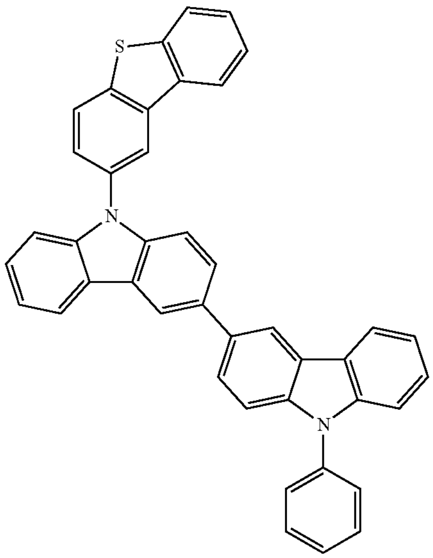
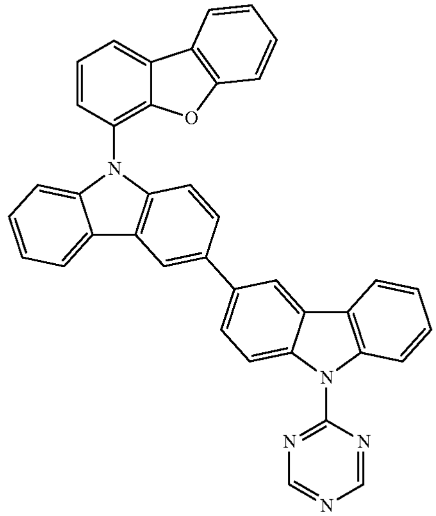
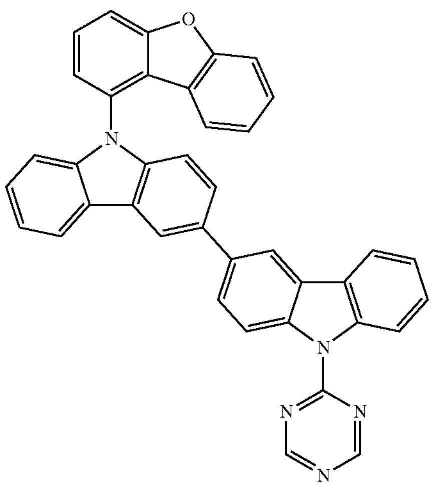
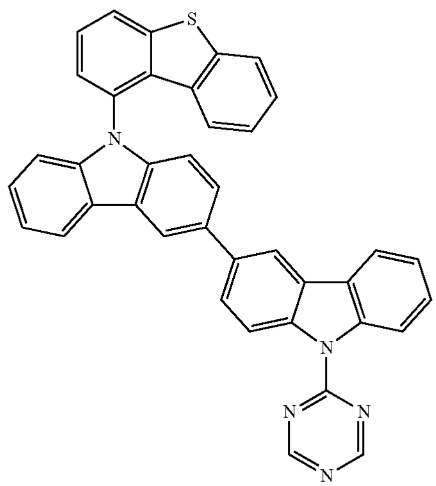
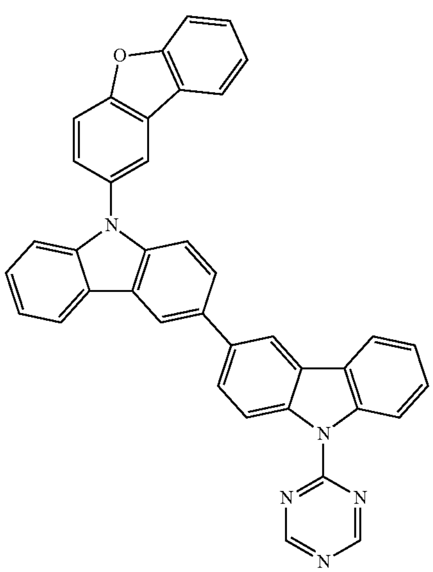
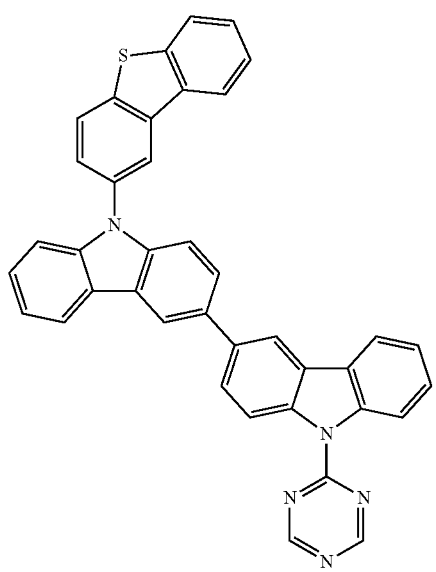

-continued
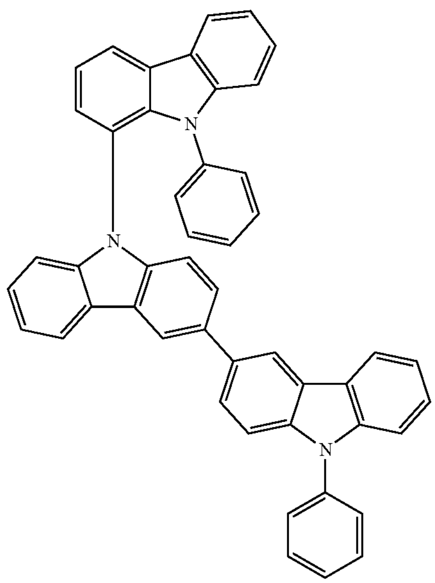
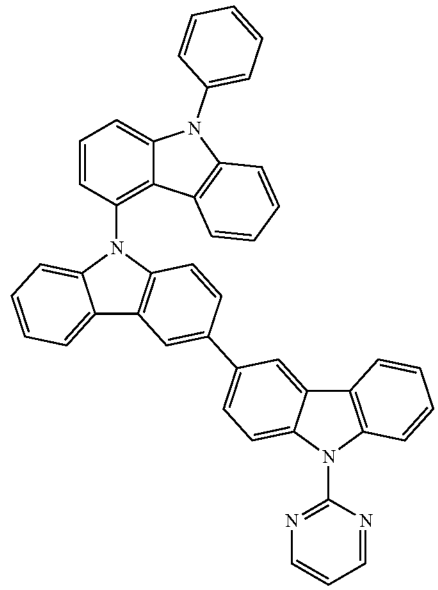
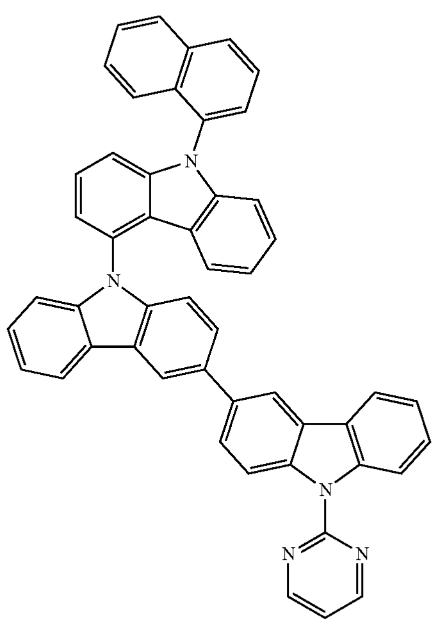
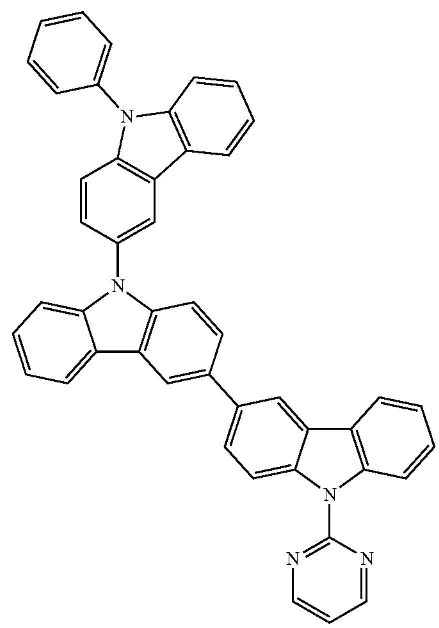

-continued
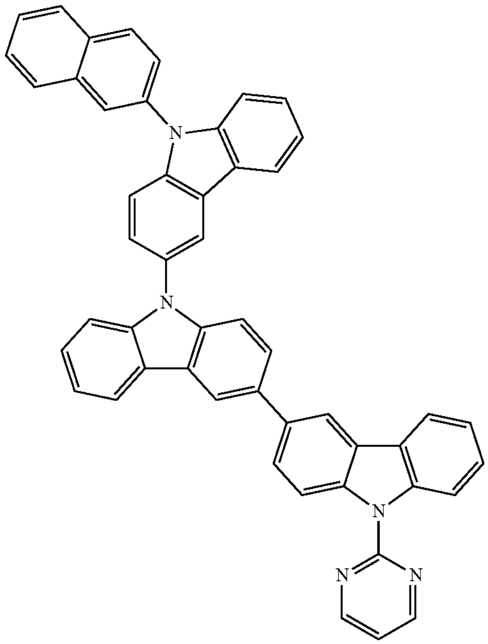
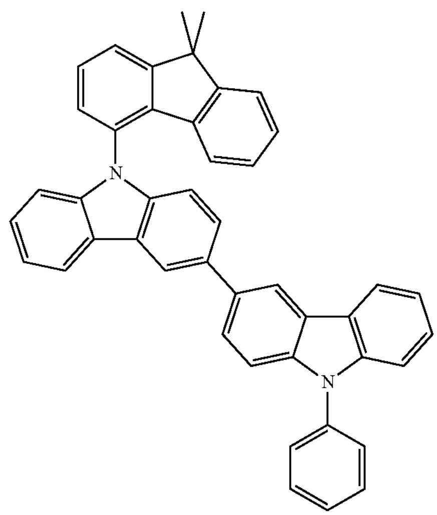
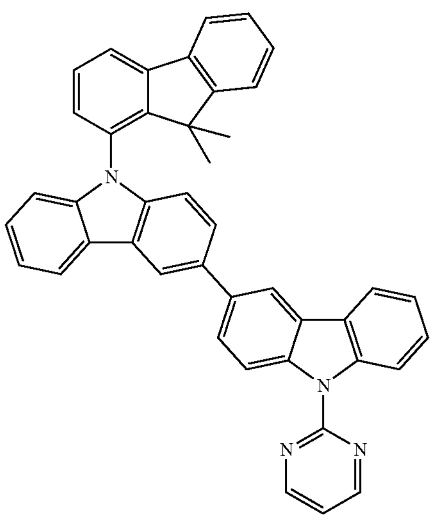
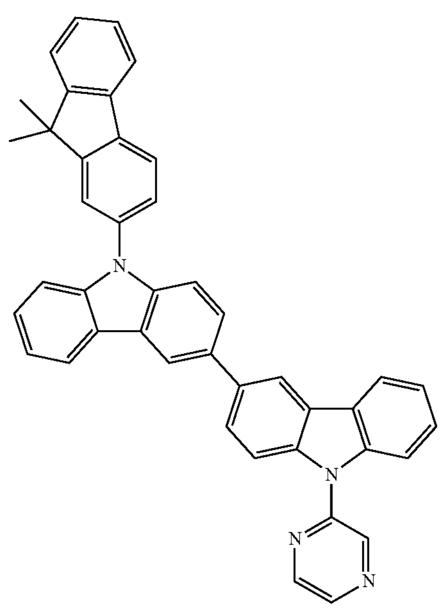

-continued
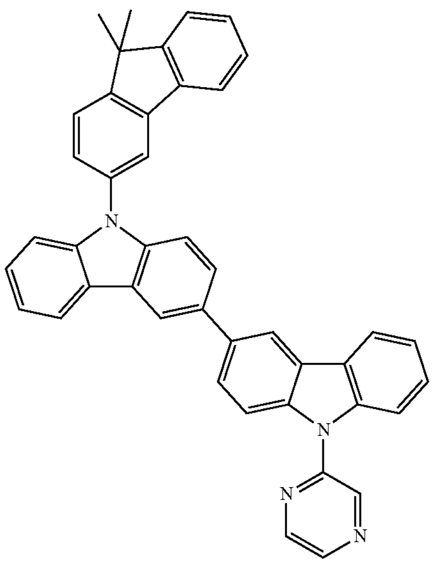
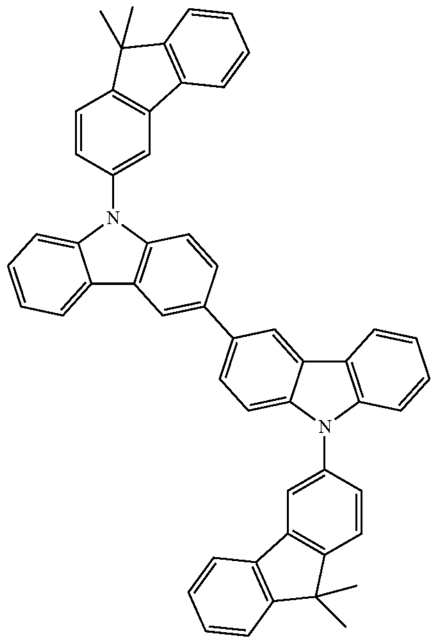
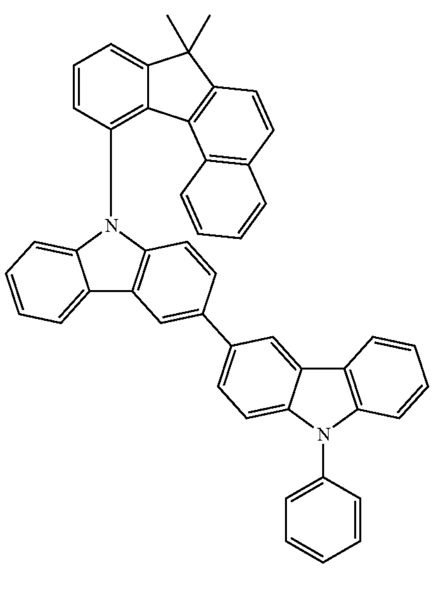
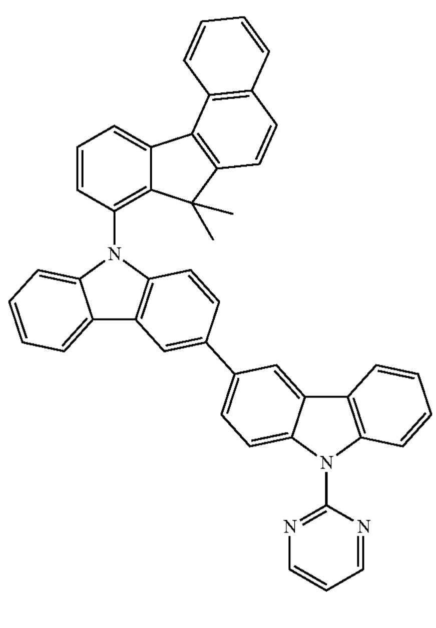

-continued
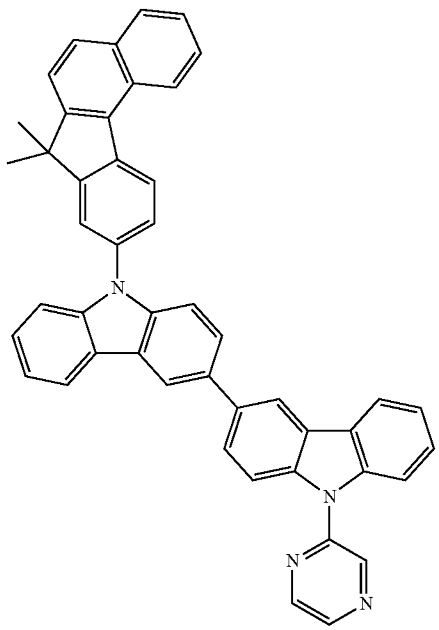
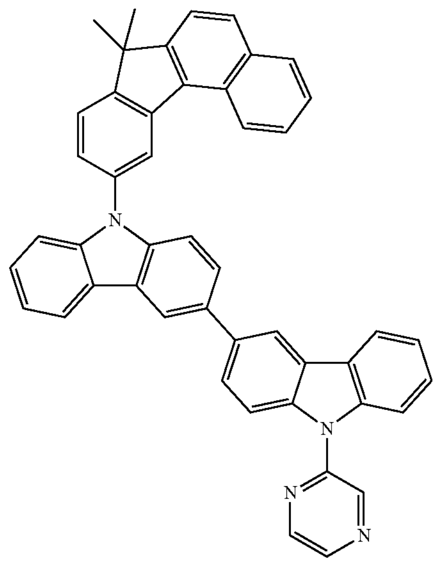
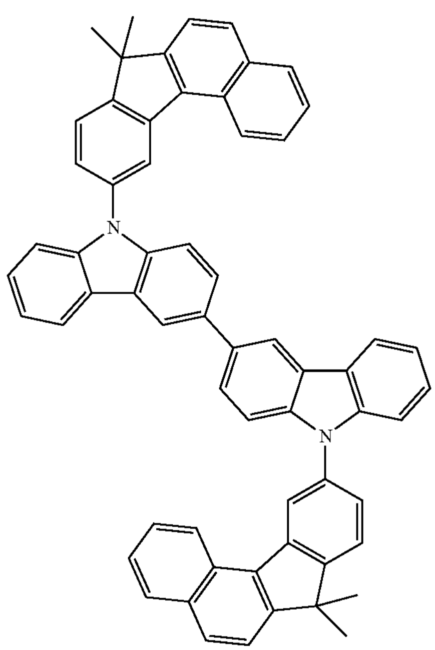
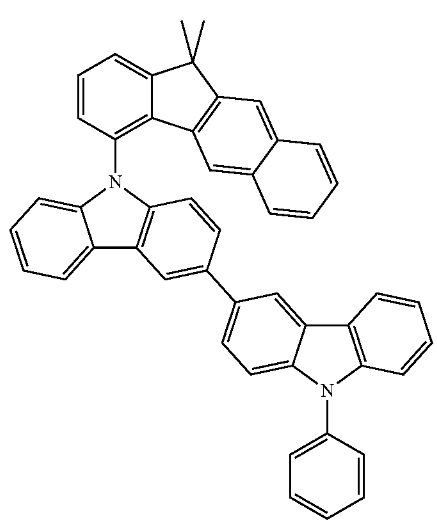

-continued
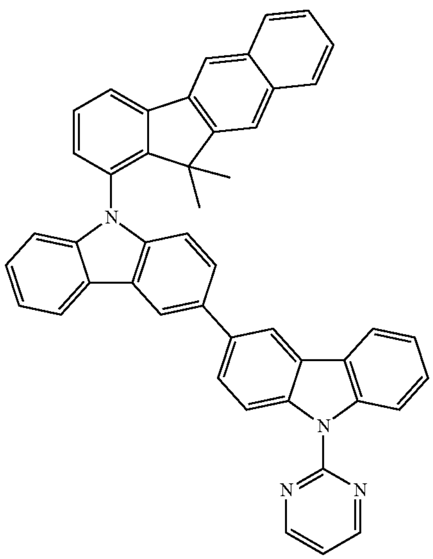
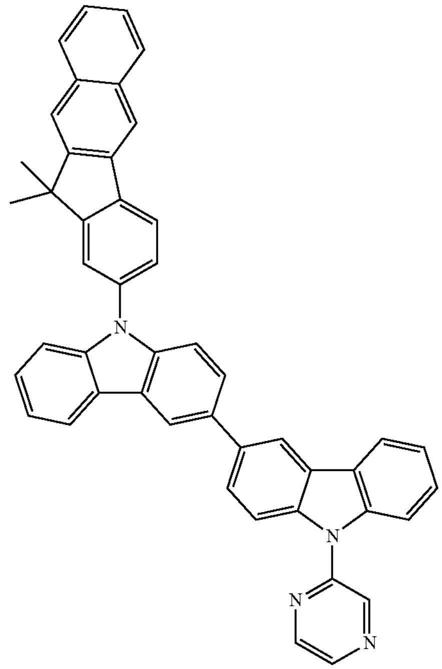
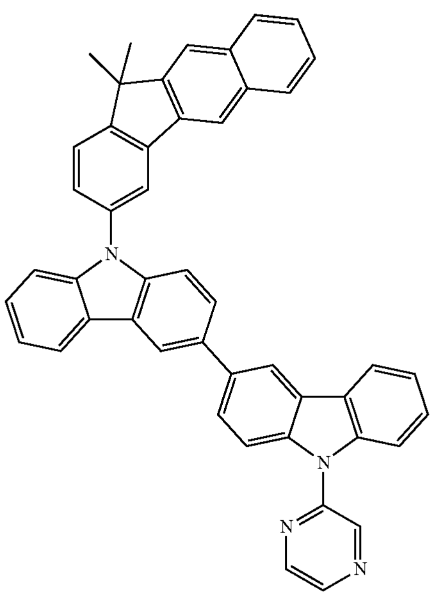
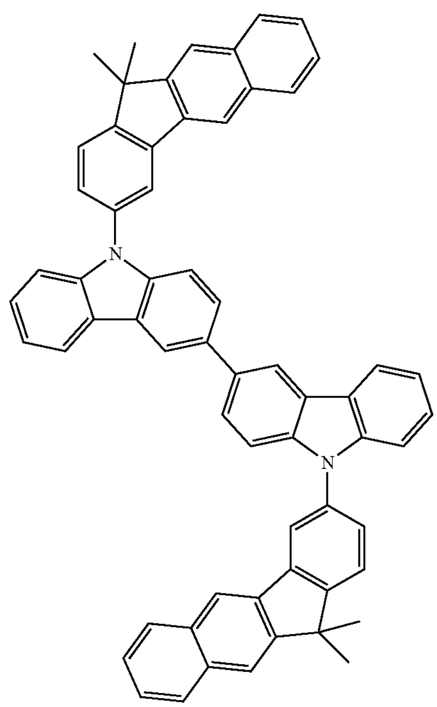

-continued
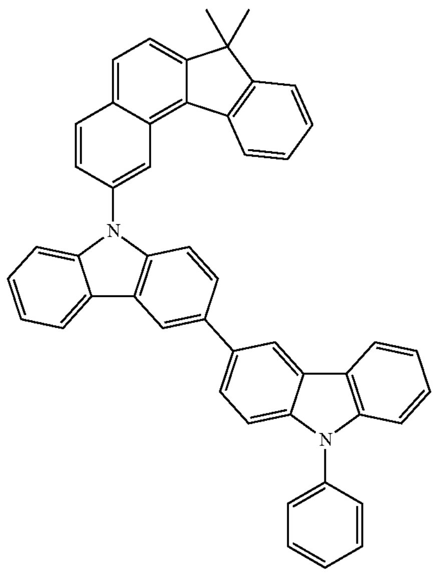
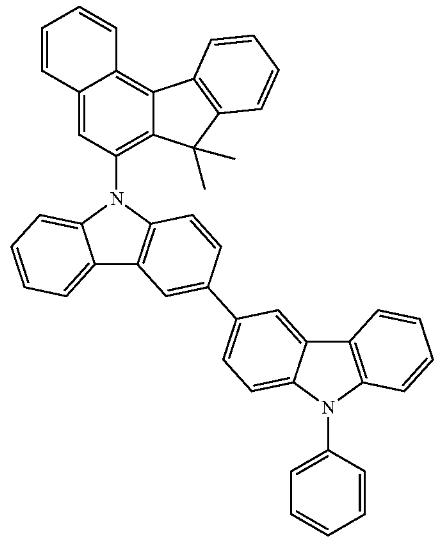
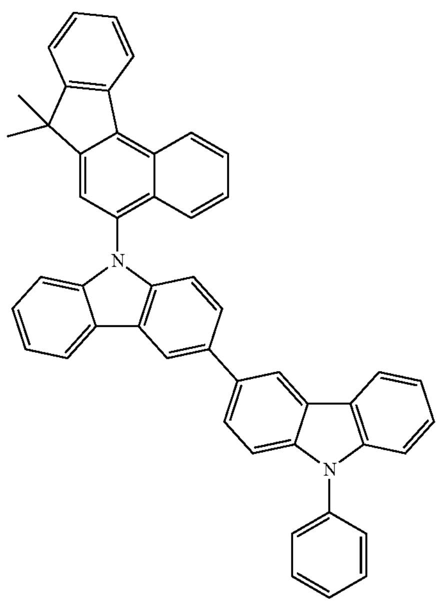
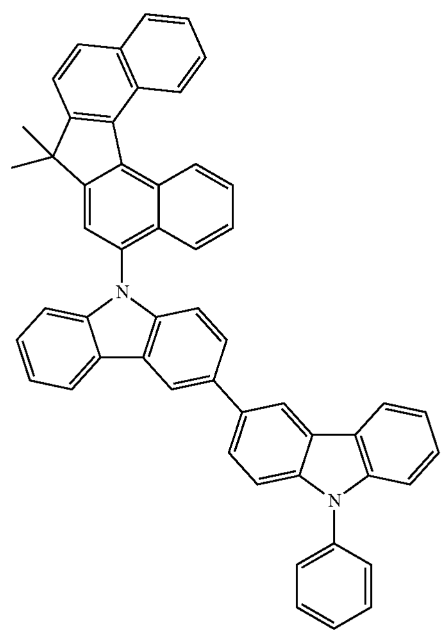

-continued
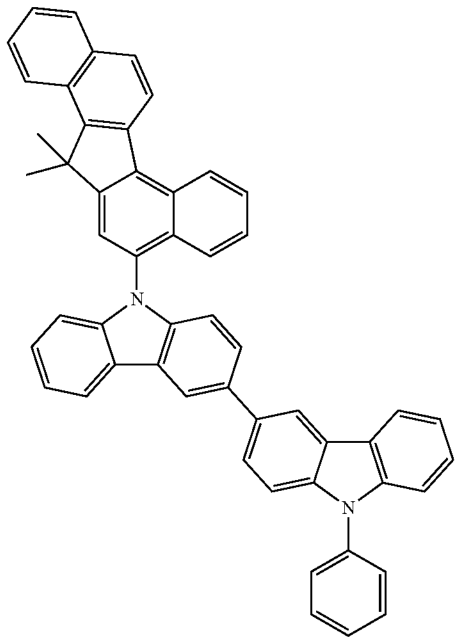
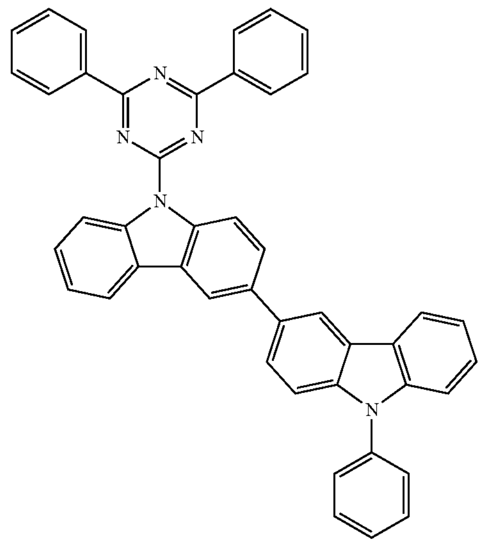
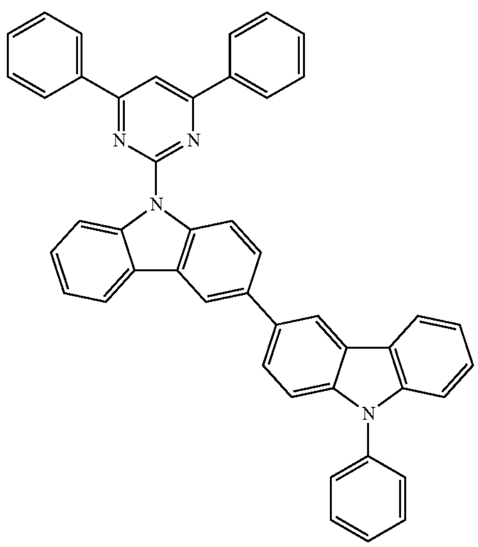
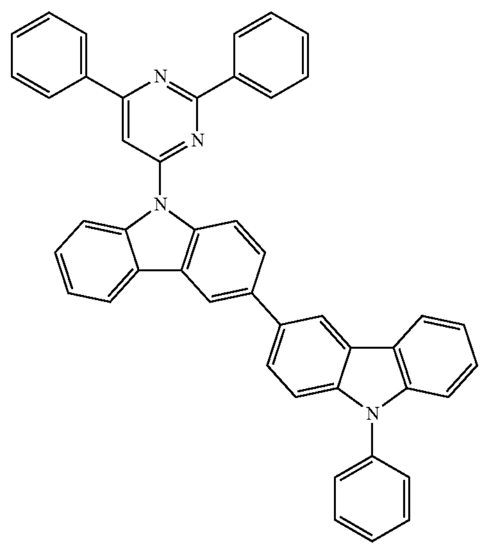
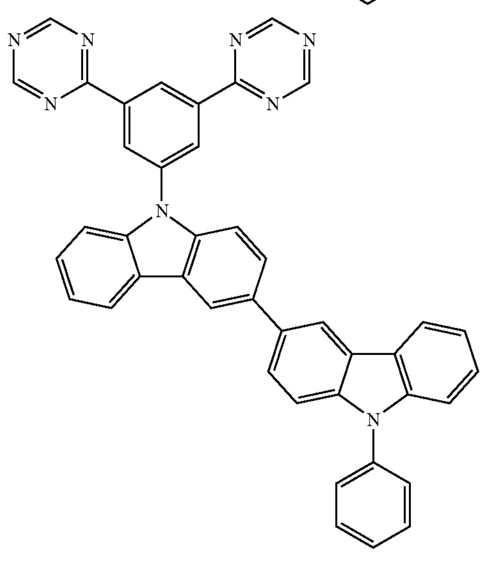
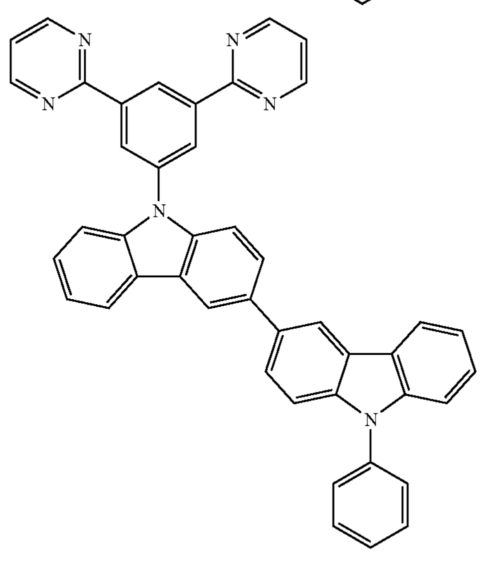

-continued
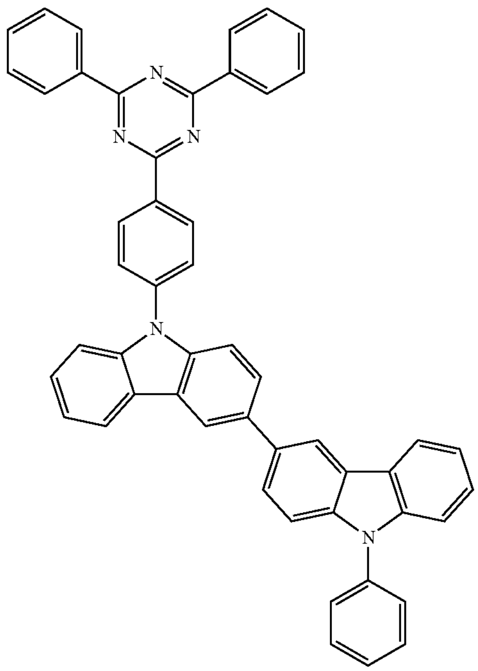
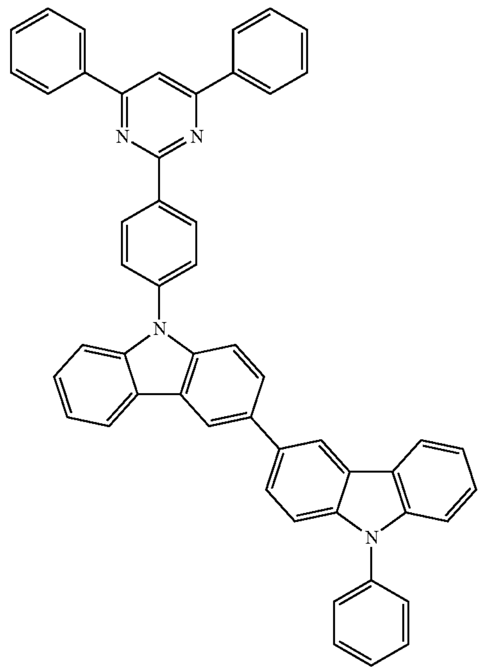
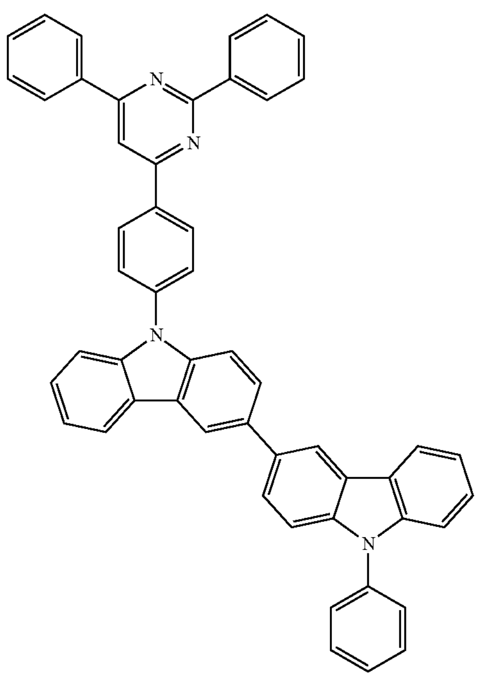
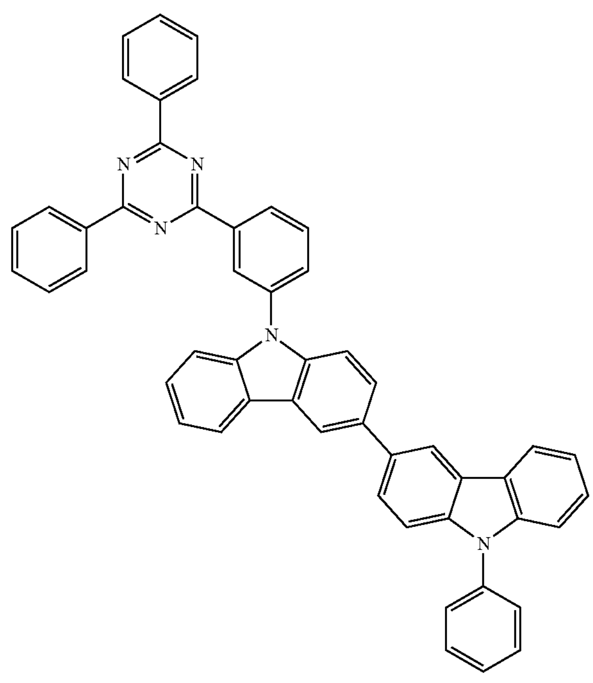

-continued
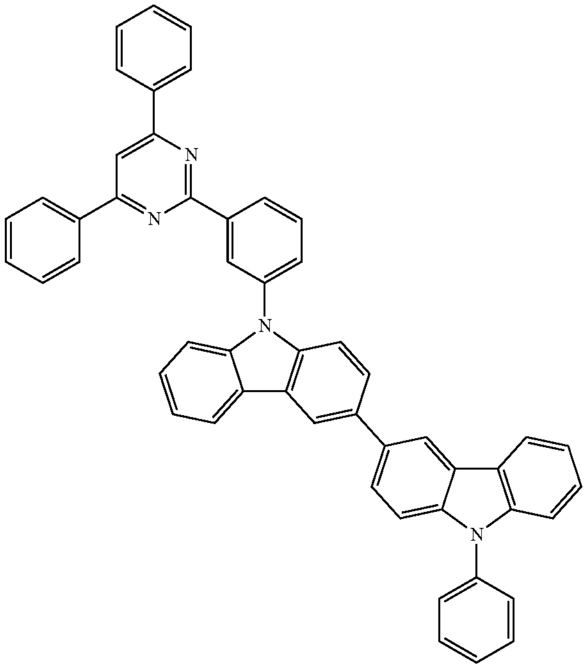
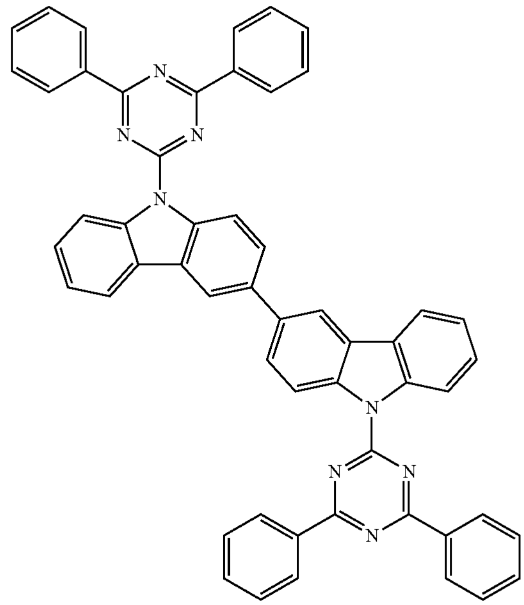
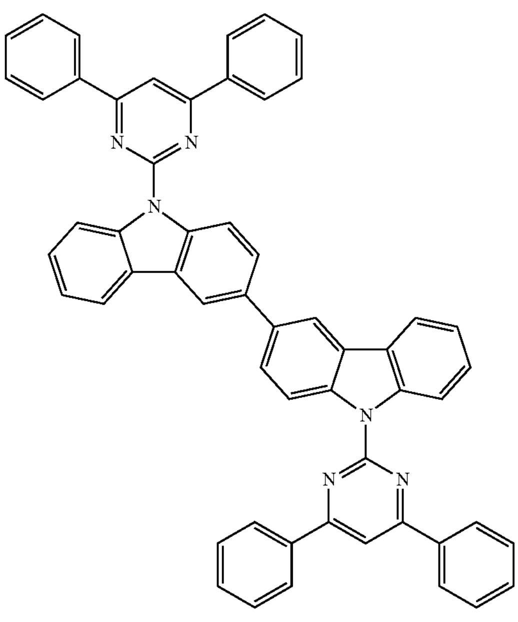
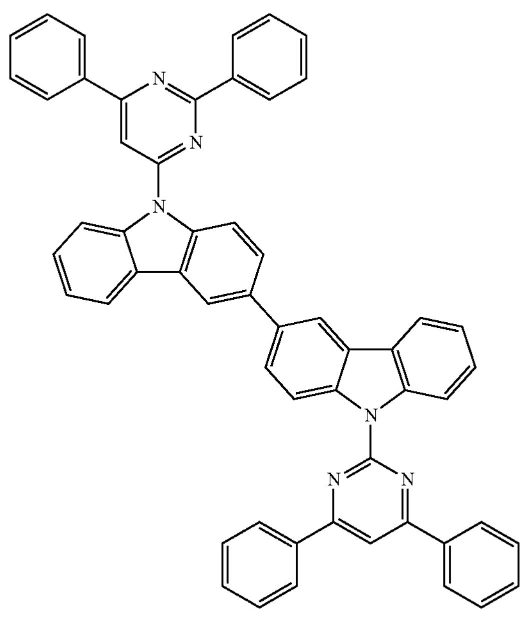

-continued
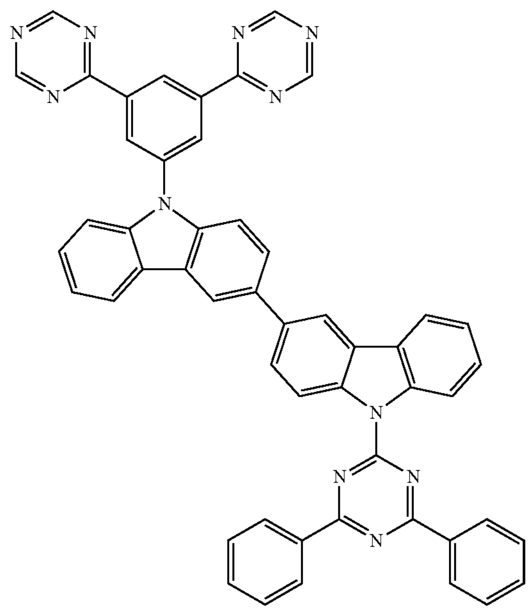
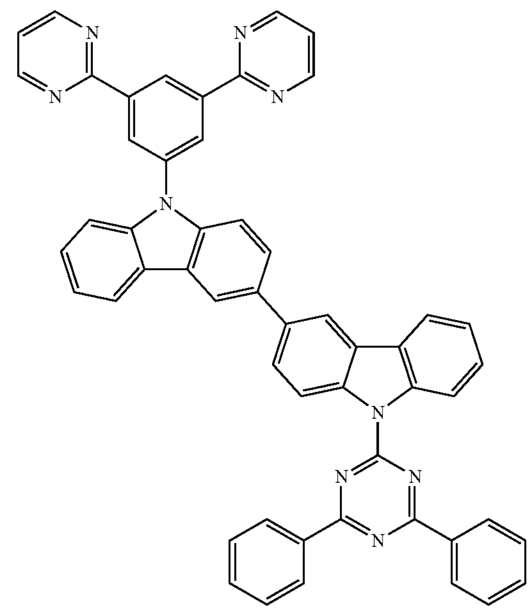
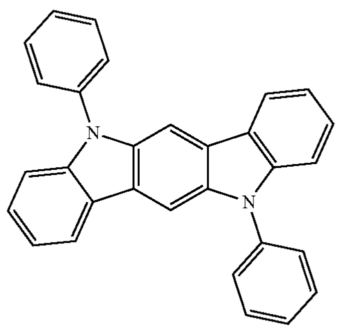
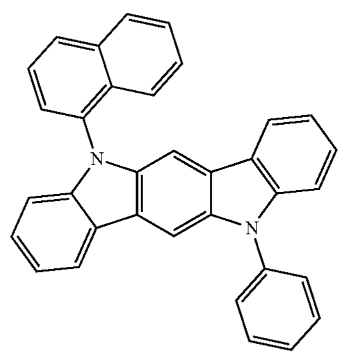
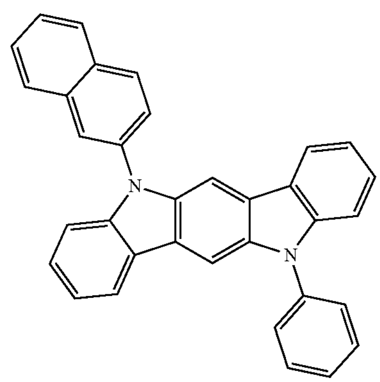
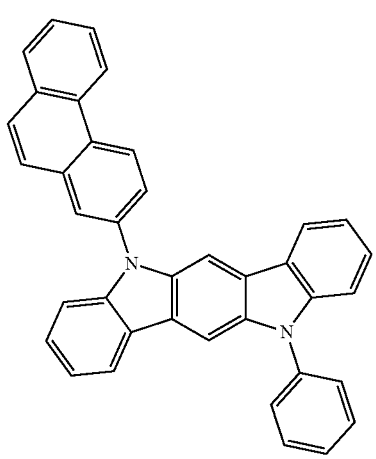
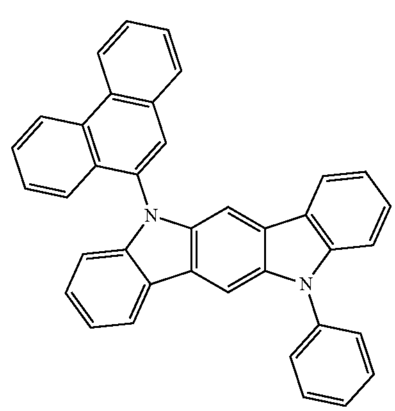

-continued
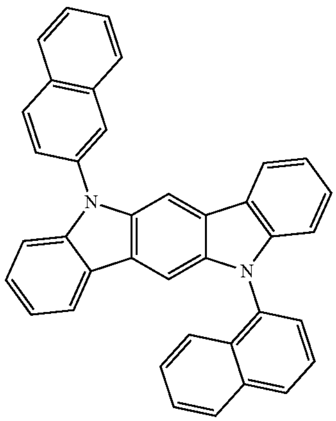
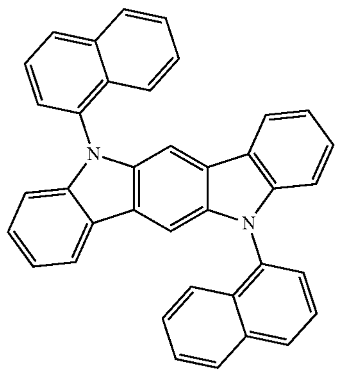
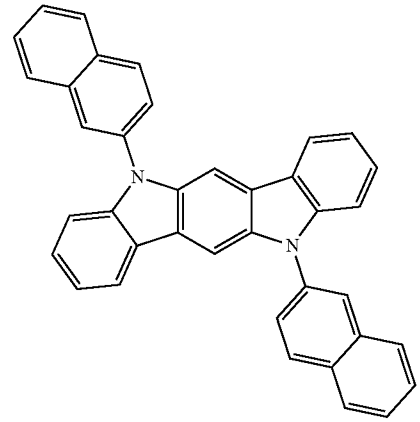
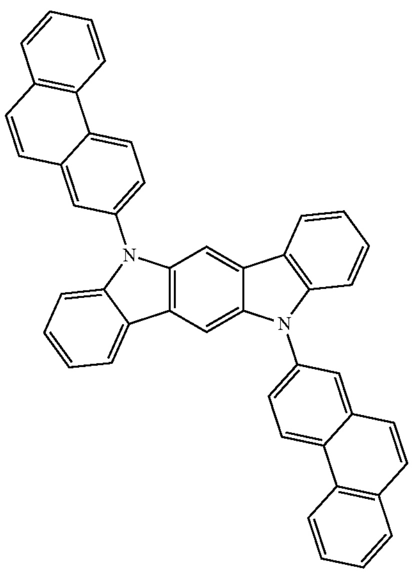
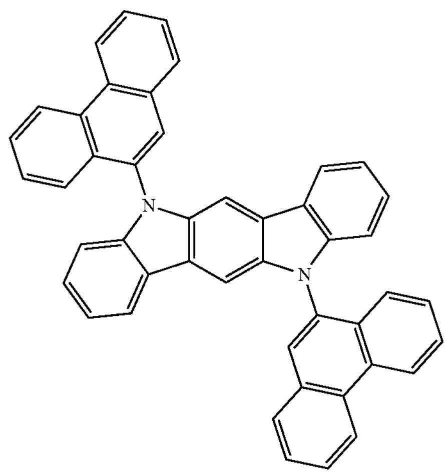
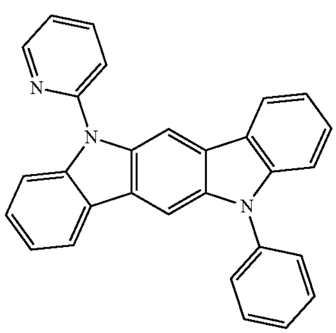
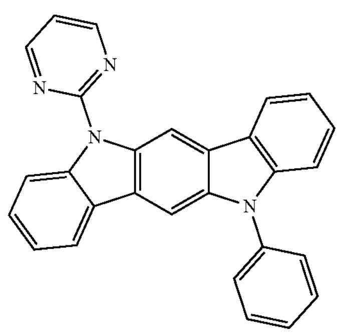
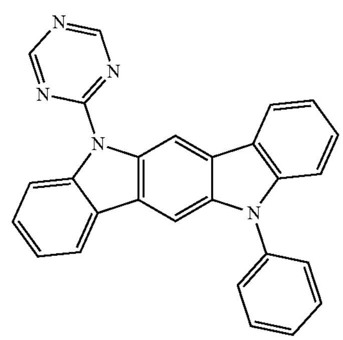
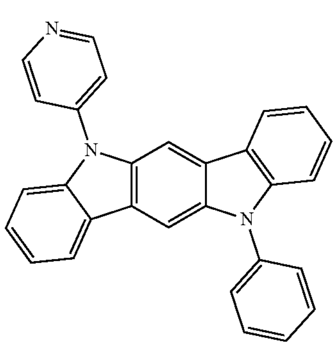
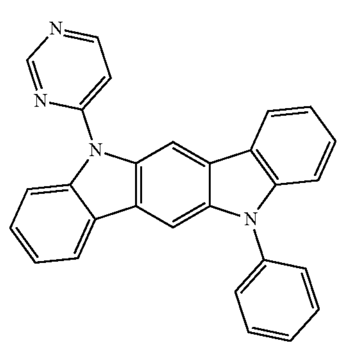
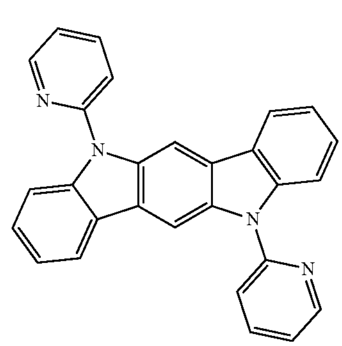

-continued
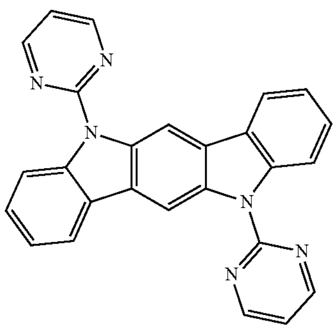
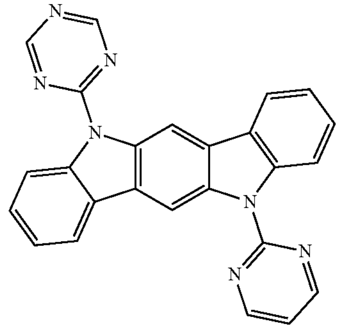
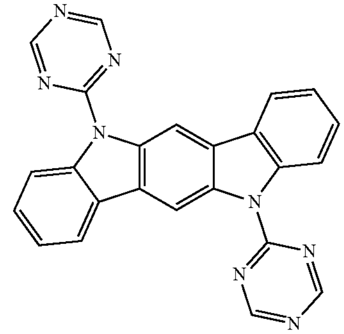
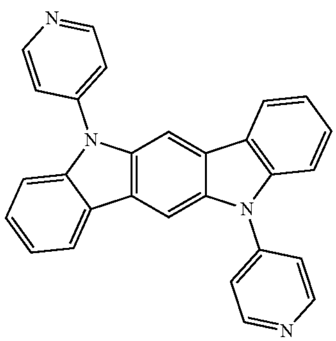
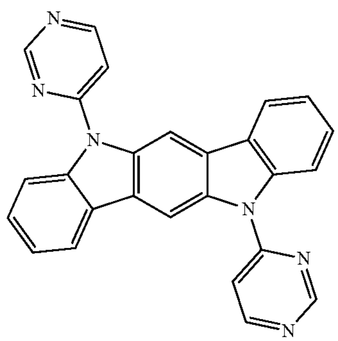
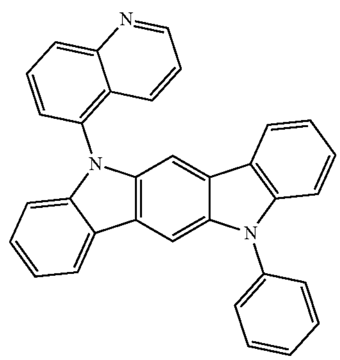
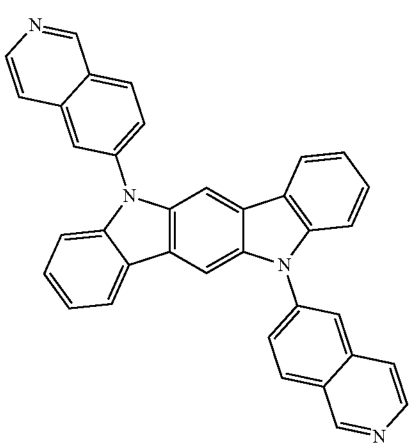
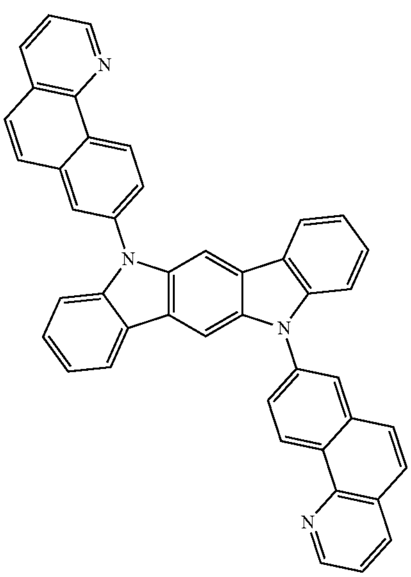

-continued
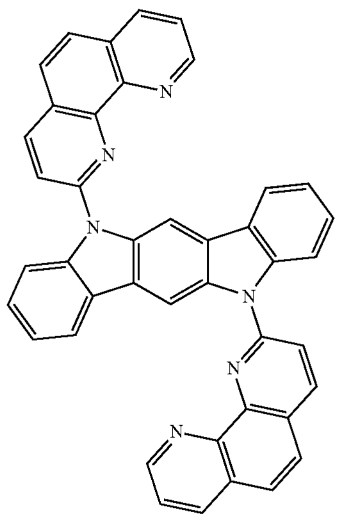
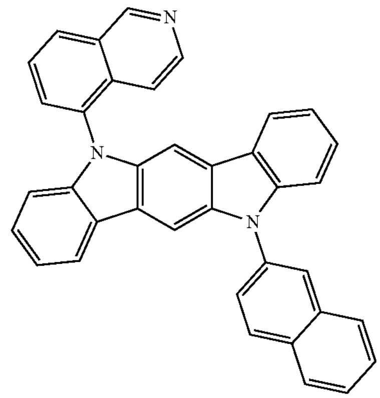
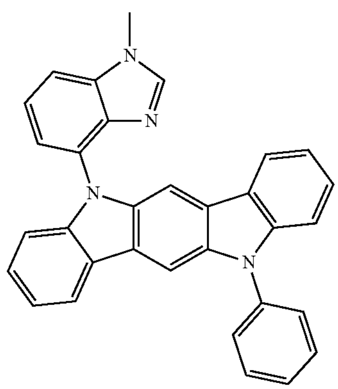
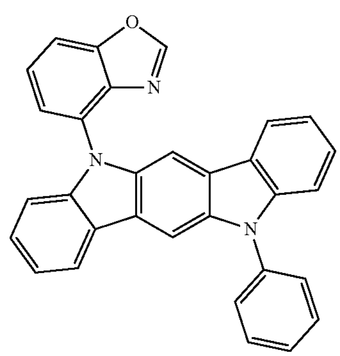
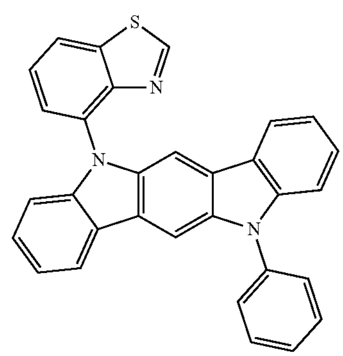
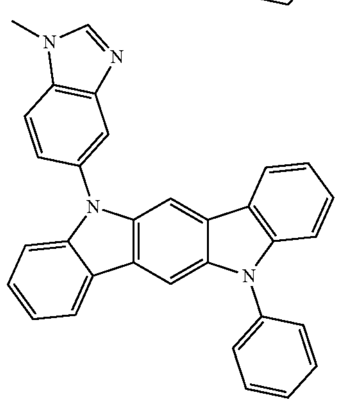
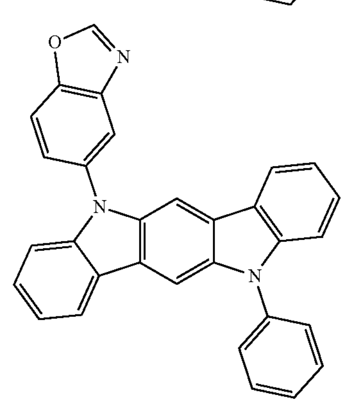
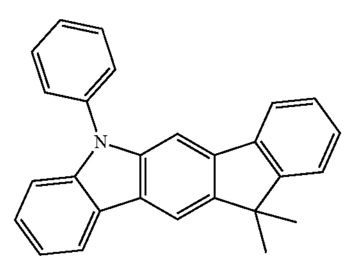
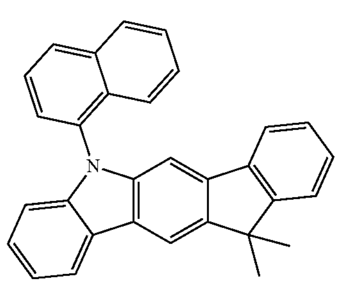
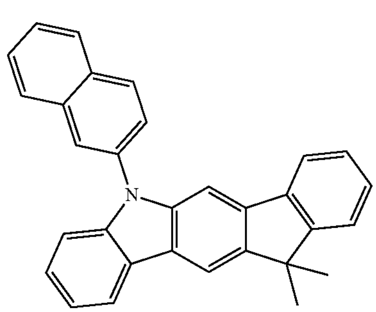
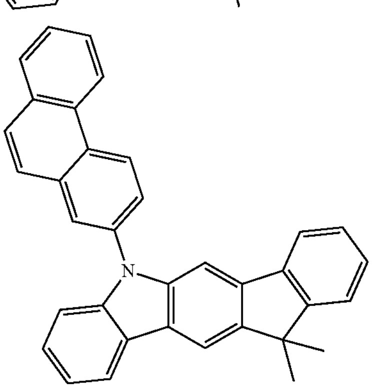

-continued
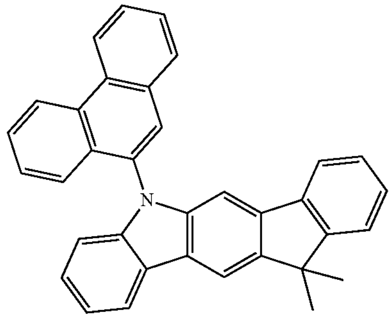
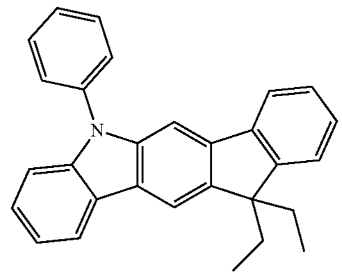
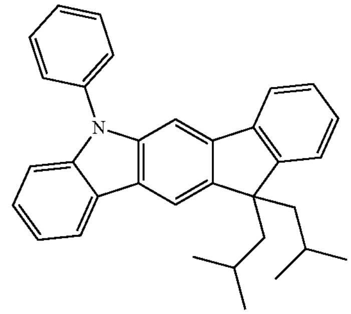
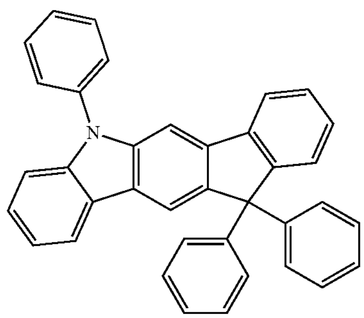
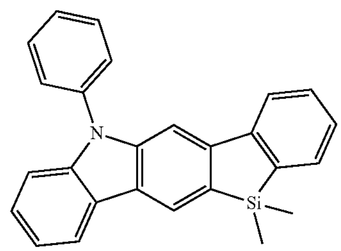
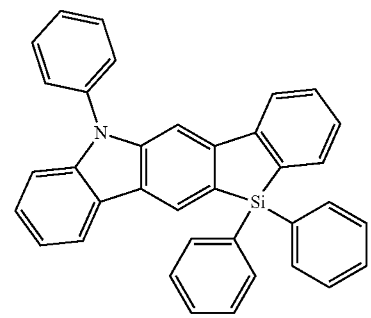
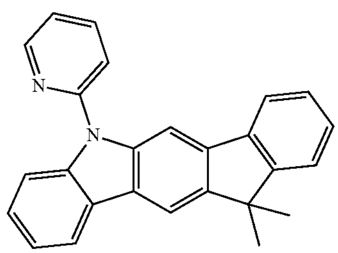
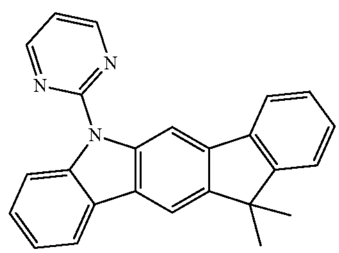
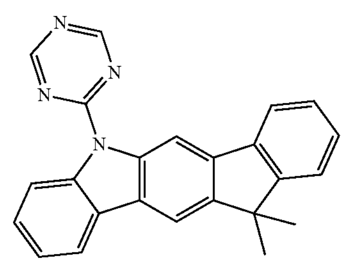
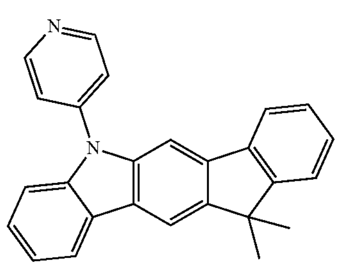
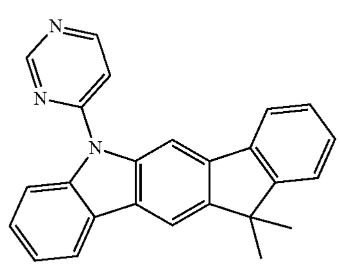
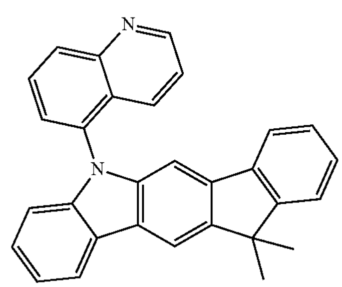
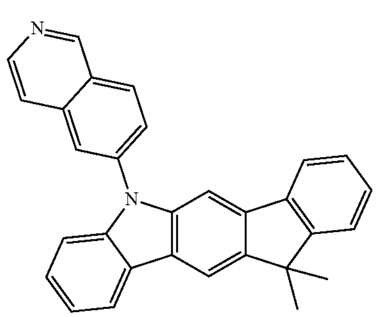
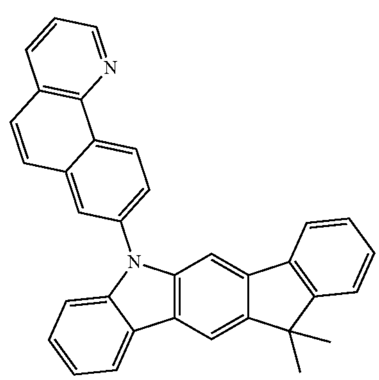
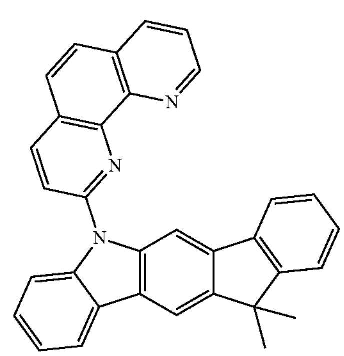

-continued
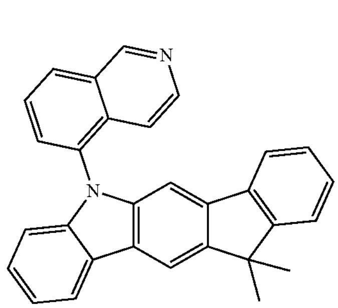
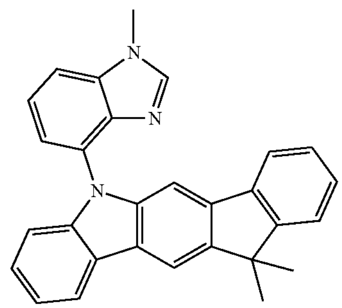
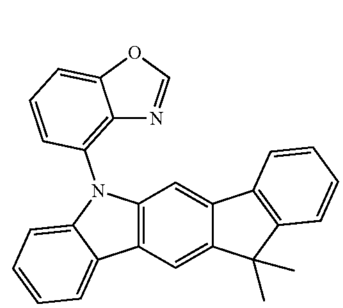
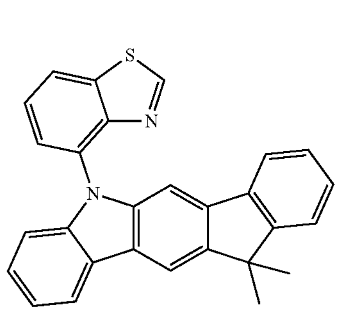
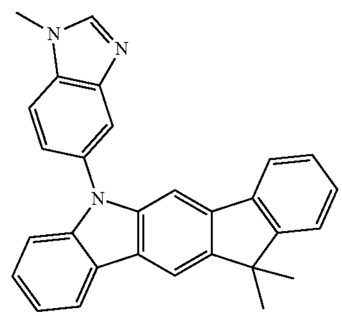
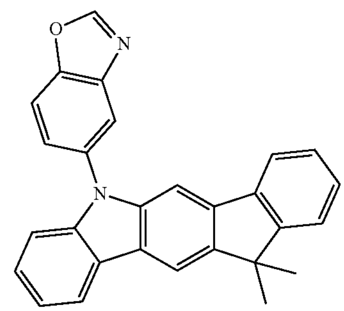
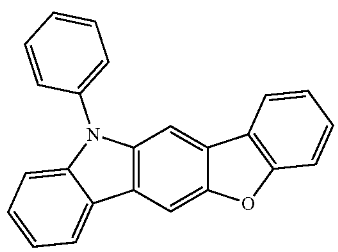
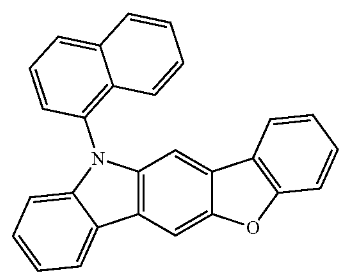
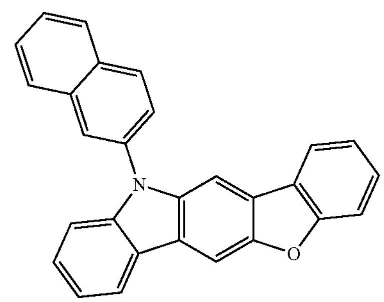
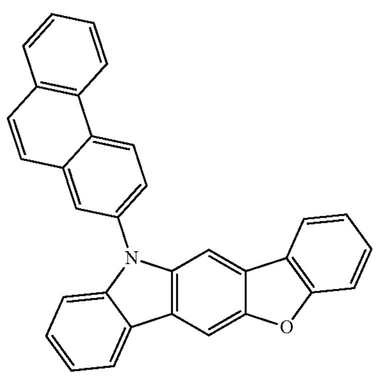
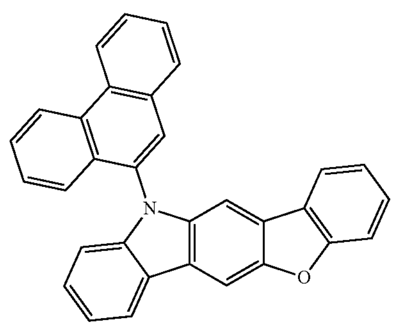
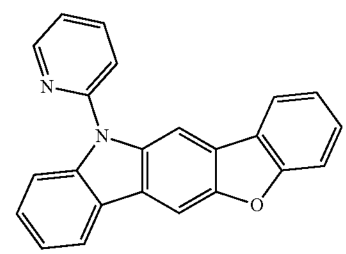
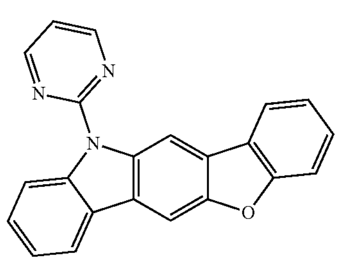
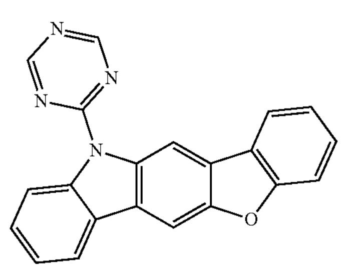
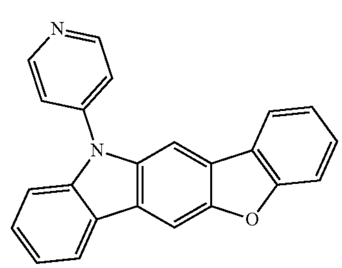

-continued
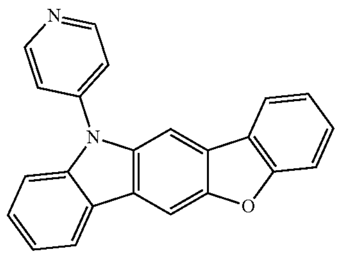
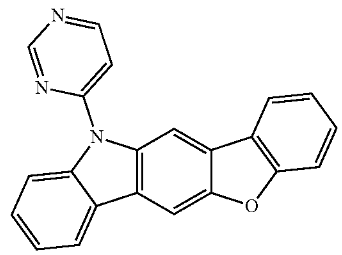
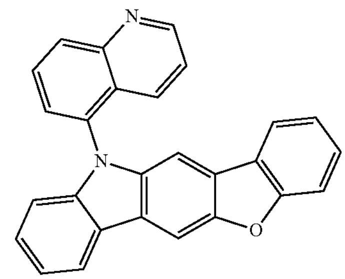
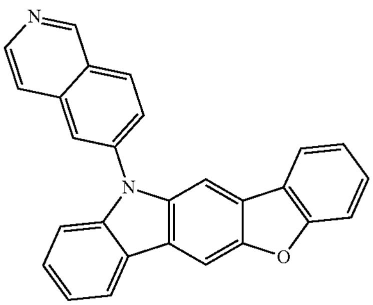
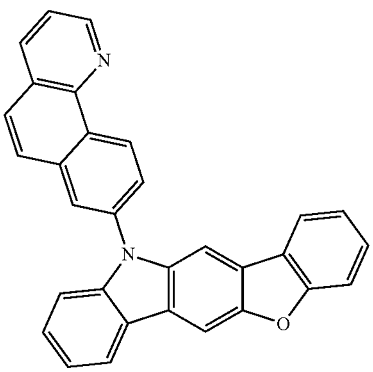
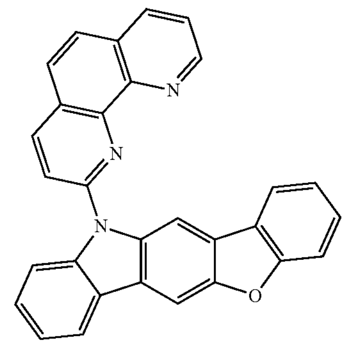
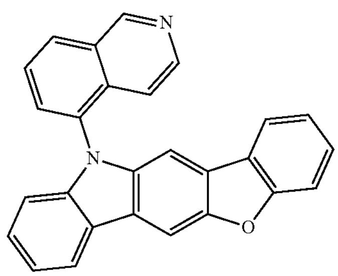
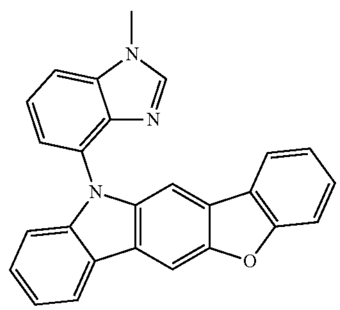
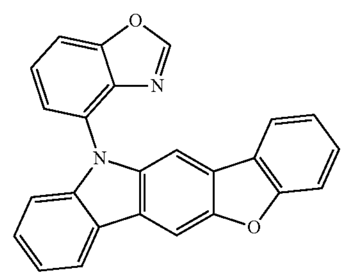
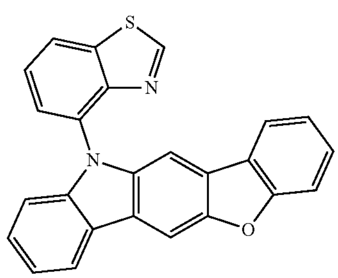
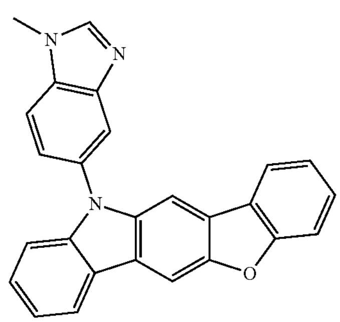
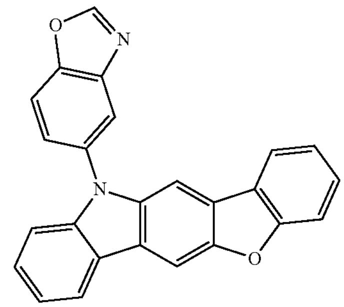
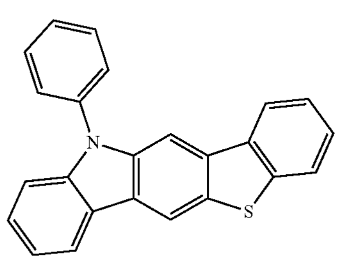
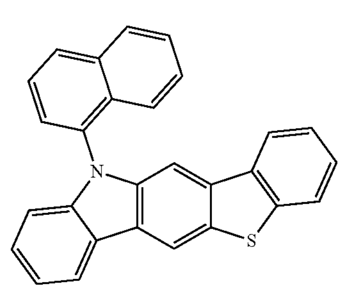
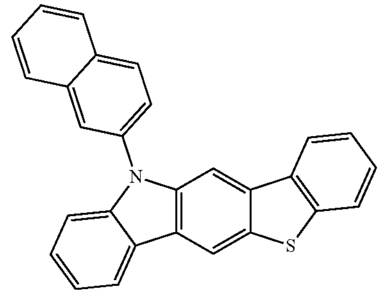

-continued
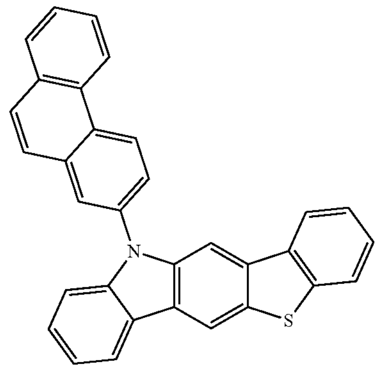
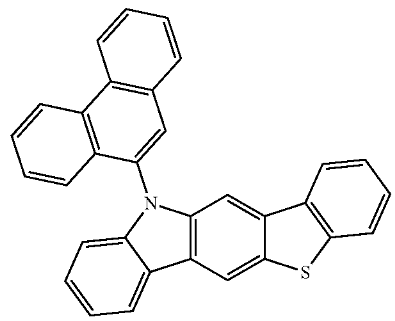
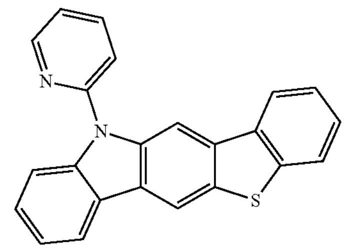
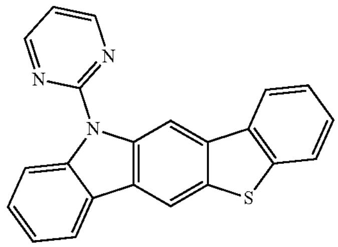
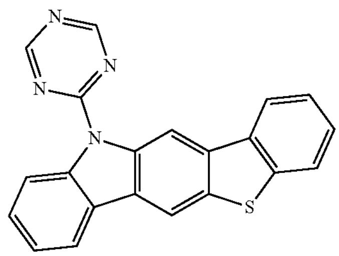
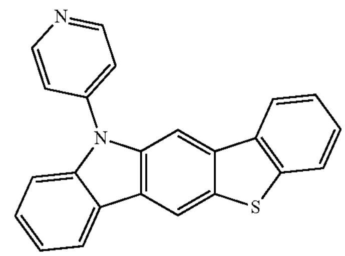
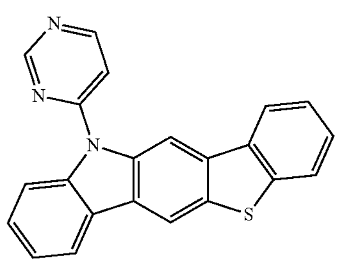
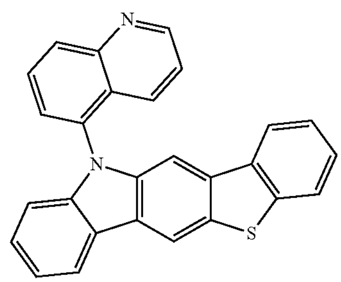
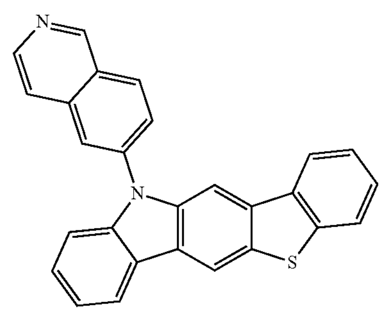
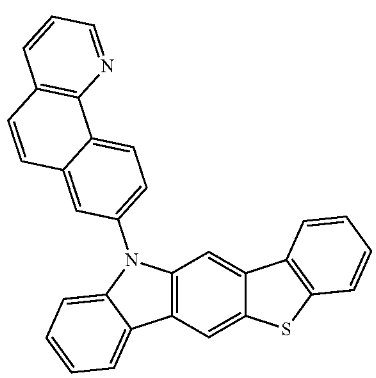
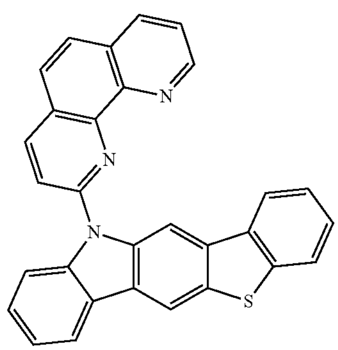
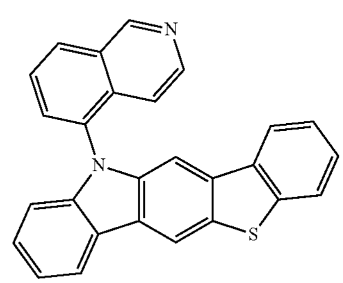
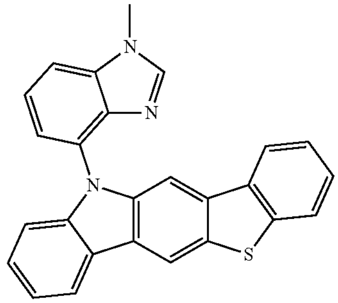
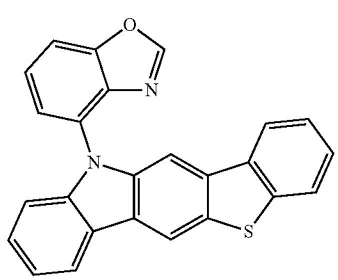
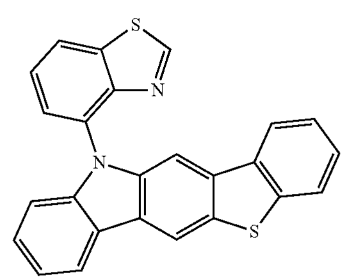

-continued
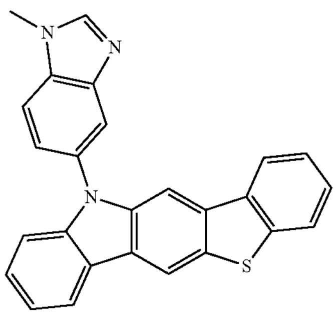
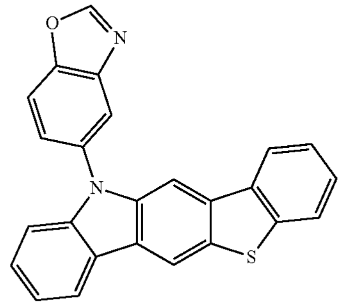
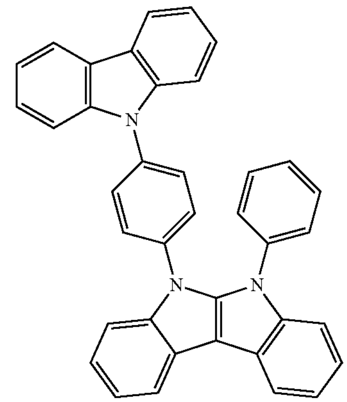
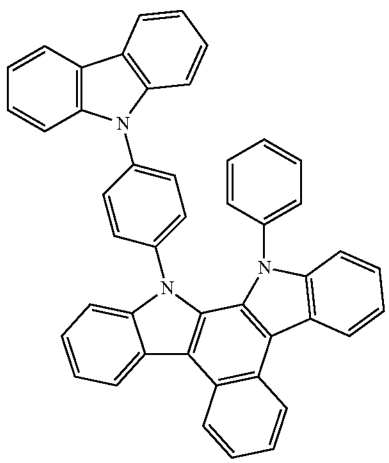
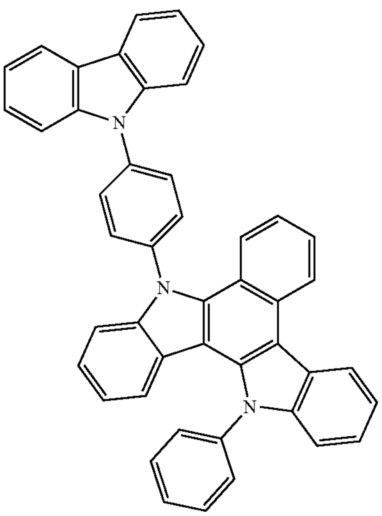
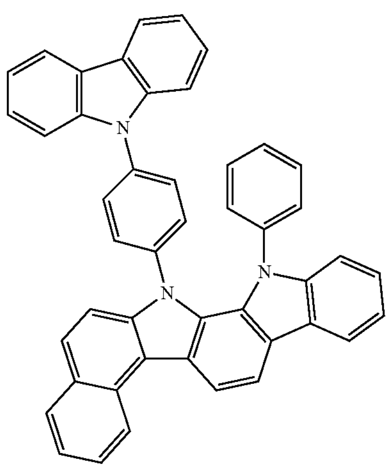
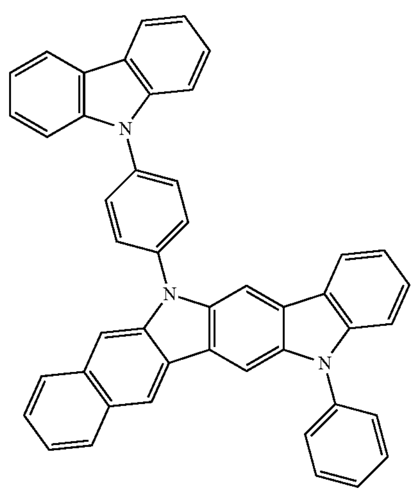

-continued
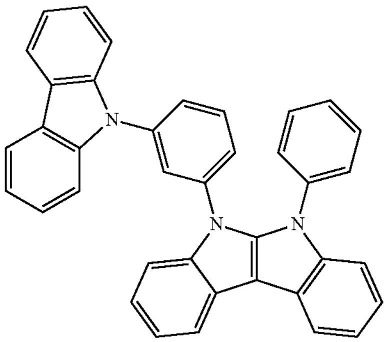
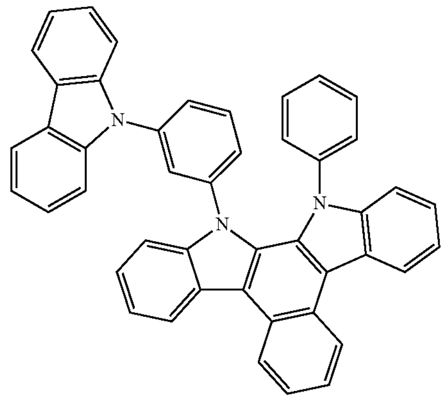
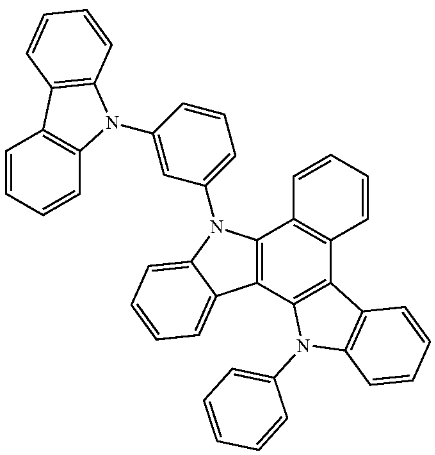
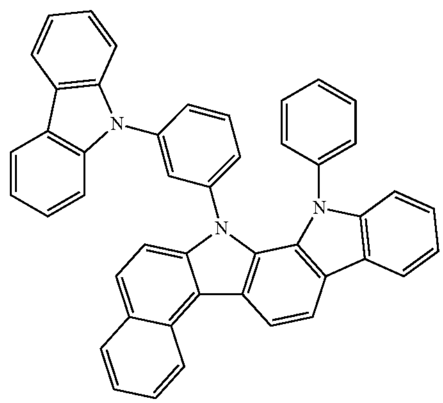
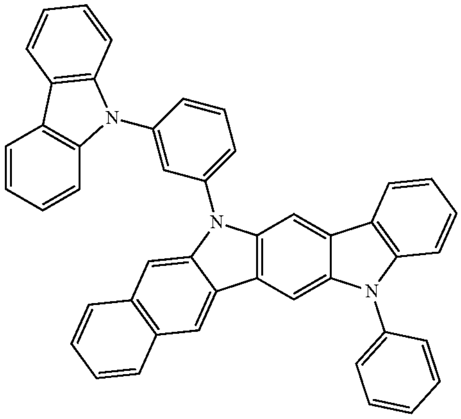
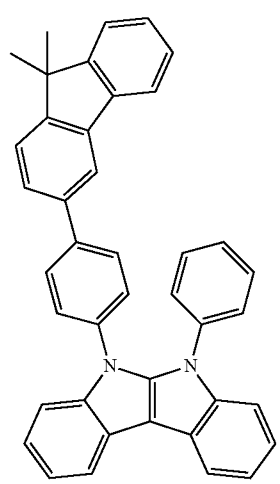
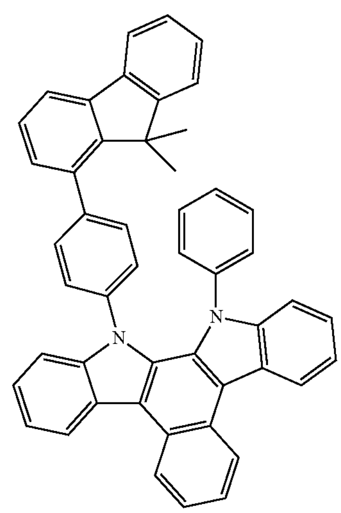

-continued
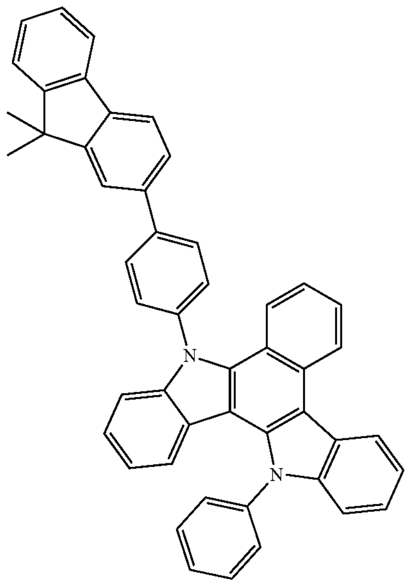
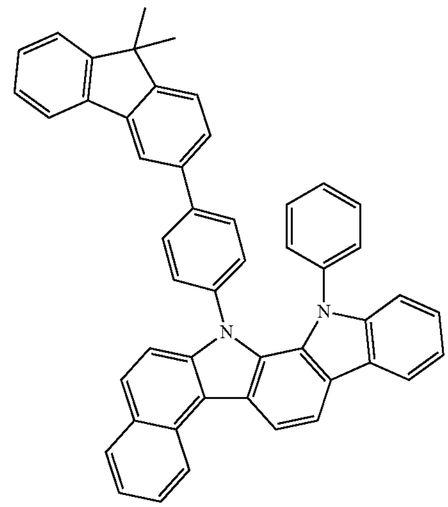
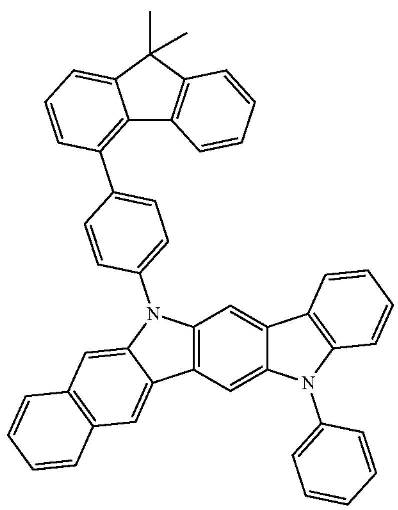
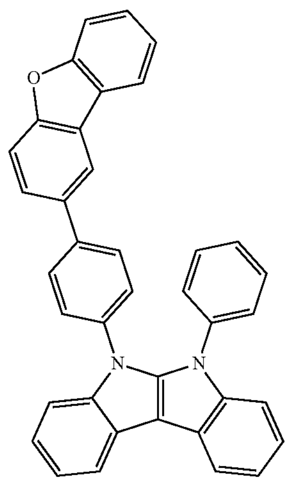
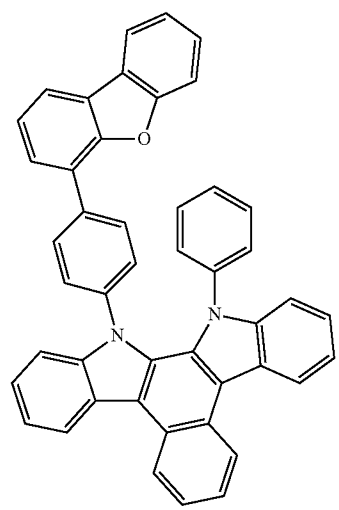
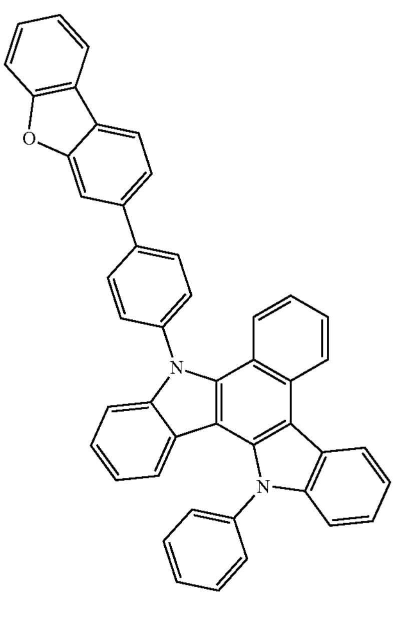
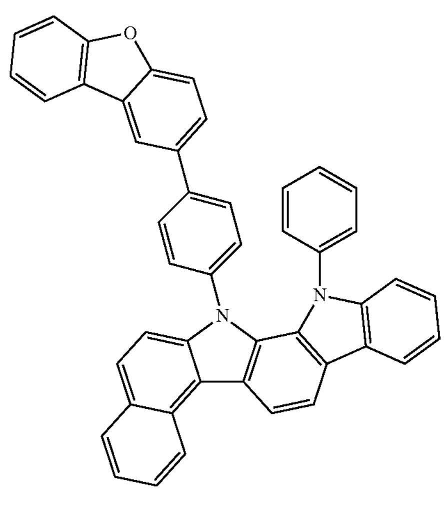

-continued
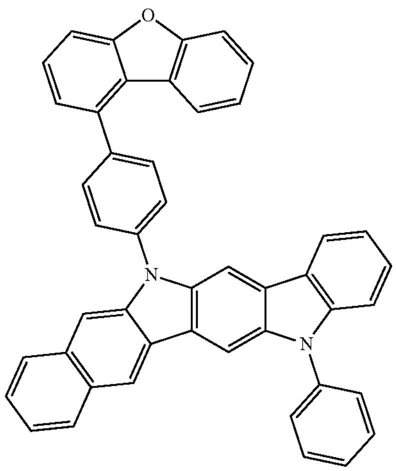
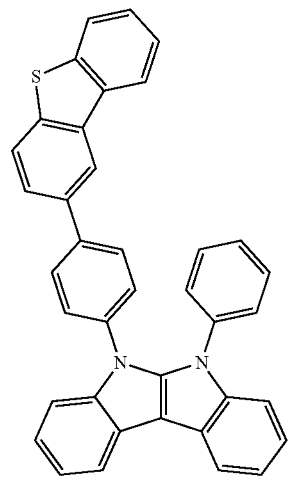
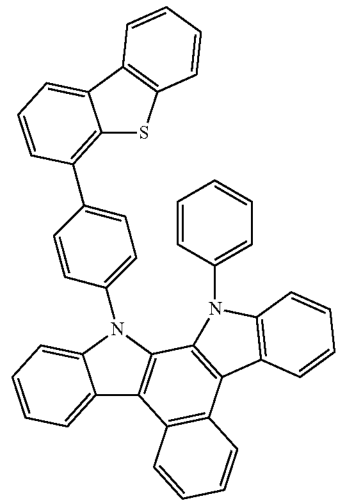
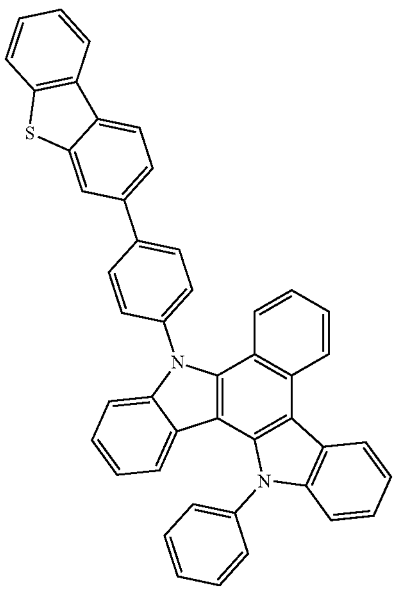
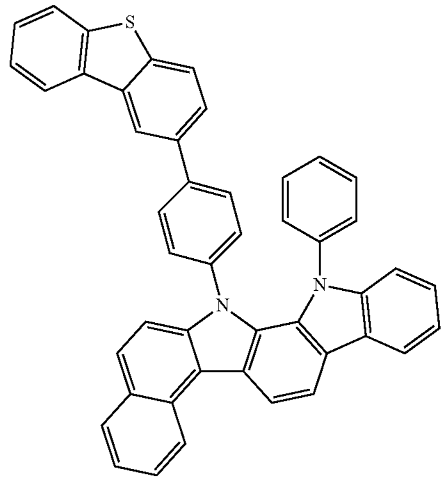
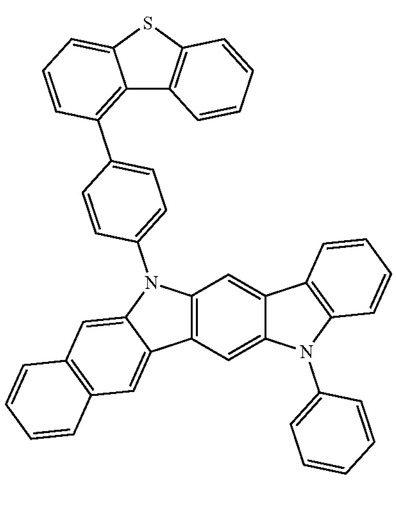
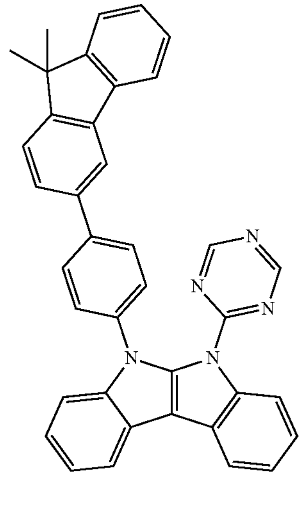
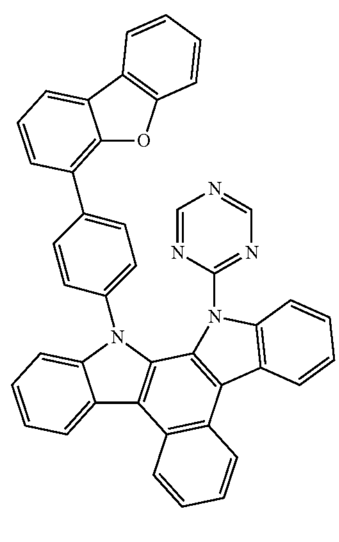

-continued
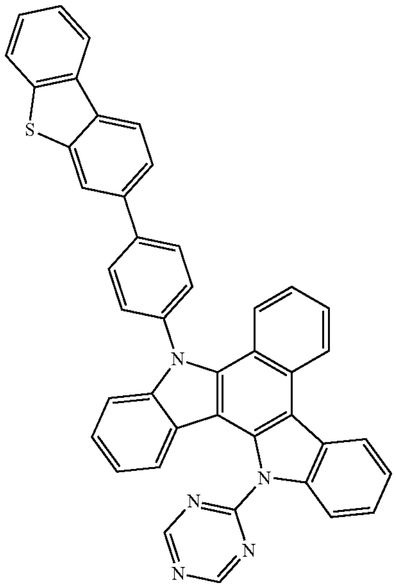
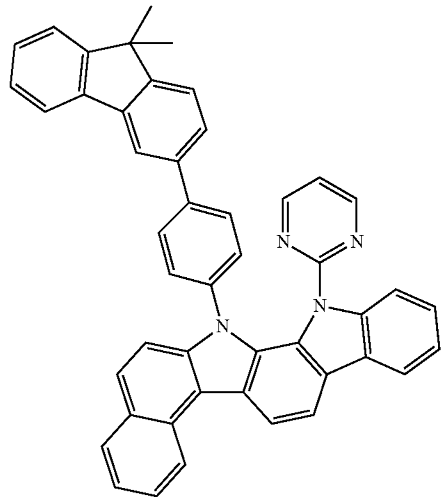
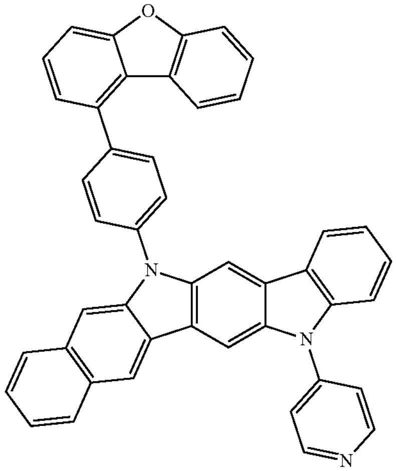
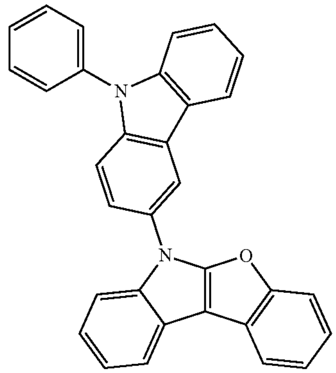
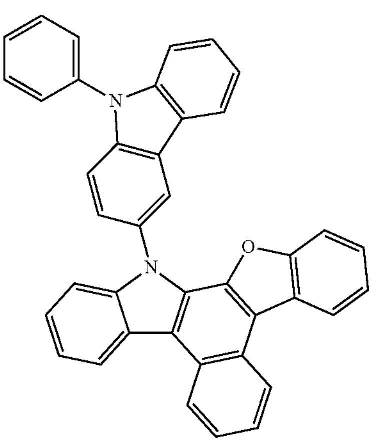
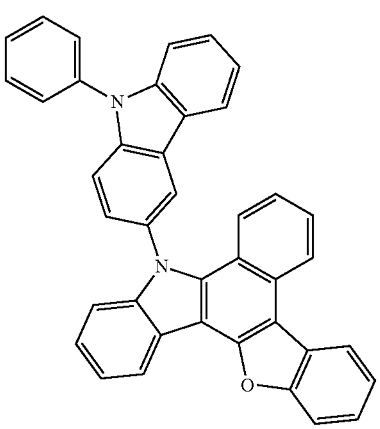
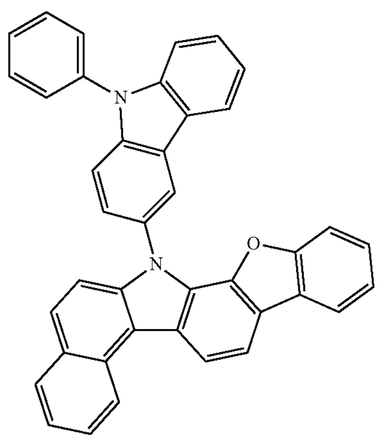

-continued
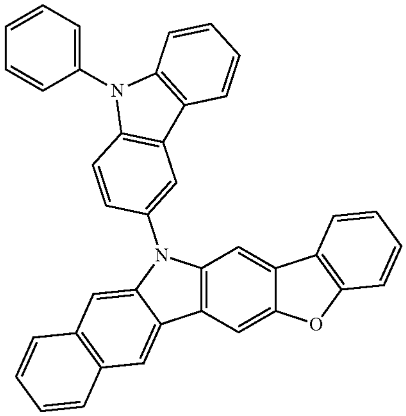
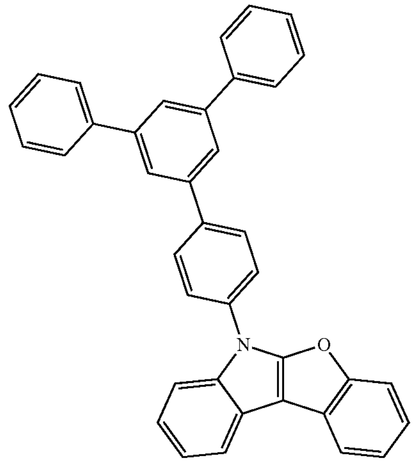
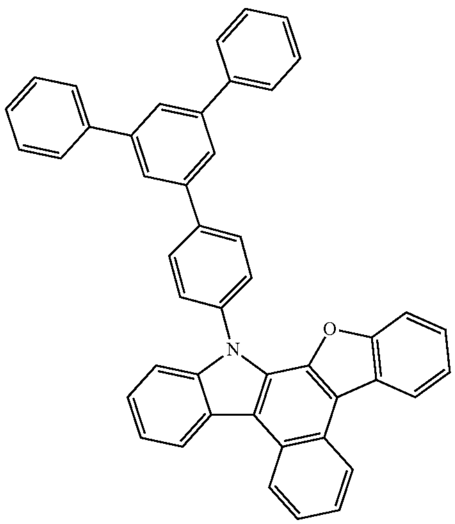
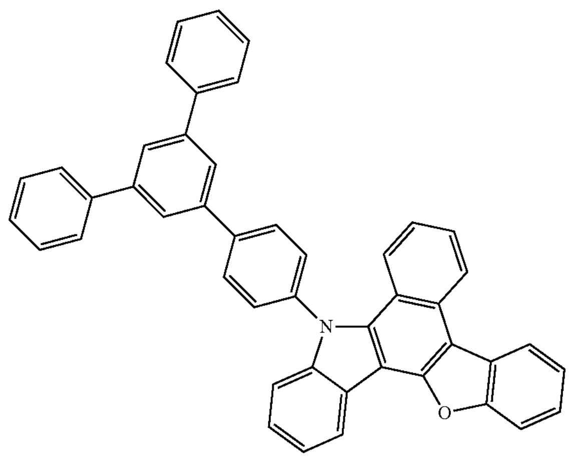
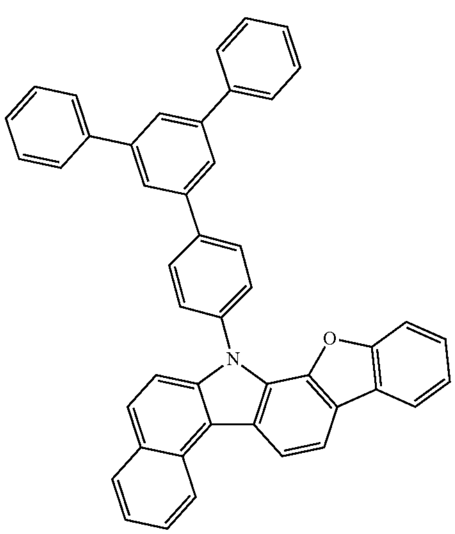
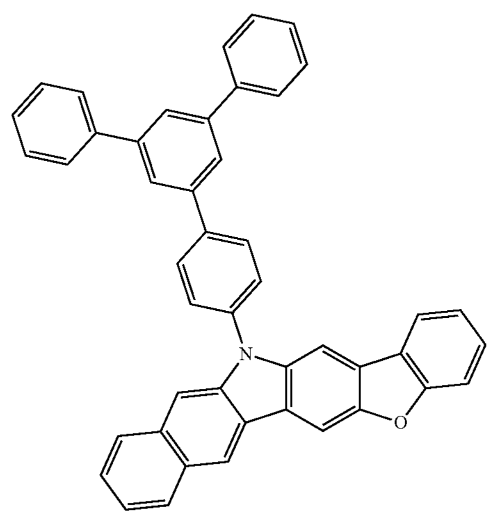

-continued
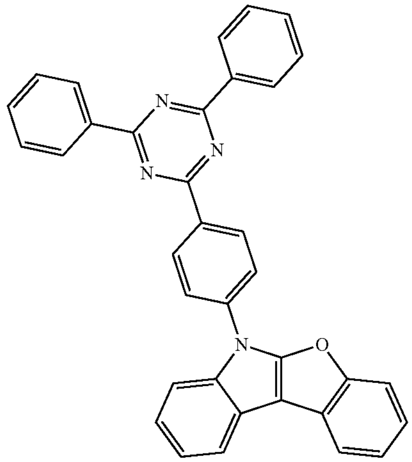
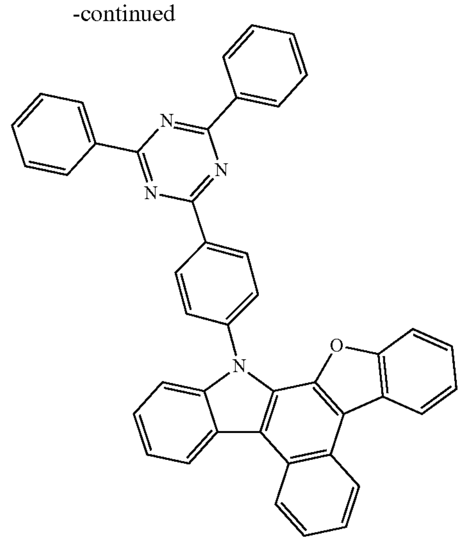
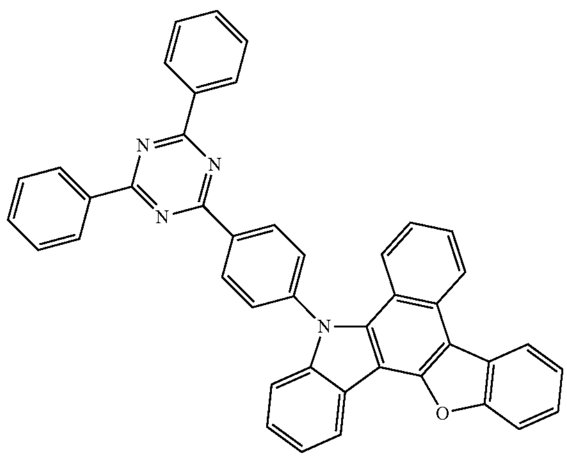
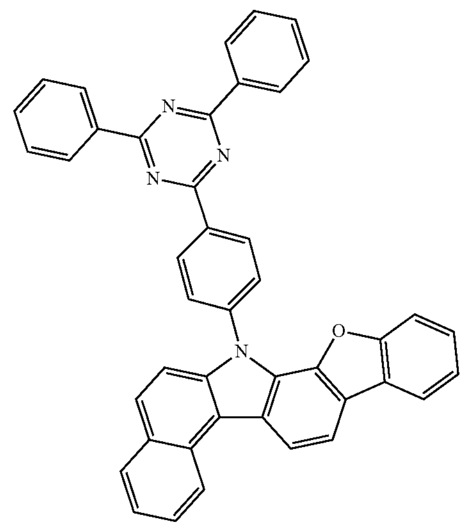
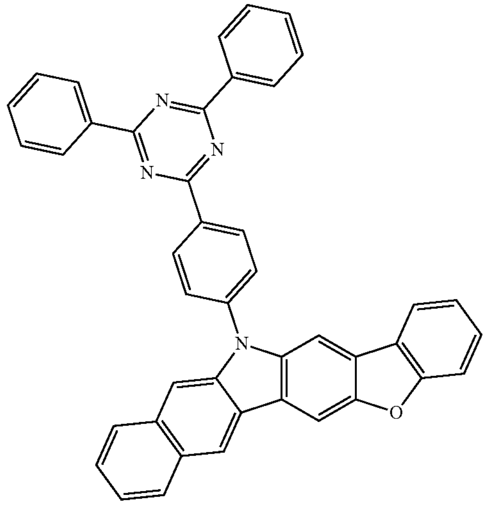
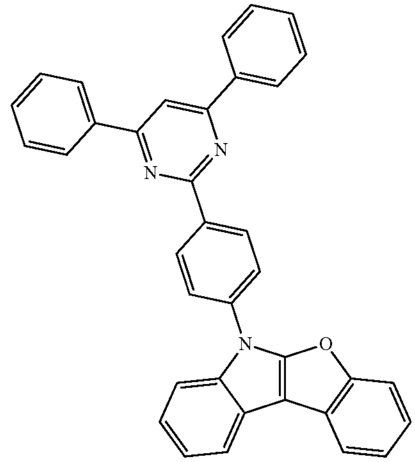

-continued
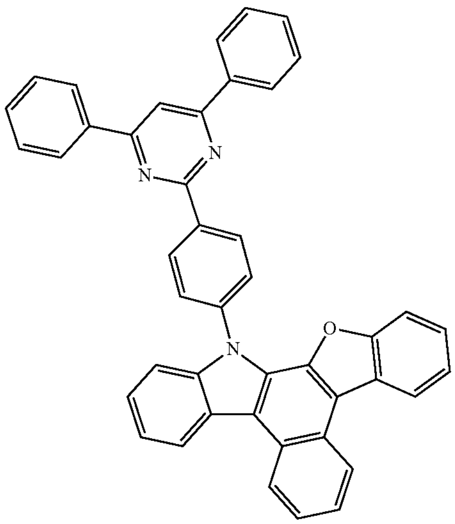
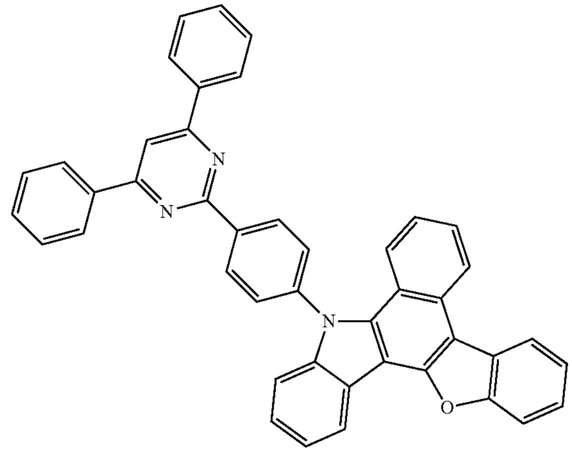
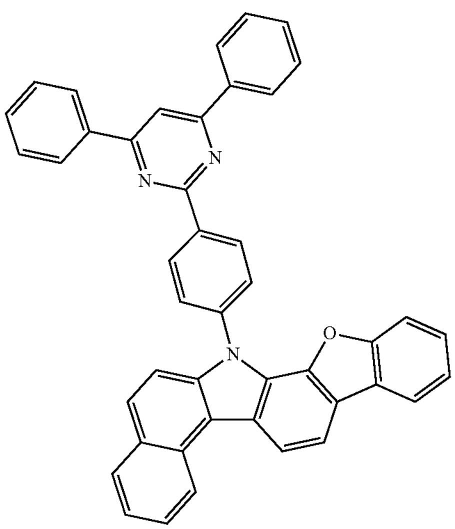
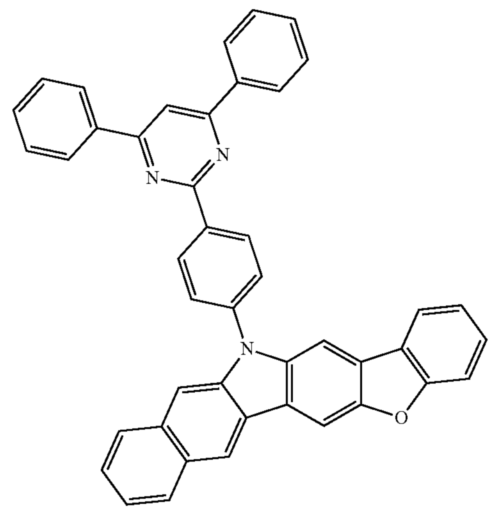
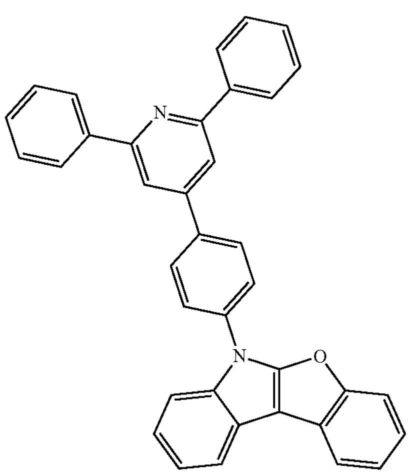
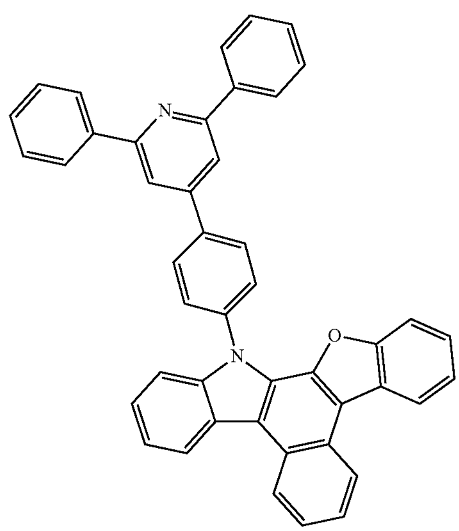

-continued
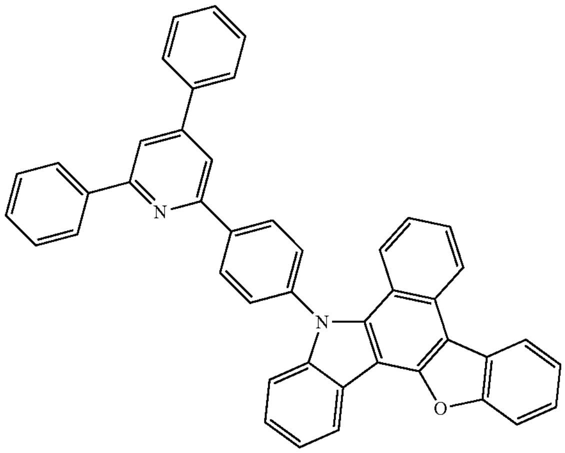
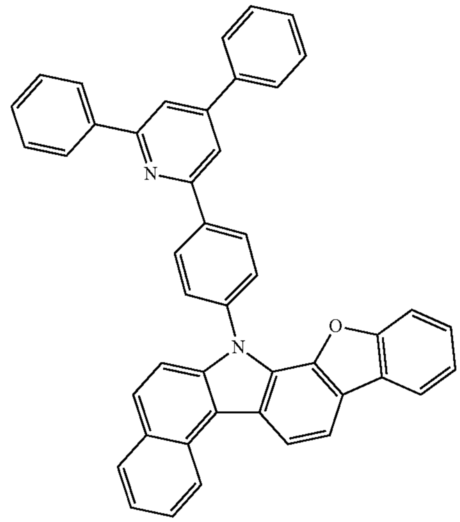
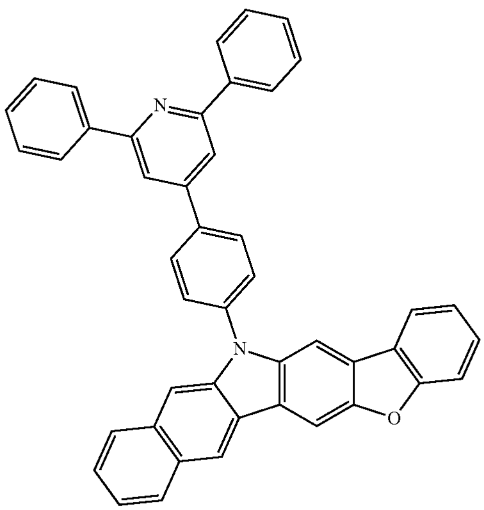
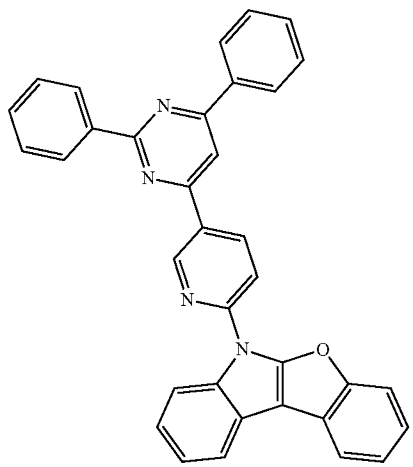
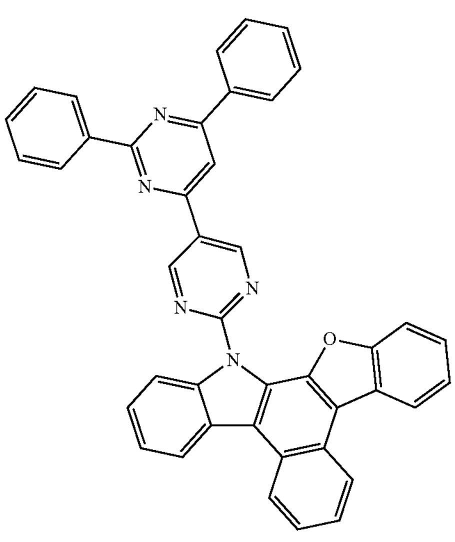
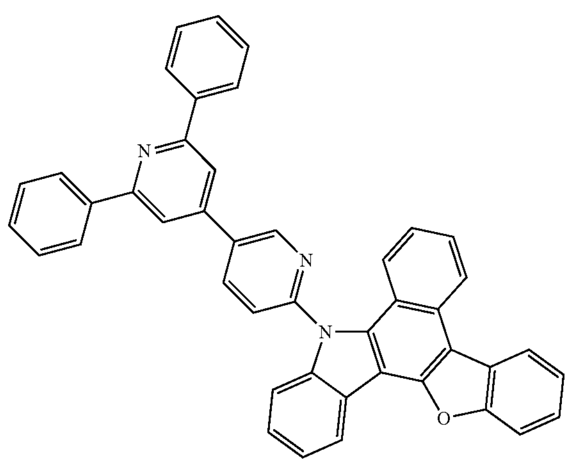

-continued
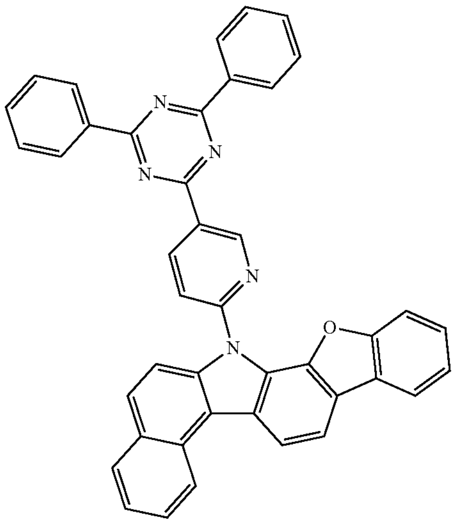
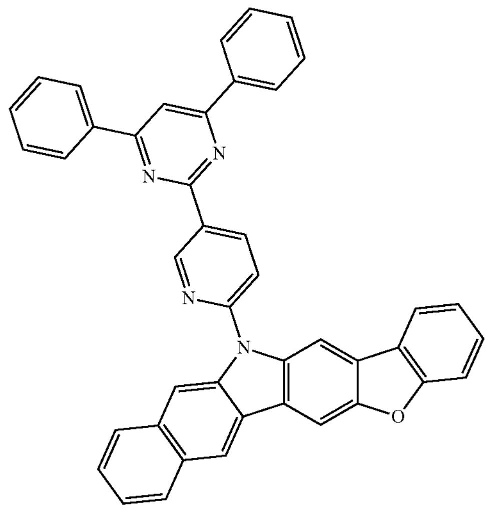
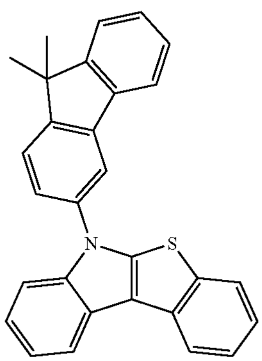
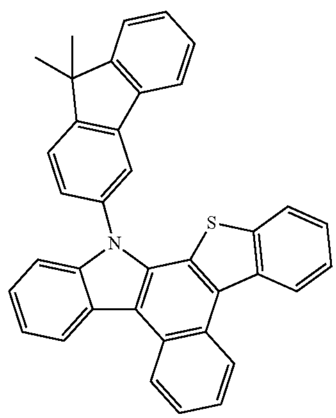
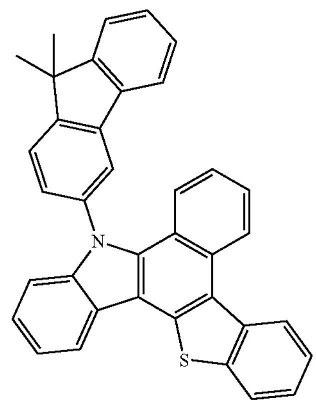
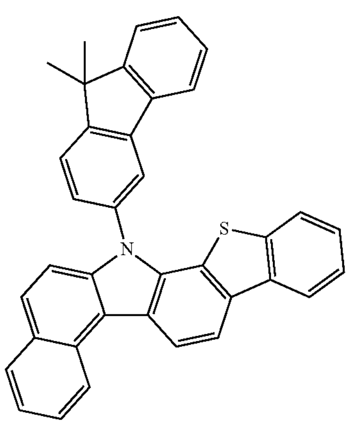
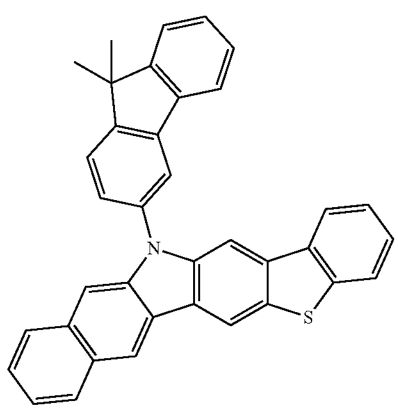
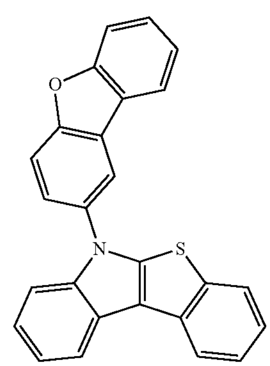

-continued
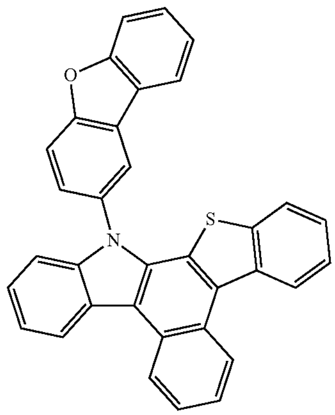
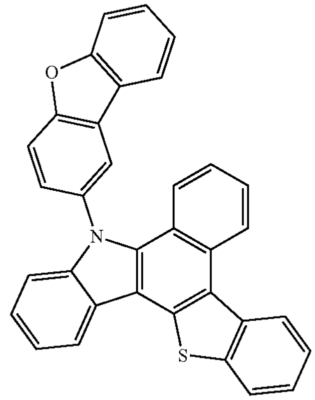
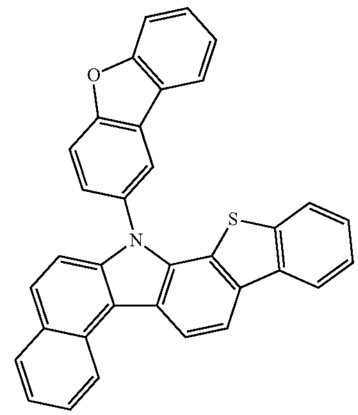
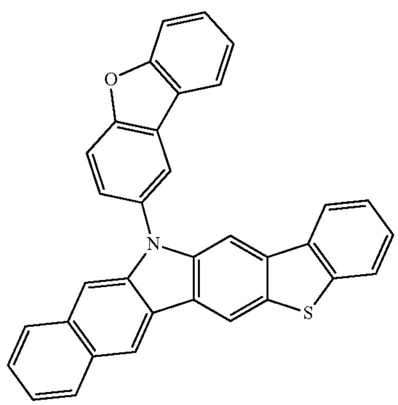
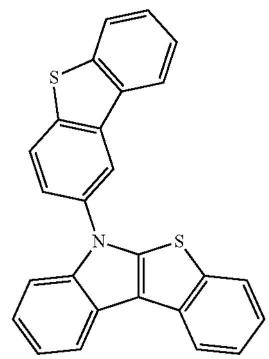
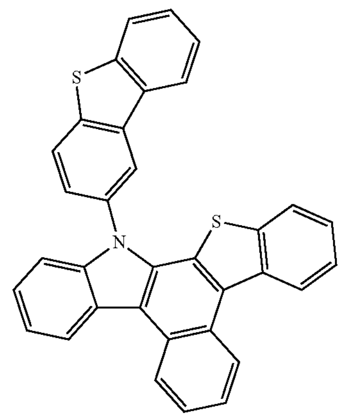
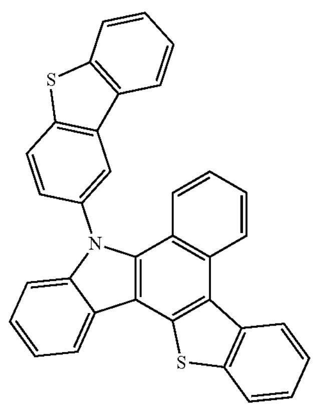
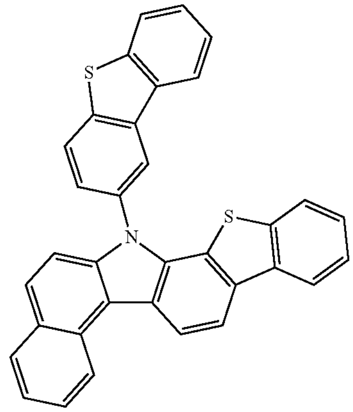
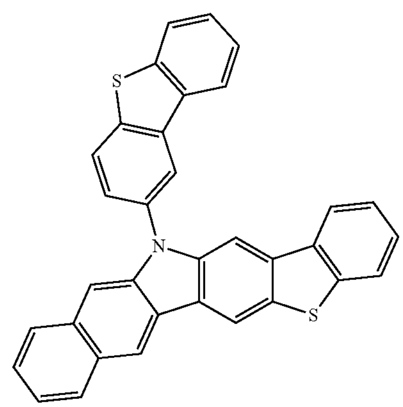
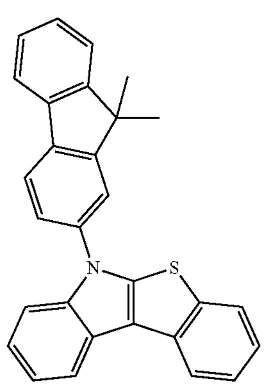
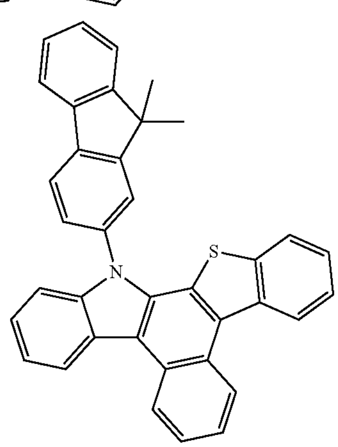
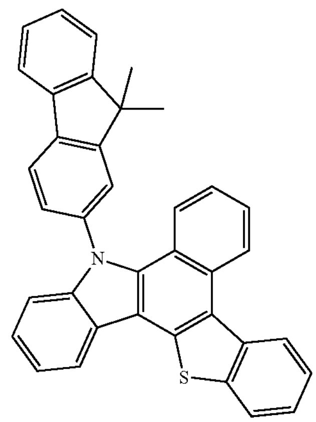

-continued
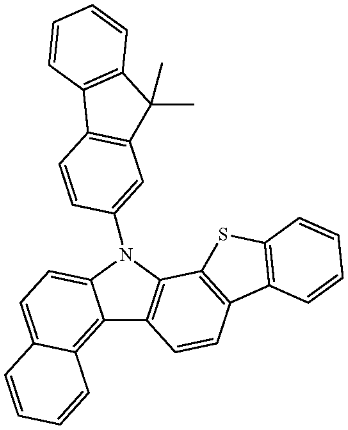
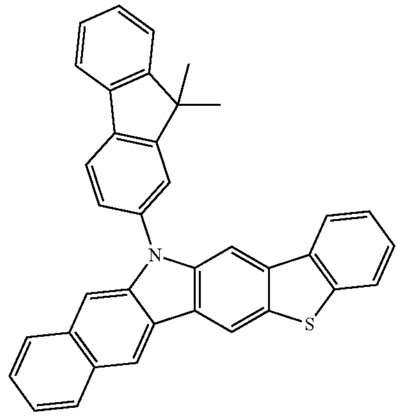
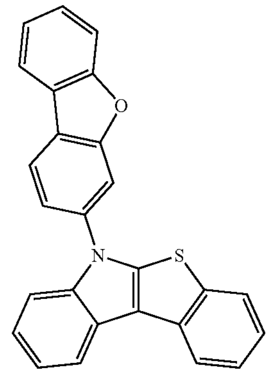
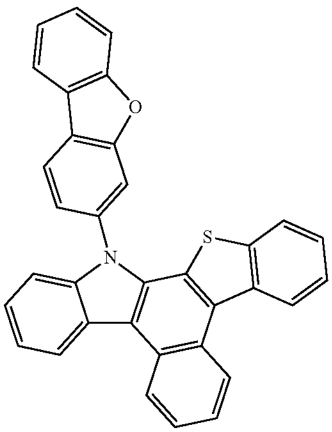
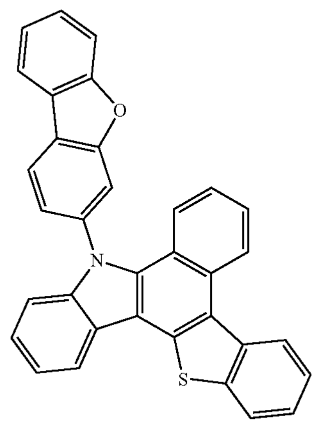
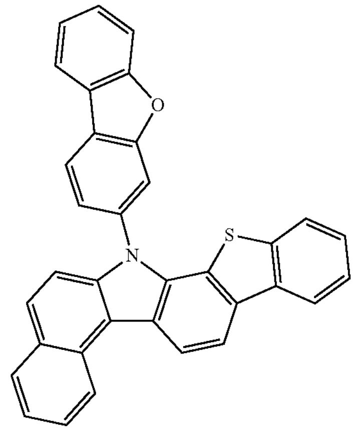
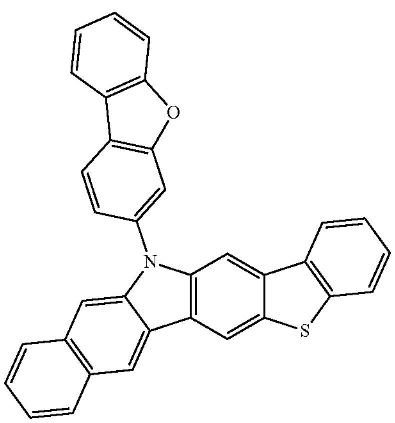
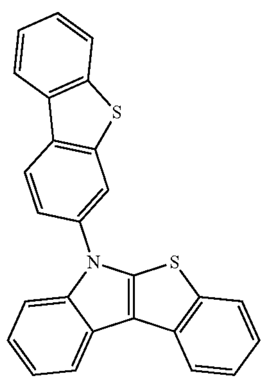
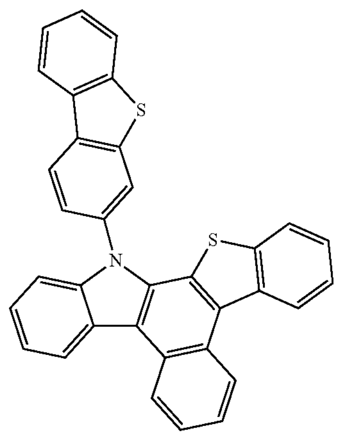
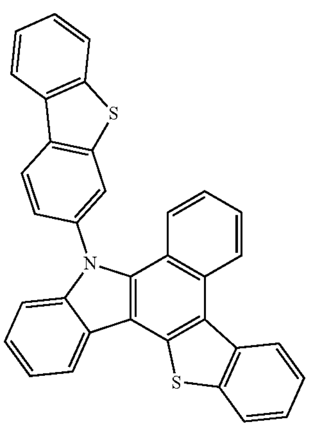
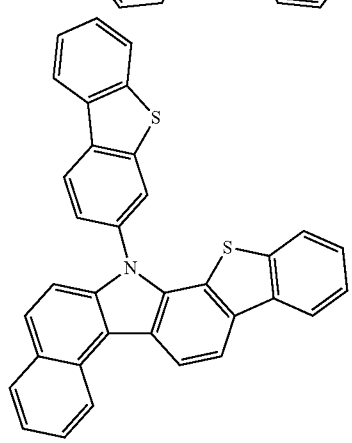
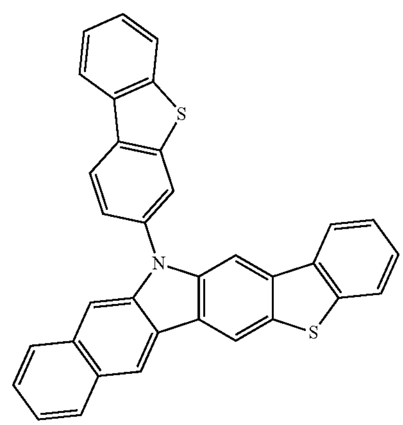

-continued
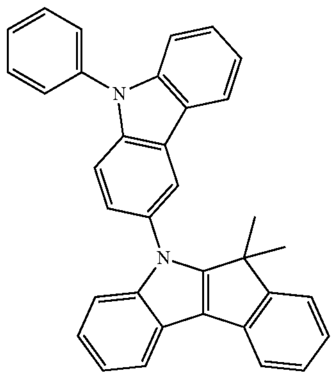
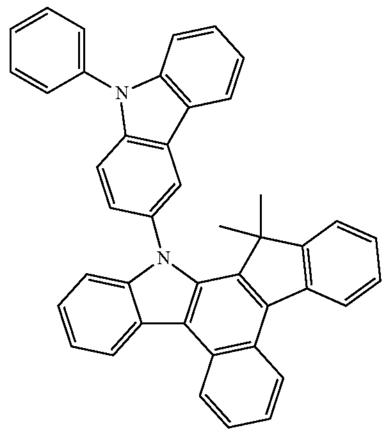
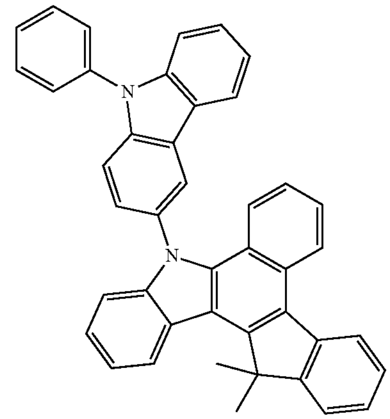
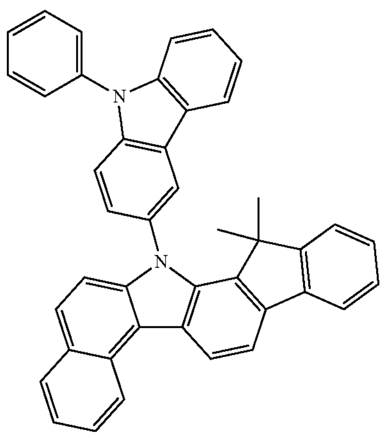
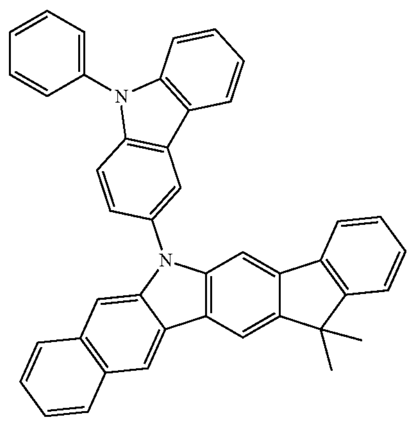
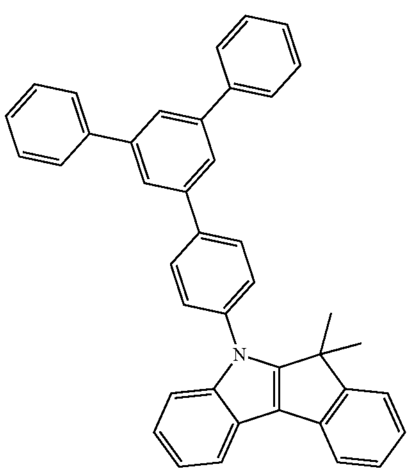
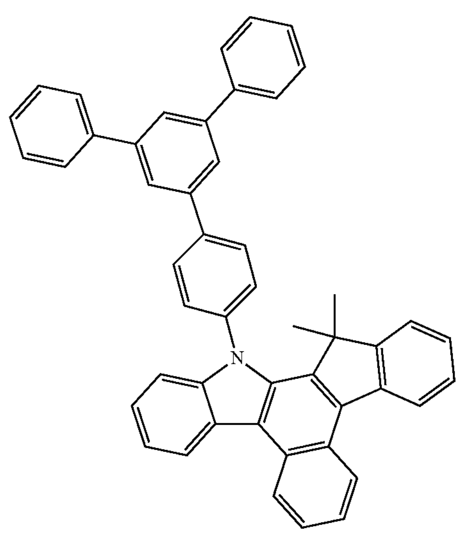

-continued
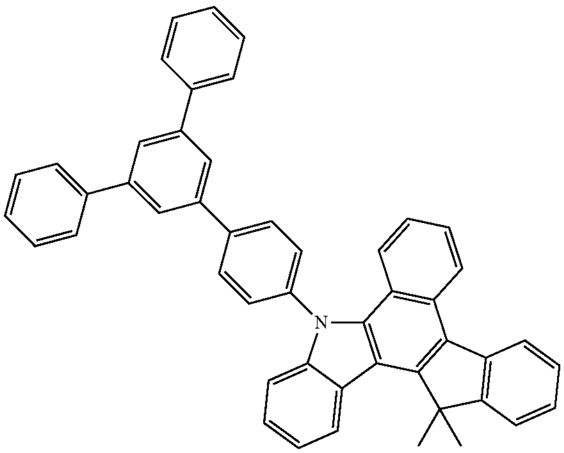
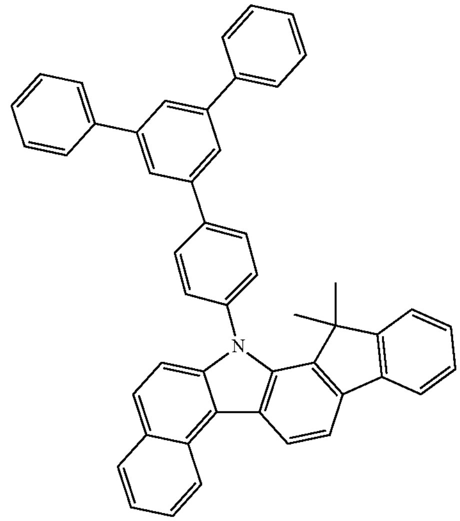
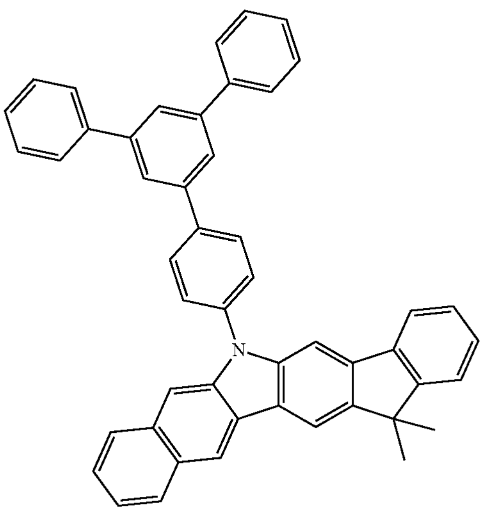
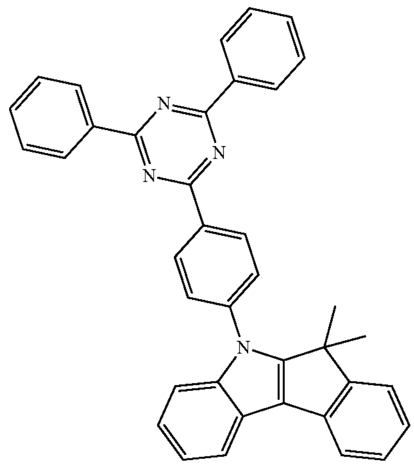
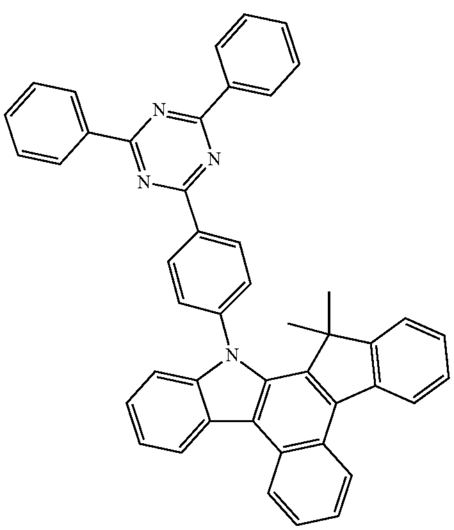
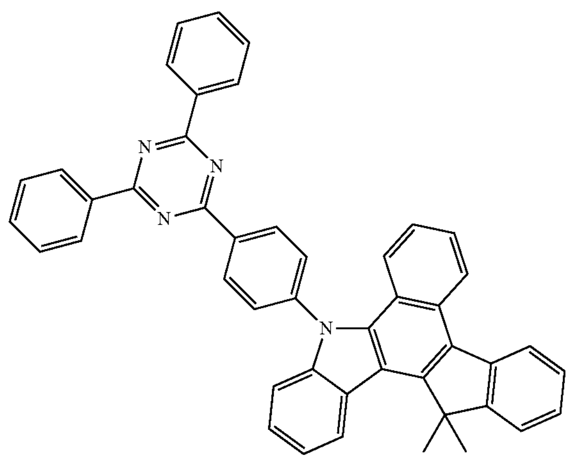

-continued
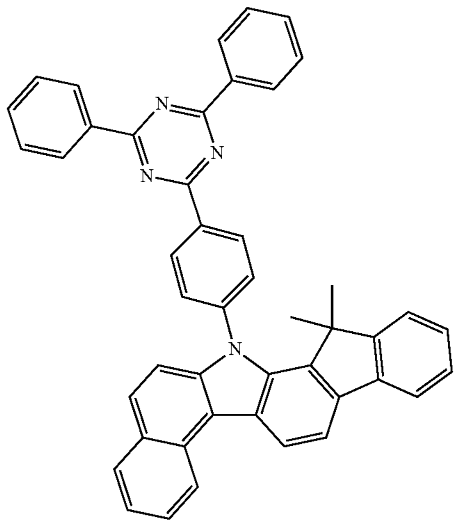
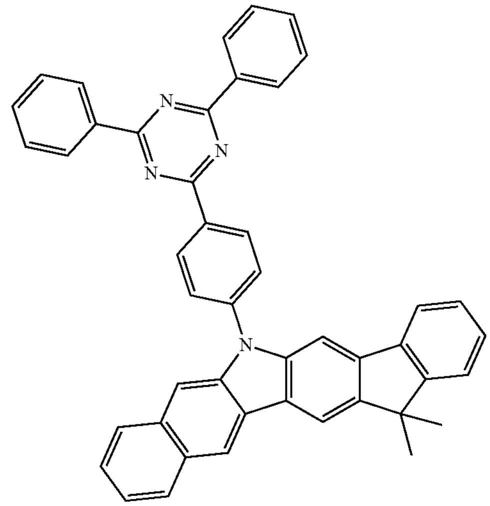
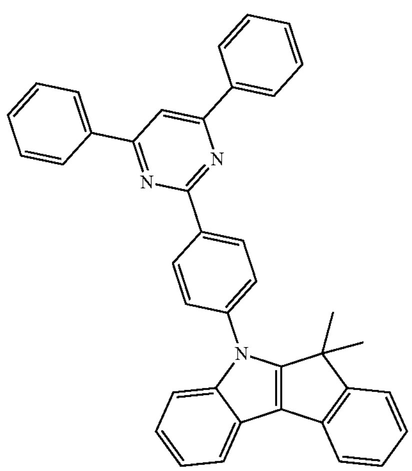
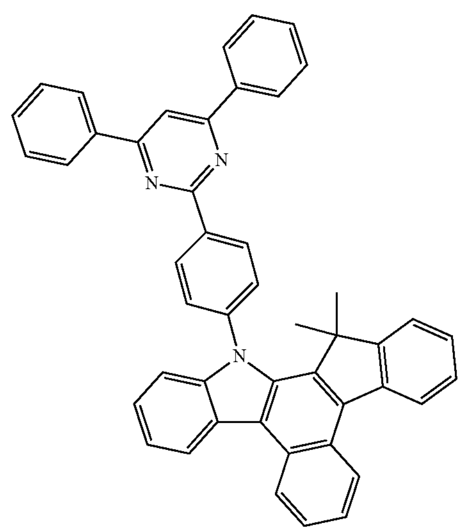
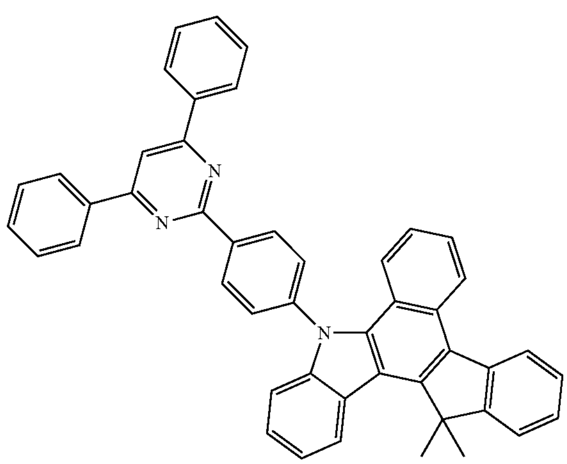
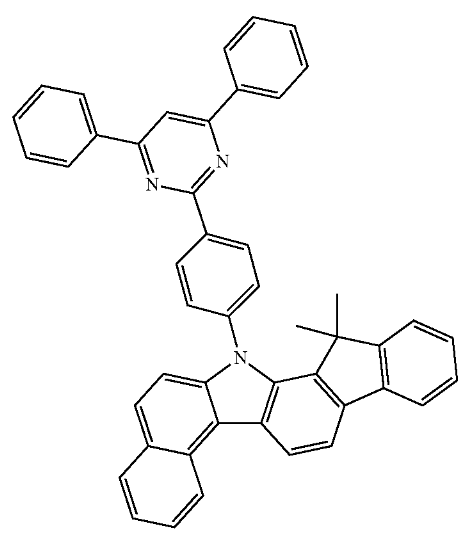

-continued
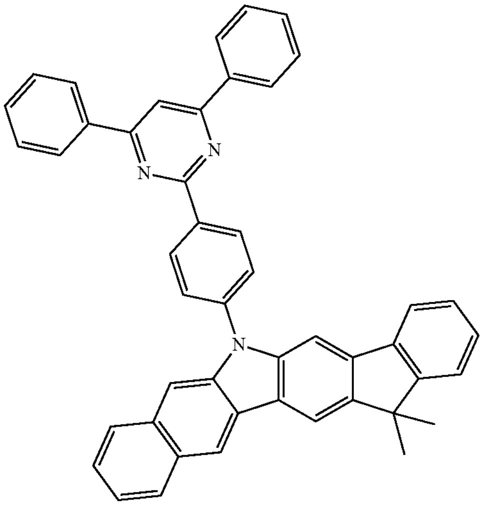
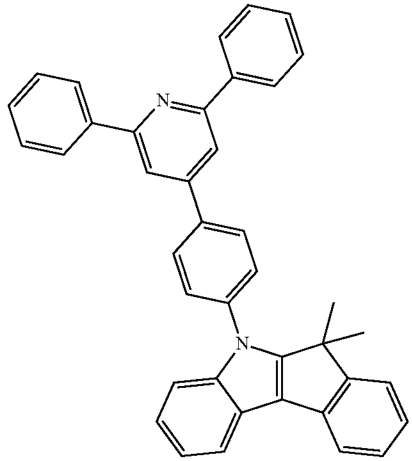
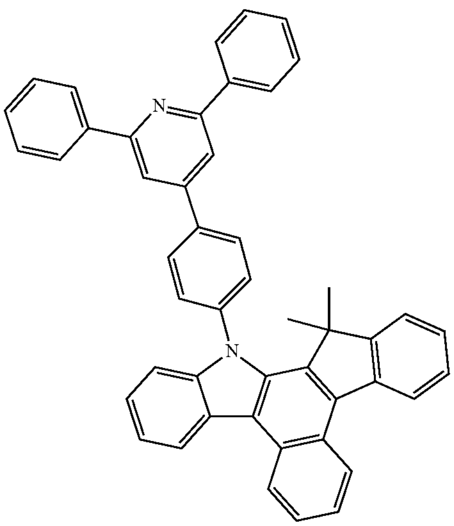
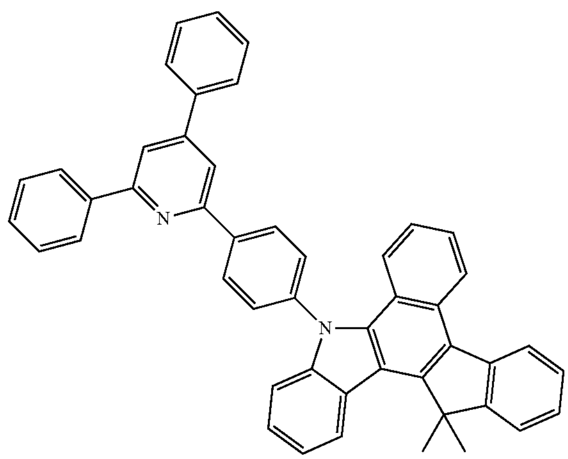
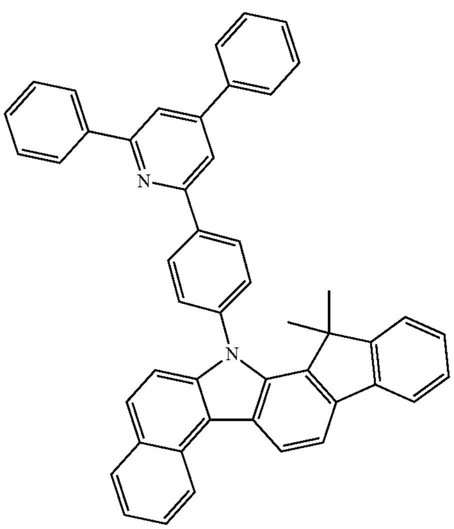
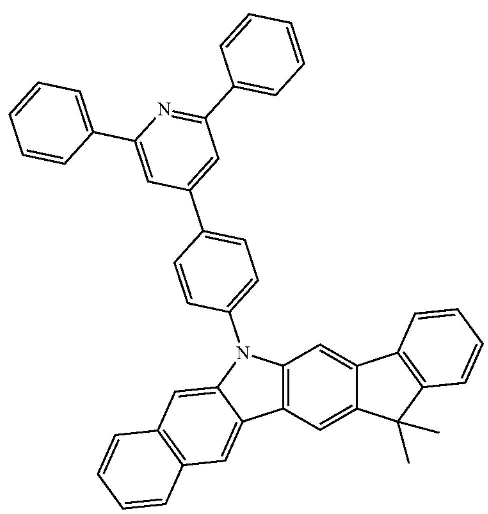

-continued
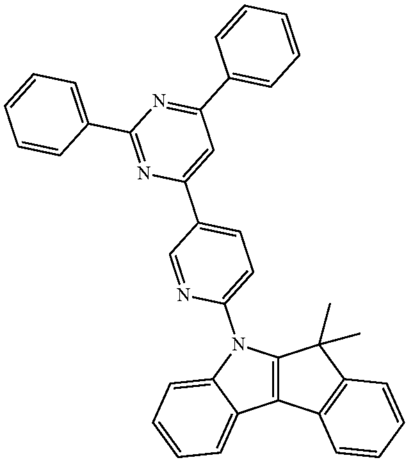
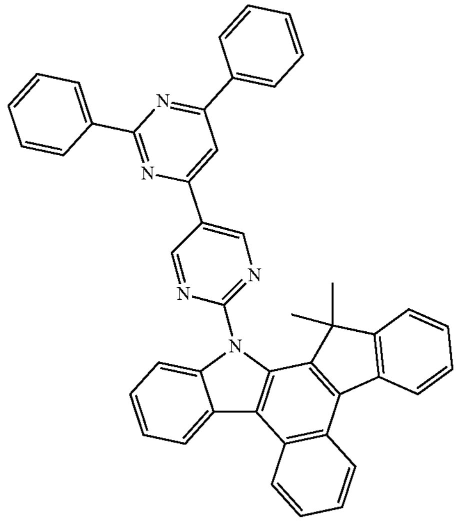
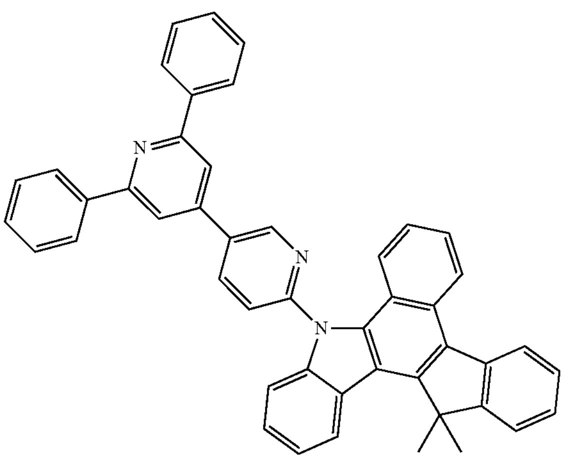
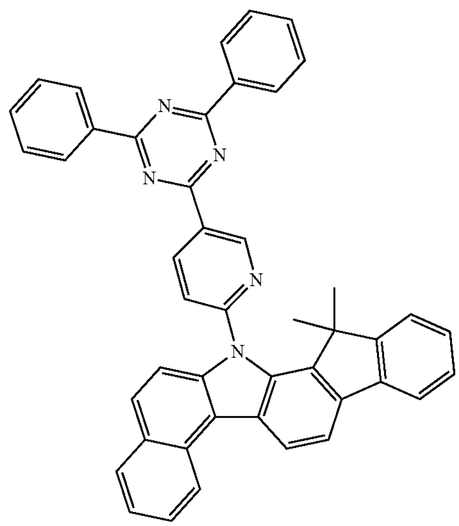
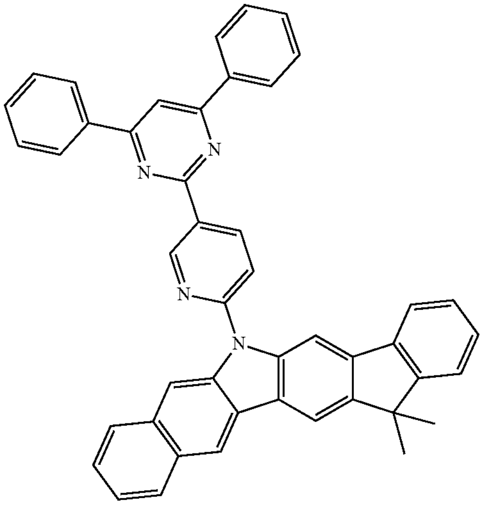
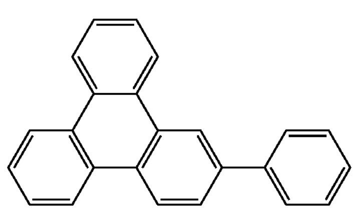

-continued
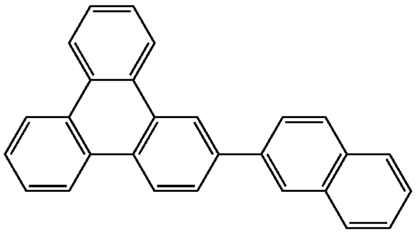
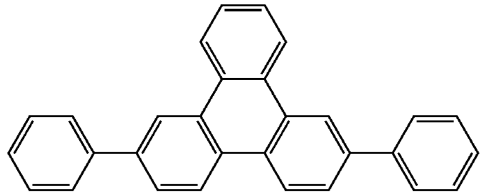
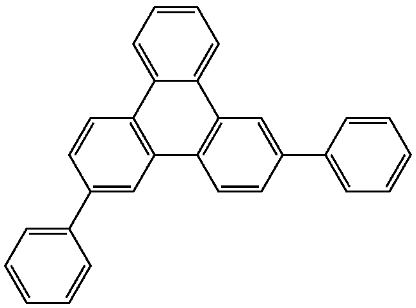
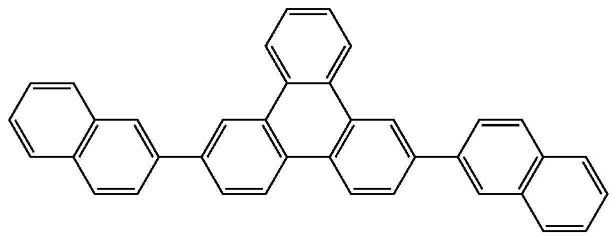
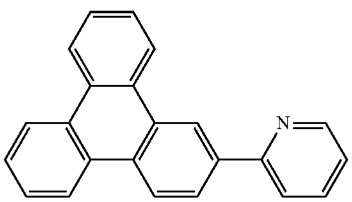
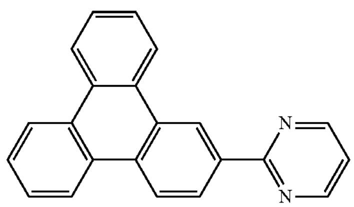
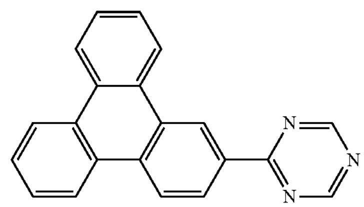
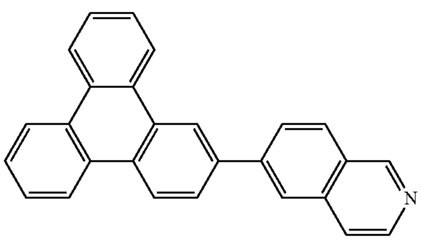
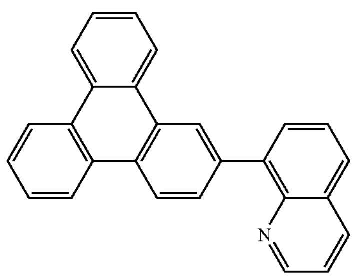
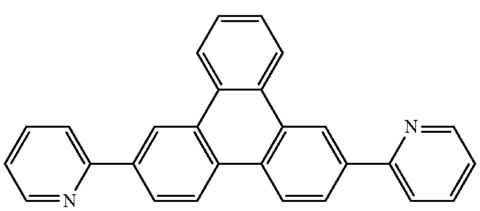
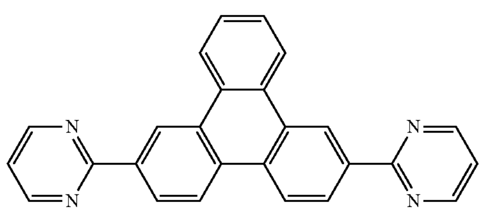
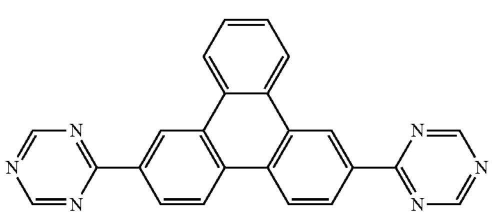
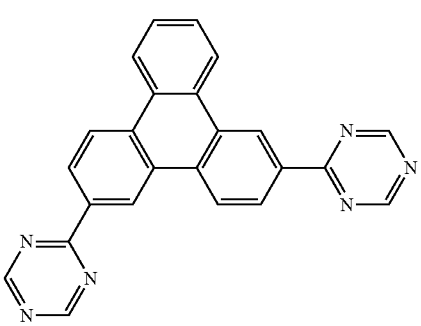

-continued
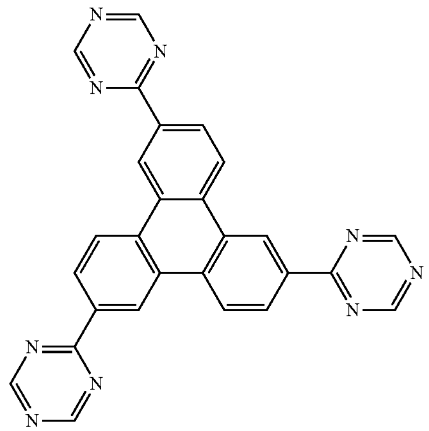
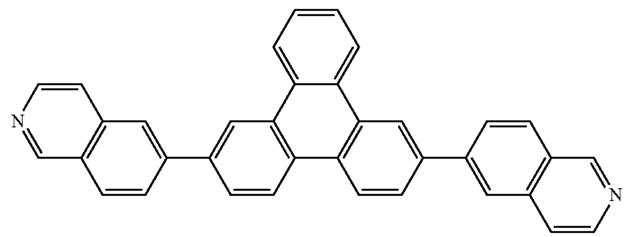
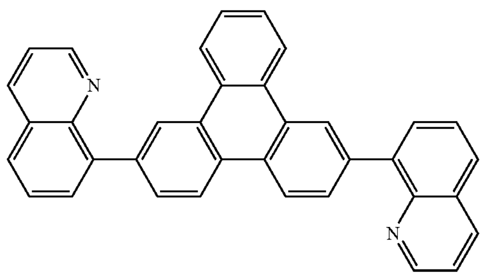
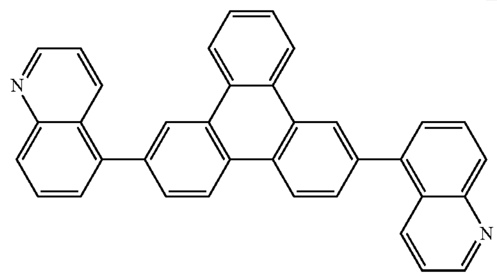
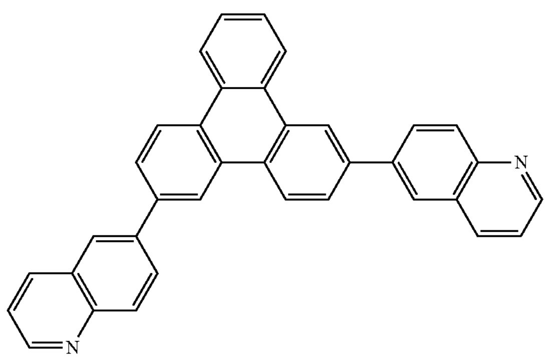
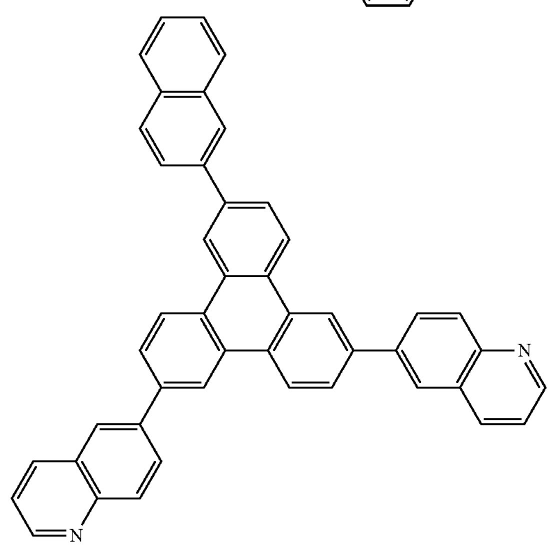
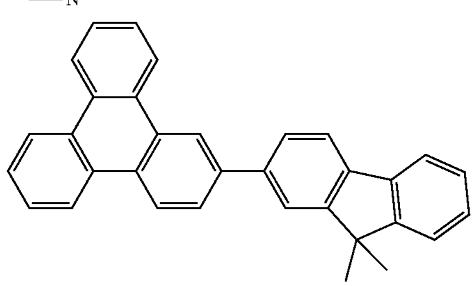
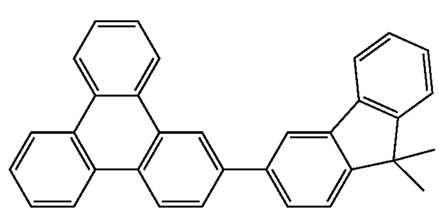
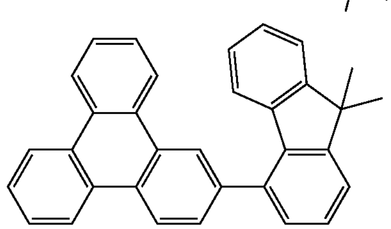
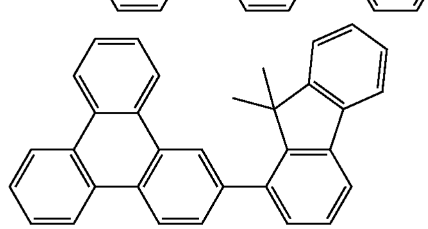

-continued
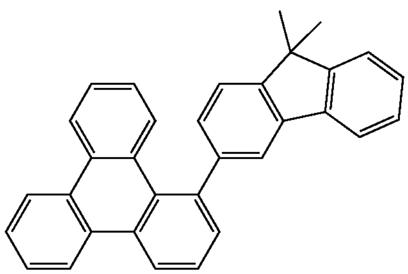
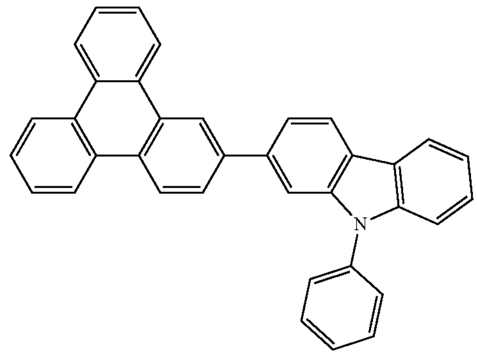
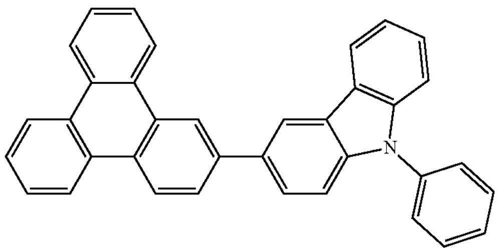
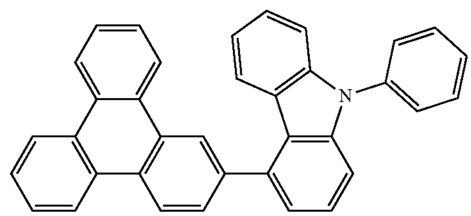
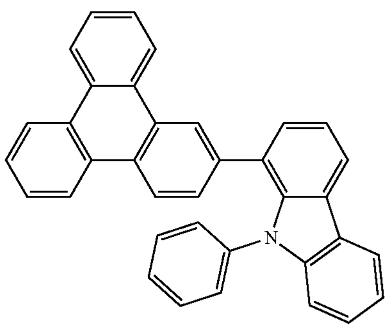
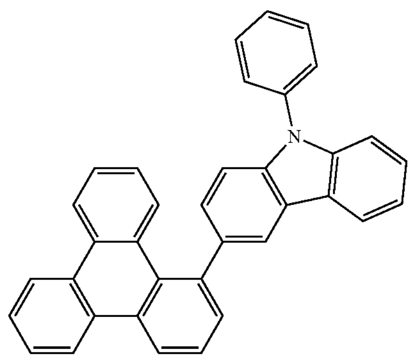
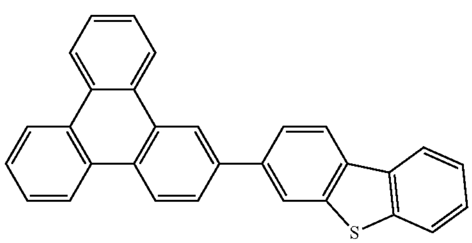
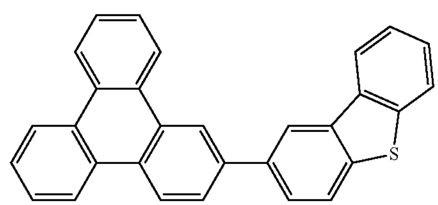
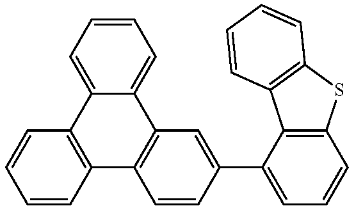
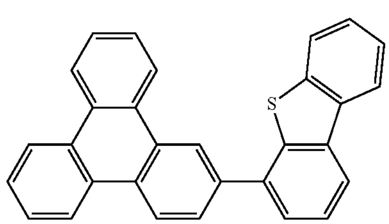
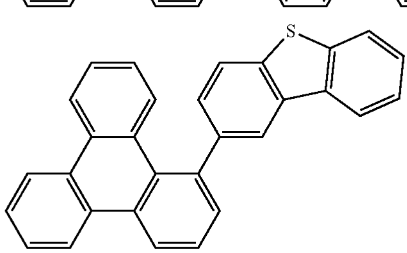
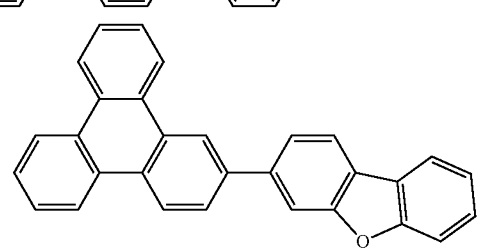

-continued
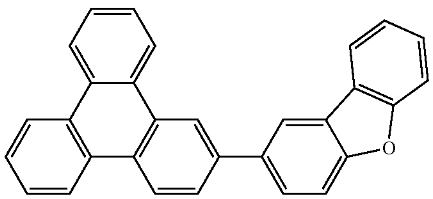
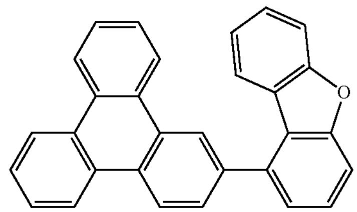
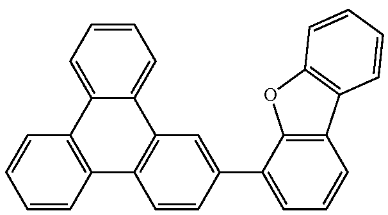
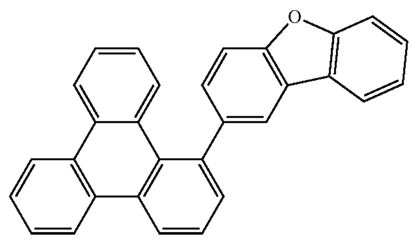
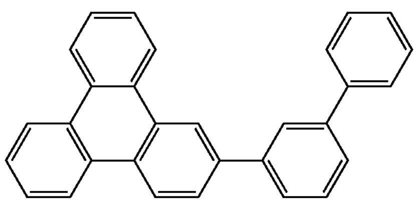
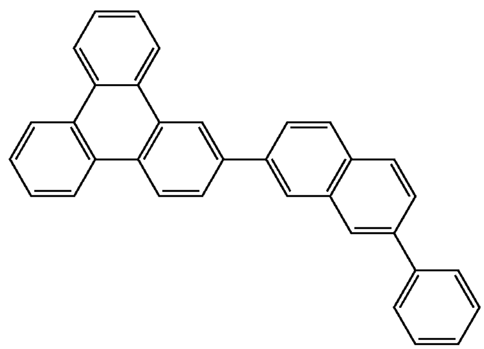
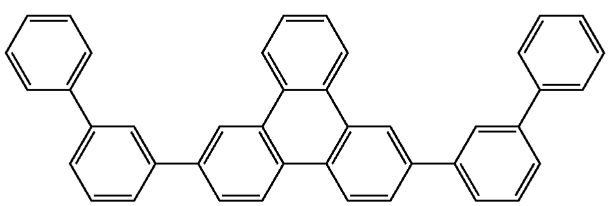
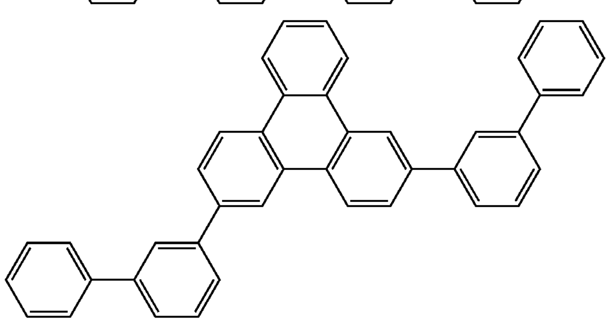
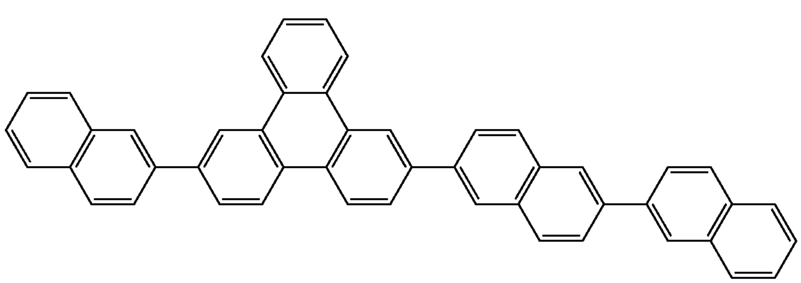

-continued
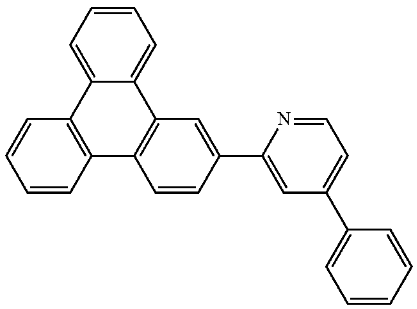
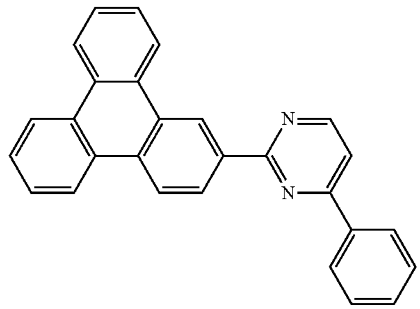
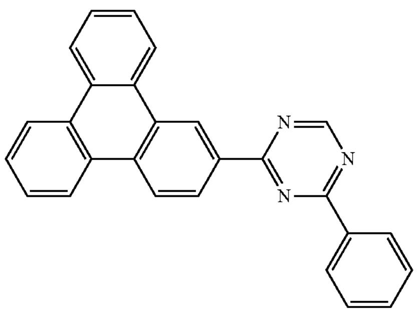
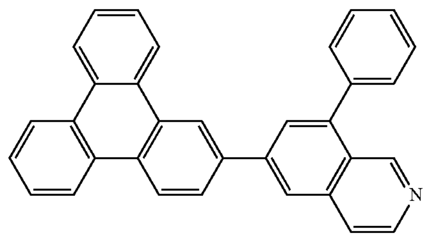
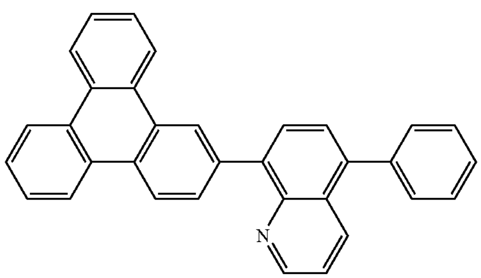
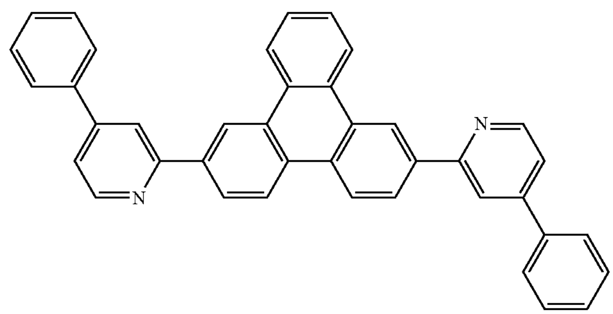
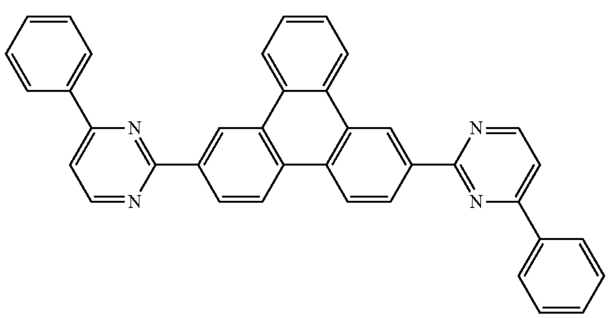
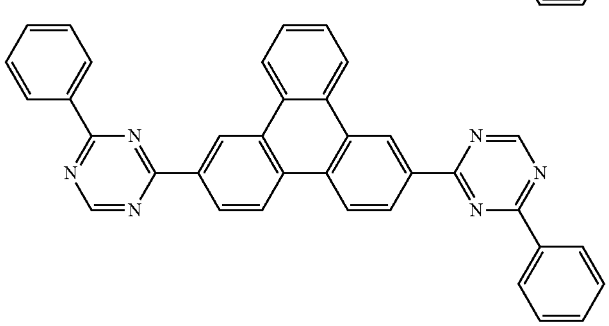

-continued
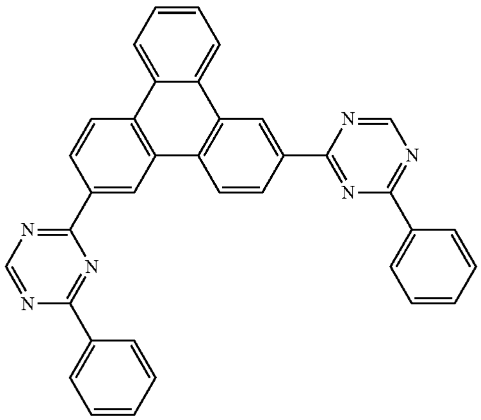
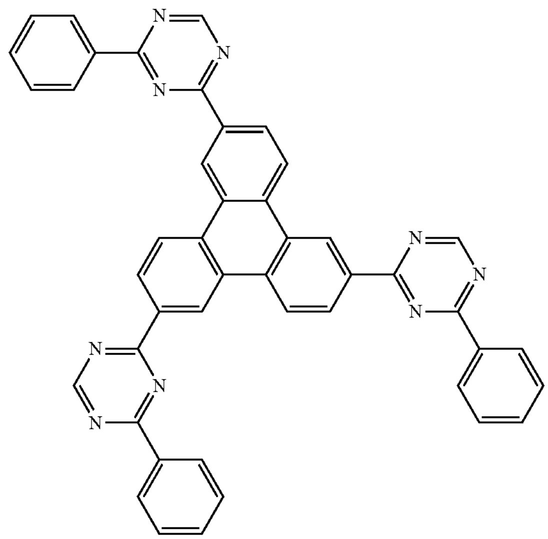
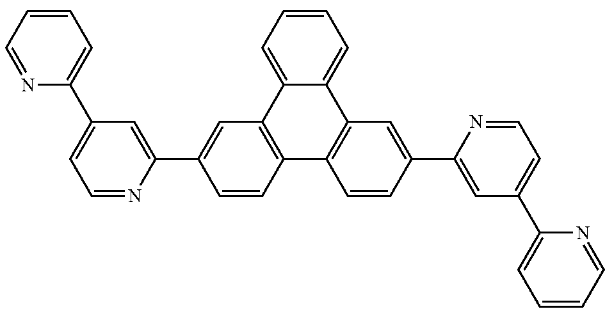
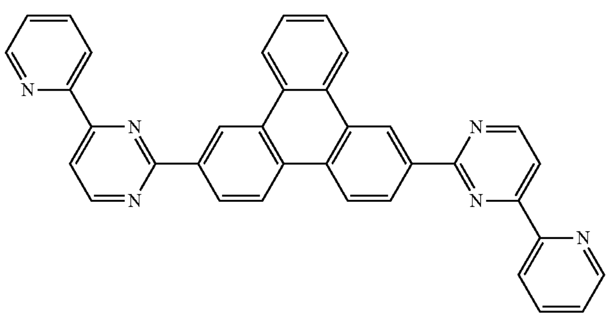
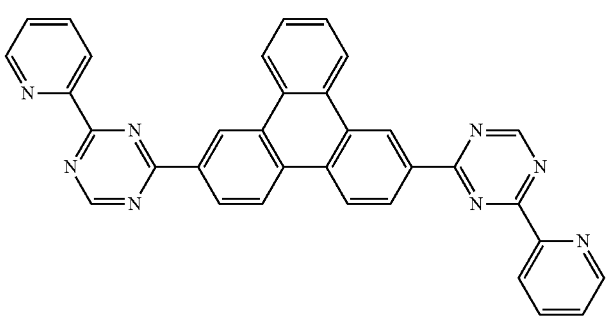

-continued
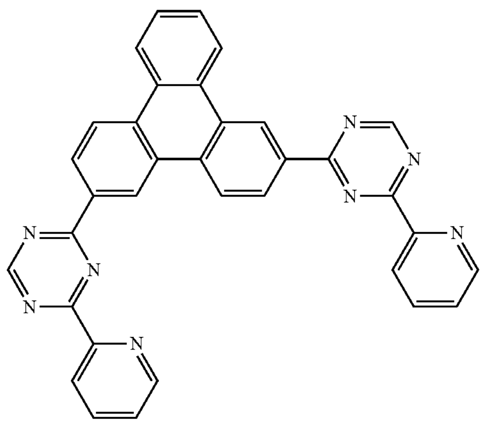
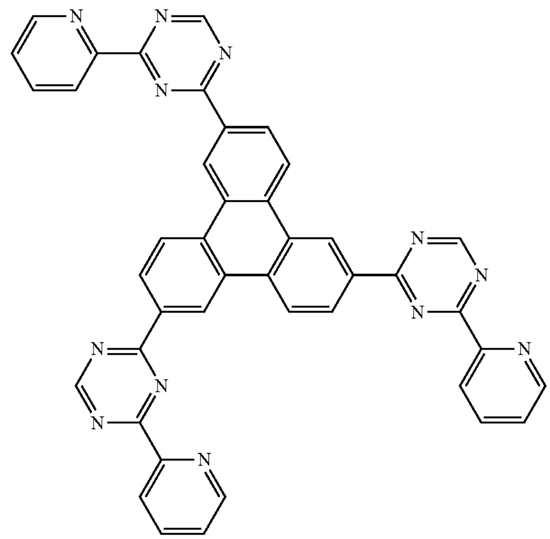
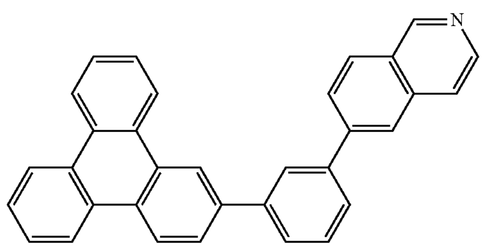
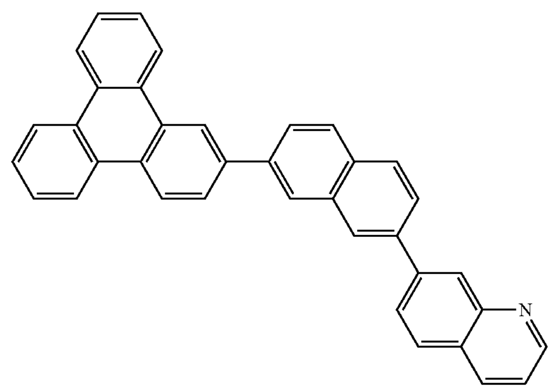
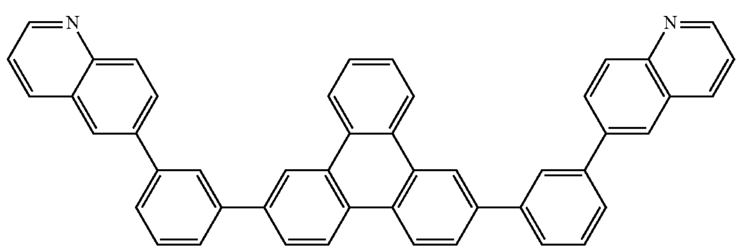
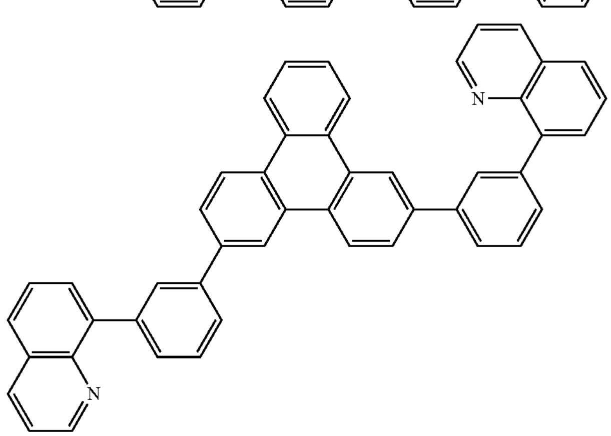

-continued
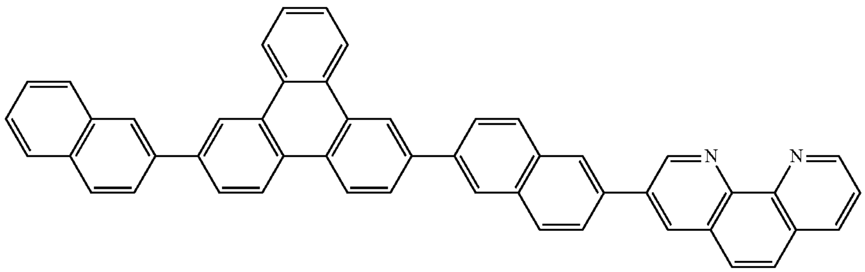
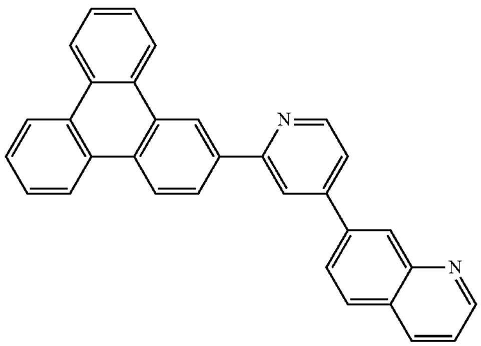
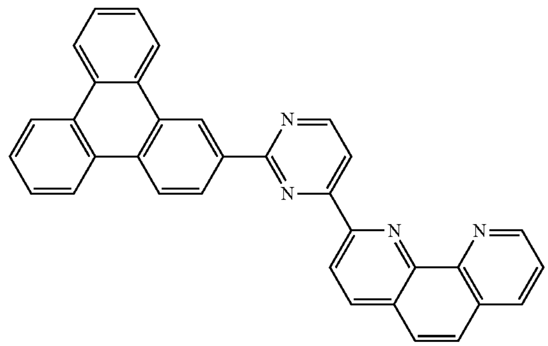
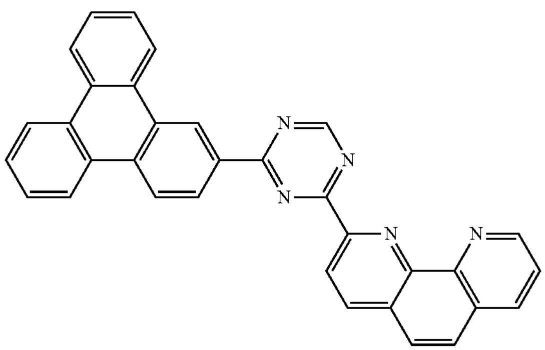
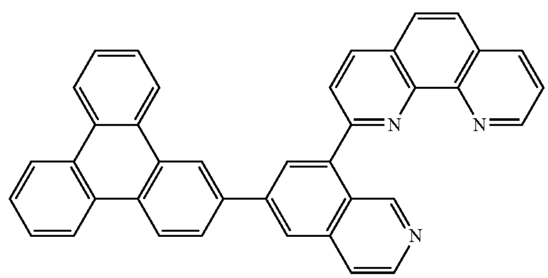
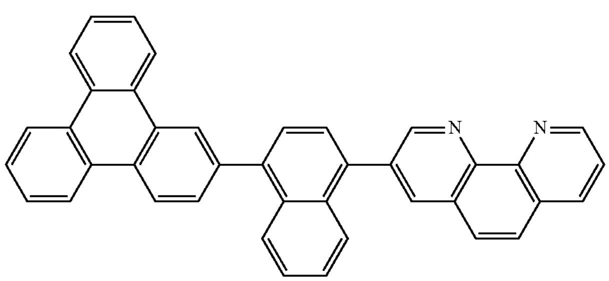
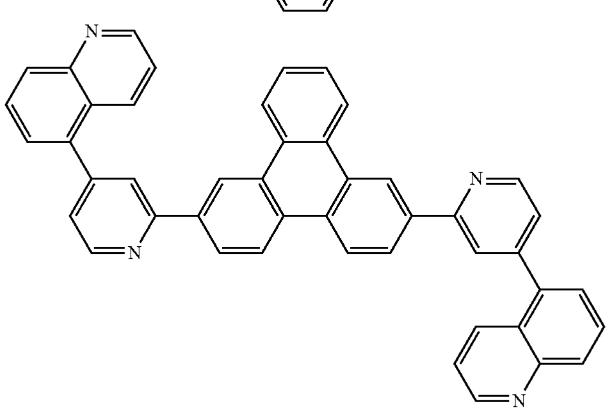

-continued
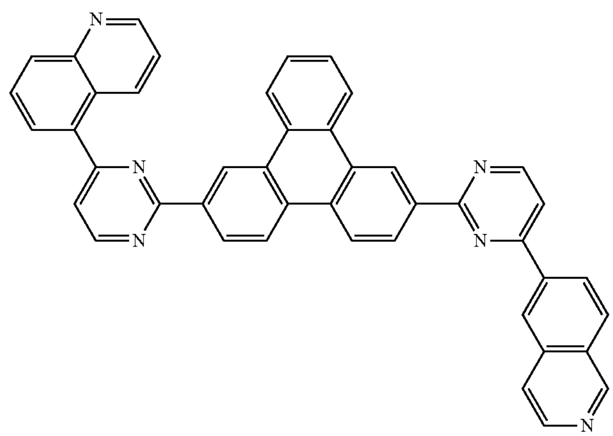
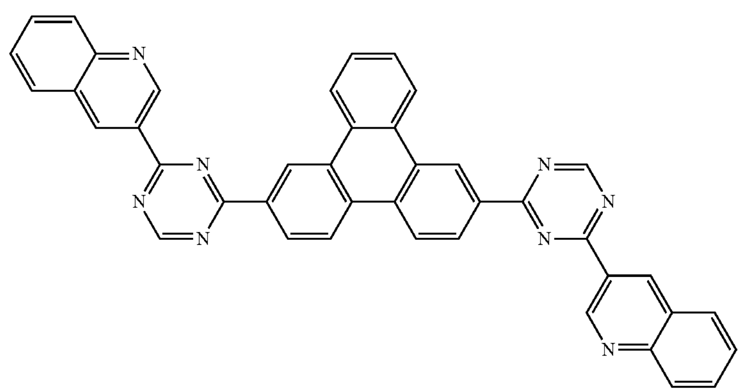
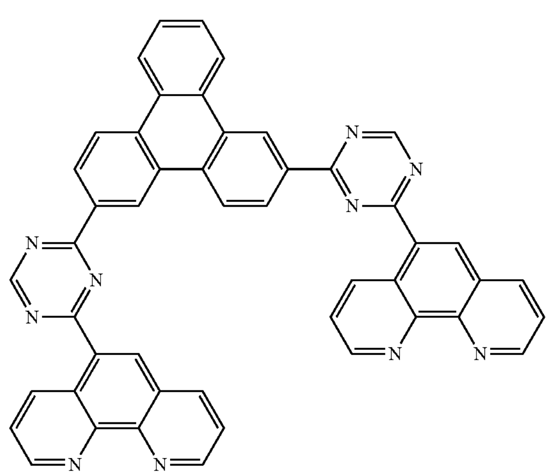

-continued
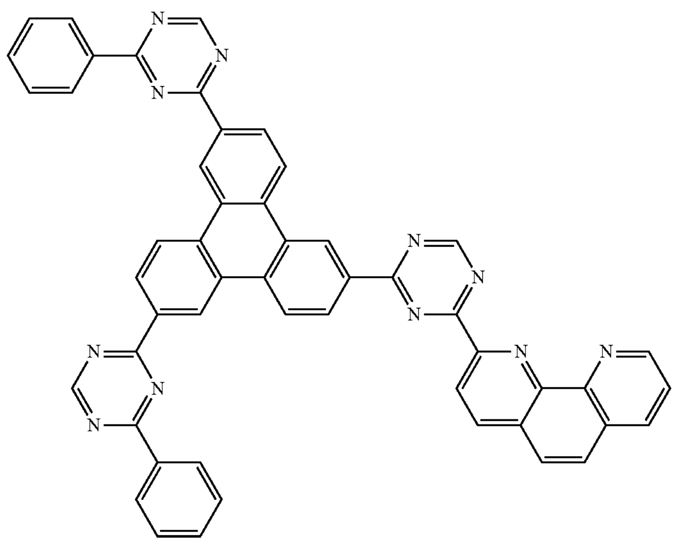
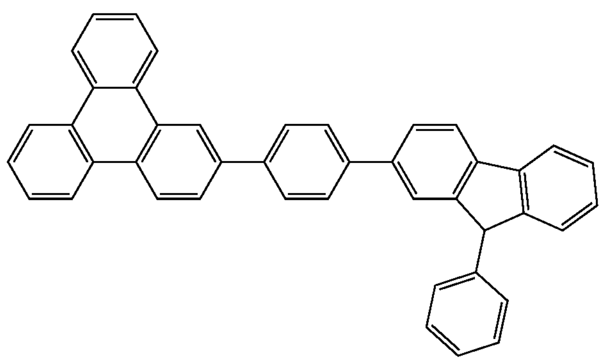
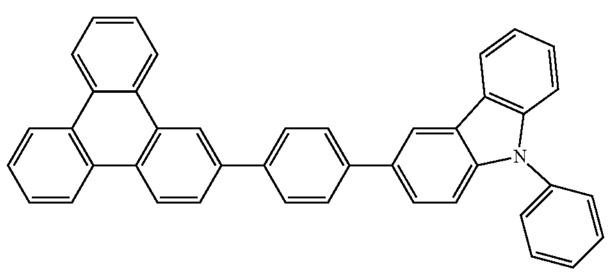
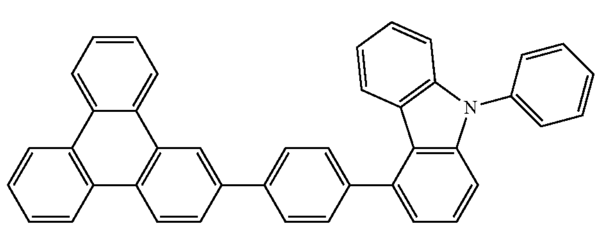
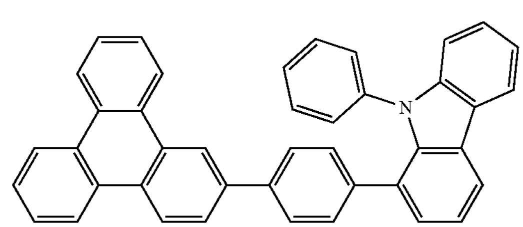

-continued
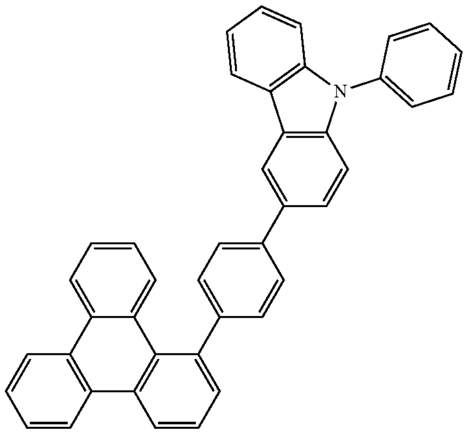
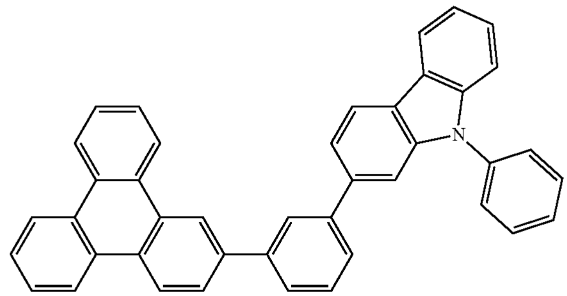
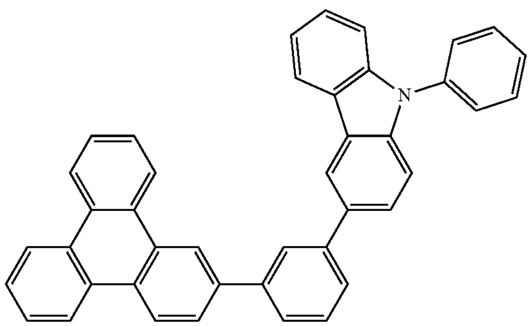
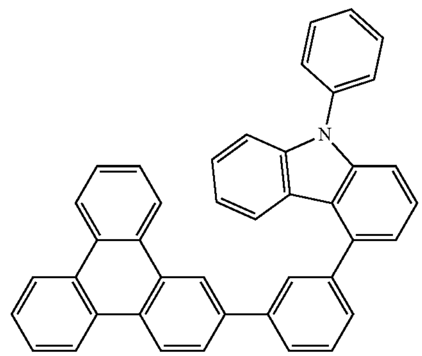
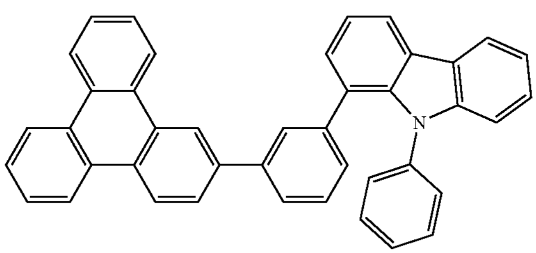
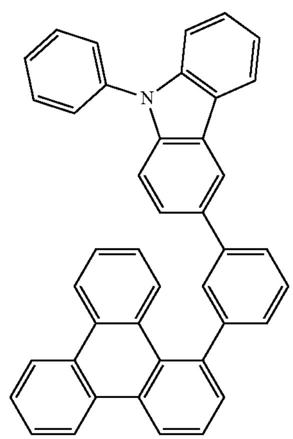
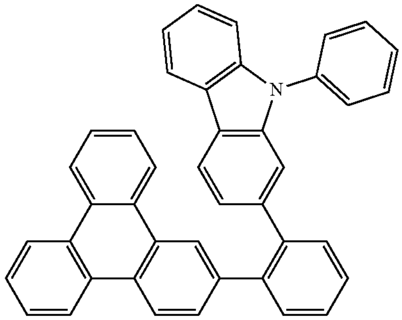
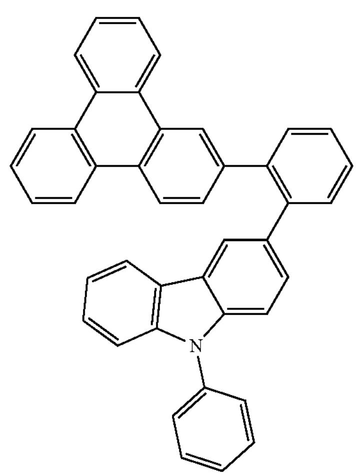

-continued
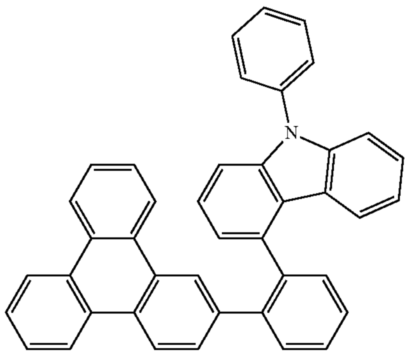
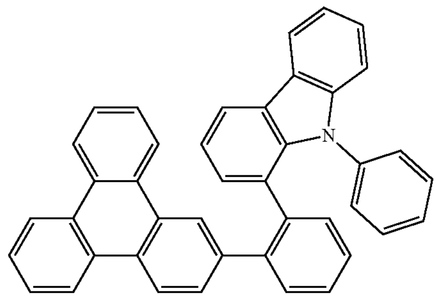
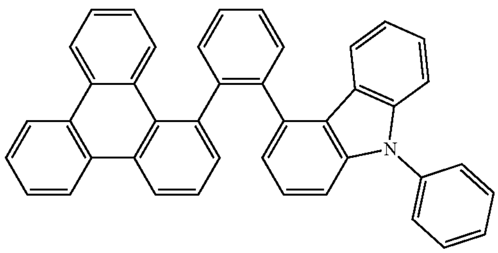
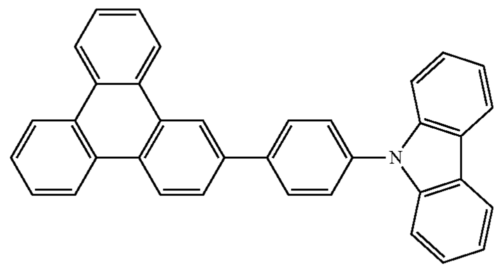
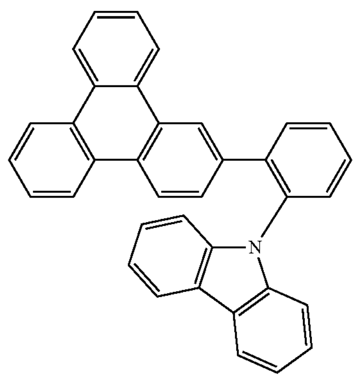
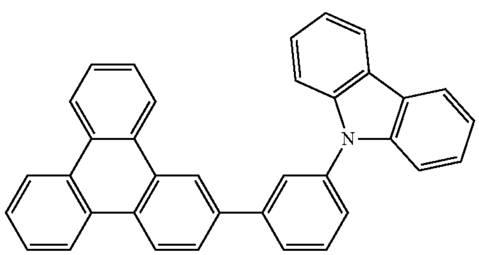
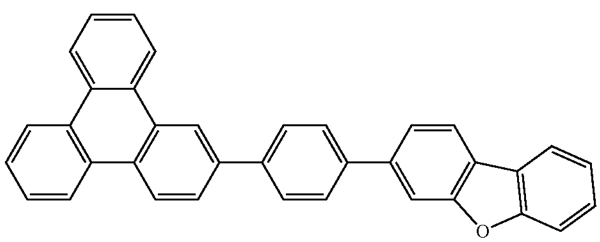
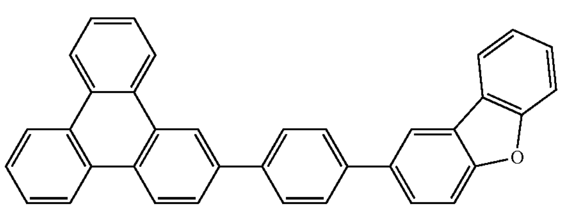
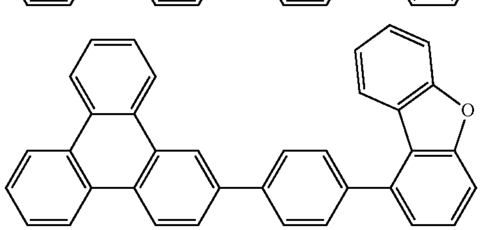
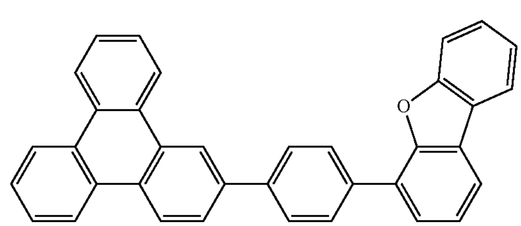

-continued
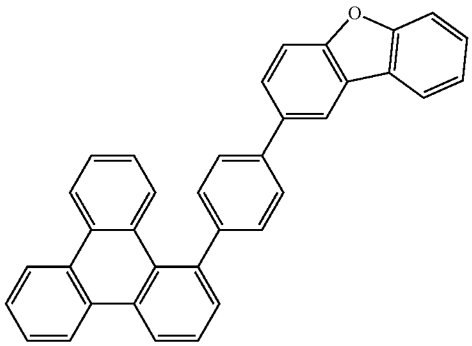
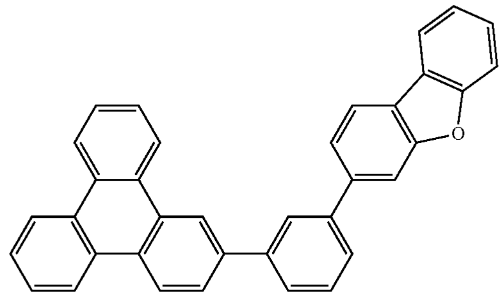
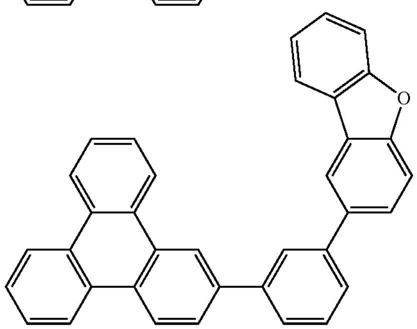
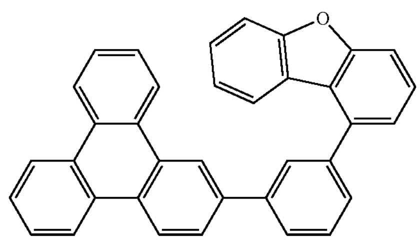
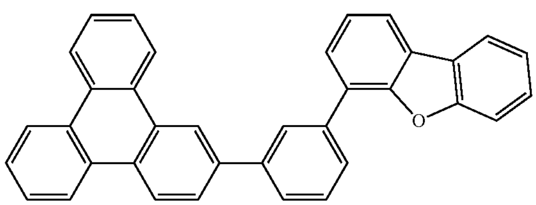
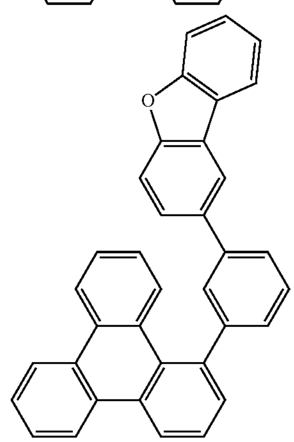
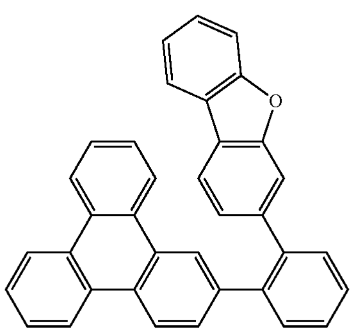
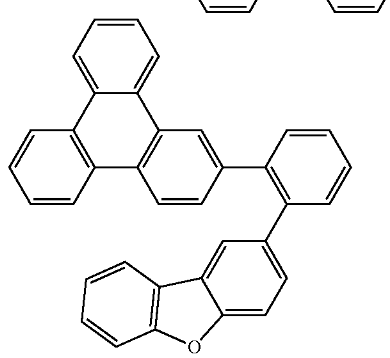
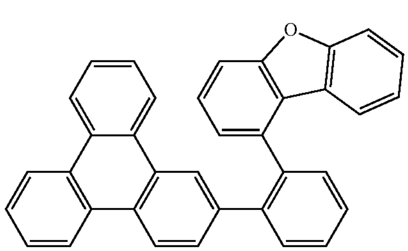
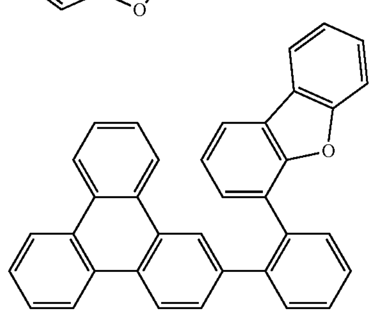

-continued
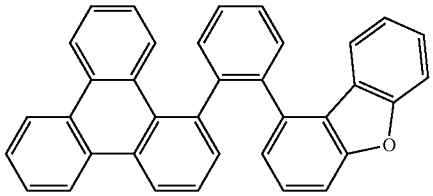
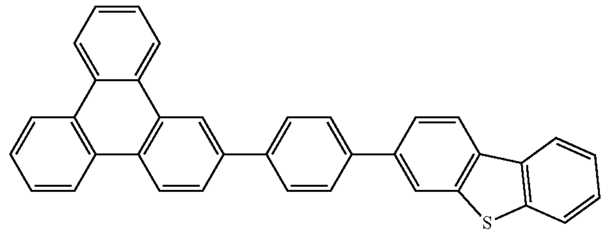
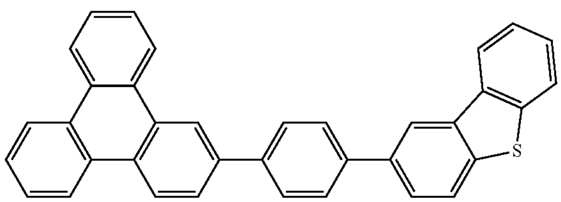
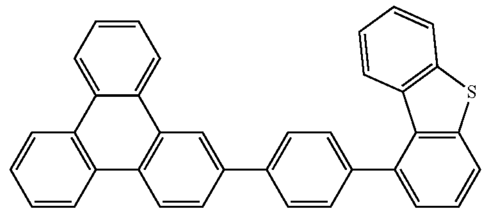
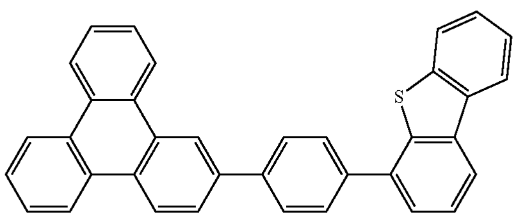
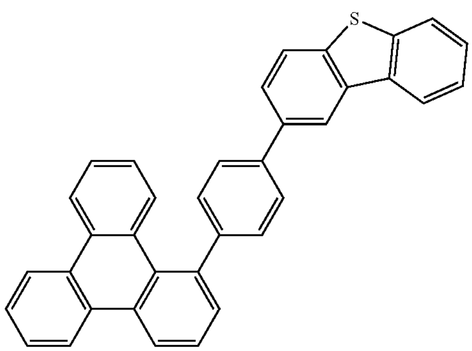
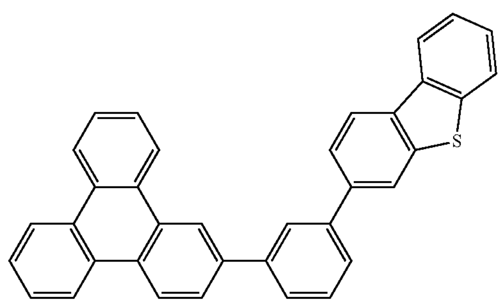
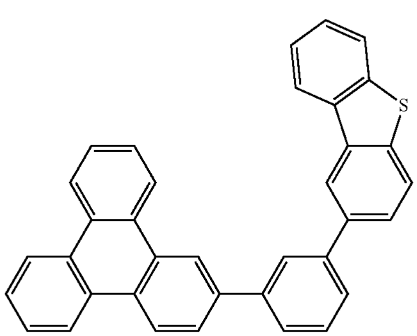
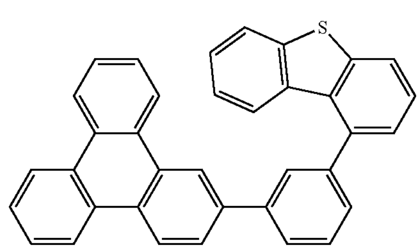

-continued
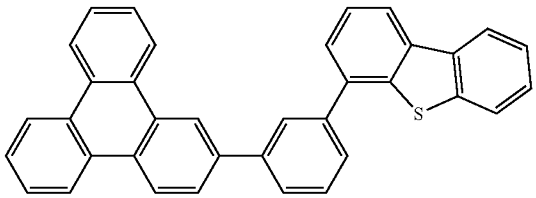
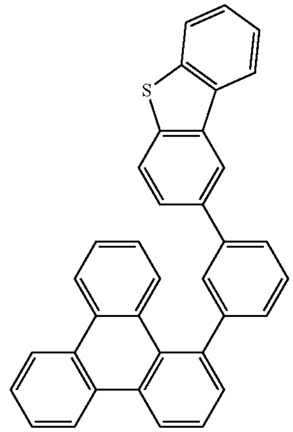
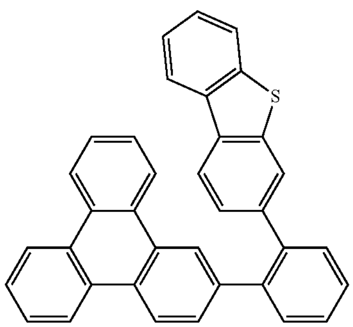
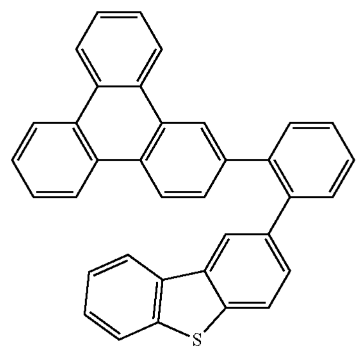
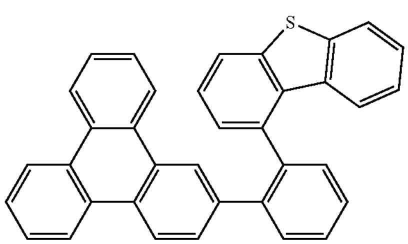
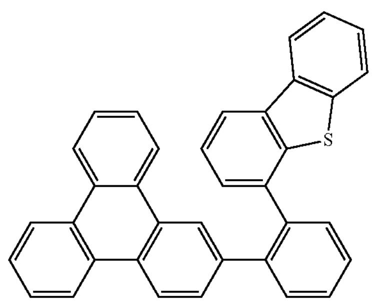
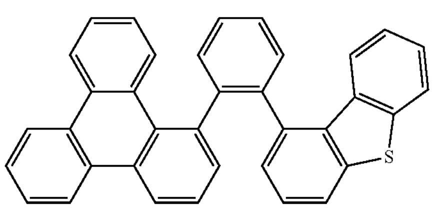
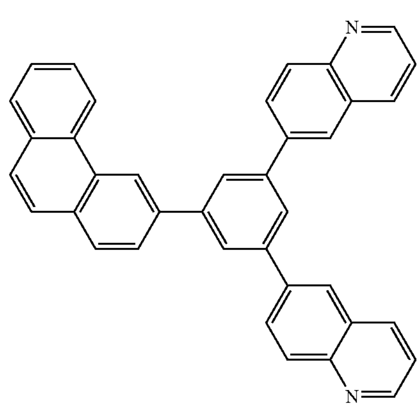

-continued
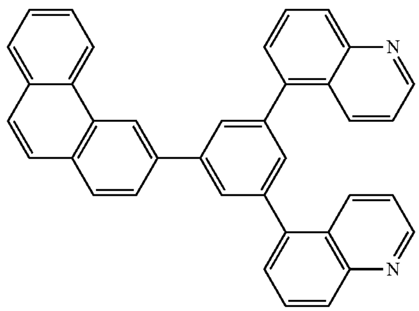
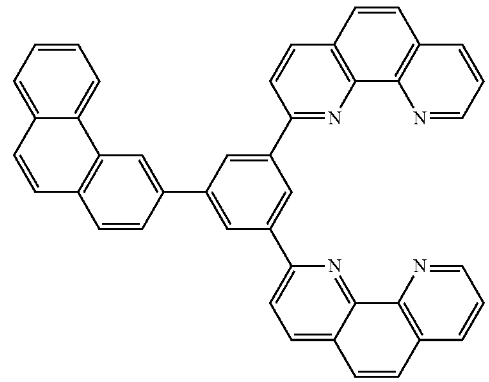
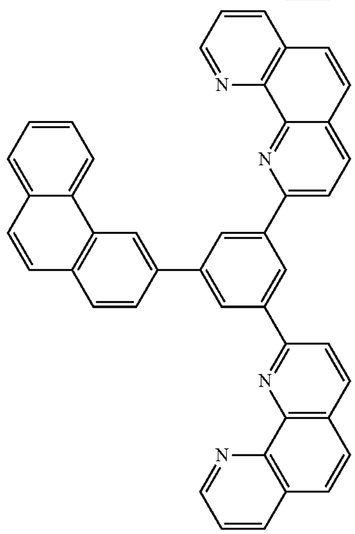
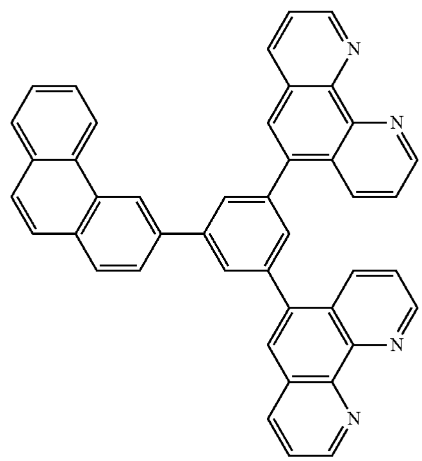
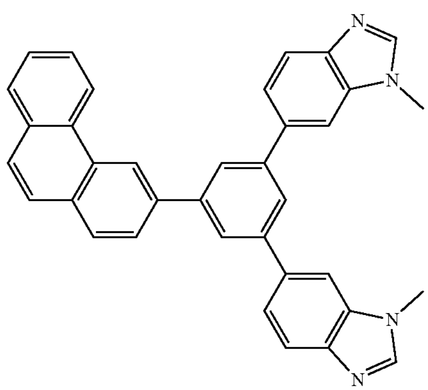
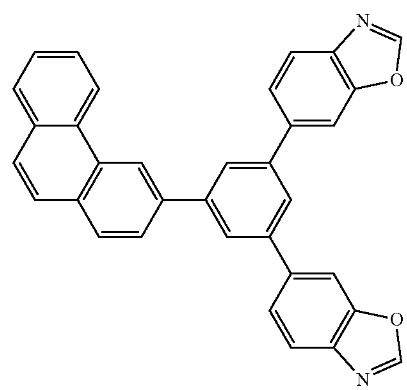
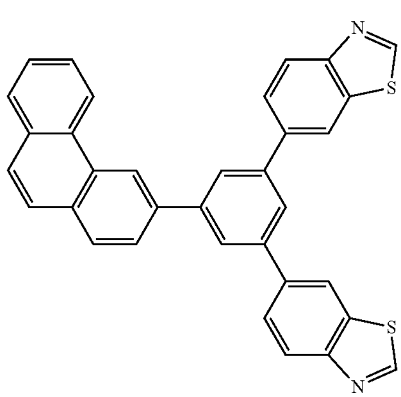
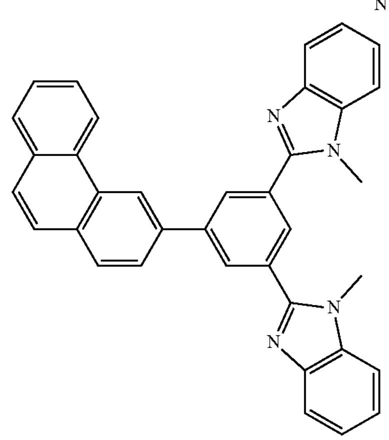

-continued
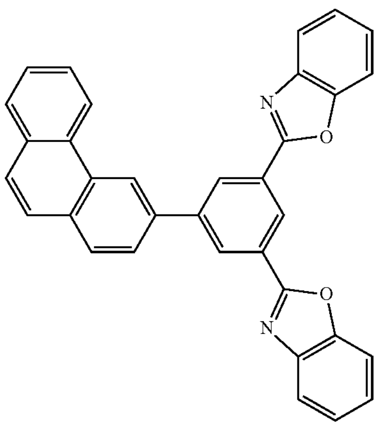
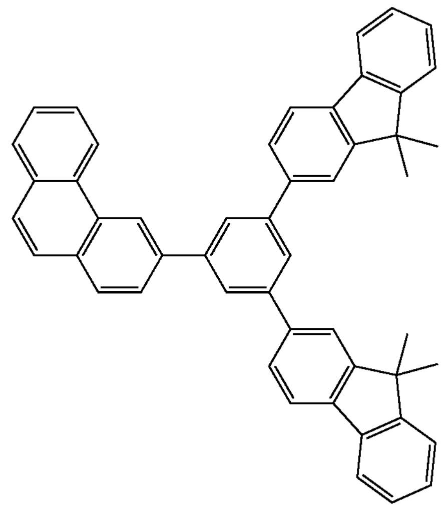
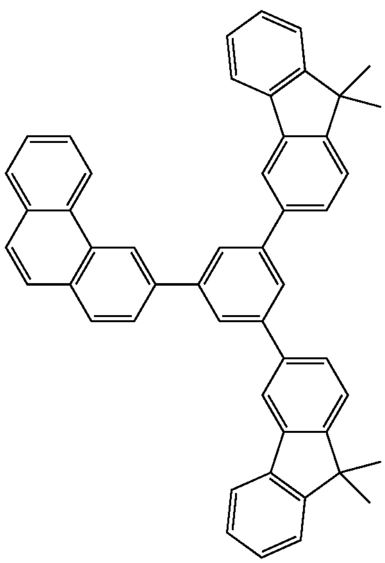
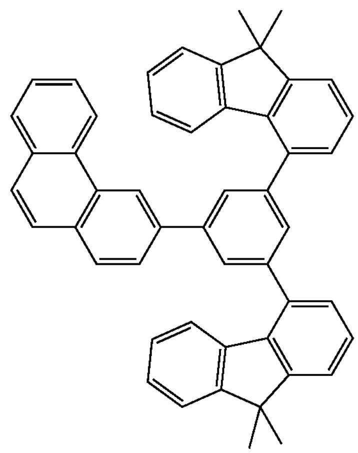
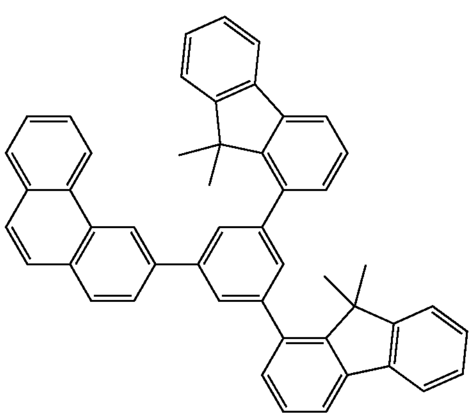
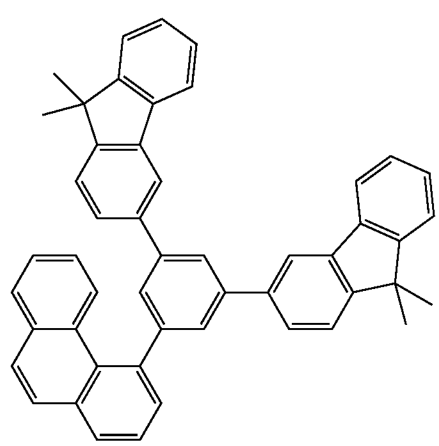

-continued
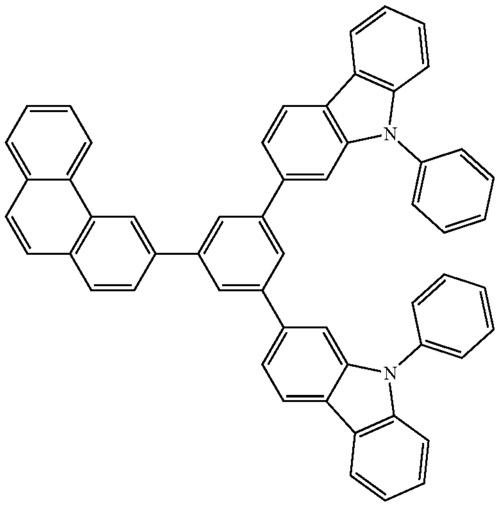
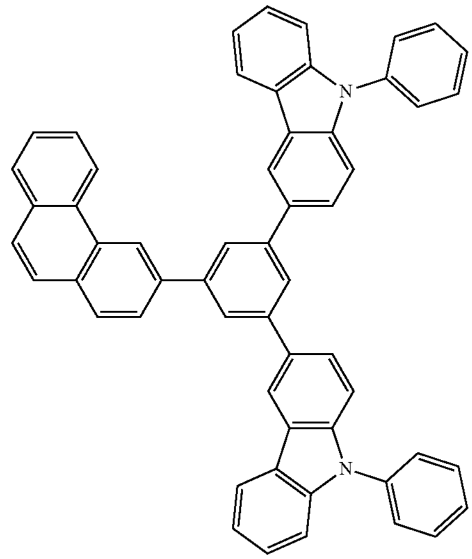
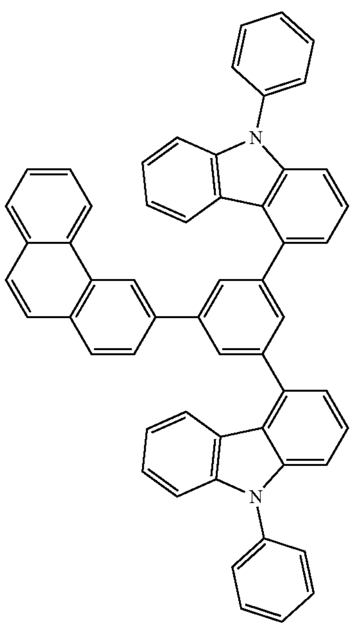
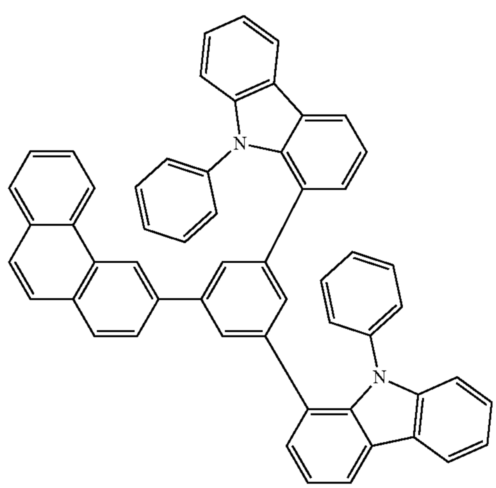
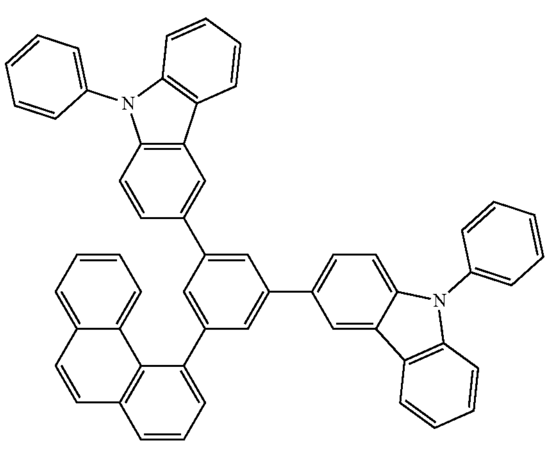
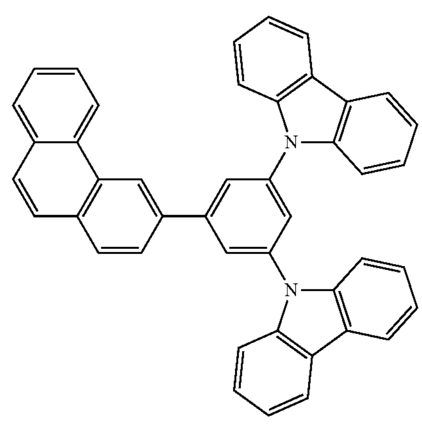

-continued
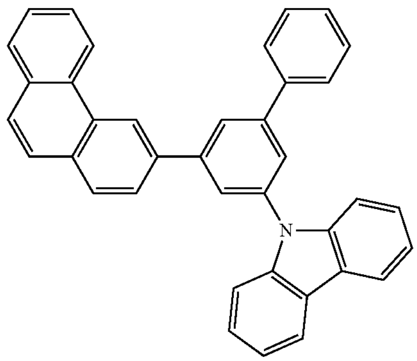
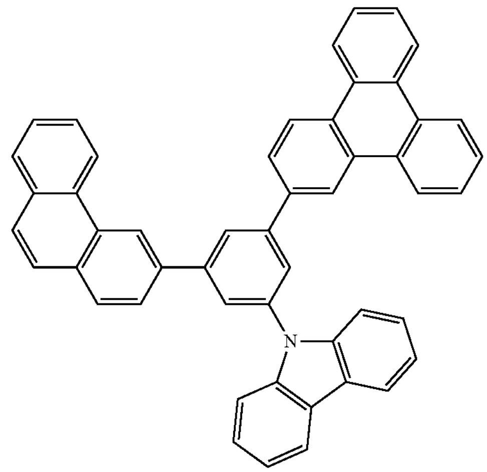
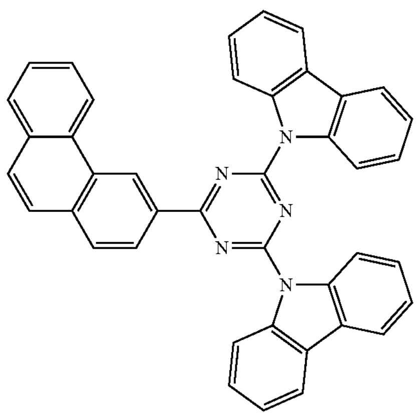
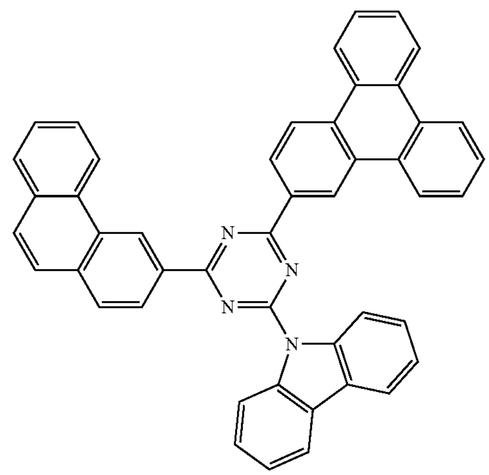
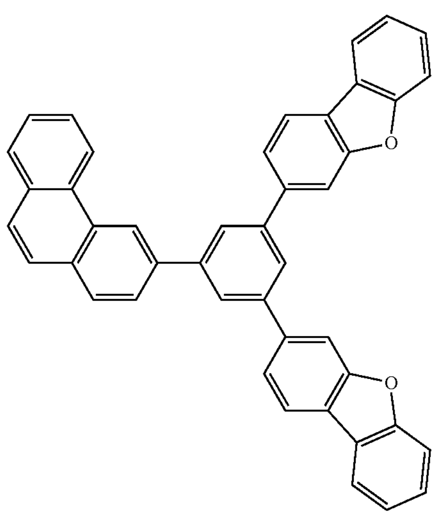
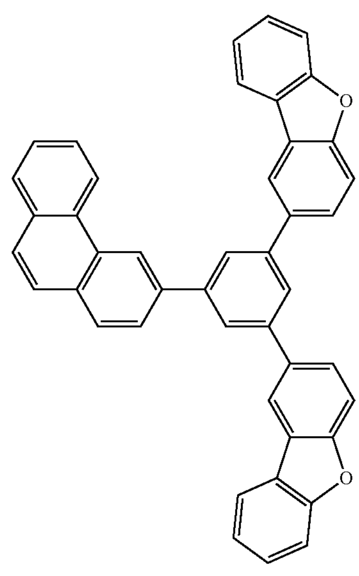

-continued
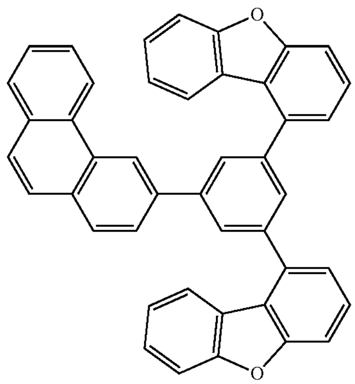
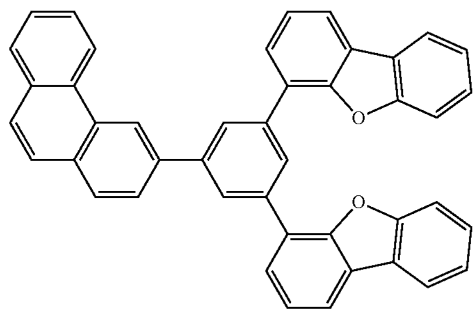
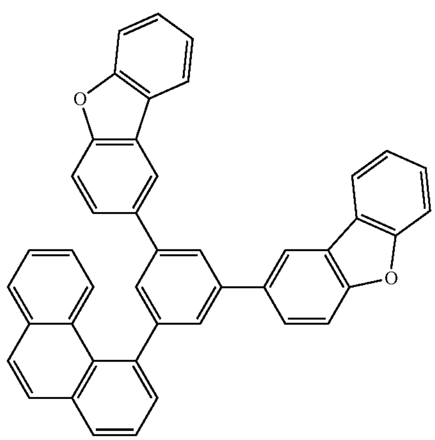
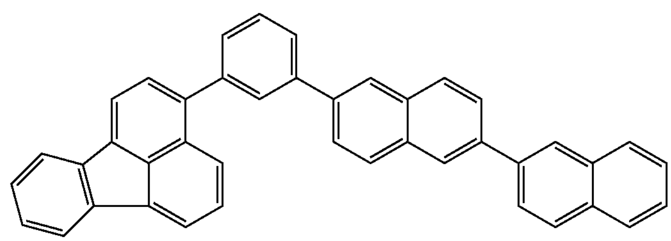
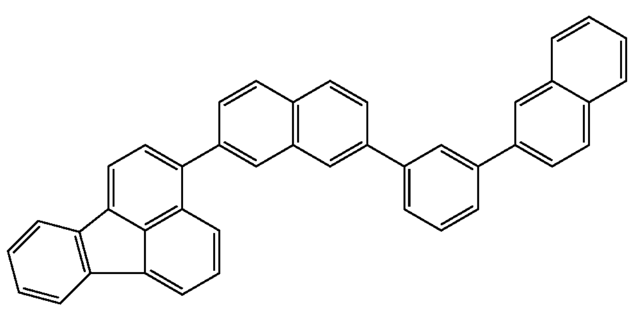
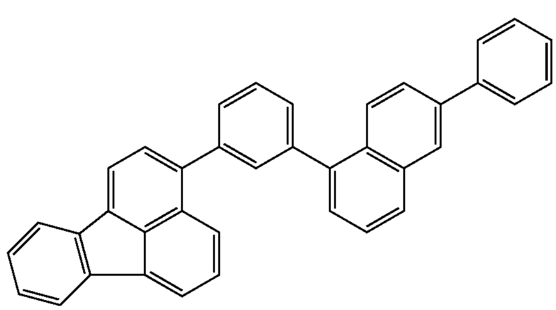

-continued
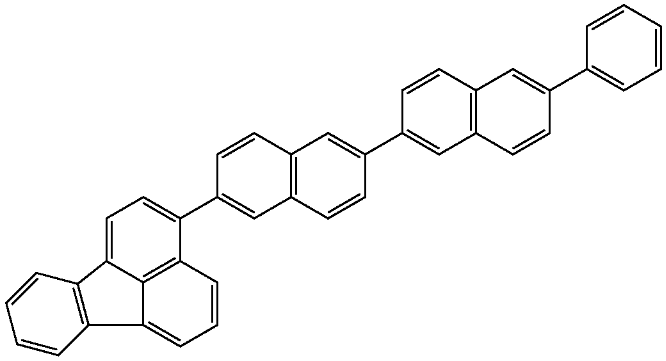
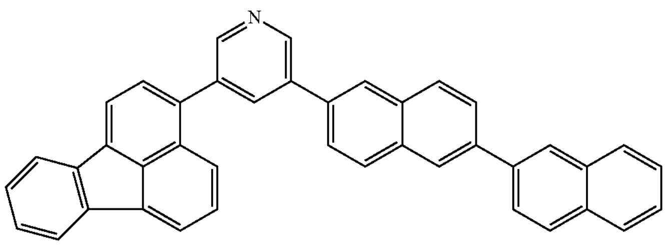
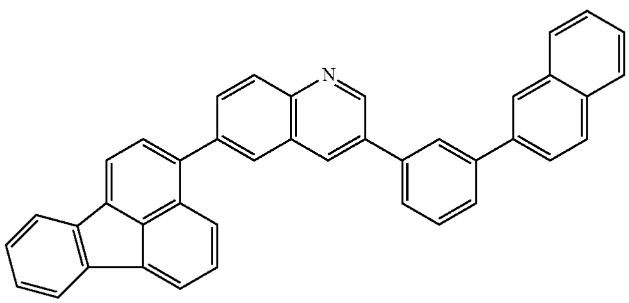
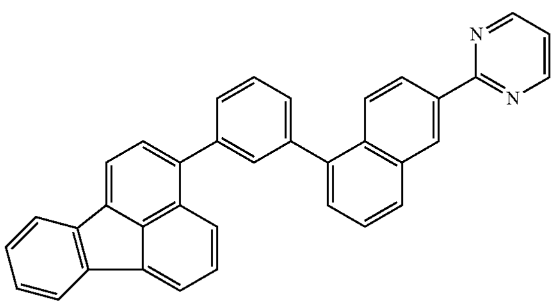
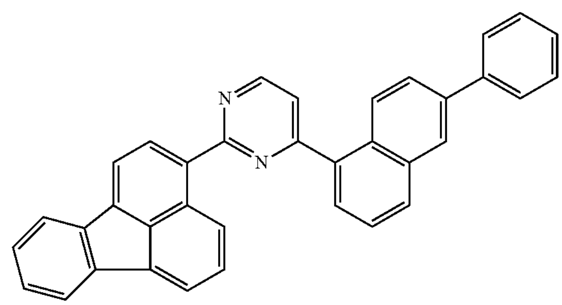
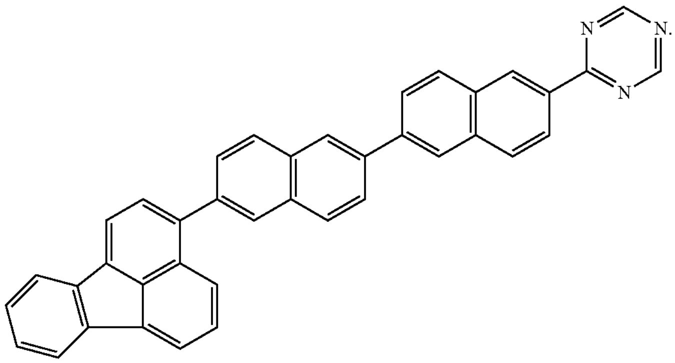

9. The organic light-emitting device of claim 1, wherein the EML comprises compound BD as a dopant:

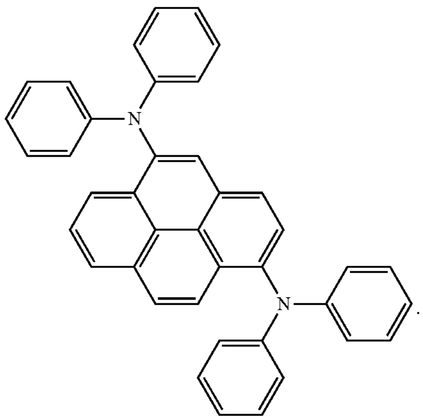

BD

10. The organic light-emitting device of claim 1, wherein the EML comprises $Ir(ppy)_3$ as a dopant:

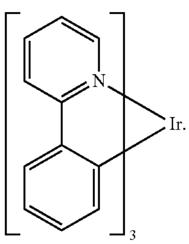

$Ir(ppy)_3$

11. The organic light-emitting device of claim 1, wherein the EML comprises Ir(pq)2acac as a dopant:

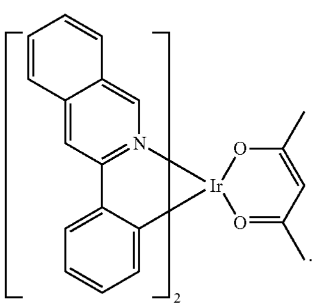

$Ir(pq)_2acac$

12. The organic light-emitting device of claim 1, wherein the EML comprises at least one compound selected from compounds below as a host:

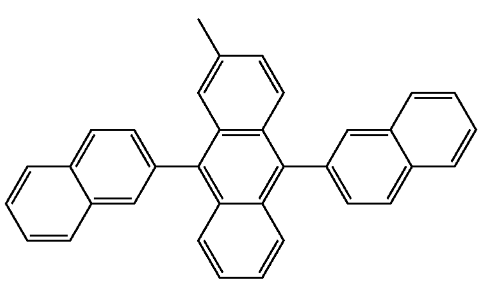

MADN

-continued

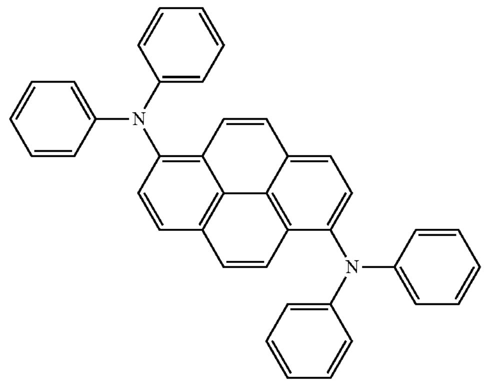

BD

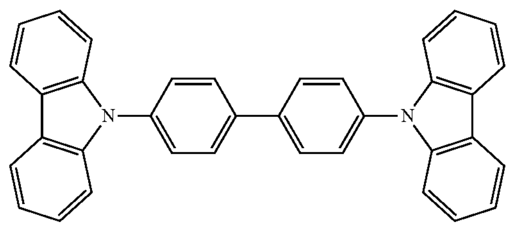

CBP

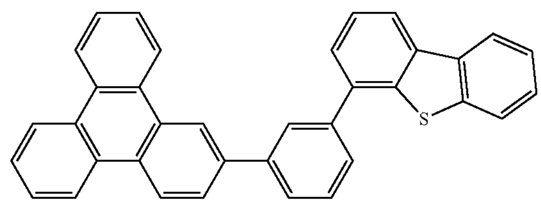

PH1

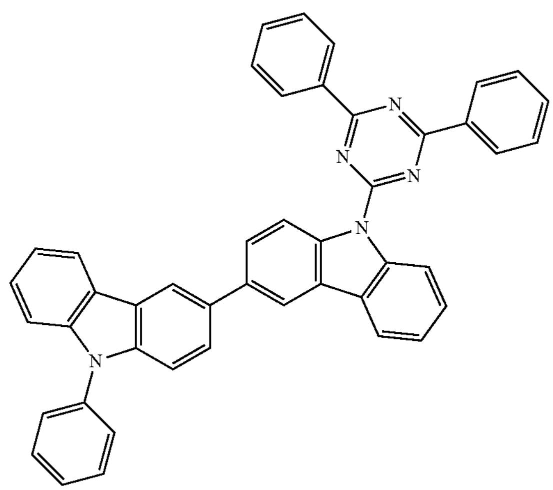

PH2

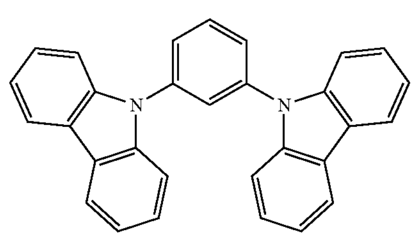

BF5

-continued

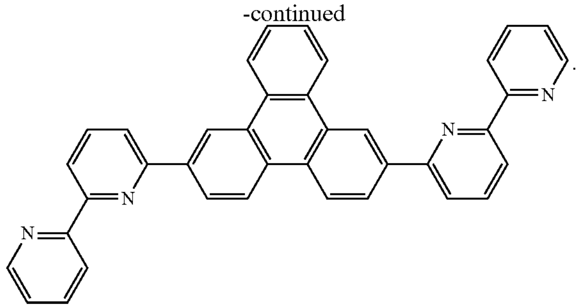

BF8

13. The organic light-emitting device of claim 1, wherein the hole transport region comprises at least one compound selected from a group of compounds represented by Formula 201A and Formula 202A:

Formula 201A

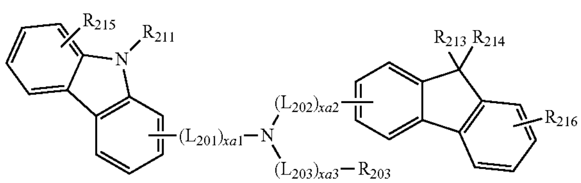

Formula 202A

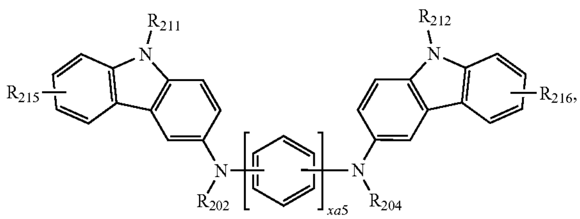

wherein $L_{201}$ to $L_{203}$ are each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and/or a triazinylene group; and/or a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and/or a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 are each independently selected from 0 and 1;

$R_{203}$, $R_{211}$, and $R_{212}$ are each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ are each independently selected from:

a $C_1$-$C_{20}$ alkyl group and/or a $C_1$-$C_{20}$ alkoxy group;

a $C_1$-$C_{20}$ alkyl group and/or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ are each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and/or a $C_1$-$C_{20}$ alkoxy group;

a $C_1$-$C_{20}$ alkyl group and/or a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and/or a triazinyl group; and/or a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and/or a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 is selected from 1 and 2.

14. The organic light-emitting device of claim 13, wherein the compound represented by Formula 201A and the compound represented by Formula 202A are each independently selected from compounds HT1-HT20 below:

HT1

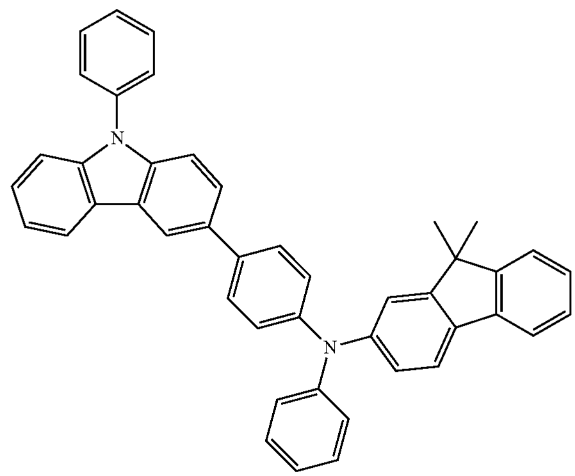

HT2

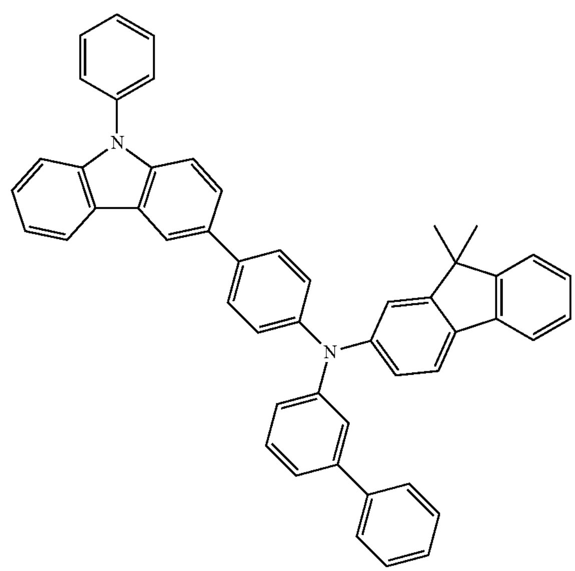

-continued
HT3
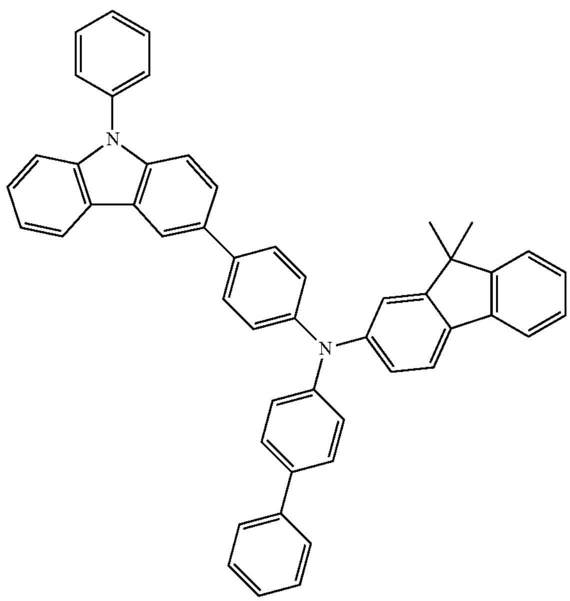
HT4
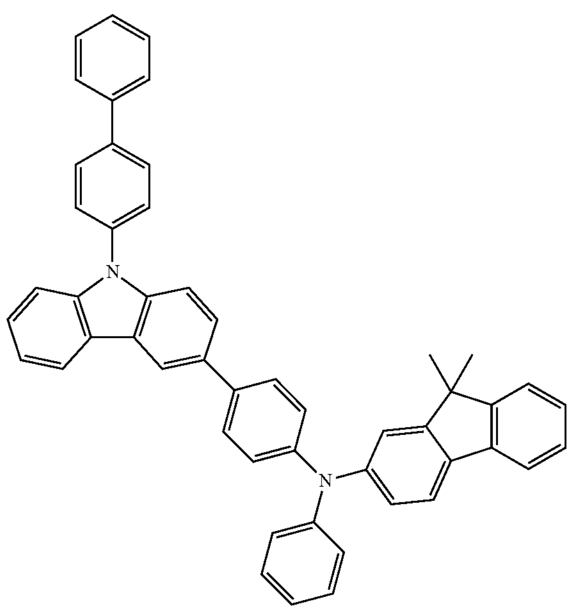
-continued
HT5
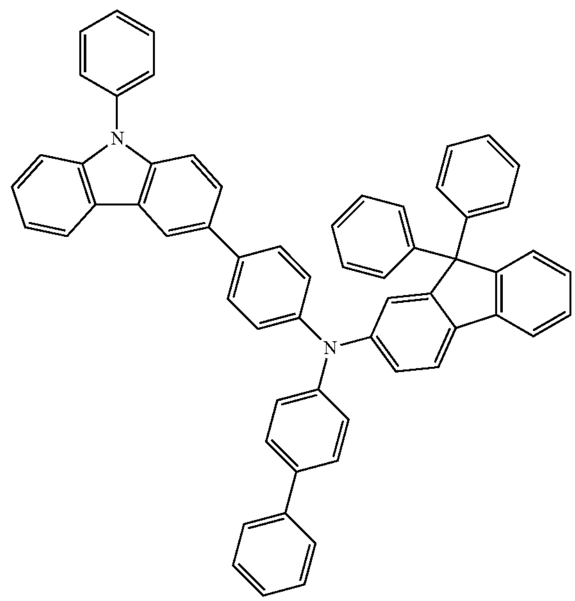
HT6
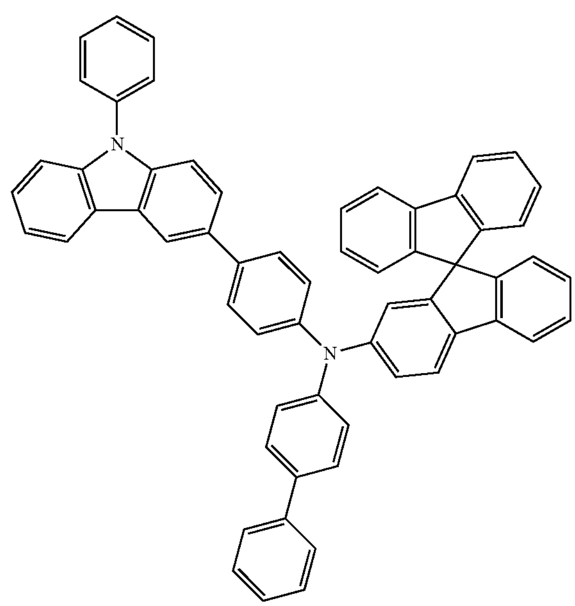

-continued
HT7
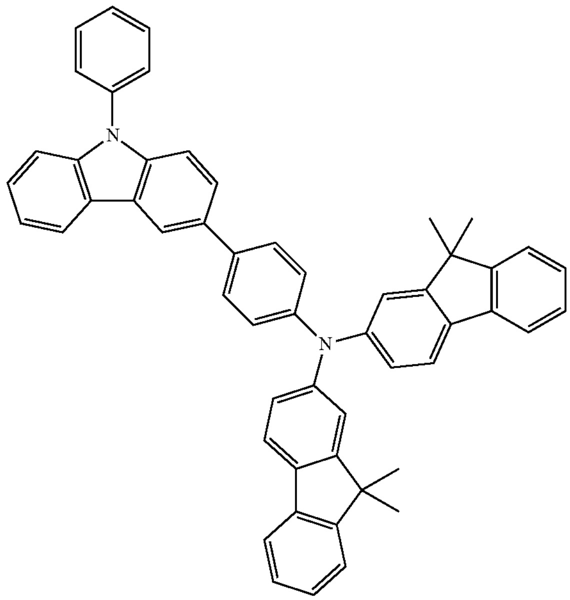
HT8
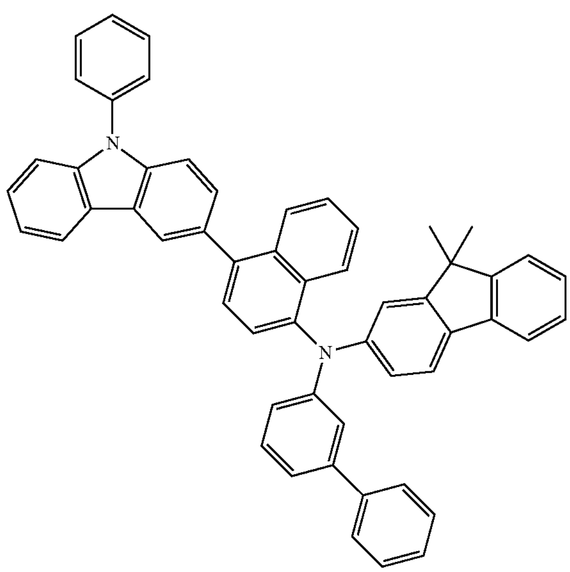
-continued
HT9
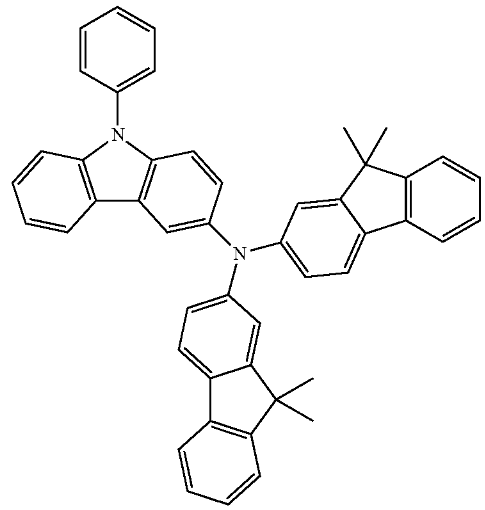
HT10
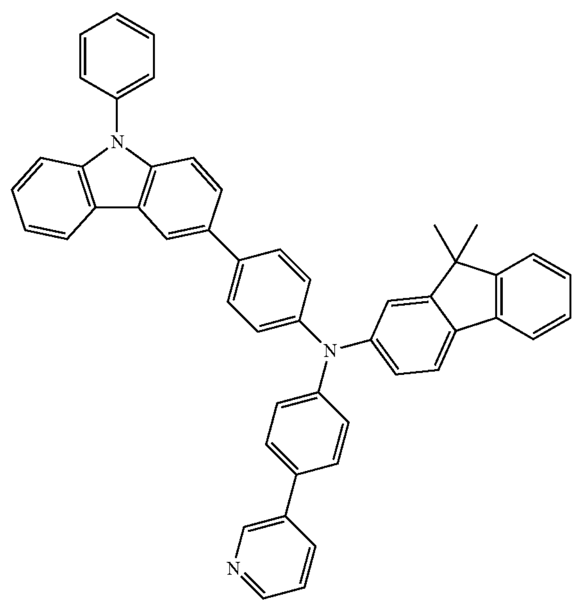

-continued
HT11
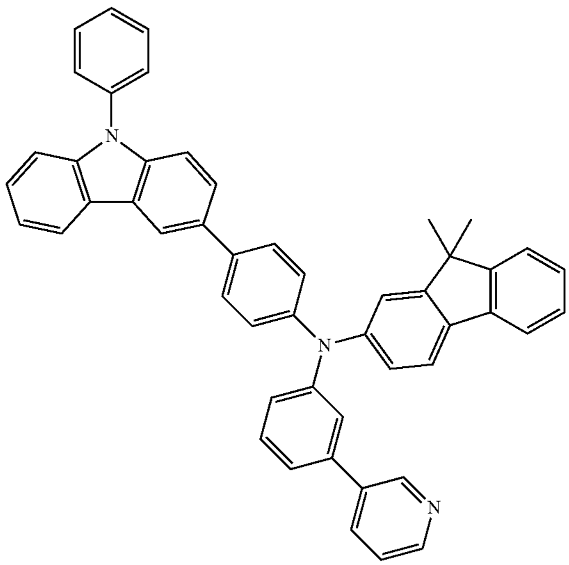
HT12
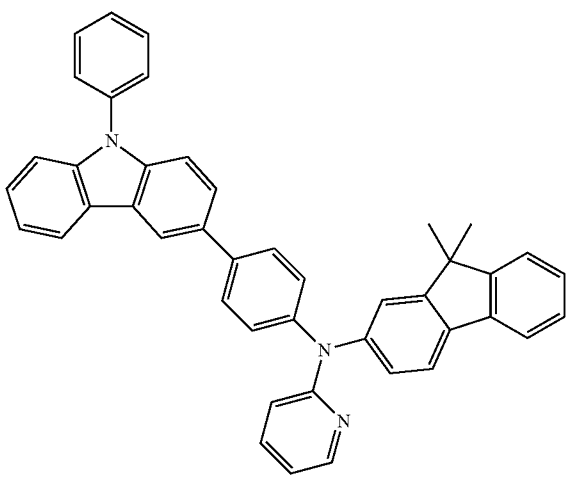
HT13
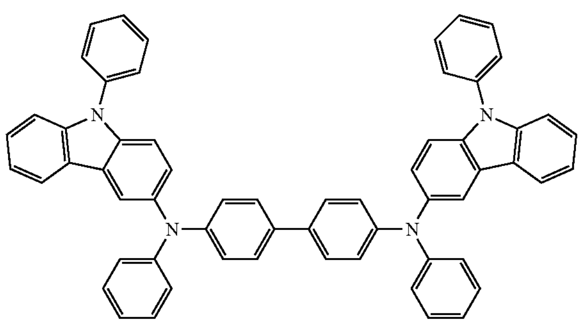
-continued
HT14
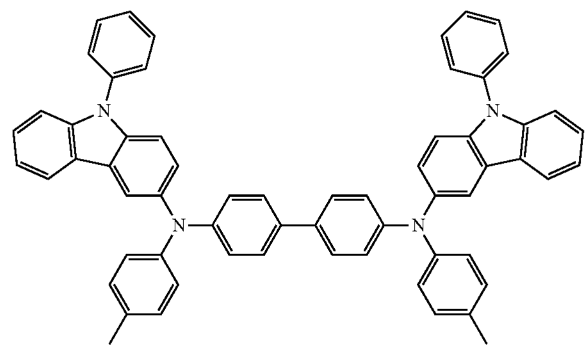
HT15
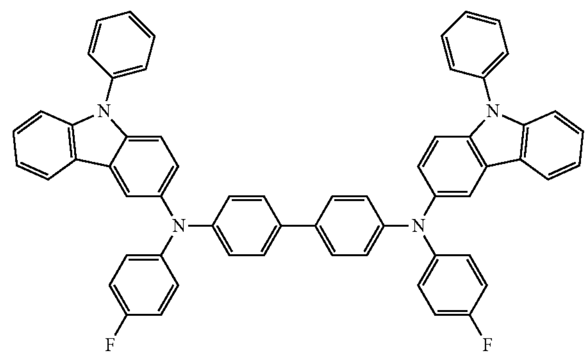
HT16
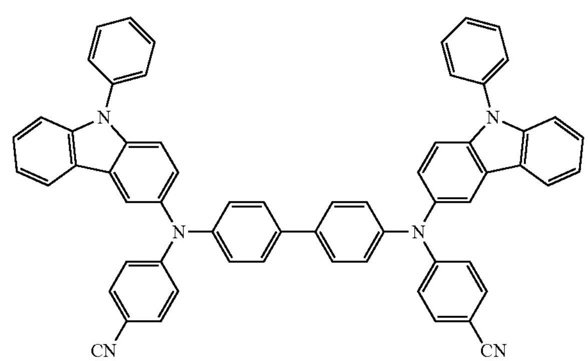
HT17
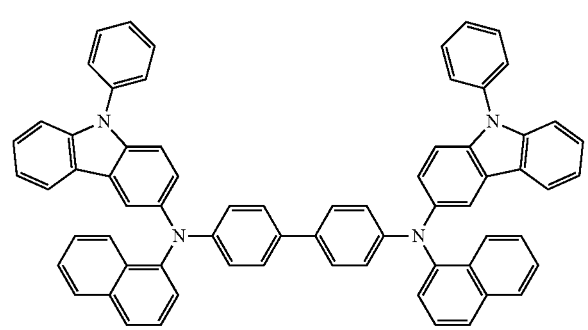

-continued

HT18

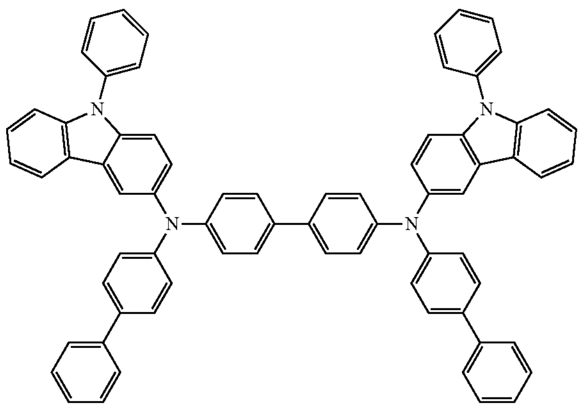

HT19

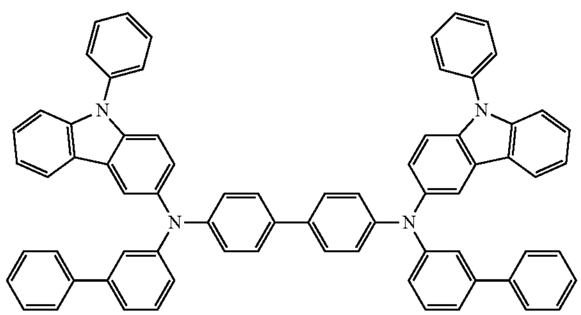

-continued

HT20

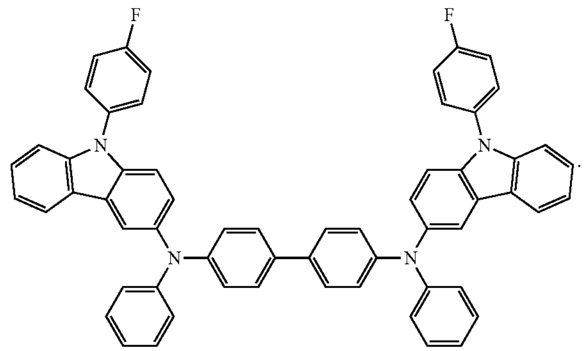

15. The organic light-emitting device of claim 1, wherein the hole transport region comprises a p-dopant.

16. The organic light-emitting device of claim 1, wherein the hole transport region comprises a p-dopant, and the p-dopant is a quinone derivative, a metal oxide, or a cyano group-containing compound.

17. The organic light-emitting device of claim 1, wherein the organic layer is a wet-processed organic layer.

18. A flat panel display comprising the organic light-emitting device of claim 1, wherein a first electrode of the organic light-emitting device is electrically connected to a source electrode or a drain electrode of a thin film transistor.

* * * * *

US009564598C1

(12) EX PARTE REEXAMINATION CERTIFICATE (12081st)

United States Patent (10) Number: US 9,564,598 C1
Ito et al. (45) Certificate Issued: Jun. 28, 2022

(54) ORGANIC LIGHT-EMITTING DEVICE

(71) Applicant: SAMSUNG DISPLAY CO., LTD., Gyeonggi-Do (KR)

(72) Inventors: Naoyuki Ito, Yongin (KR); Seul-Ong Kim, Yongin (KR); Youn-Sun Kim, Yongin (KR); Dong-Woo Shin, Yongin (KR); Jung-Sub Lee, Yongin (KR)

(73) Assignee: SAMSUNG DISPLAY CO., LTD, Yongin (KR)

Reexamination Request:
No. 90/014,803, Jul. 15, 2021

Reexamination Certificate for:
Patent No.: 9,564,598
Issued: Feb. 7, 2017
Appl. No.: 14/497,267
Filed: Sep. 25, 2014

(30) Foreign Application Priority Data

May 2, 2014 (KR) ........................ 10-2014-0053616

(51) Int. Cl.
*H01L 51/00* (2006.01)
*H01L 27/32* (2006.01)
*H01L 51/50* (2006.01)
*H01L 51/52* (2006.01)

(52) U.S. Cl.
CPC ...... *H01L 51/0072* (2013.01); *H01L 27/3248* (2013.01); *H01L 51/006* (2013.01); *H01L 51/0052* (2013.01); *H01L 51/0054* (2013.01); *H01L 51/0058* (2013.01); *H01L 51/0059* (2013.01); *H01L 51/0061* (2013.01); *H01L 51/0067* (2013.01); *H01L 51/0074* (2013.01); *H01L 51/0085* (2013.01); *H01L 51/5028* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 27/3244* (2013.01); *H01L 51/0081* (2013.01); *H01L 51/5004* (2013.01); *H01L 51/506* (2013.01); *H01L 51/5008* (2013.01); *H01L 51/5016* (2013.01); *H01L 51/5096* (2013.01); *H01L 2251/5384* (2013.01); *H01L 2251/552* (2013.01)

(58) Field of Classification Search
None
See application file for complete search history.

(56) References Cited

To view the complete listing of prior art documents cited during the proceeding for Reexamination Control Number 90/014,803, please refer to the USPTO's public Patent Application Information Retrieval (PAIR) system under the Display References tab.

*Primary Examiner* — Jerry D Johnson

(57) ABSTRACT

An organic light-emitting device includes an anode, a cathode, and an organic layer between the anode and the cathode, wherein the organic layer includes a mixed organic layer, and the mixed organic layer includes at least two different compounds, and a triplet energy of at least one compound of the at least two different compounds is 2.2 eV or higher. The organic light-emitting device according to embodiments of the present invention may have a low driving voltage, a high efficiency, and a long lifespan.

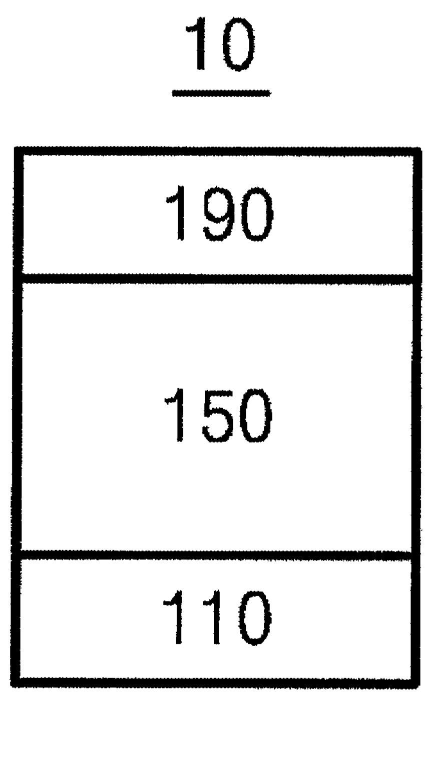

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 6 is cancelled.

Claims 1 and 8 are determined to be patentable as amended.

Claims 3 and 5, dependent on an amended claim, are determined to be patentable.

New claims 19-33 are added and determined to be patentable.

Claims 2, 4, 7 and 9-18 were not reexamined.

1. An organic light-emitting device comprising an anode;

a cathode; and an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL) and at least one selected from a hole blocking layer (HBL) and an electron injection layer (EIL), wherein a mixed organic layer is between the EML and the electron transport layer (ETL) and comprises at least two different compounds *in a weight ratio of about 0.1:1 to about 10:1*, a triplet energy of at least one compound of the at least two different compounds being 2.2 eV or greater, wherein the mixed organic layer is in contact with the EML and the ETL, [and]

wherein the at least one compound is an electron-transporting material or a hole-transporting material*, and the at least one compound comprises one of the backbones below:*

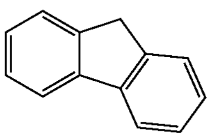

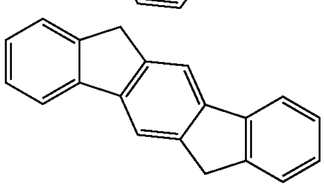

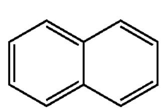

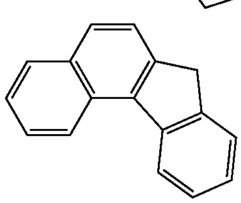

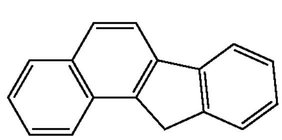

-continued

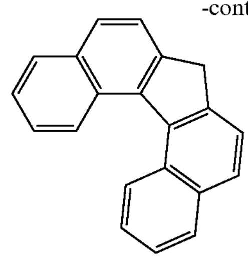

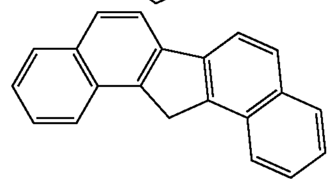

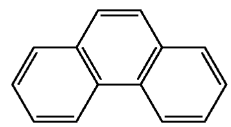

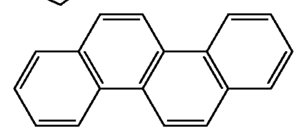

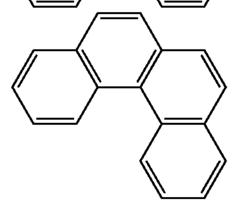

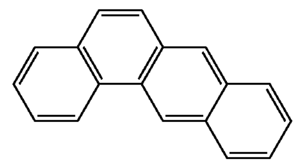

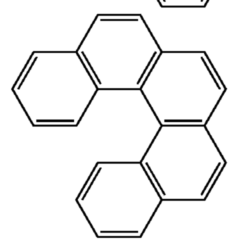

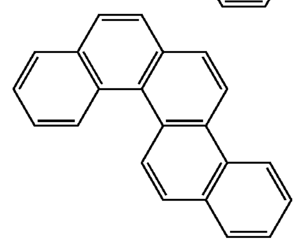

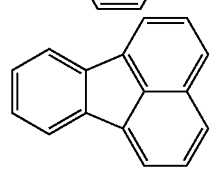

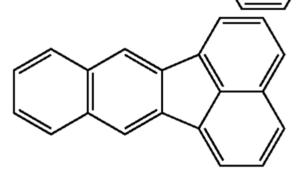

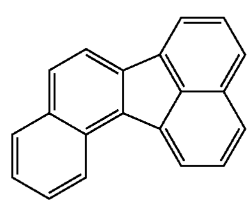

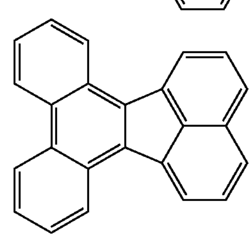

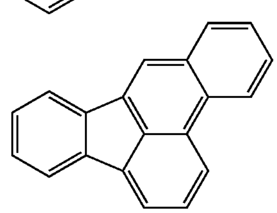

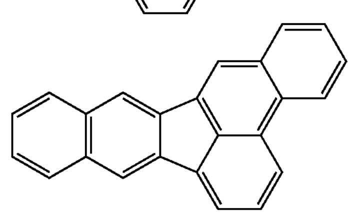

-continued
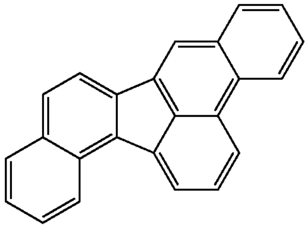
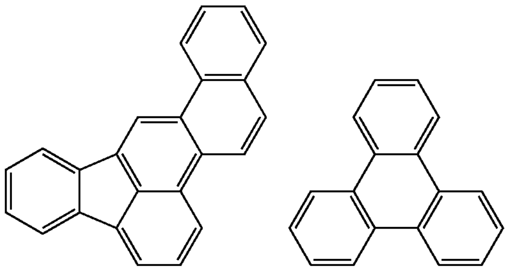
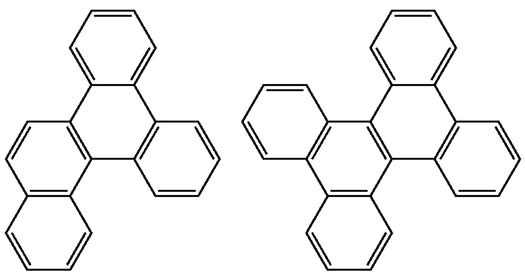
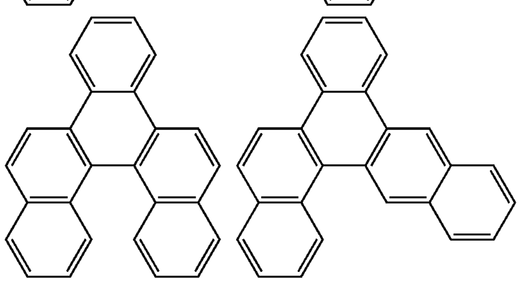
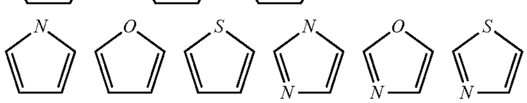
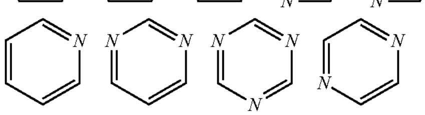
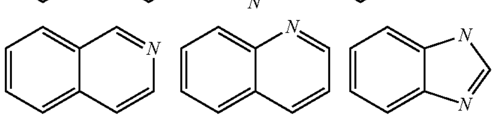
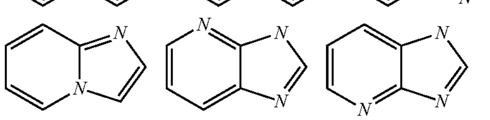
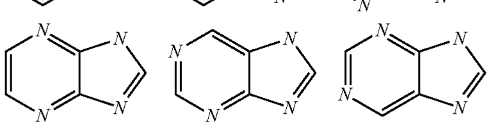
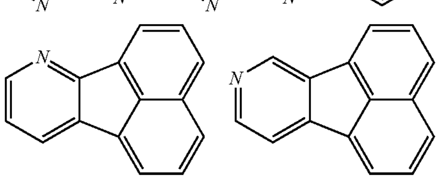
-continued
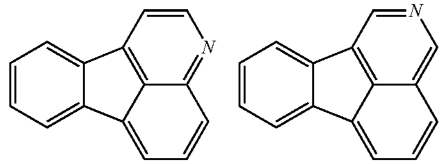
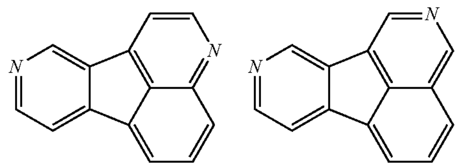
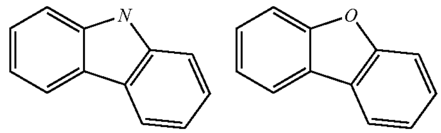
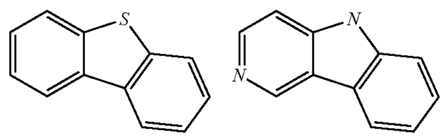
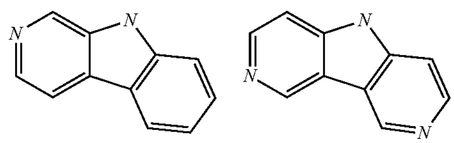
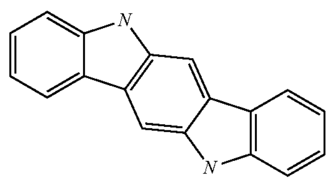
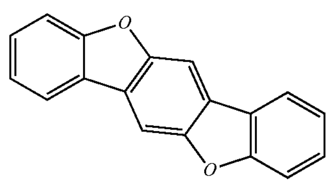
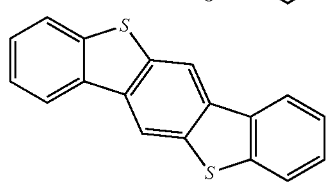
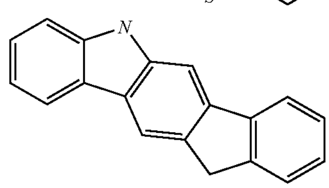
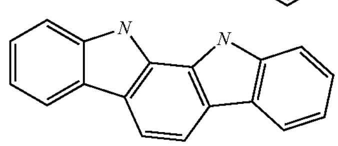
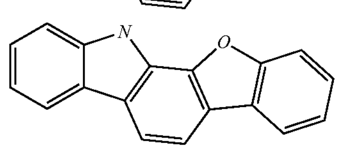

-continued
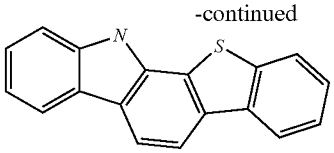
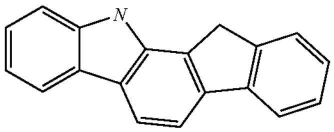
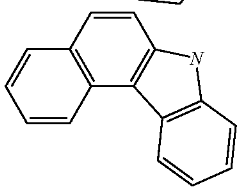
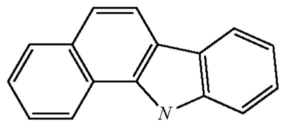
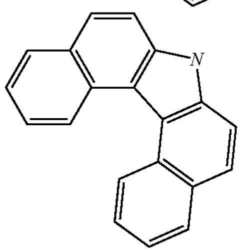
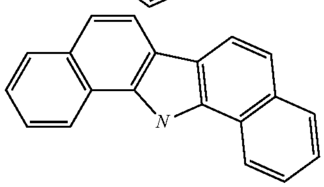
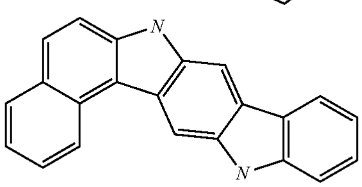
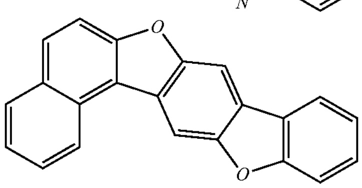
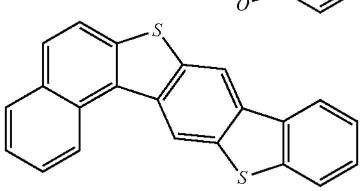
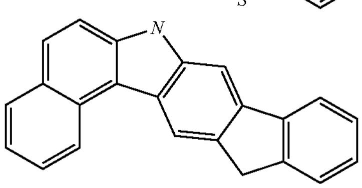
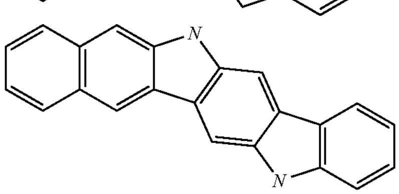
-continued
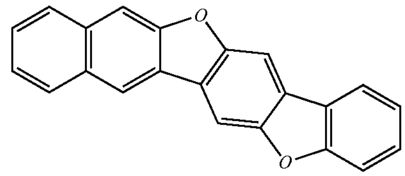
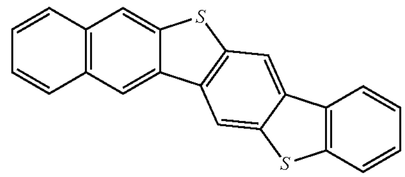
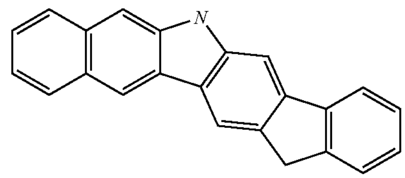
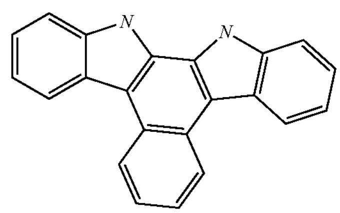
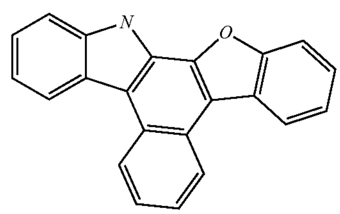
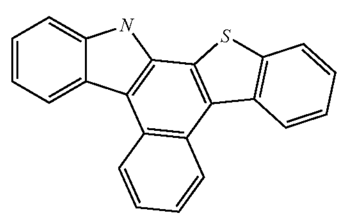
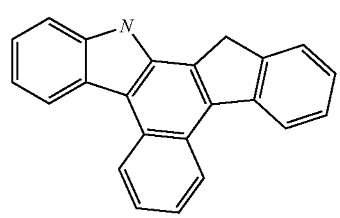
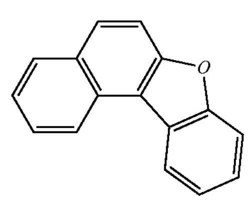
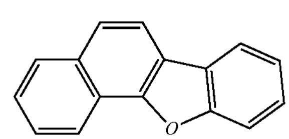

-continued
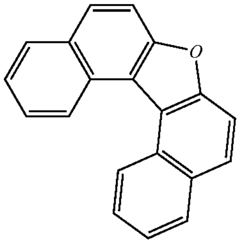
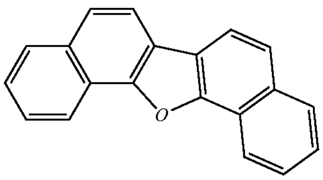
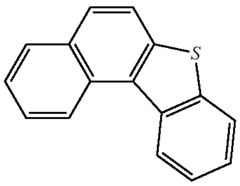
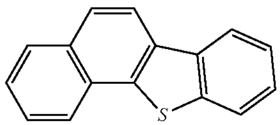
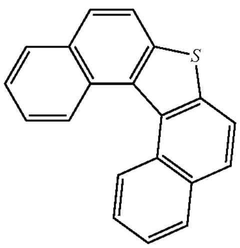
-continued
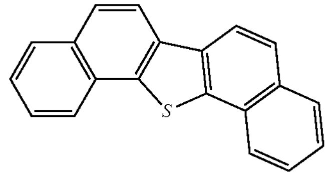
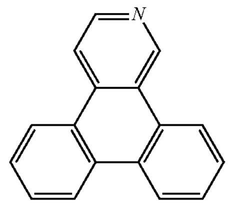
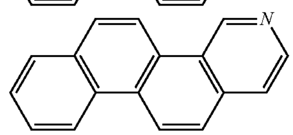
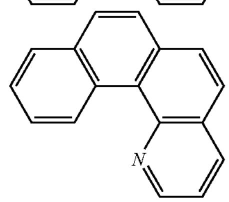
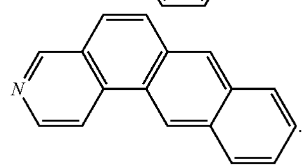
8. The organic light-emitting device of claim 1, wherein the mixed organic layer comprises at least two compounds selected from compounds below:
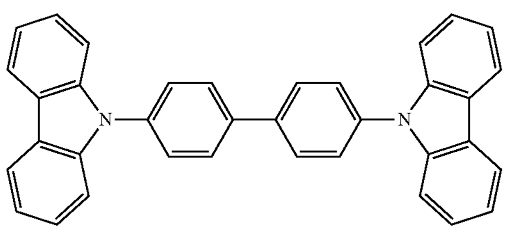
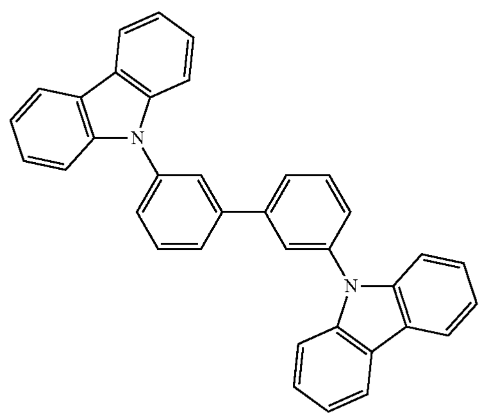
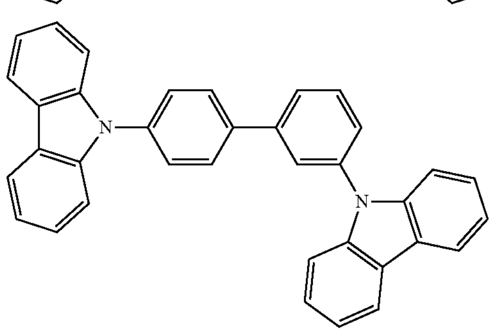
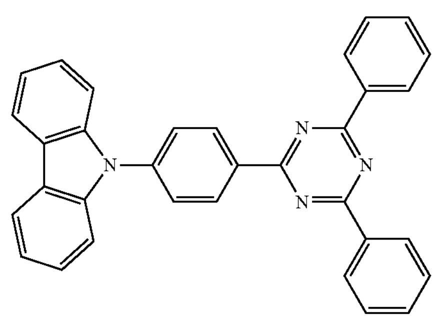

-continued
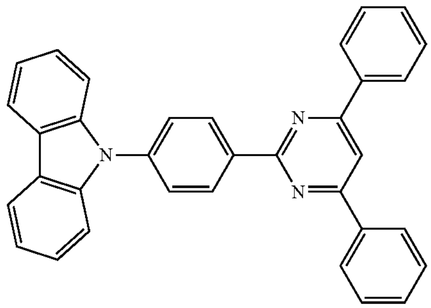
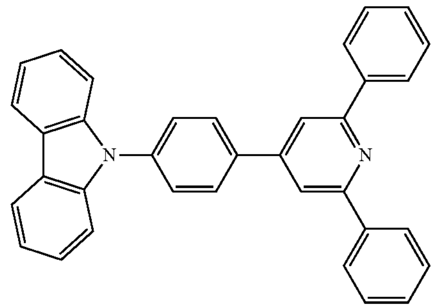
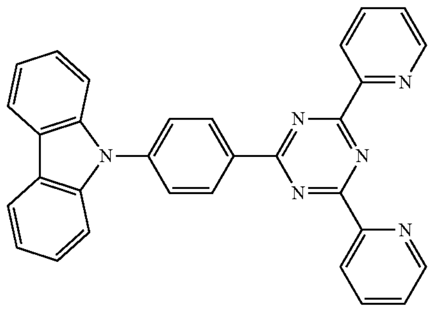
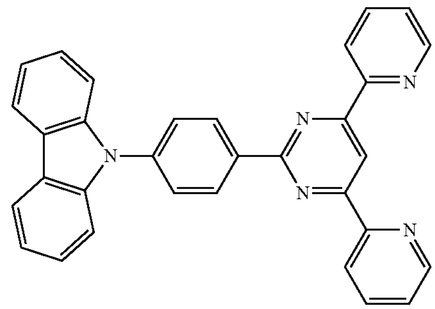
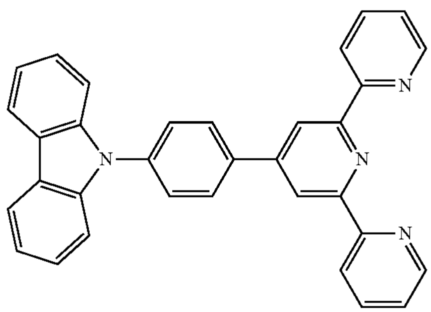
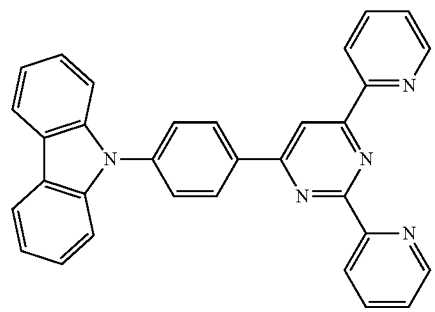
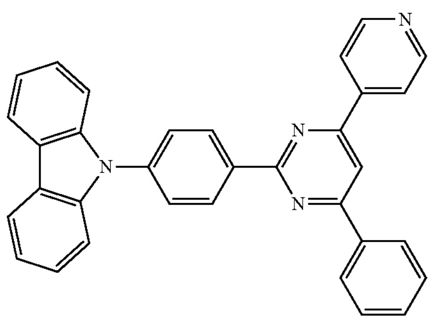
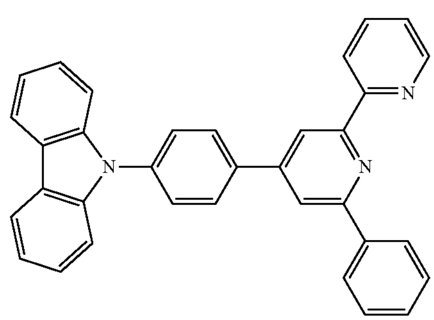
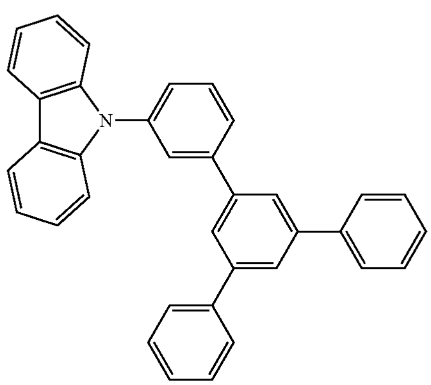
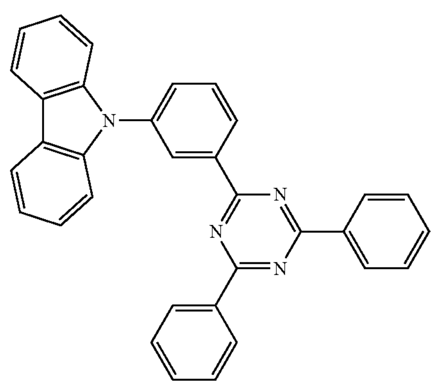

-continued
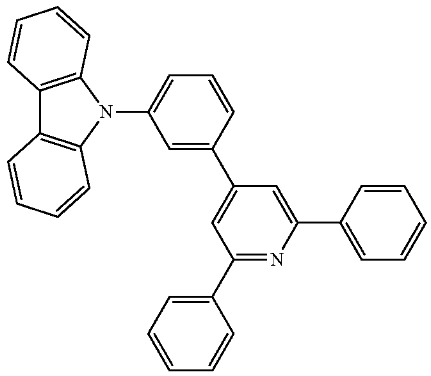
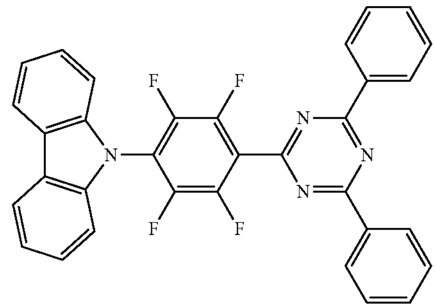
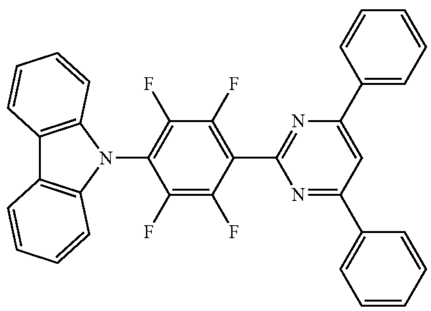
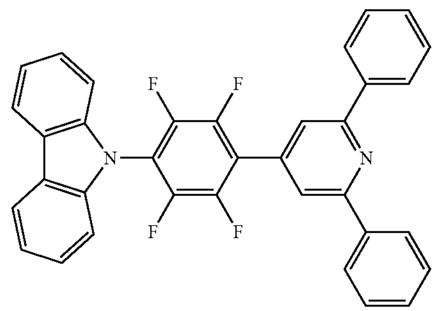
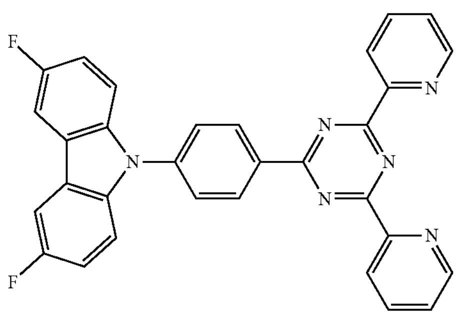
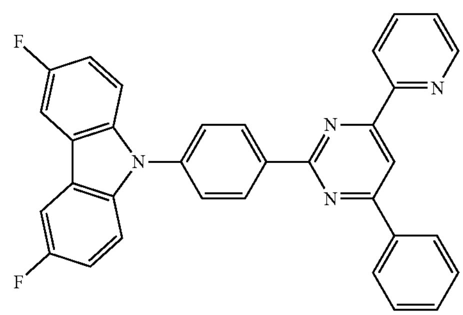
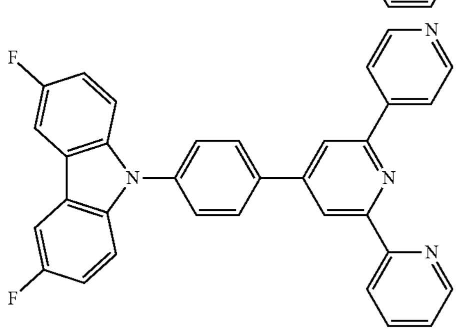
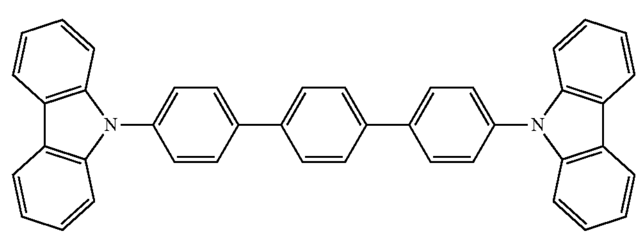
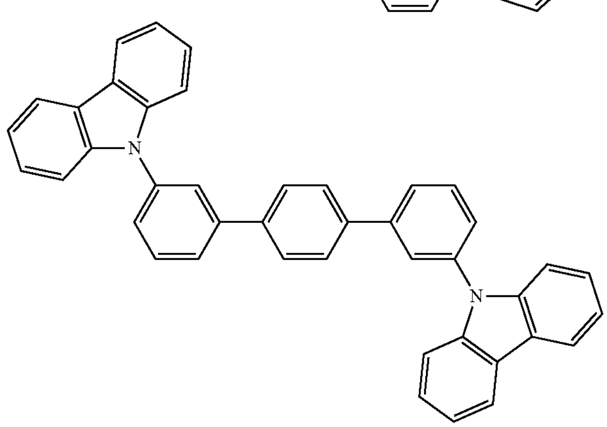

-continued
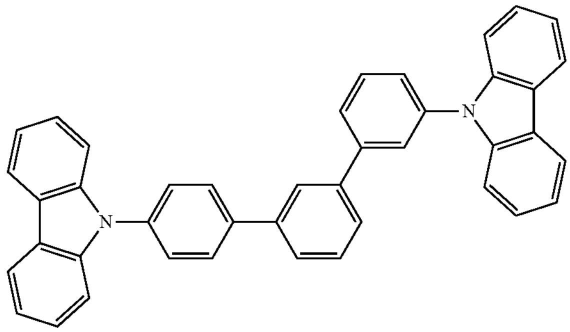
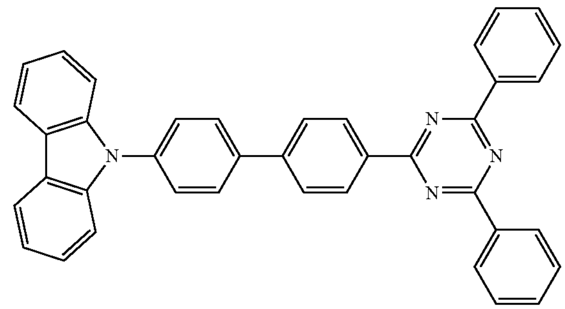
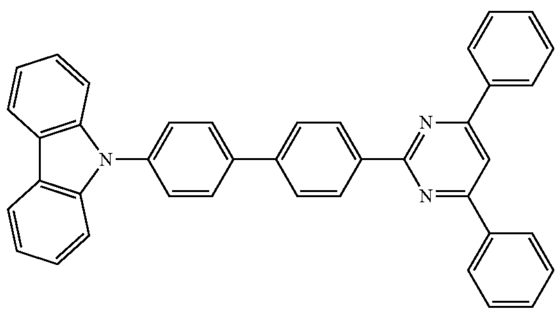
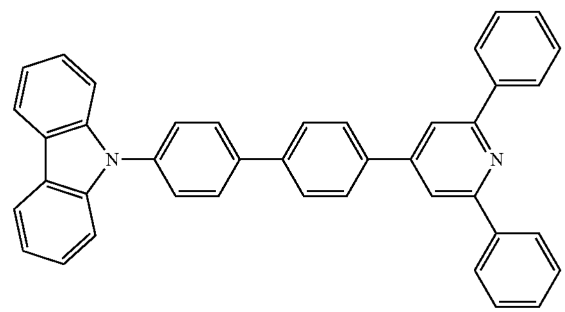
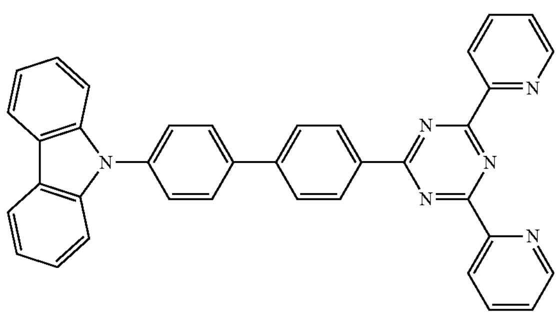
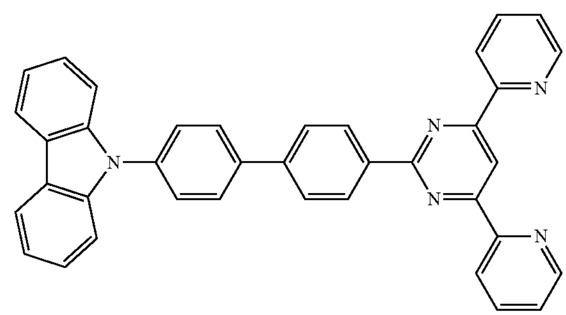
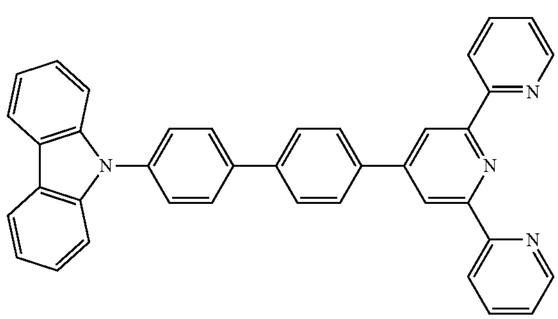
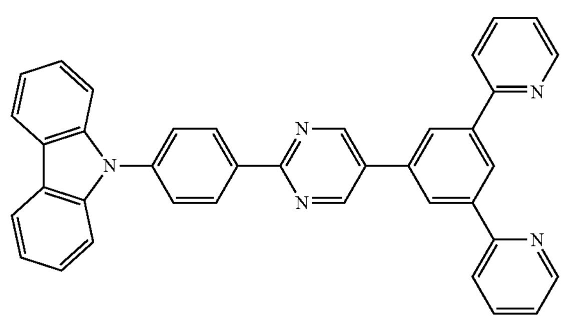

-continued
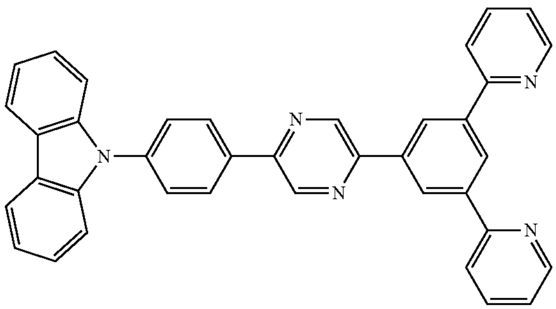
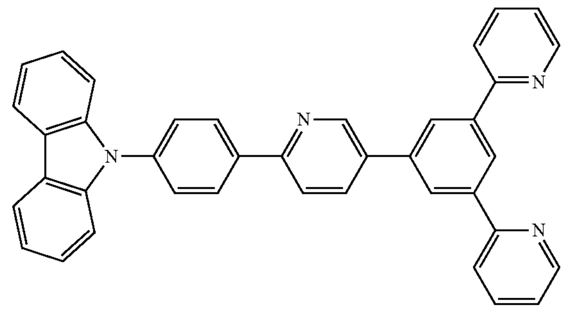
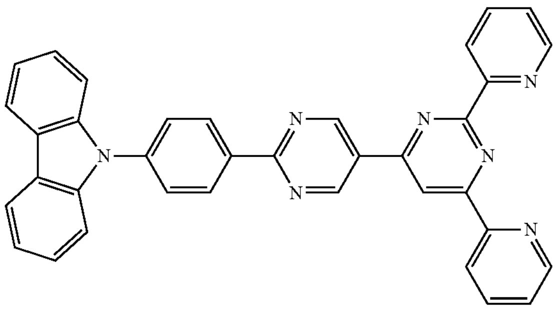
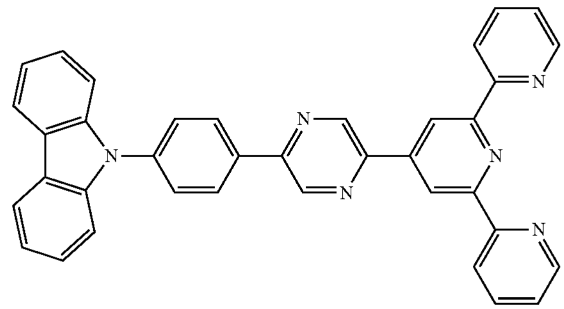
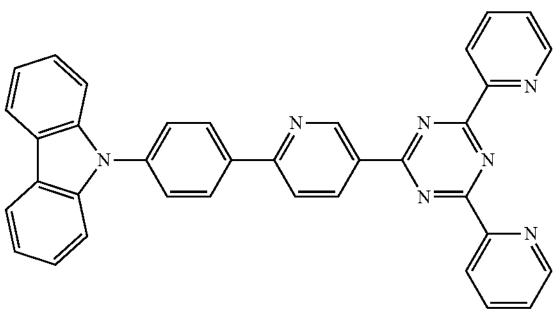
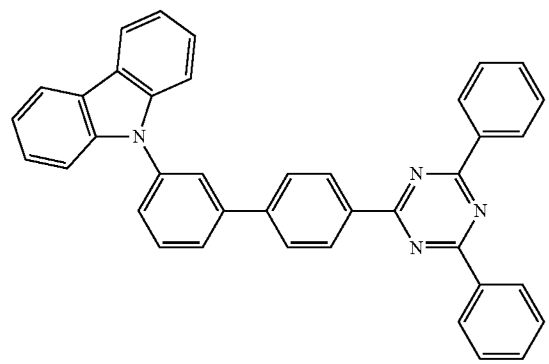
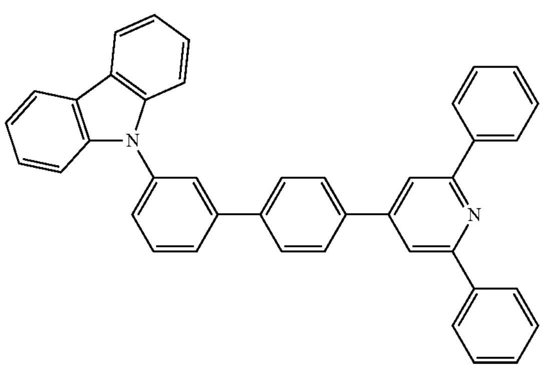
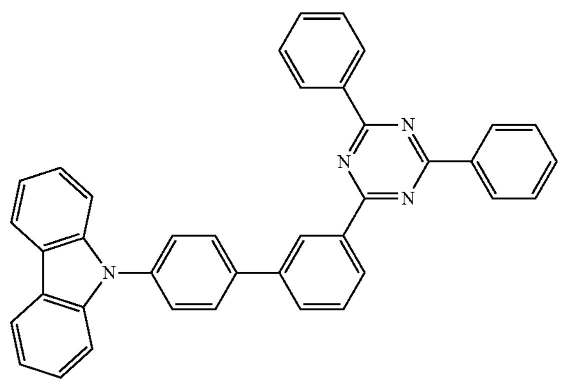
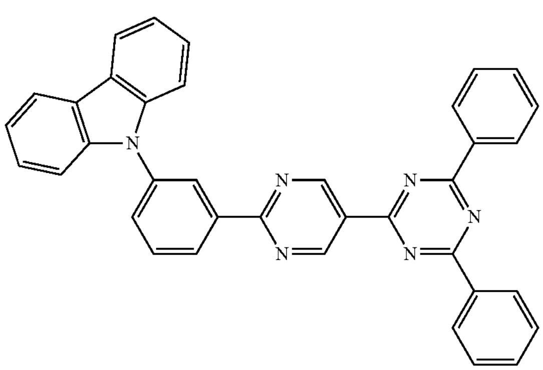
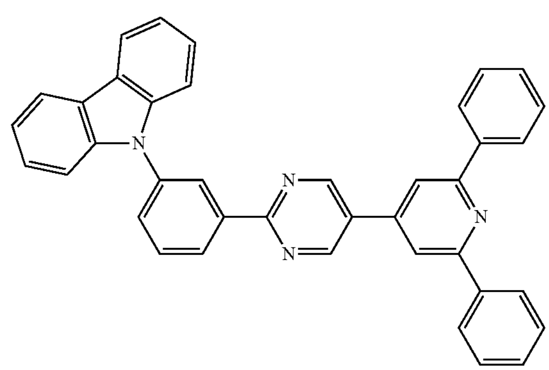

-continued
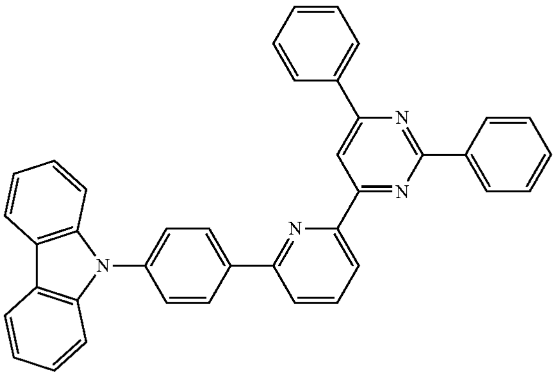
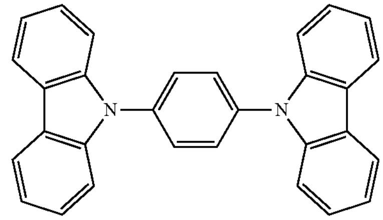
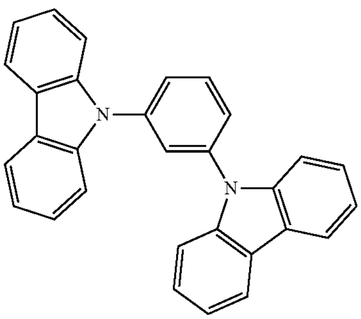
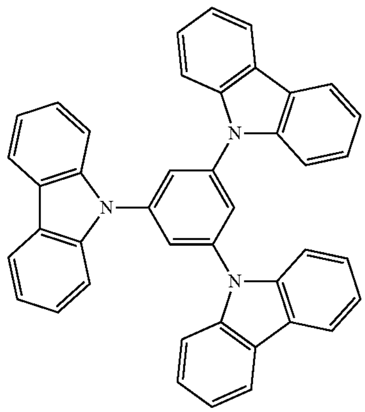
[
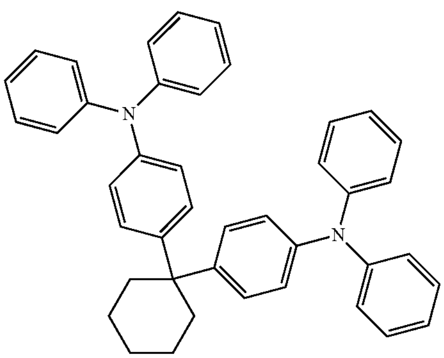
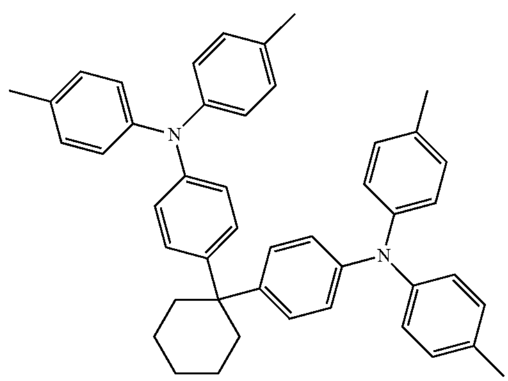
]
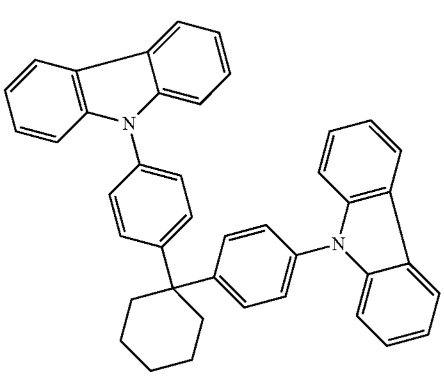
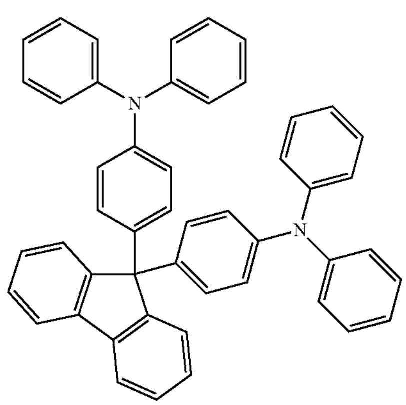

-continued
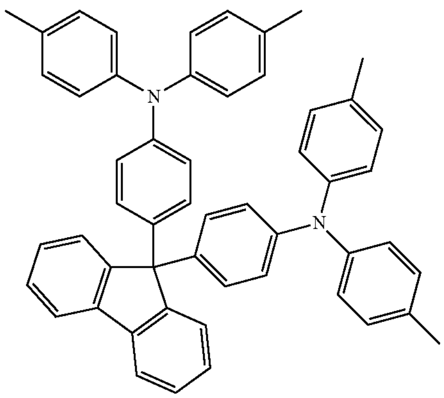
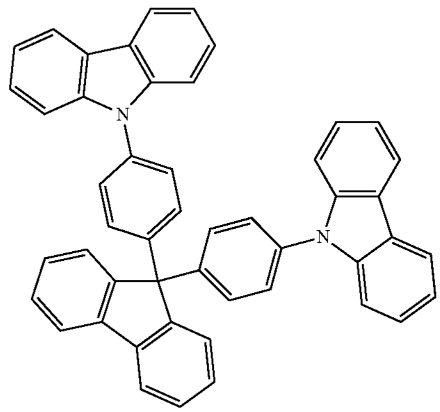
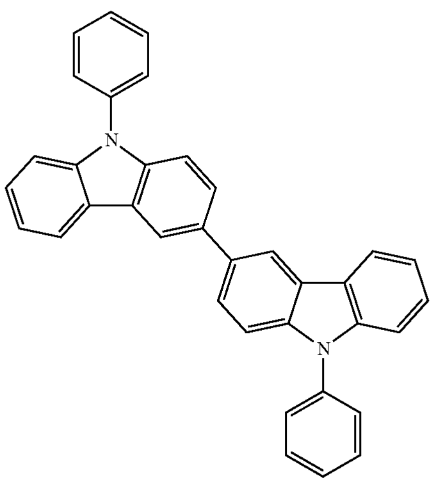
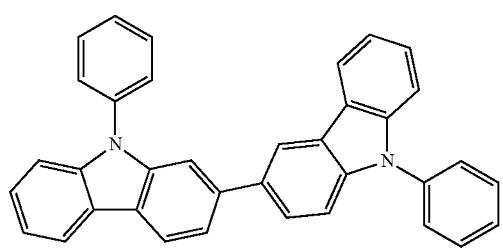
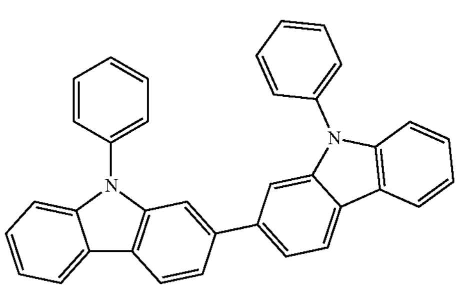
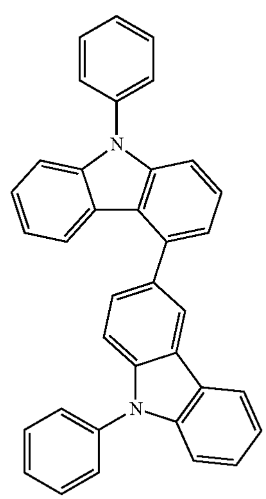
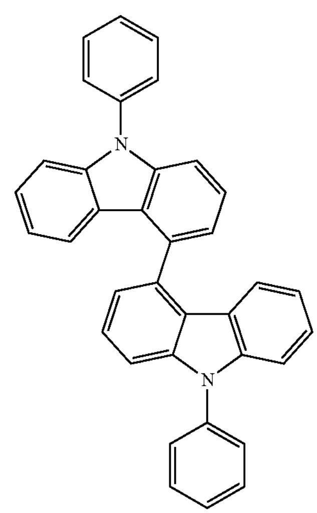

-continued
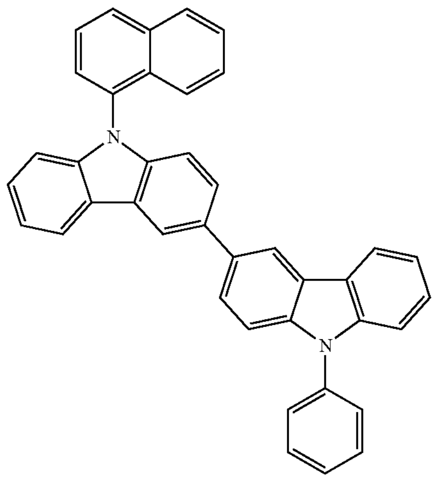
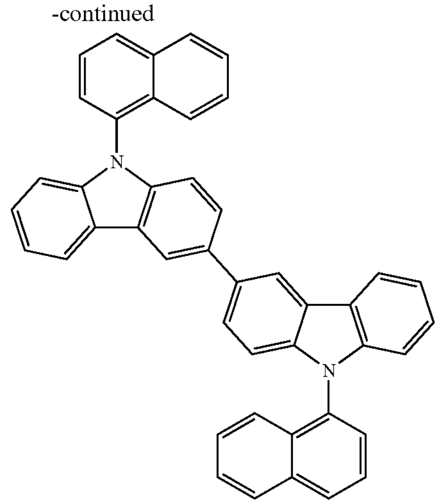
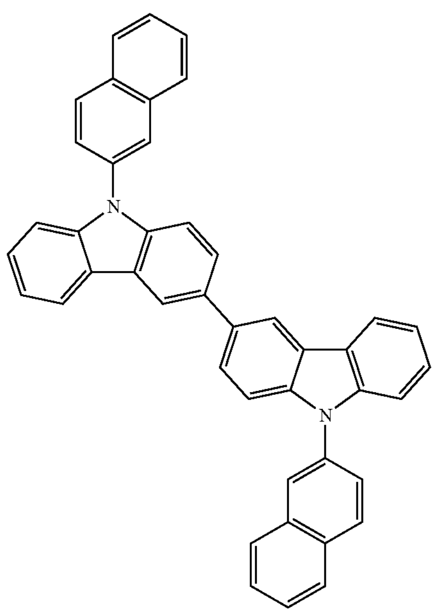
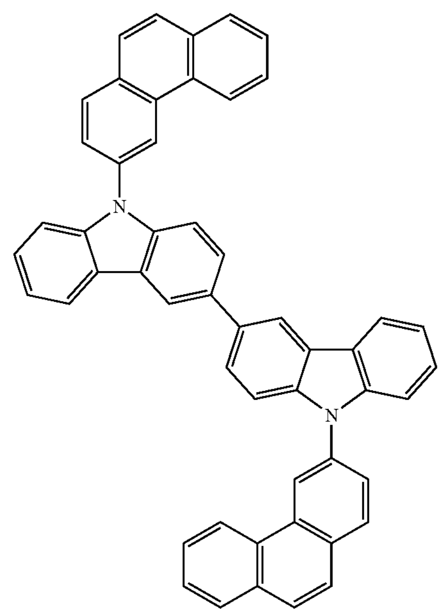

-continued
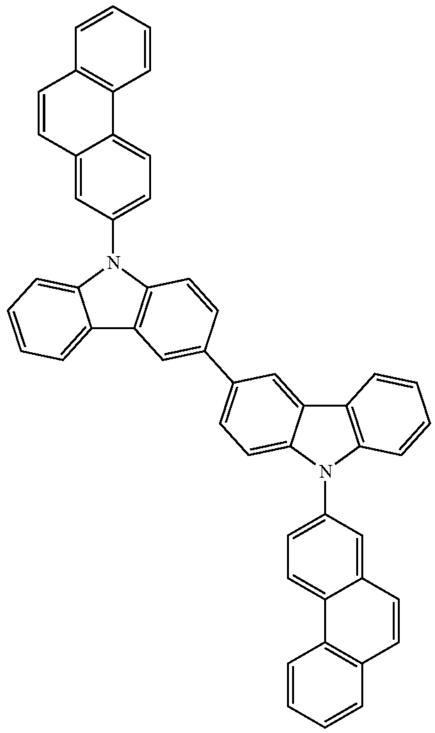
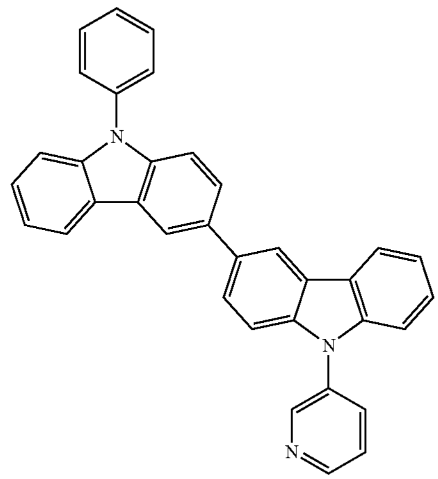
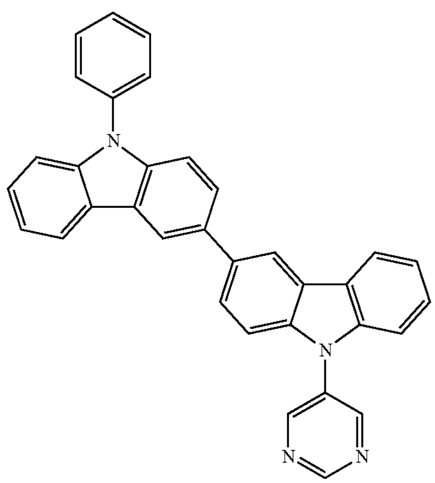
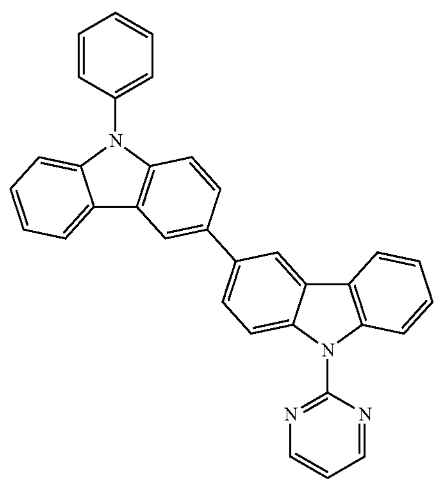
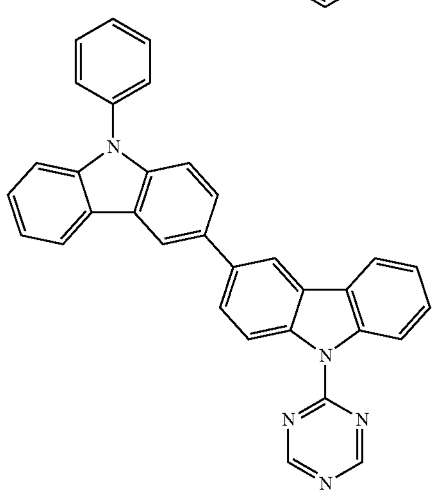
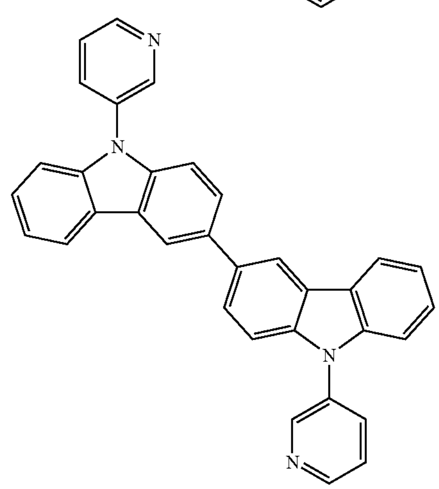

-continued
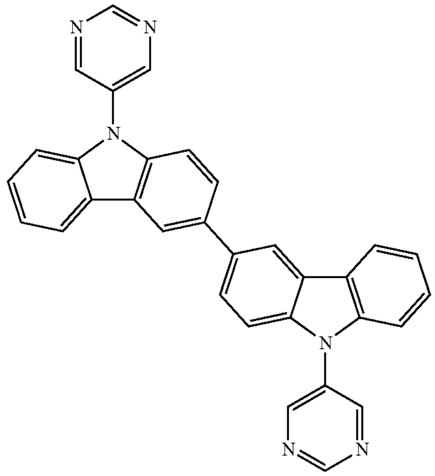
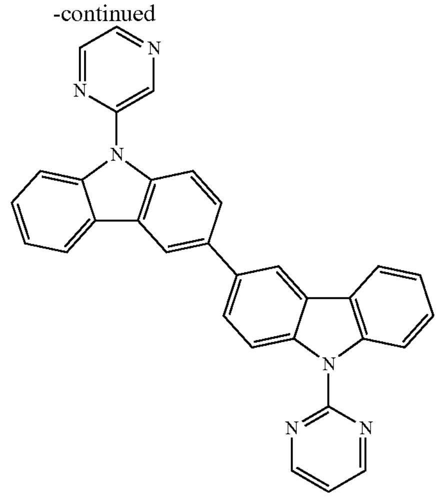
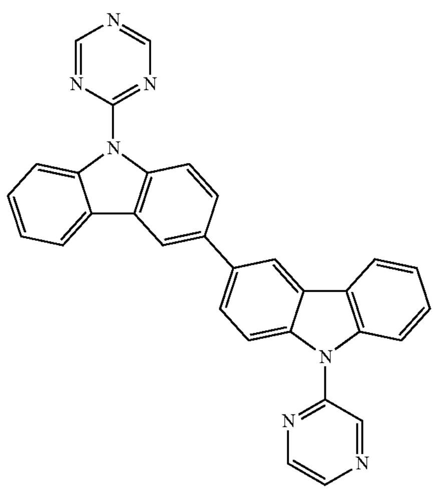
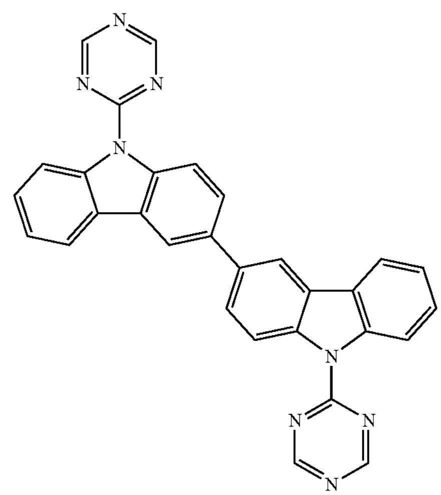
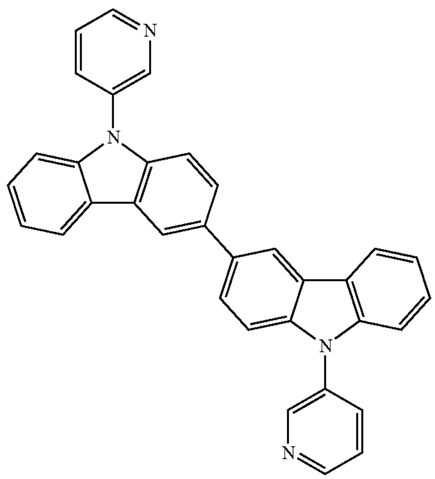
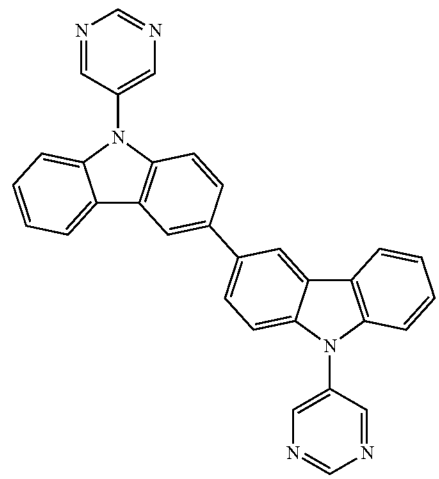

-continued
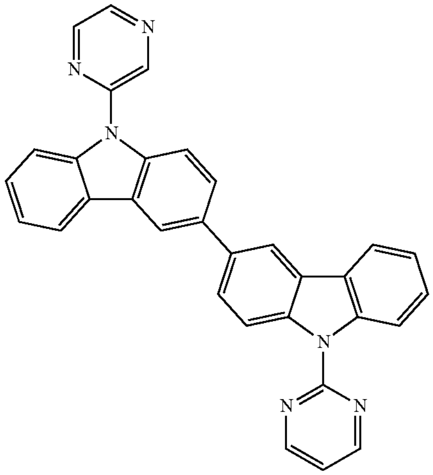
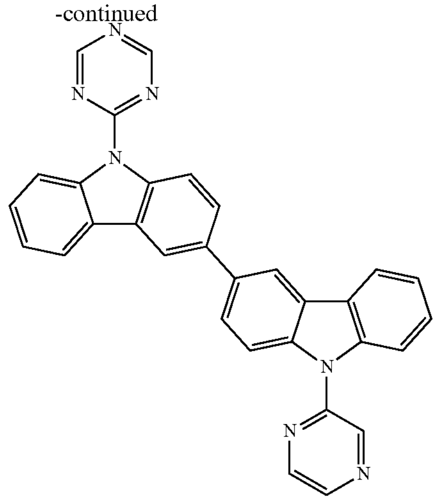
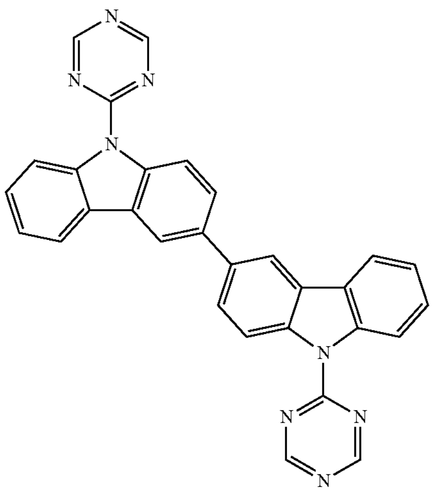
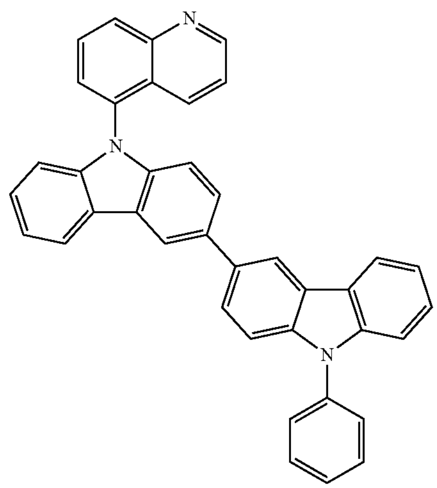
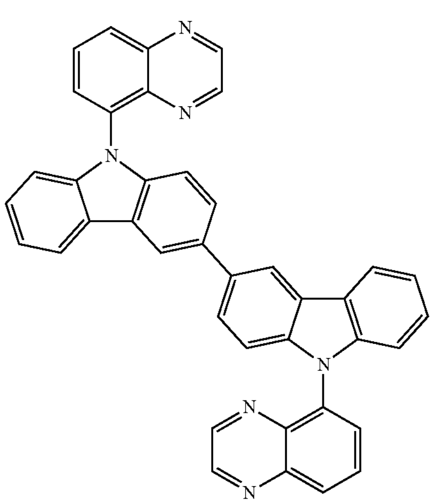
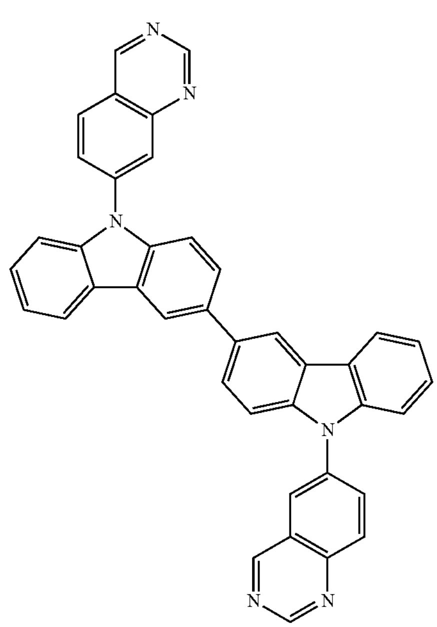

-continued
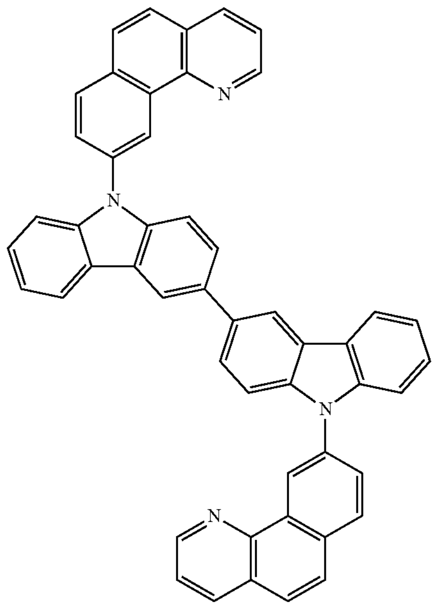
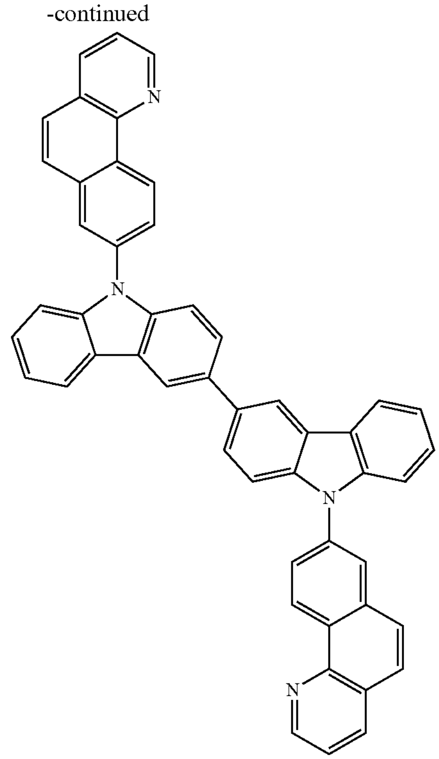
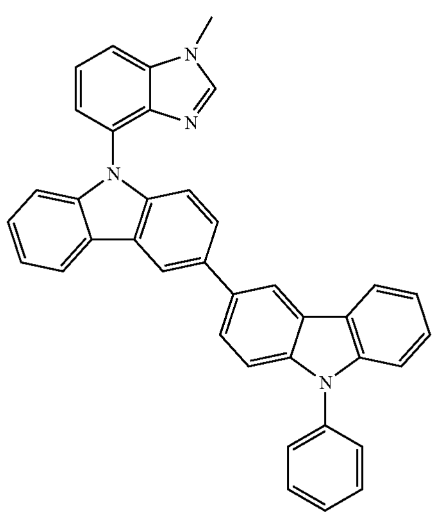
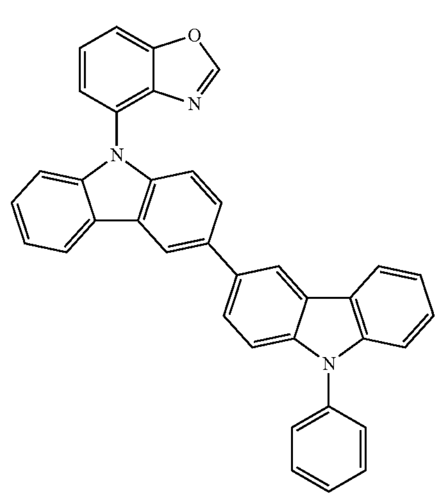

-continued
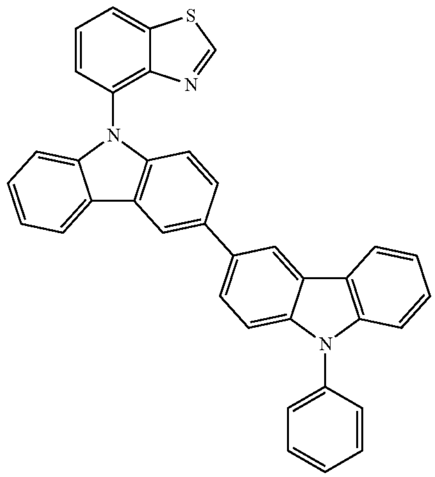
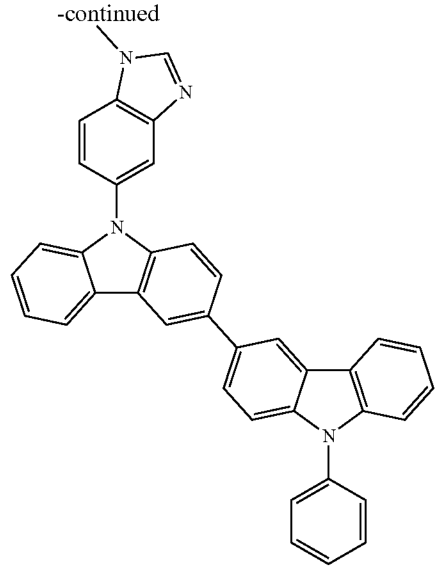
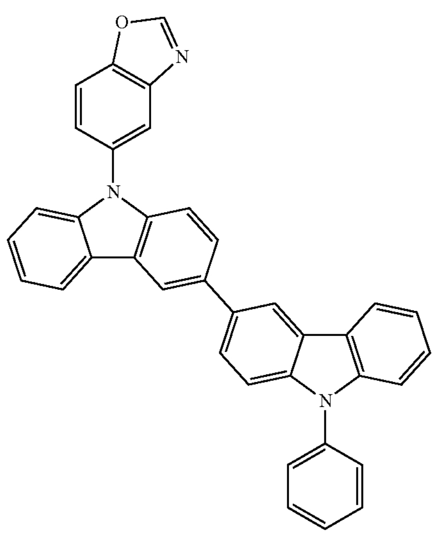
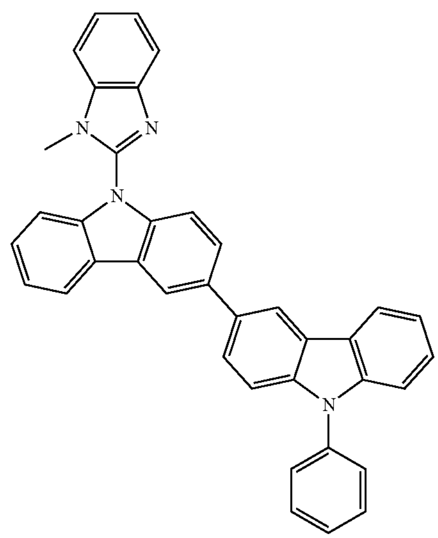
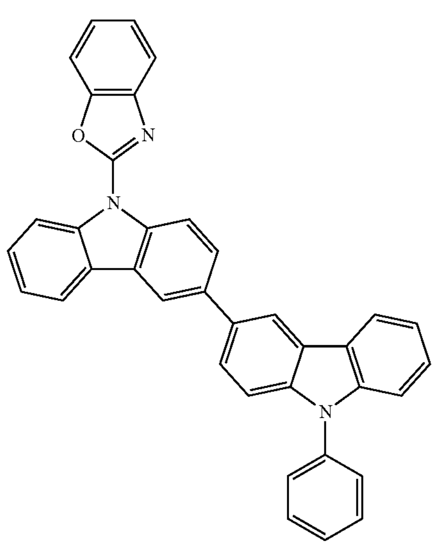
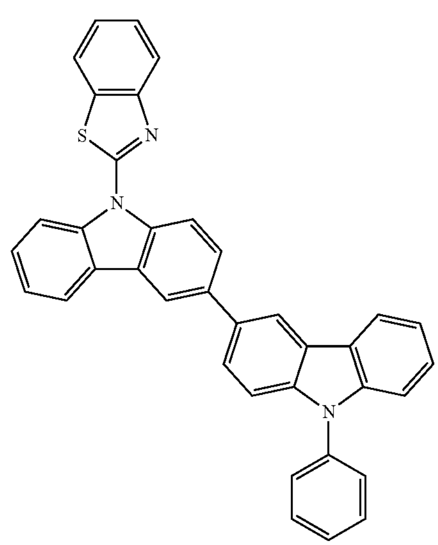

-continued
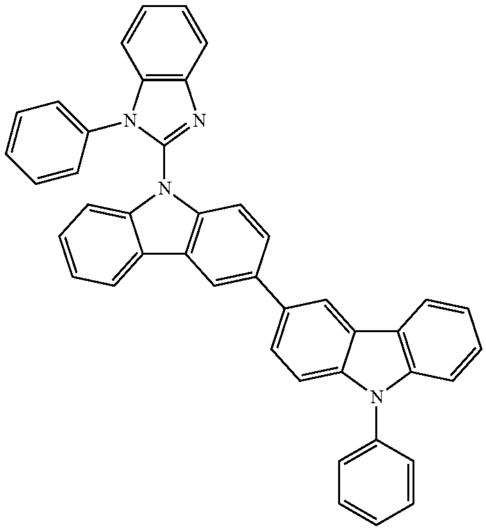
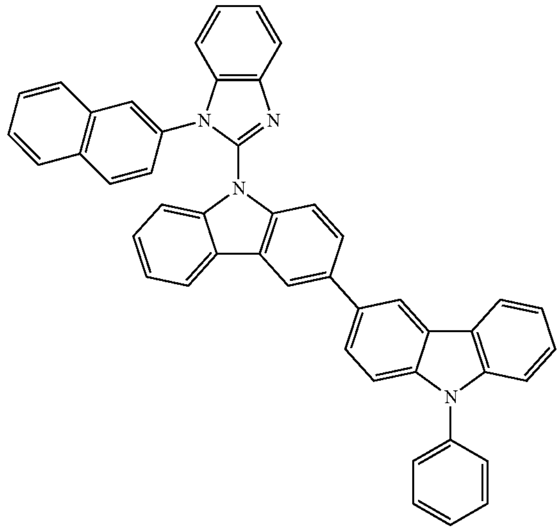
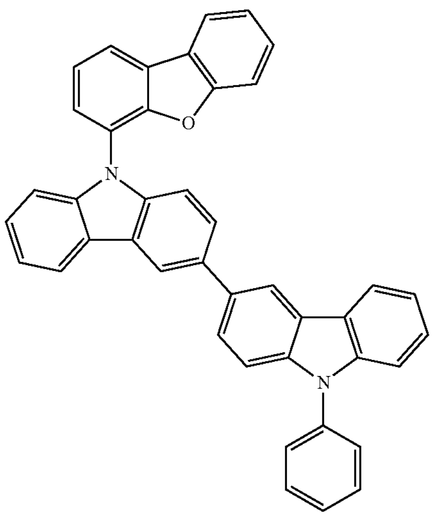
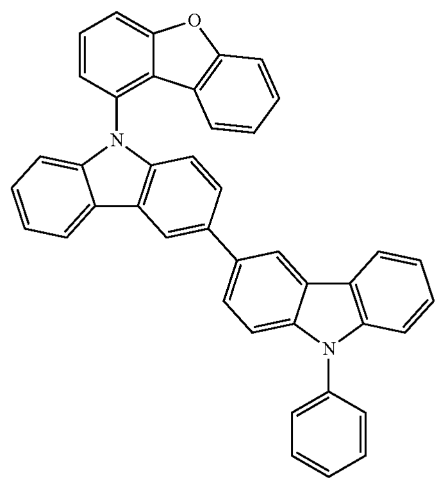
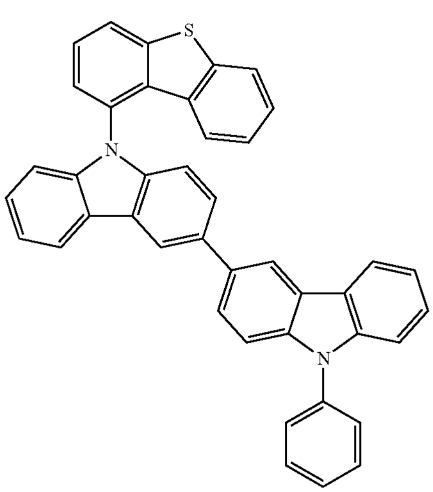
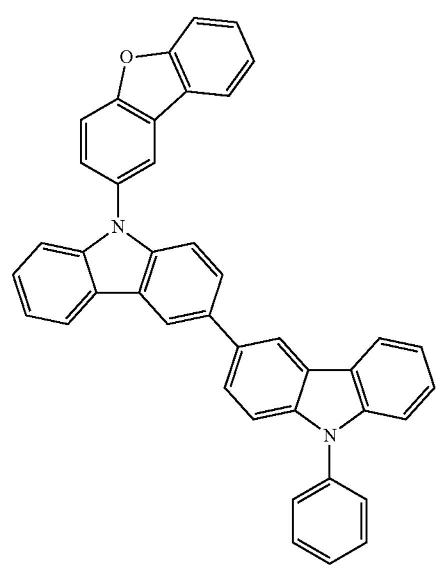

-continued
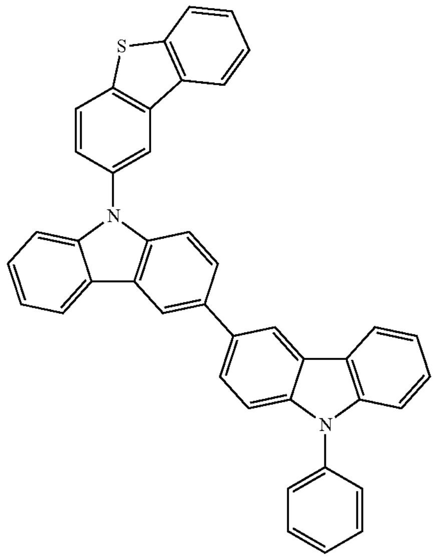
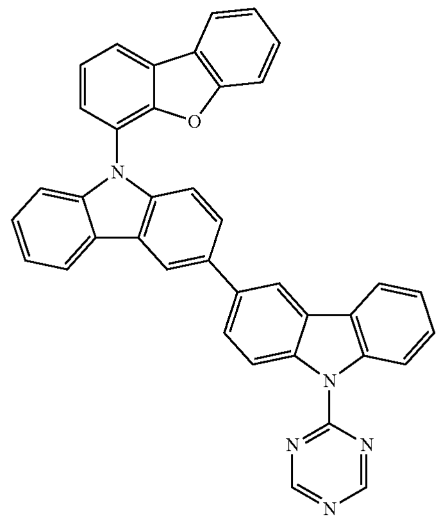
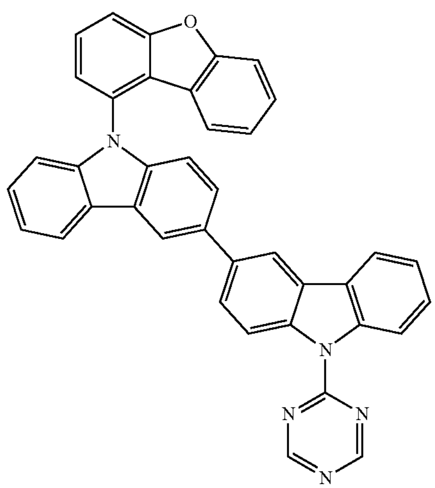
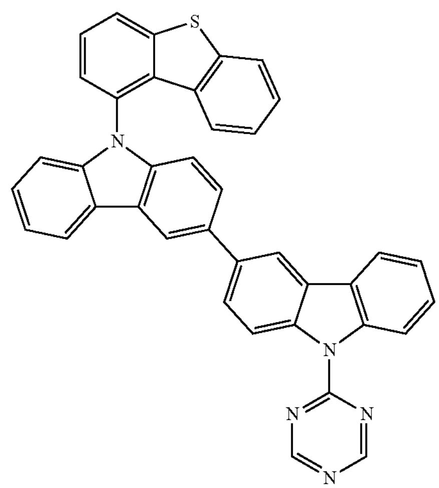
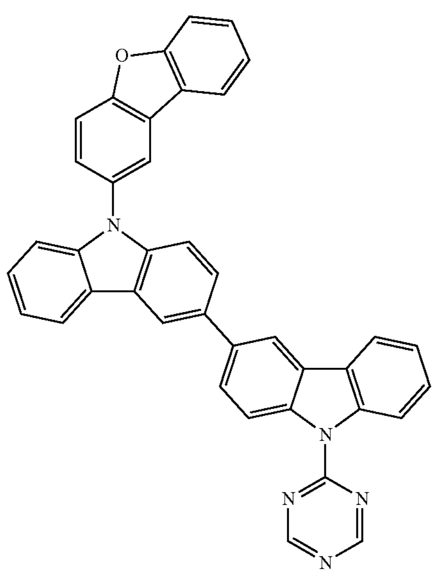
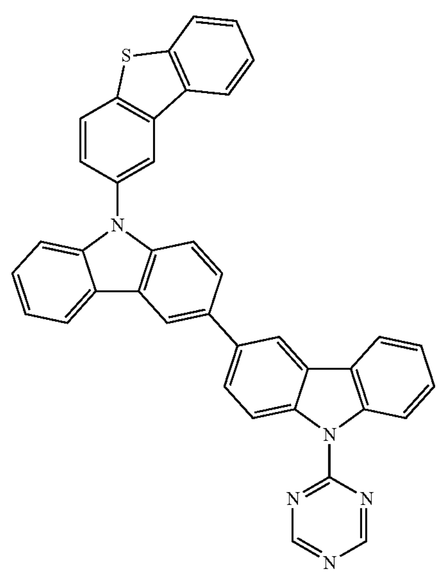

-continued
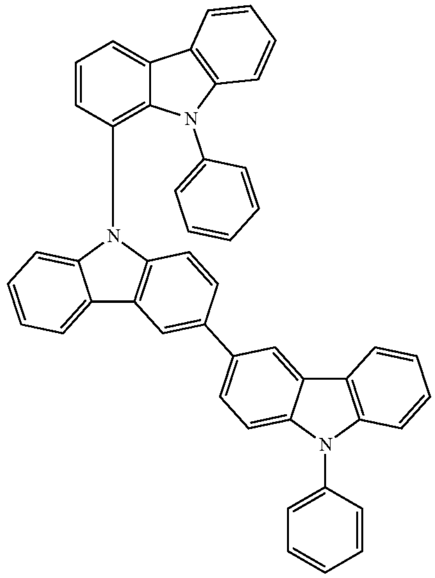
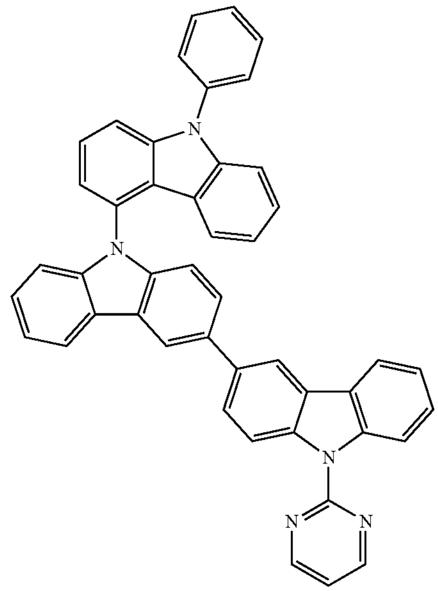
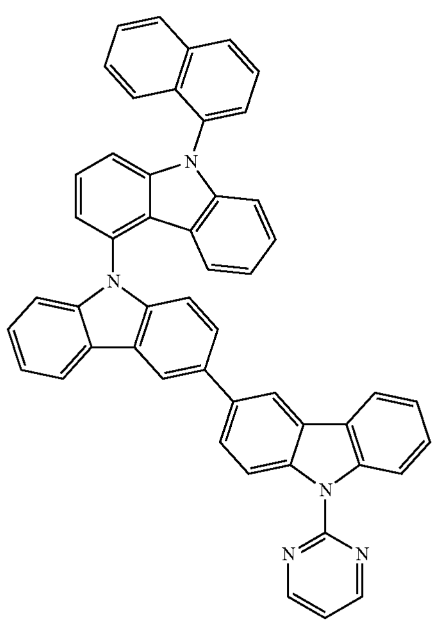
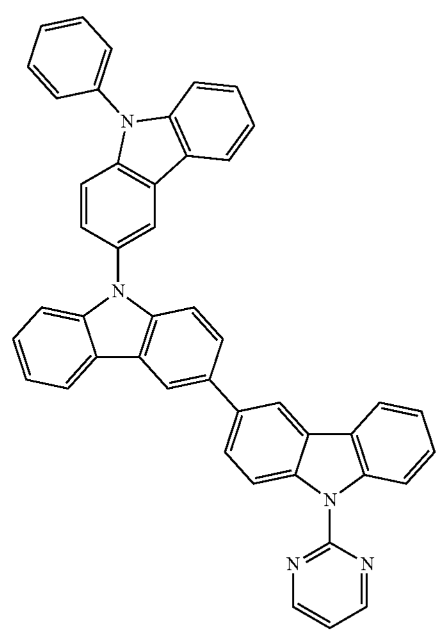

-continued
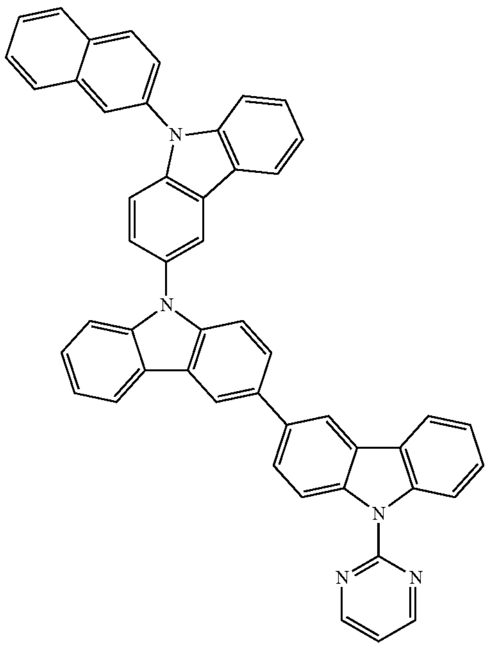
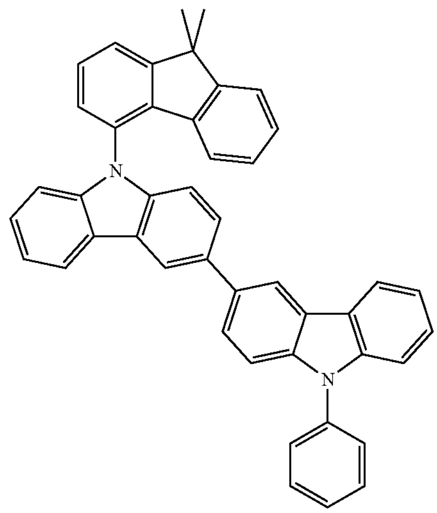
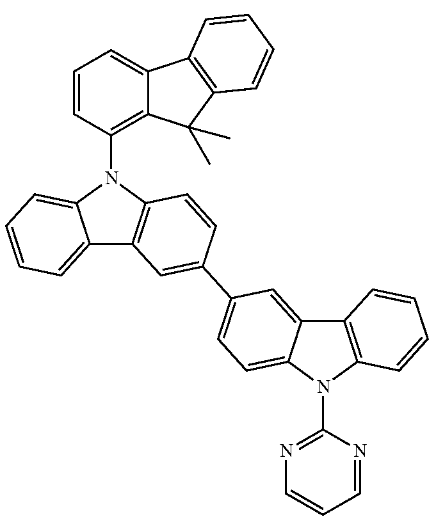
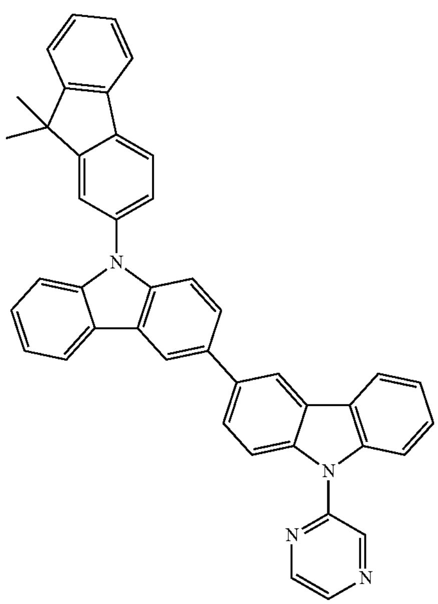

-continued
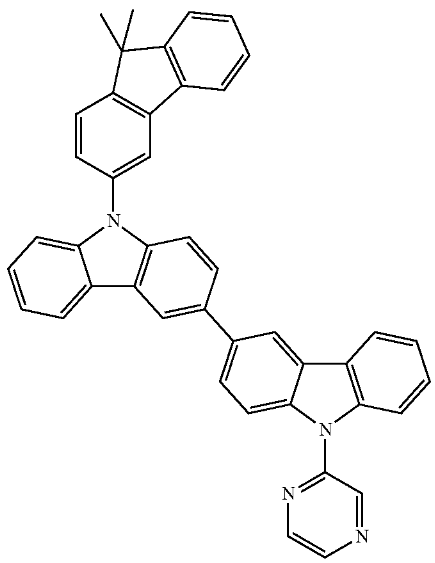
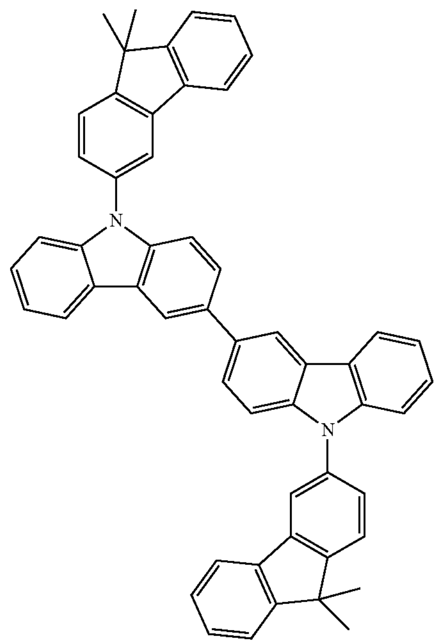
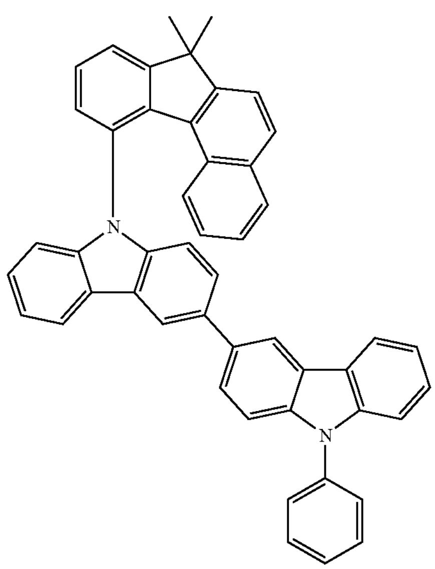
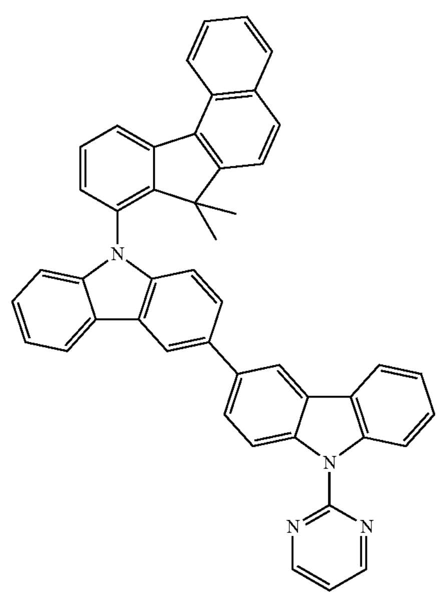

-continued
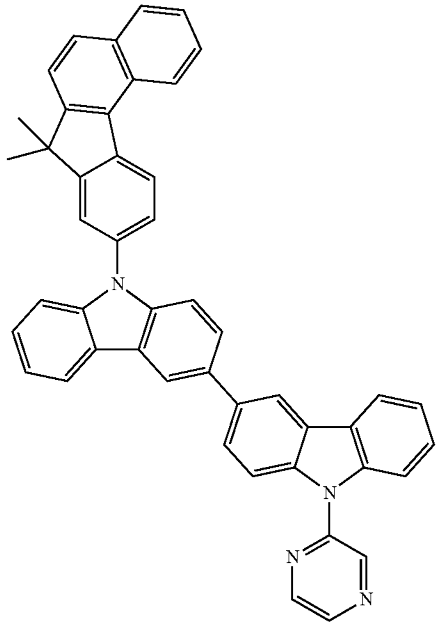
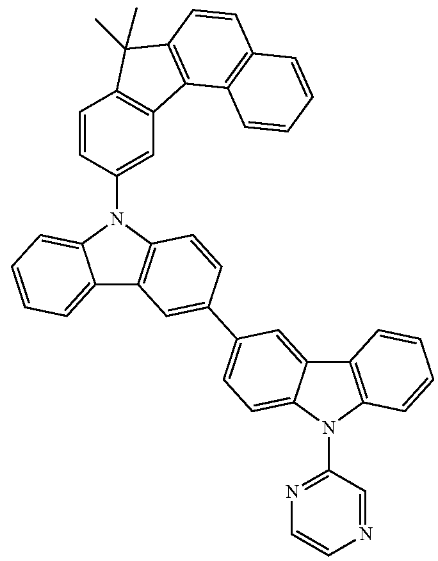
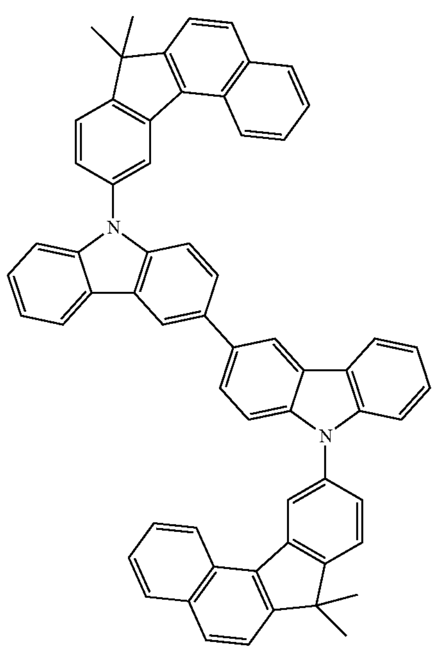
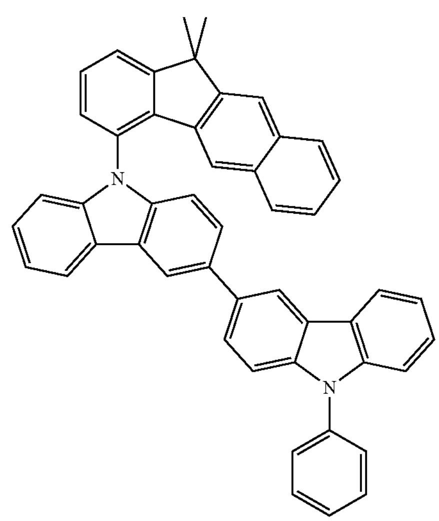

-continued
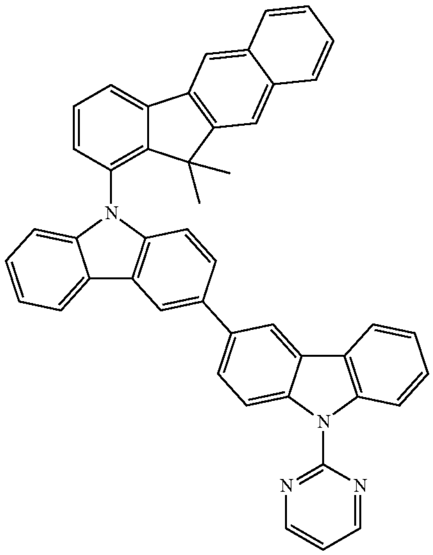
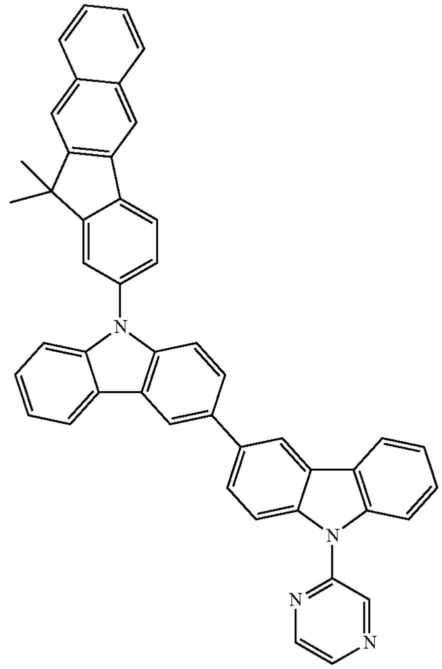
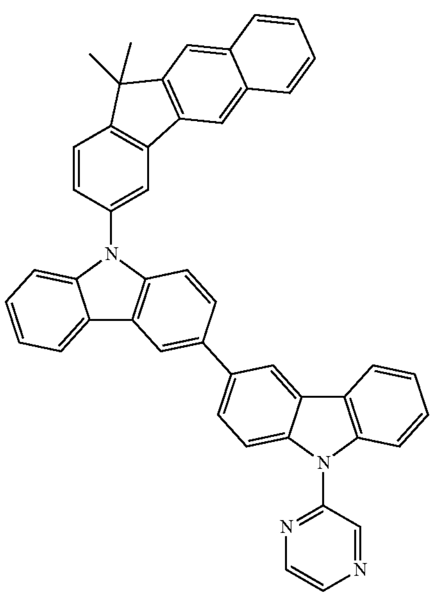
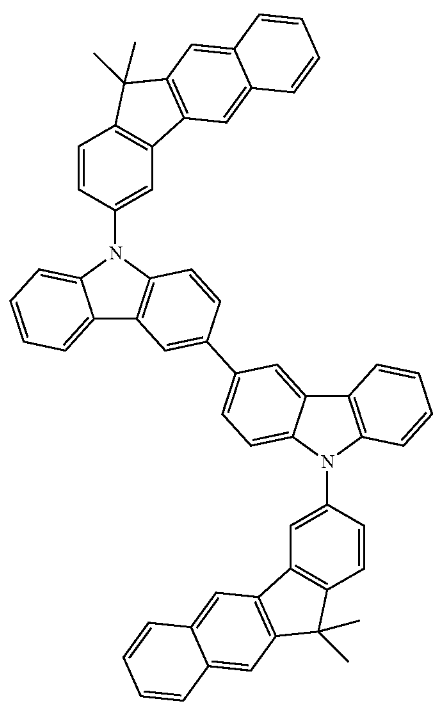

-continued
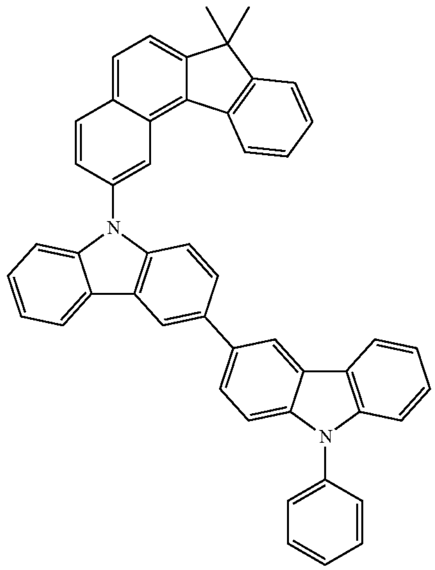
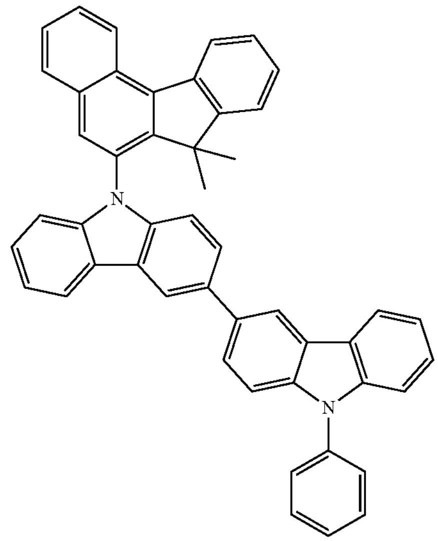
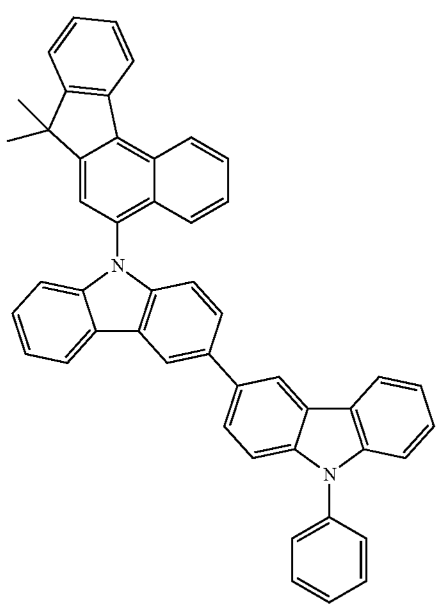
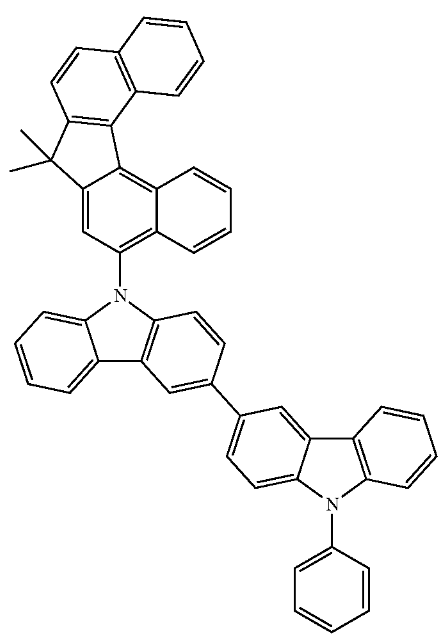

-continued
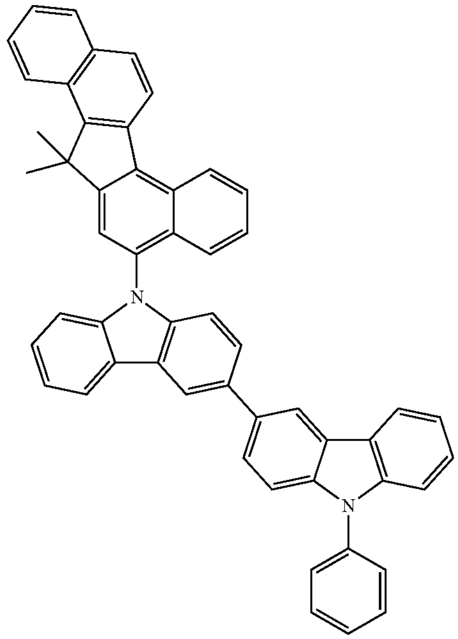
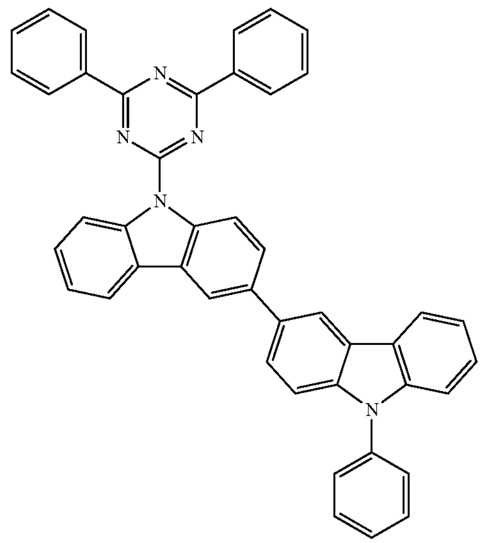
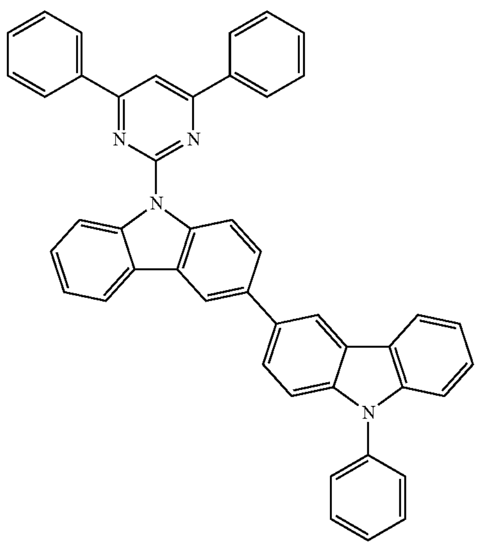
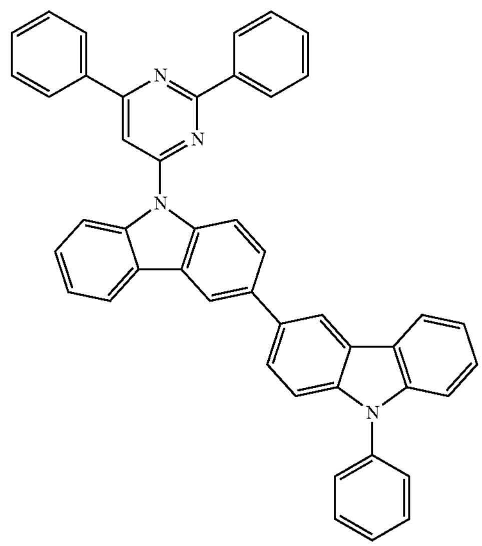
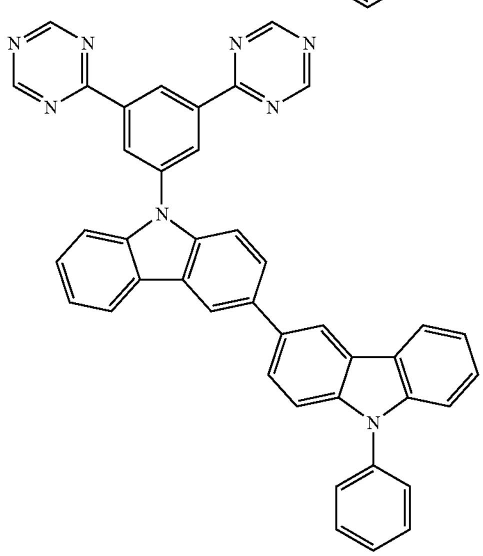
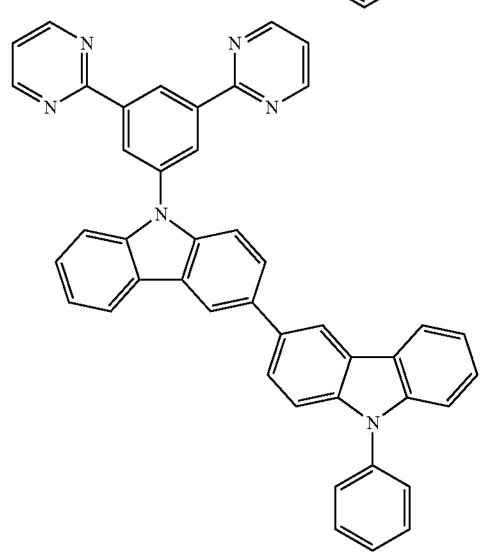

-continued
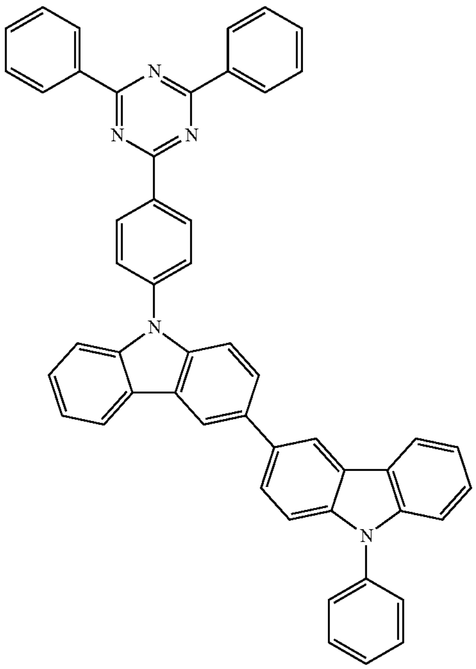
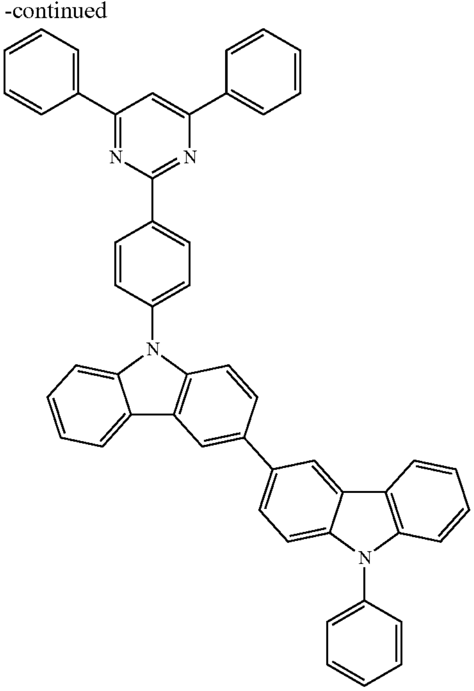
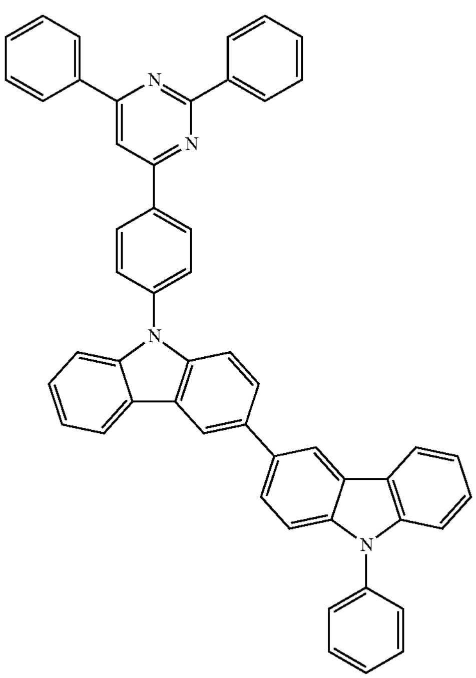
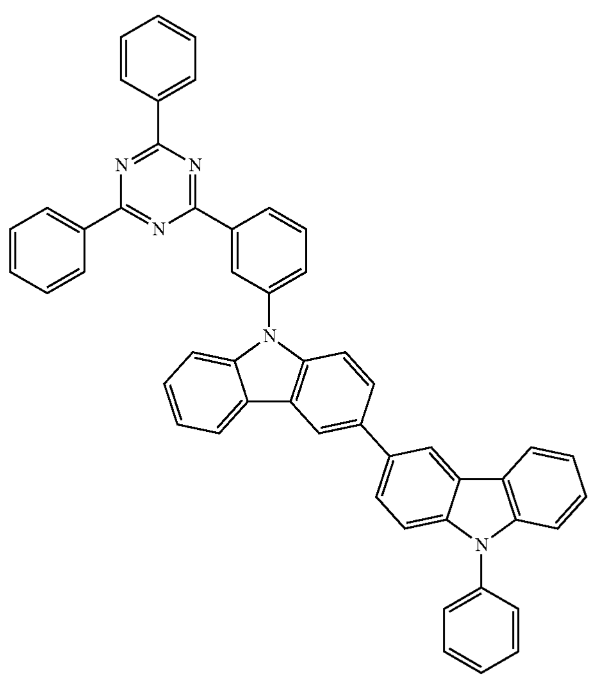

-continued
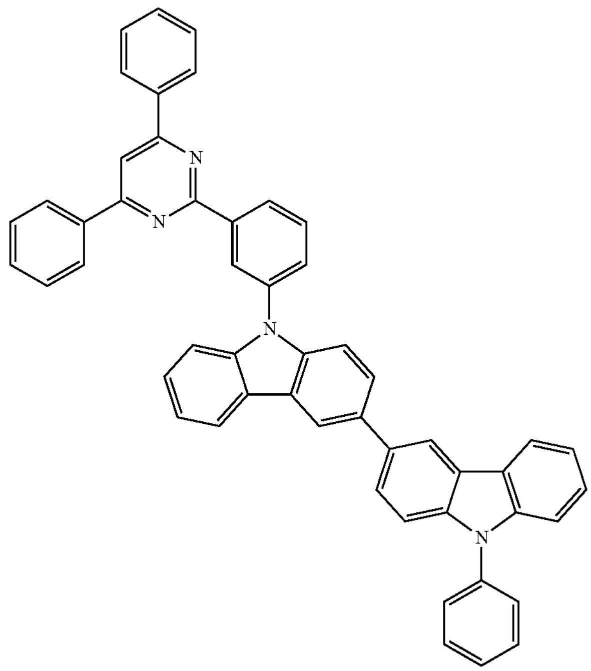
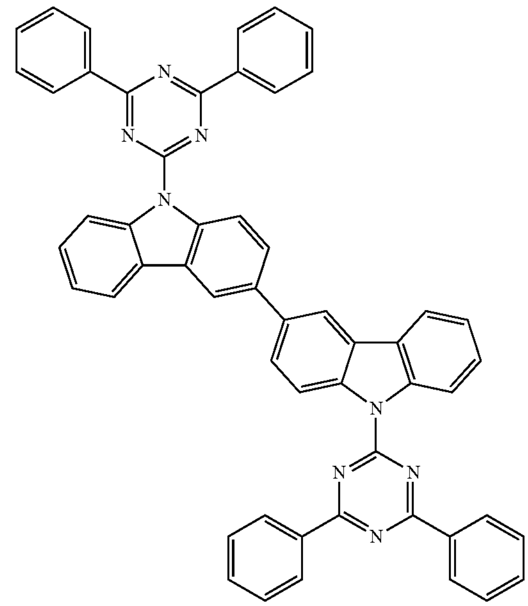
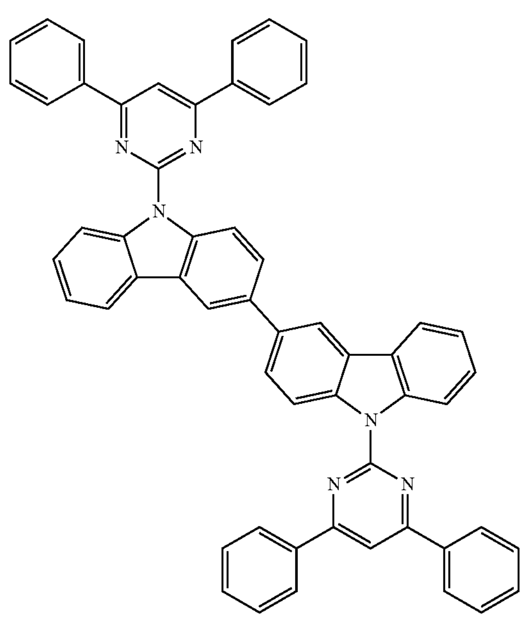
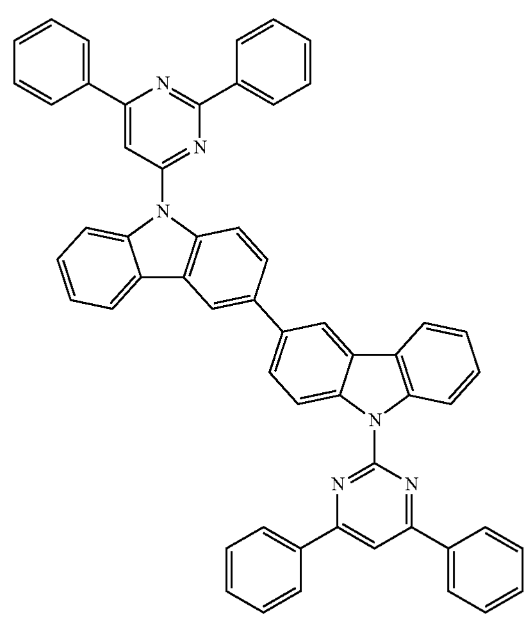

-continued
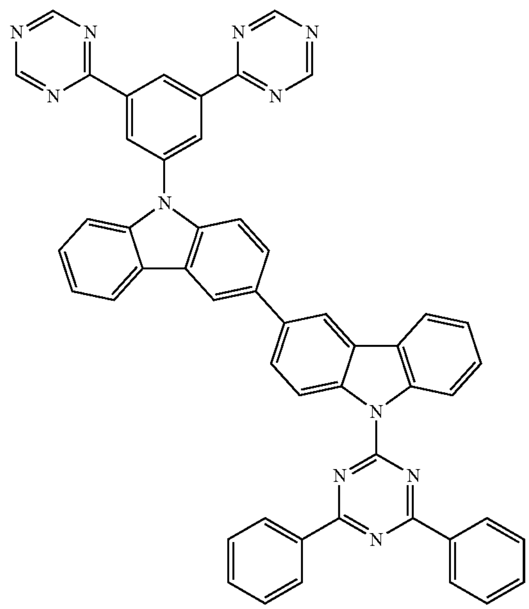
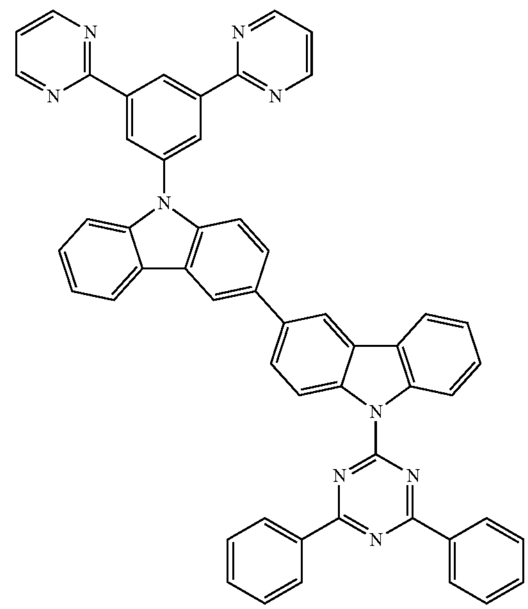
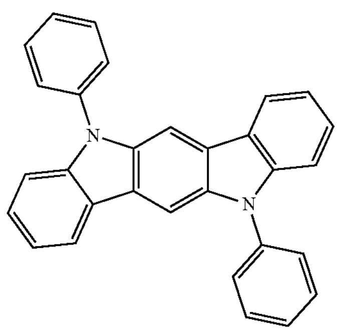
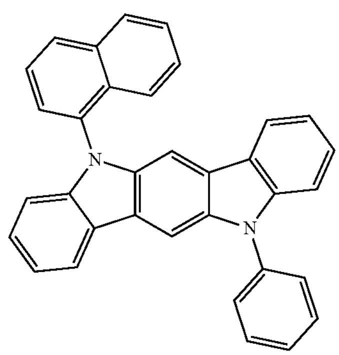
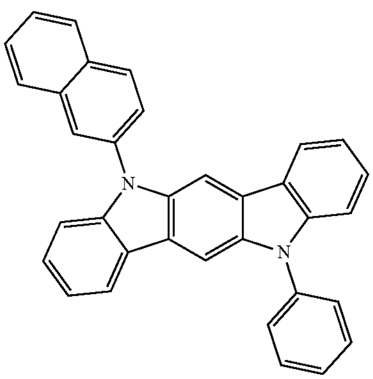
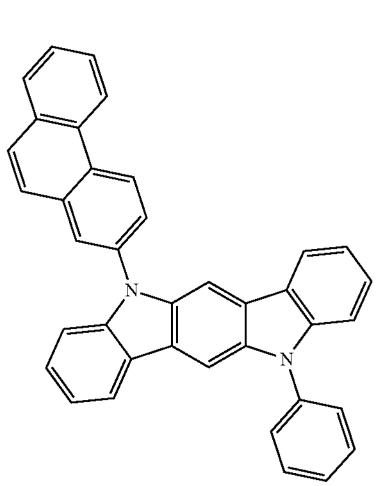
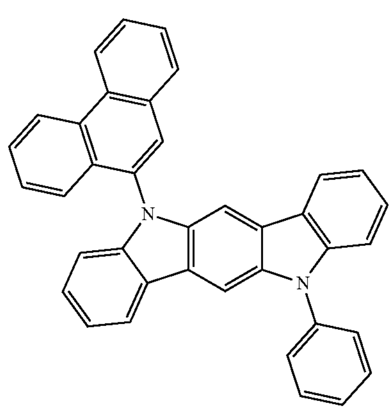

-continued
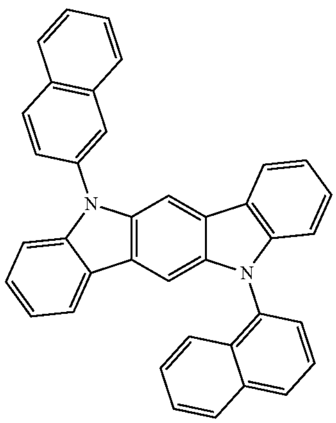
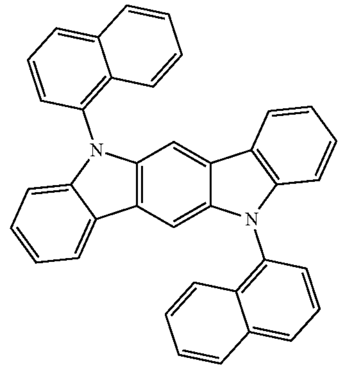
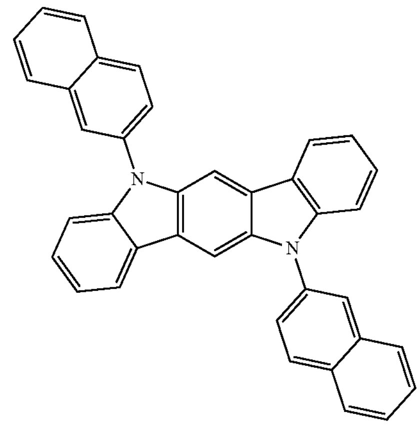
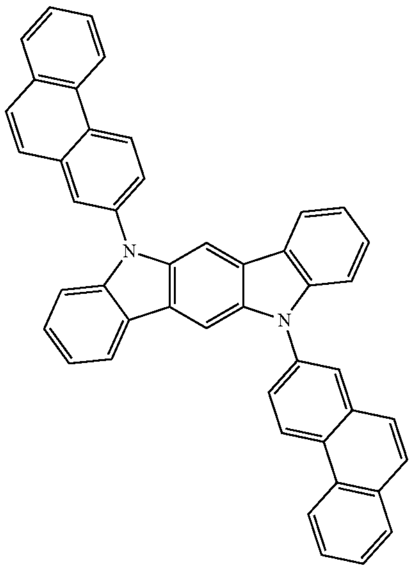
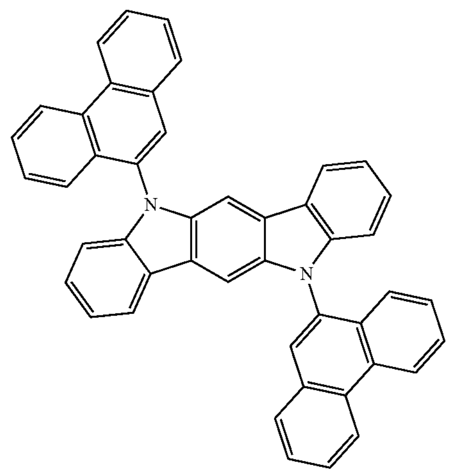
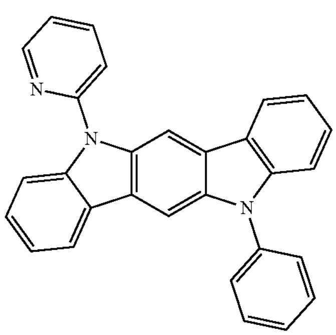
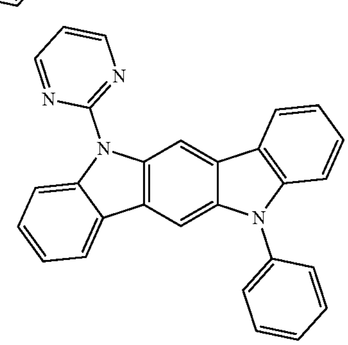
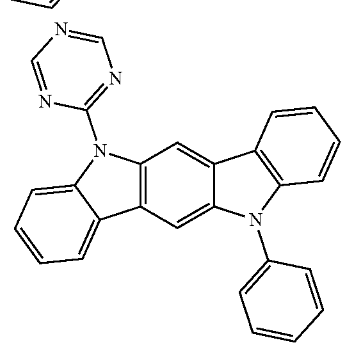
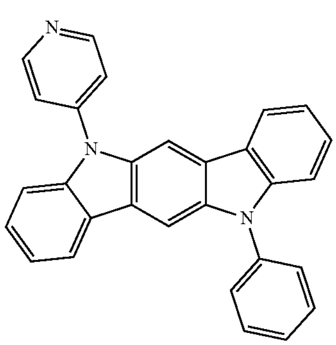
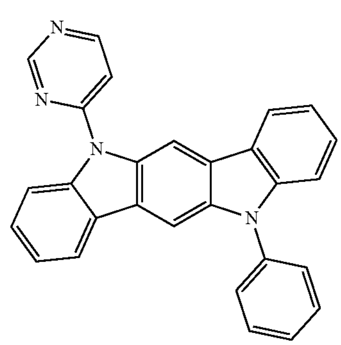
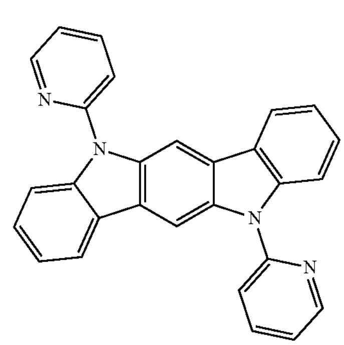

-continued
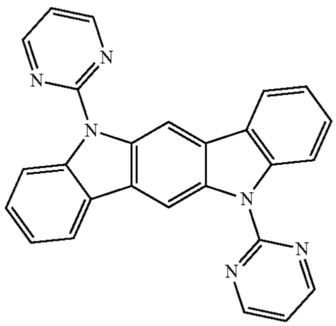
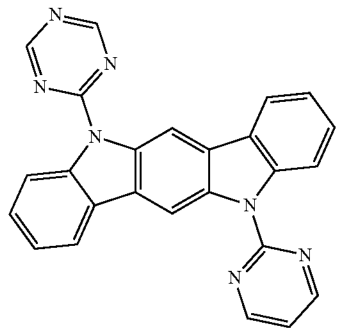
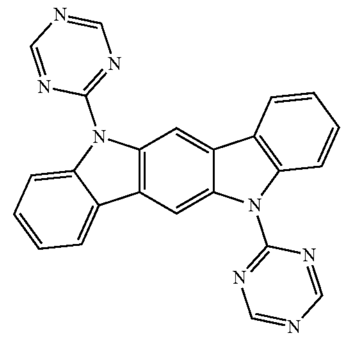
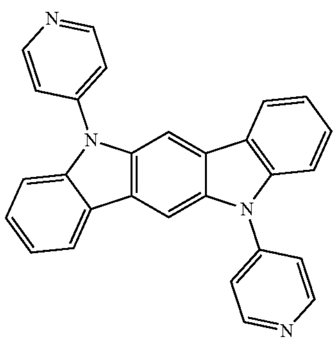
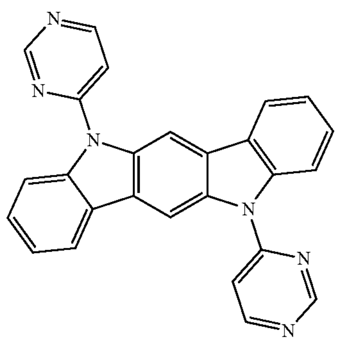
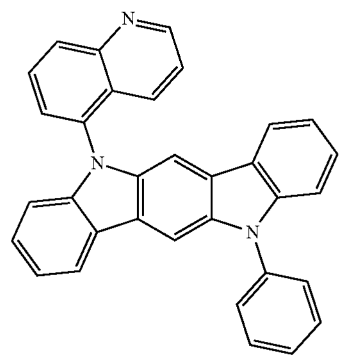
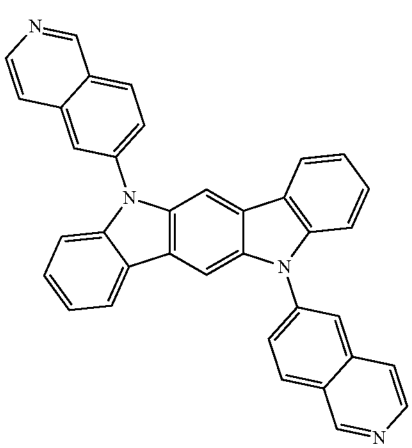
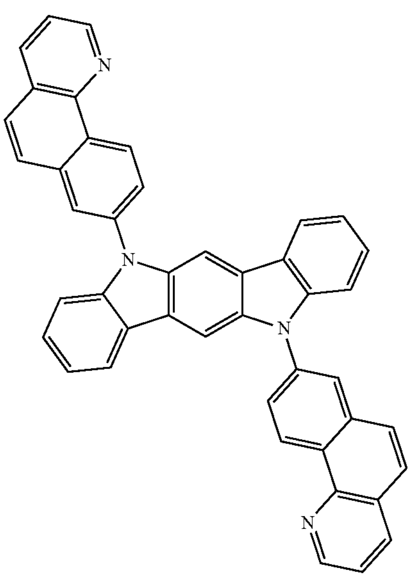

-continued
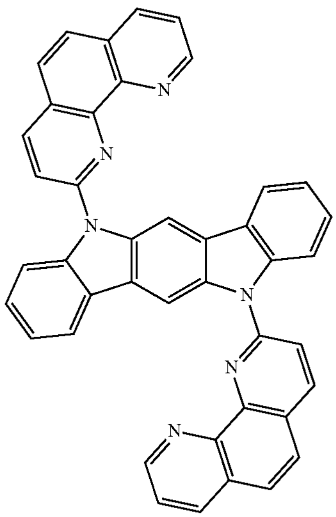
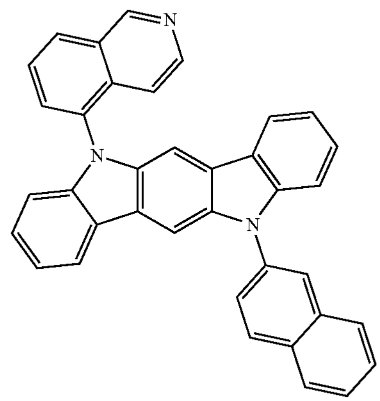
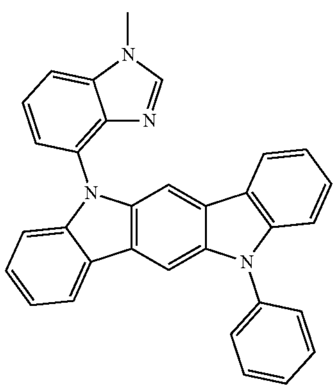
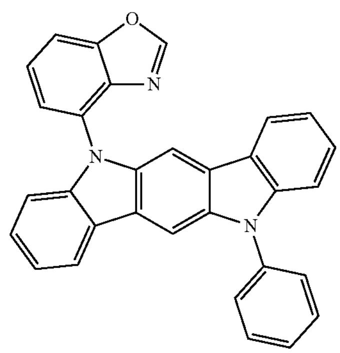
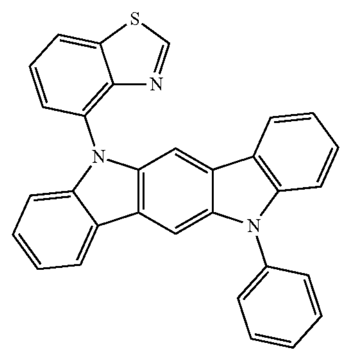
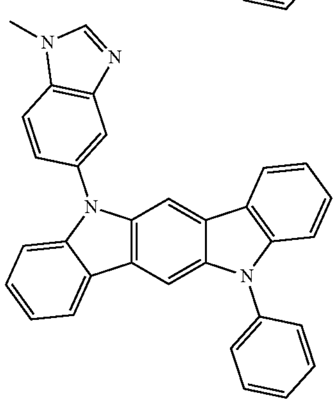
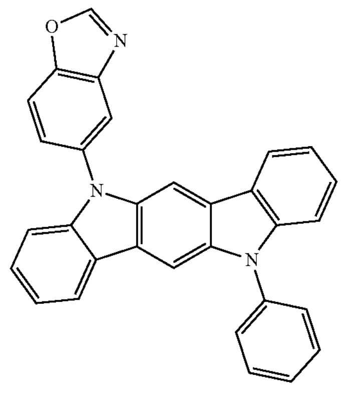
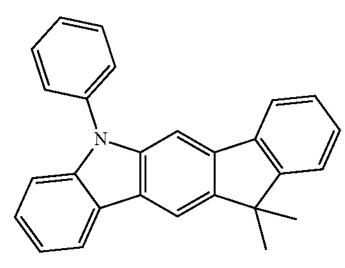
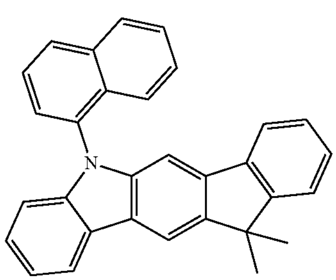
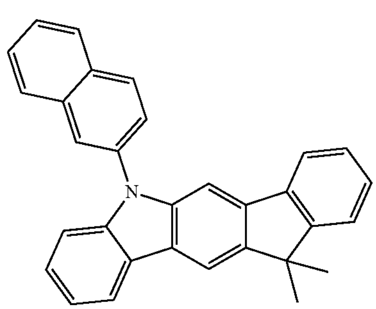
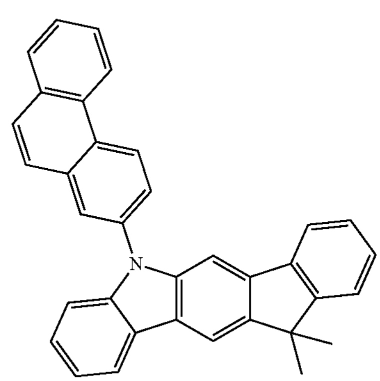

-continued
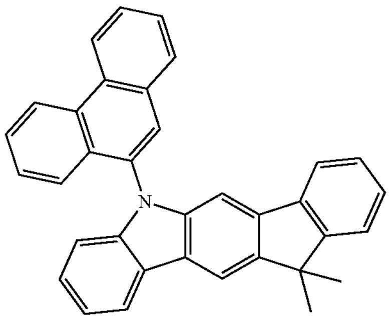
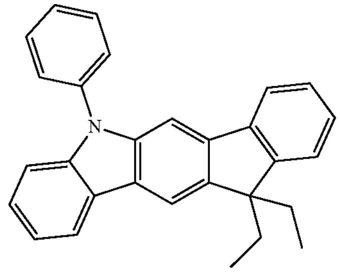
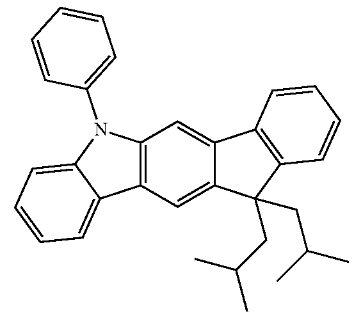
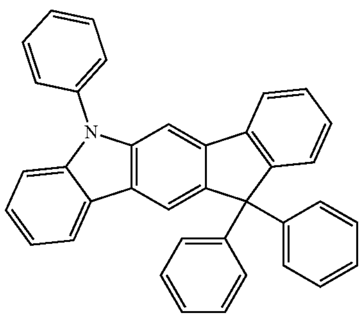
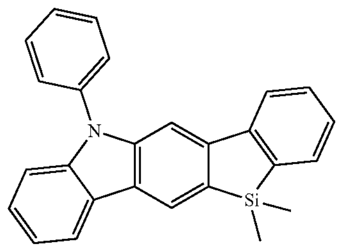
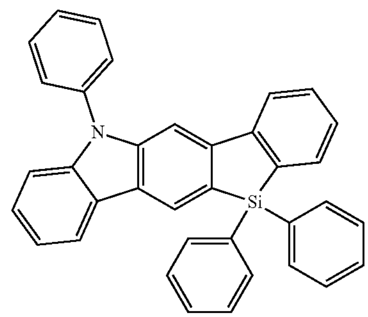
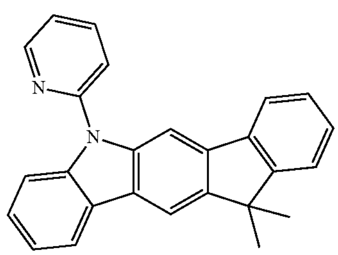
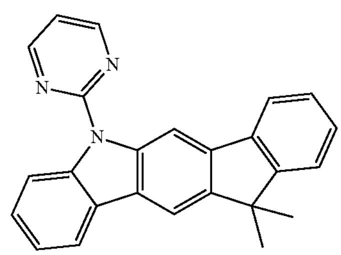
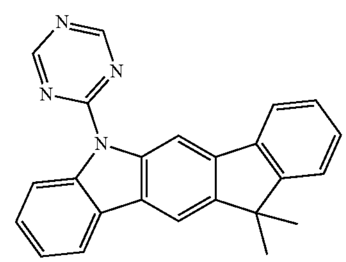
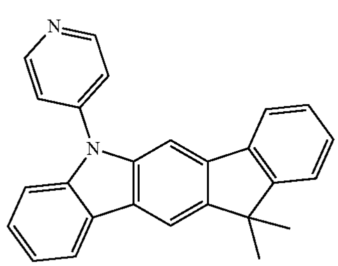
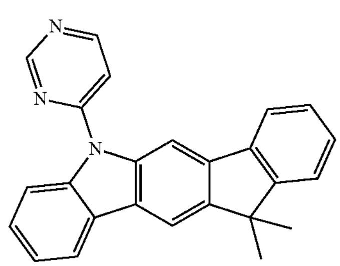
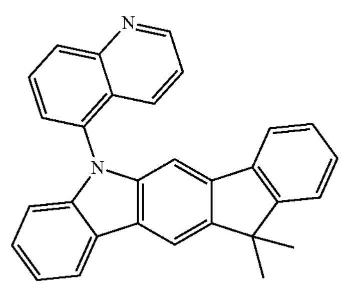
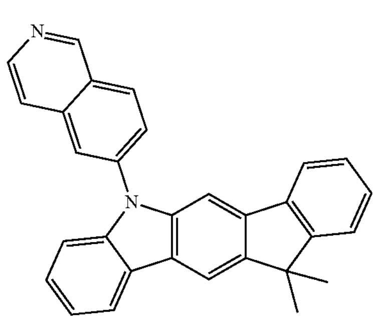
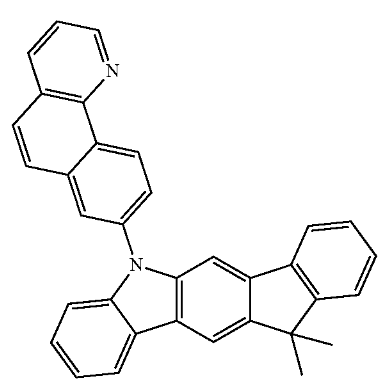
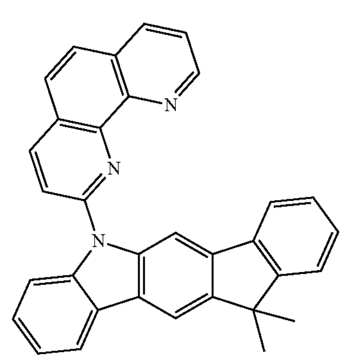

-continued
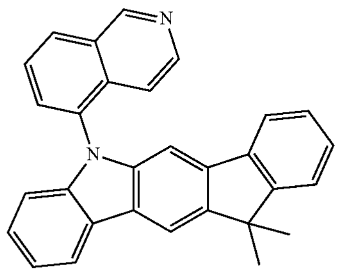
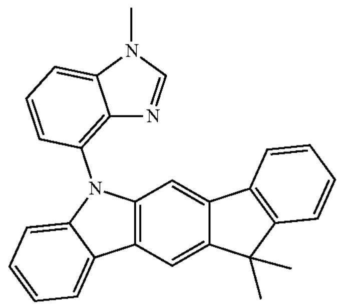
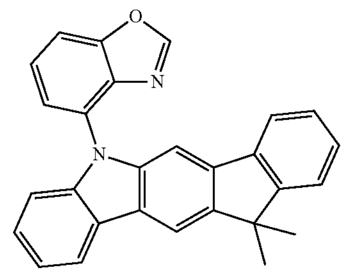
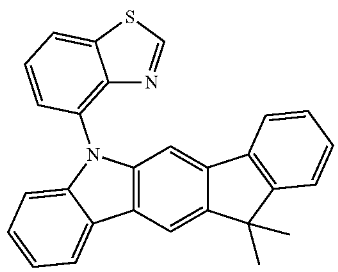
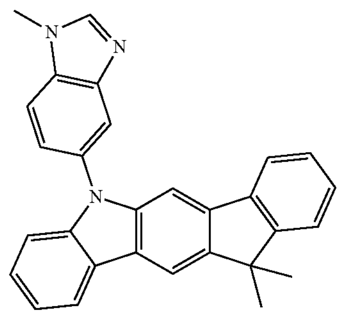
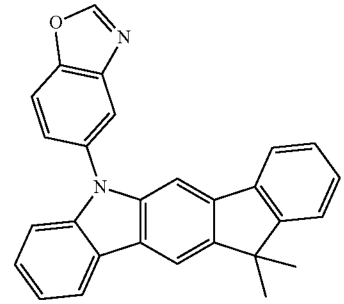
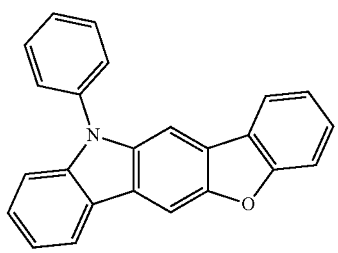
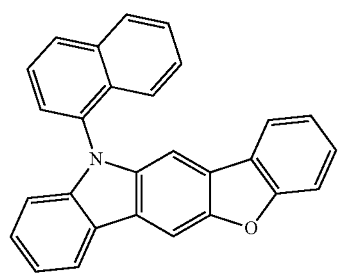
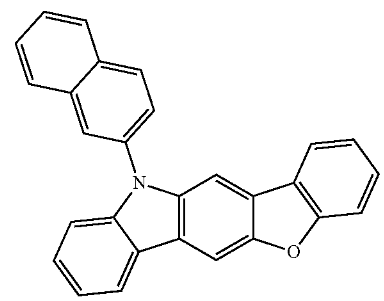
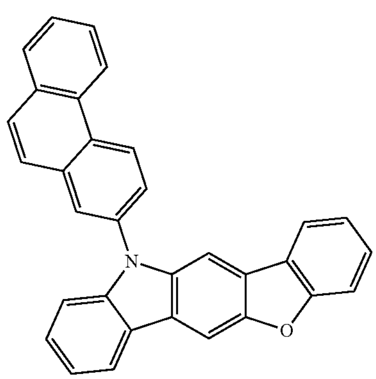
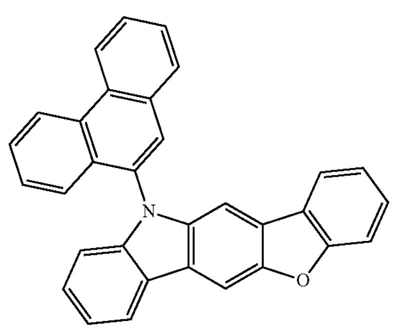
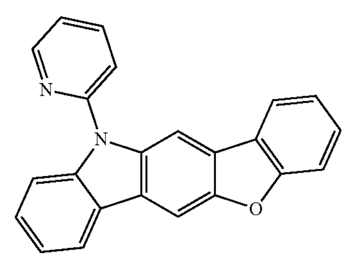
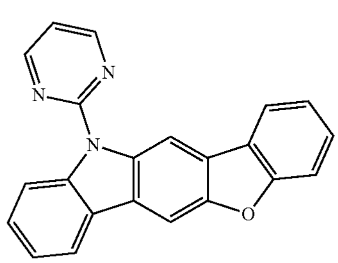
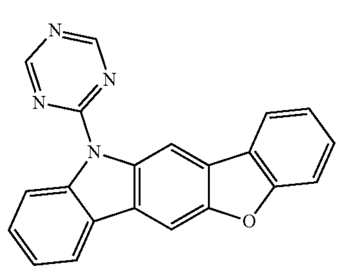
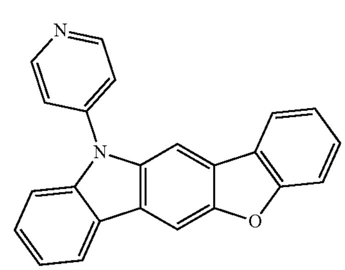

-continued
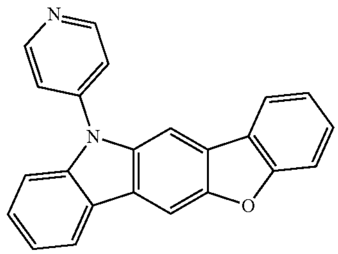
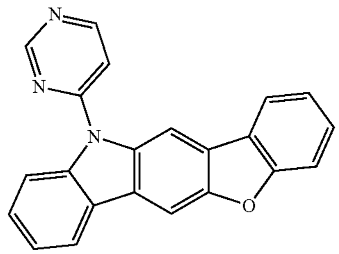
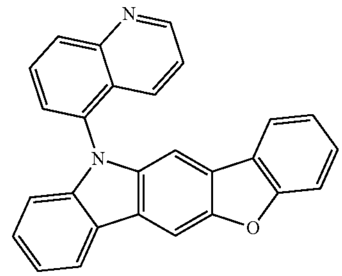
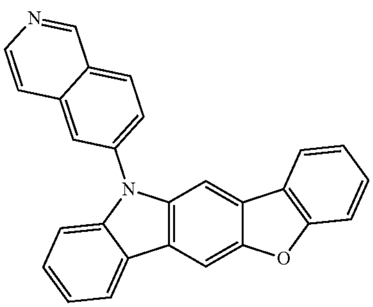
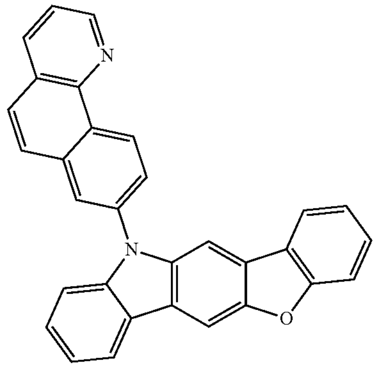
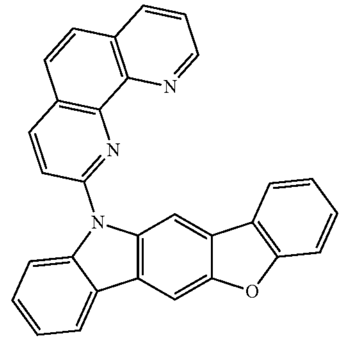
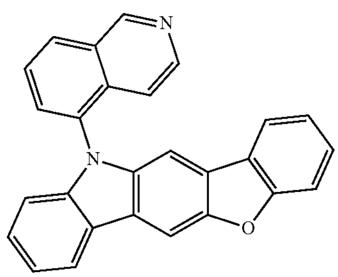
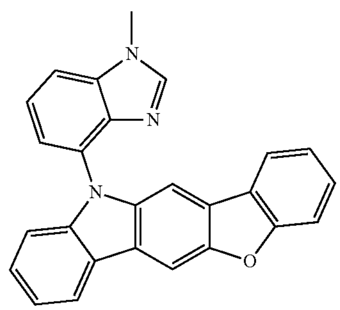
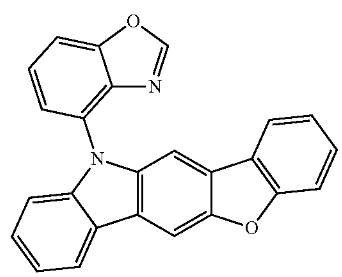
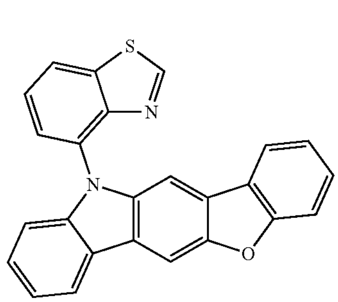
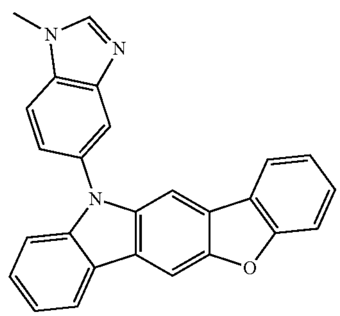
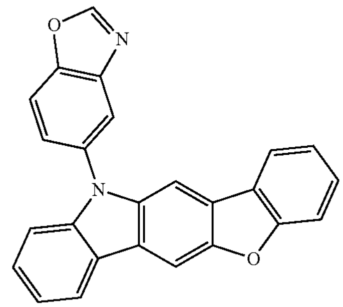
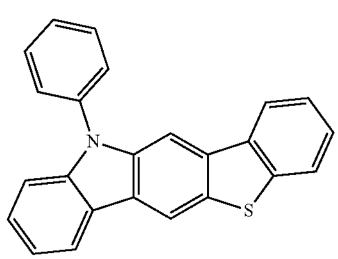
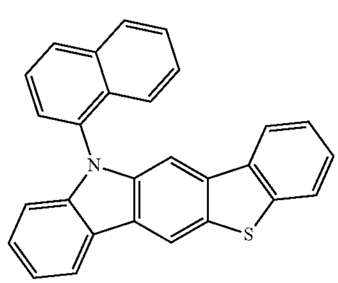
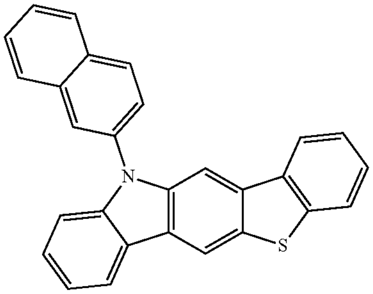

-continued
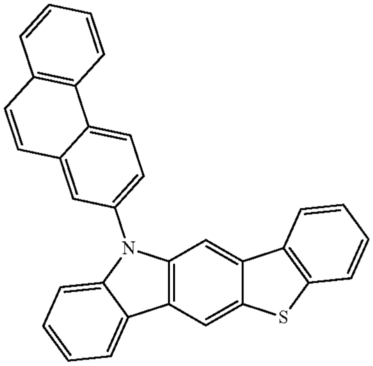
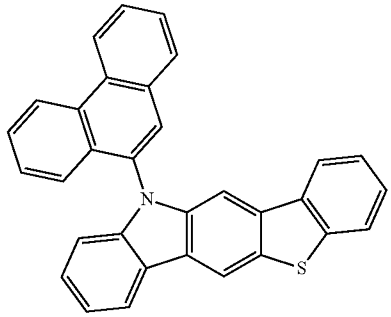
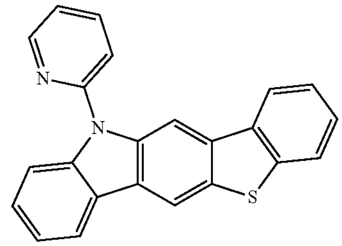
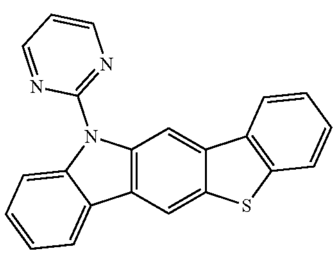
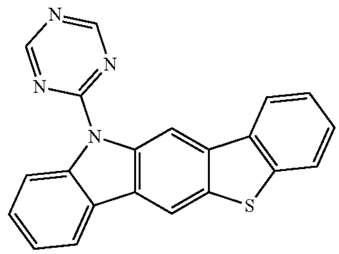
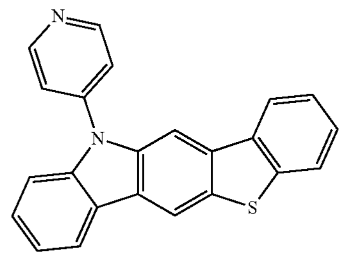
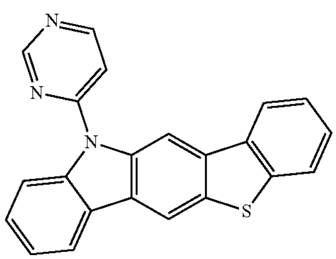
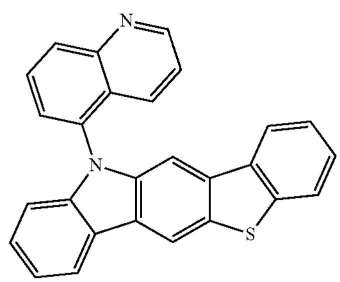
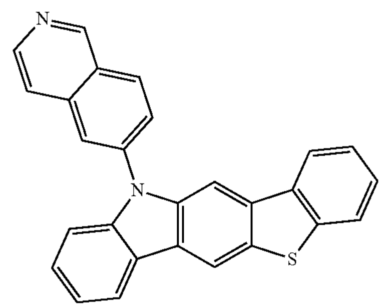
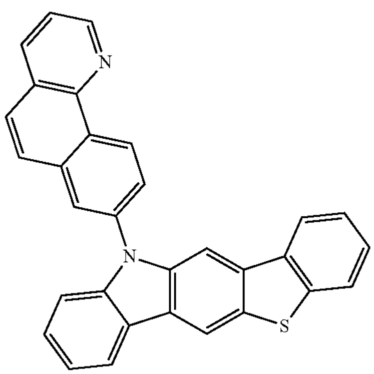
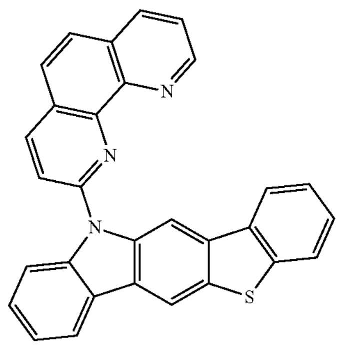
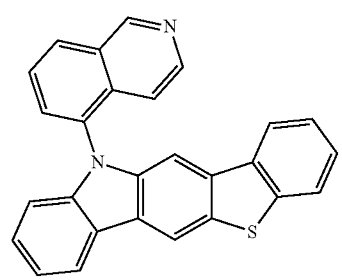
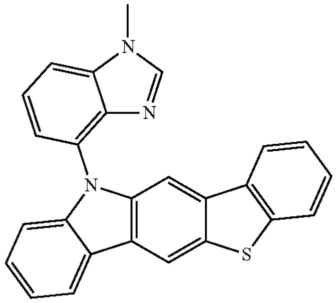
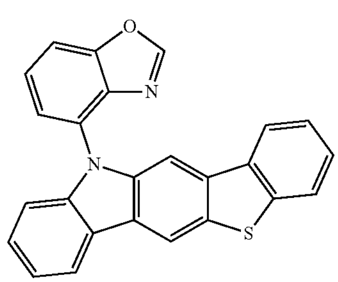
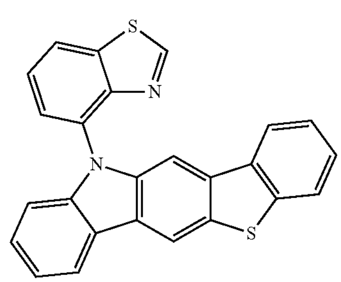

-continued
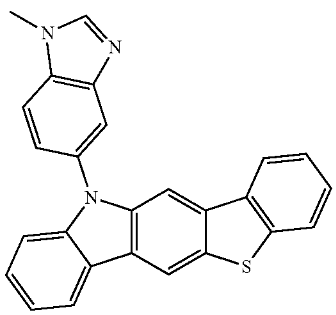
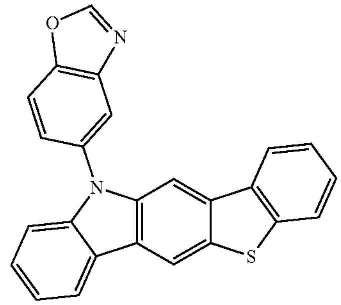
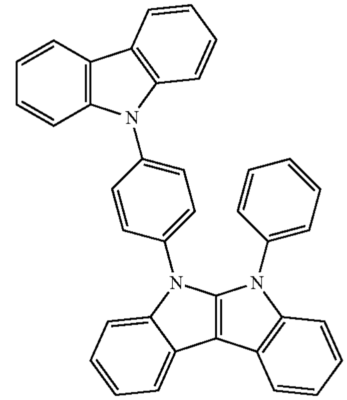
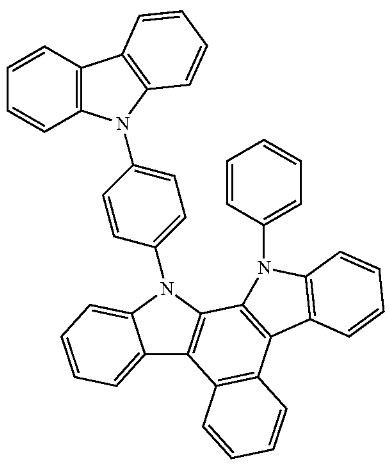
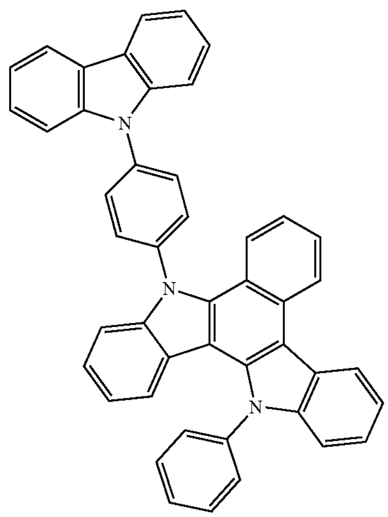
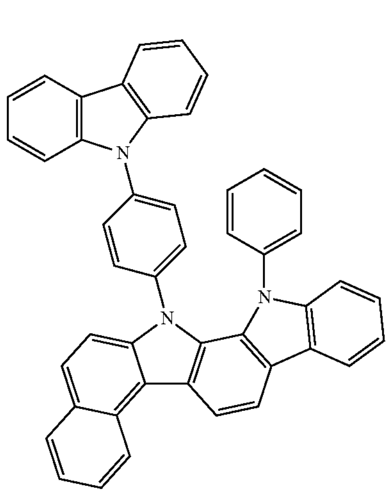
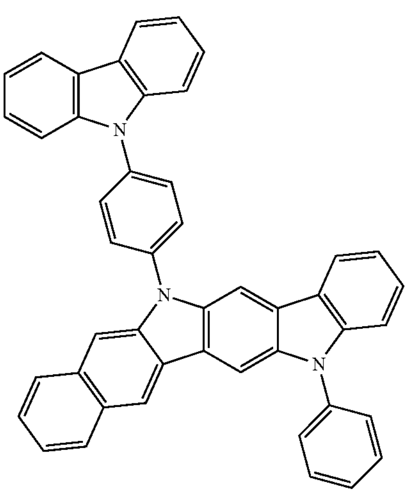

-continued
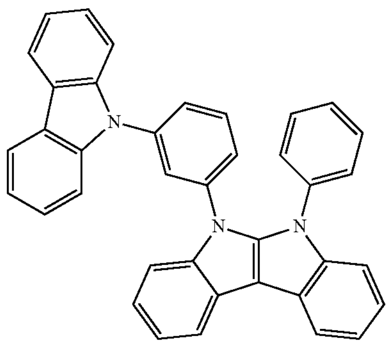
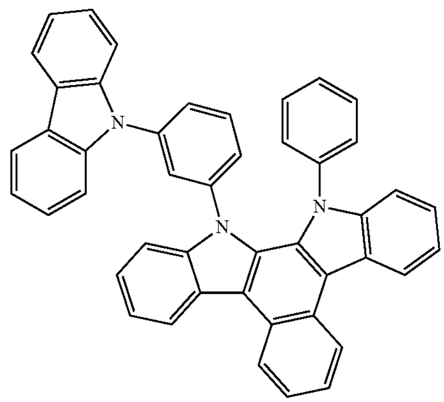
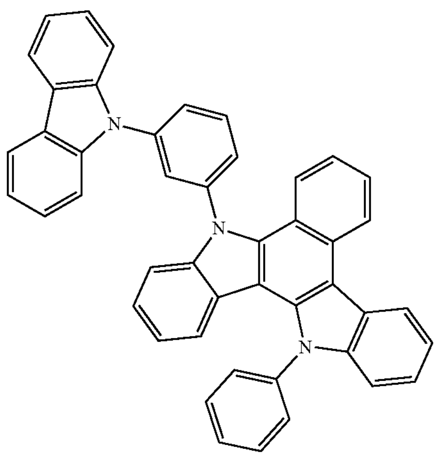
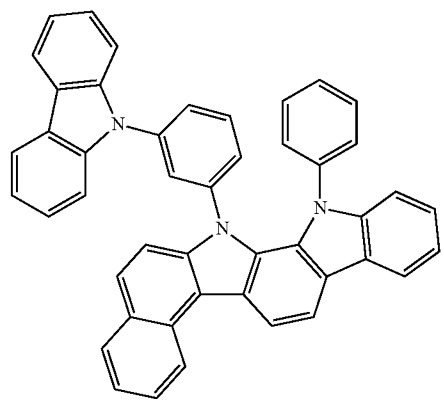
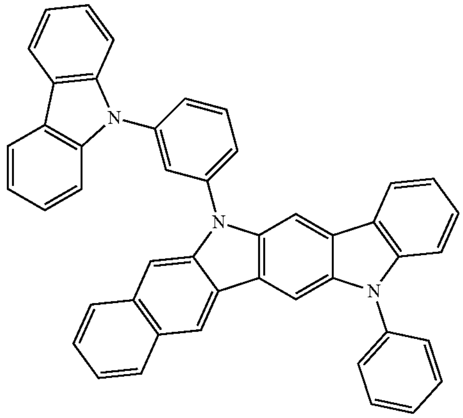
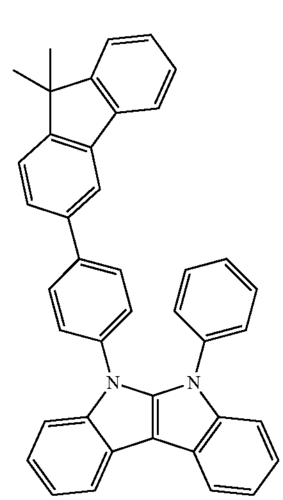
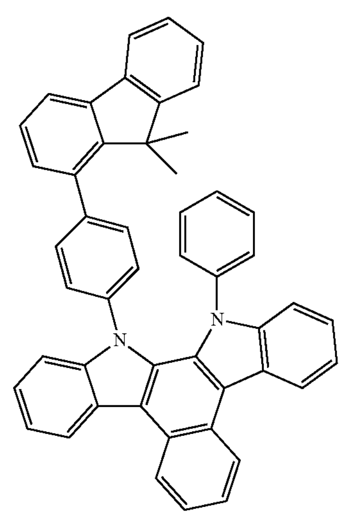

-continued
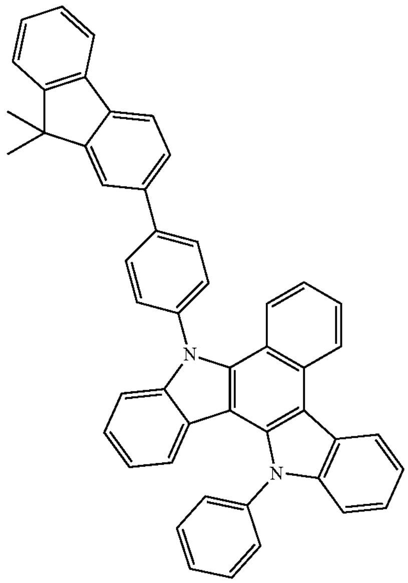
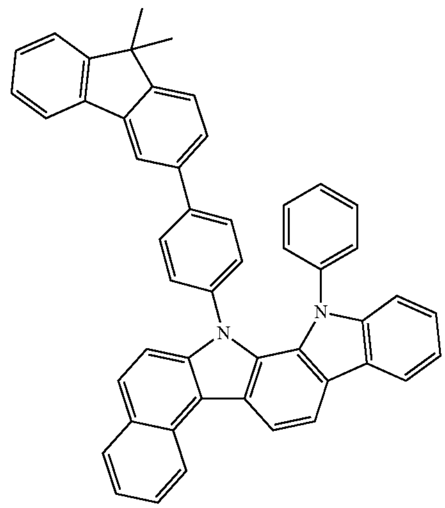
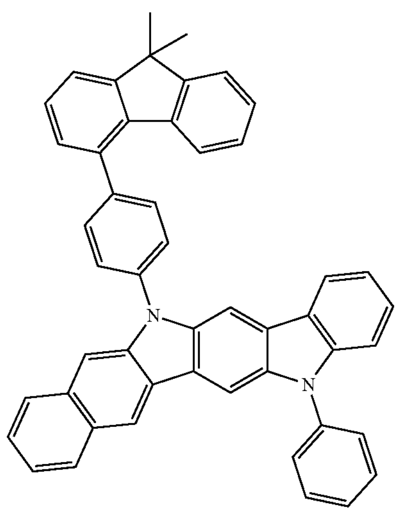
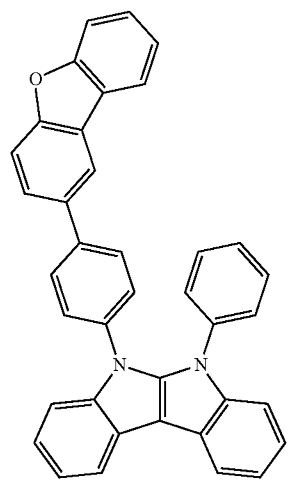
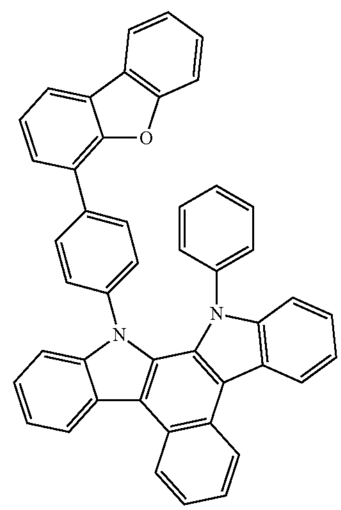
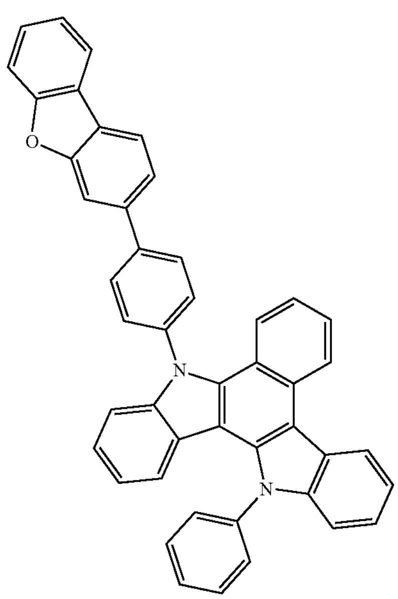
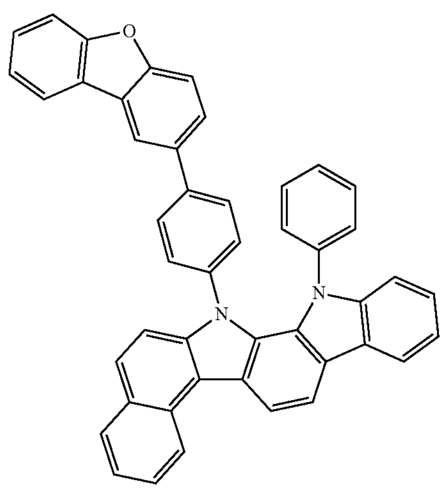

-continued
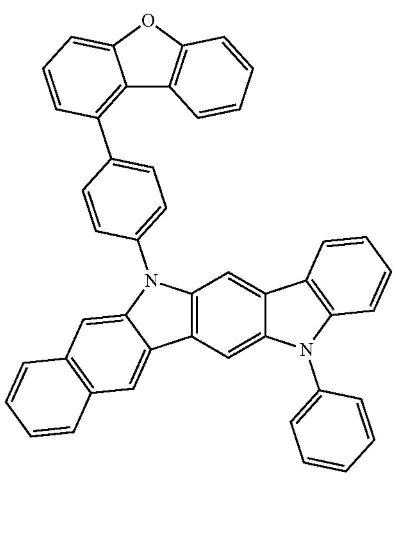
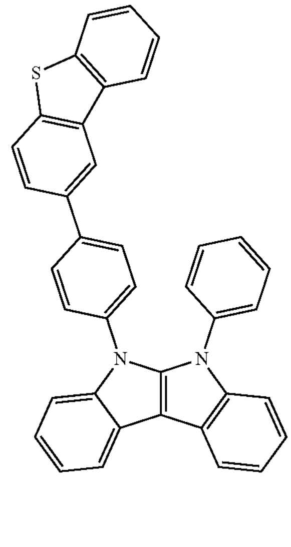
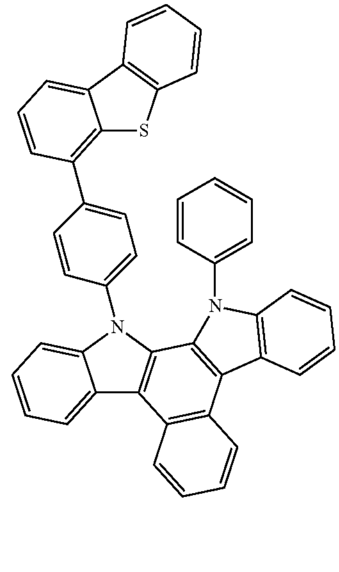
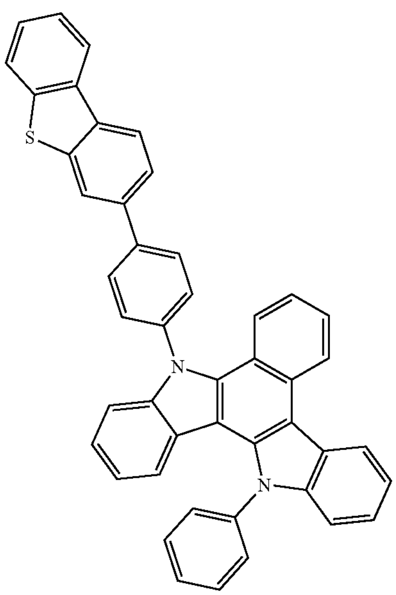
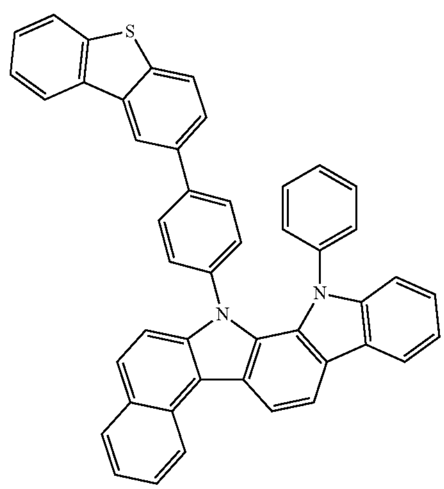
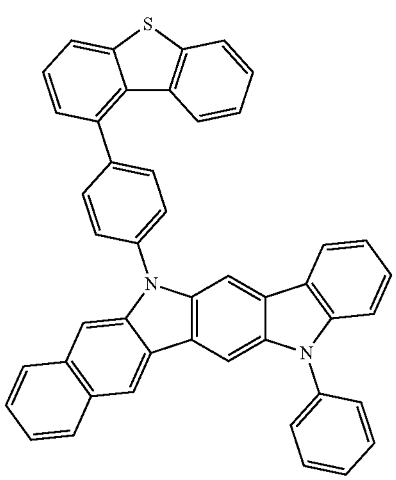
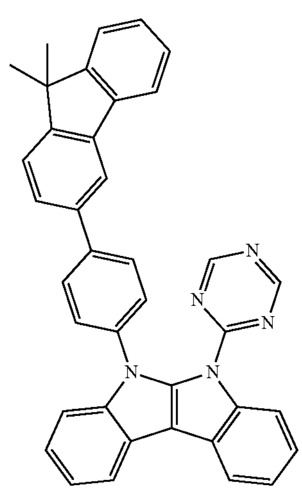
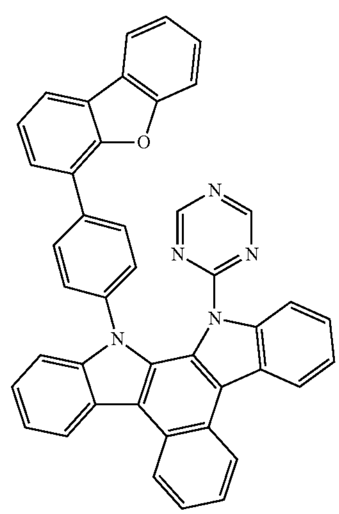

-continued
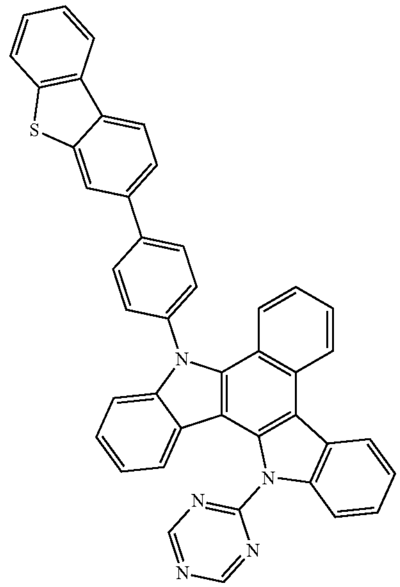
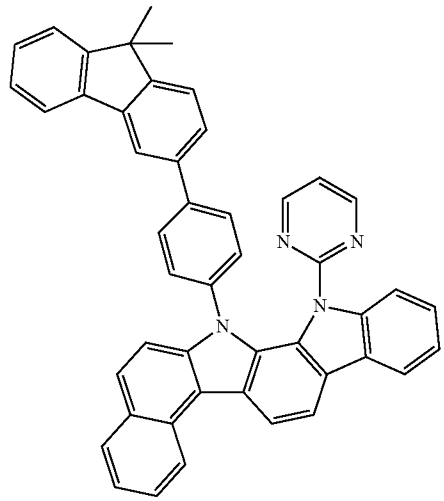
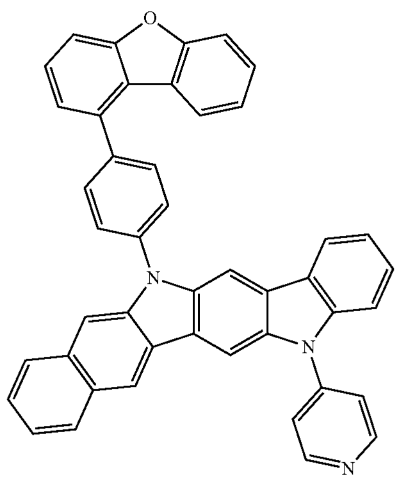
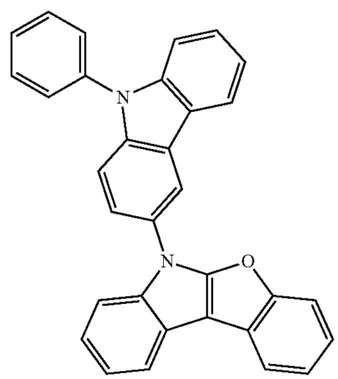
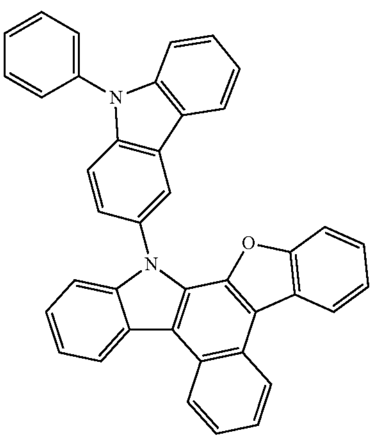
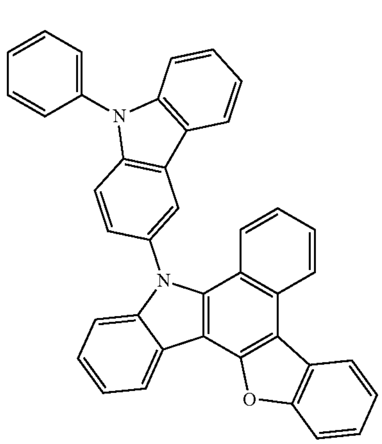
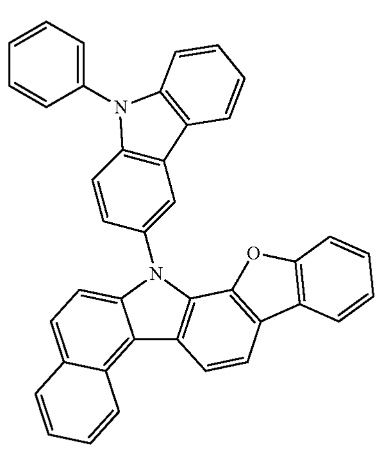

-continued
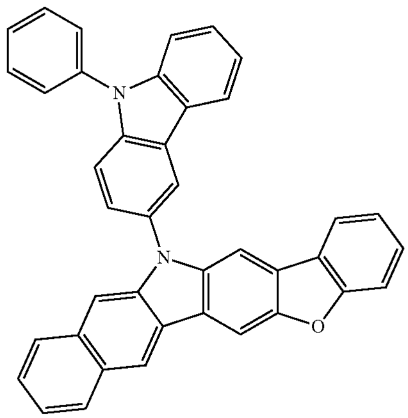
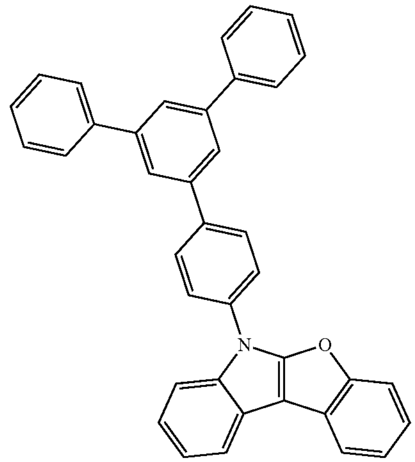
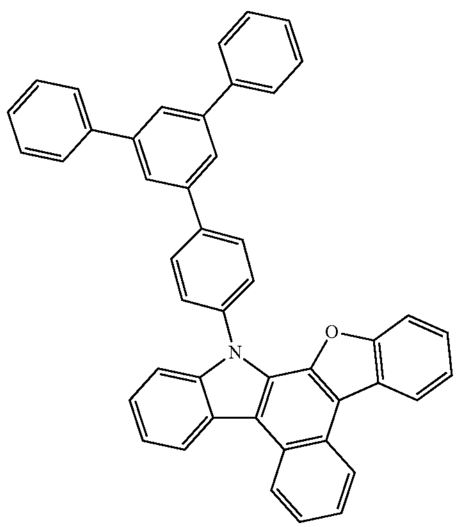
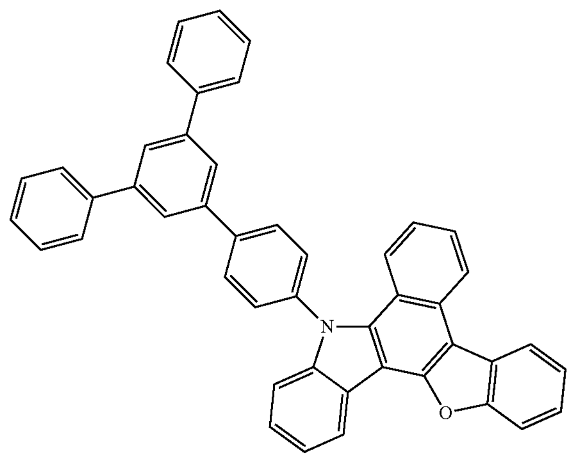
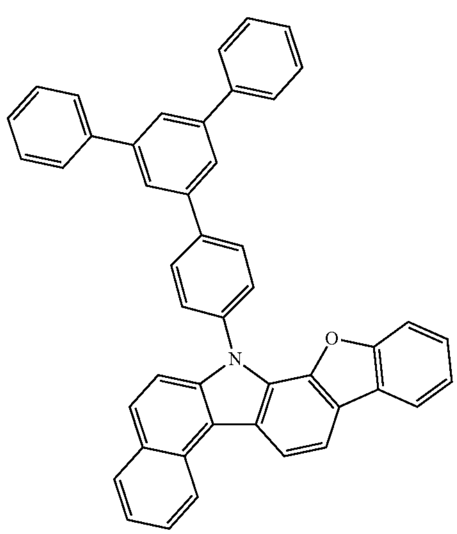
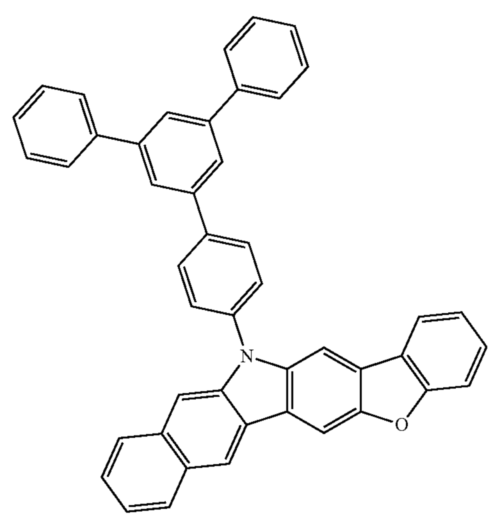

-continued
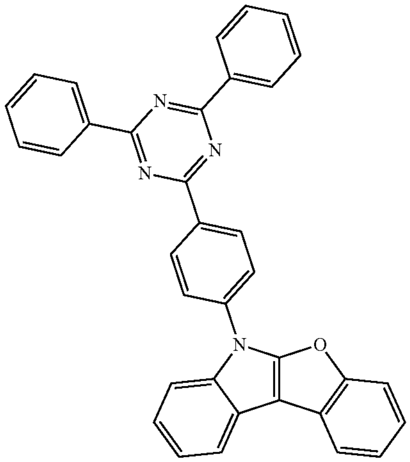
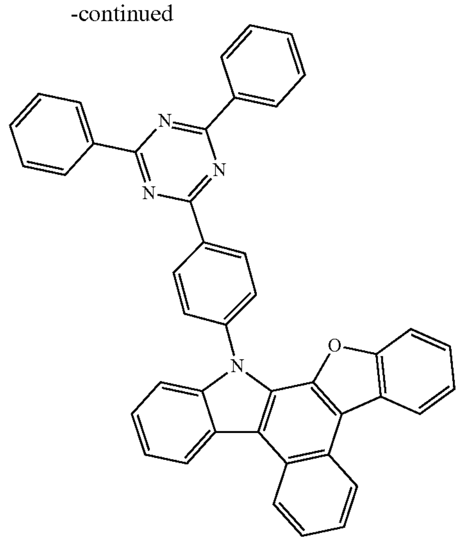
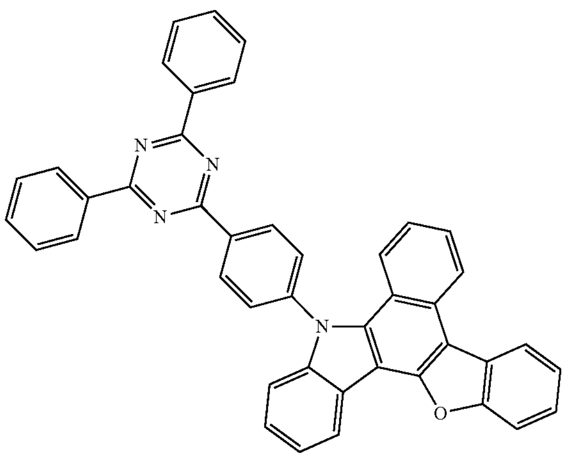
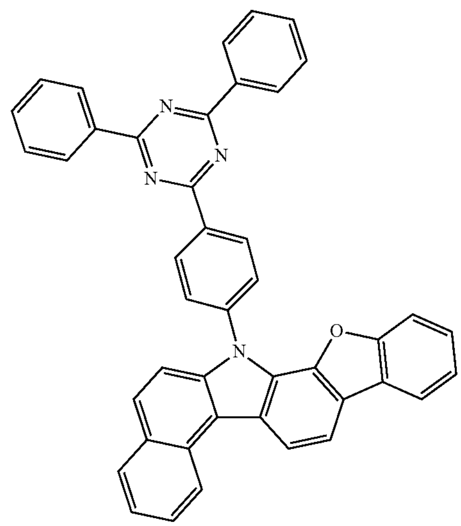
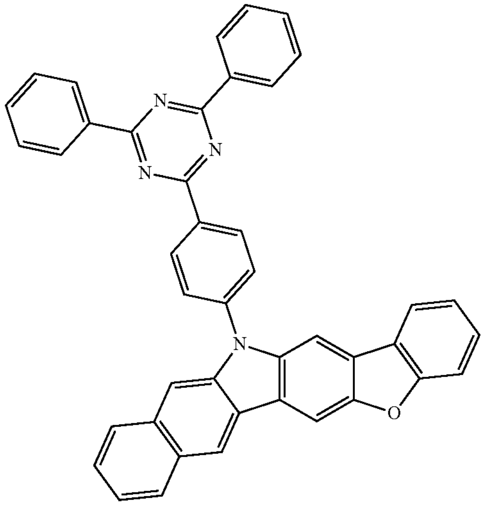
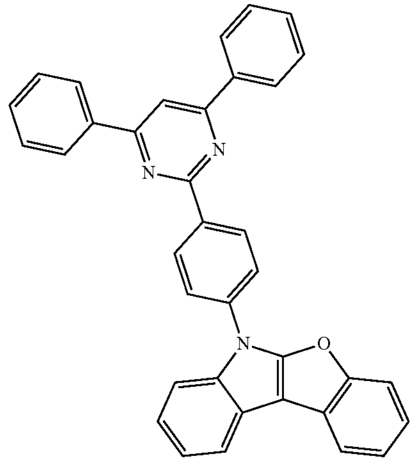

-continued
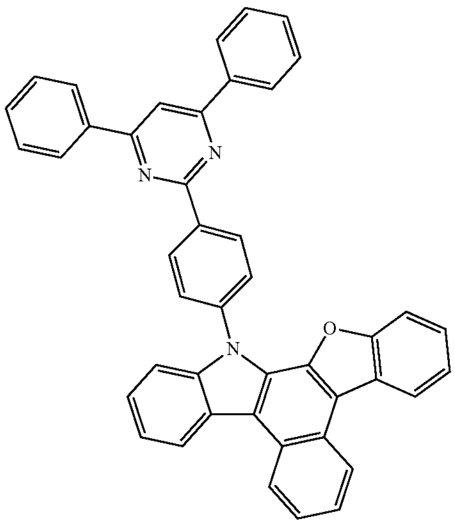
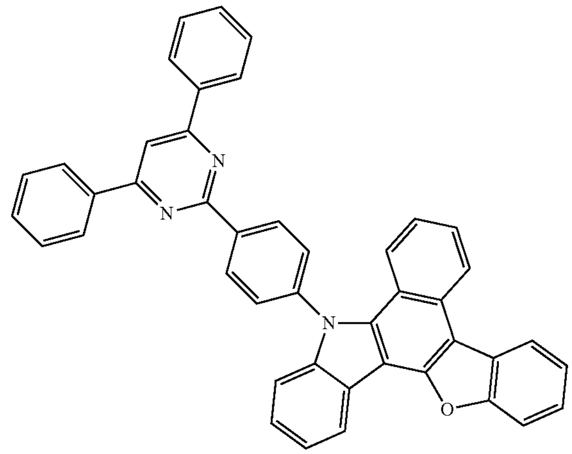
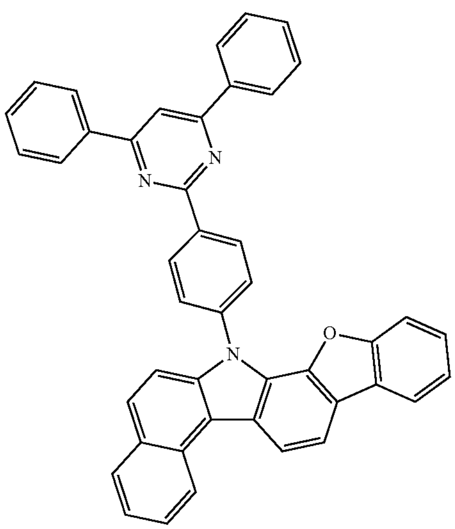
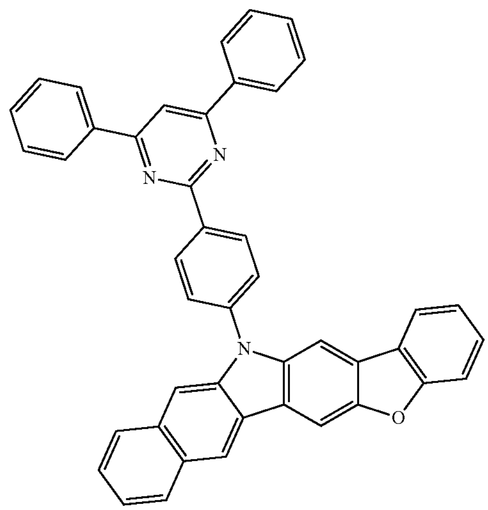
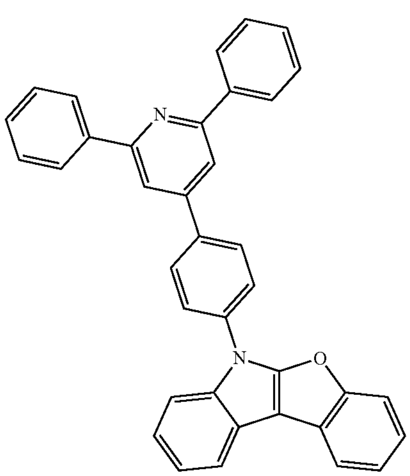
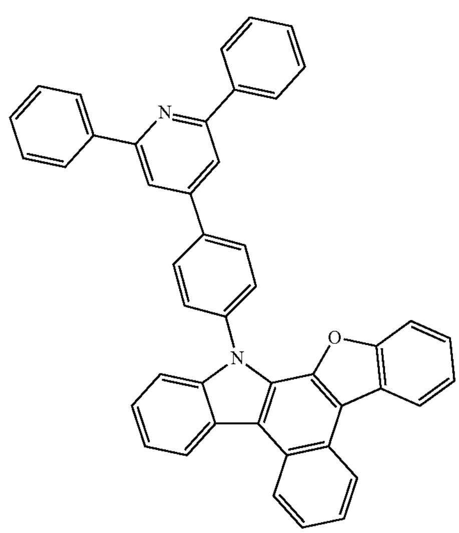

-continued
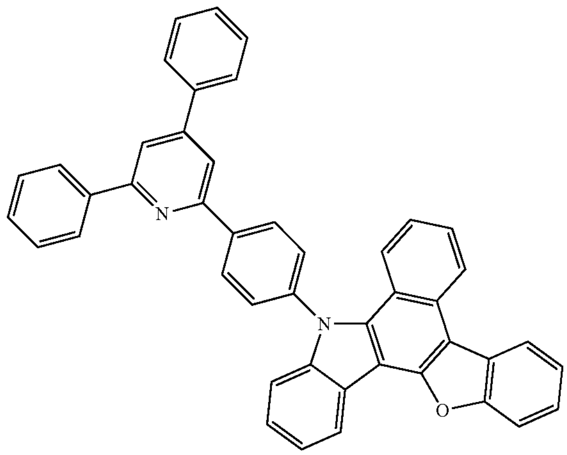
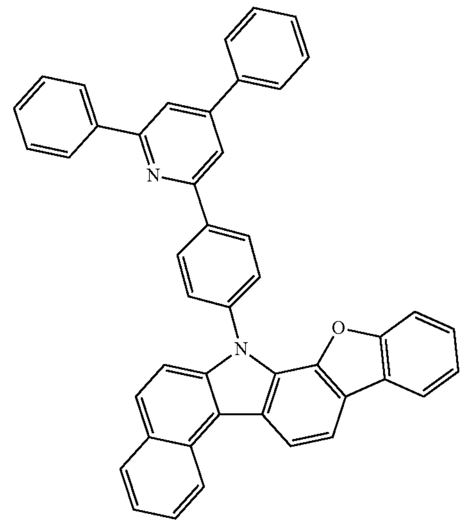
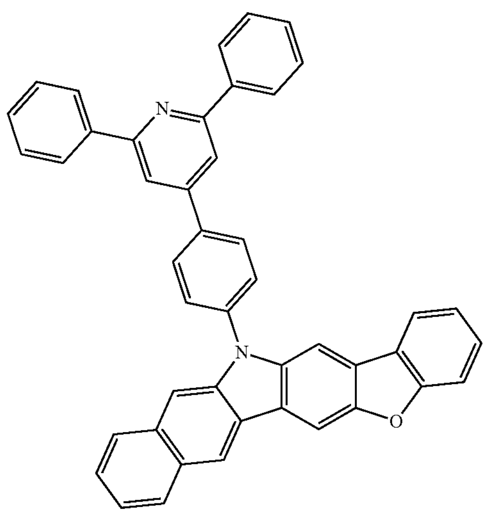
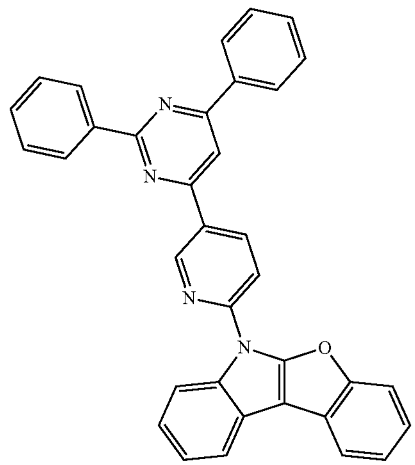
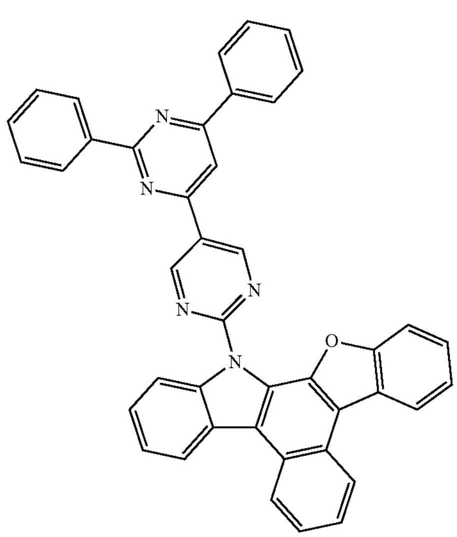
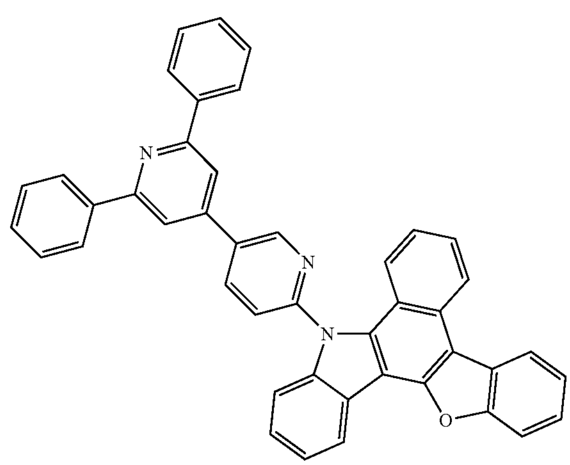

-continued
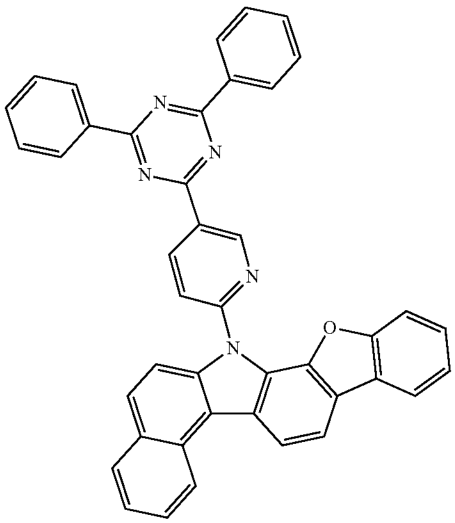
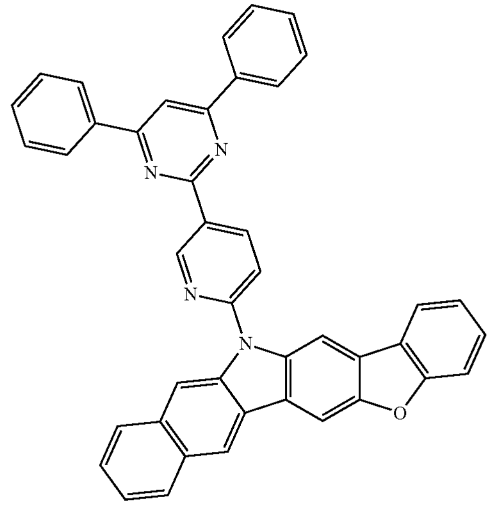
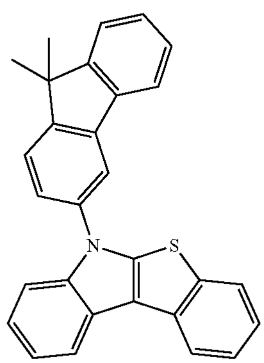
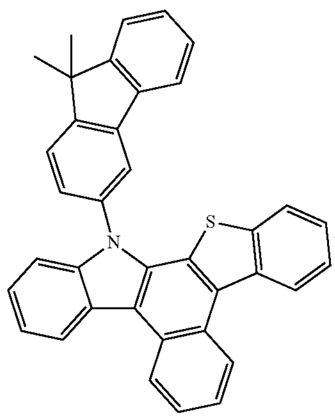
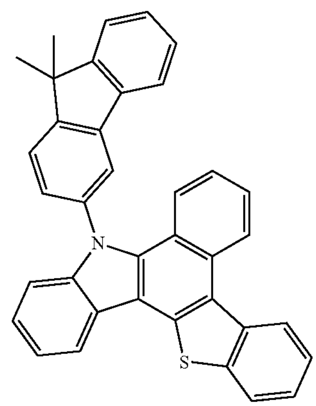
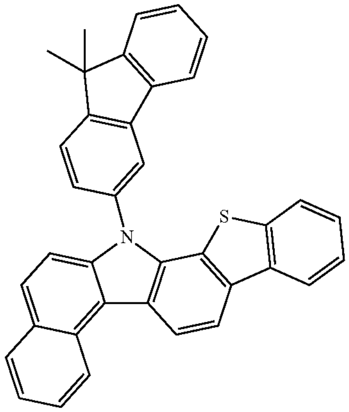
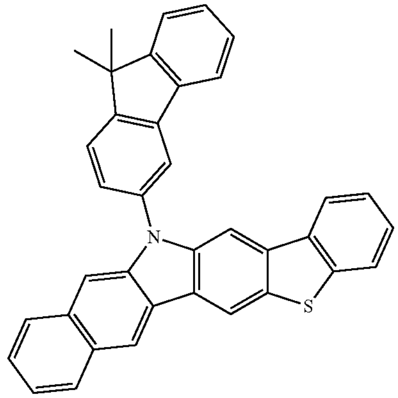
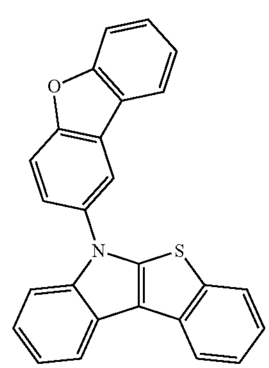

-continued
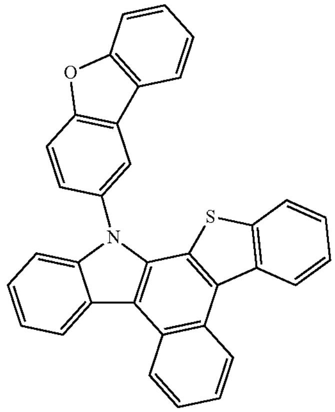
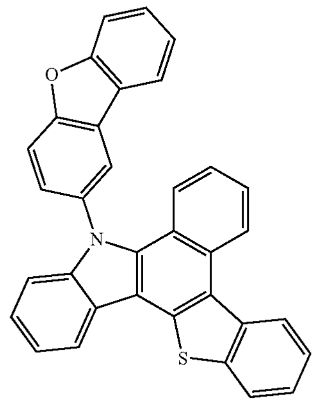
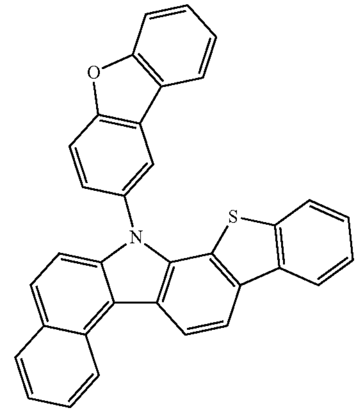
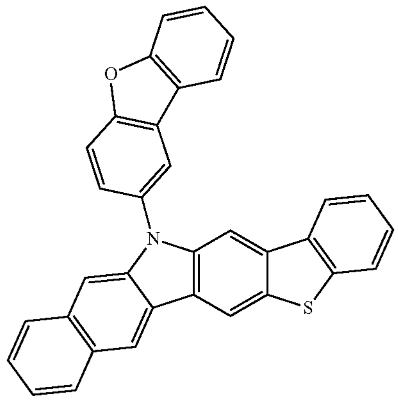
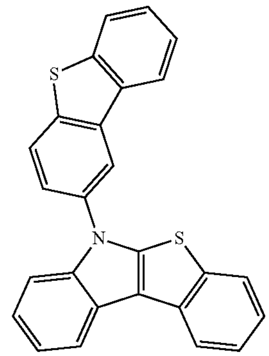
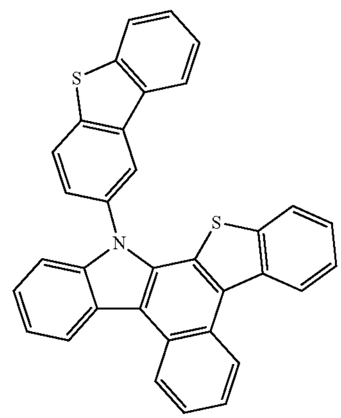
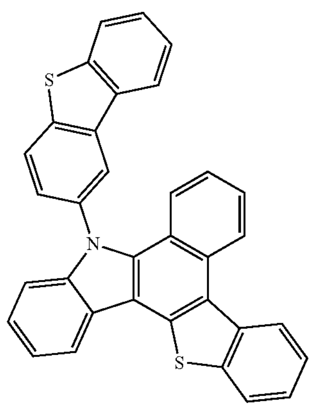
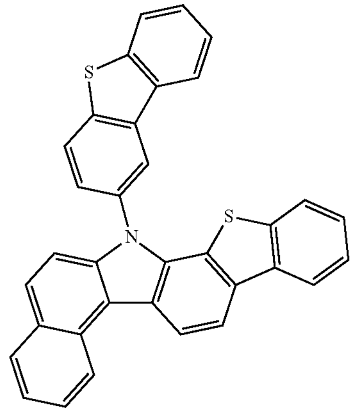
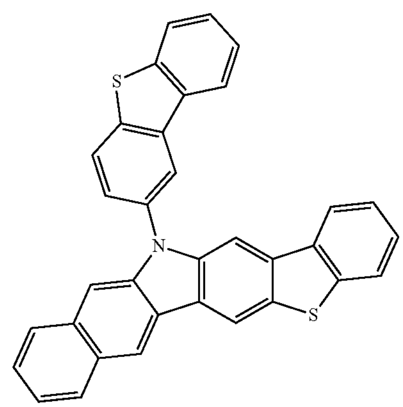
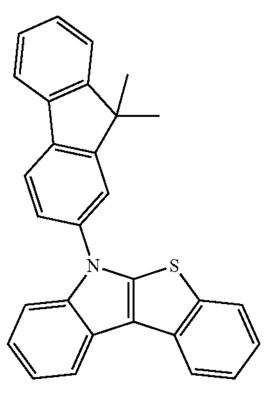
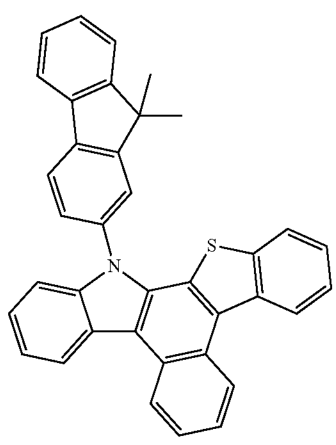
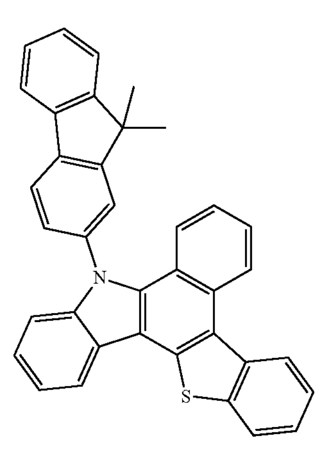

-continued
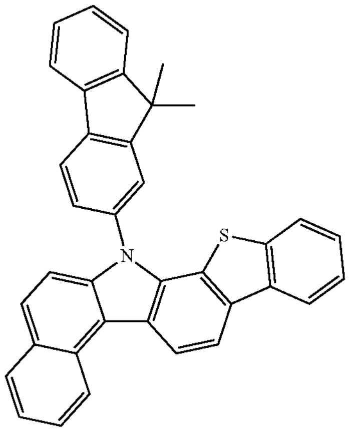
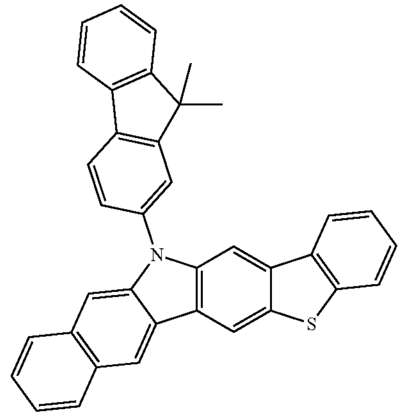
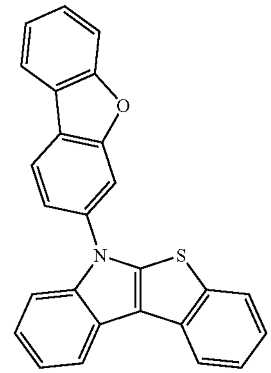
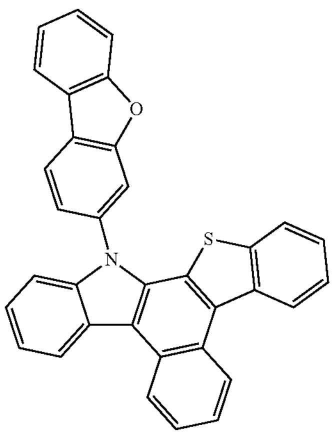
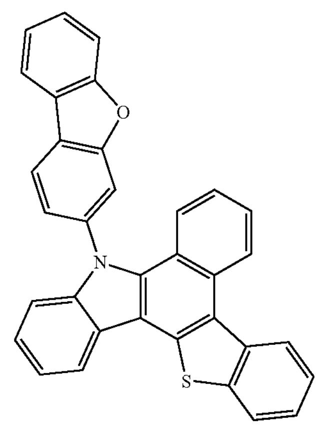
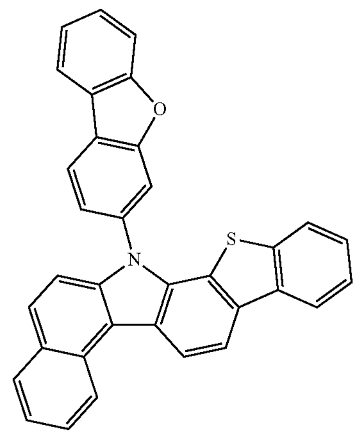
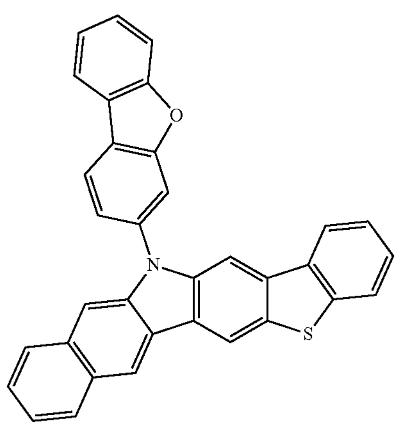
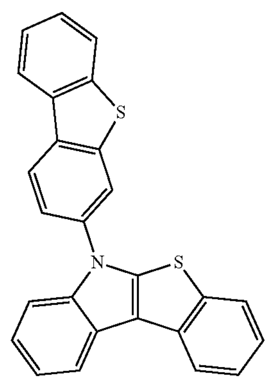
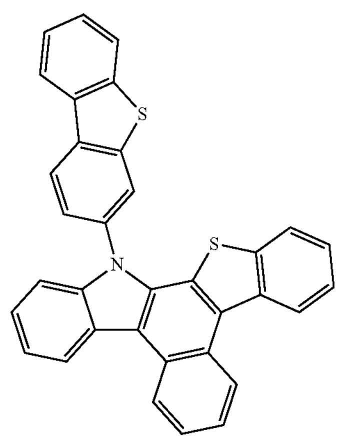
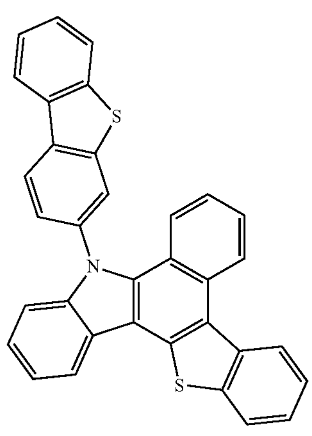
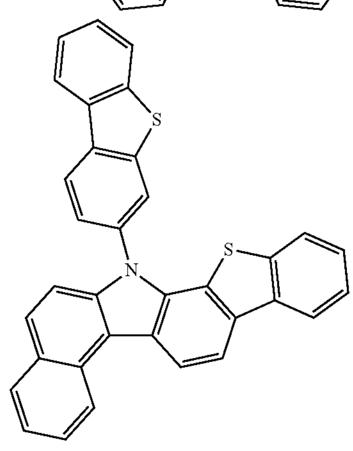
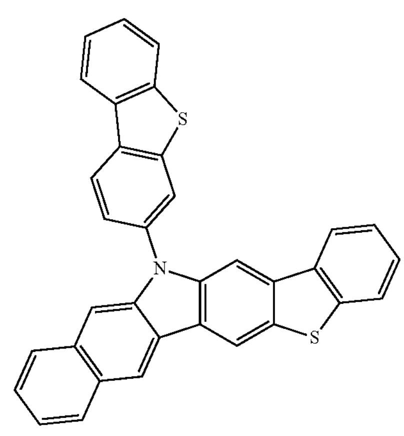

-continued
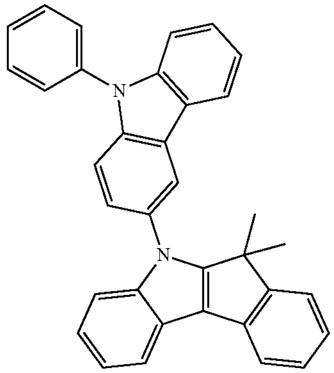
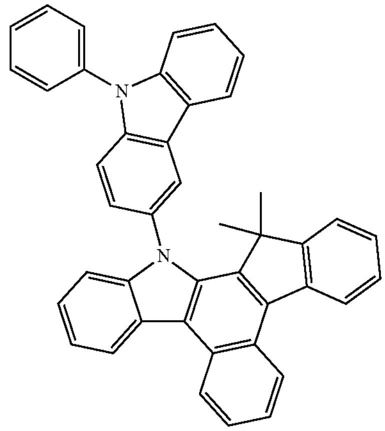
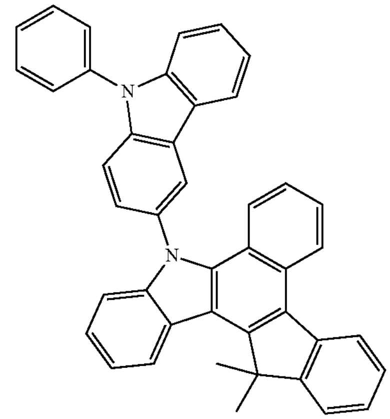
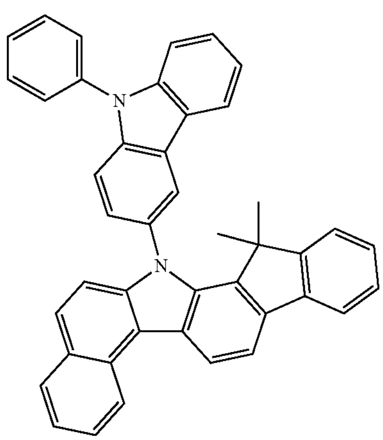
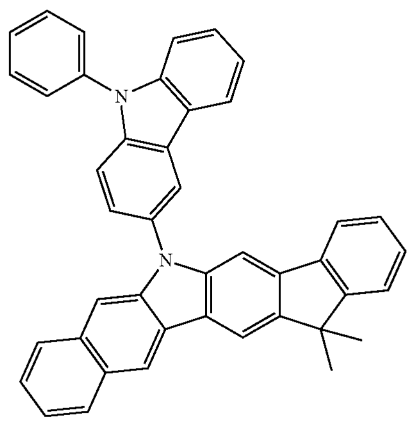
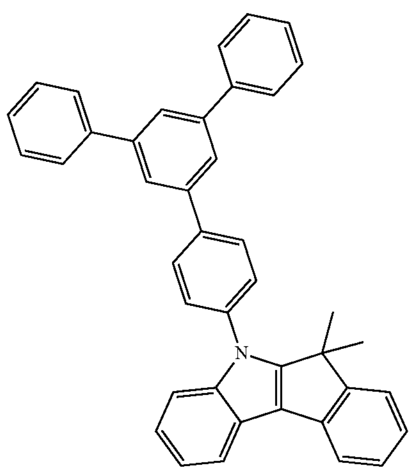
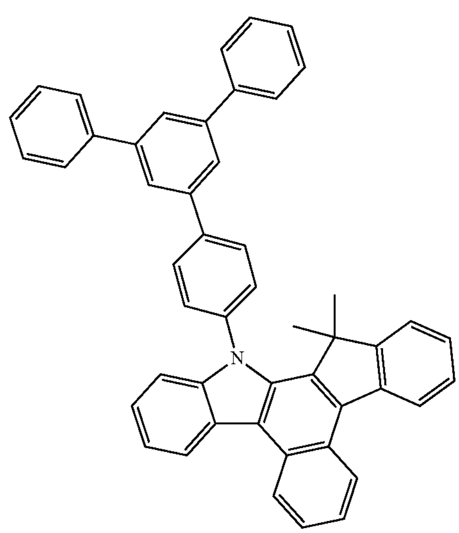

-continued
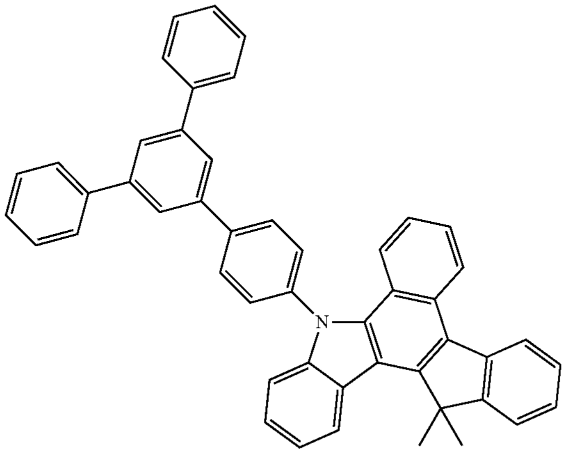
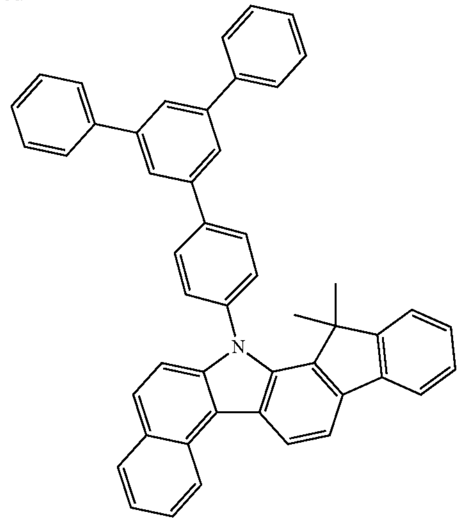
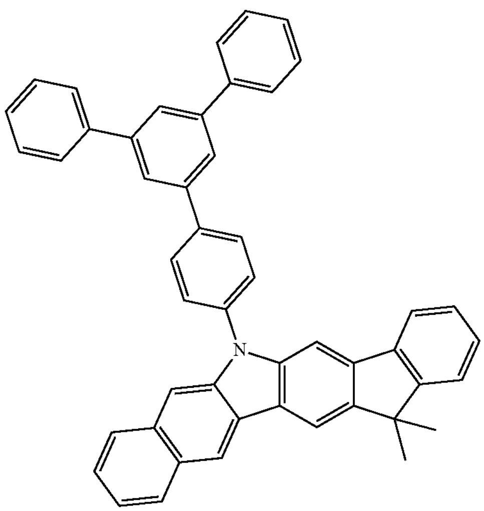
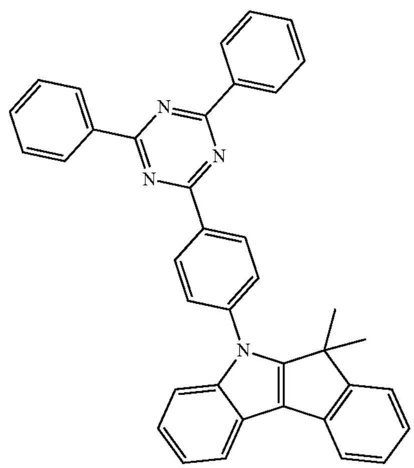
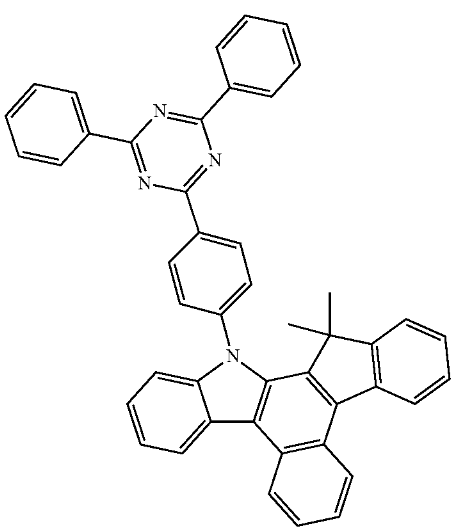
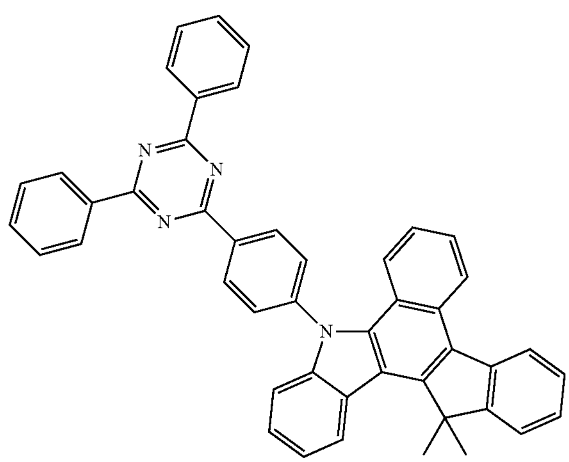

-continued
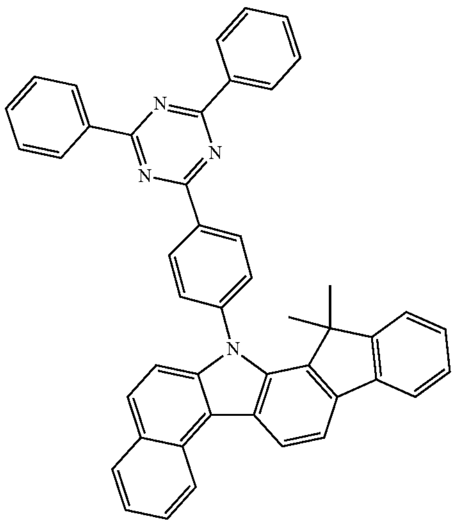
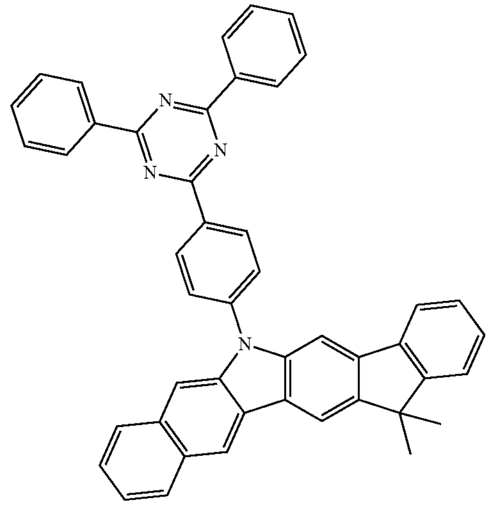
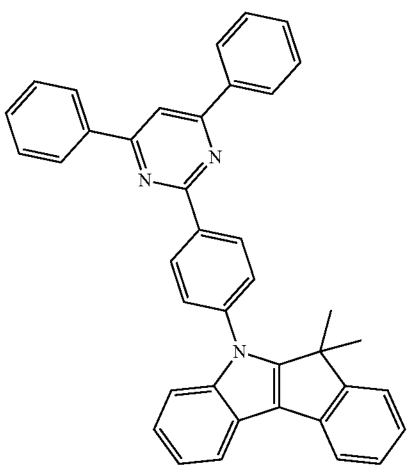
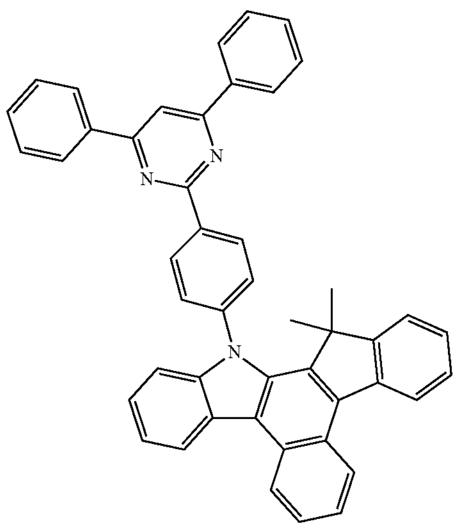
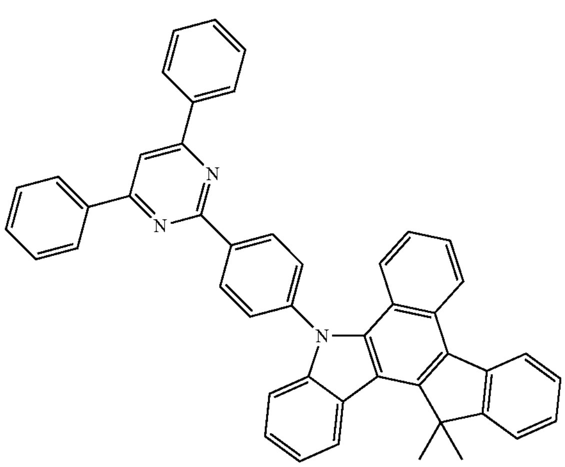
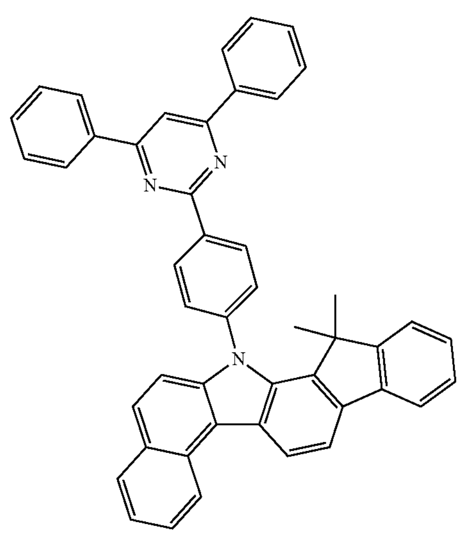

-continued
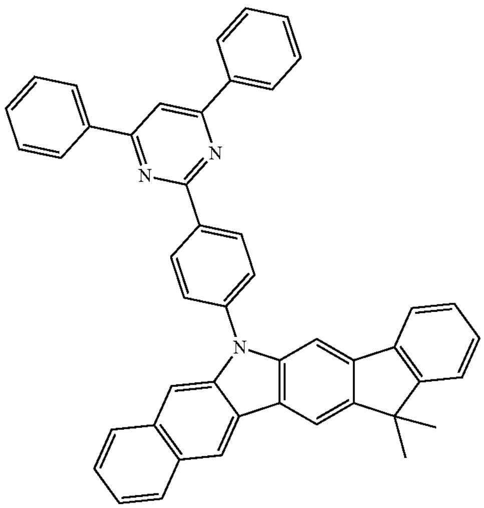
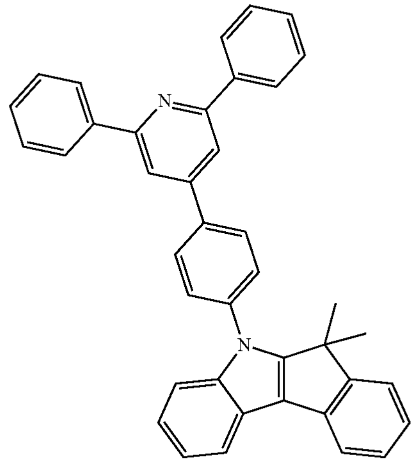
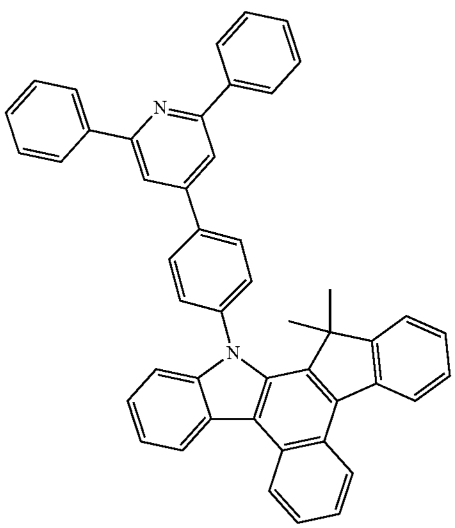
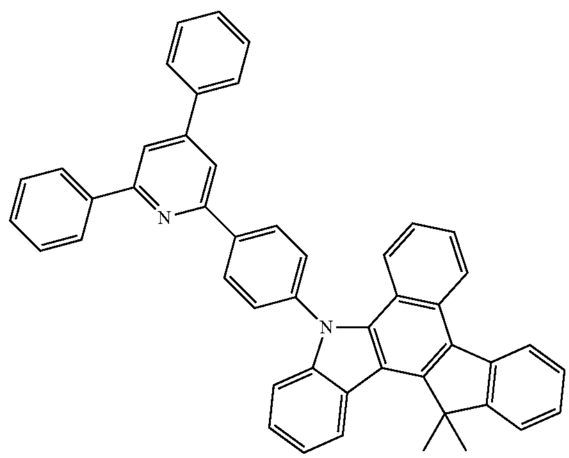
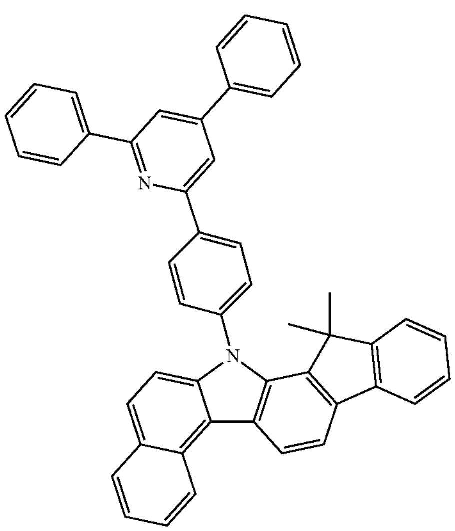
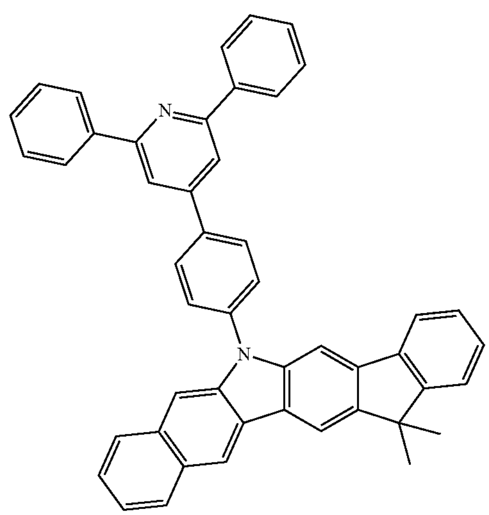

-continued
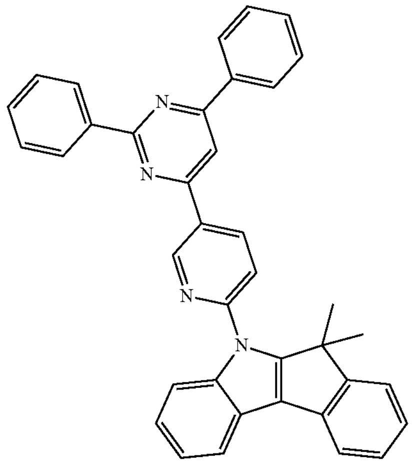
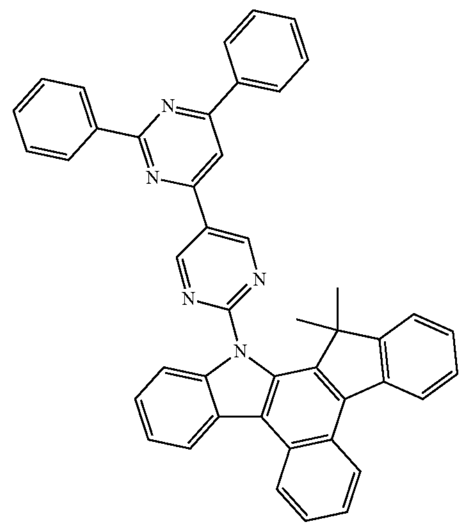
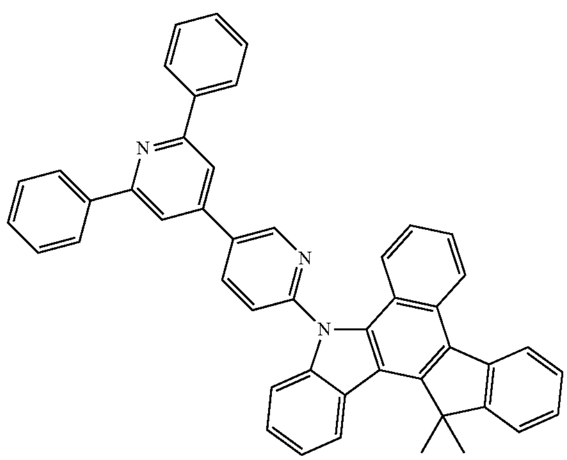
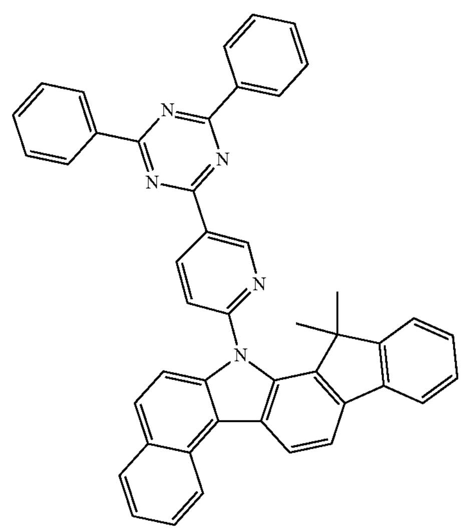
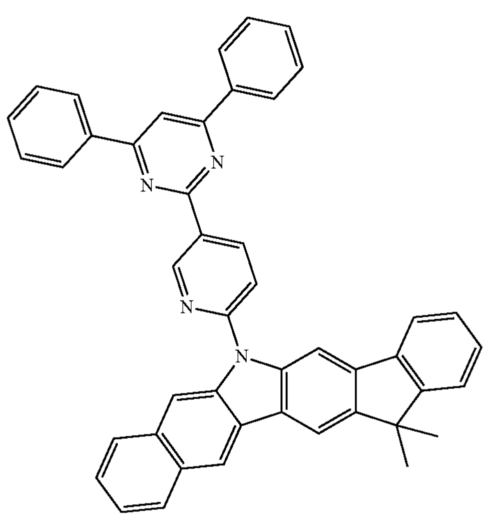
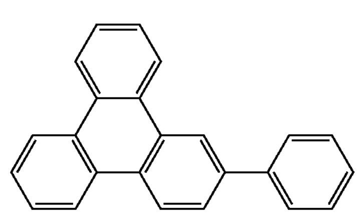

-continued
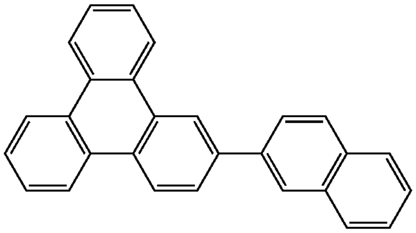
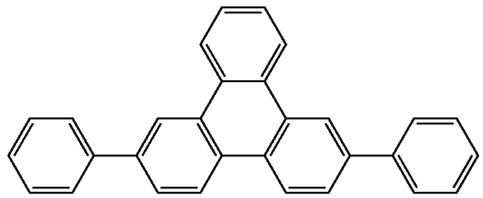
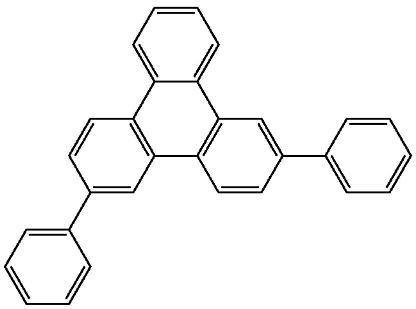
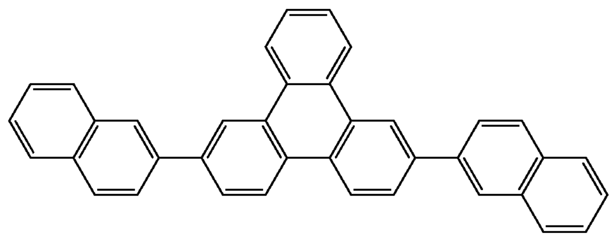
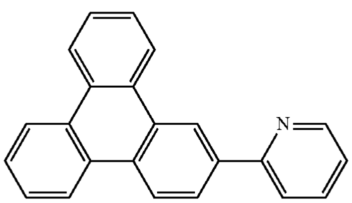
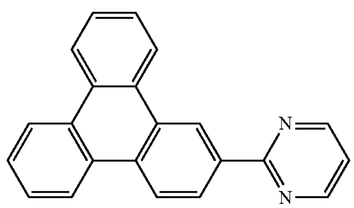
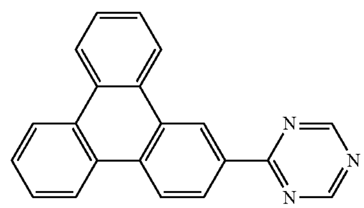
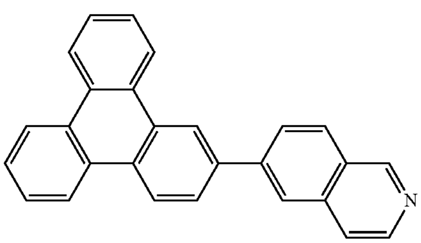
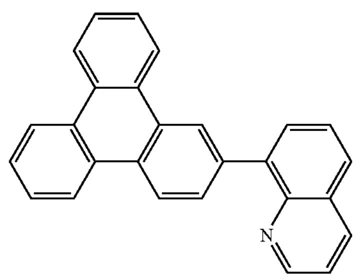
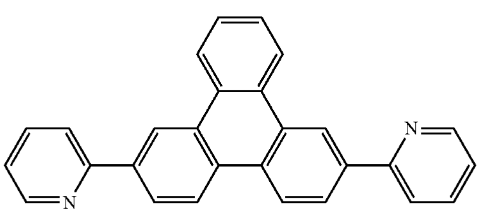
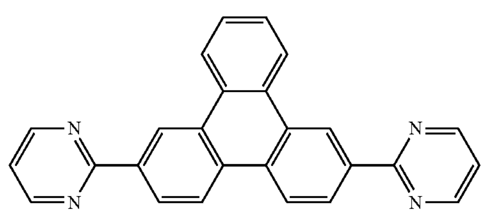
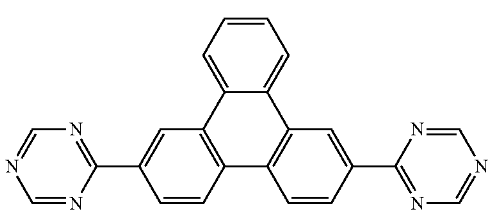
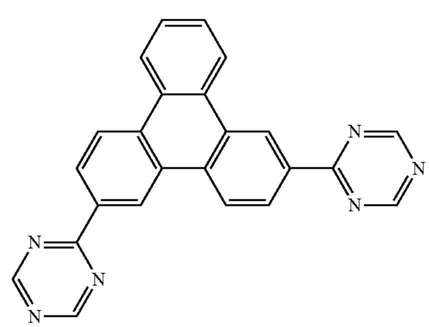

-continued
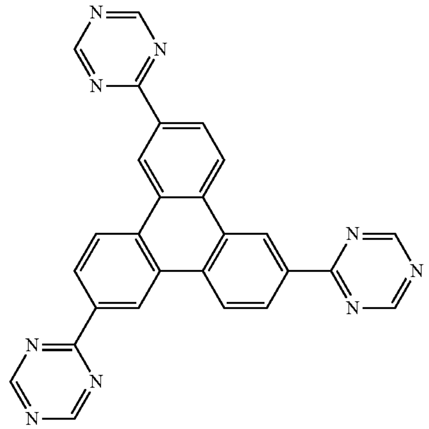
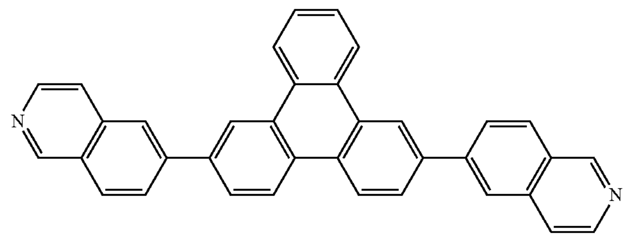
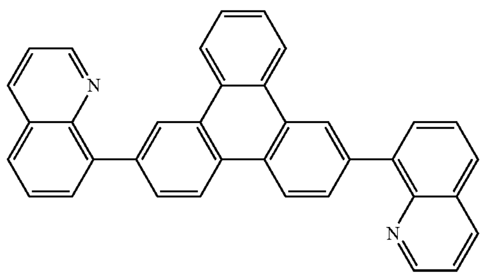
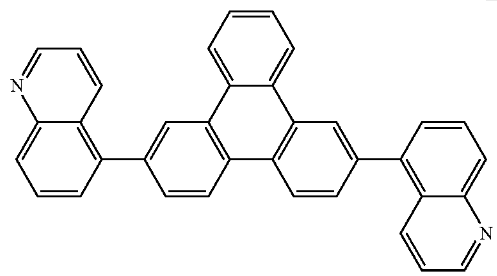
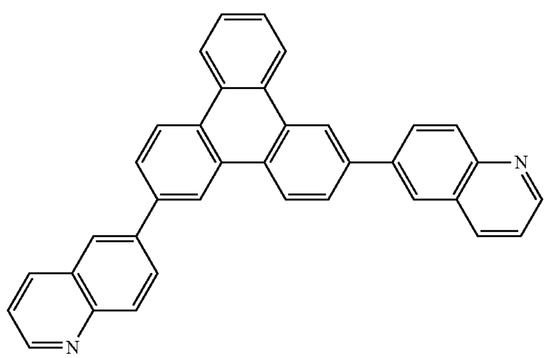
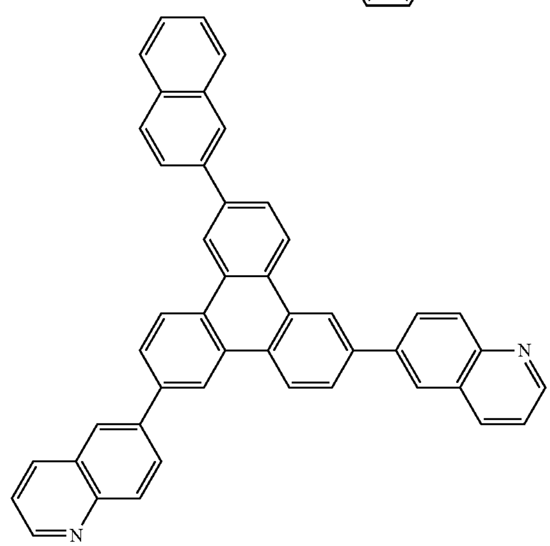
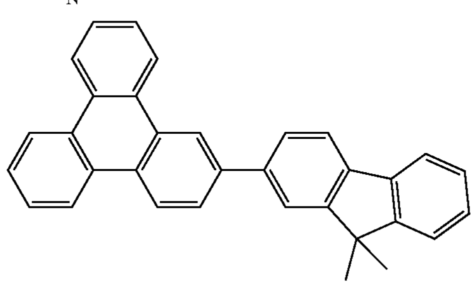
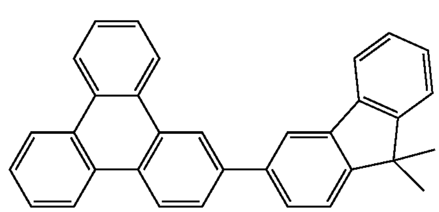
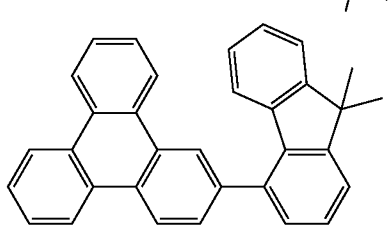
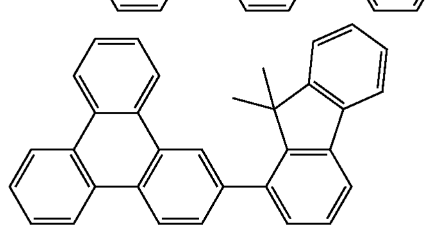

-continued
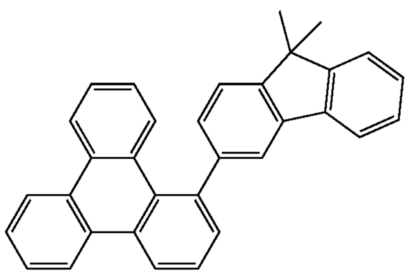
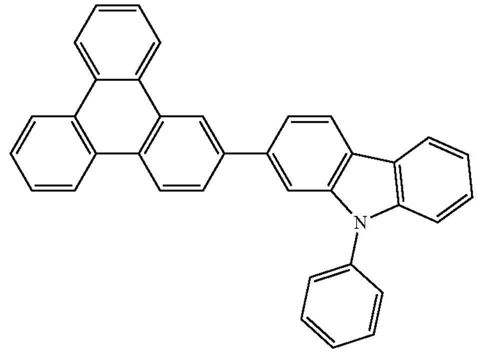
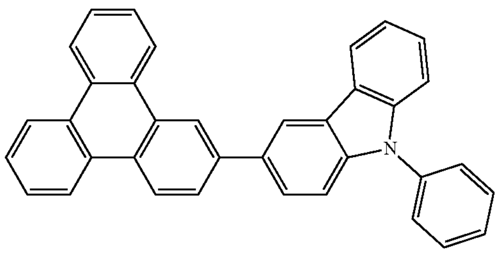
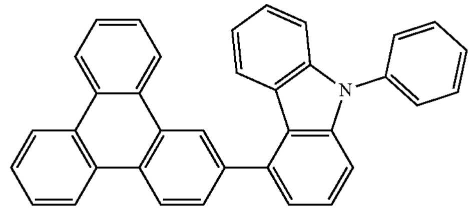
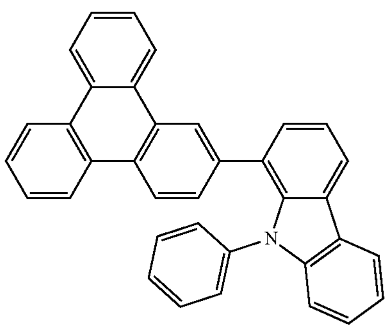
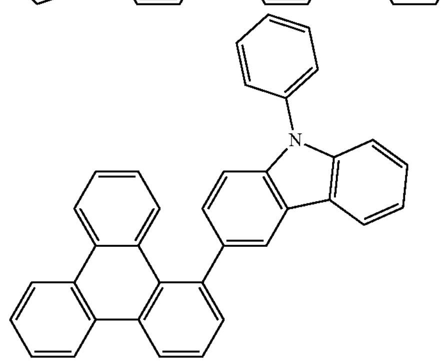
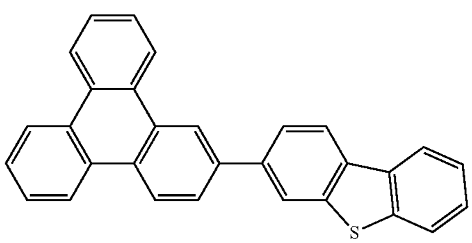
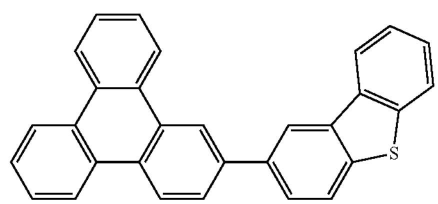
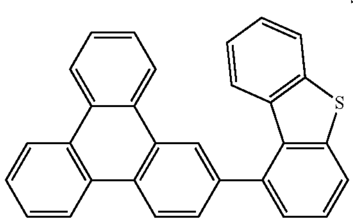
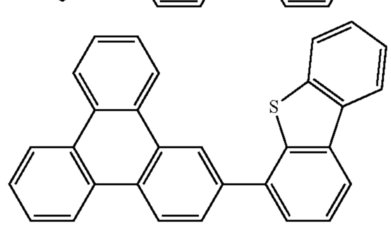
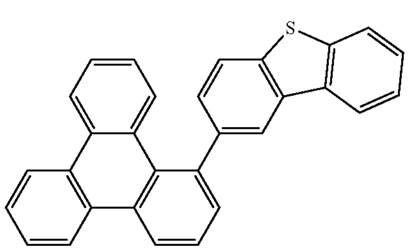
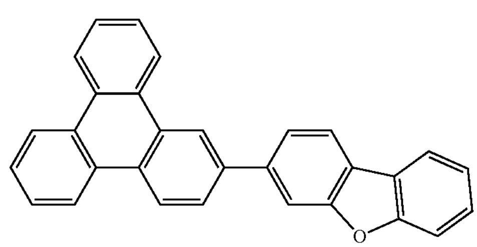

-continued
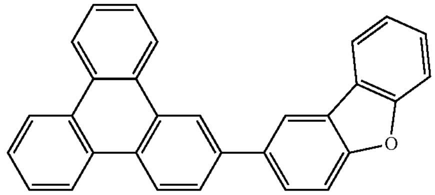
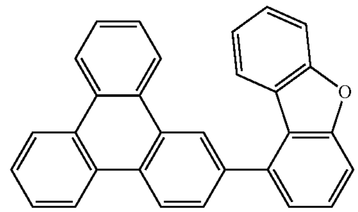
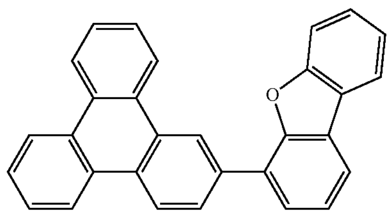
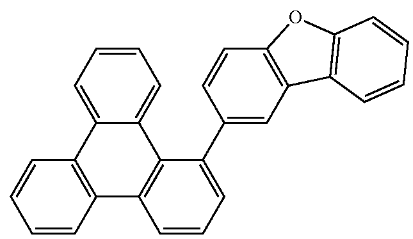
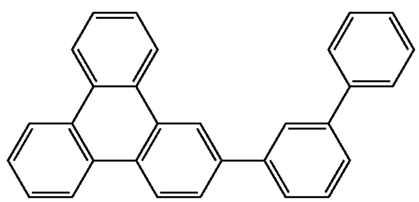
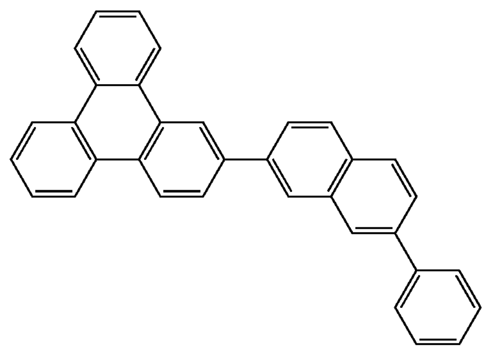
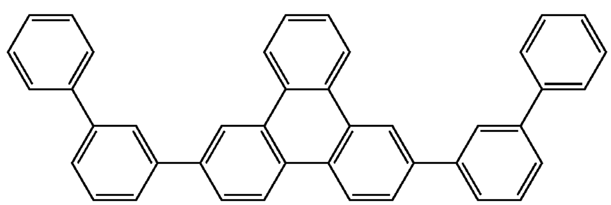
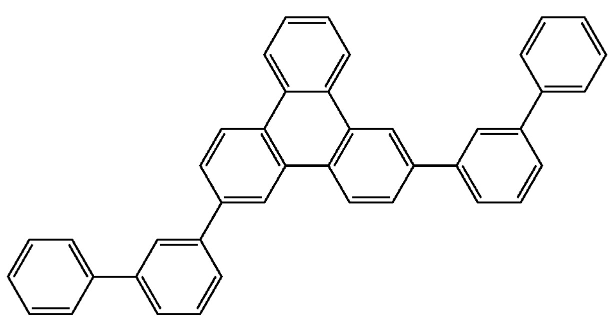
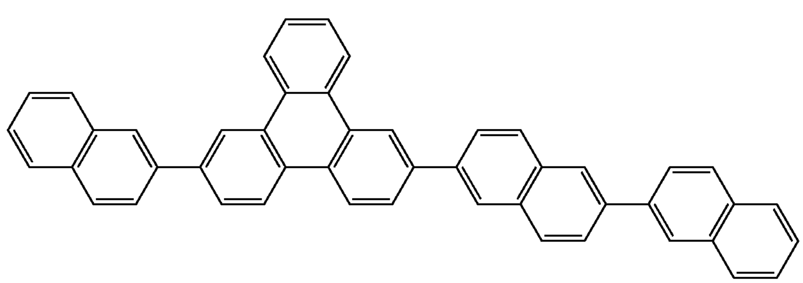

-continued
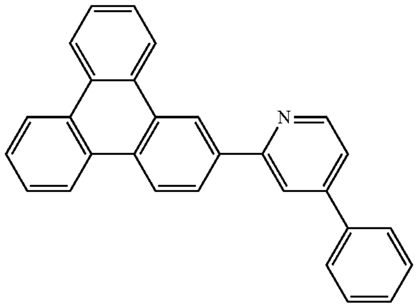
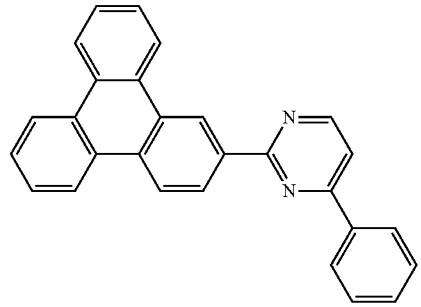
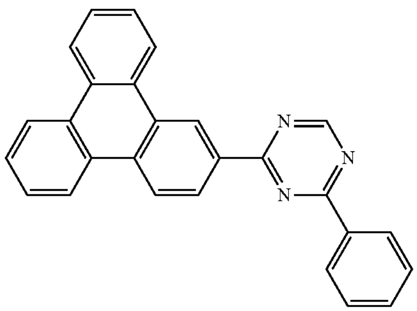
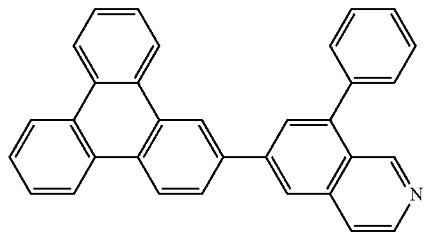
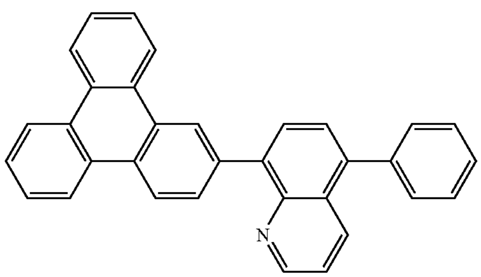
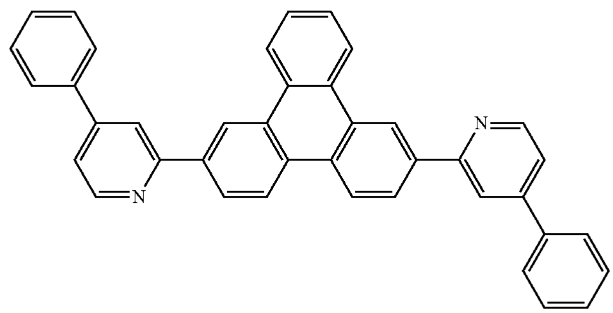
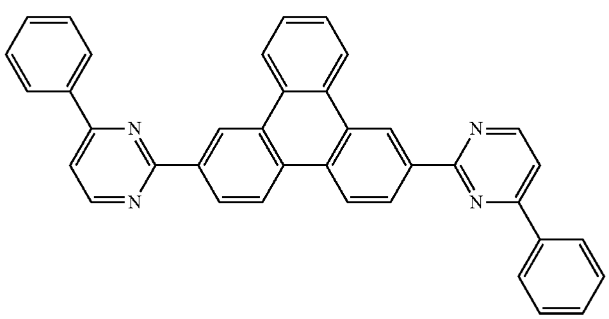
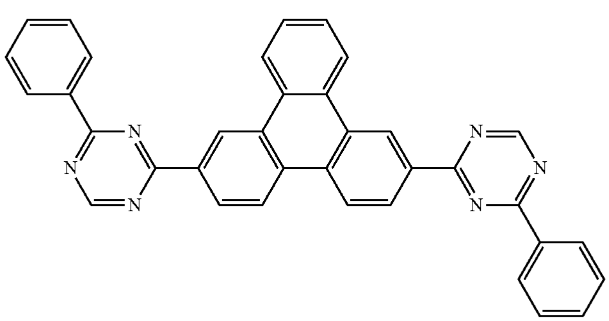

-continued
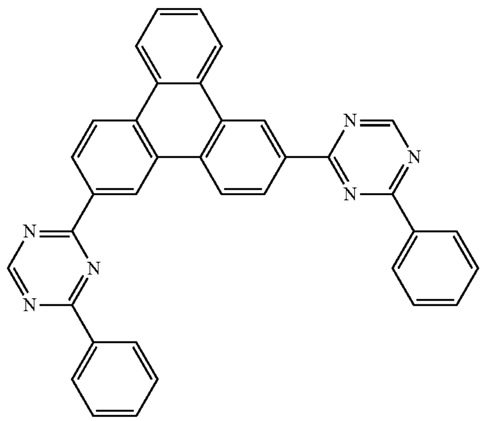
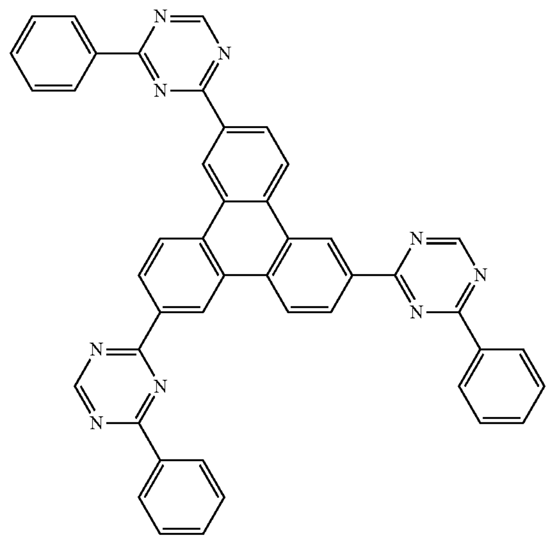
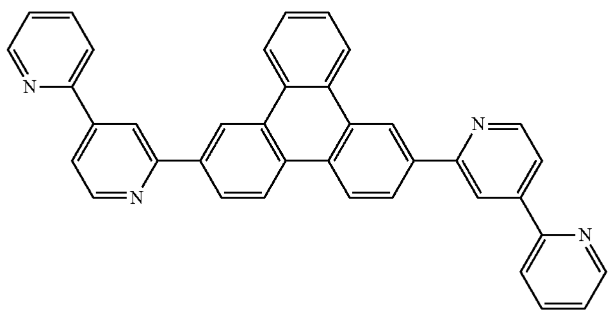
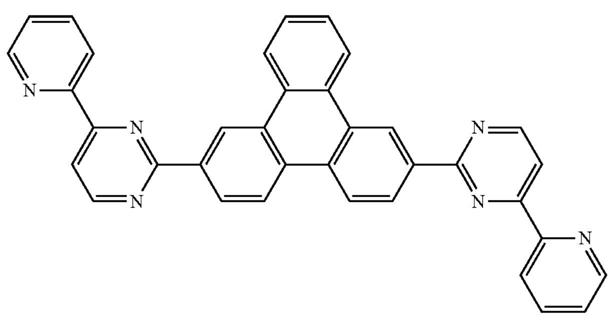
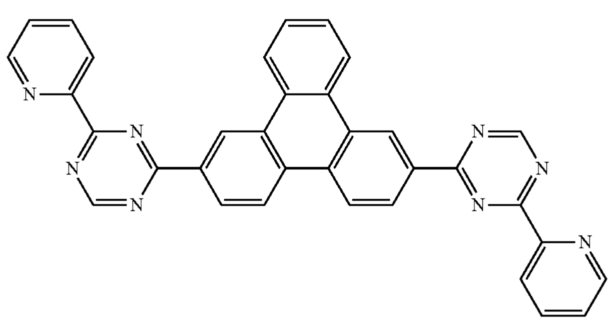

-continued
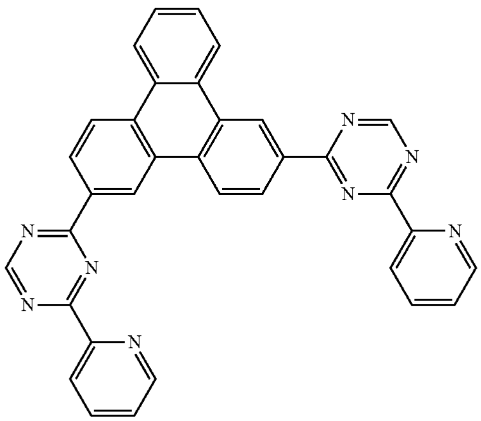
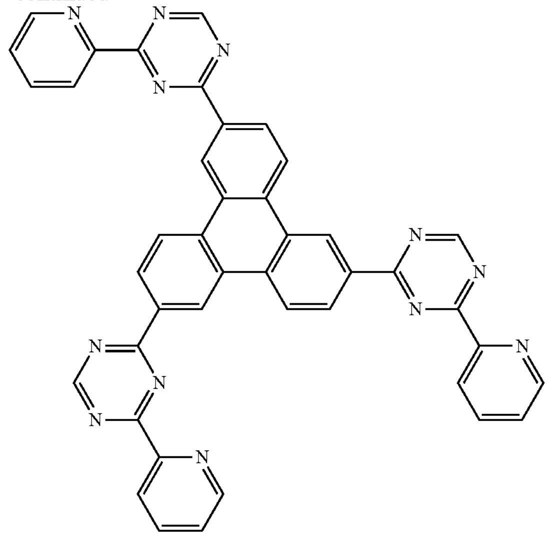
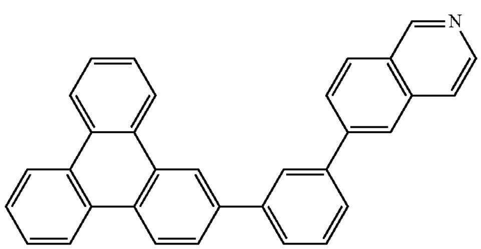
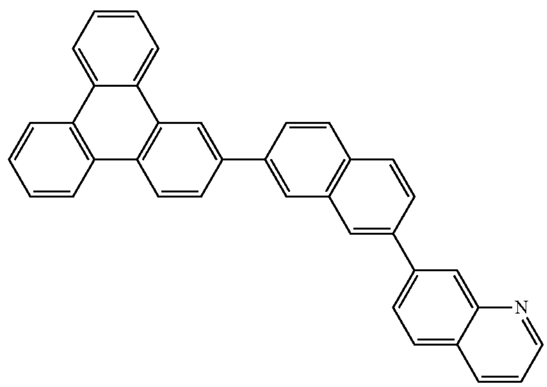
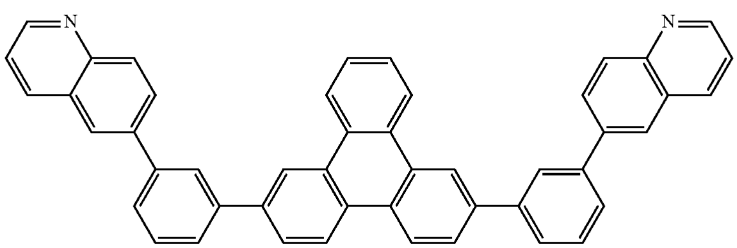
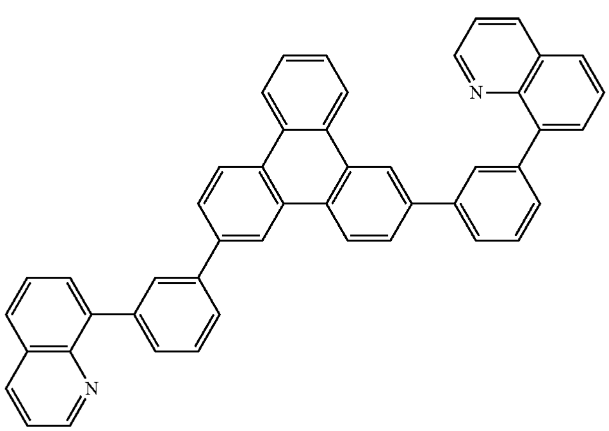

-continued
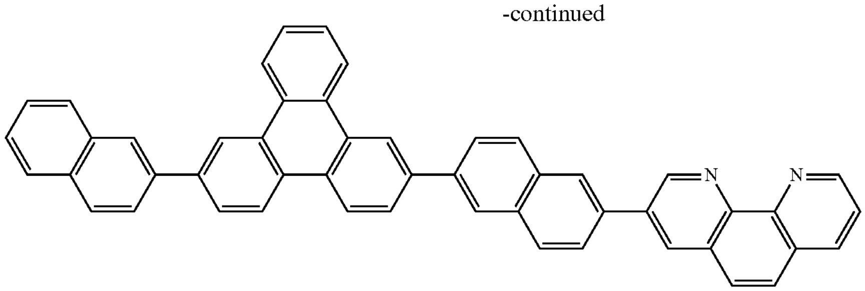
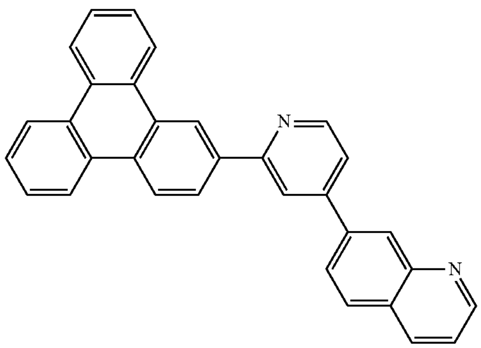
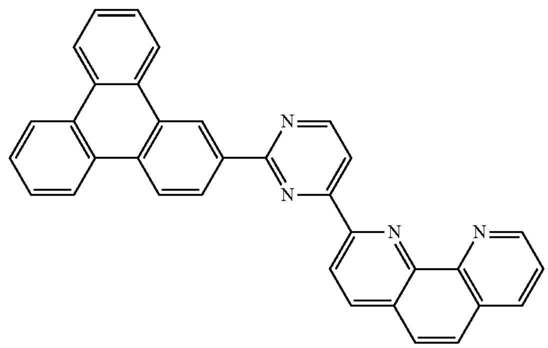
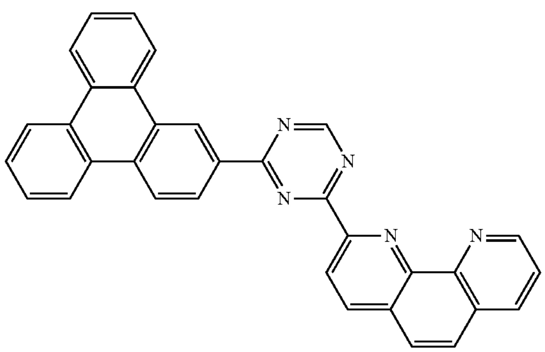
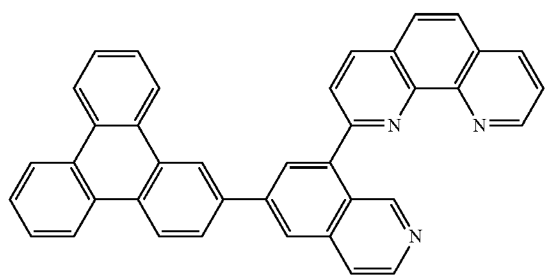
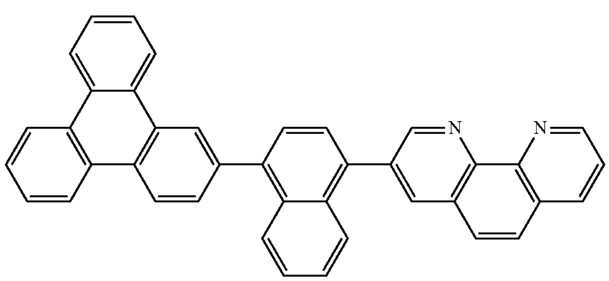
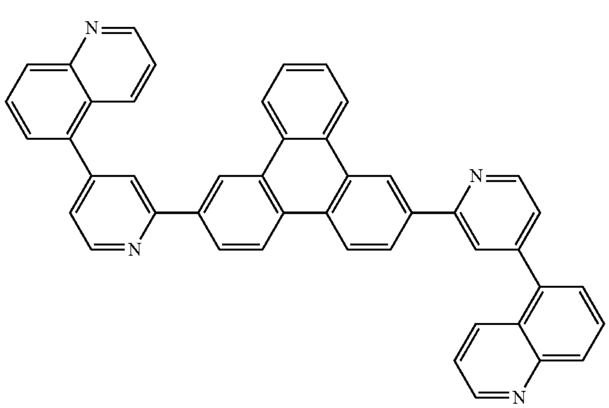

-continued
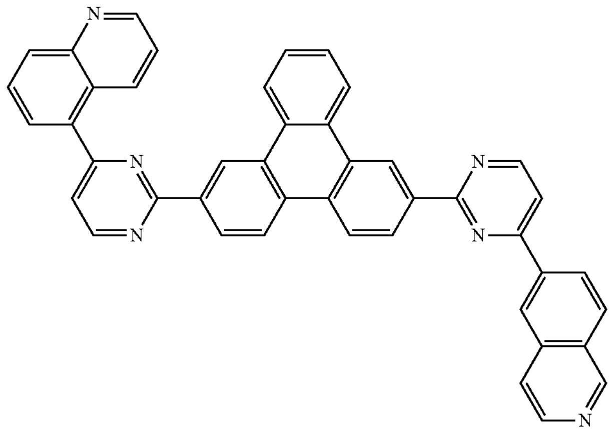
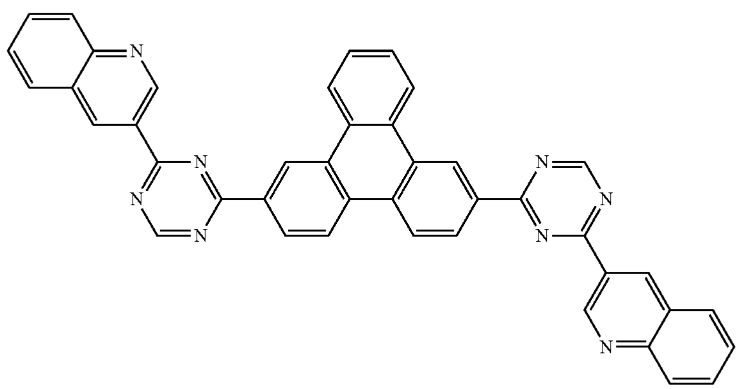
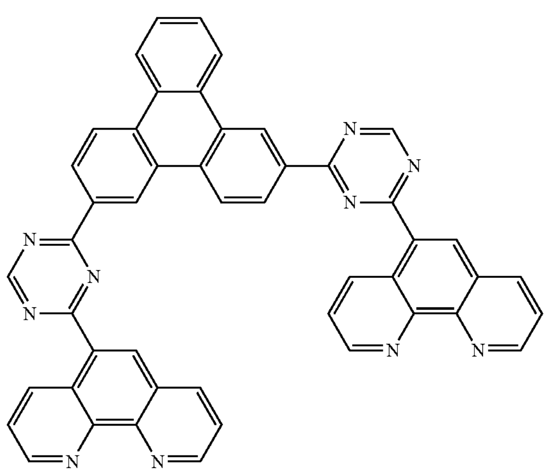

-continued
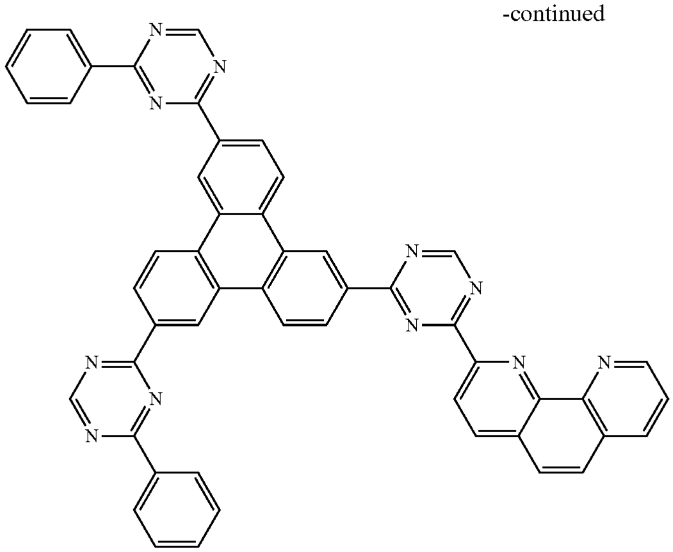
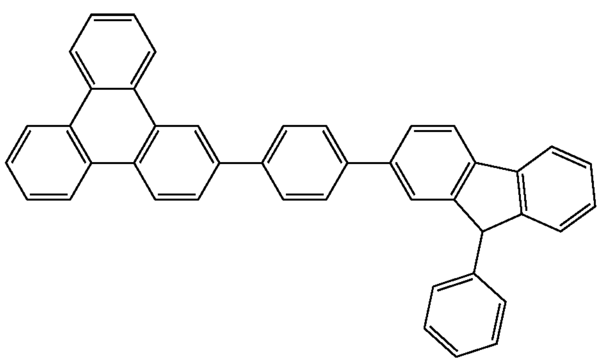
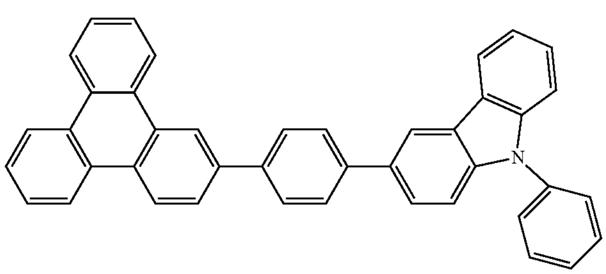
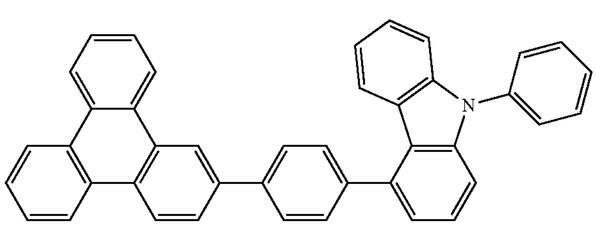
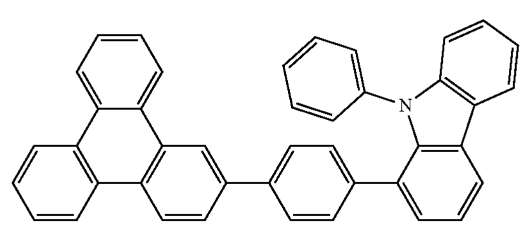

-continued
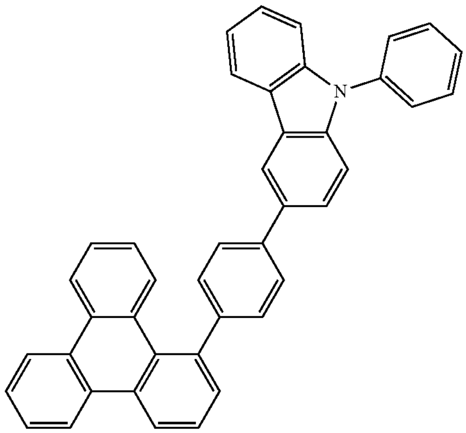
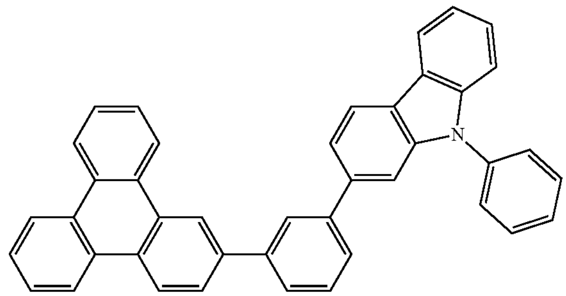
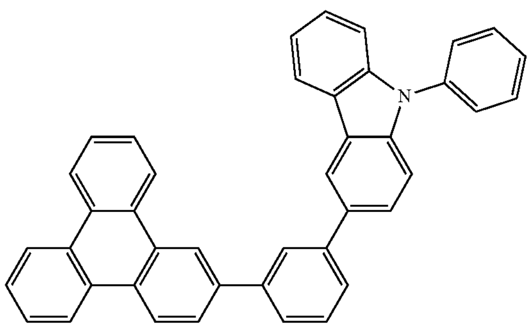
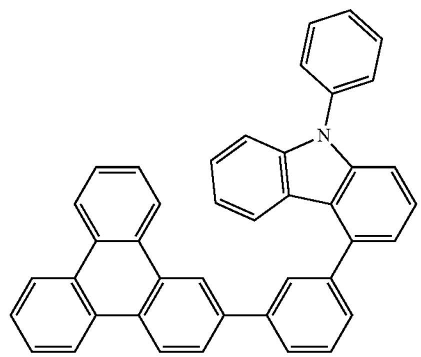
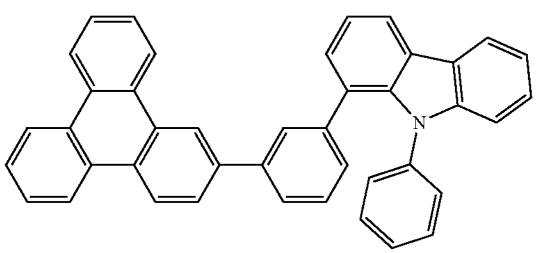
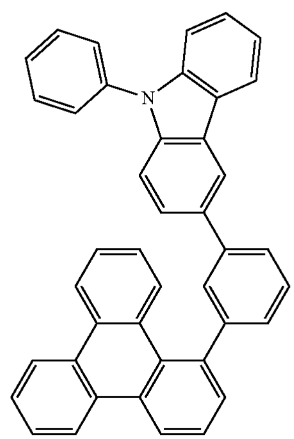
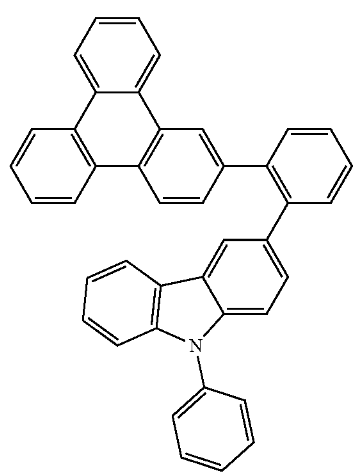
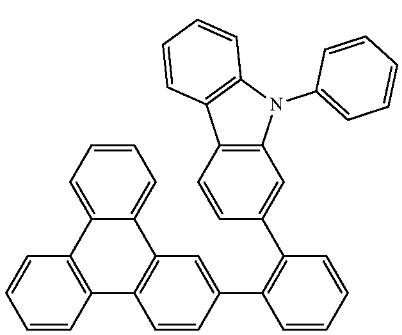

-continued
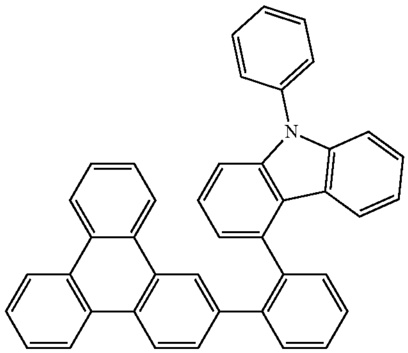
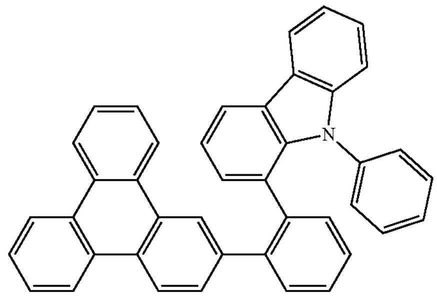
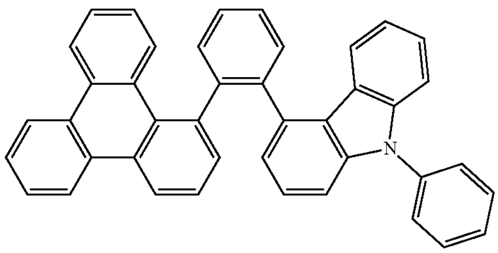
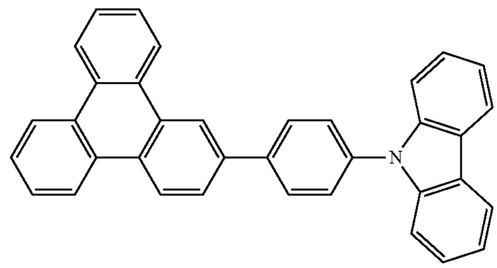
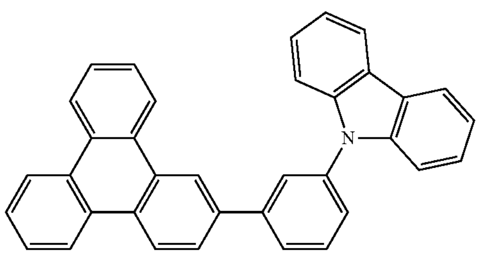
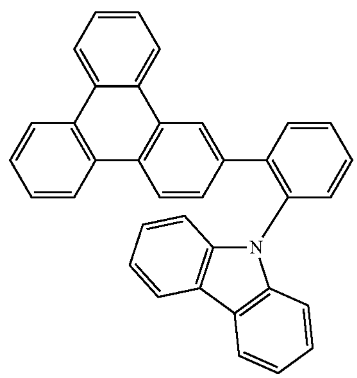
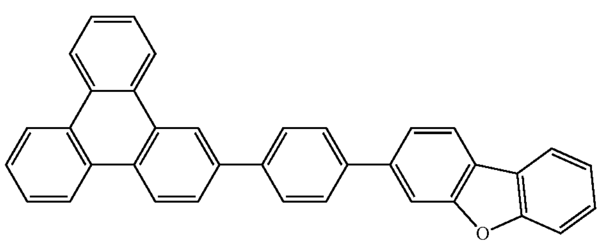
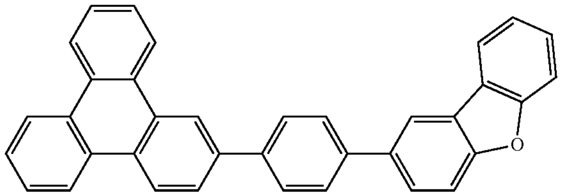
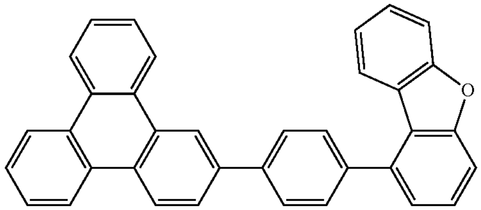
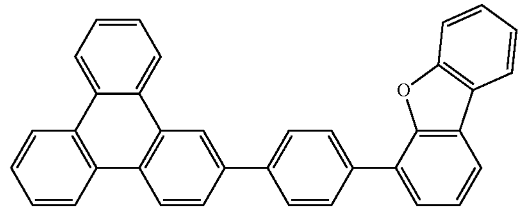

-continued
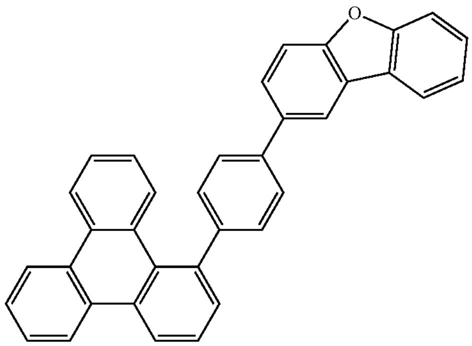
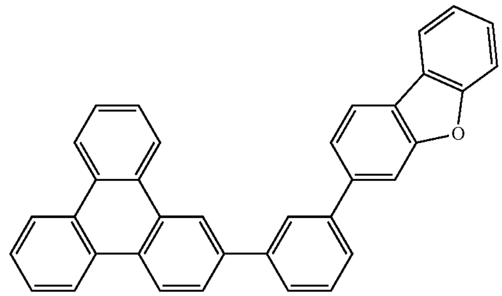
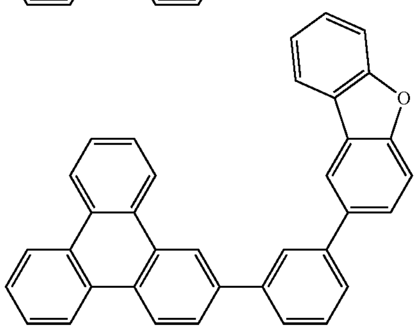
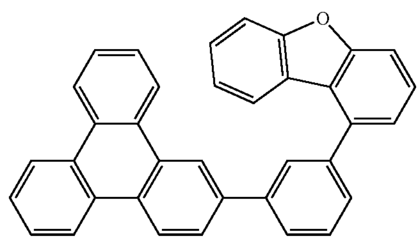
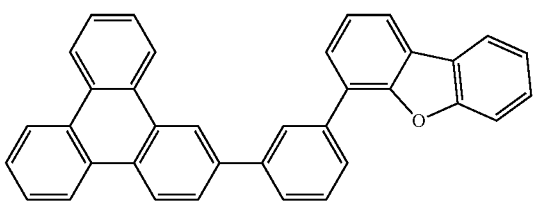
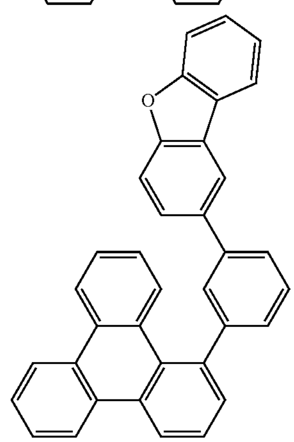
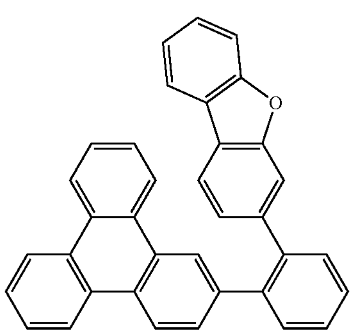
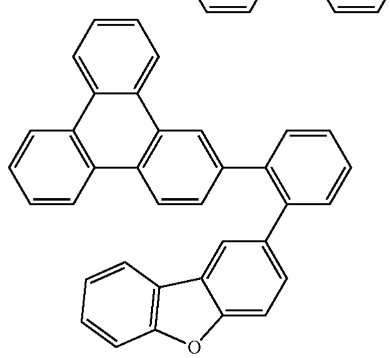
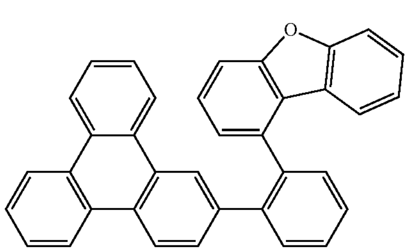
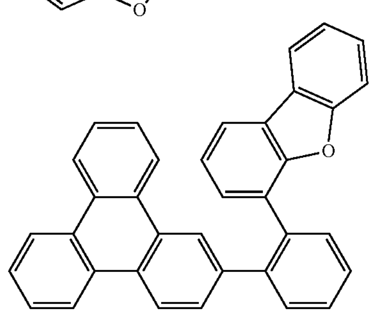

-continued
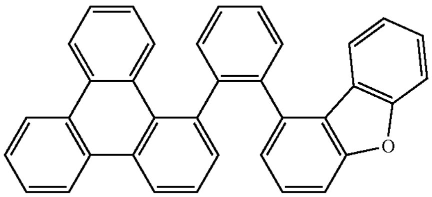
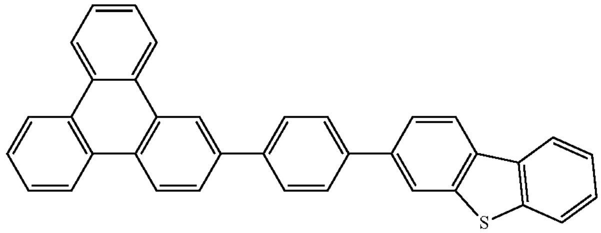
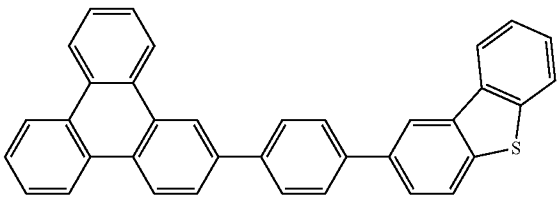
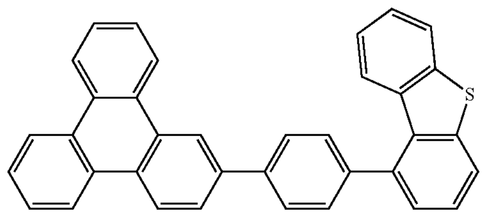
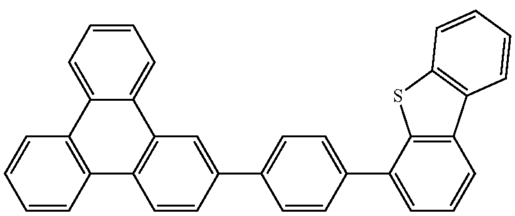
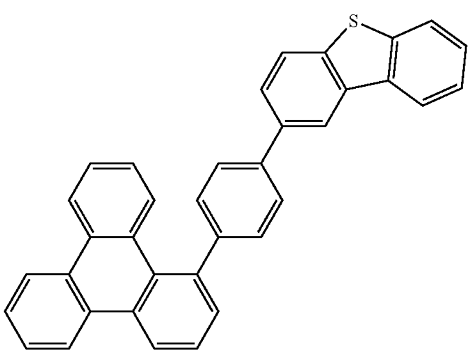
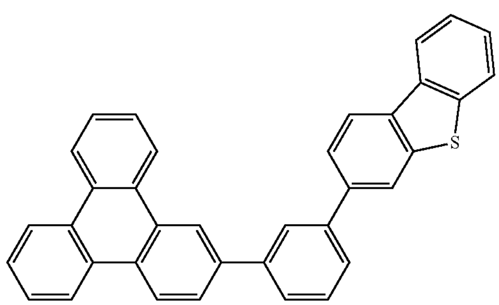
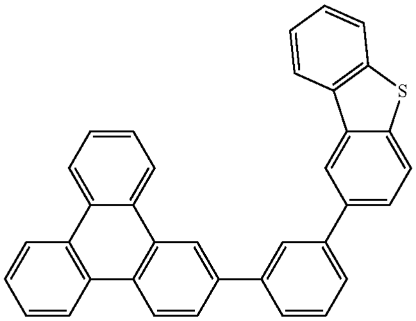
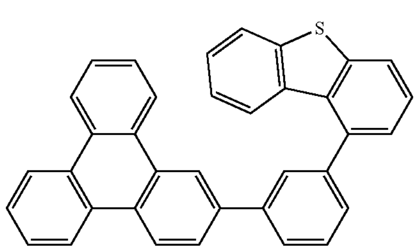

-continued
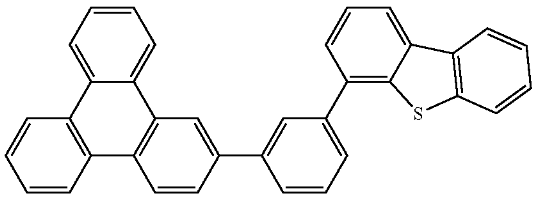
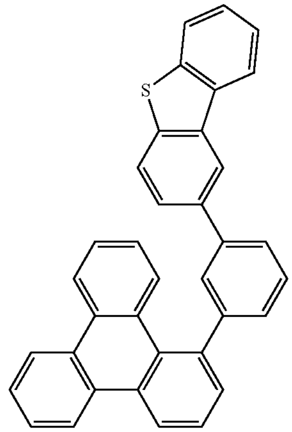
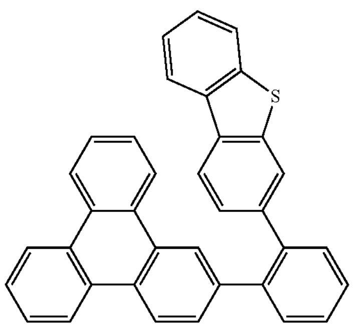
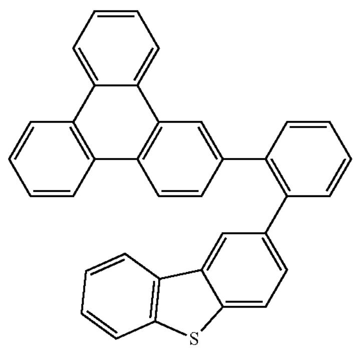
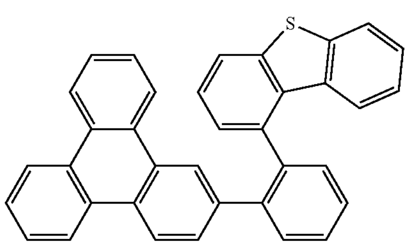
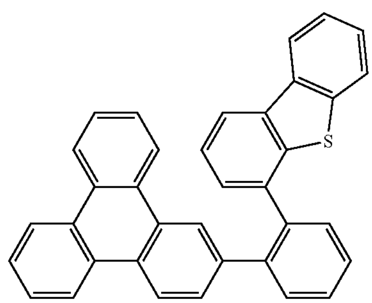
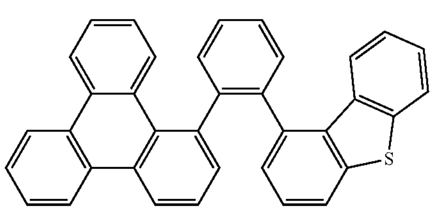
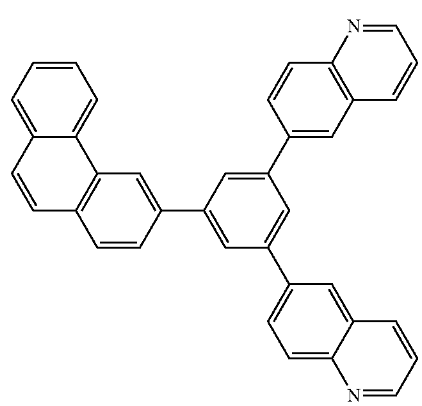

-continued
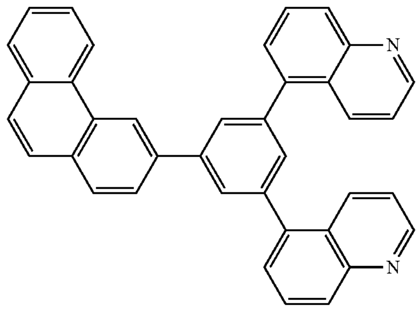
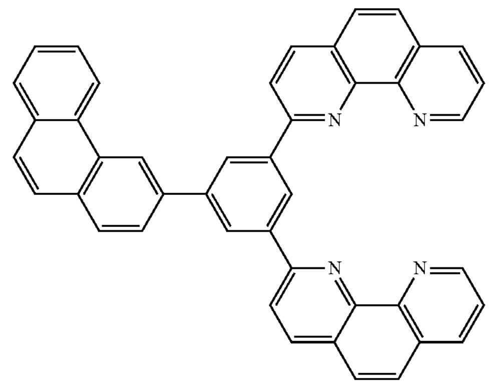
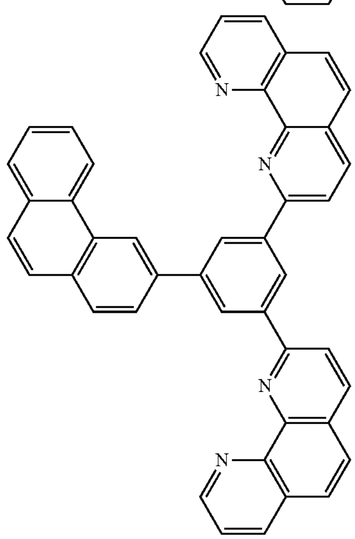
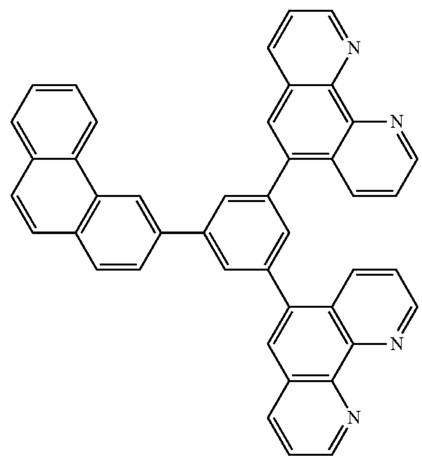
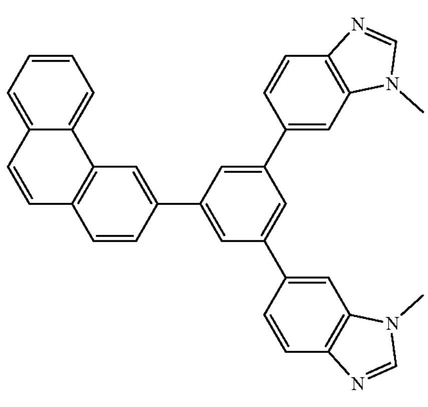
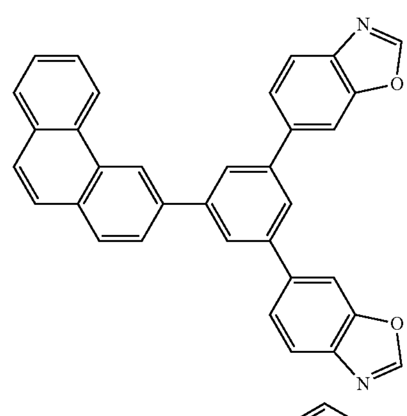
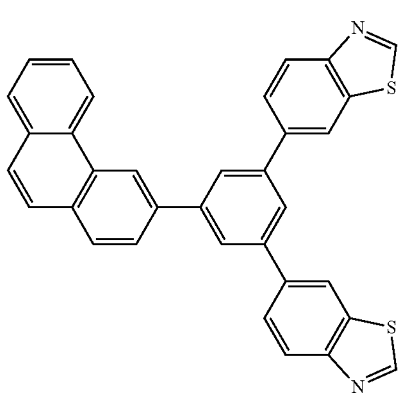
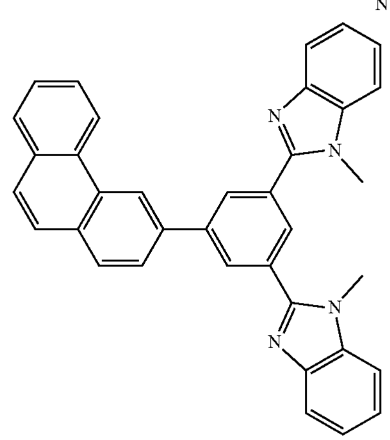

-continued
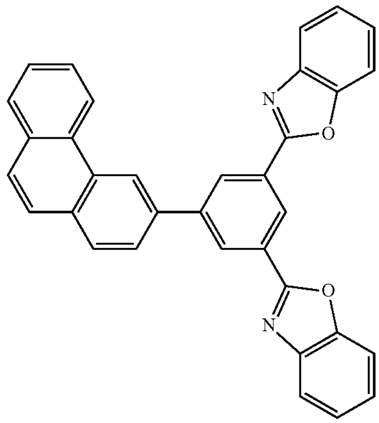
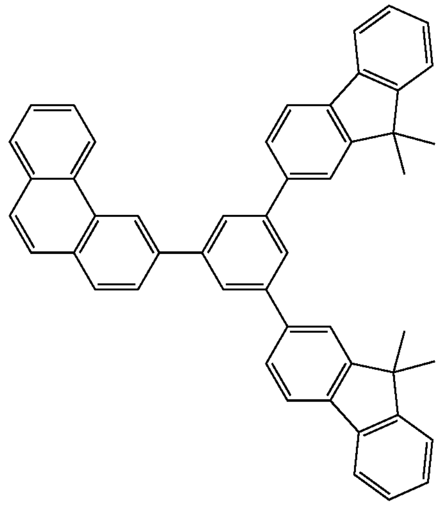
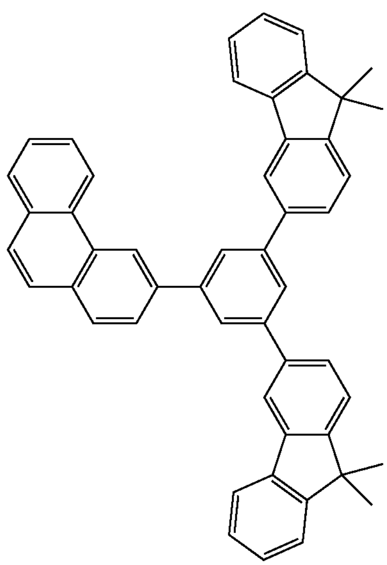
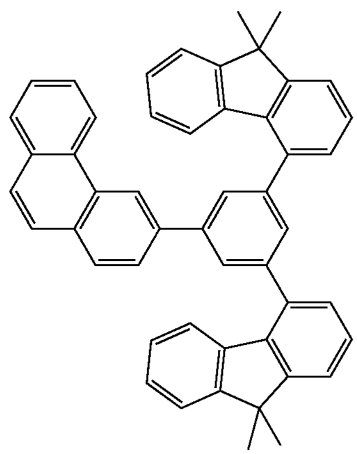
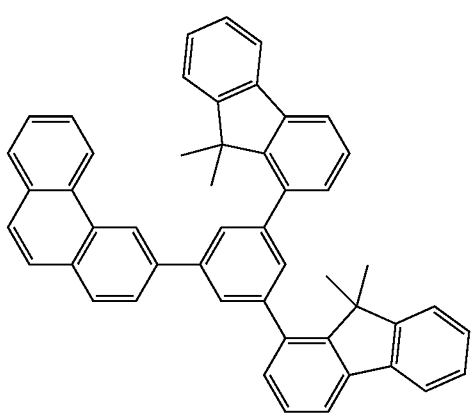
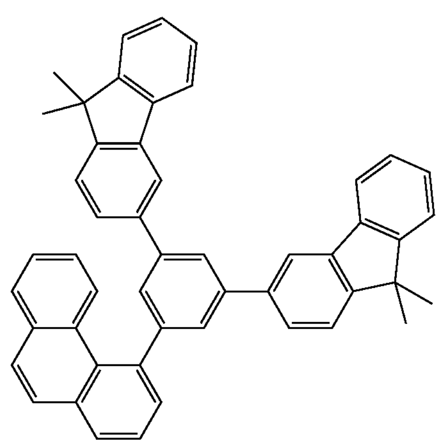

-continued
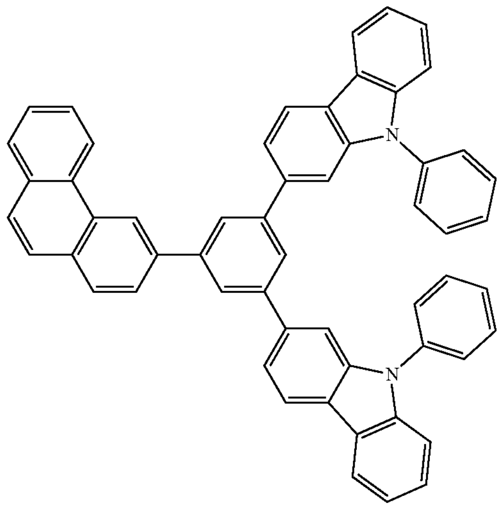
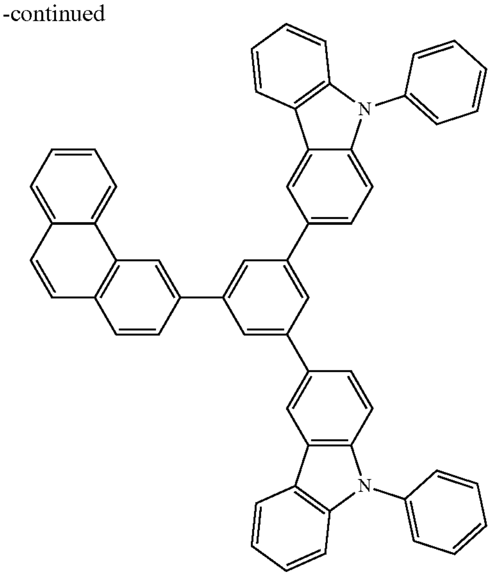
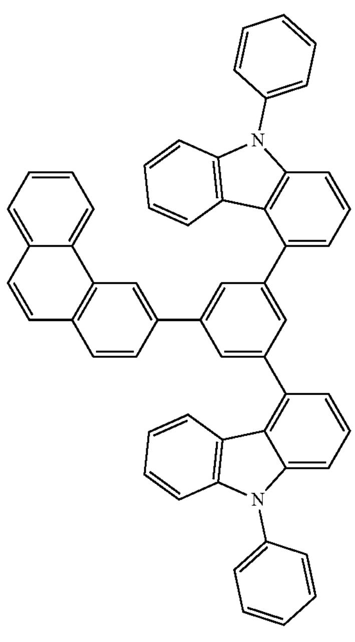
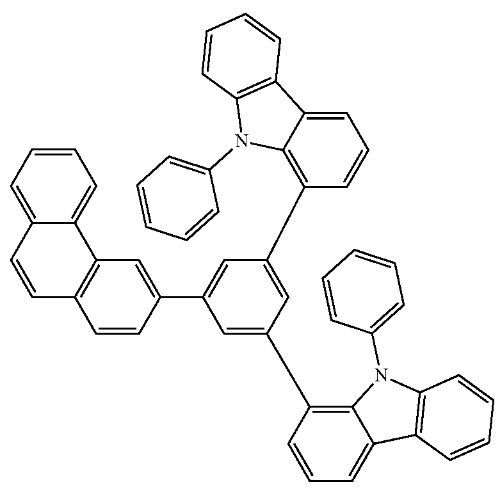
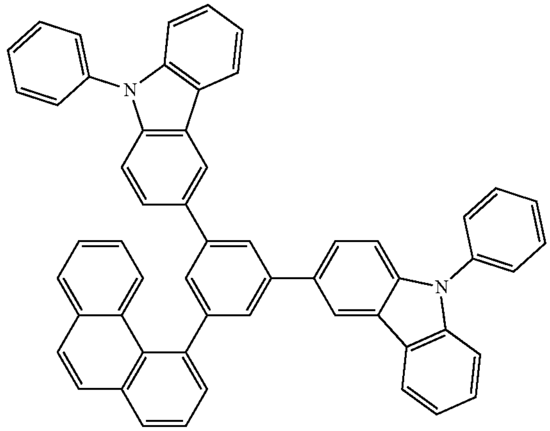
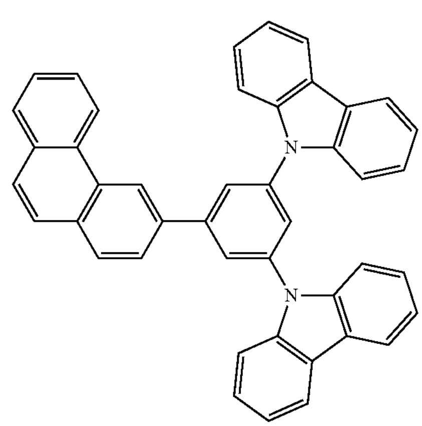

-continued
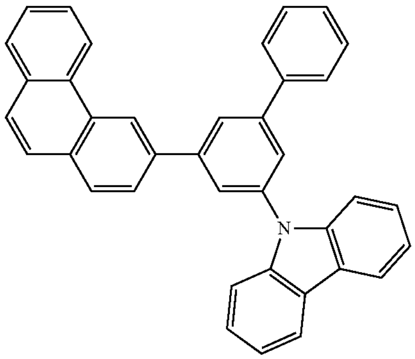
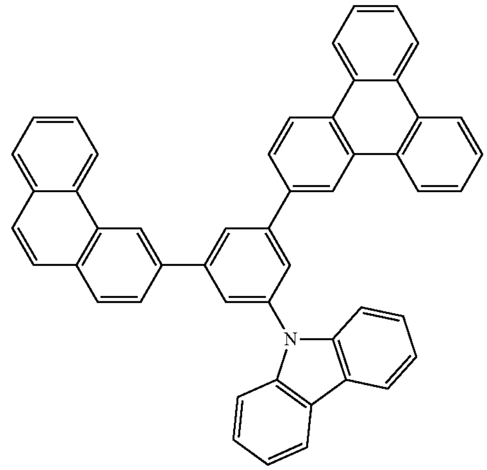
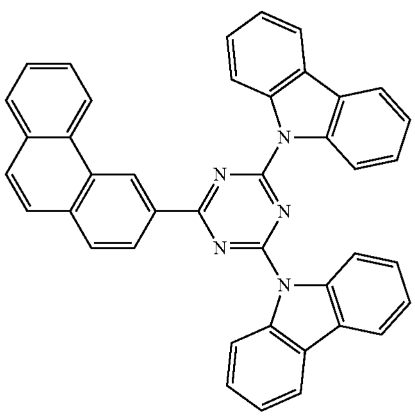
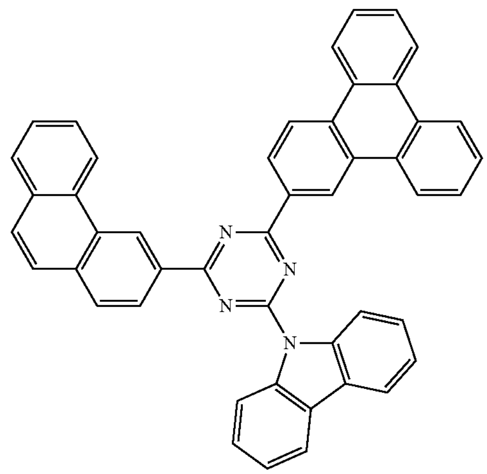
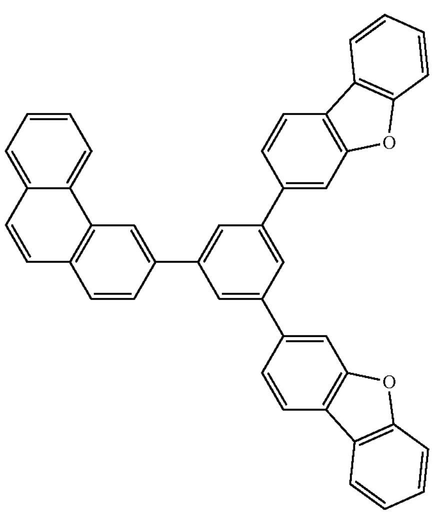
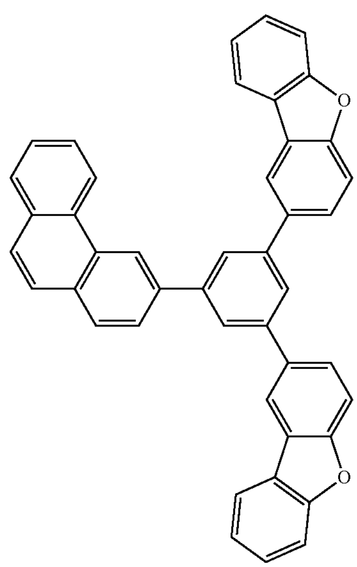

-continued
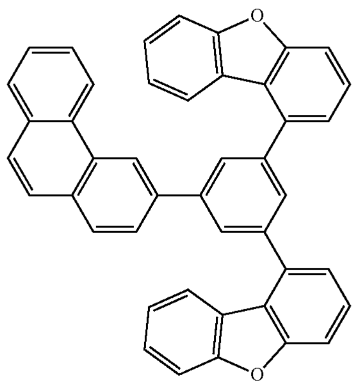
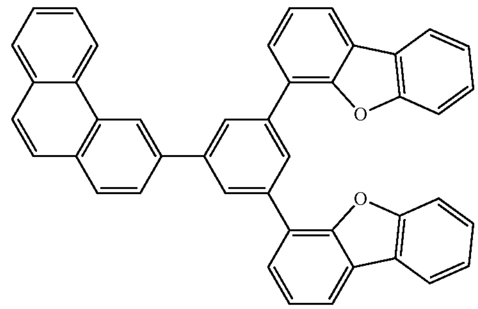
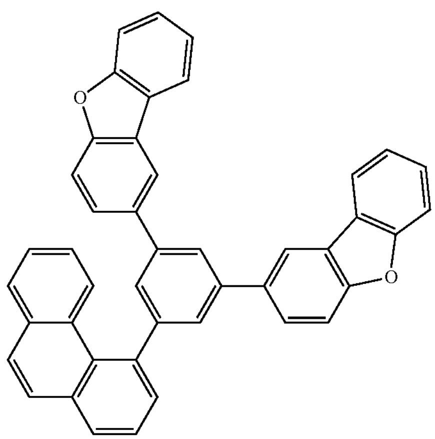
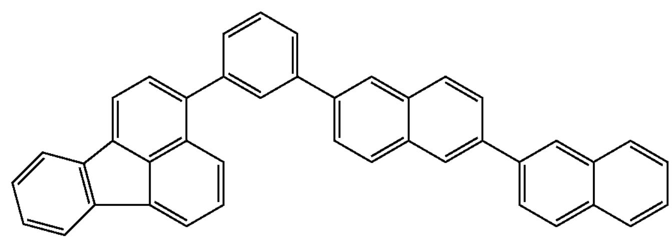
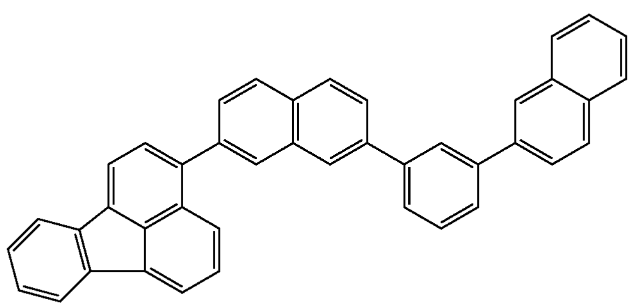
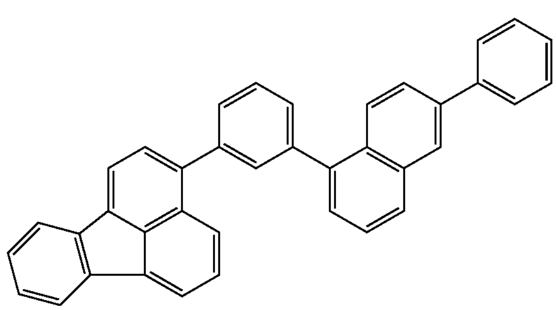
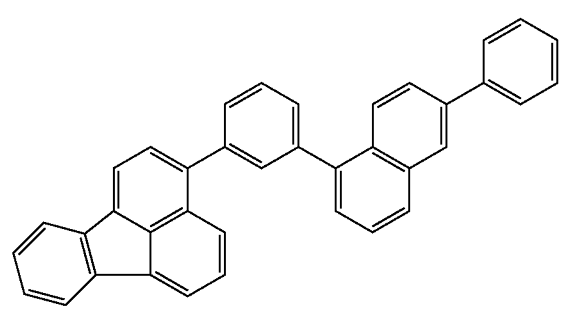

-continued
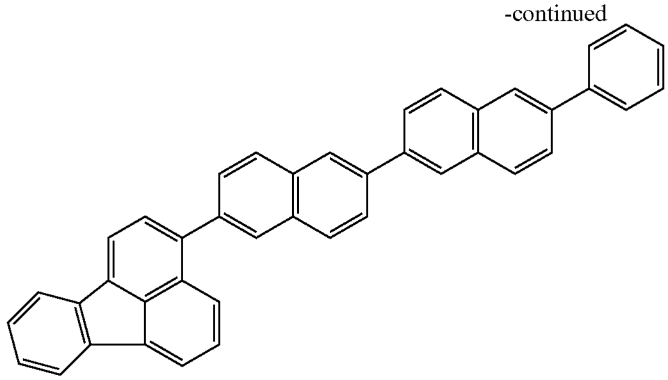
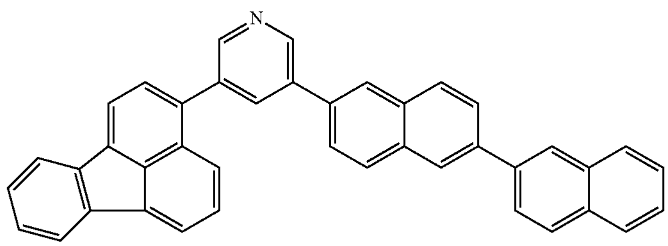
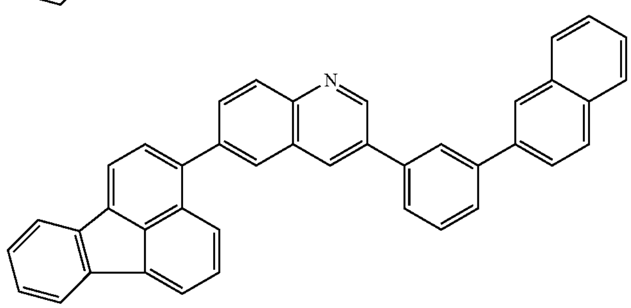
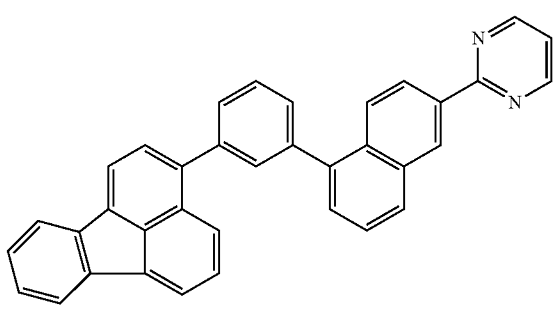
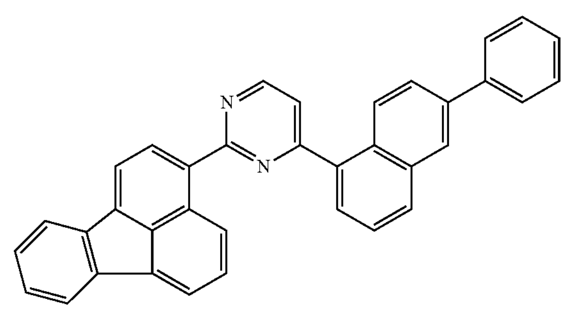
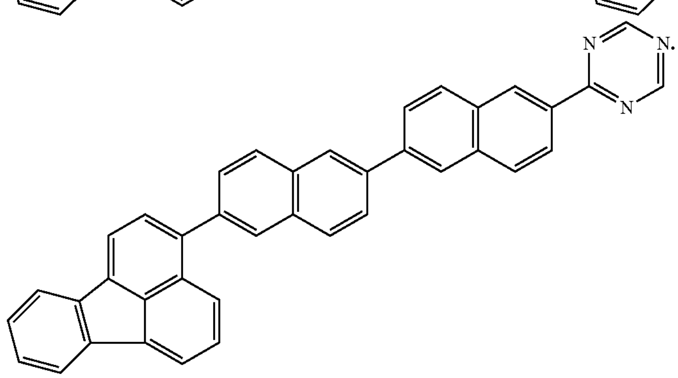
*19. An organic light-emitting device comprising*
*an anode;*
*a cathode; and*
*an organic layer between the anode and the cathode and comprising an emission layer (EML), a hole transport region between the anode and the EML and comprising*

*at least one selected from a hole injection layer (HIL), a hole transport layer (HTL), a buffer layer, and an electron blocking layer (EBL), and an electron transport region between the EML and the cathode and comprising an electron transport layer (ETL) and at least one selected from a hole blocking layer (HBL) and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the ETL,*

*wherein the at least two different compounds comprise a hole-transporting compound and an electron-transporting compound, and a weight ratio in the mixed organic layer of the hole-transporting compound to the electron-transporting compound is about 0.1:1 to about 10:1, and*

*the hole-transporting compound and the electron-transporting compound comprise one of the backbones below:*

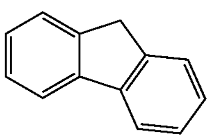

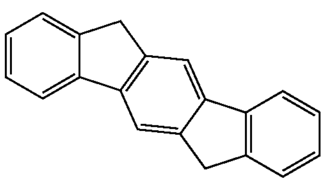

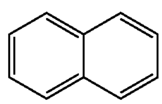

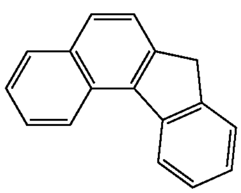

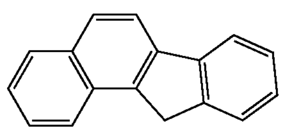

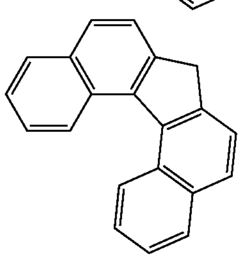

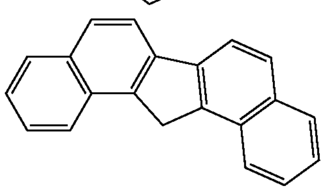

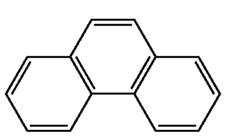

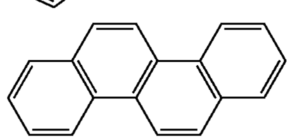

-continued

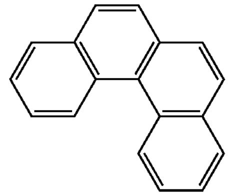

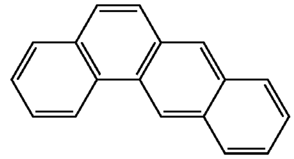

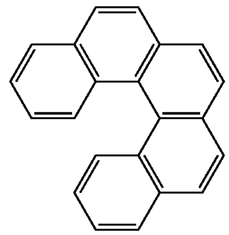

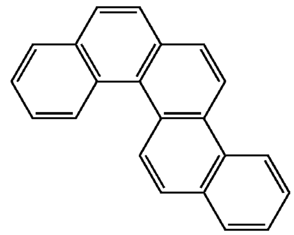

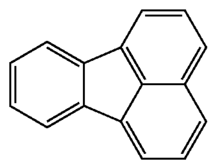

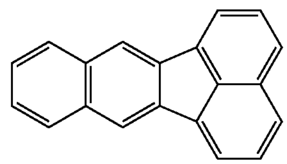

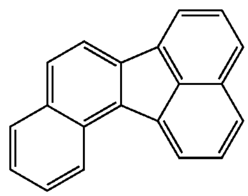

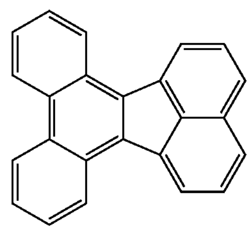

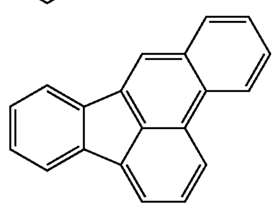

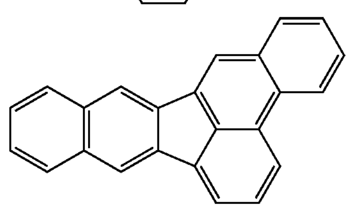

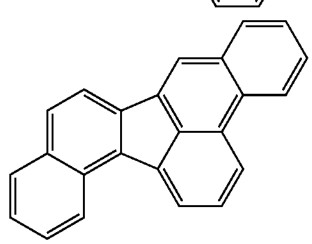

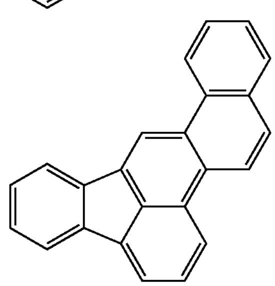

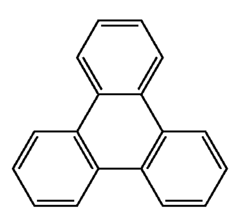

-continued
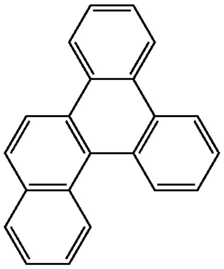
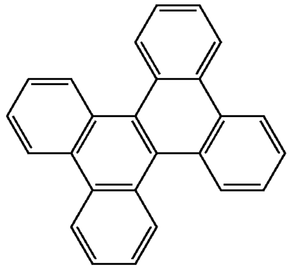
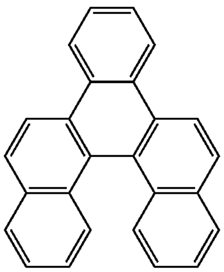
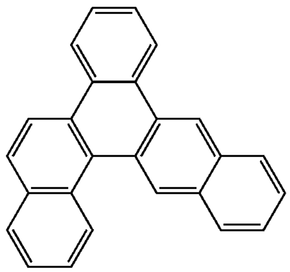
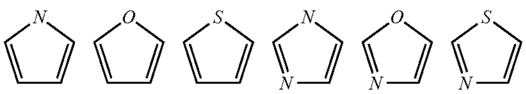
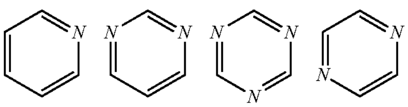
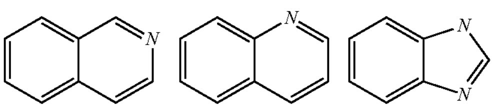
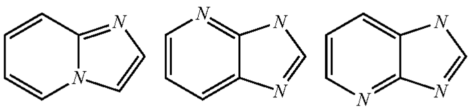
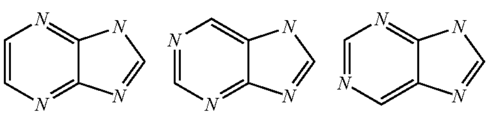
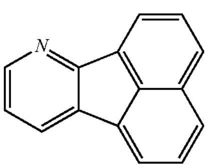
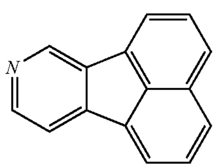
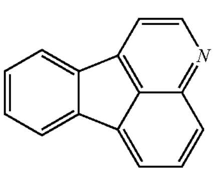
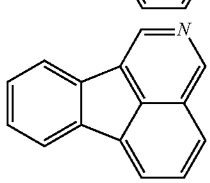
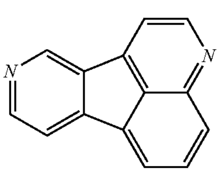
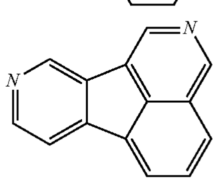
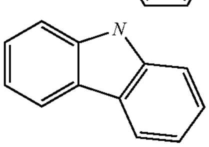
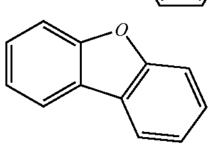
-continued
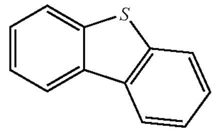
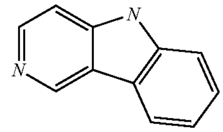
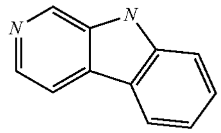
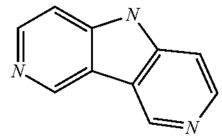
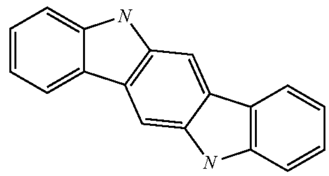
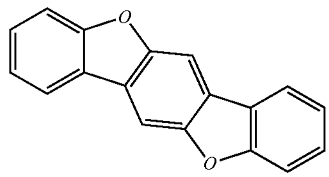
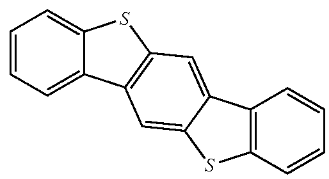
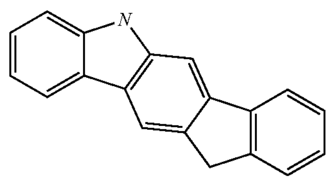
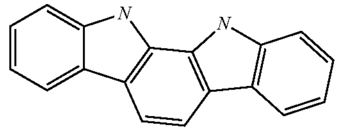
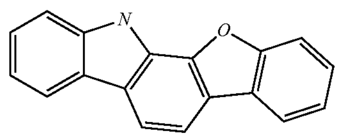
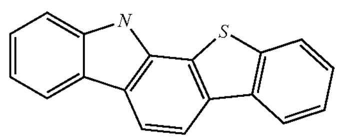
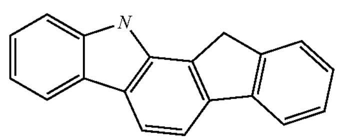
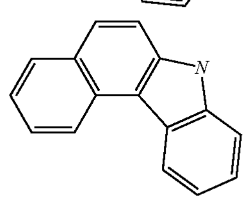
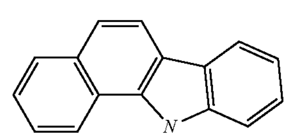

-continued
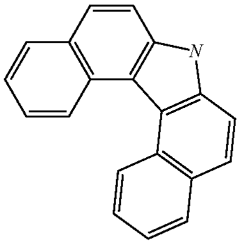
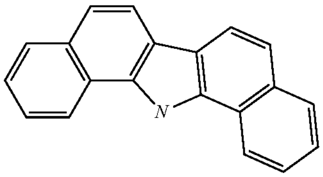
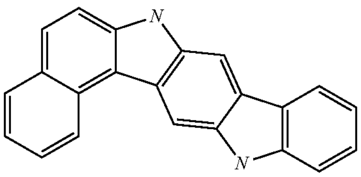
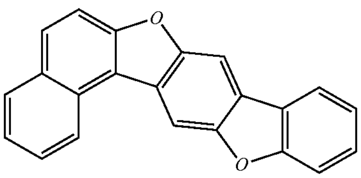
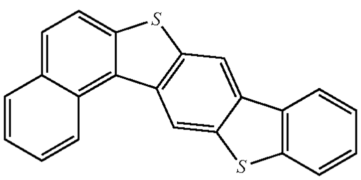
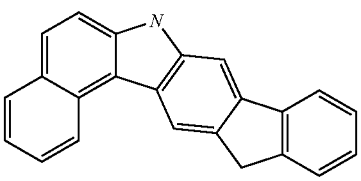
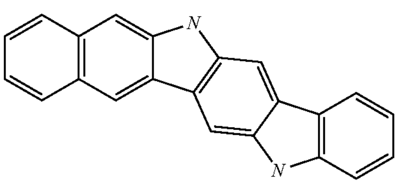
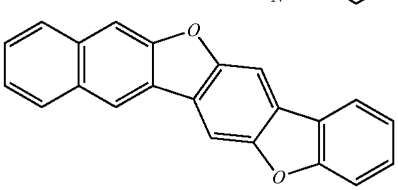
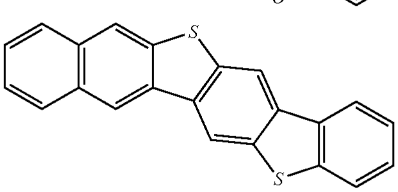
-continued
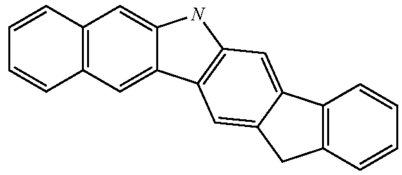
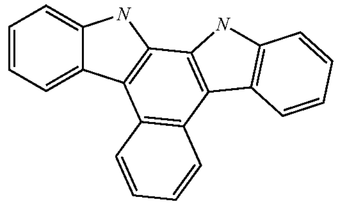
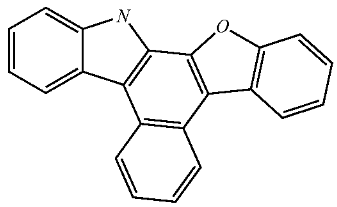
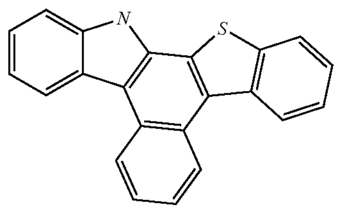
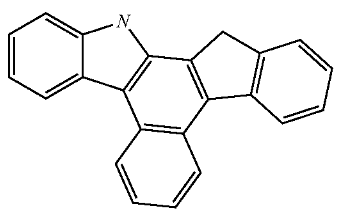
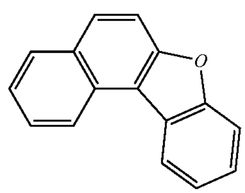
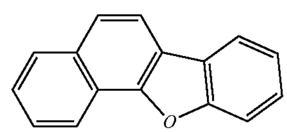
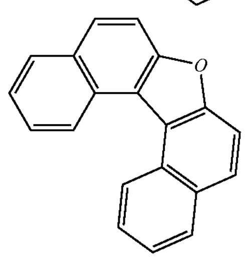
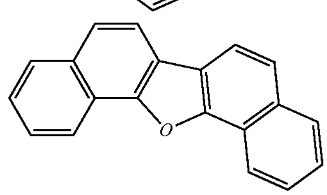

-continued

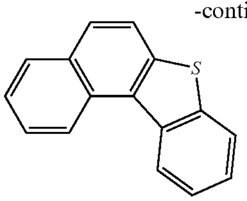
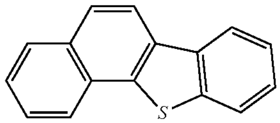
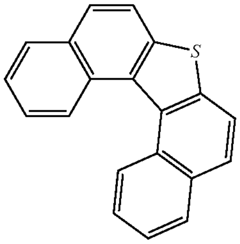
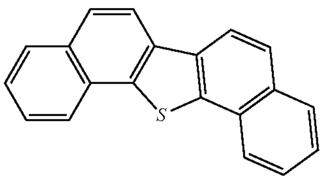
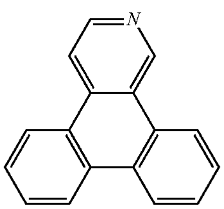
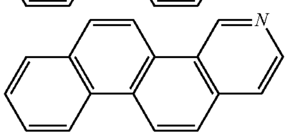
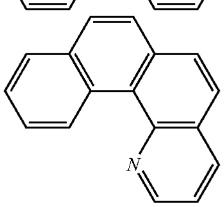
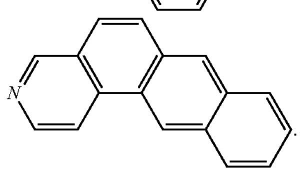

*20. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole- transporting material, and*

*the at least one compound comprises one of the following backbones:*

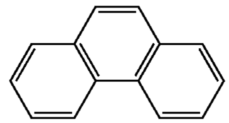
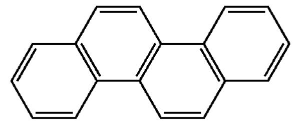
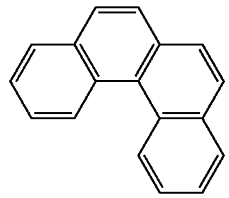
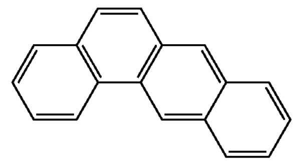
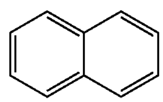
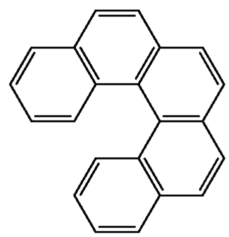
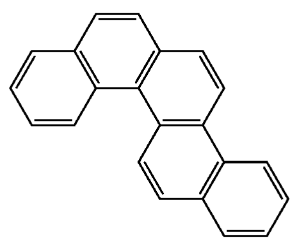
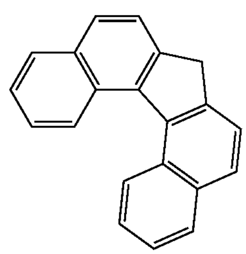
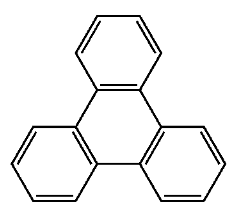
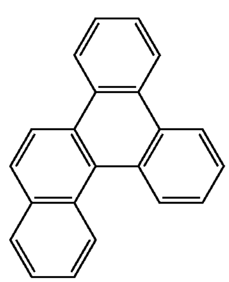
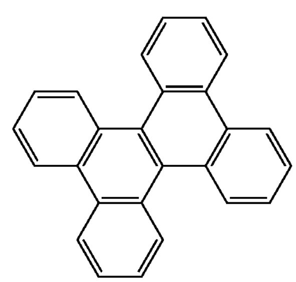

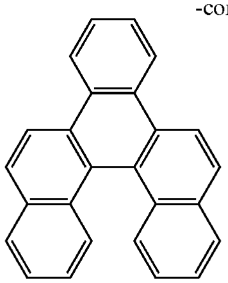

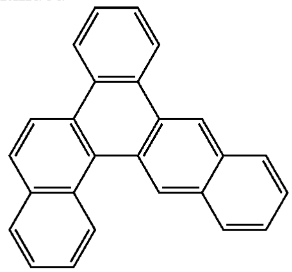

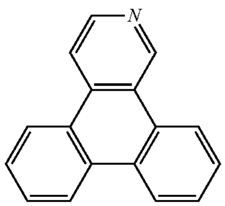

*21. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole-transporting material, and the at least one compound comprises one of the following backbones:*

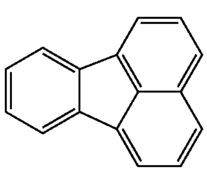

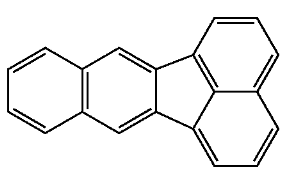

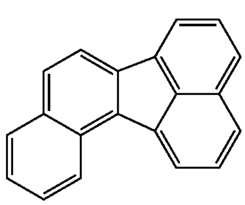

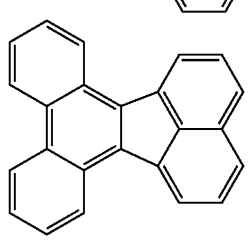

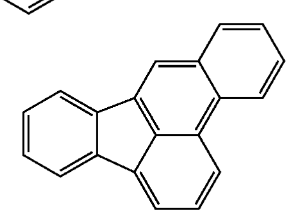

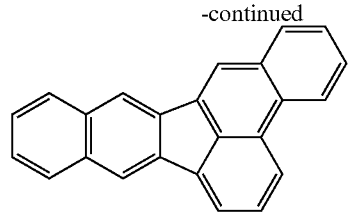

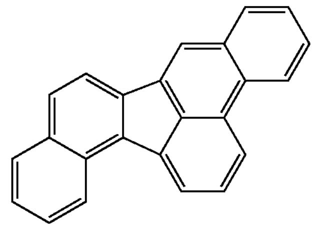

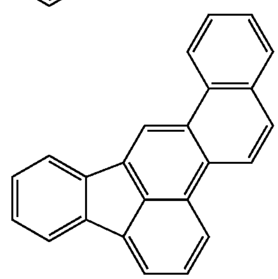

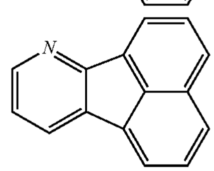

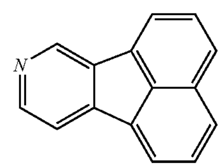

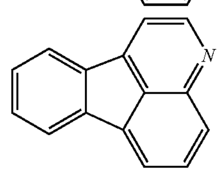

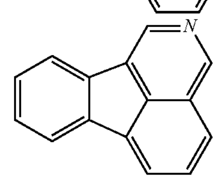

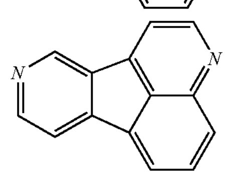

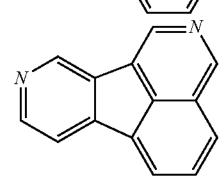

*22. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole-transporting material, and*
*the at least one compound comprises one of the following backbones:*
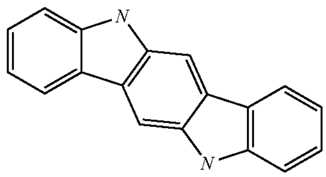
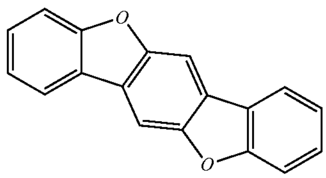
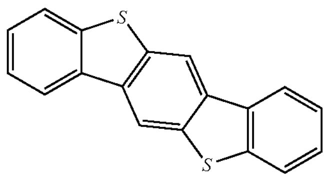
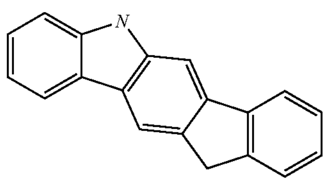
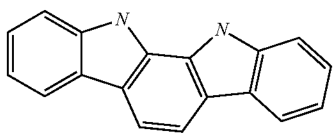
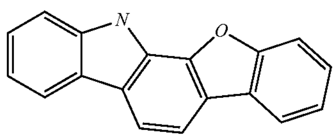
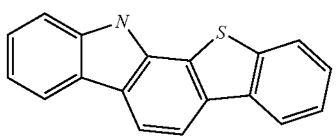
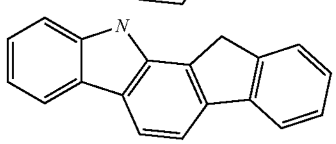
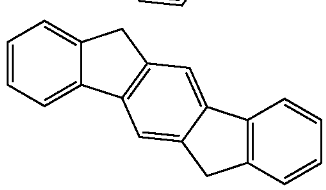
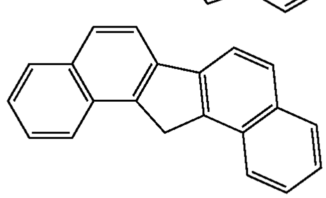
-continued
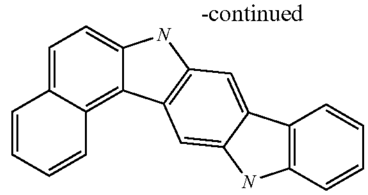
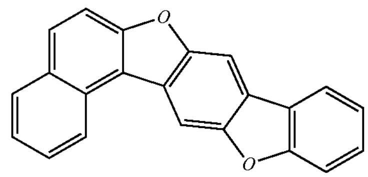
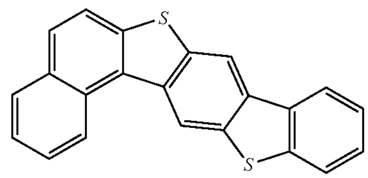
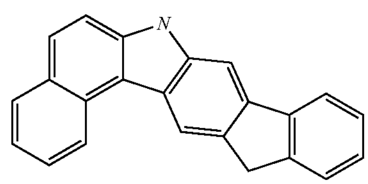
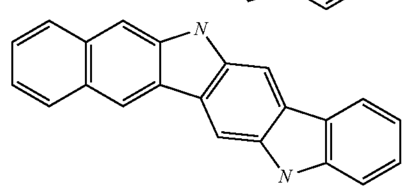
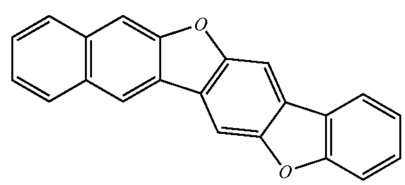
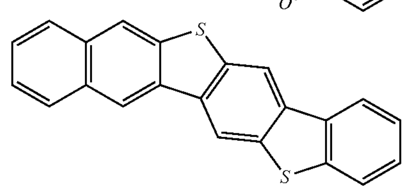
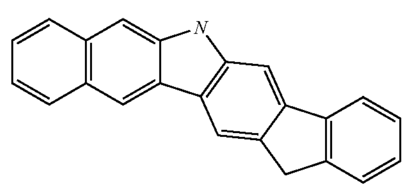
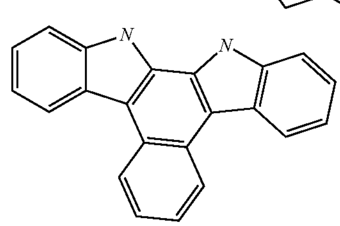

-continued

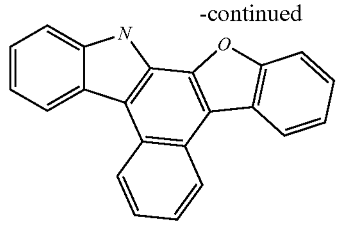

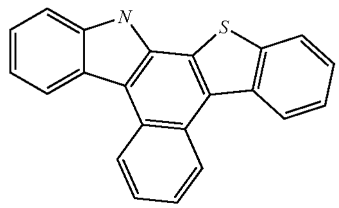

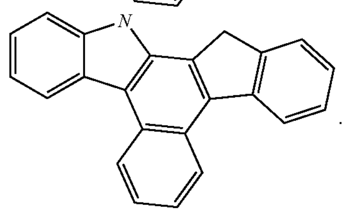

*23. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole- transporting material, and*

*the at least one compound comprises one of the following backbones:*

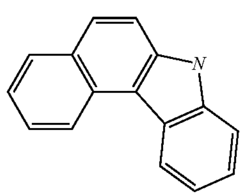

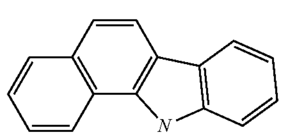

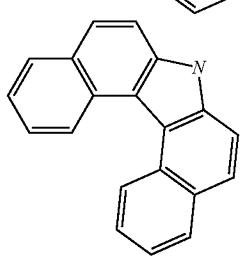

-continued

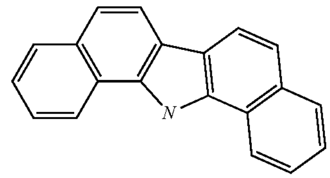

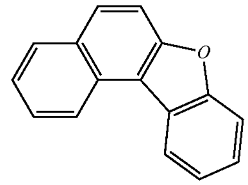

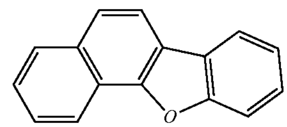

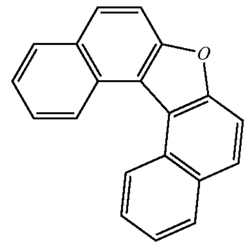

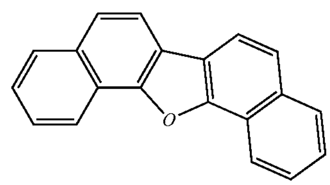

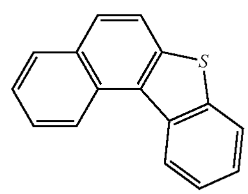

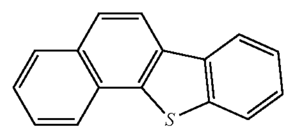

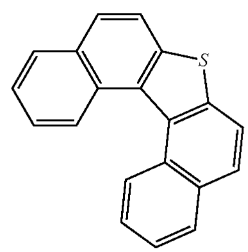

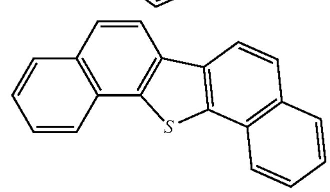

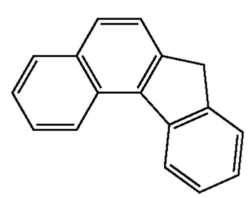

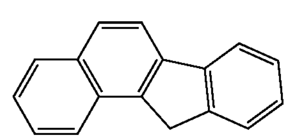

-continued

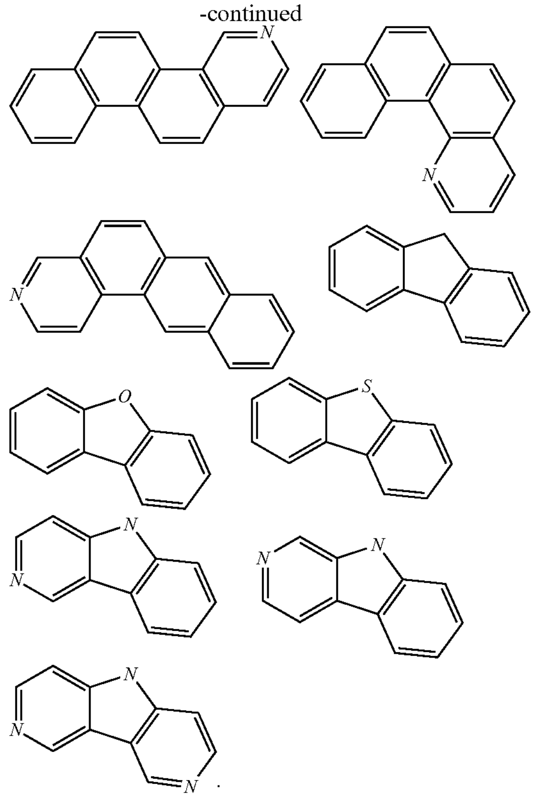

-continued

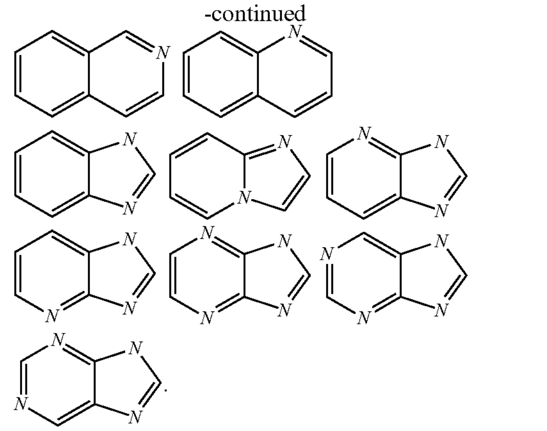

*24. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole-transporting material, and*

*the at least one compound comprises one of the following backbones:*

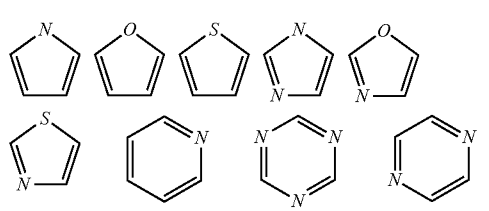

*25. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole- transporting material,*

*wherein the triplet energy of the at least one compound is greater in level than a triplet energy of a dopant in the EML.*

*26. The organic light-emitting device of claim 25, wherein the at least two different compounds comprise at least two different electron-transporting compounds.*

*27. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole- transporting material,*

*wherein the at least two different compounds comprise a hole-transporting compound and an electron-transporting compound, and a weight ratio in the mixed organic layer of the hole-transporting compound to the electron-transporting compound is about 0.1:1 to about 10:1, and*

*wherein the at least one compound comprises one of the backbones below:*

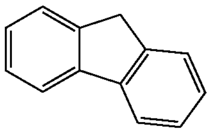
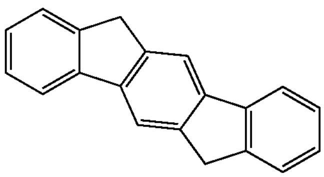
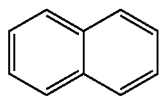
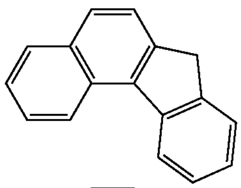
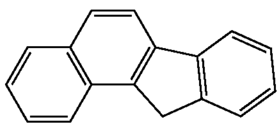
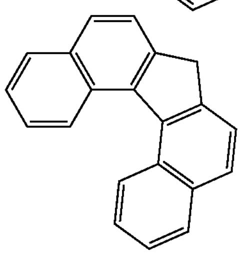
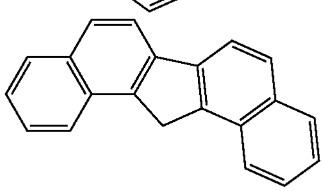
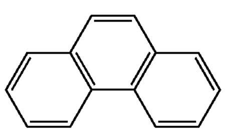
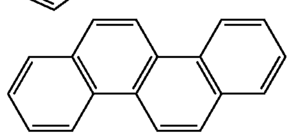
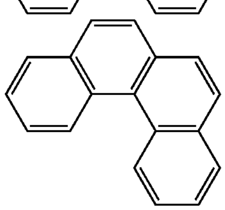
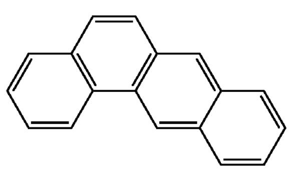
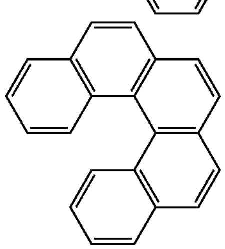
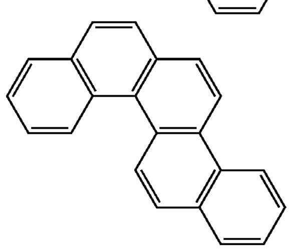

-continued

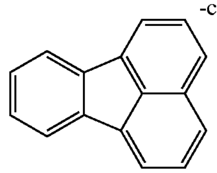
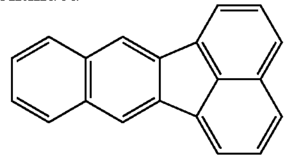
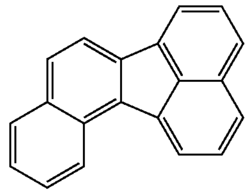
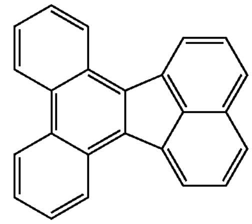
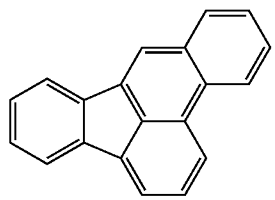
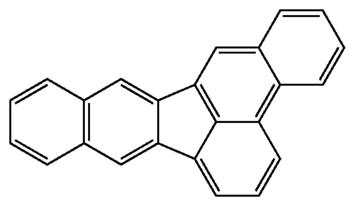
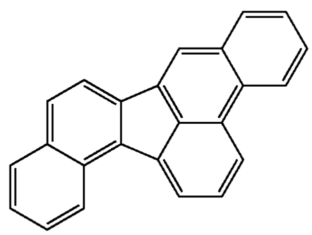
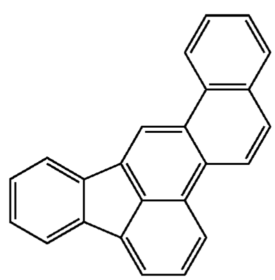
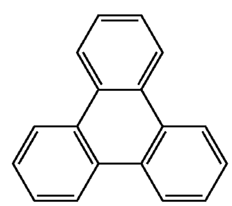
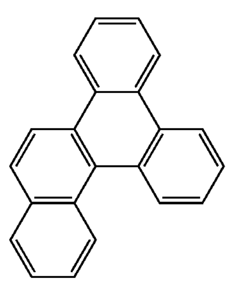
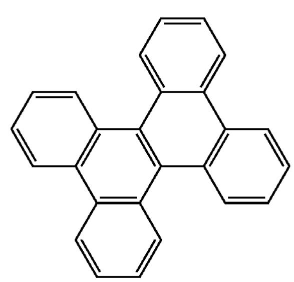

-continued
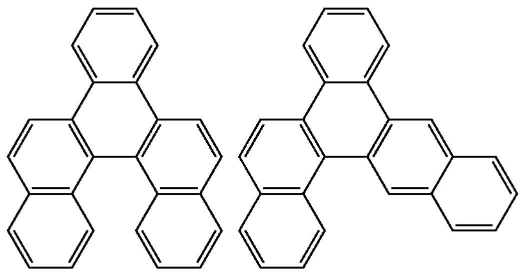
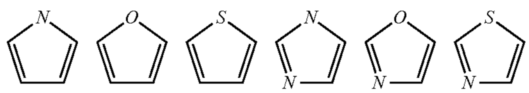
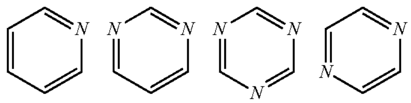
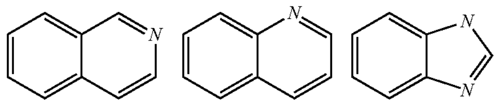
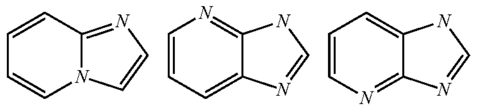
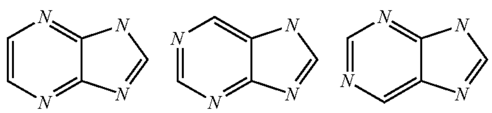
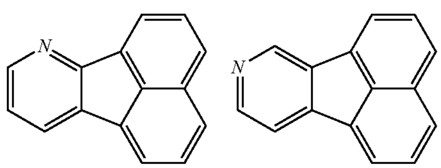
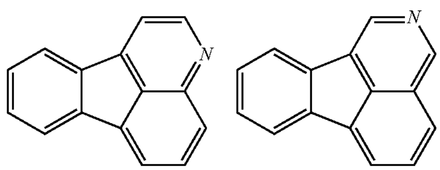
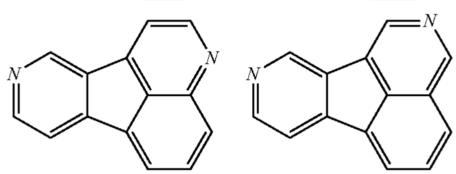
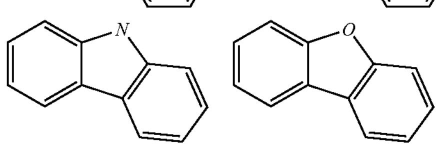
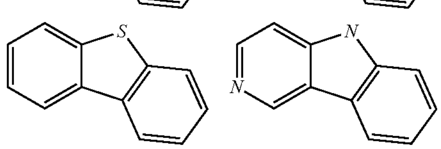
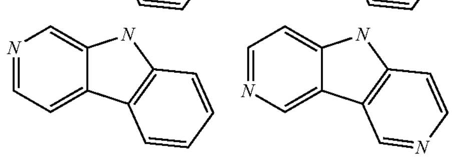
-continued
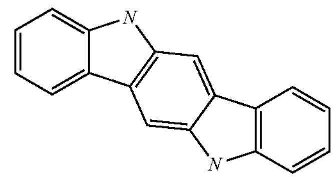
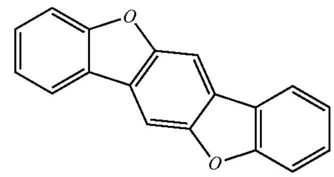
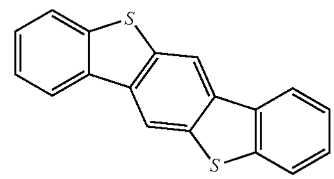
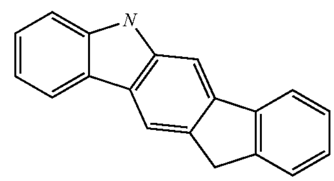
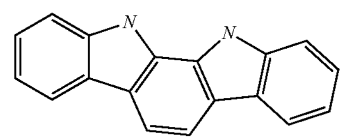
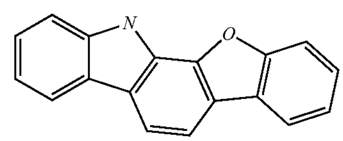
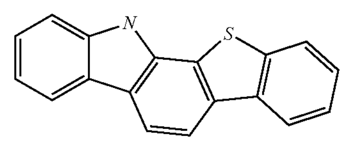
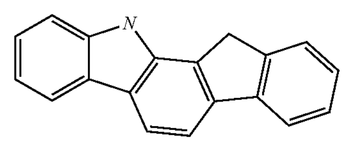
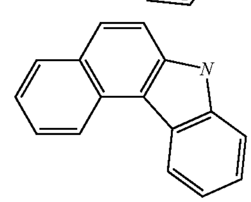
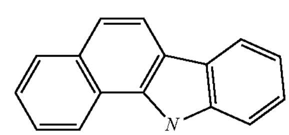
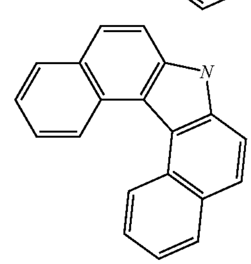

-continued
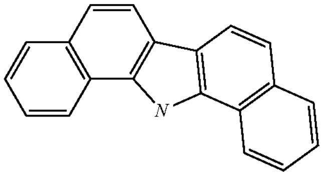
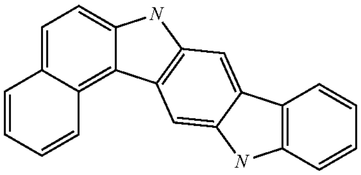
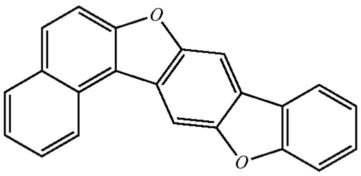
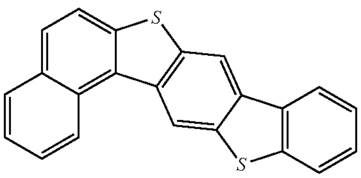
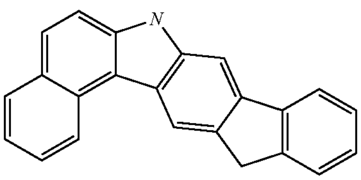
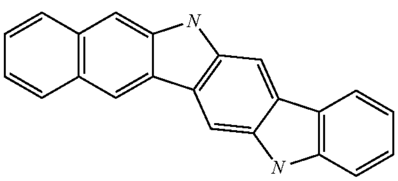
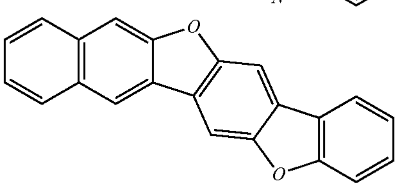
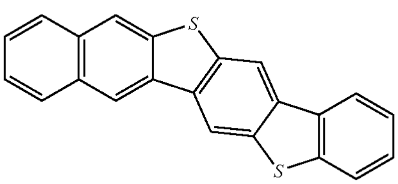
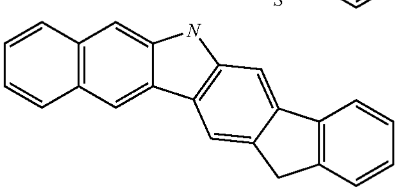
-continued
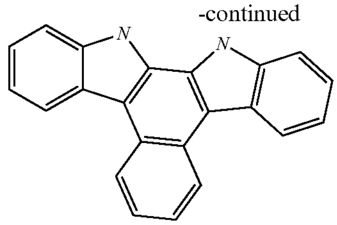
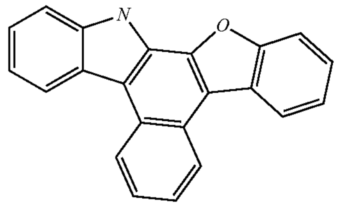
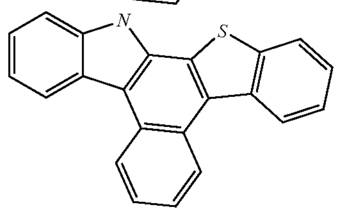
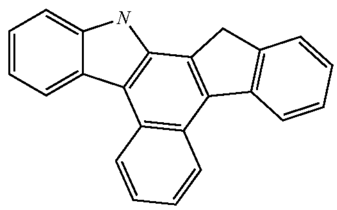
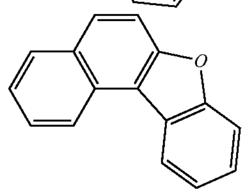
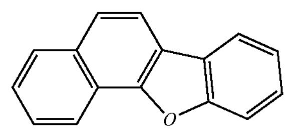
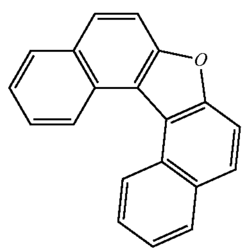
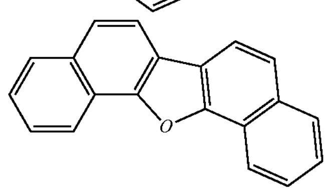
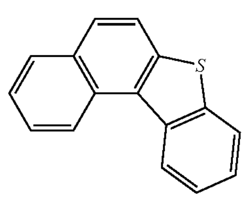
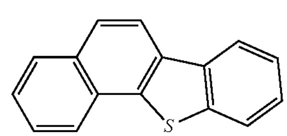

-continued

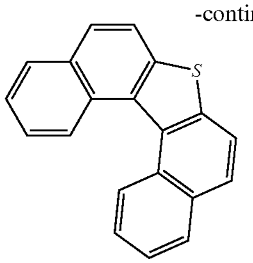

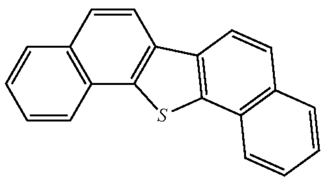

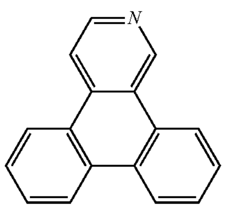

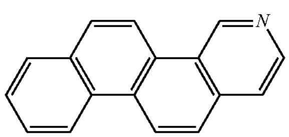

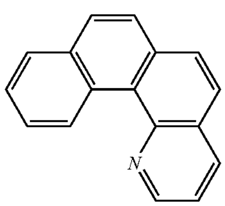

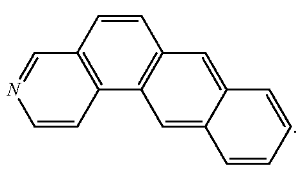

*28. The organic light-emitting device of claim 27, wherein the at least two different compounds comprise at least two different electron-transporting compounds.*

*29. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole-transporting material,*

*wherein the at least two different compounds comprise a hole-transporting compound and an electron-transporting compound, and an electron affinity of the hole-transporting compound is less than an electron affinity of the electron-transporting compound.*

*30. The organic light-emitting device of claim 29, wherein the at least two different compounds comprise at least two different electron-transporting compounds.*

*31. An organic light-emitting device comprising an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole-transporting material,*

*wherein the hole transport region comprises a p-dopant.*

*32. The organic light-emitting device of claim 31, wherein the at least two different compounds comprise at least two different electron-transporting compounds.*

*33. An organic light-emitting device comprising*

*an anode;*

*a cathode; and*

*an organic layer between the anode and the cathode and comprising an emission layer (EML), a hole transport region between the anode and the EML and comprising at least one selected from a hole injection layer (HIL), a hole transport layer (HTL), a buffer layer, and an electron blocking layer (EBL), and an electron transport region between the EML and the cathode and comprising an electron transport layer (ETL); and at least one selected from a hole blocking layer (HBL), and an electron injection layer (EIL),*

*wherein a mixed organic layer is between the EML and the electron transport layer (ETL) and comprises at least two different compounds, a triplet energy of at least one compound of the at least two different compounds being 2.2 eV or greater,*

*wherein the mixed organic layer is in contact with the EML and the electron transport layer (ETL),*

*wherein the at least one compound is an electron-transporting material, or a hole- transporting material,*

*wherein the mixed organic layer comprises at least two compounds selected from compounds below:*

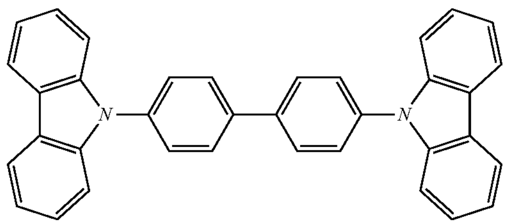
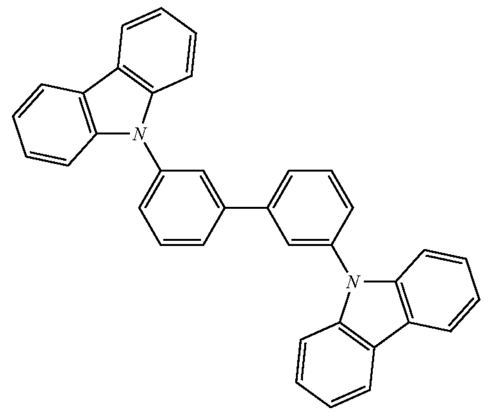
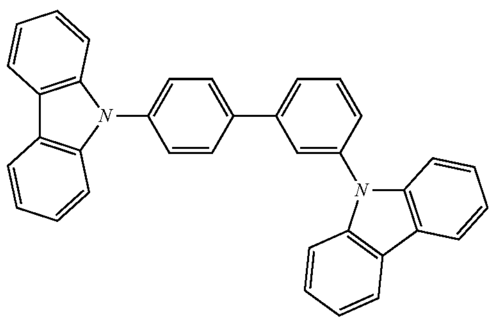
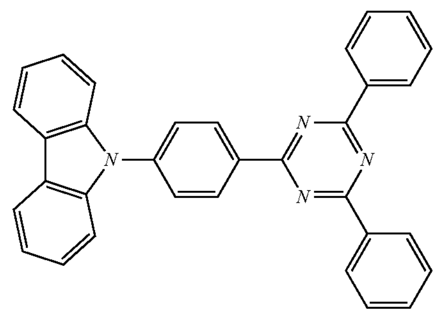
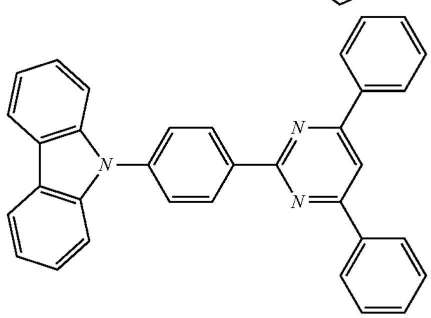
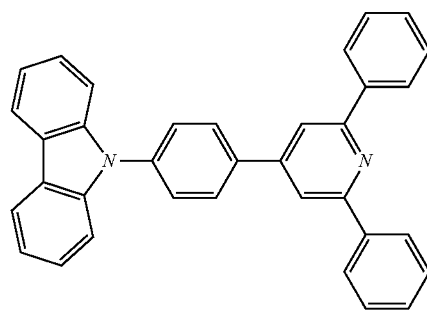
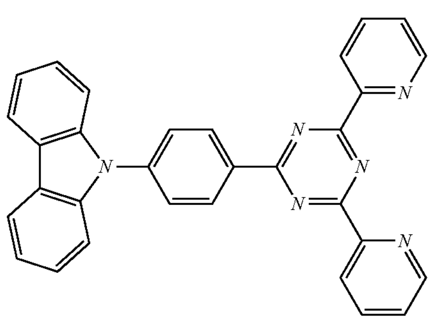
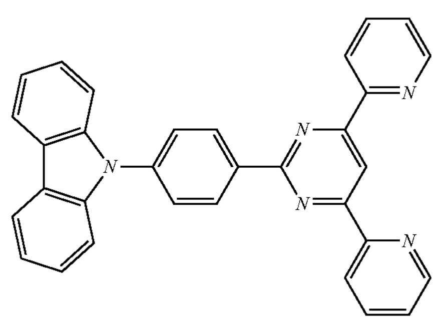
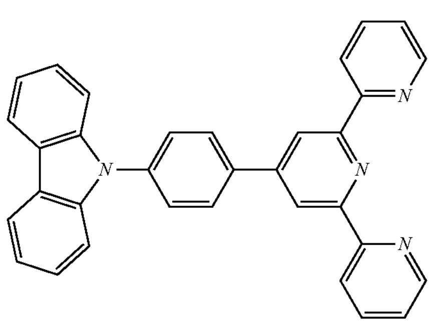
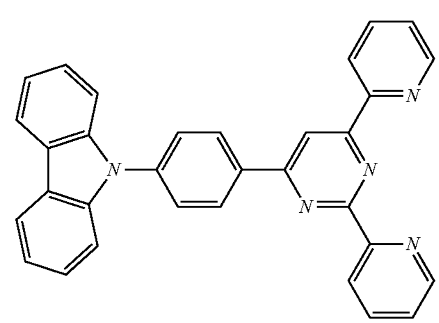

-continued
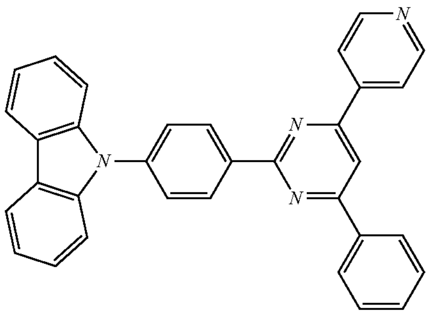
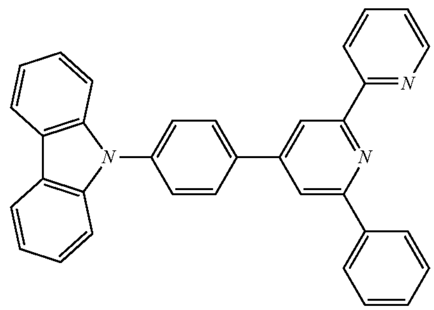
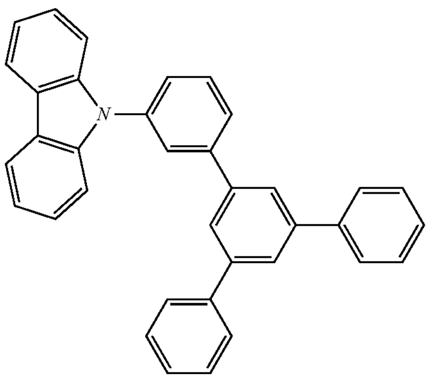
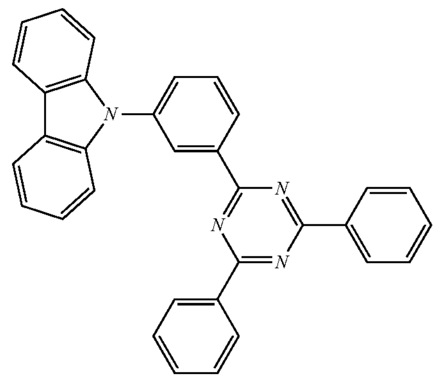
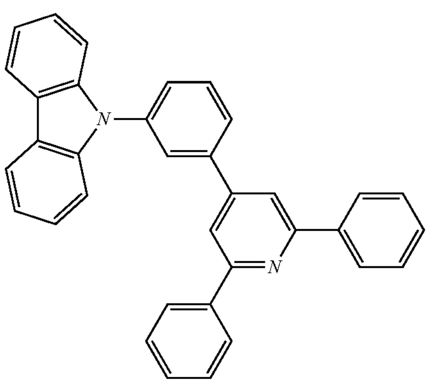
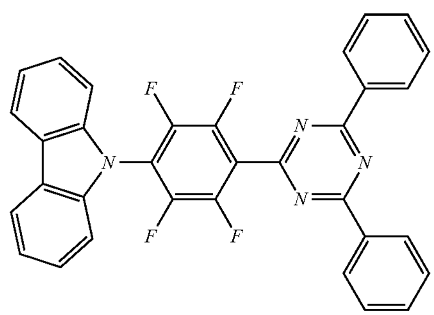
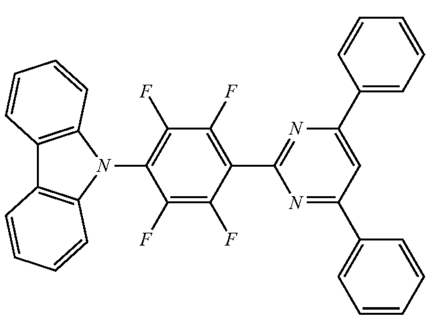
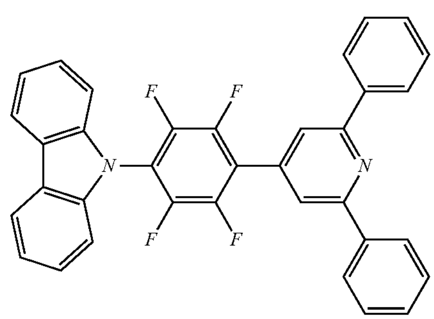
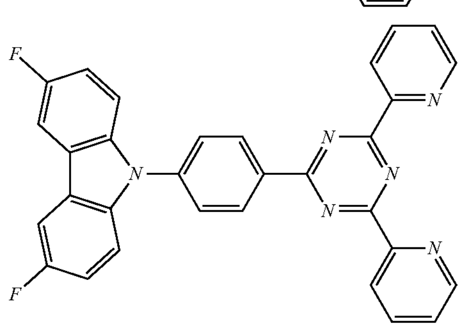
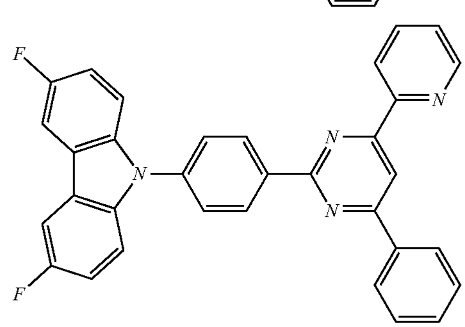

-continued
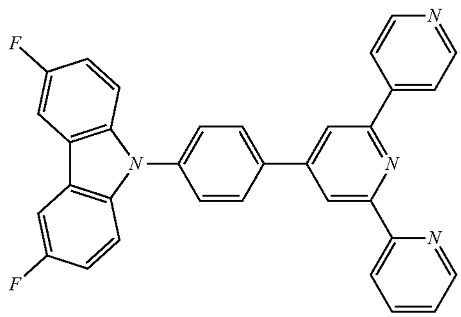
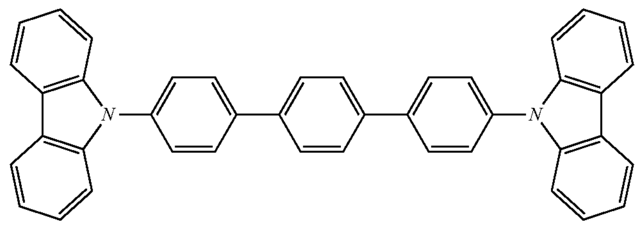
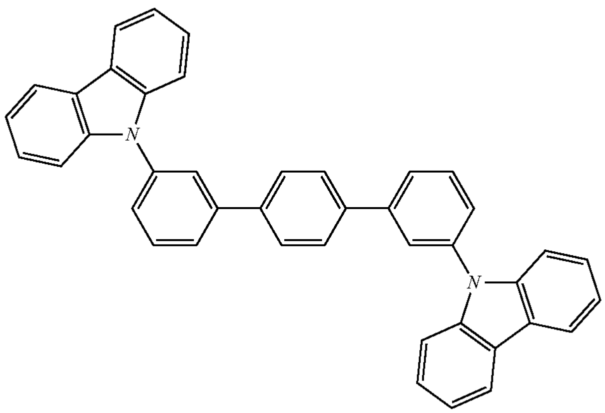
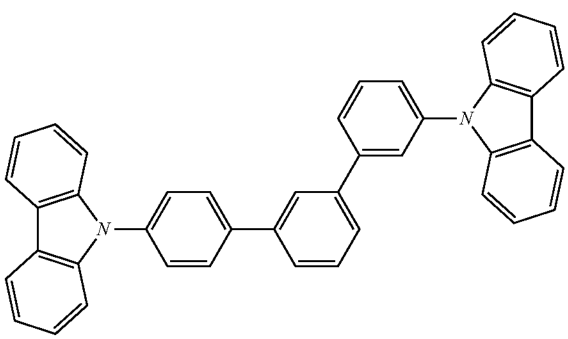
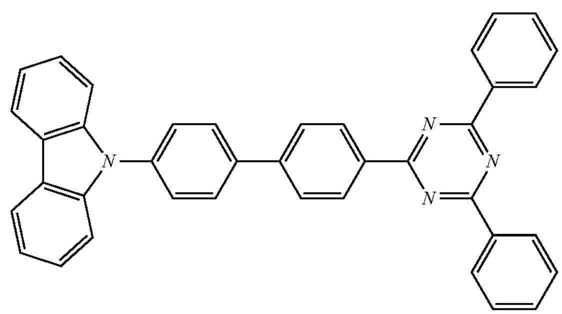
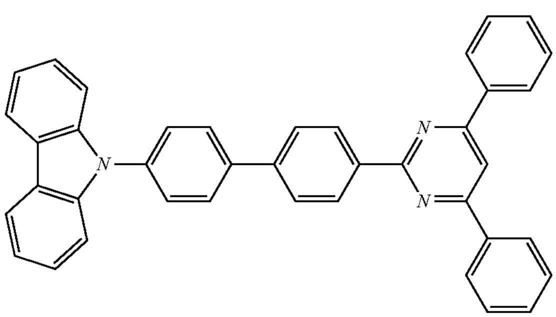
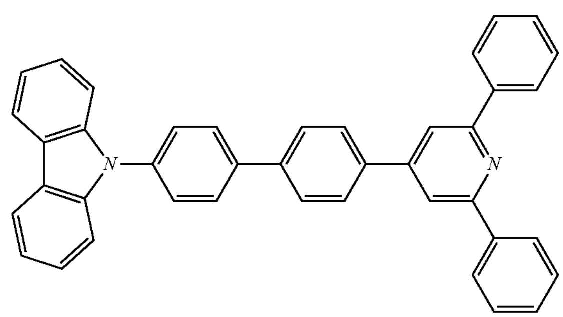
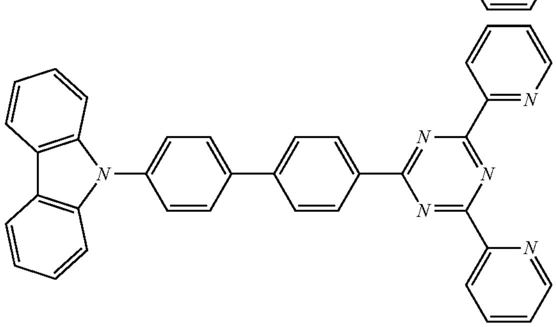
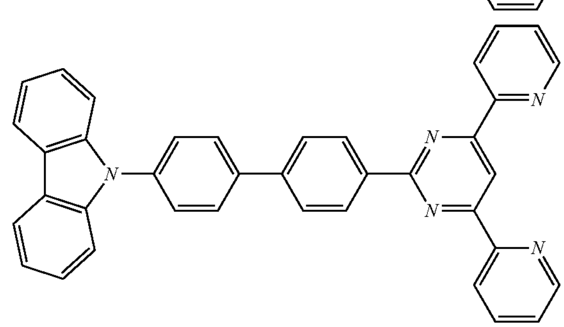

-continued
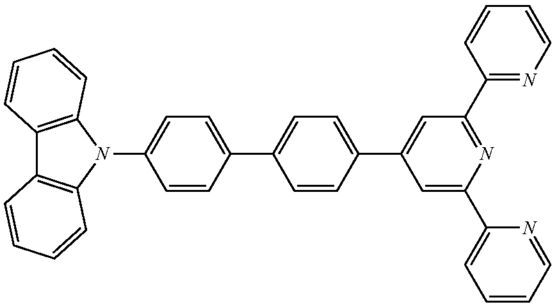
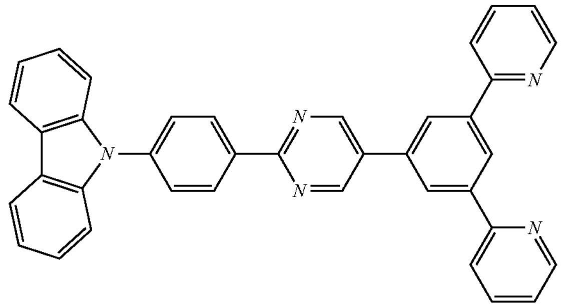
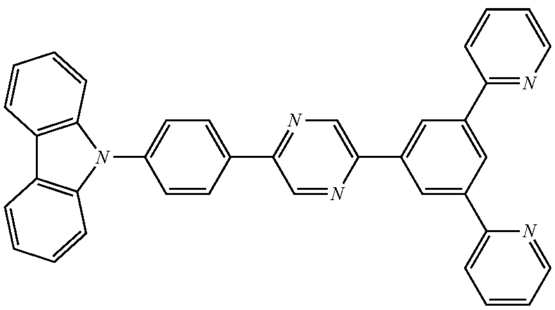
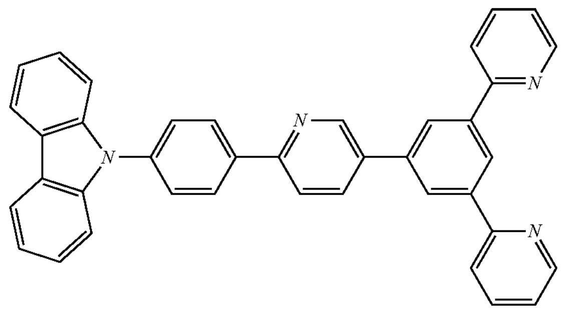
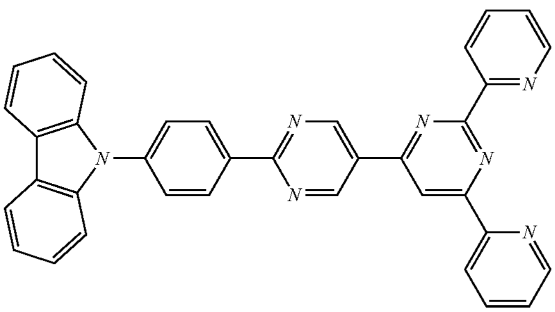
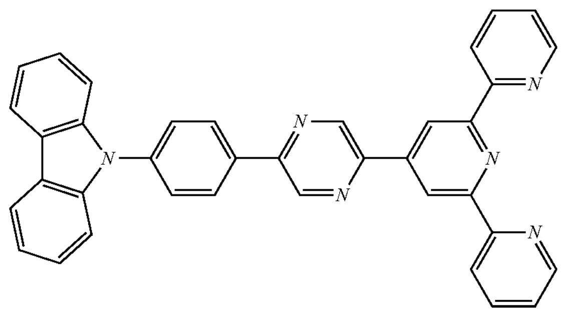
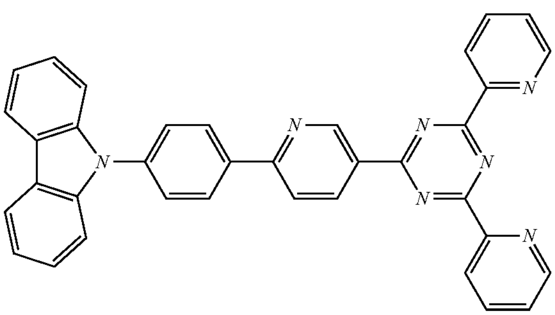
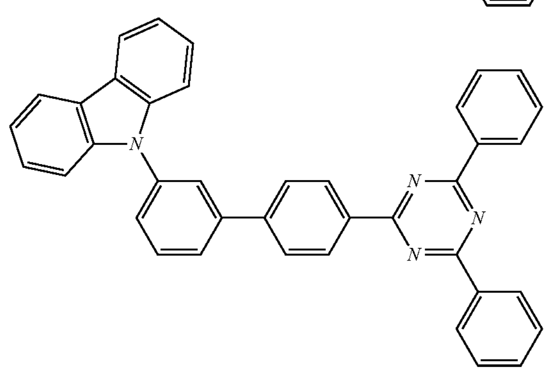
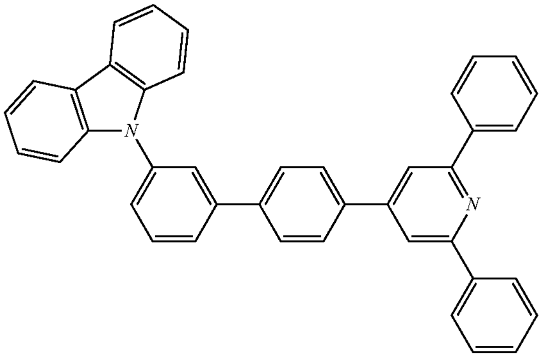
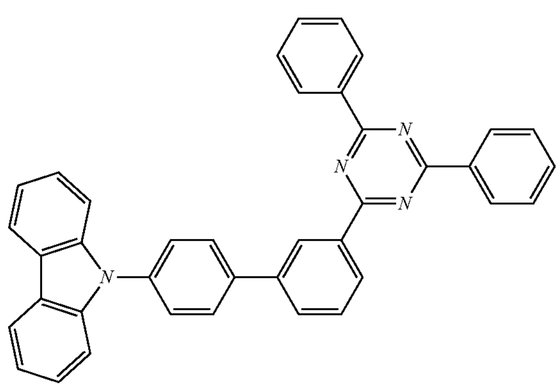

-continued
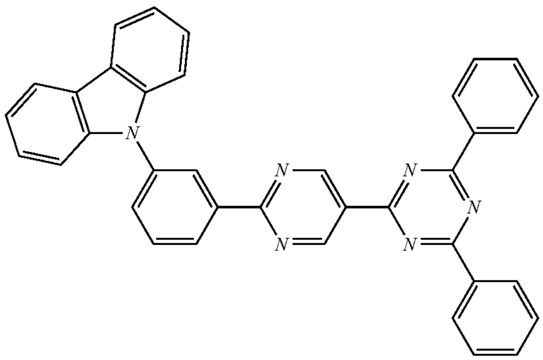
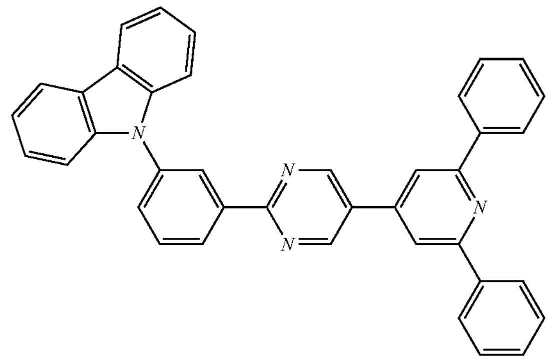
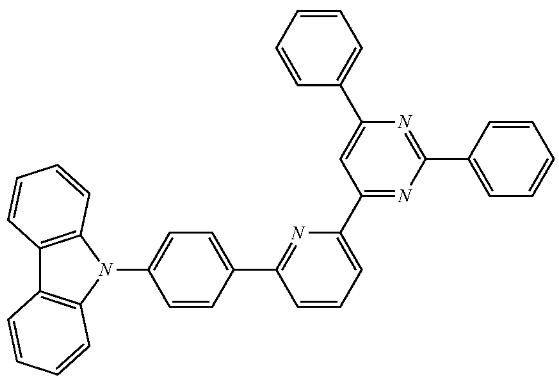
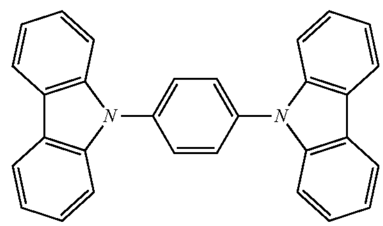
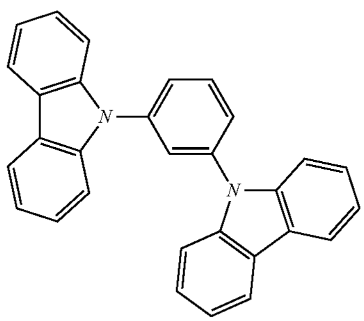
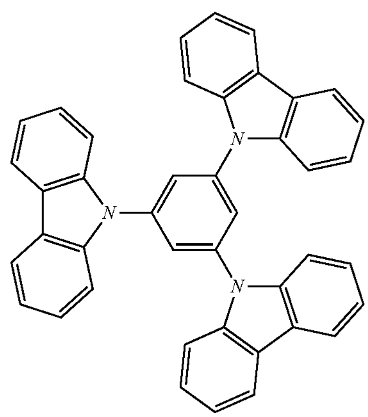
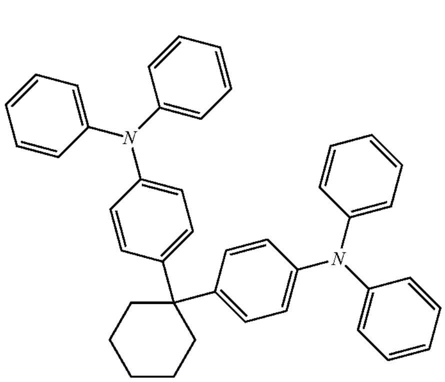
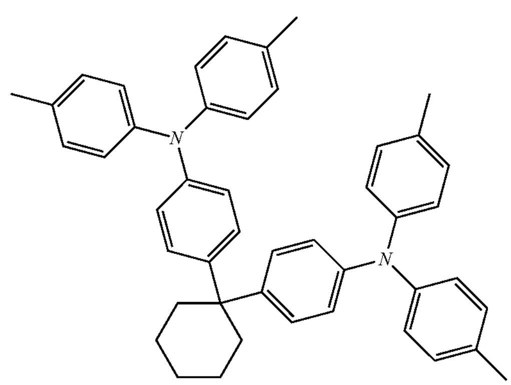

-continued
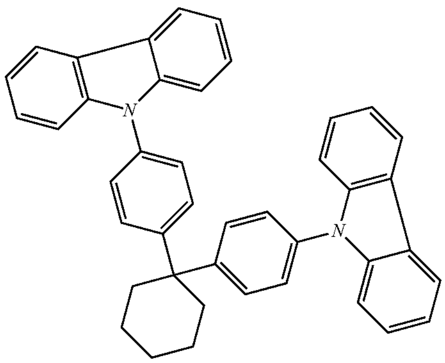
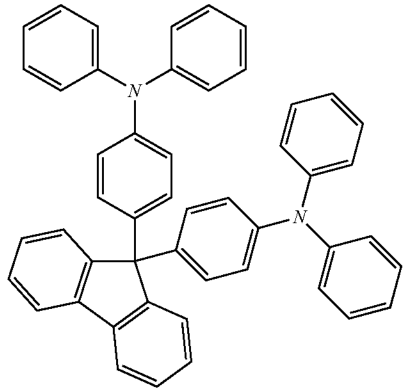
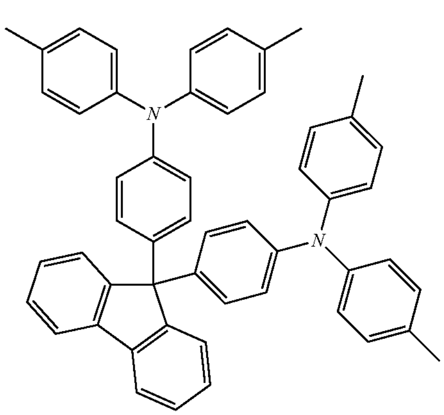
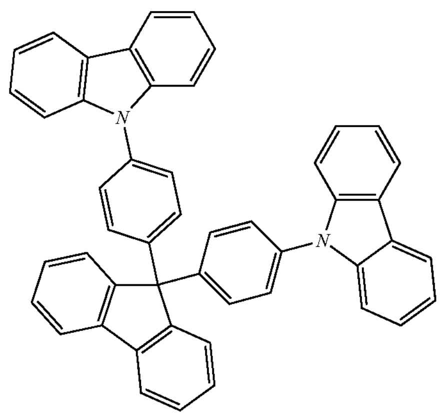
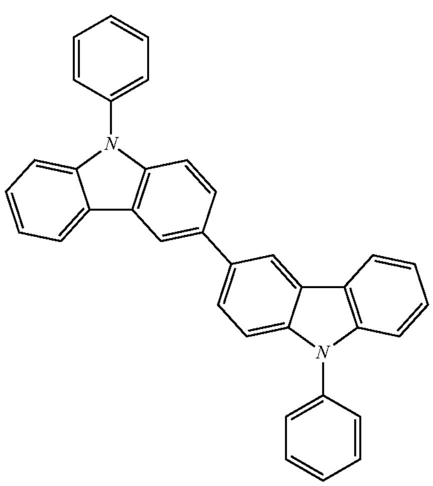
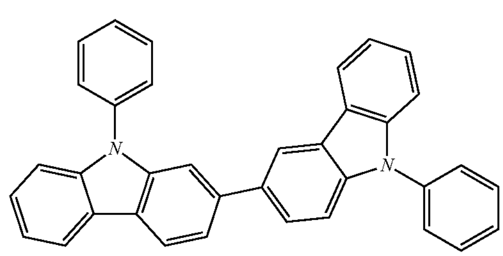

-continued
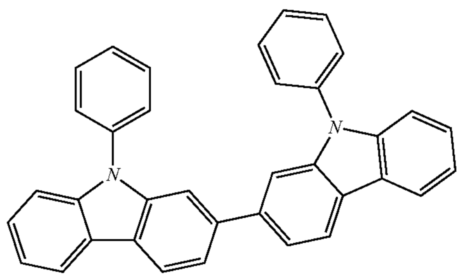
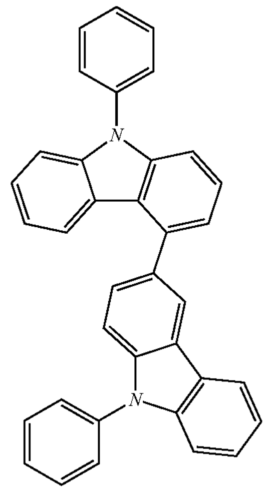
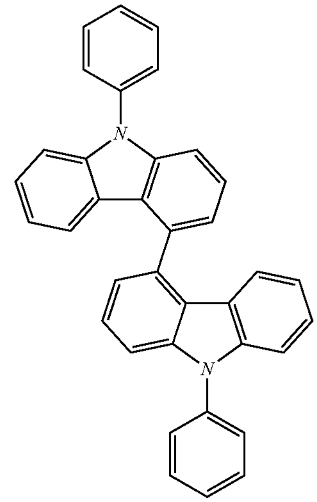
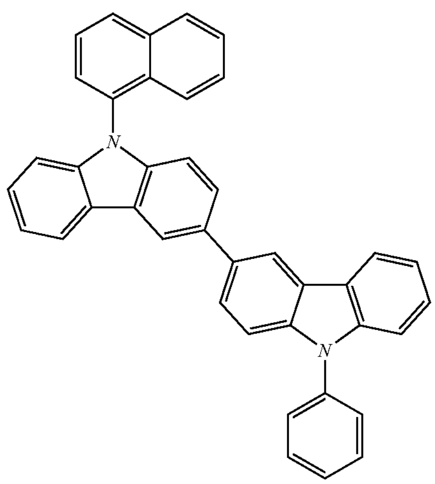
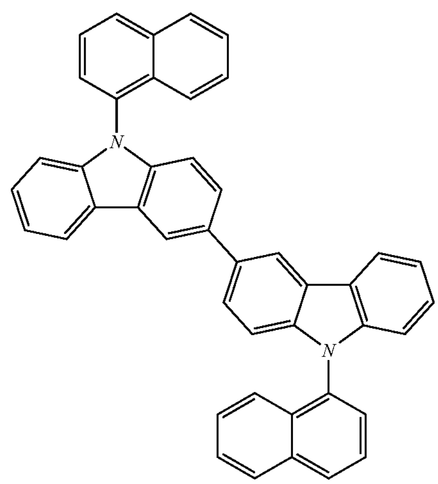
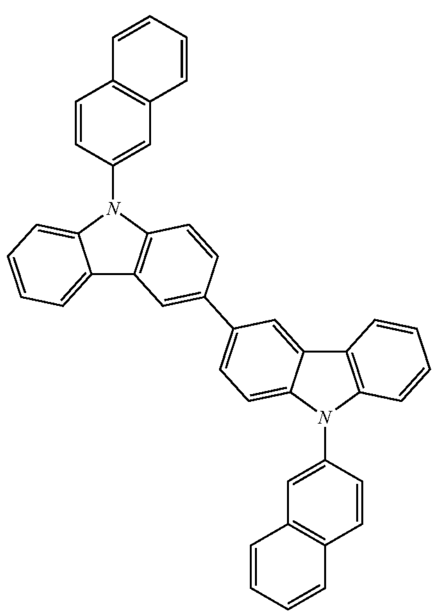
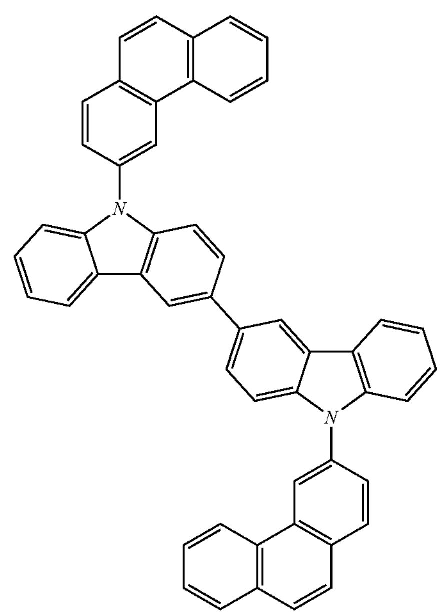

-continued
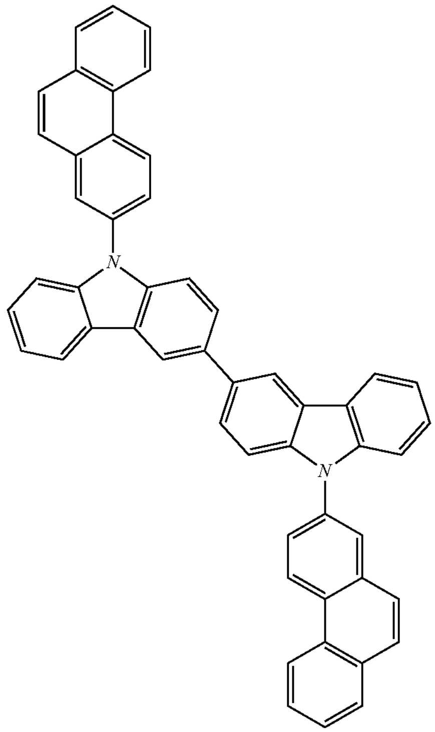
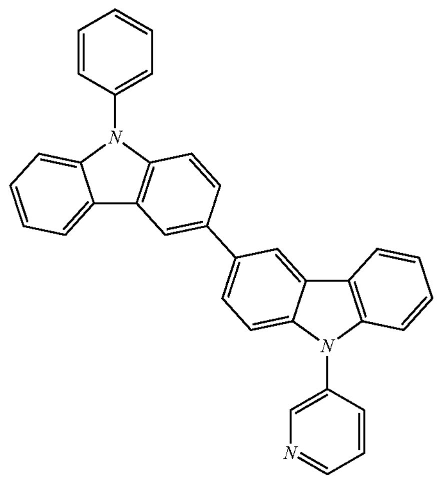
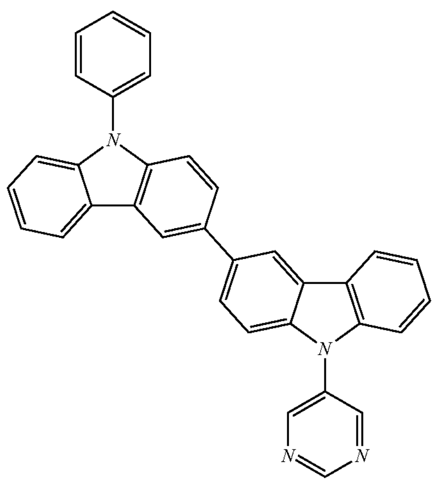
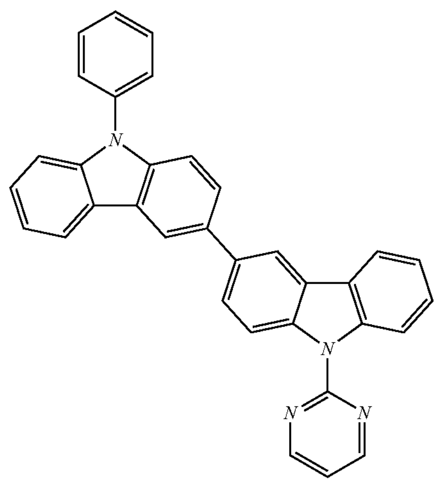
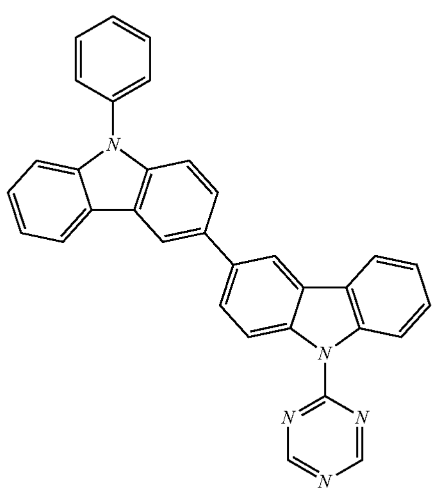
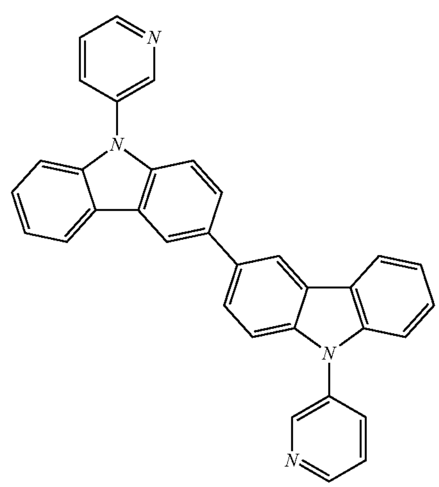

-continued
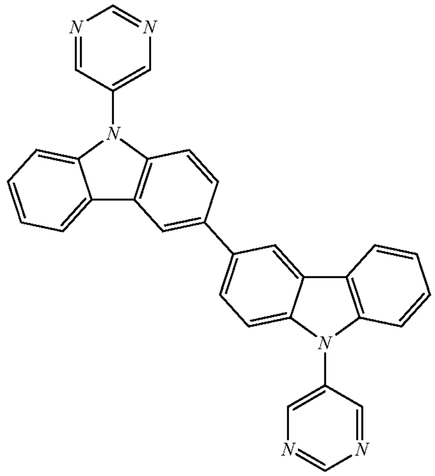
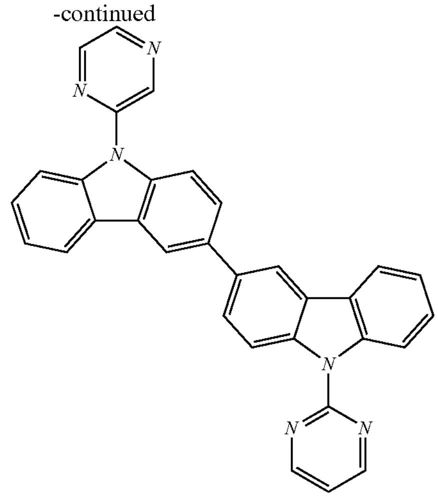
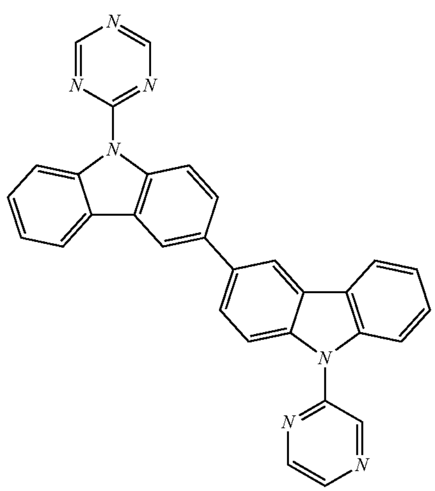
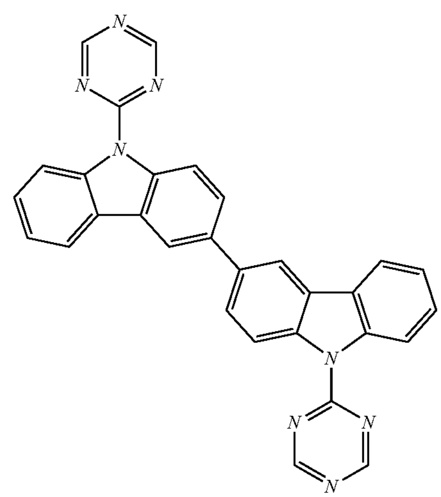
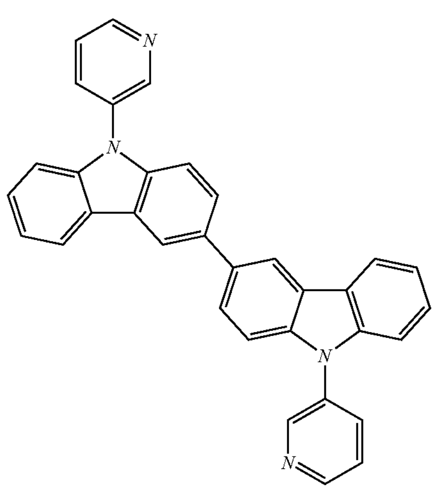
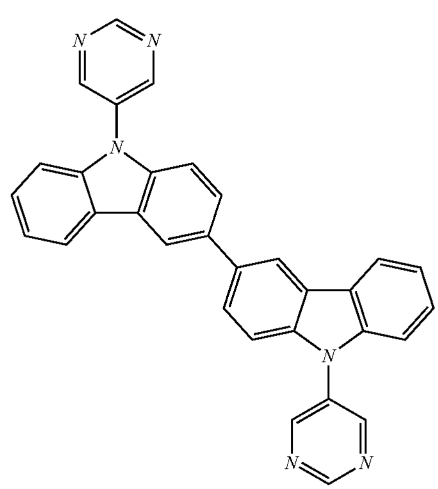

-continued
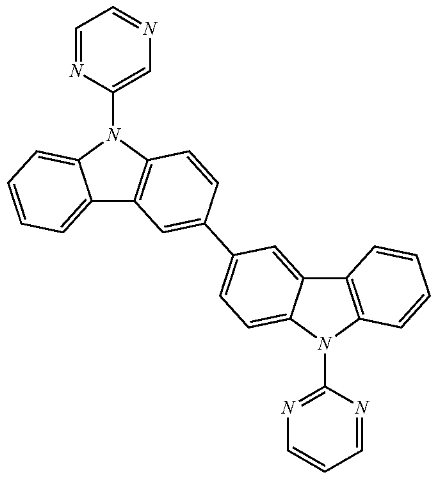
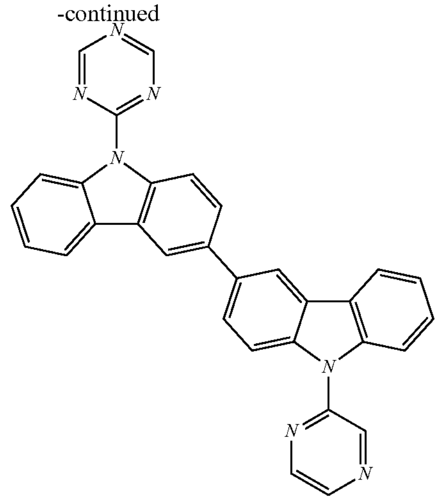
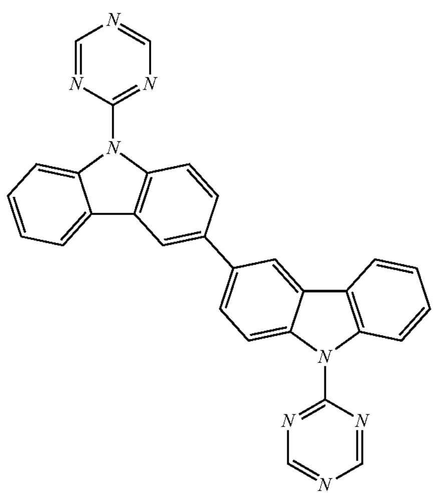
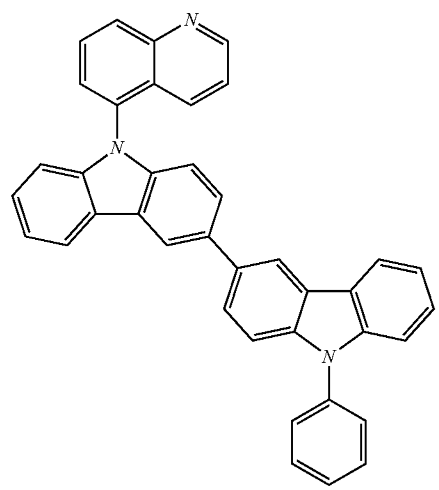
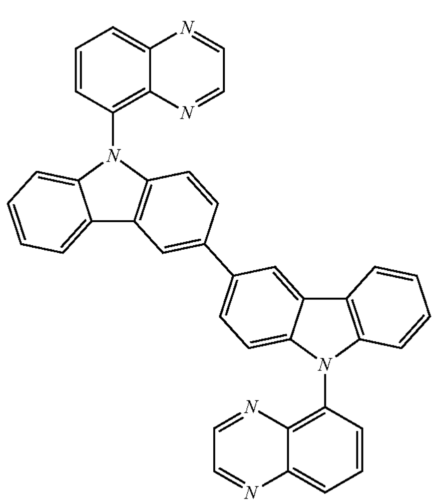
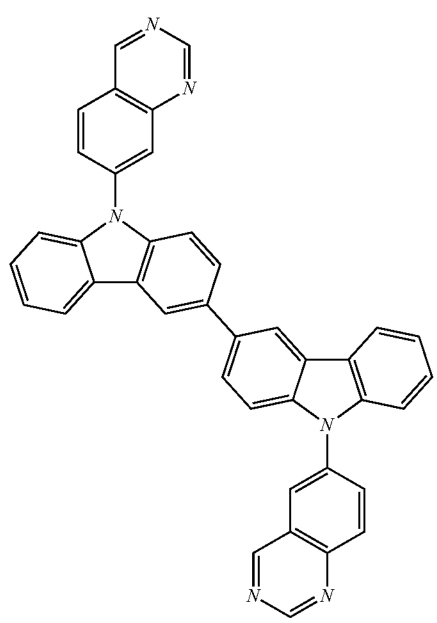

-continued
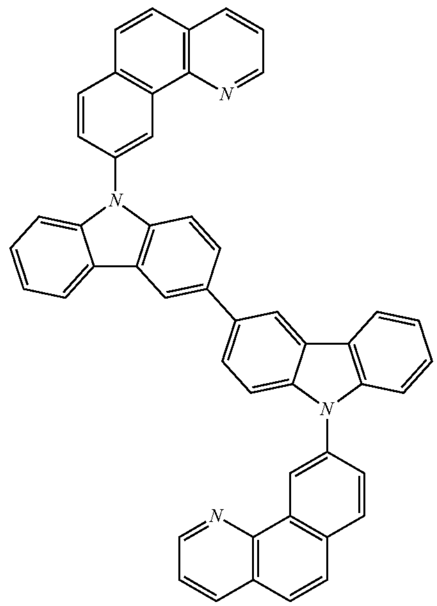
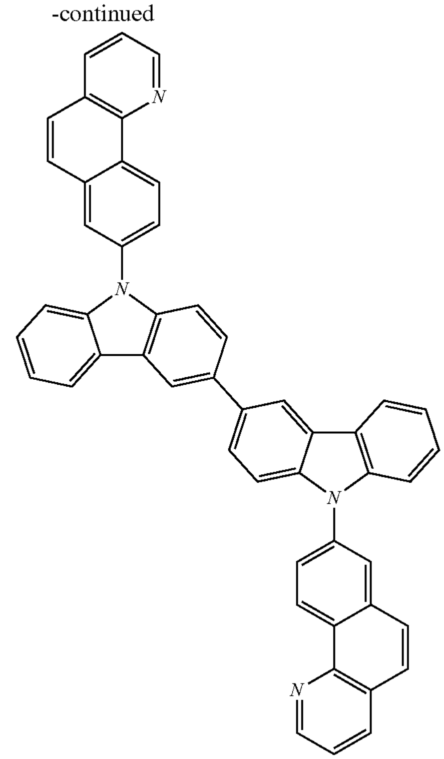
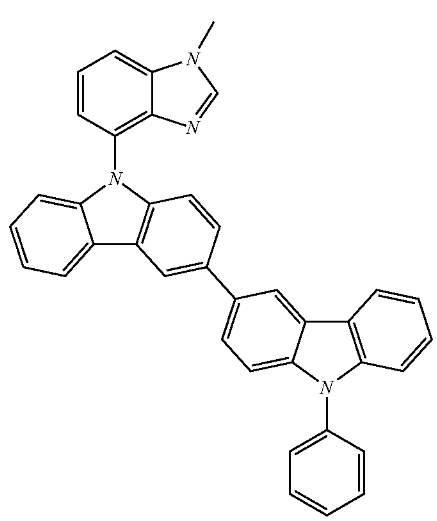
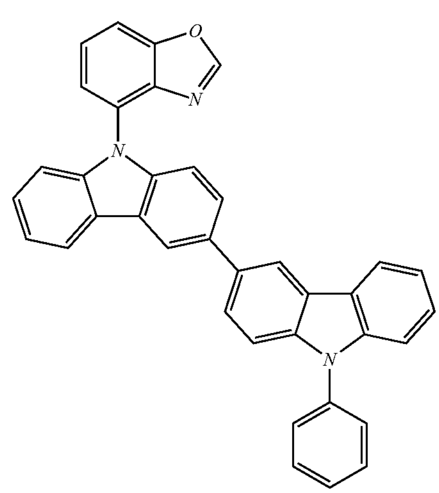

-continued
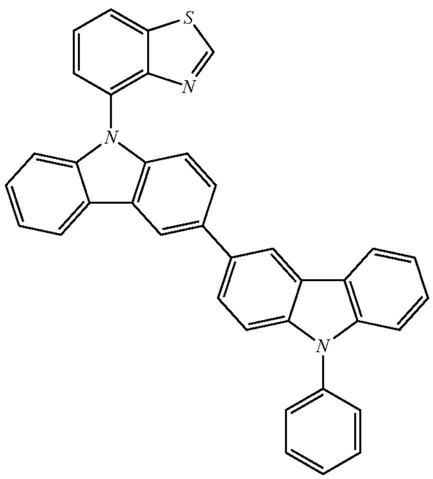
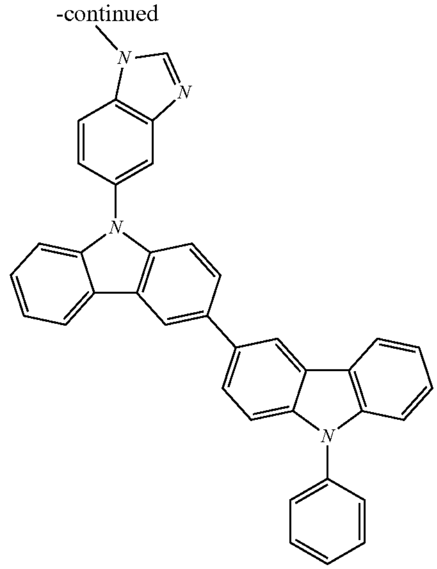
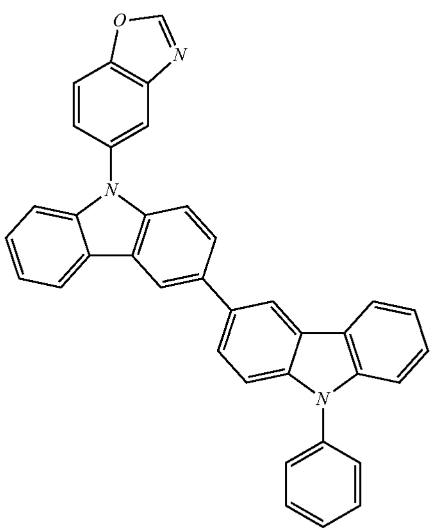
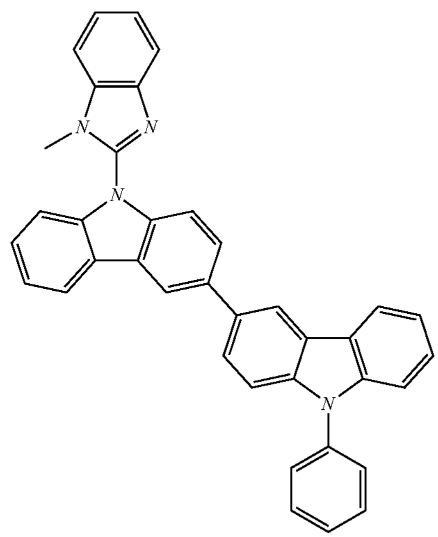
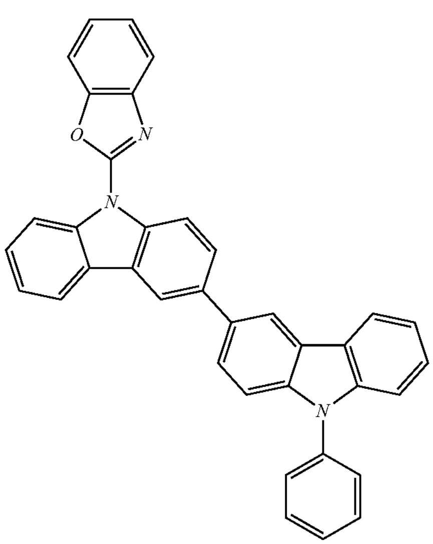
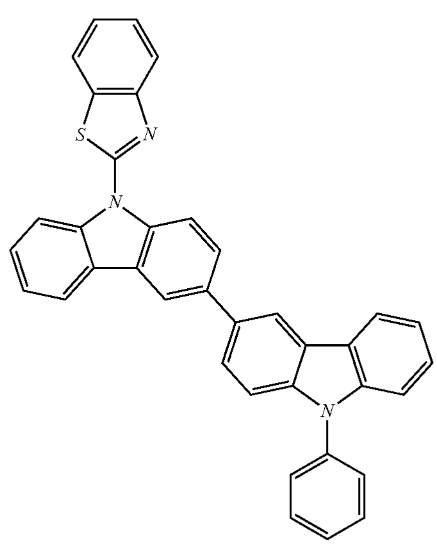

-continued
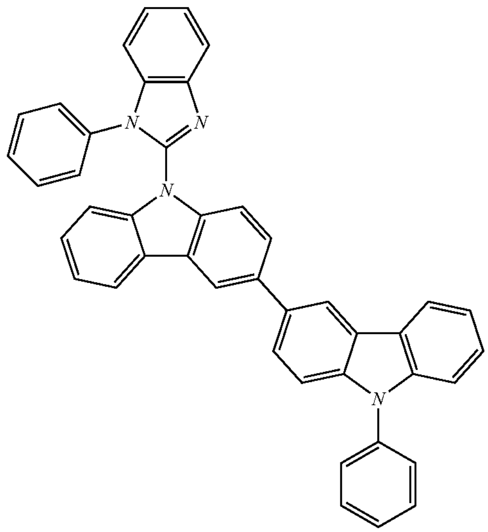
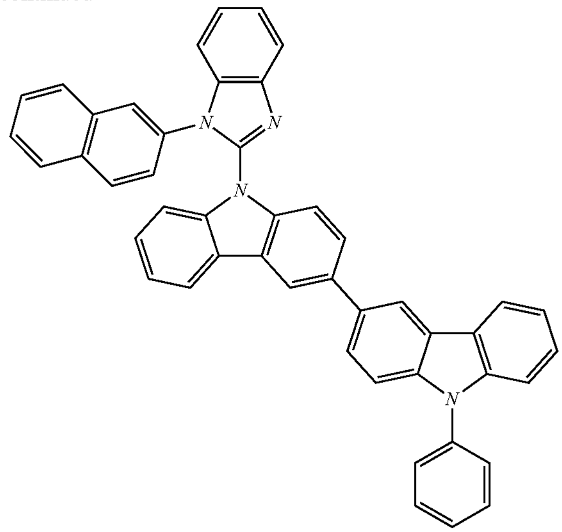
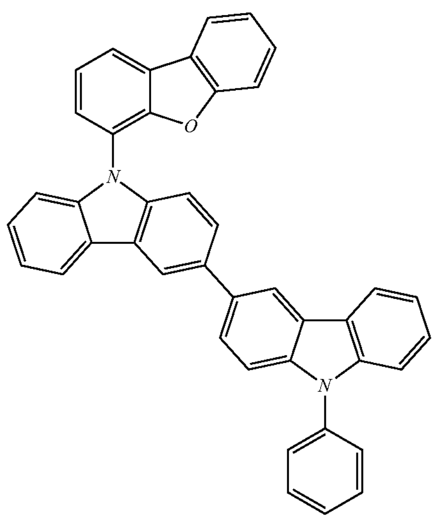
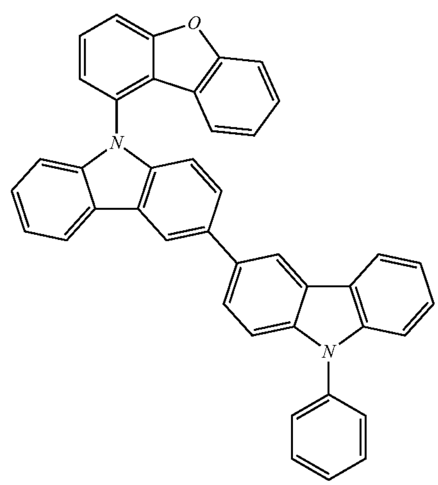
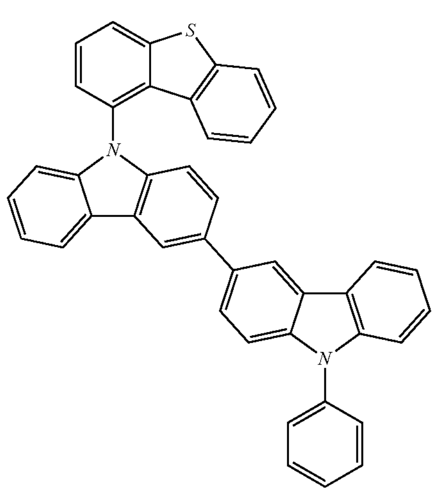
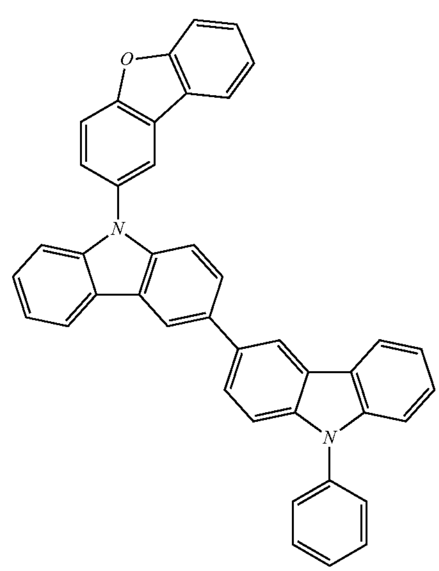

-continued
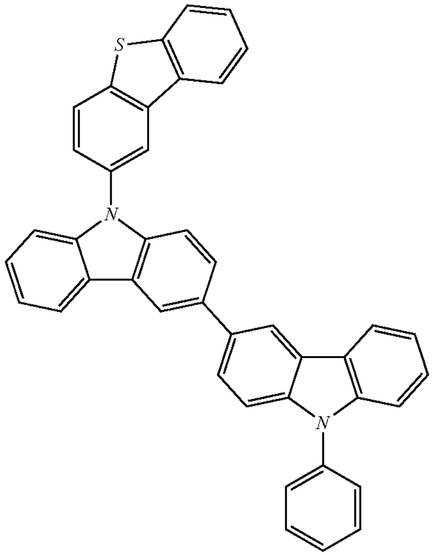
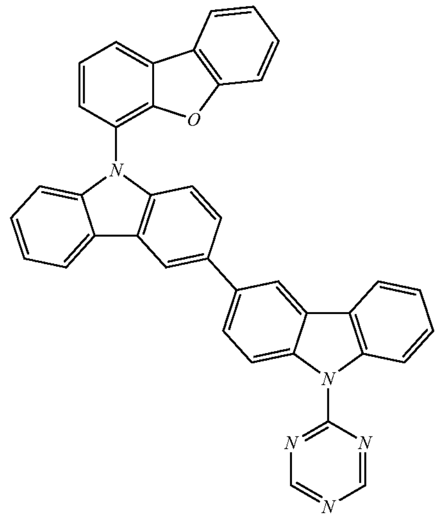
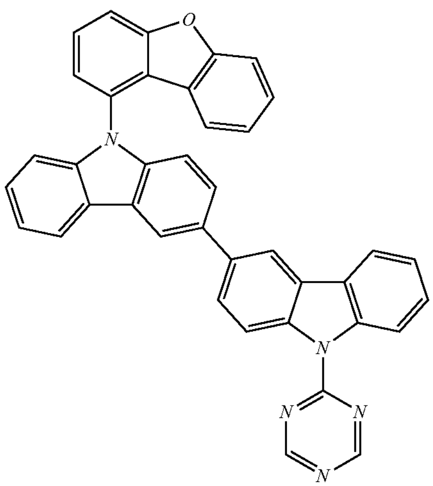
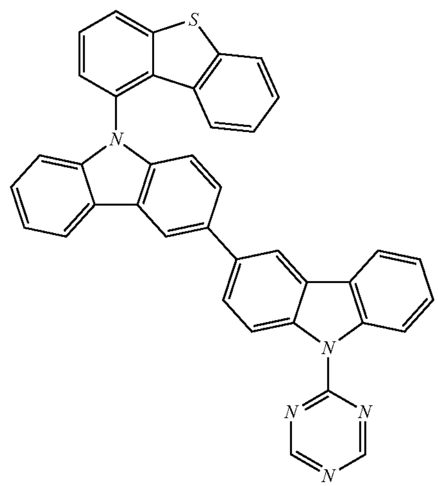
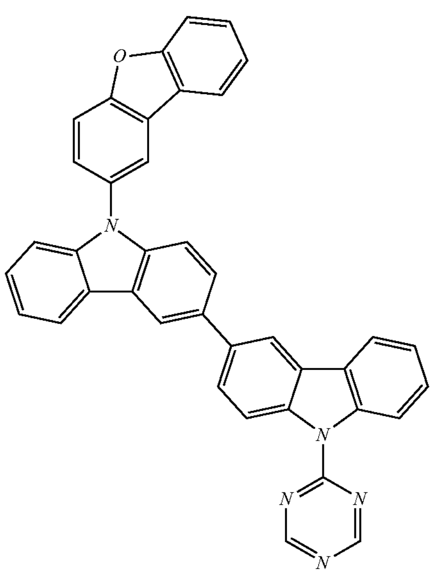
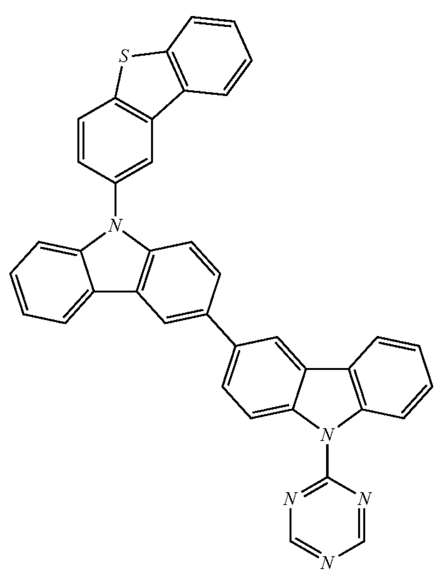

-continued
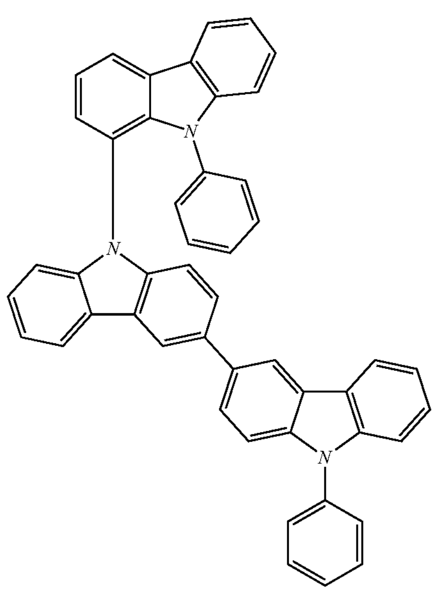
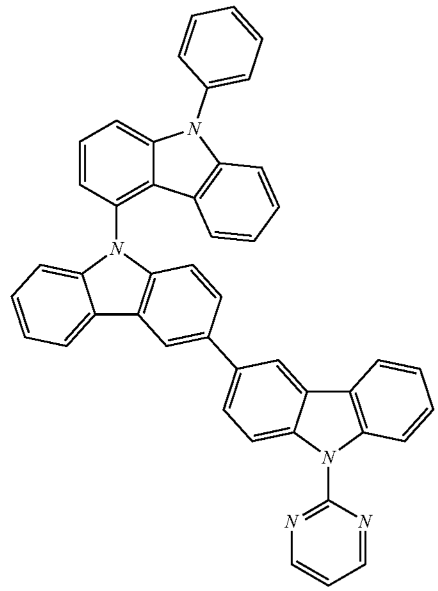
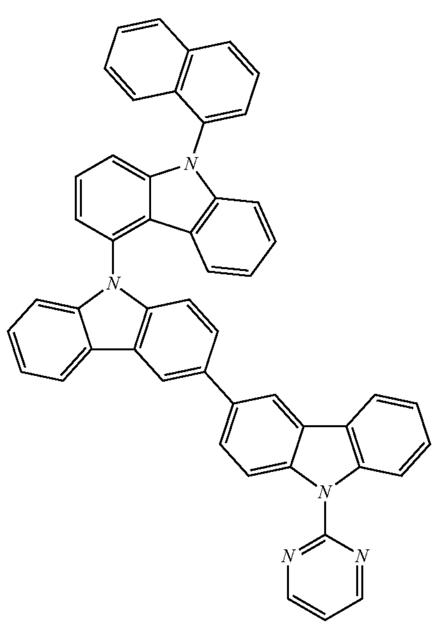
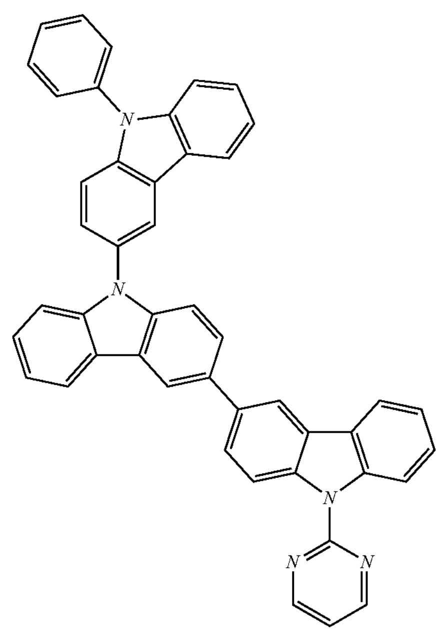

-continued
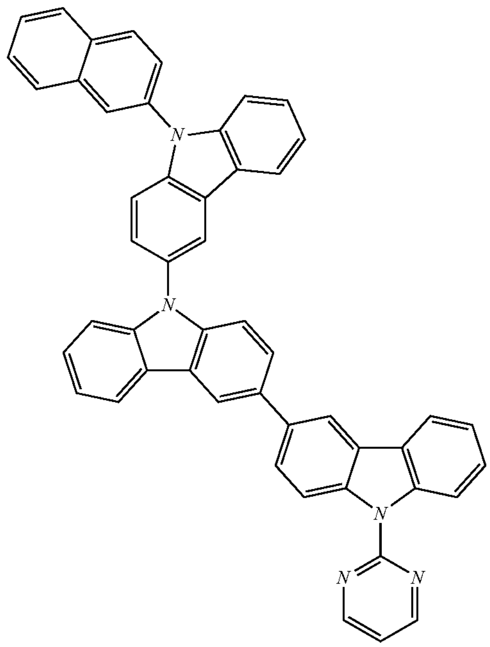
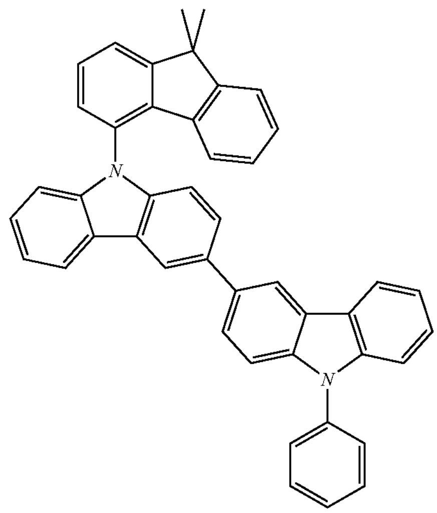
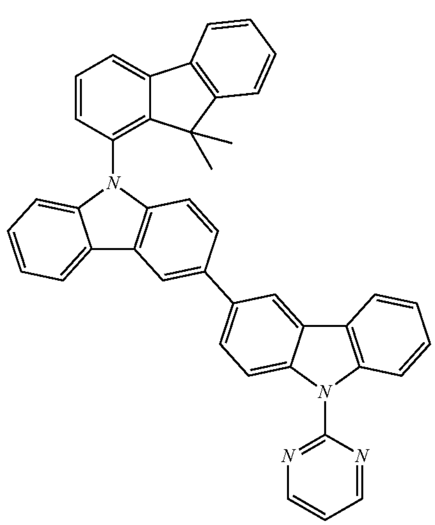
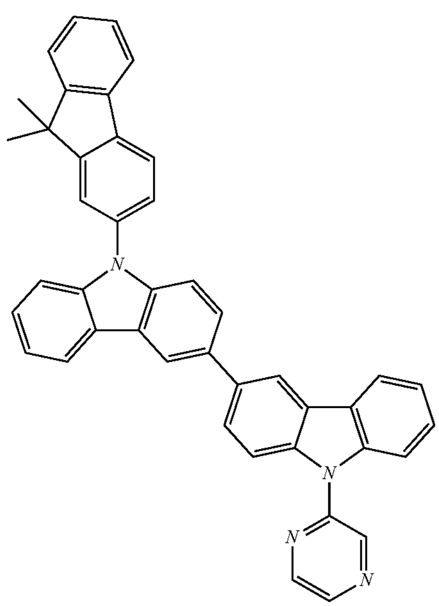

-continued
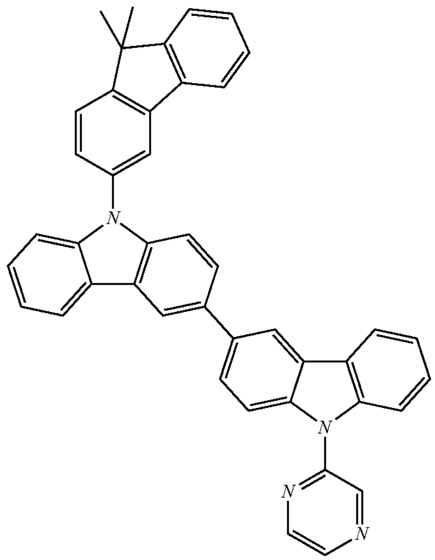
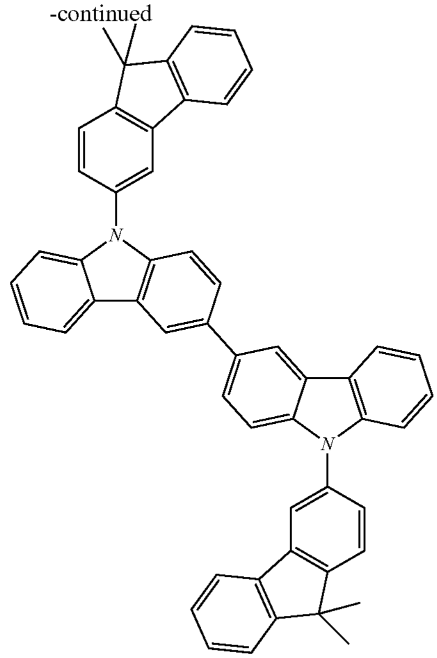
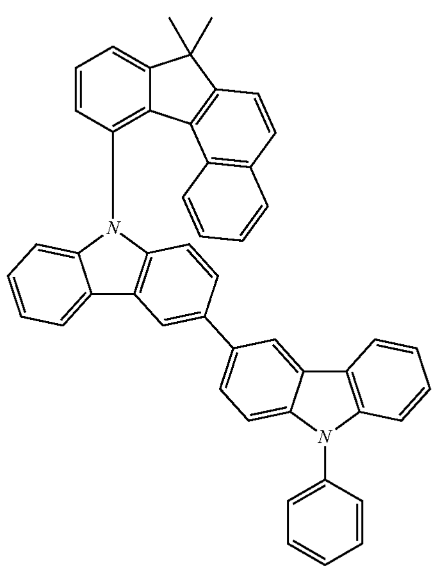
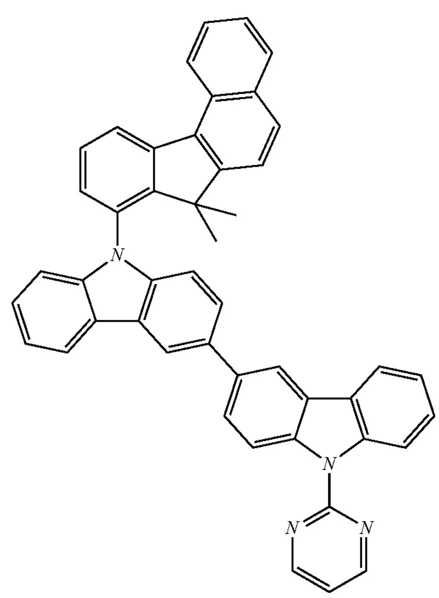

-continued
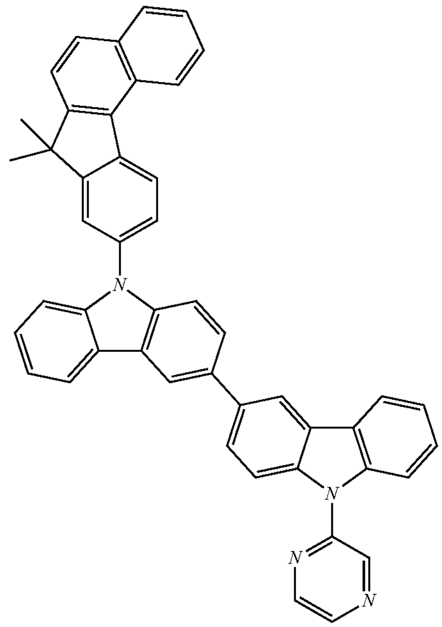
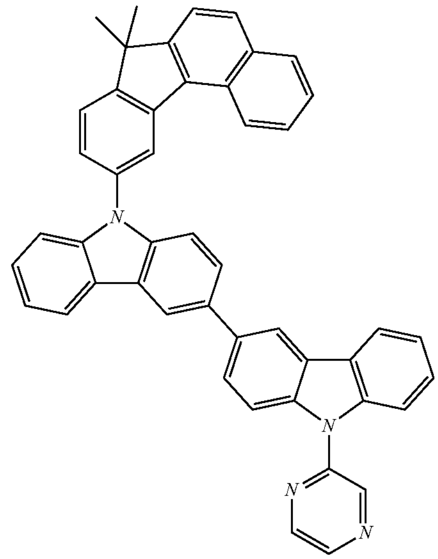
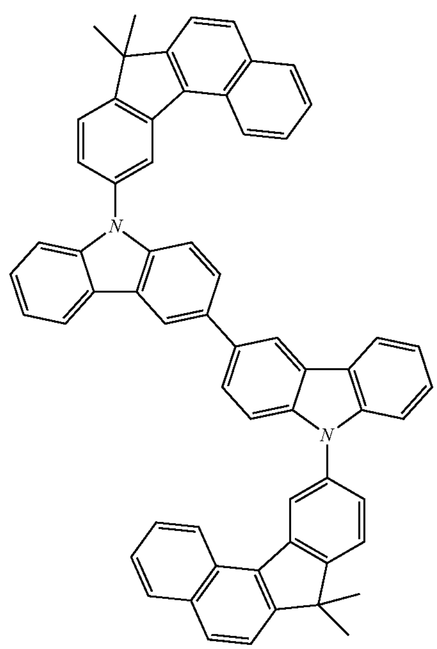
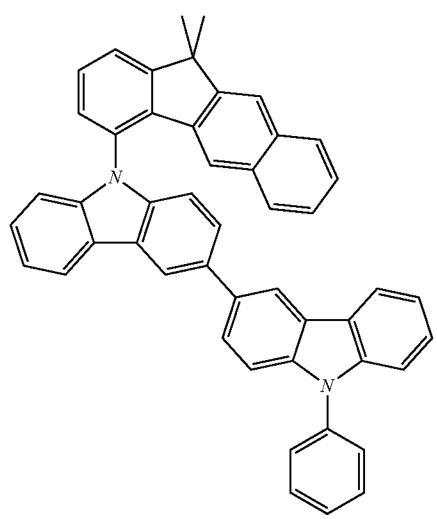

-continued
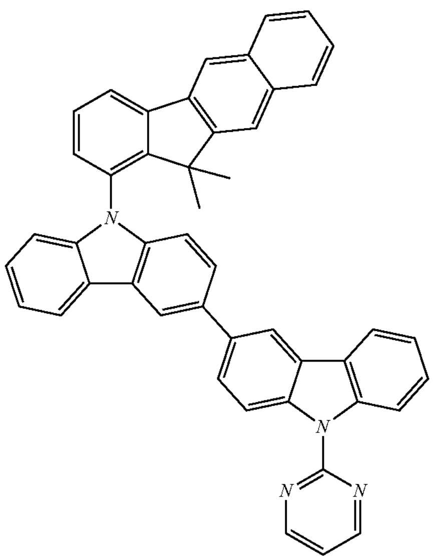
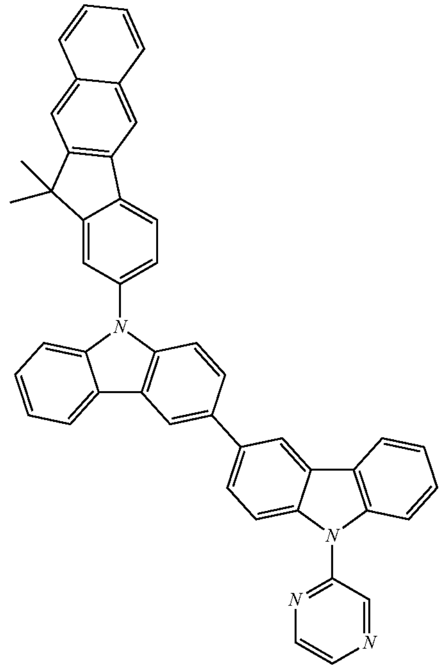
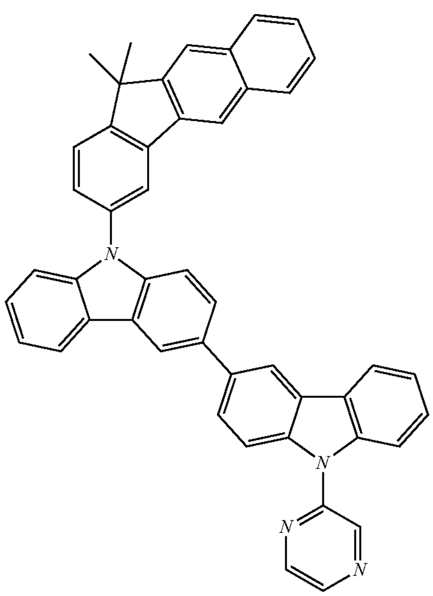
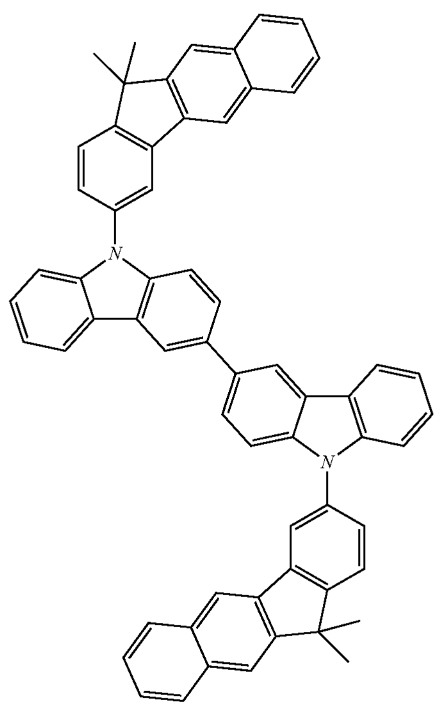

-continued
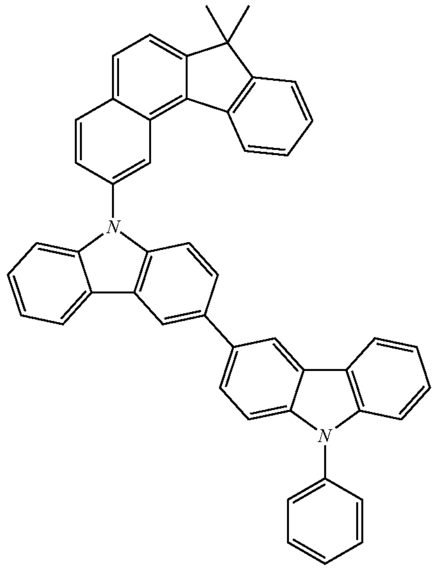
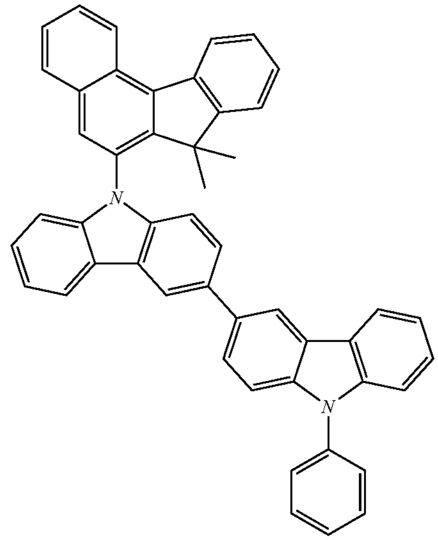
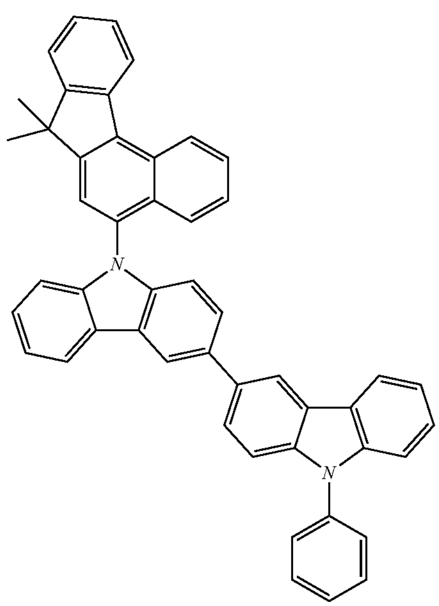
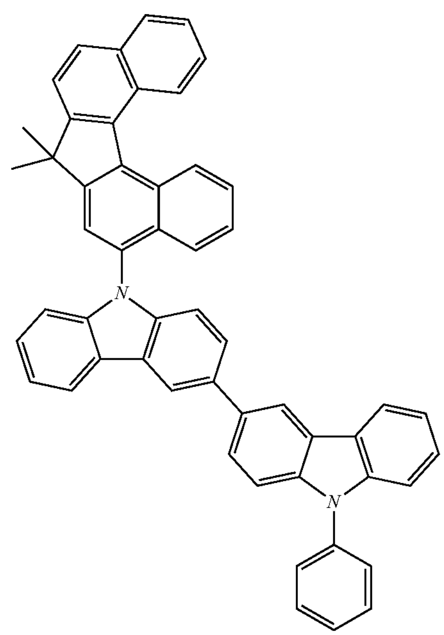

-continued
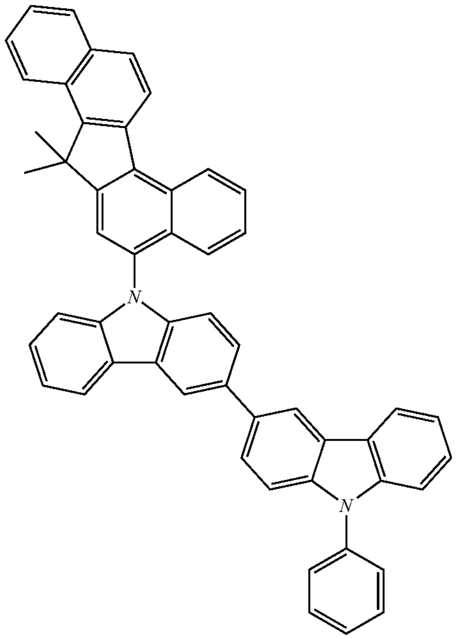
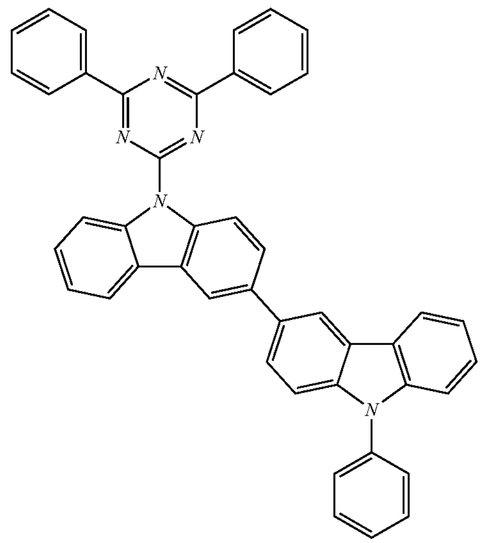
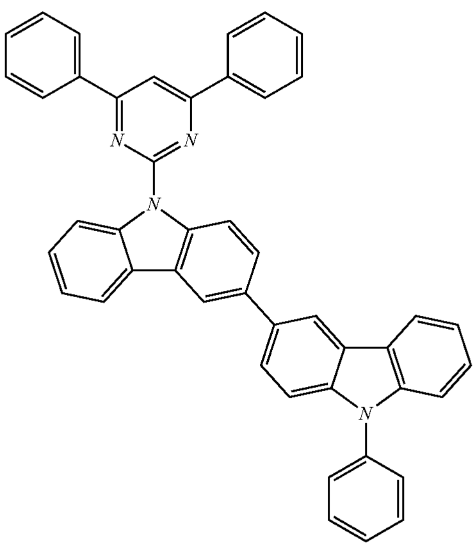
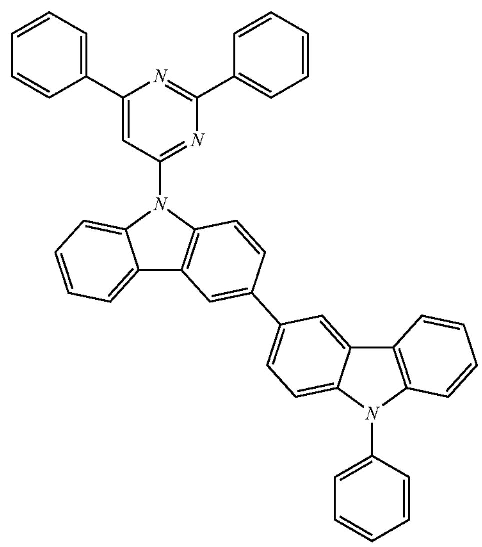
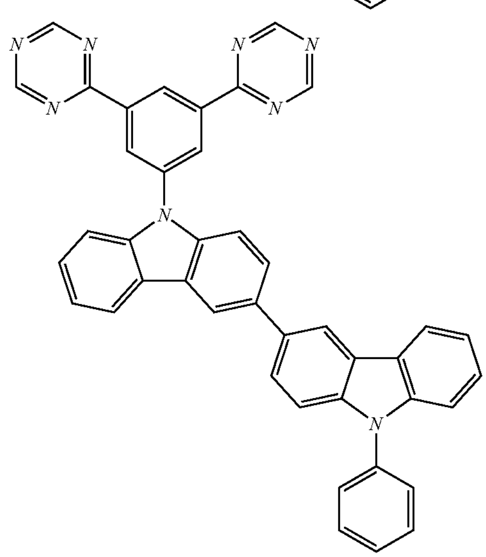
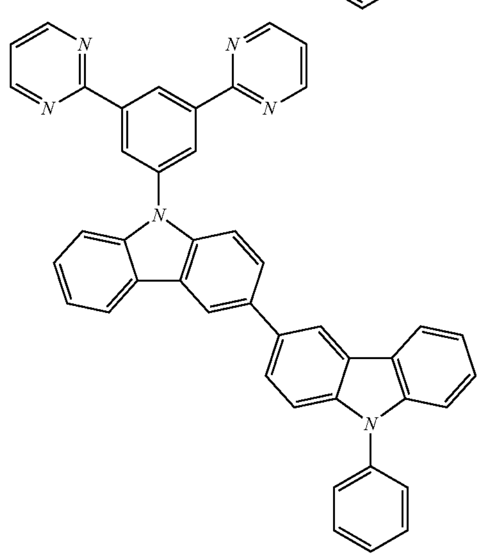

-continued
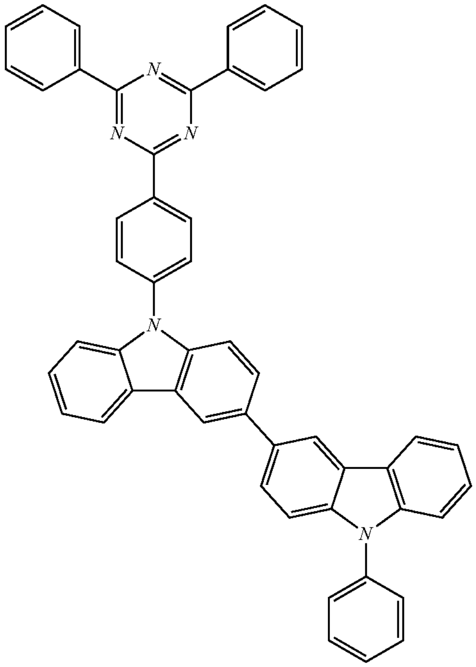
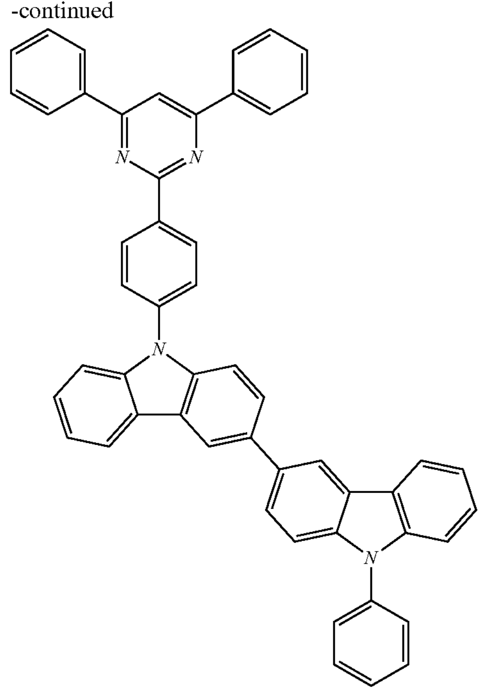
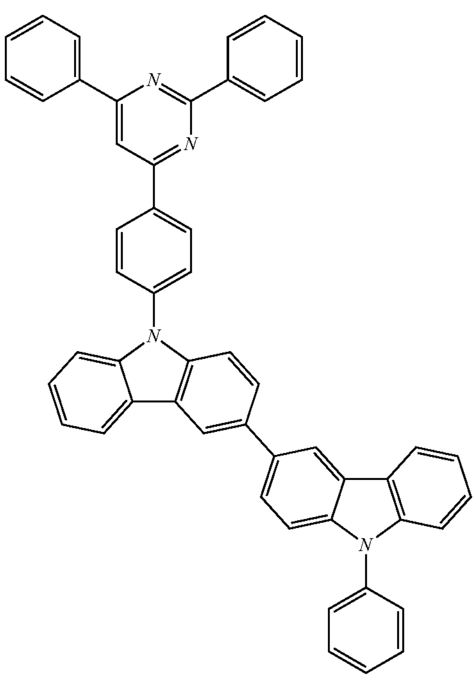
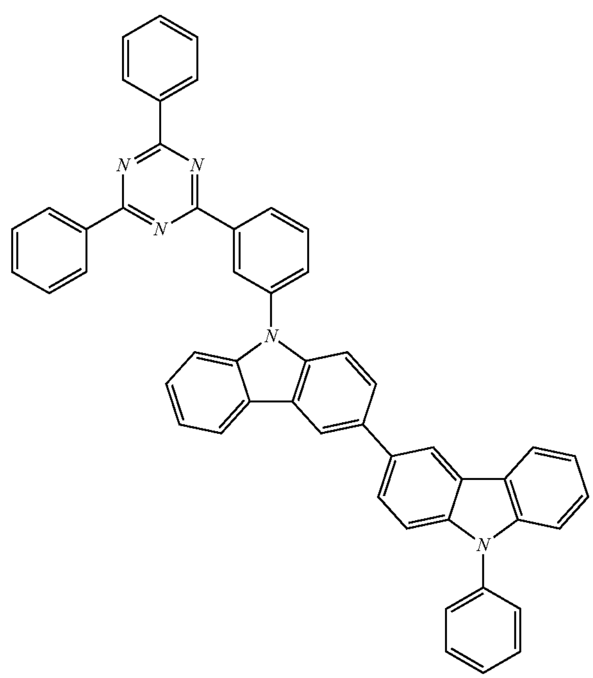

-continued
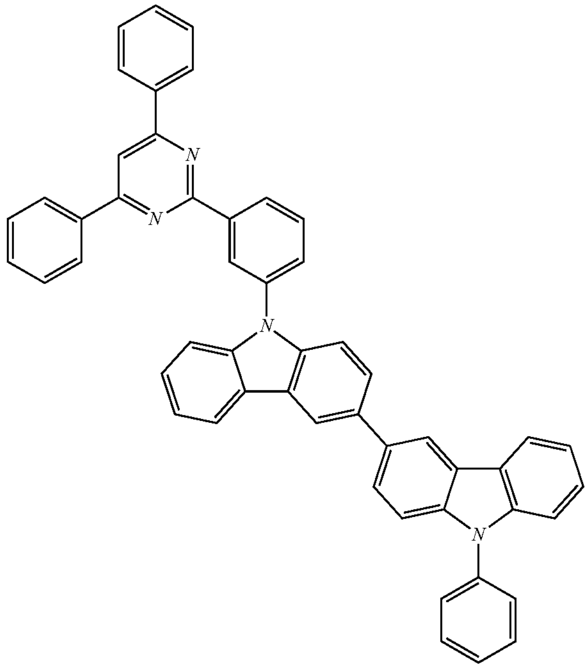
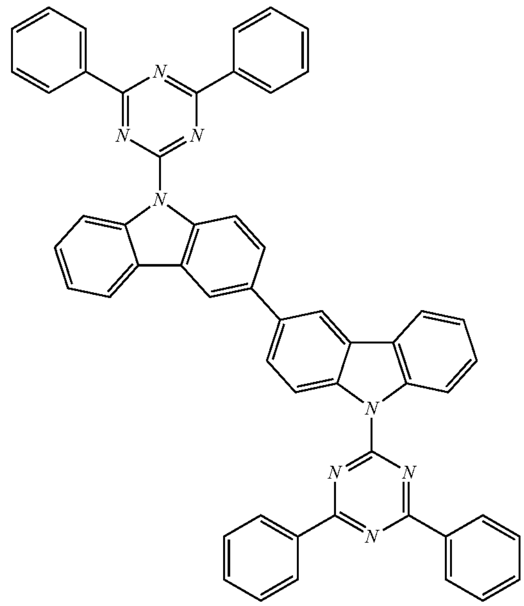
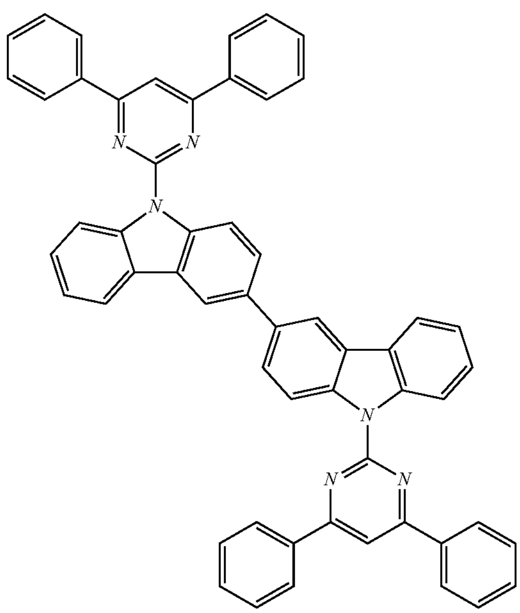
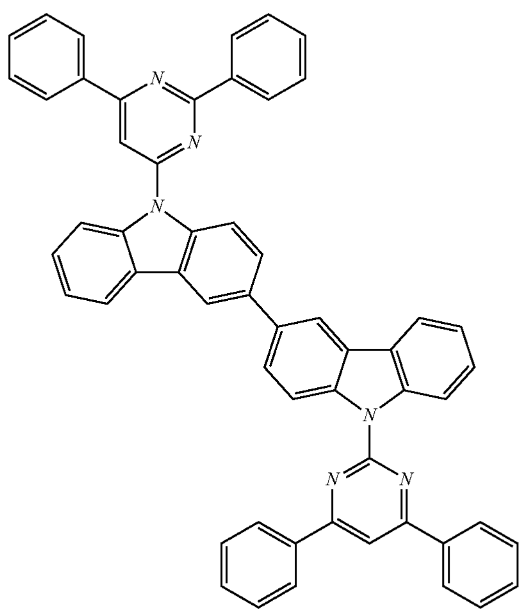

-continued
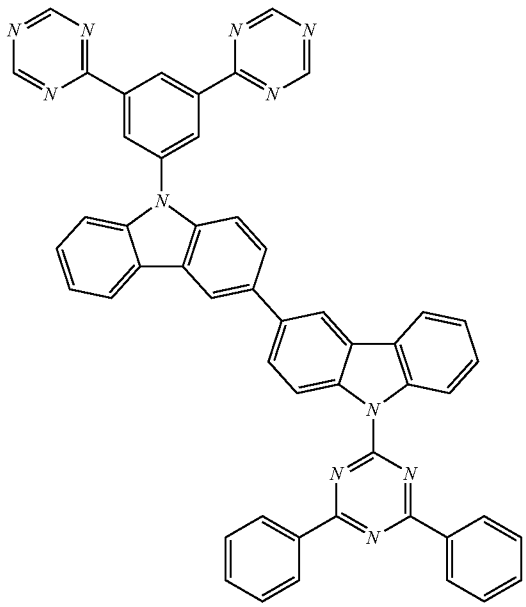
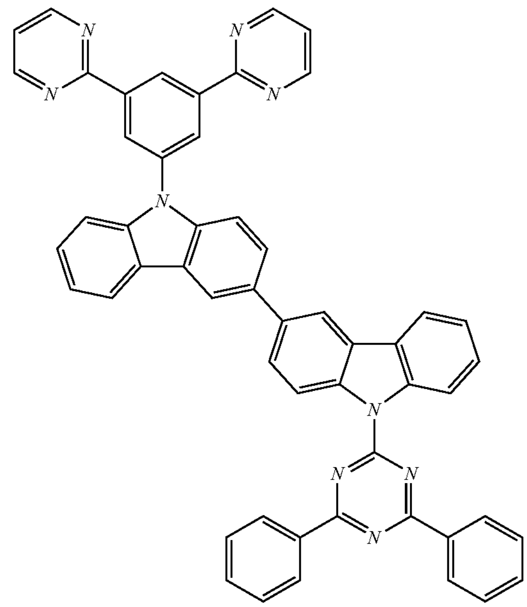
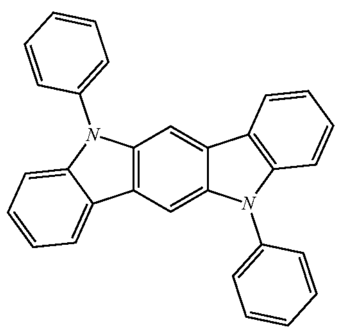
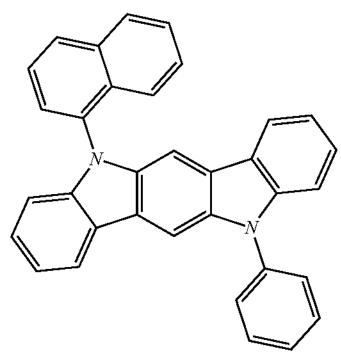
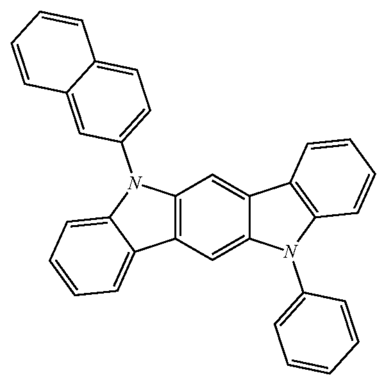
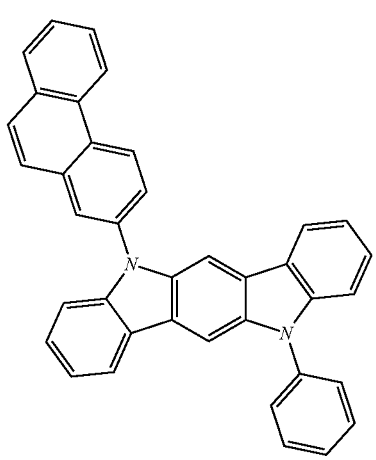
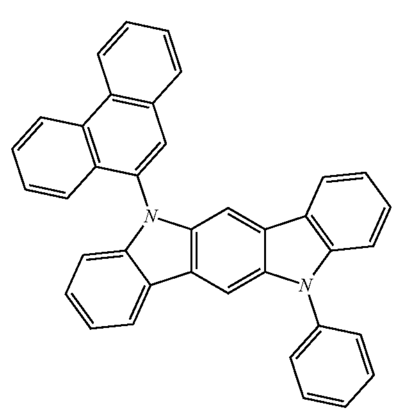

-continued
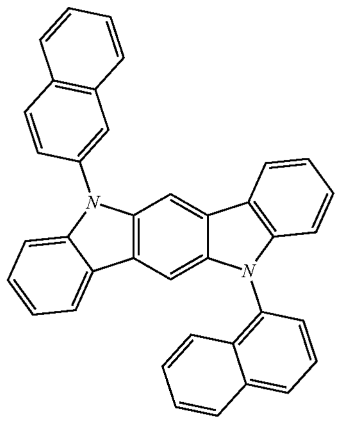
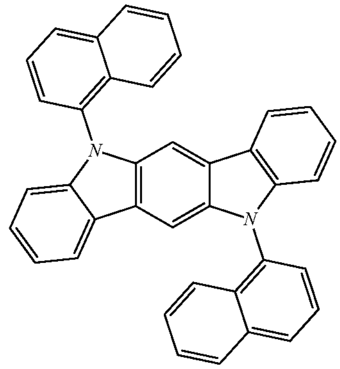
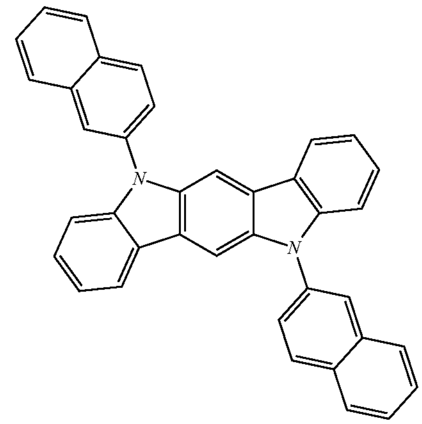
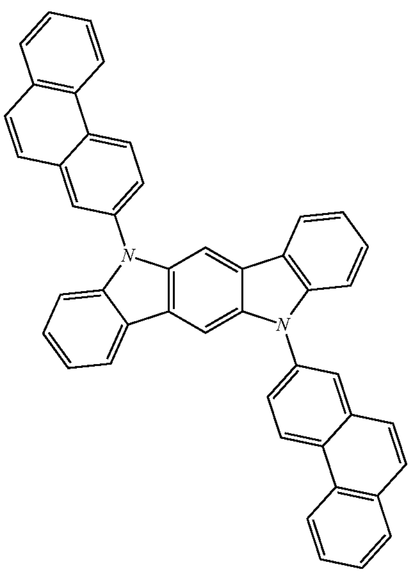
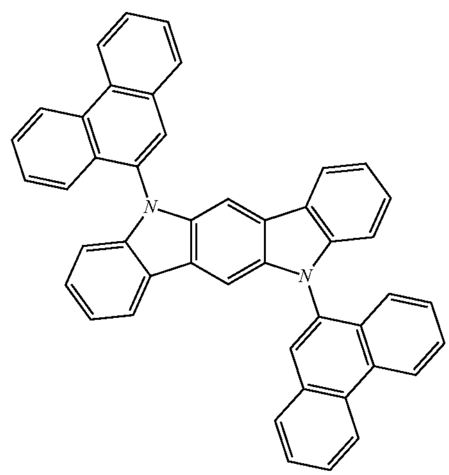
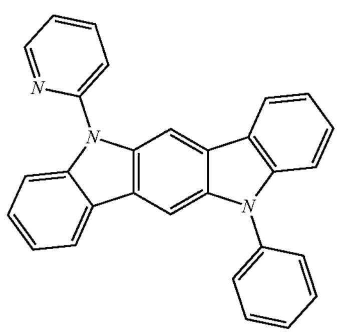
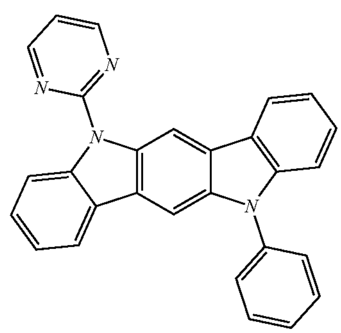
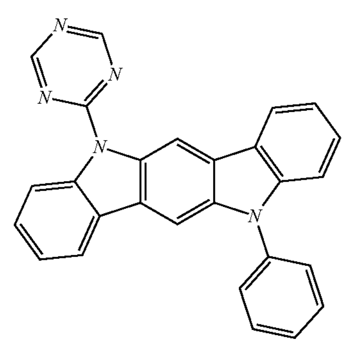
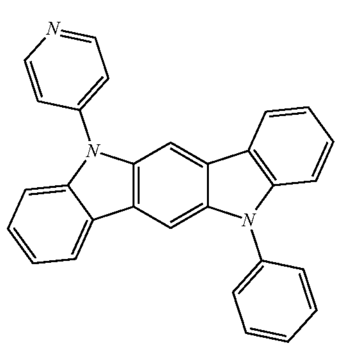
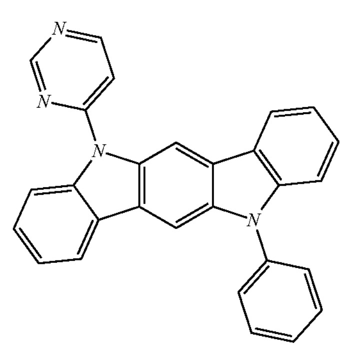
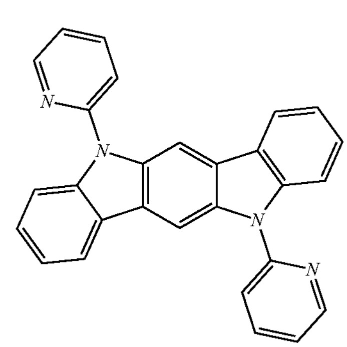

-continued
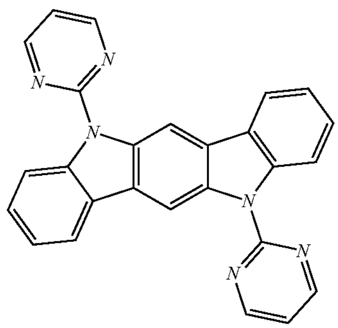
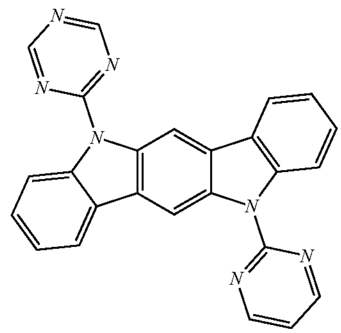
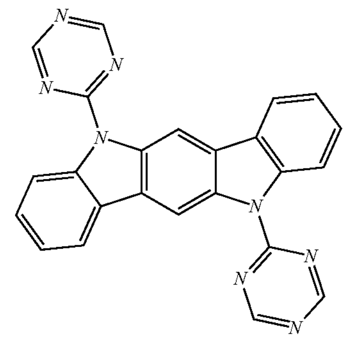
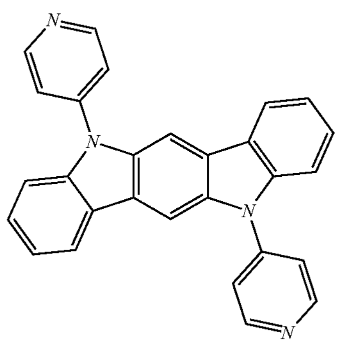
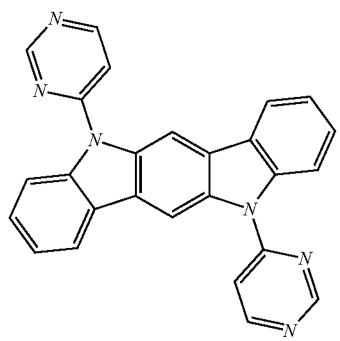
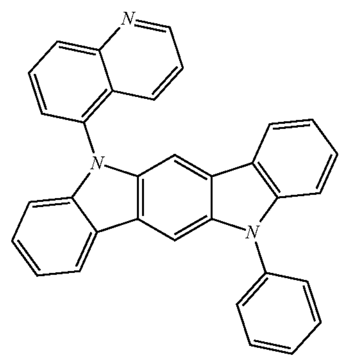
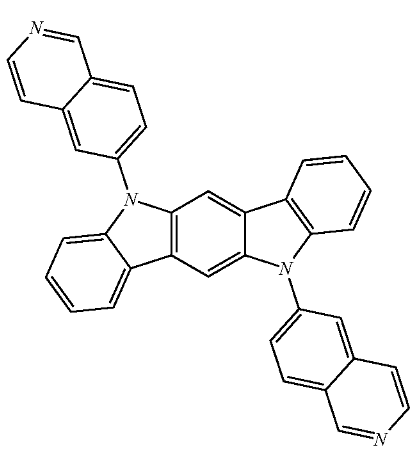
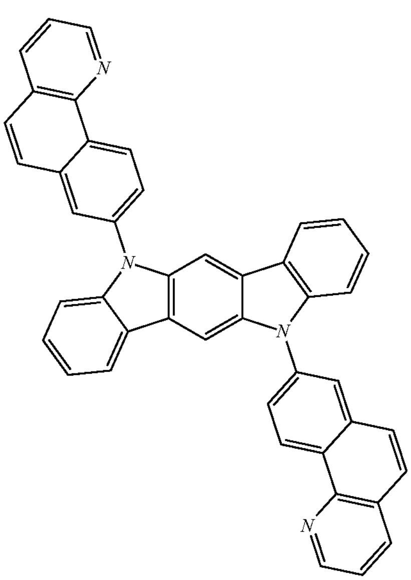

-continued
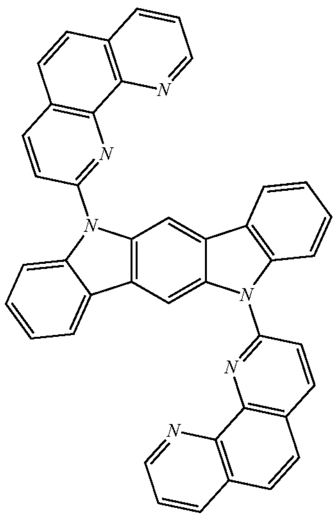
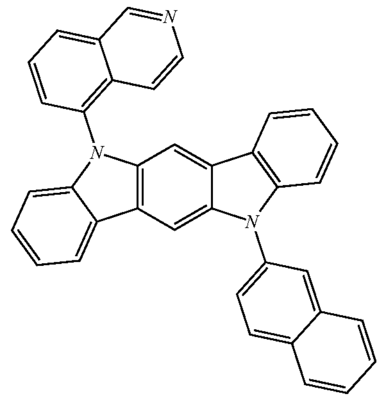
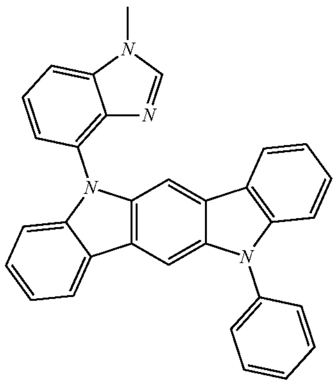
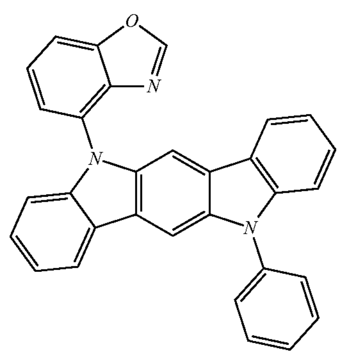
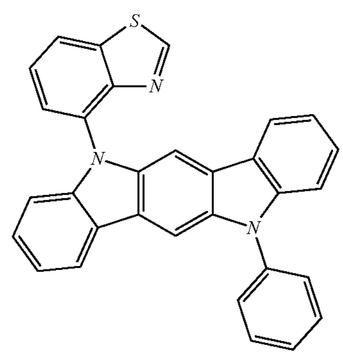
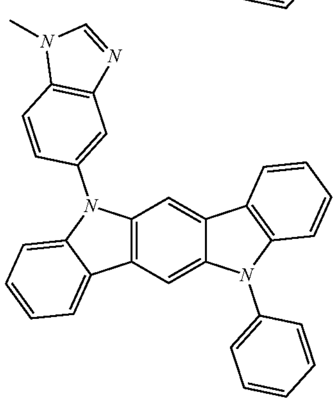
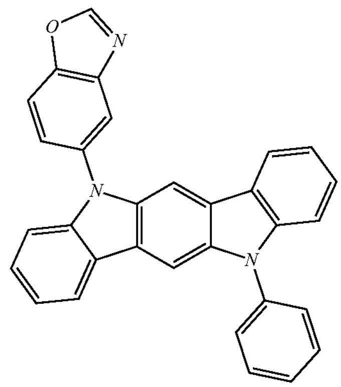
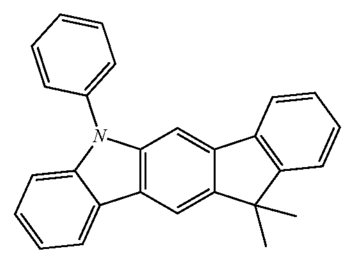
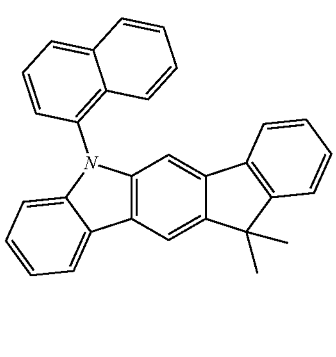
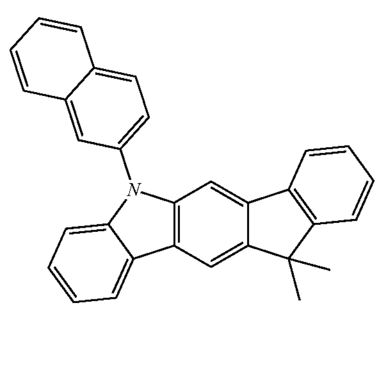
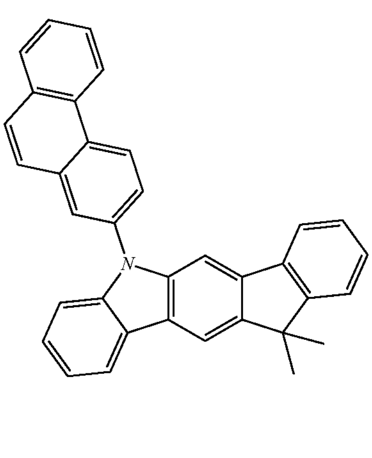

-continued
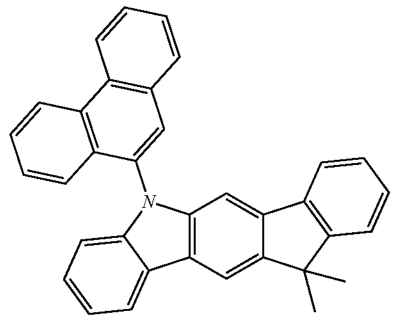
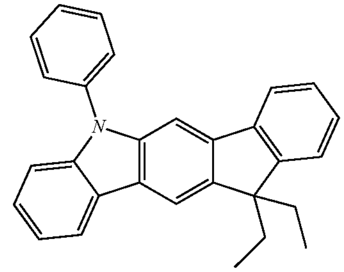
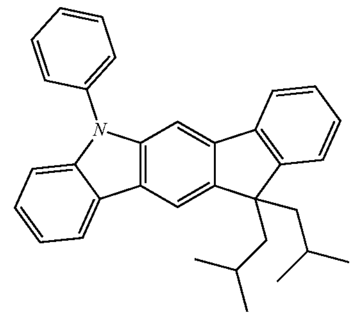
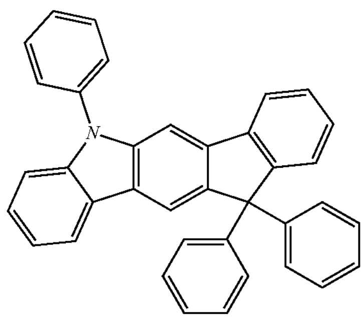
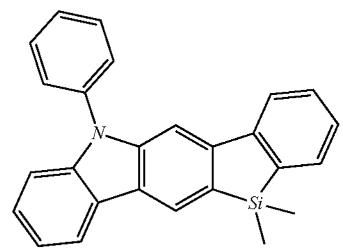
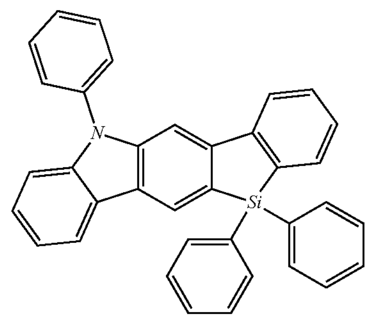
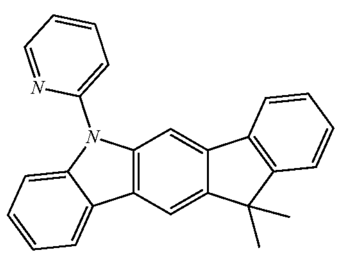
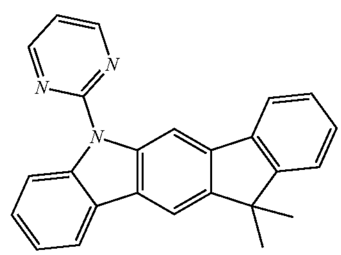
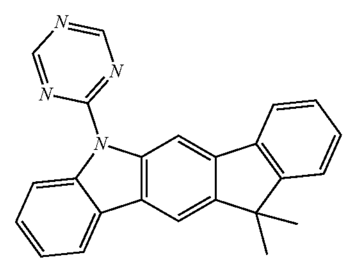
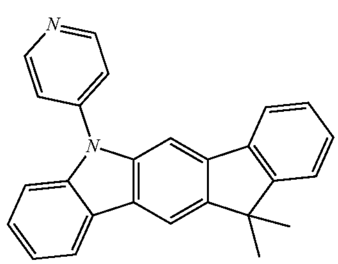
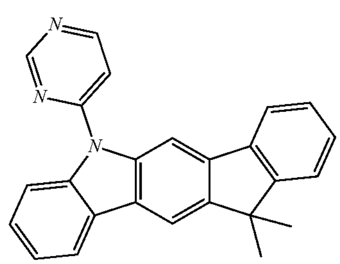
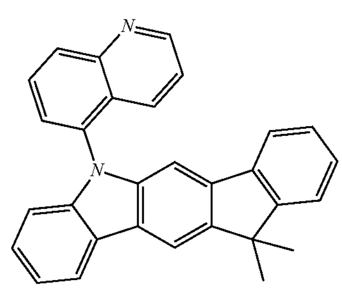
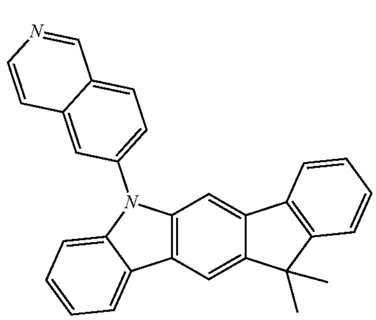
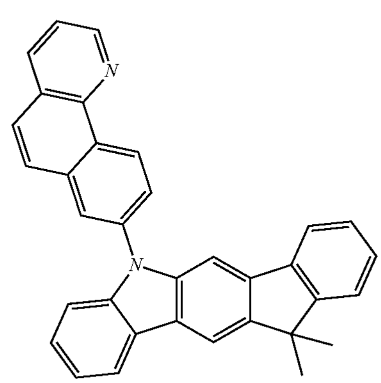
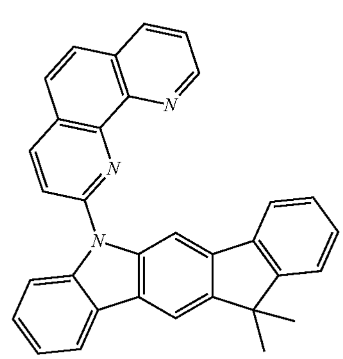

-continued
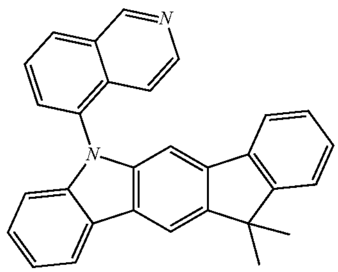
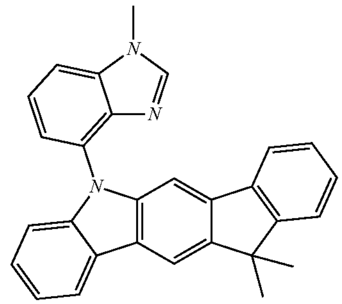
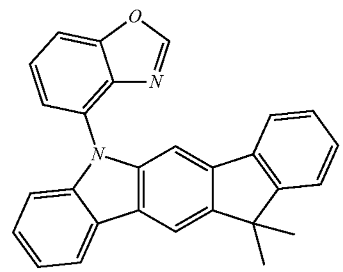
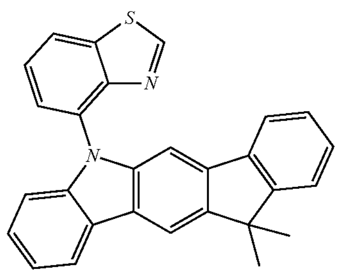
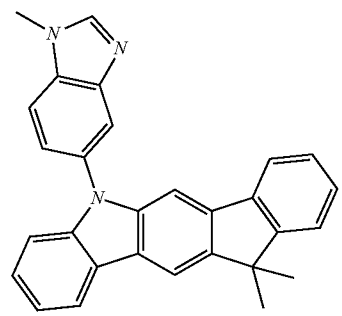
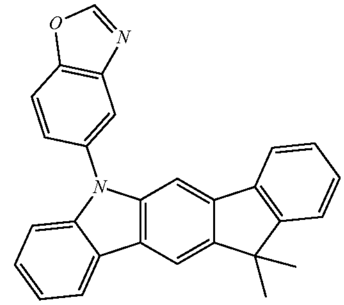
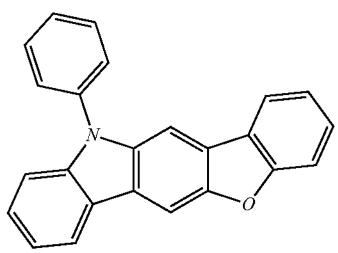
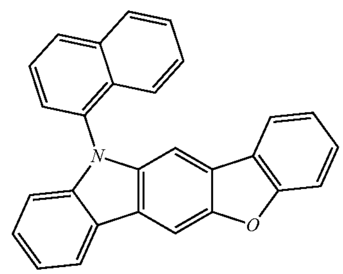
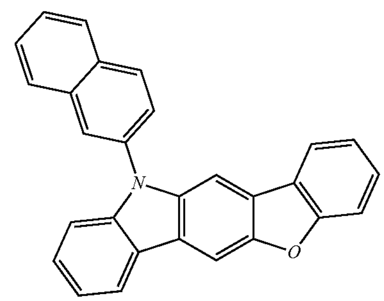
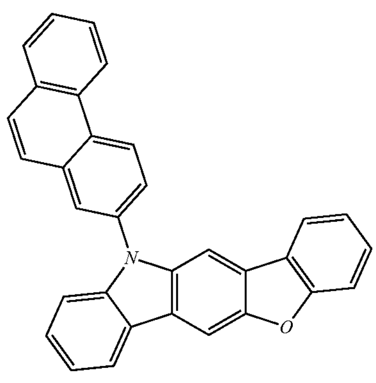
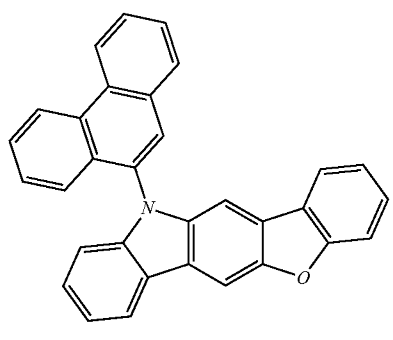
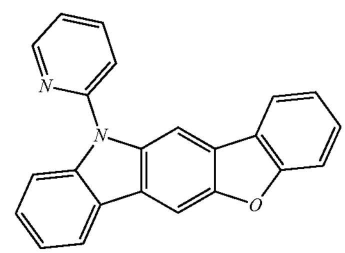
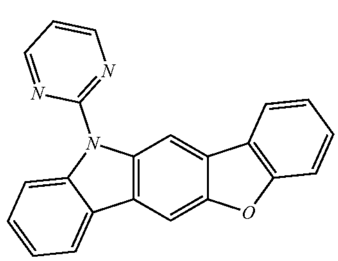
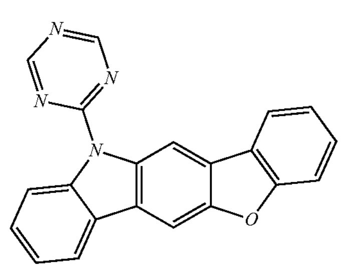
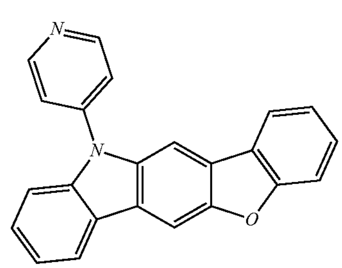

-continued
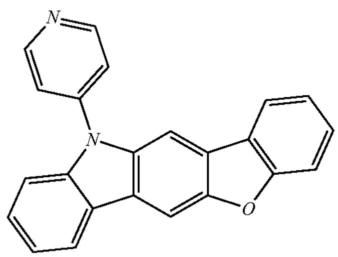
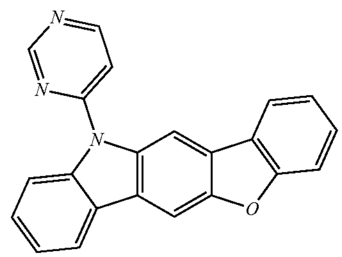
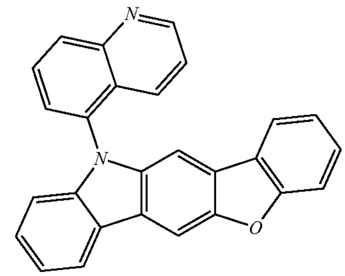
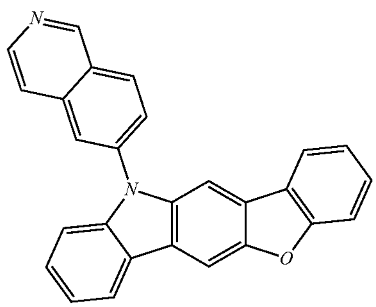
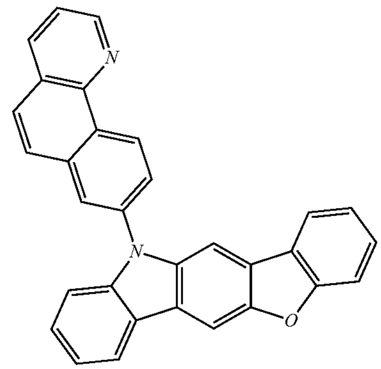
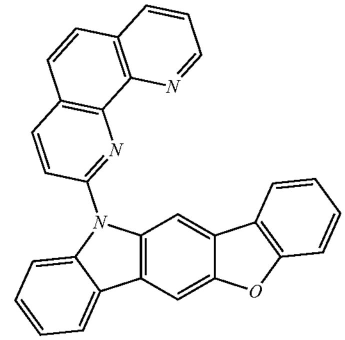
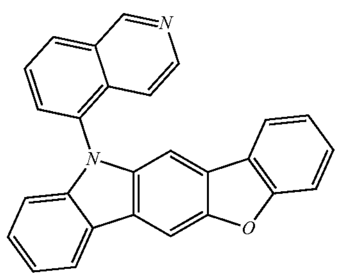
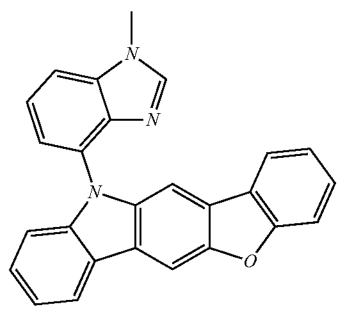
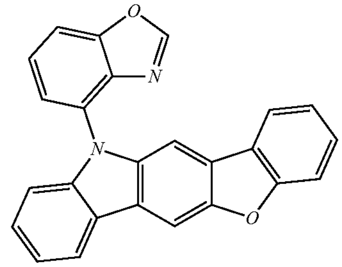
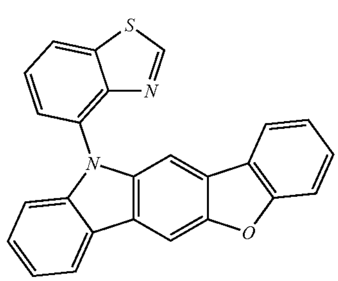
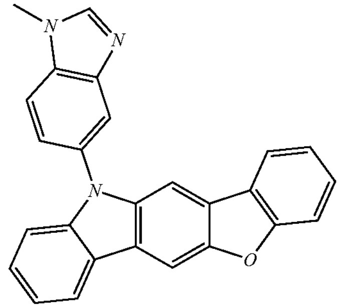
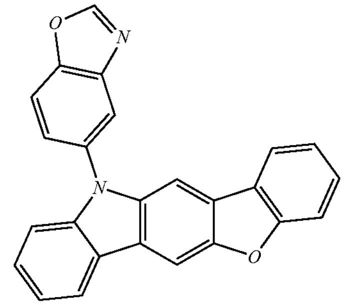
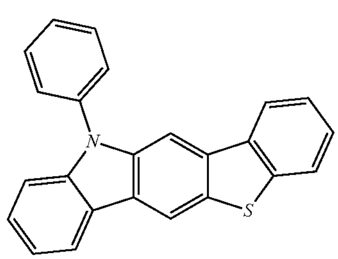
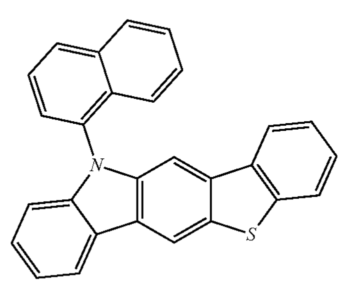
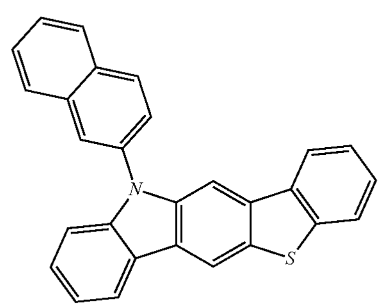

-continued
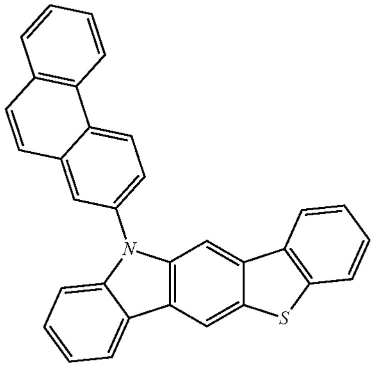
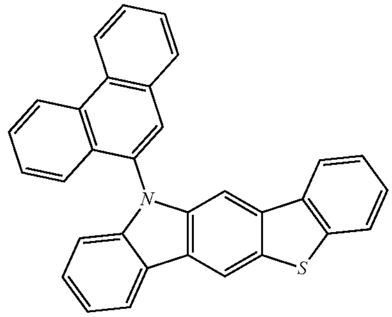
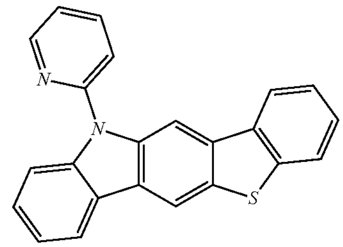
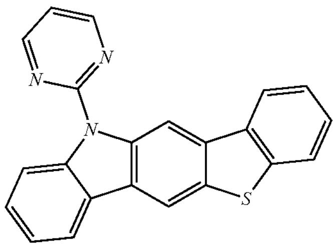
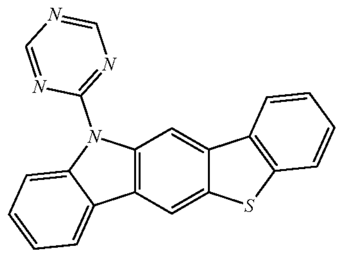
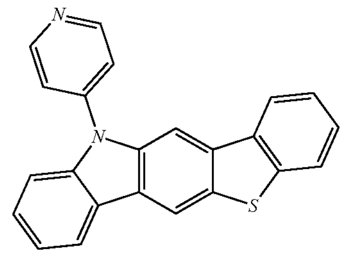
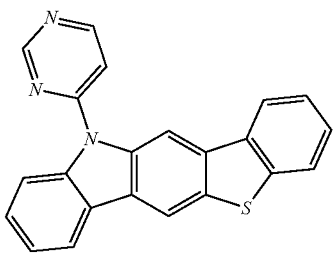
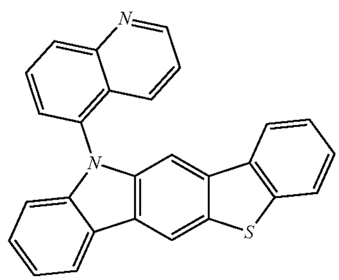
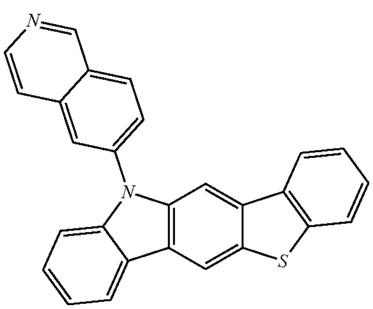
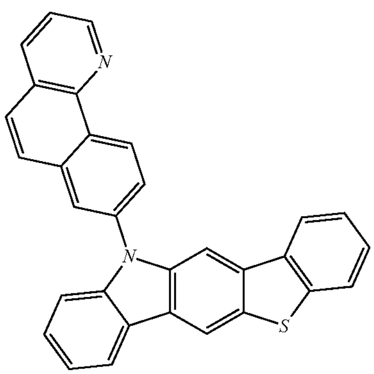
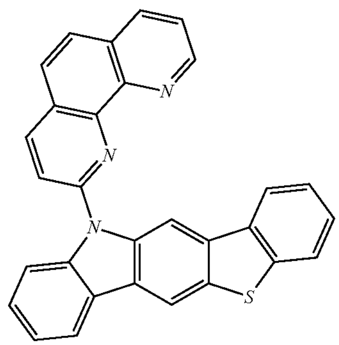
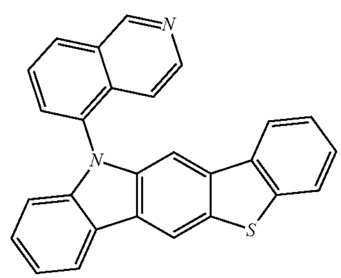
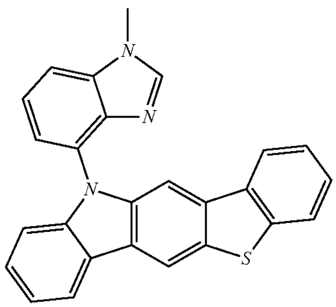
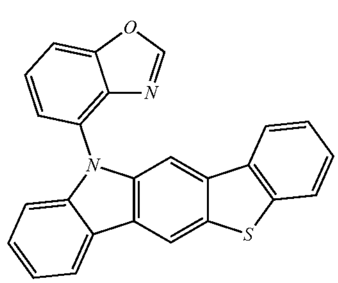
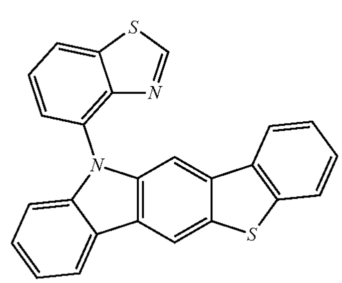

-continued
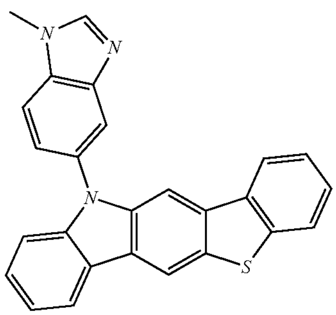
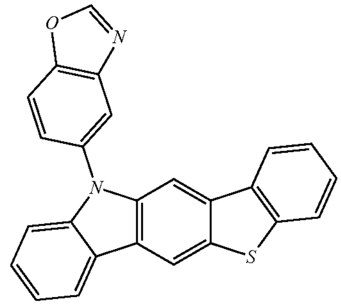
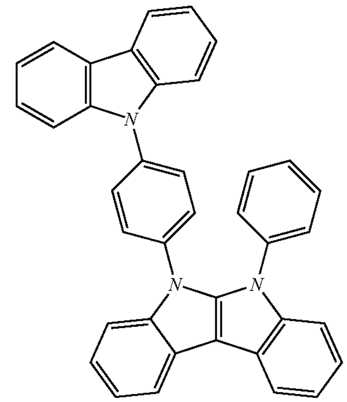
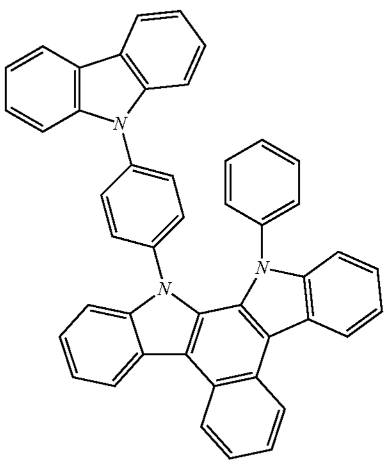
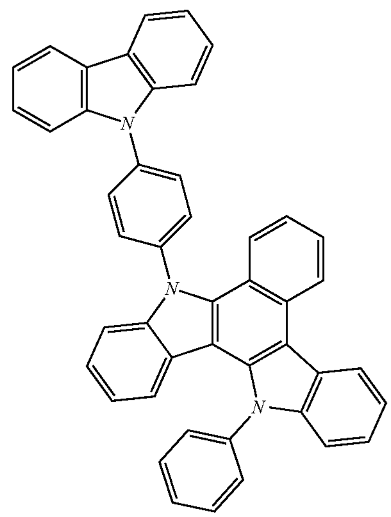
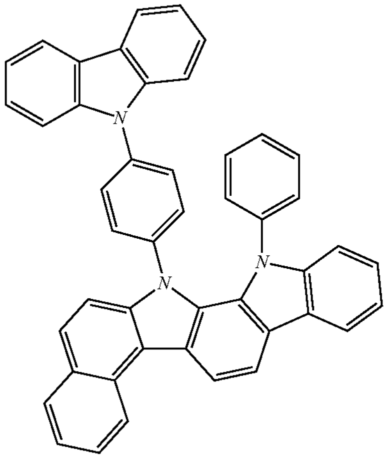
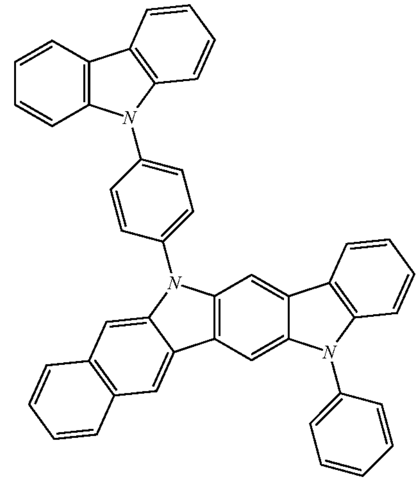

-continued
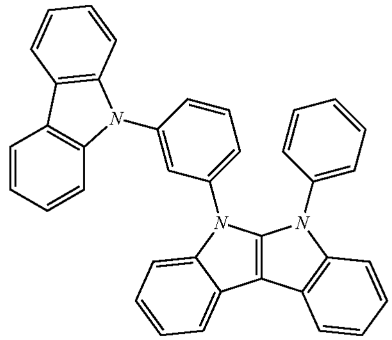
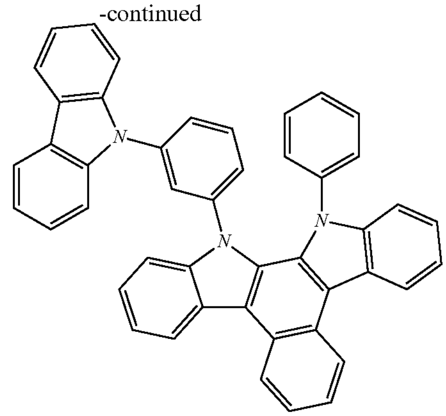
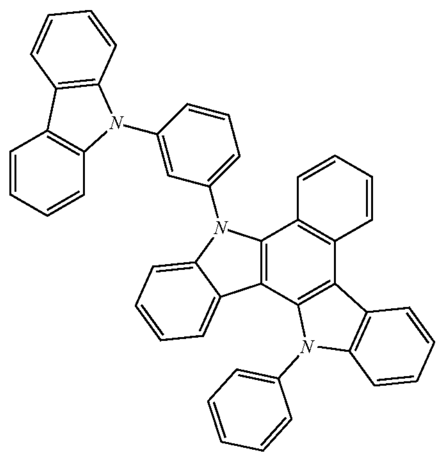
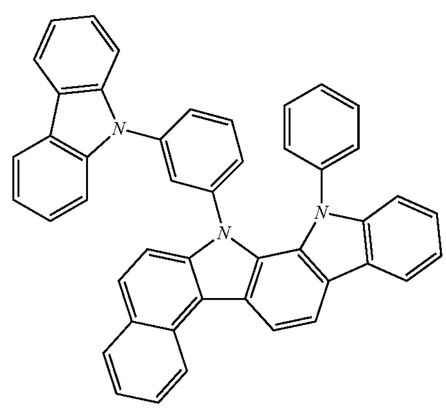
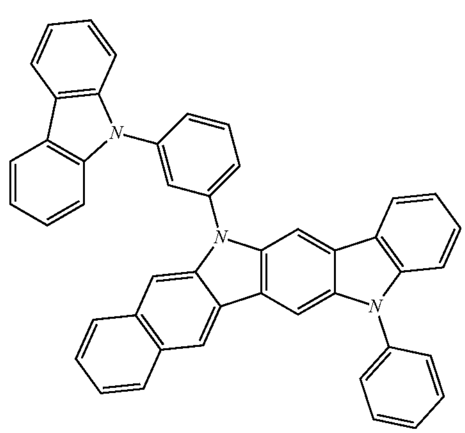
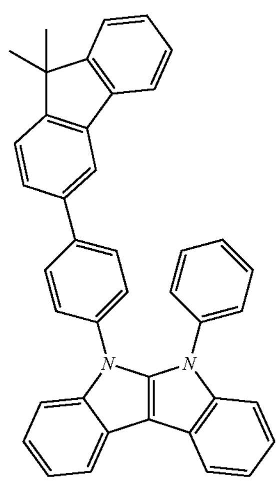
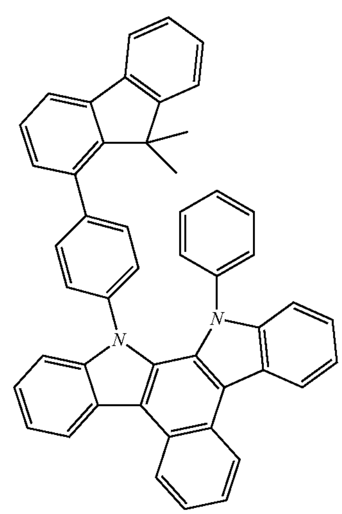

-continued
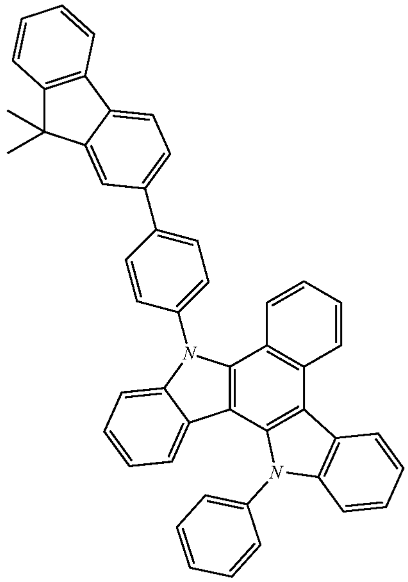
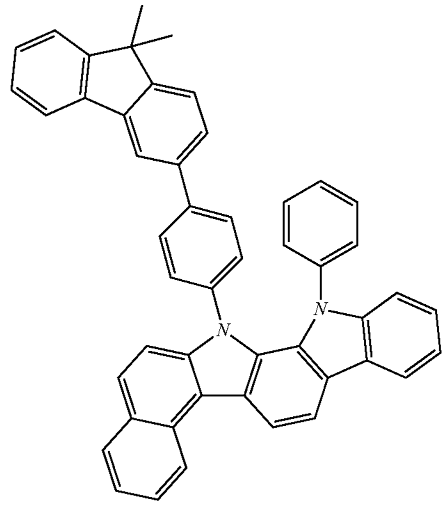
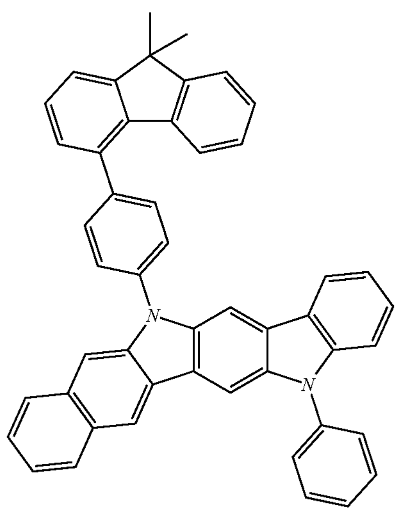
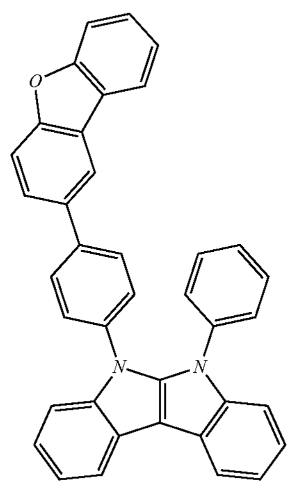
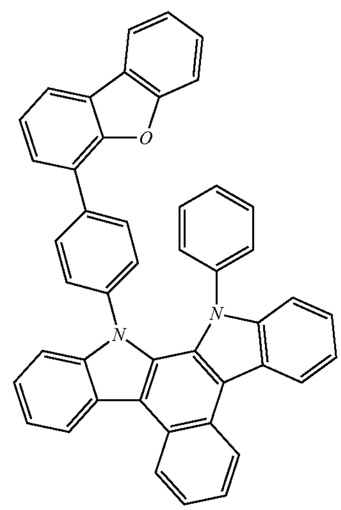
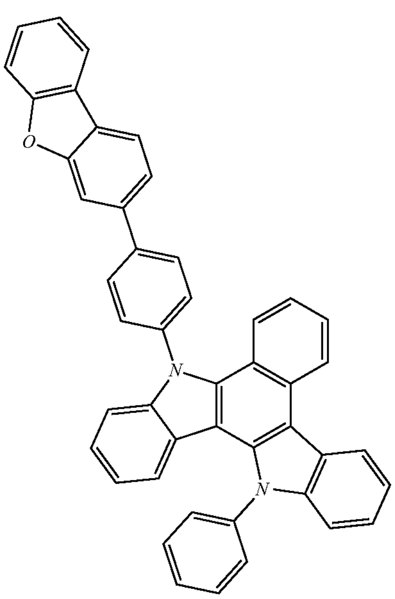
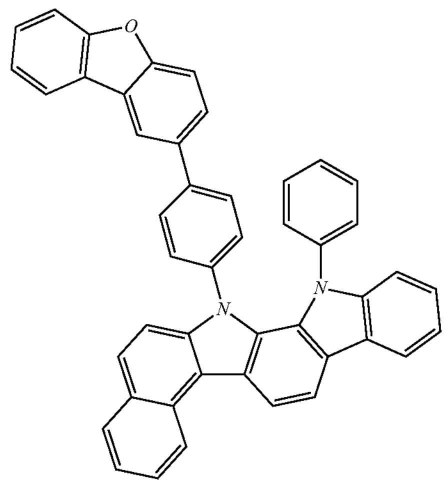

-continued
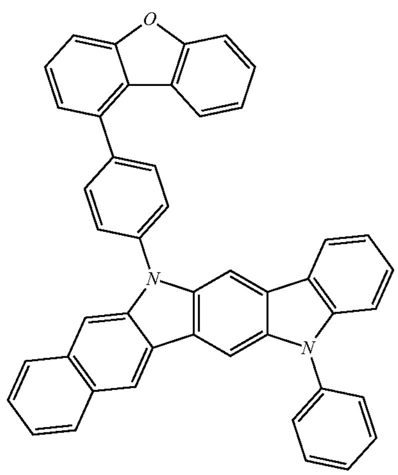
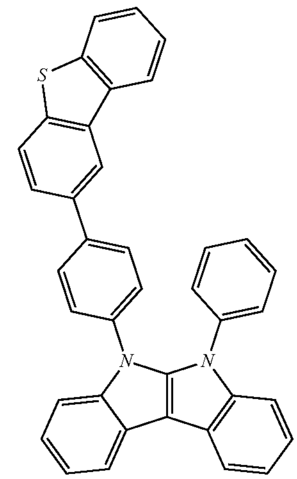
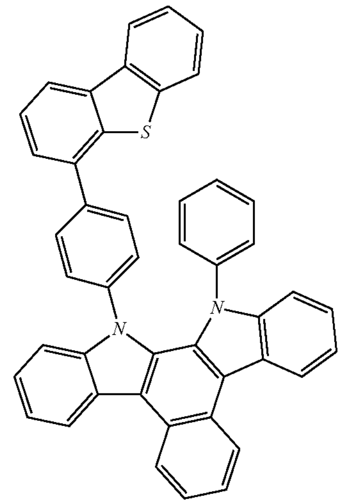
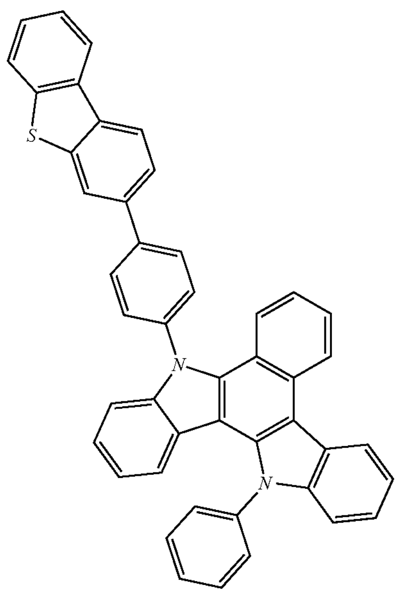
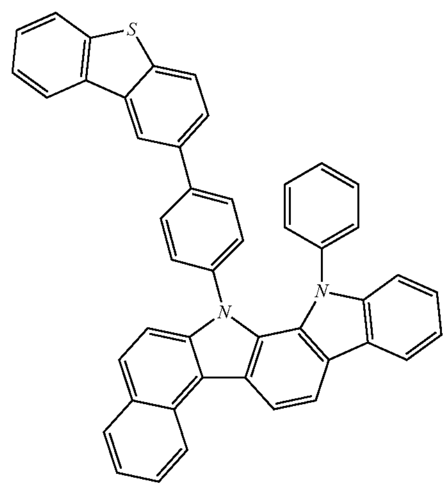
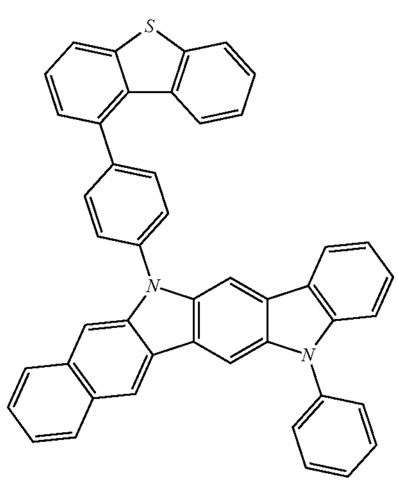
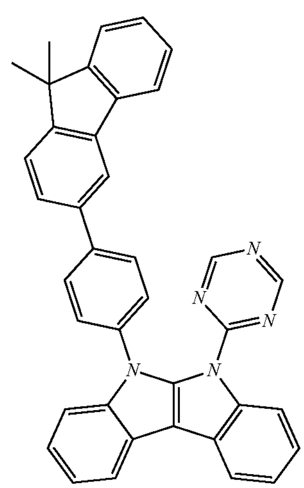
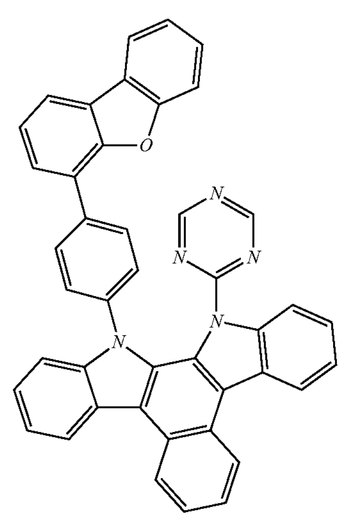

-continued
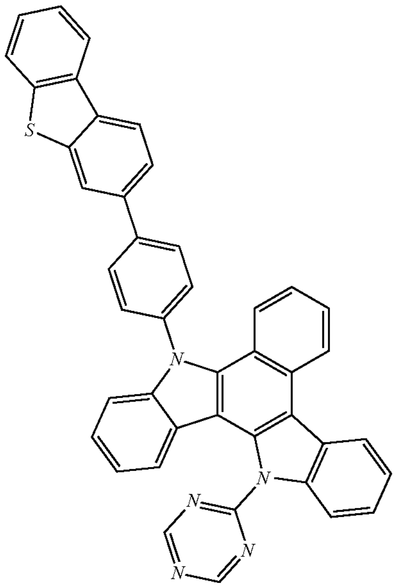
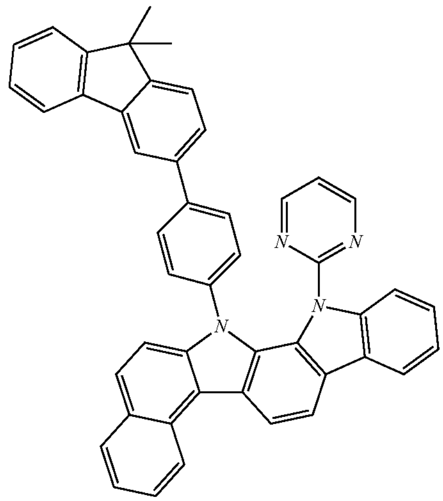
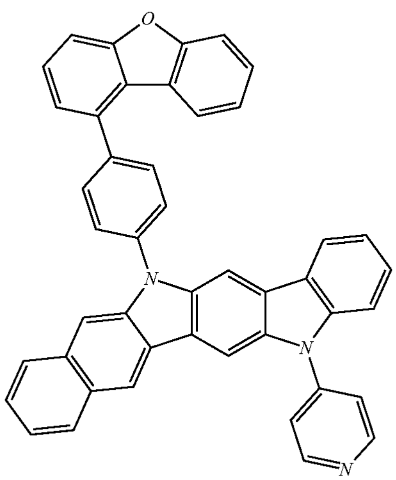
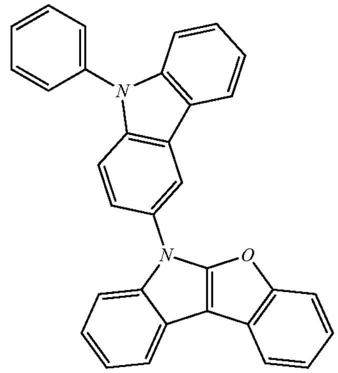
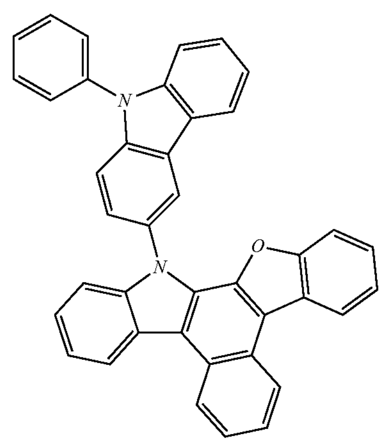
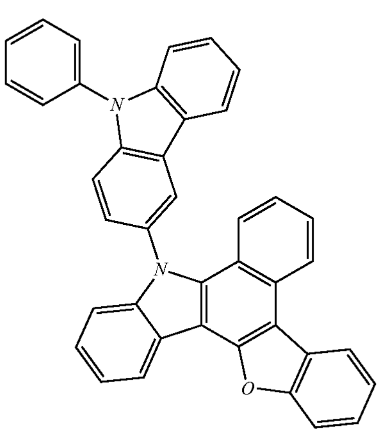
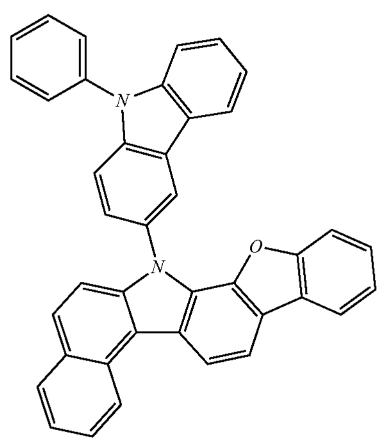

-continued
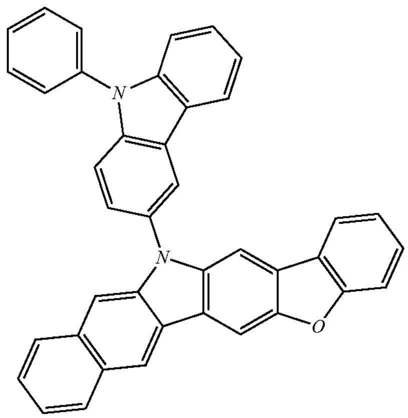
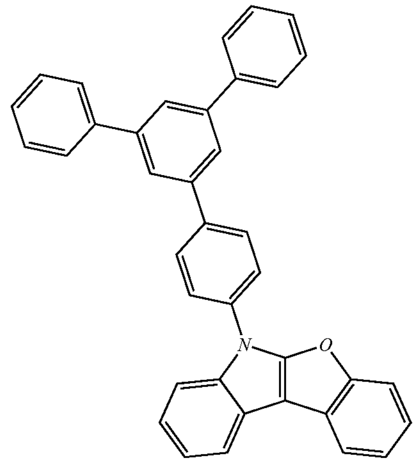
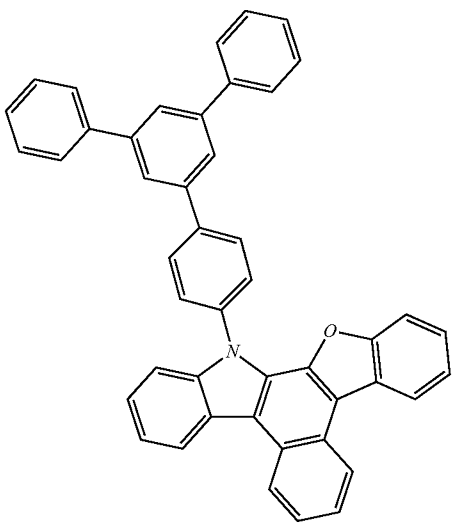
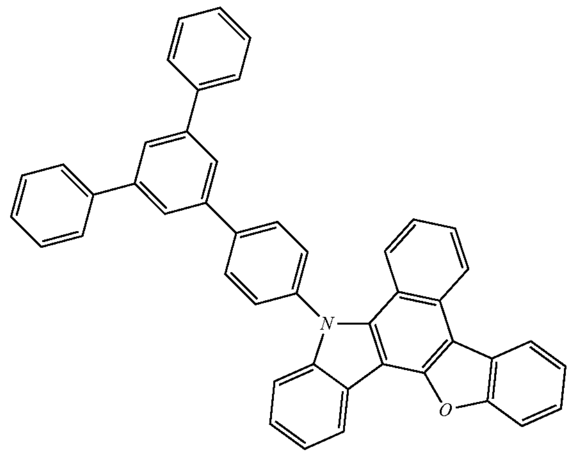
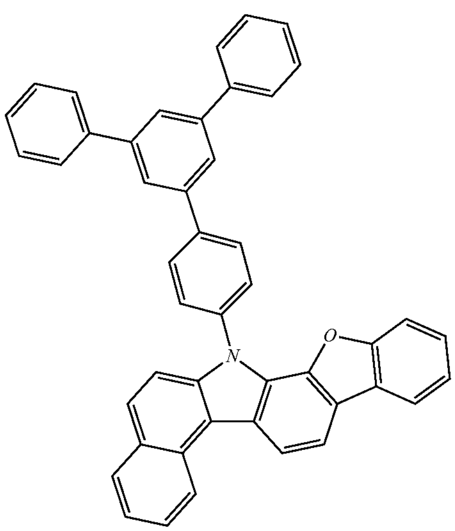
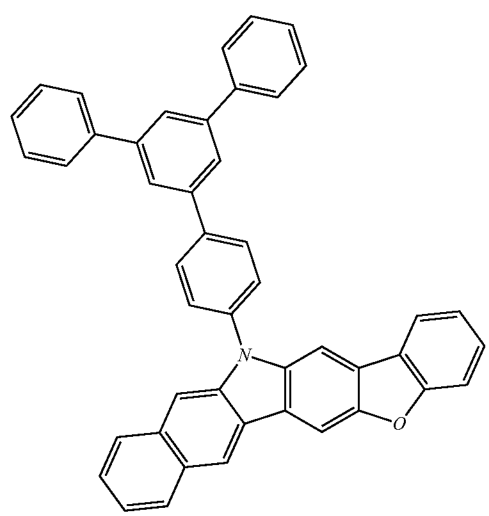

-continued
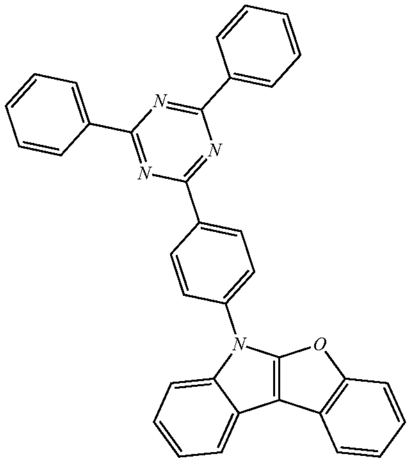
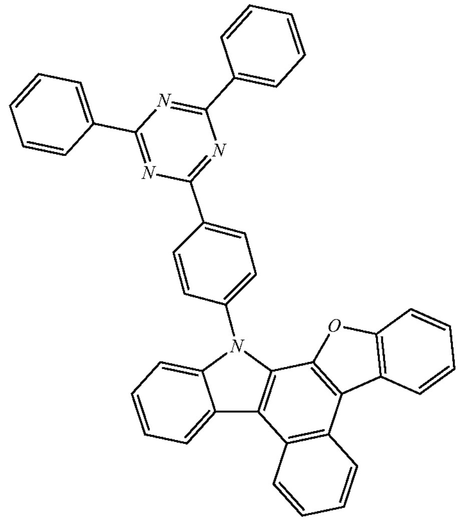
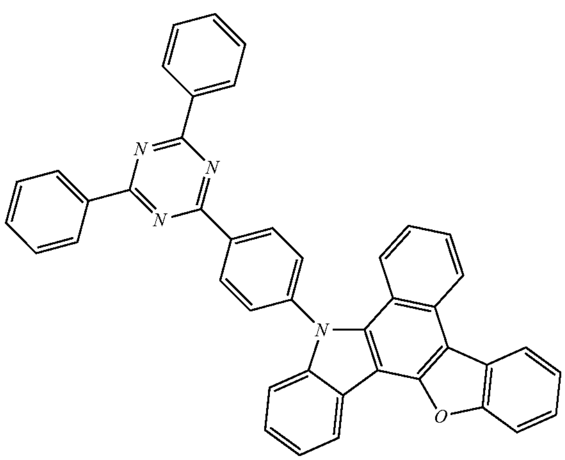
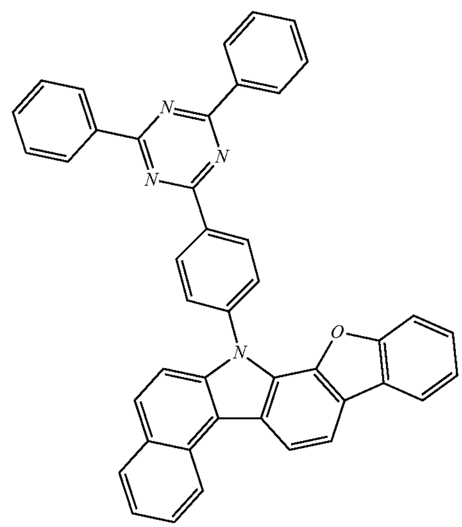
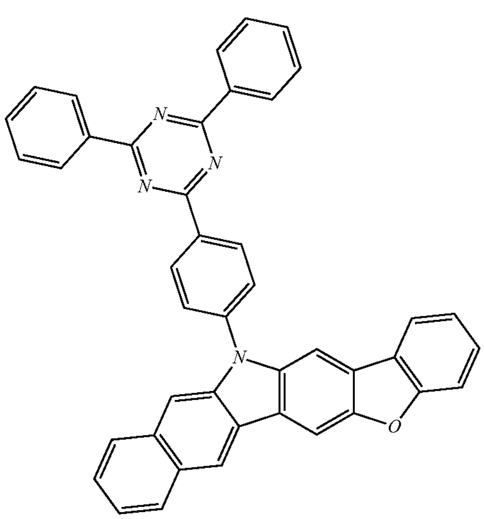
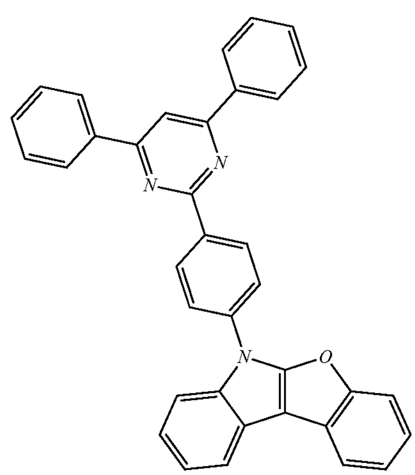

-continued
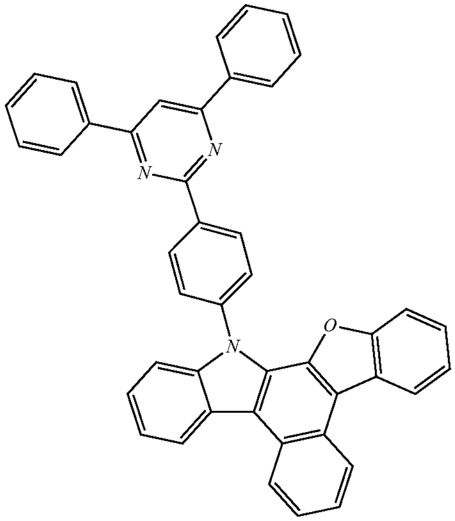
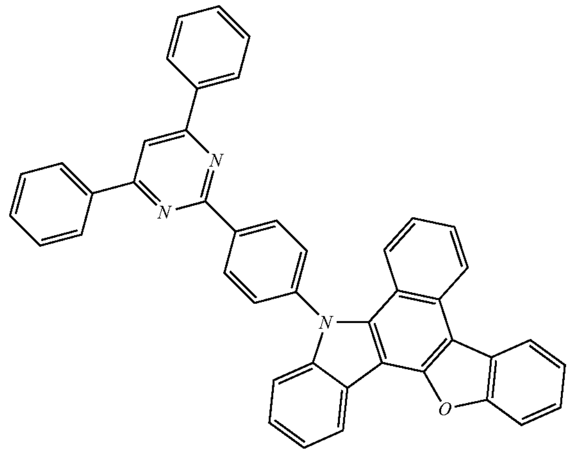
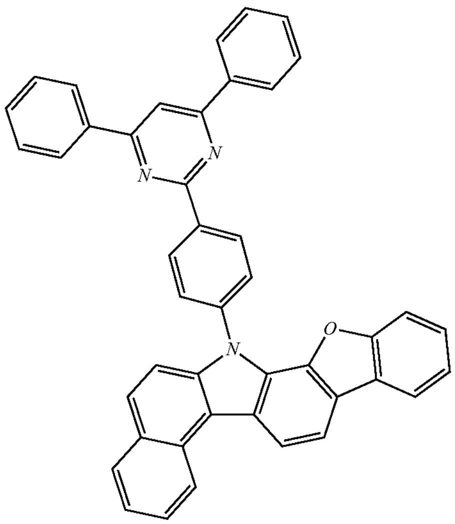
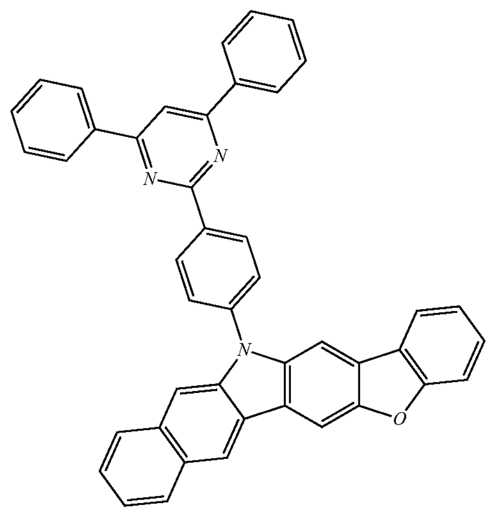
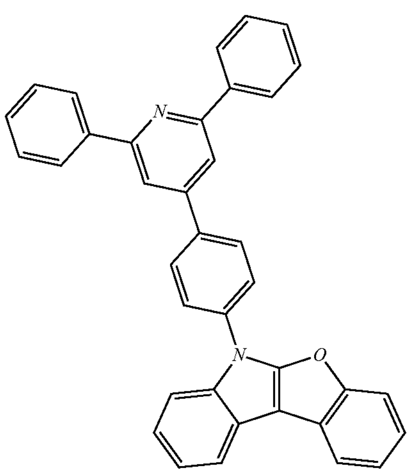
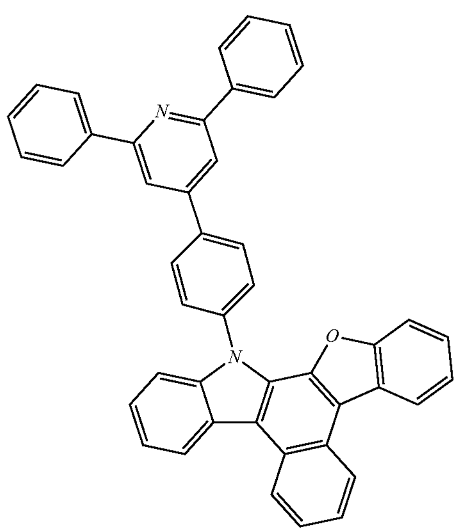

-continued
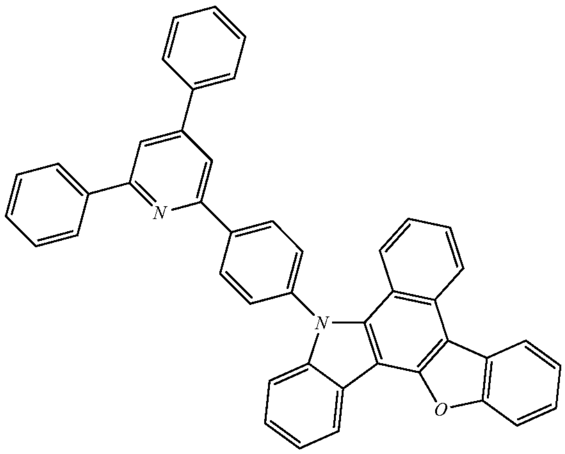
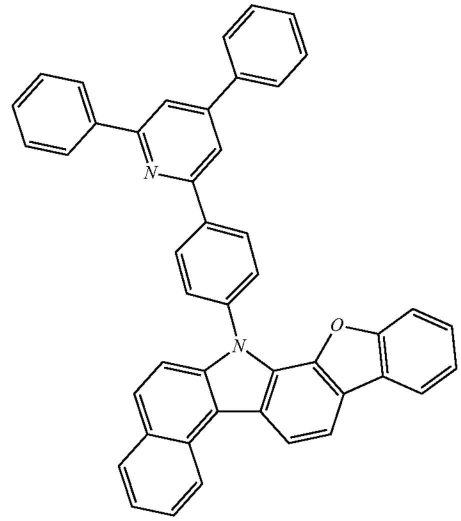
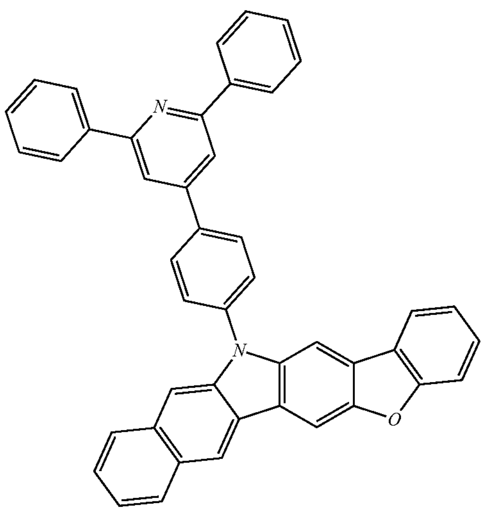
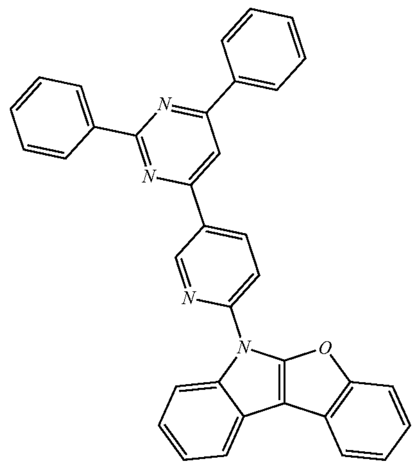
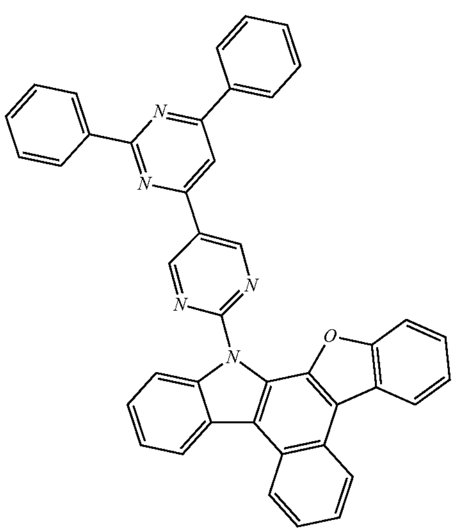
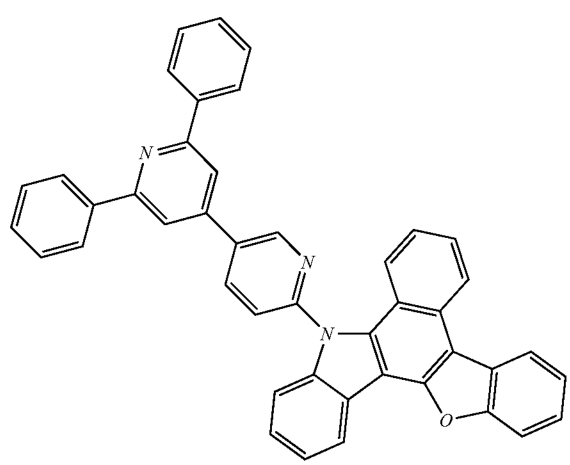

-continued
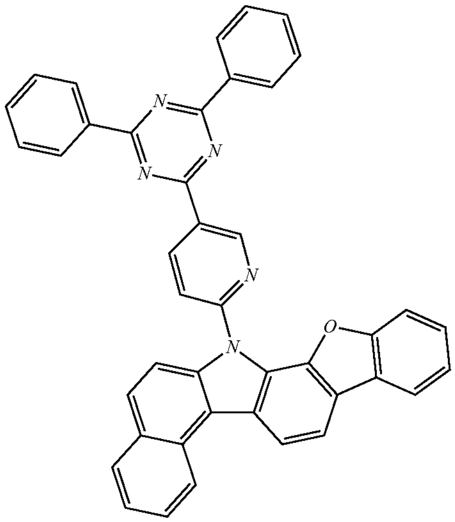
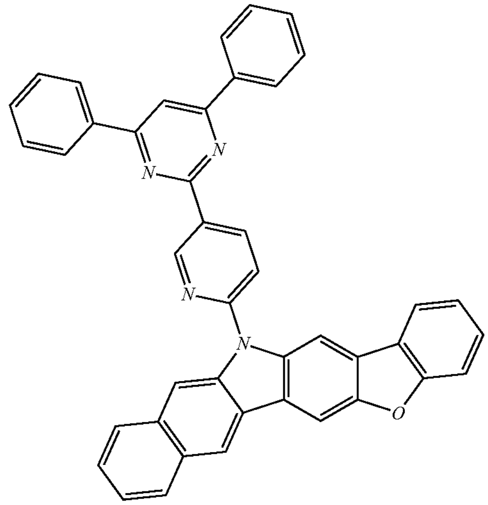
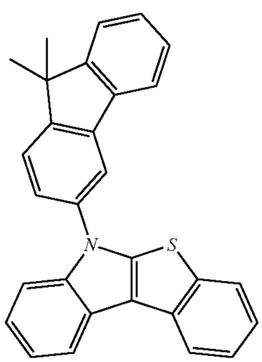
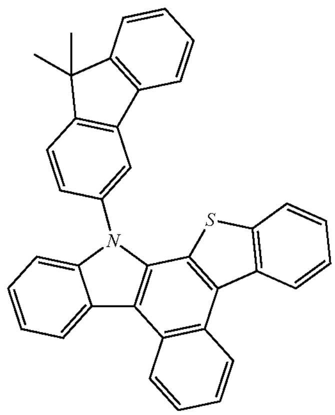
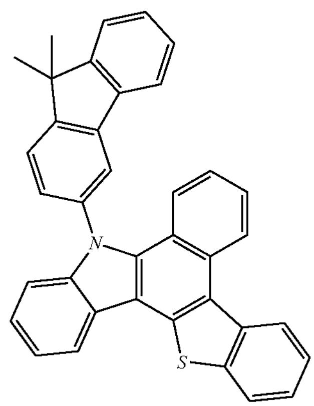
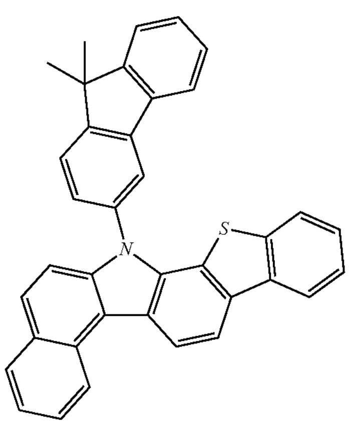
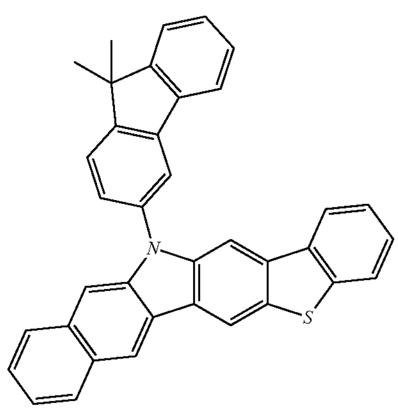
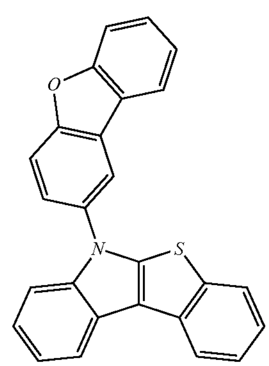

-continued
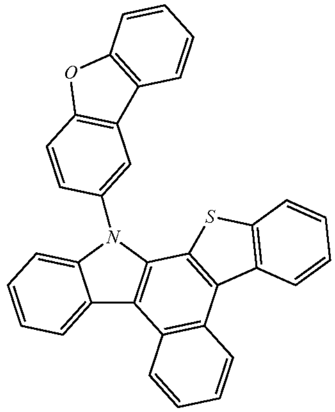
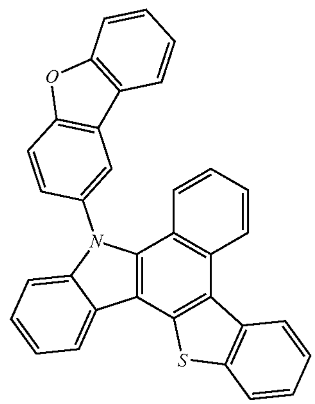
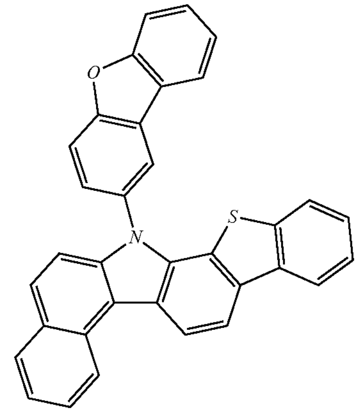
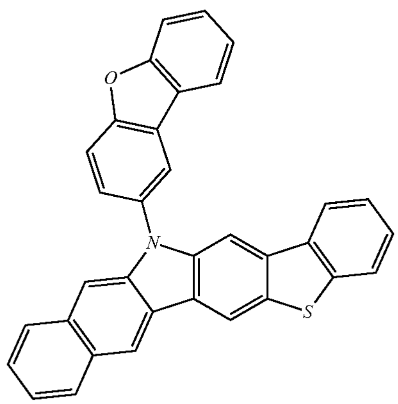
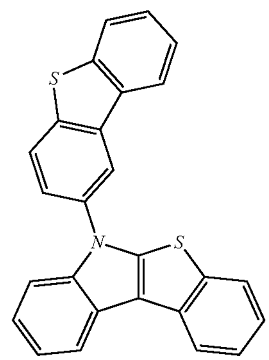
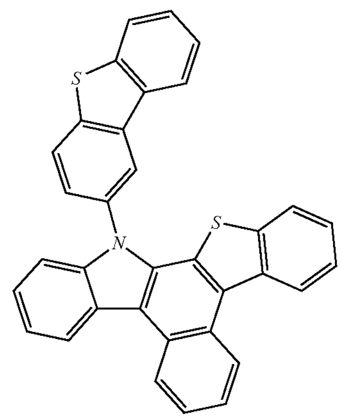
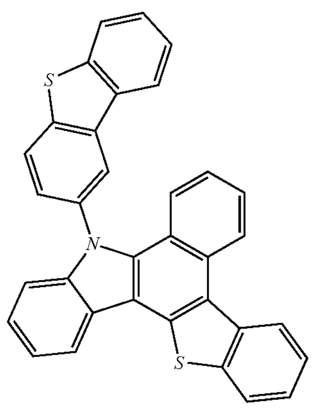
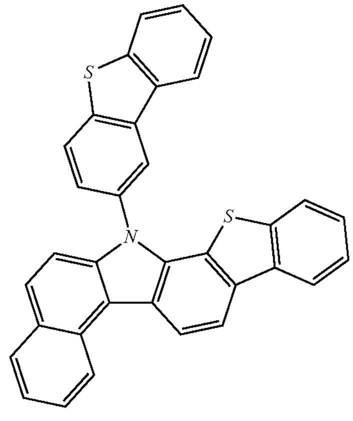
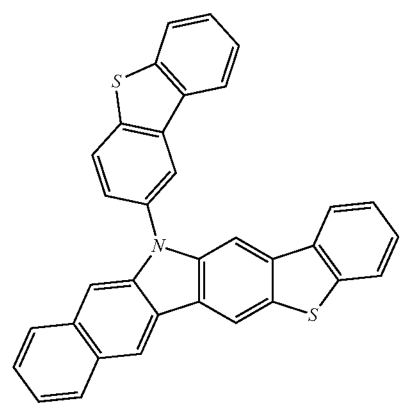
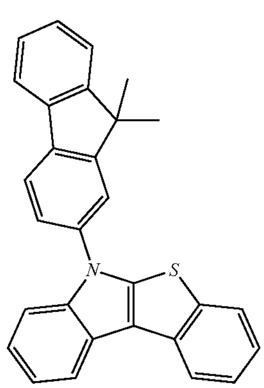
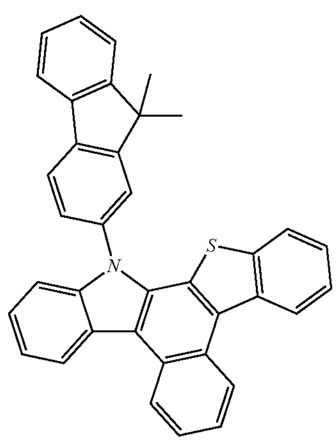
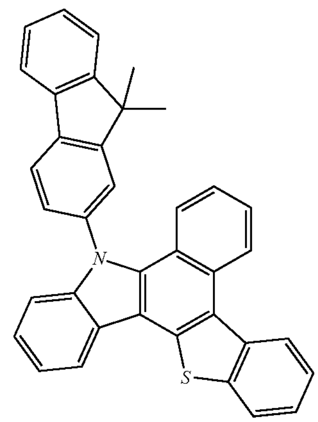

-continued
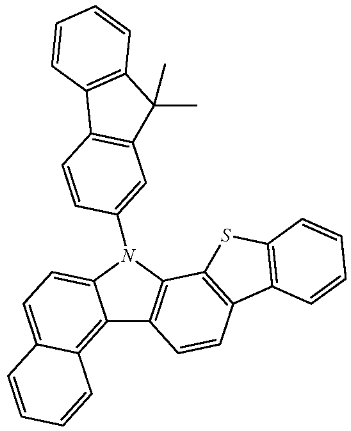
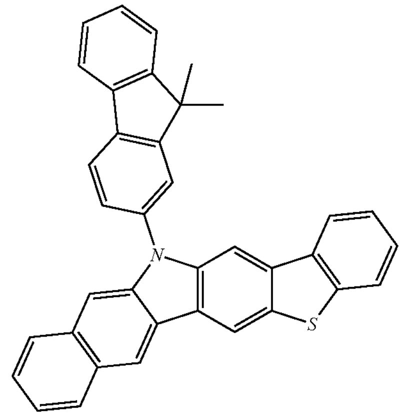
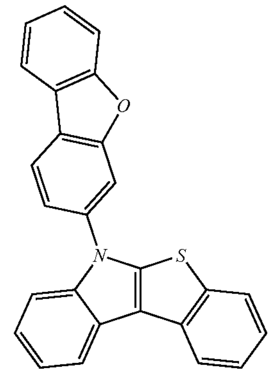
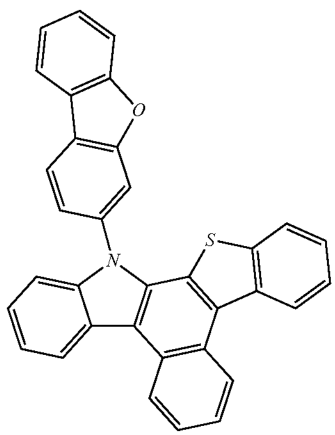
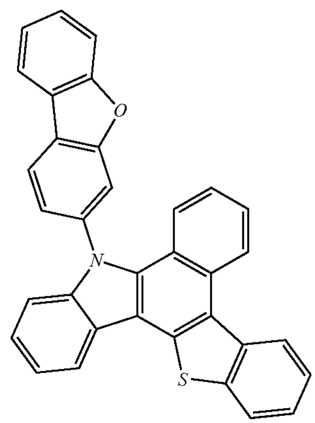
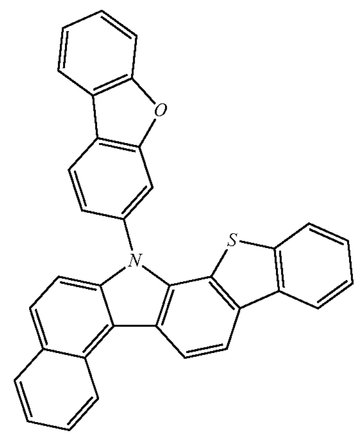
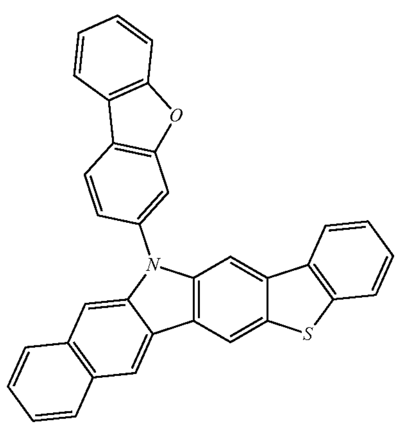
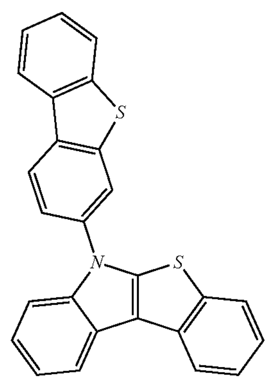
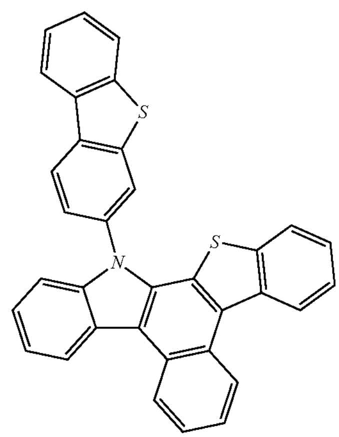
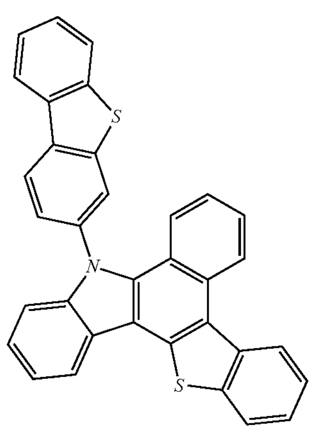
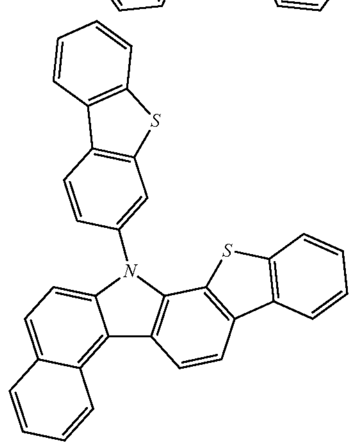
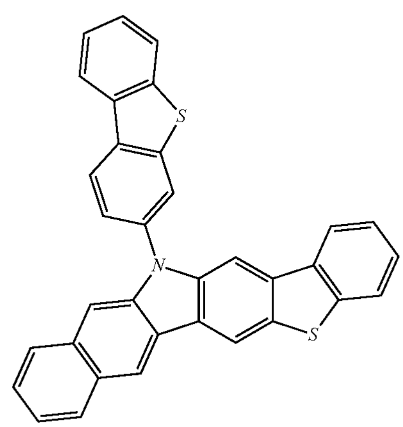

-continued
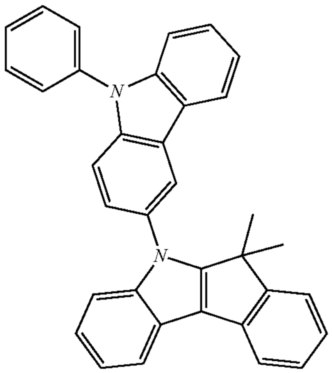
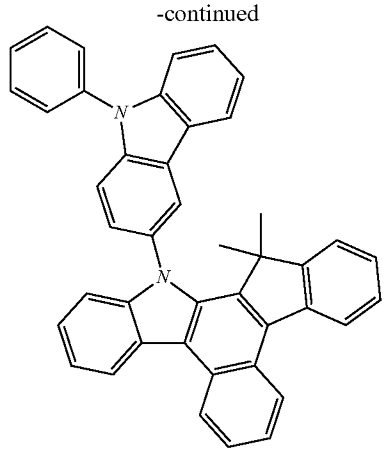
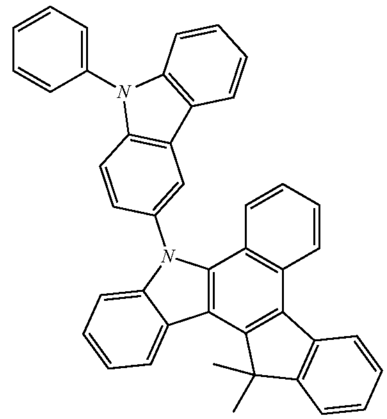
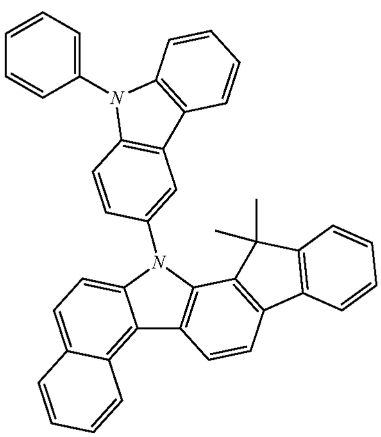
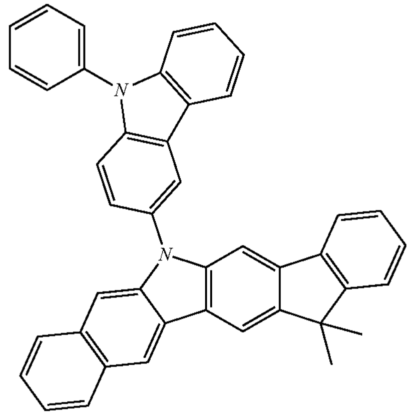
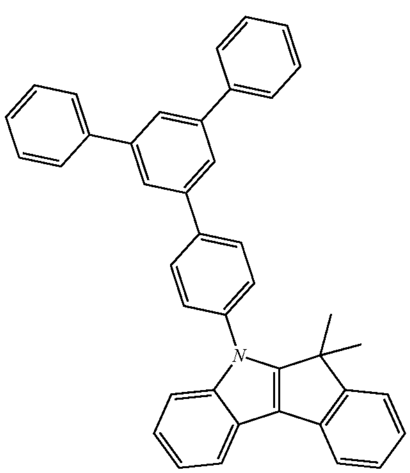
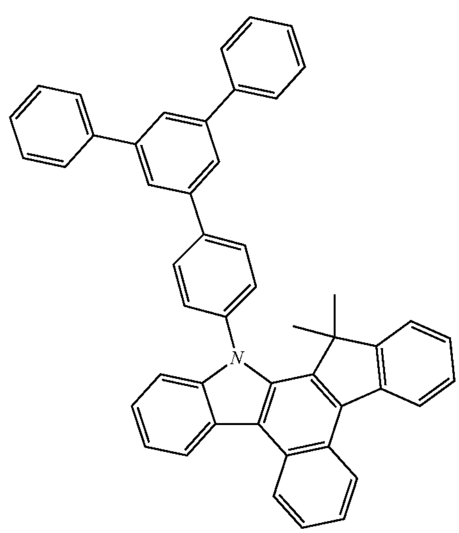

-continued
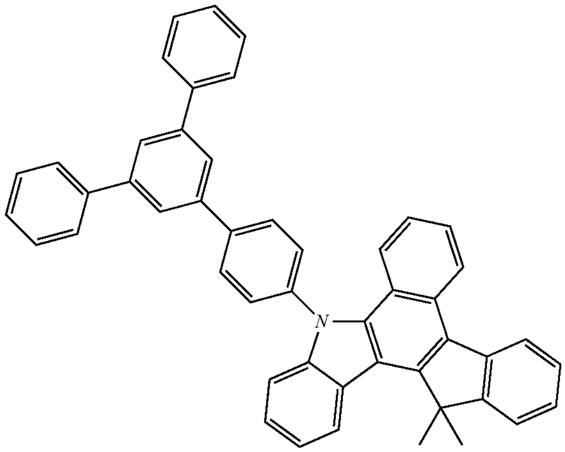
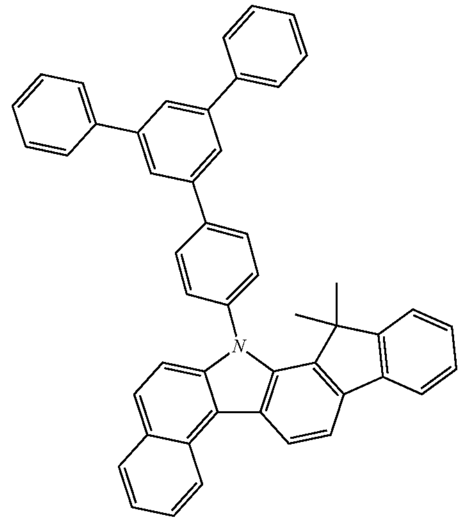
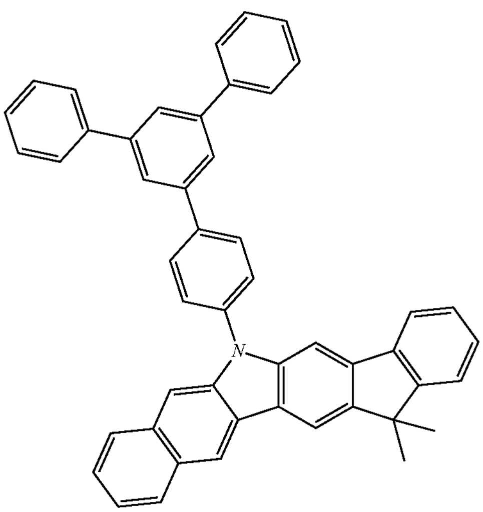
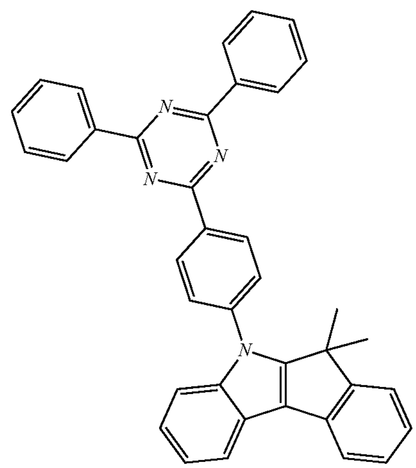
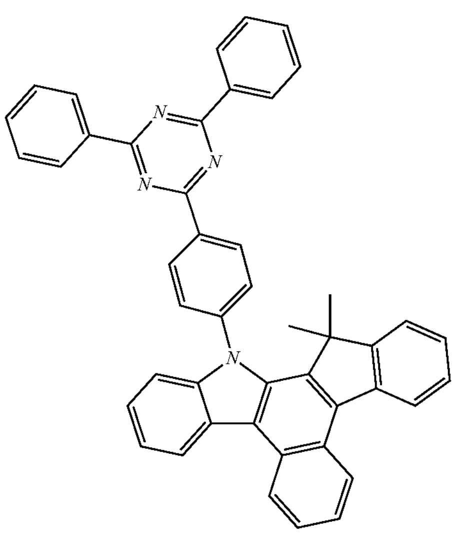
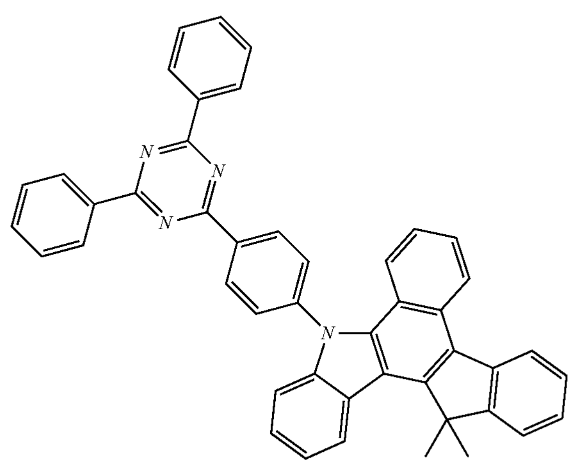

-continued
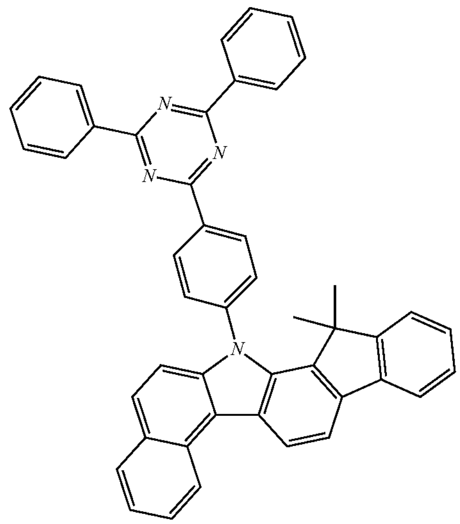
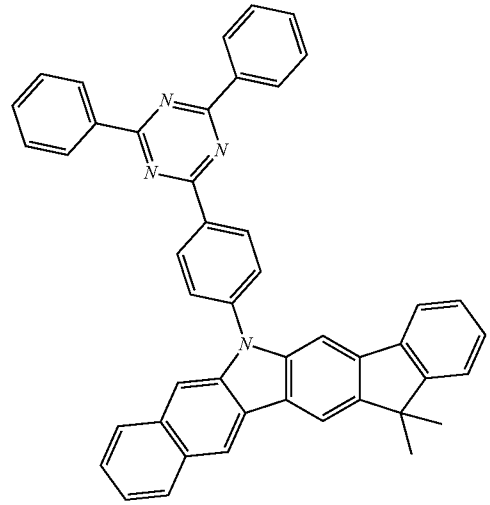
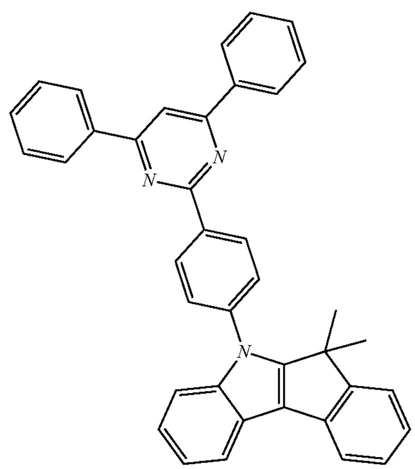
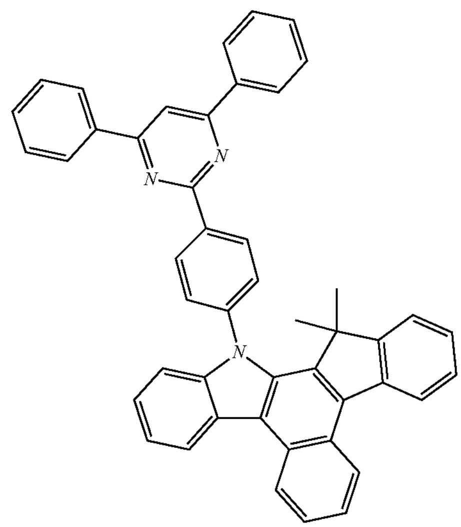
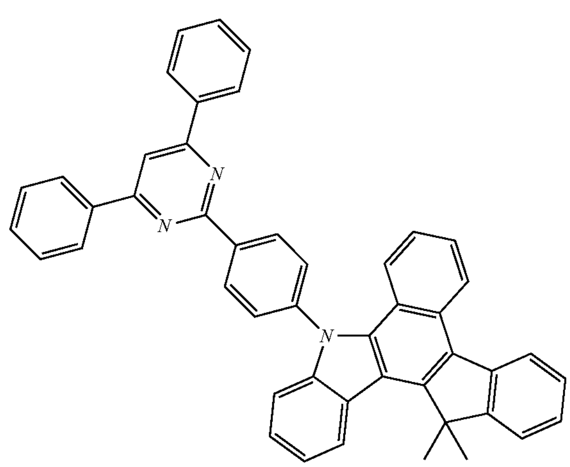
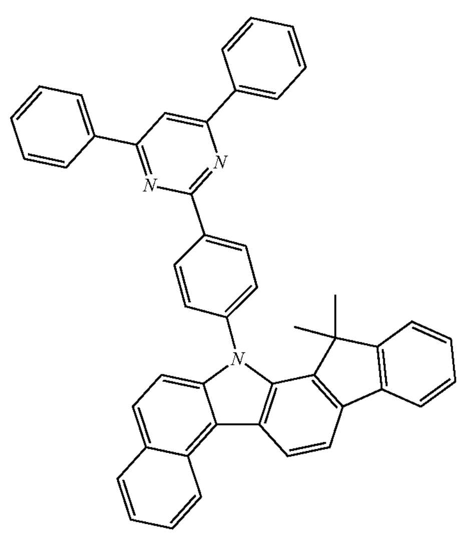

-continued
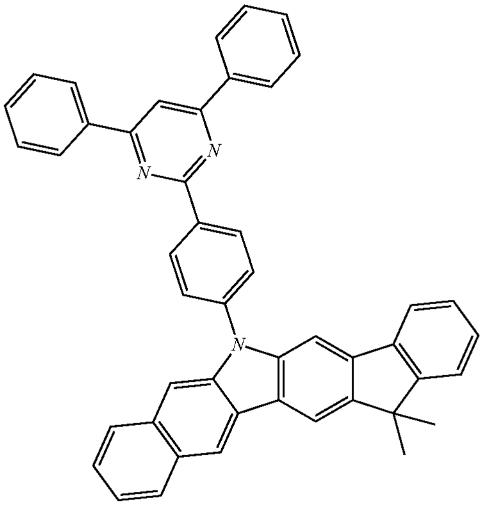
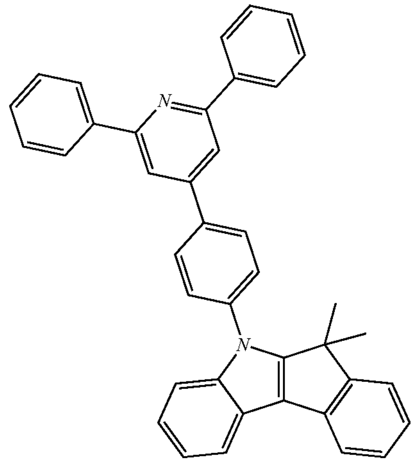
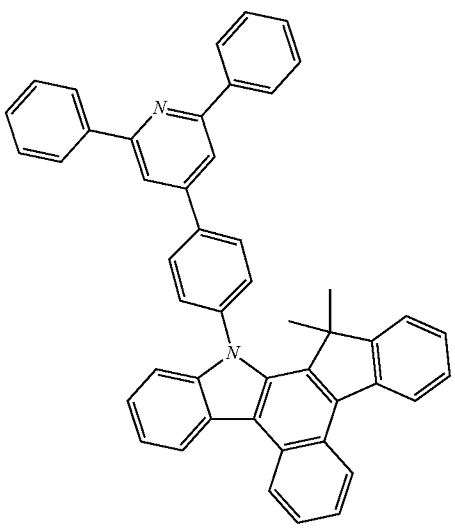
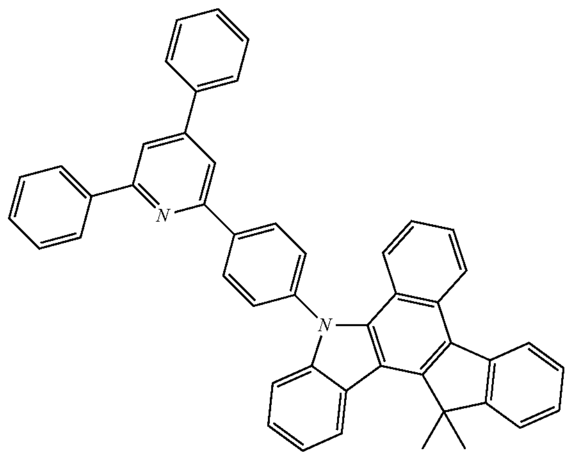
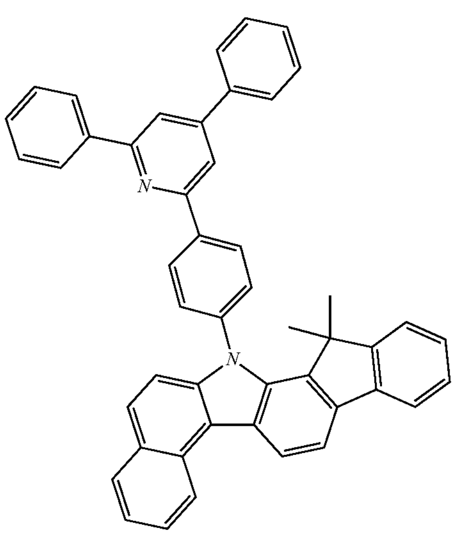
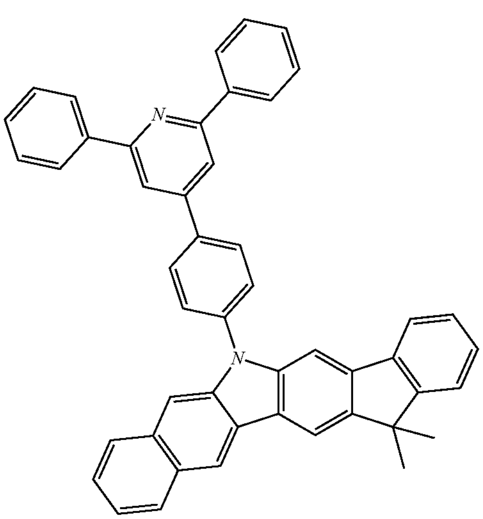

-continued
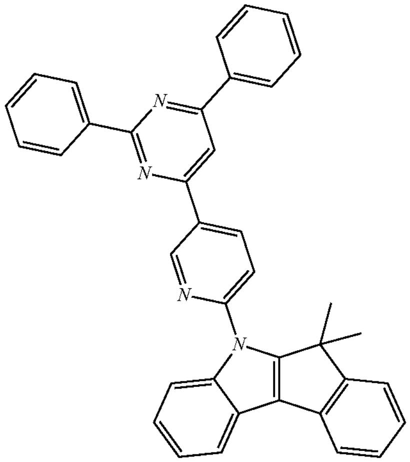
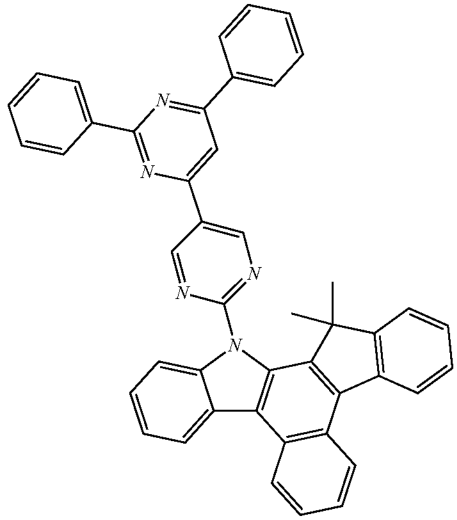
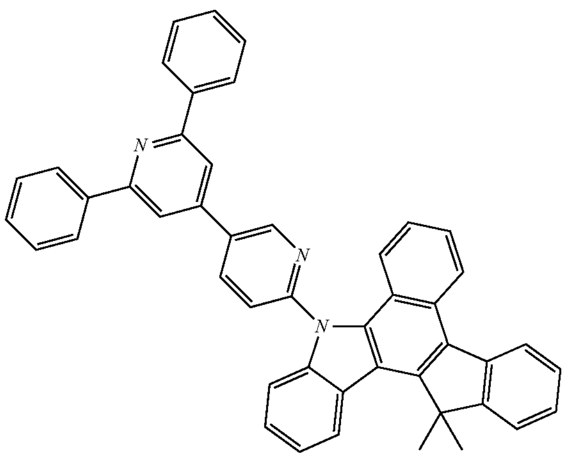
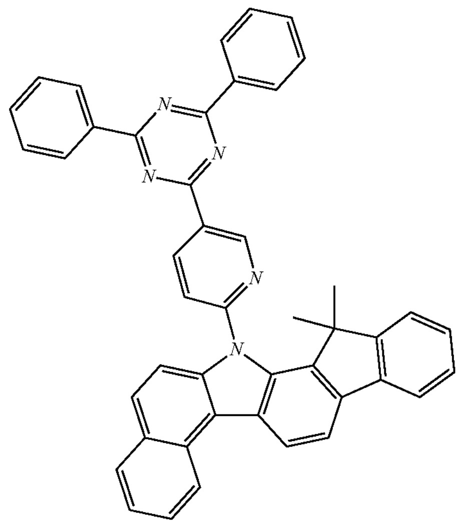
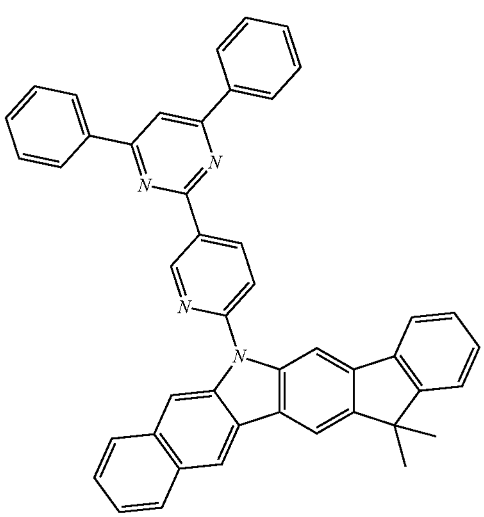
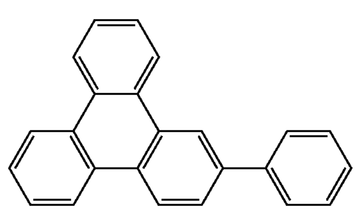

-continued
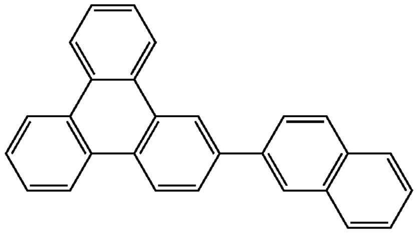
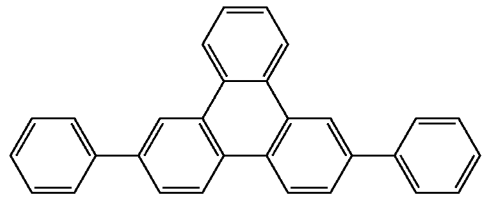
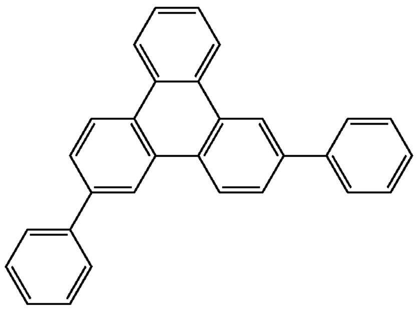
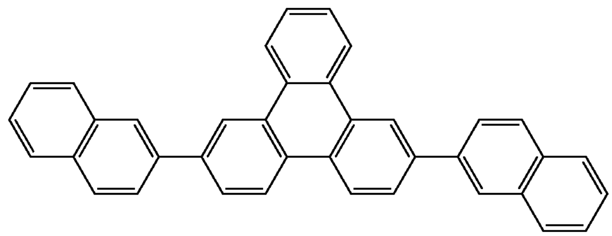
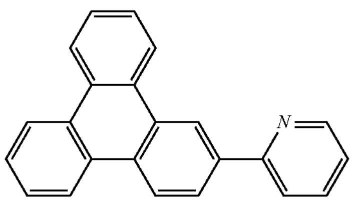
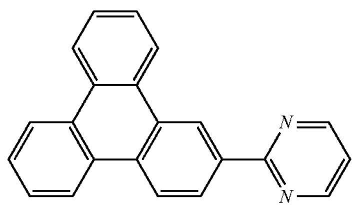
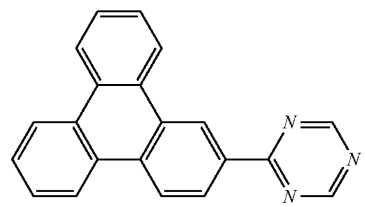
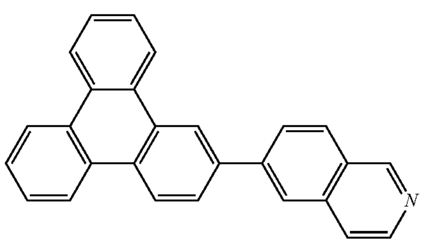
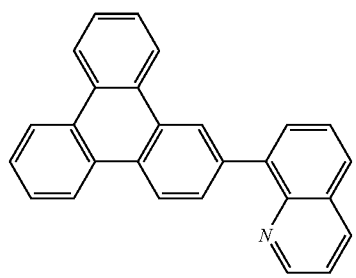
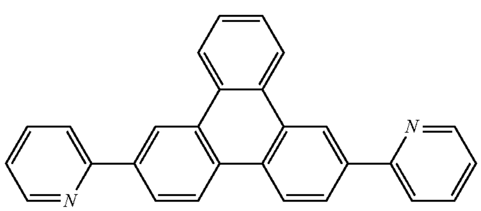
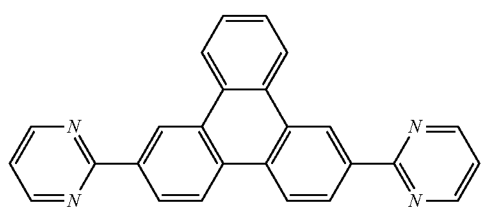
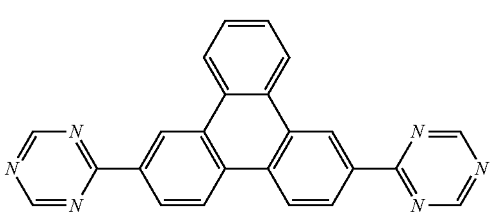
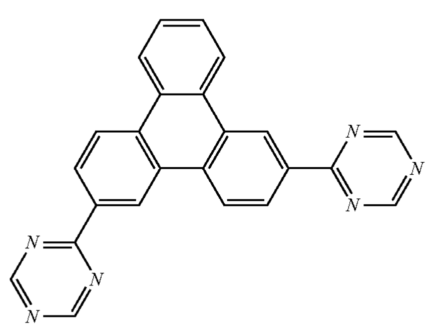

-continued
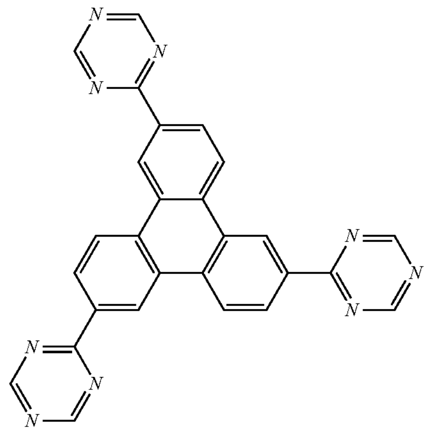
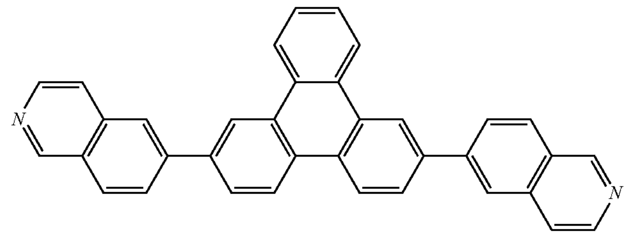
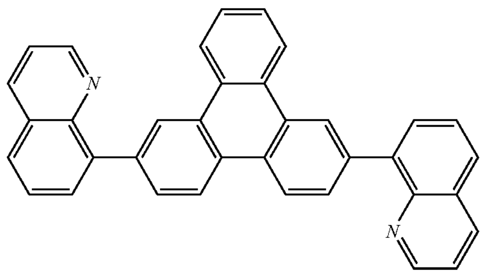
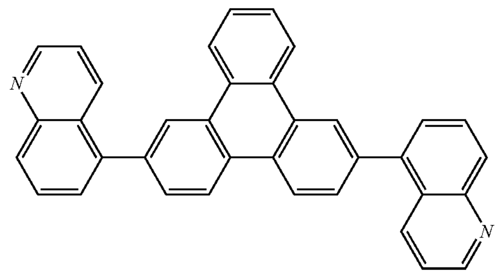
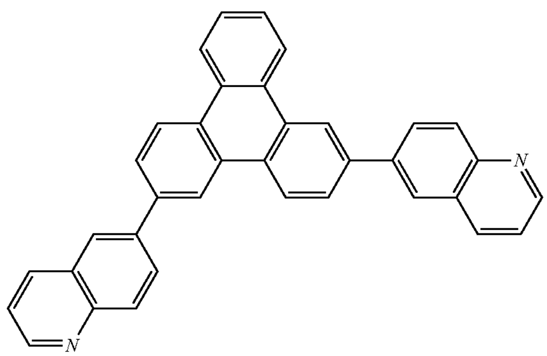
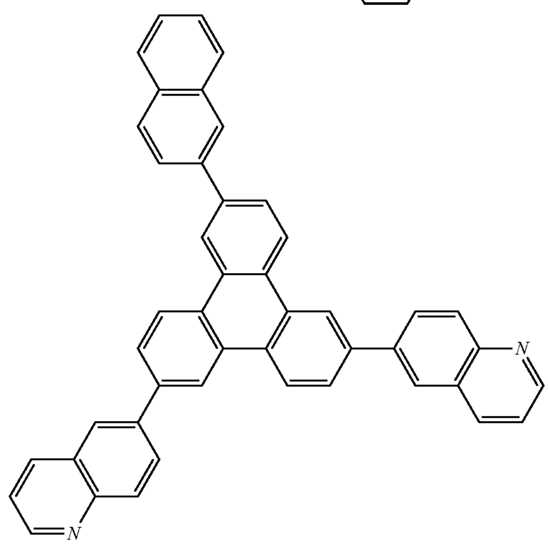
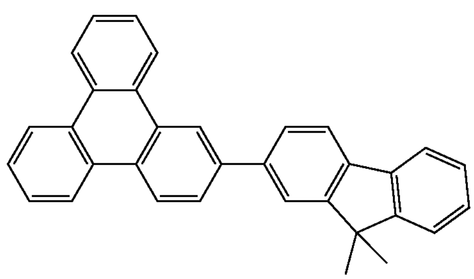
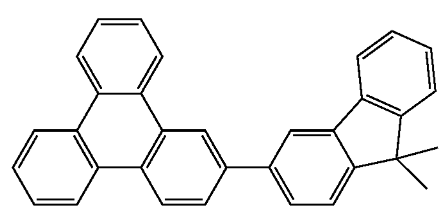
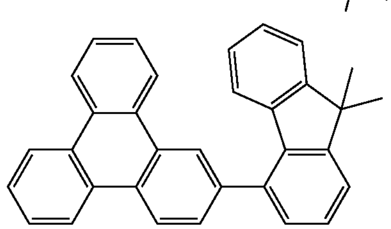
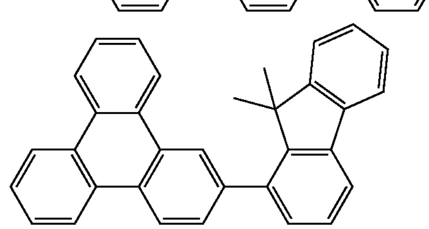

-continued
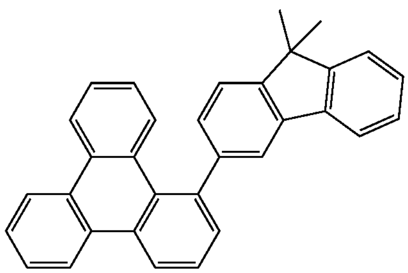
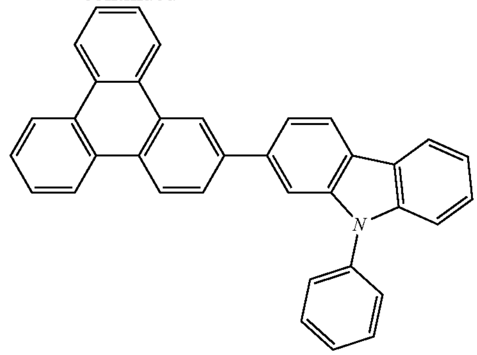
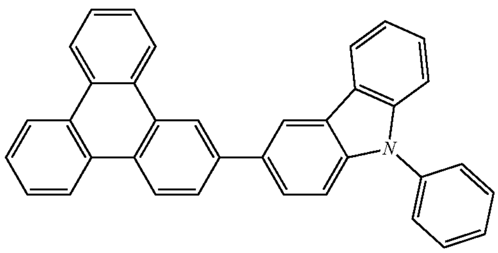
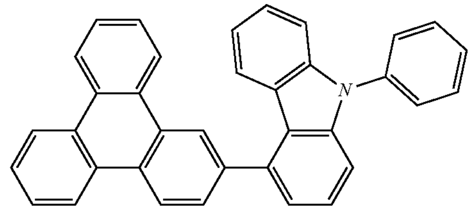
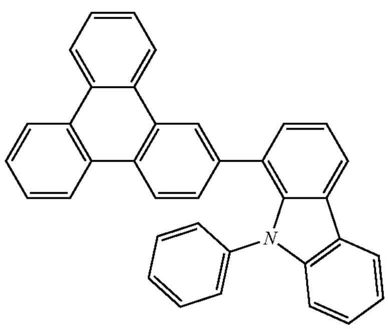
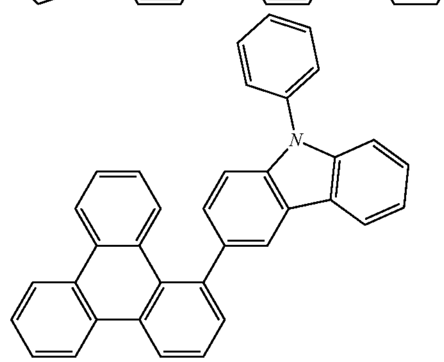
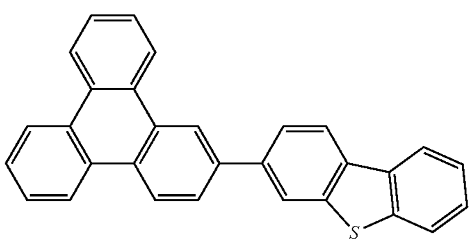
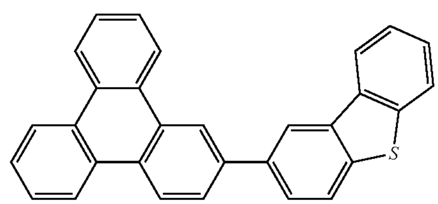
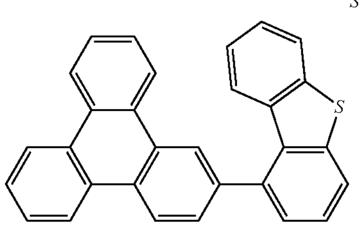
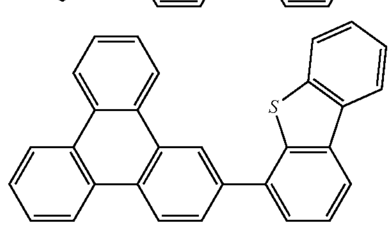
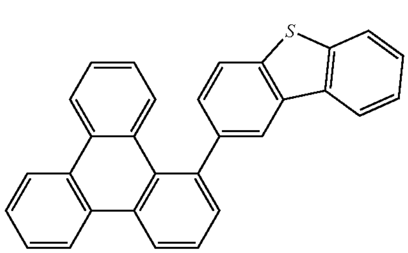
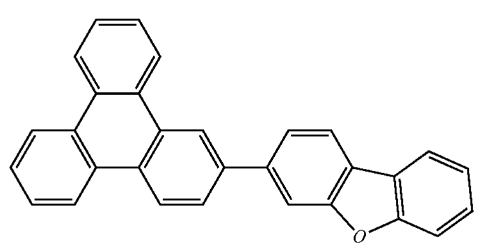

-continued
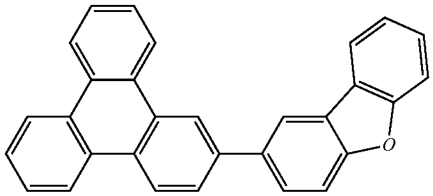
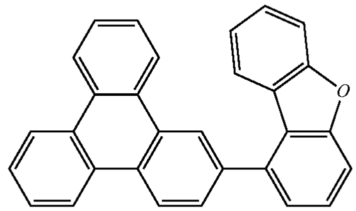
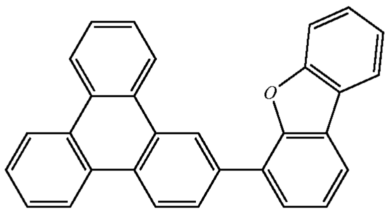
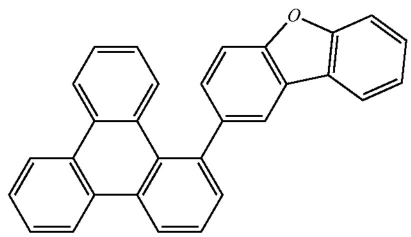
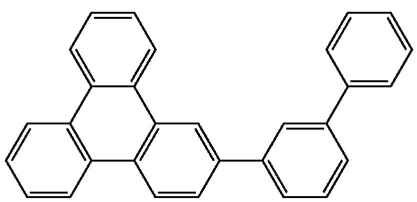
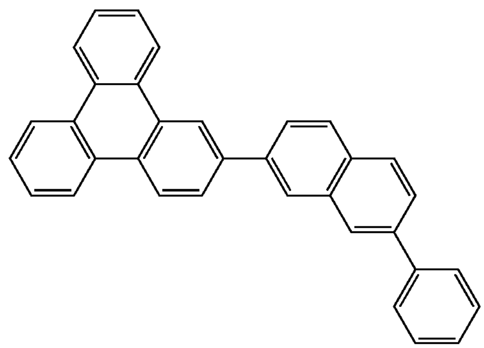
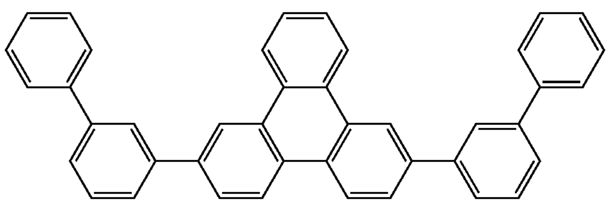
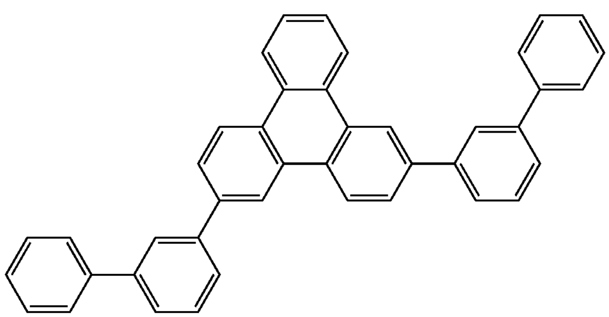
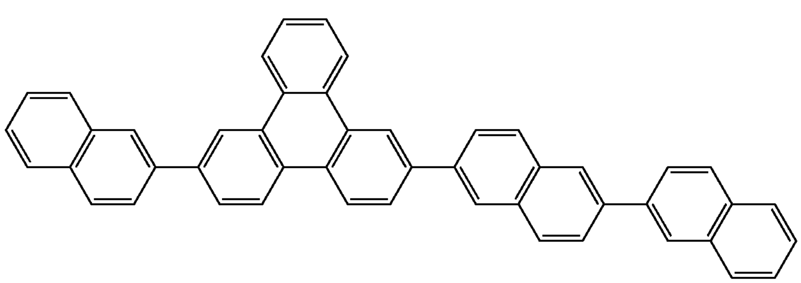

-continued
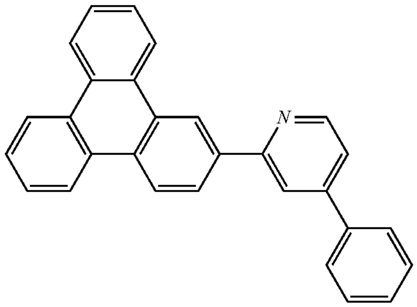
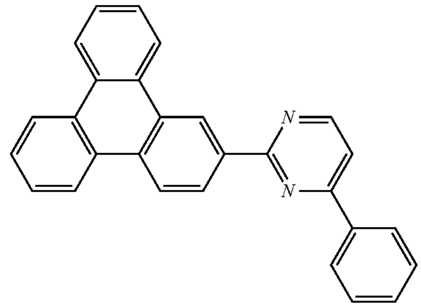
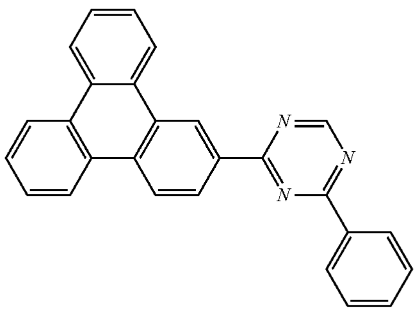
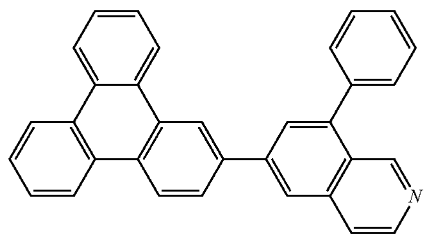
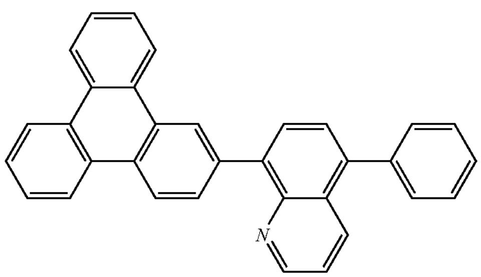
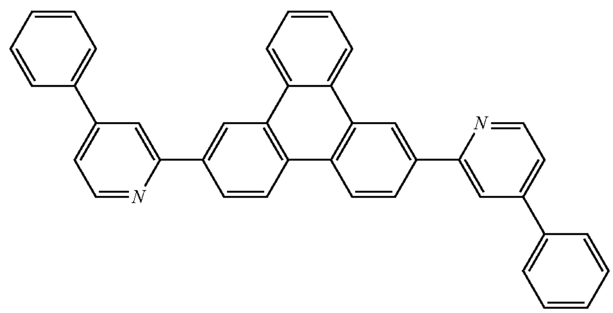
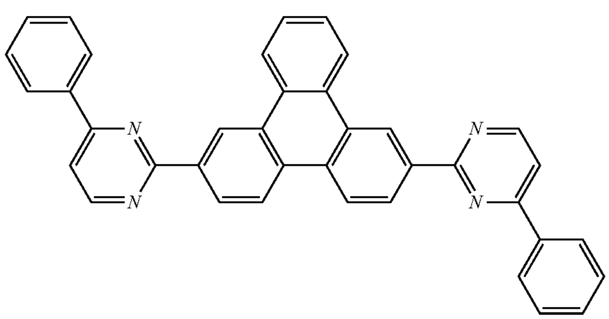
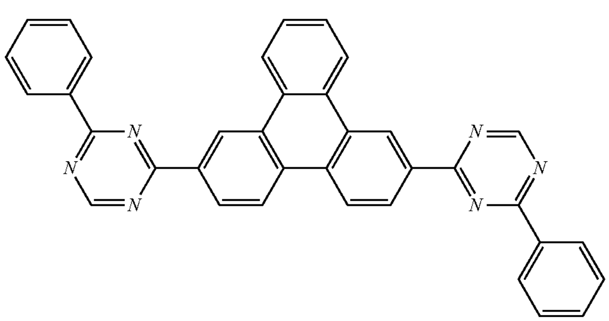

-continued
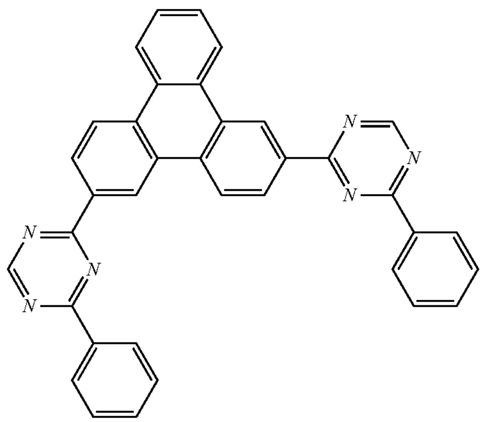
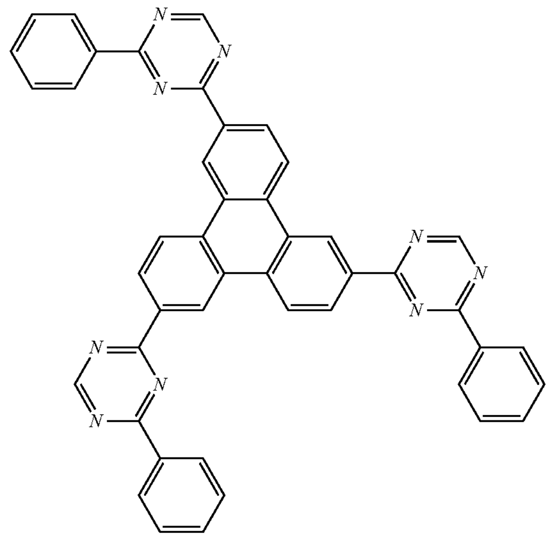
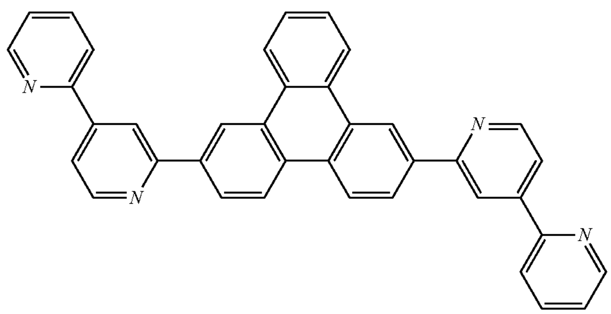
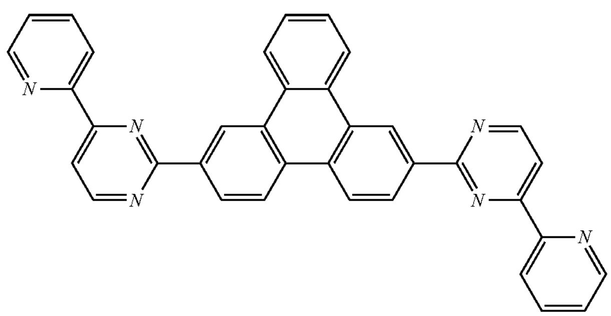
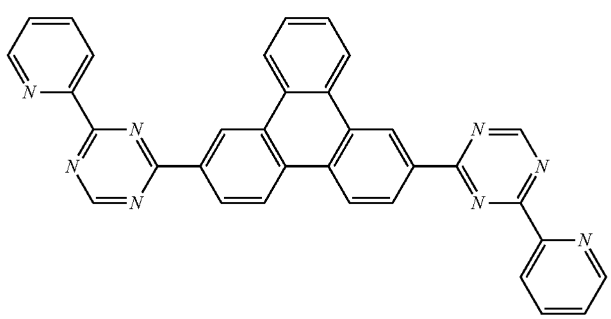

-continued
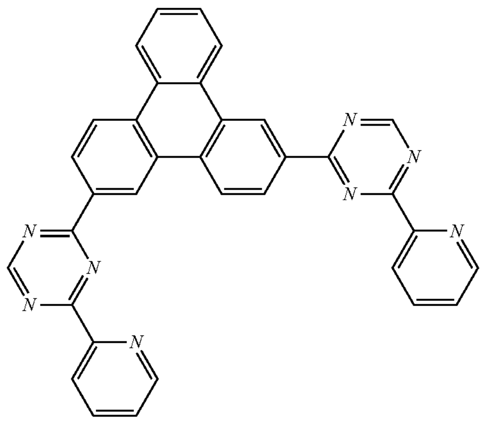
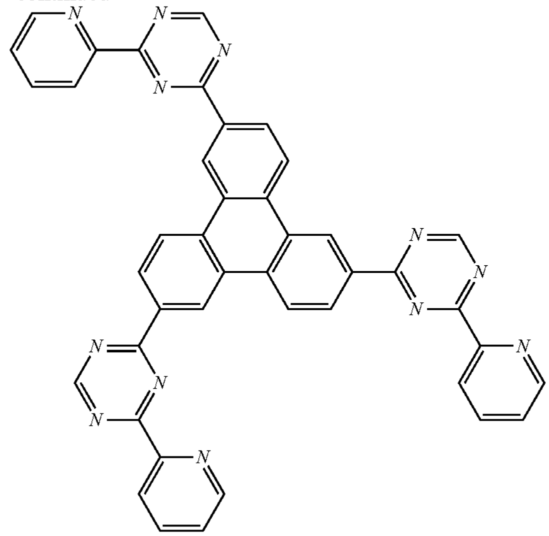
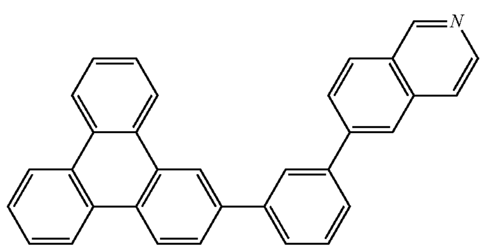
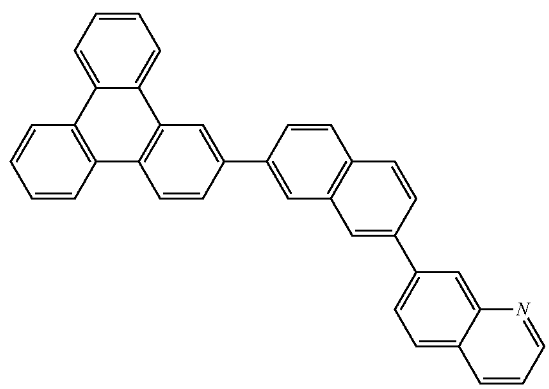
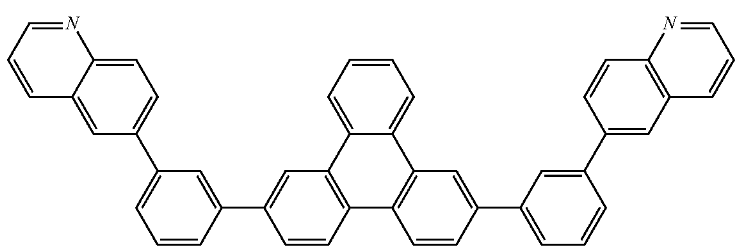
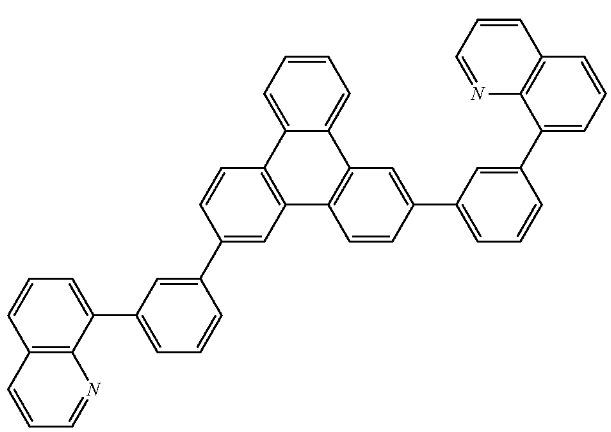

-continued
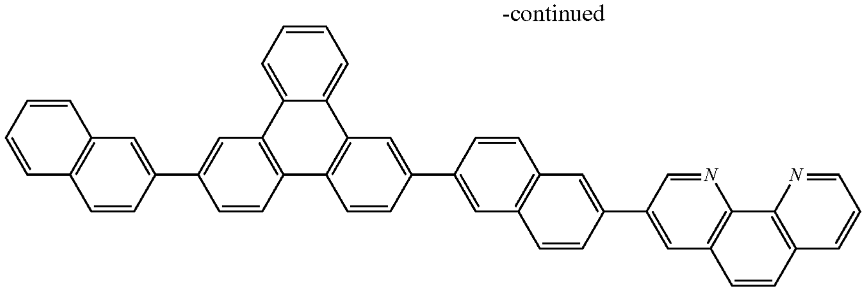
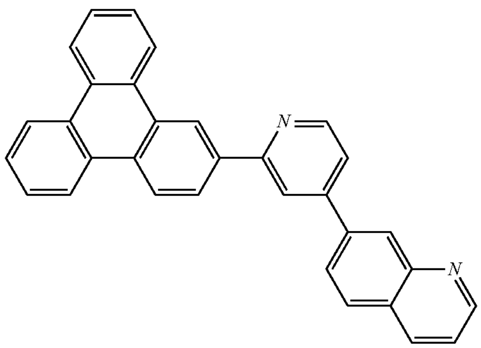
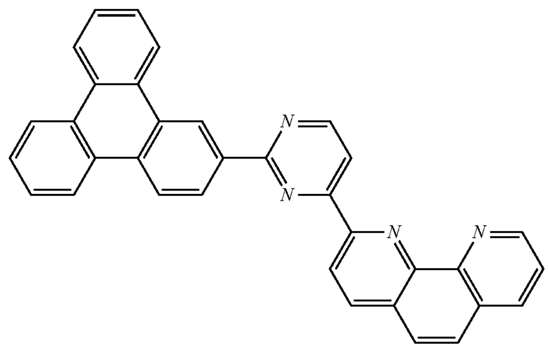
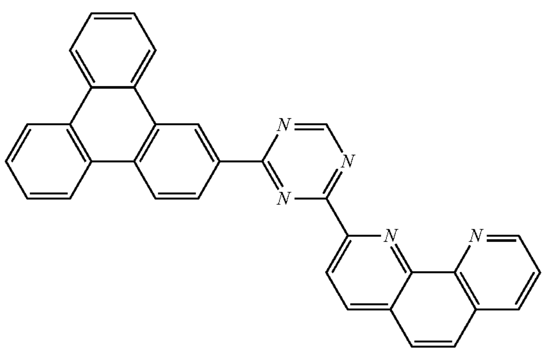
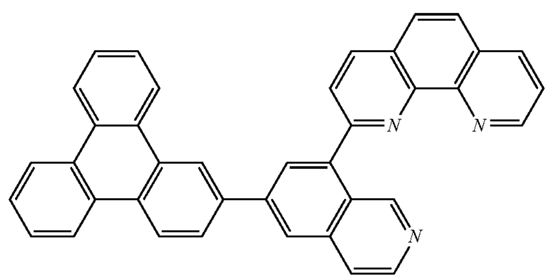
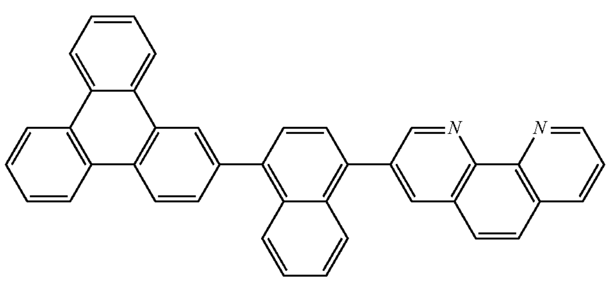
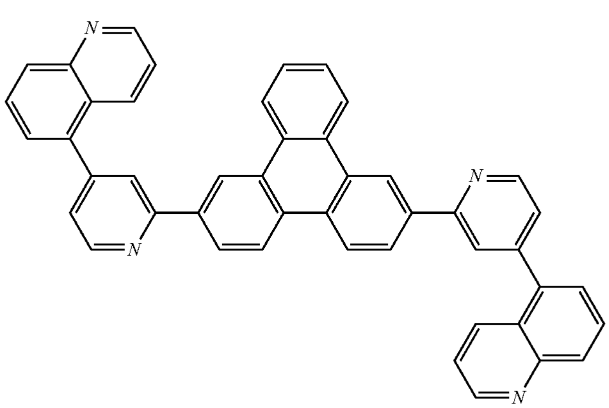

-continued
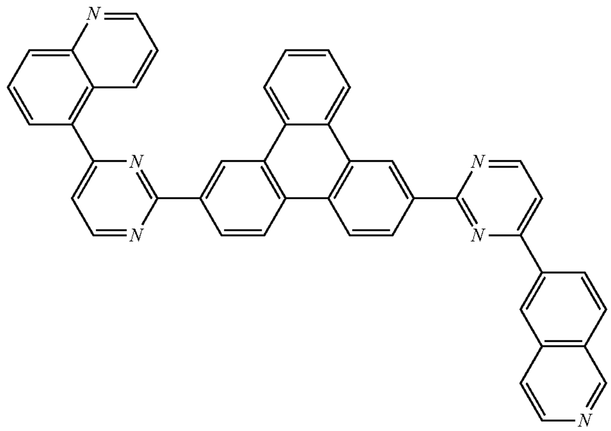
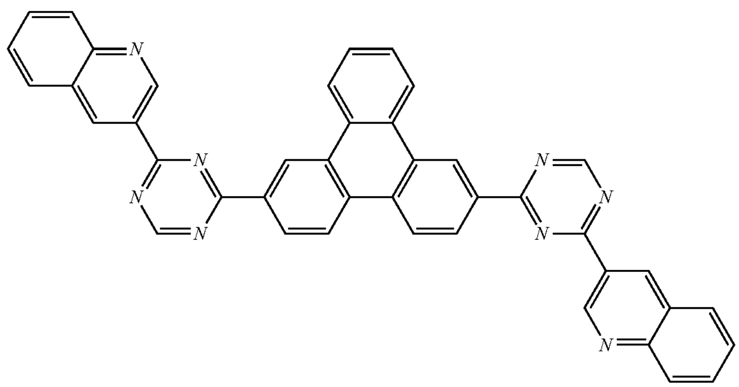
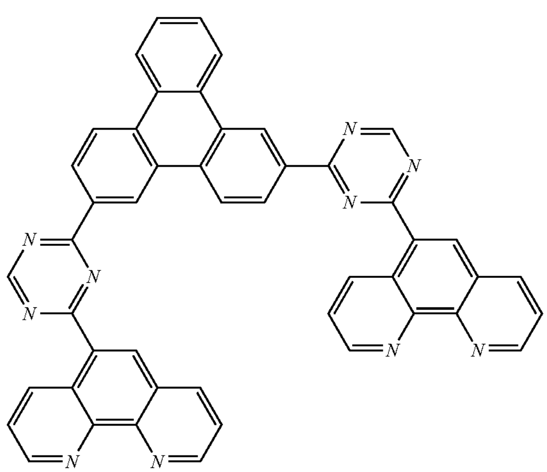

-continued
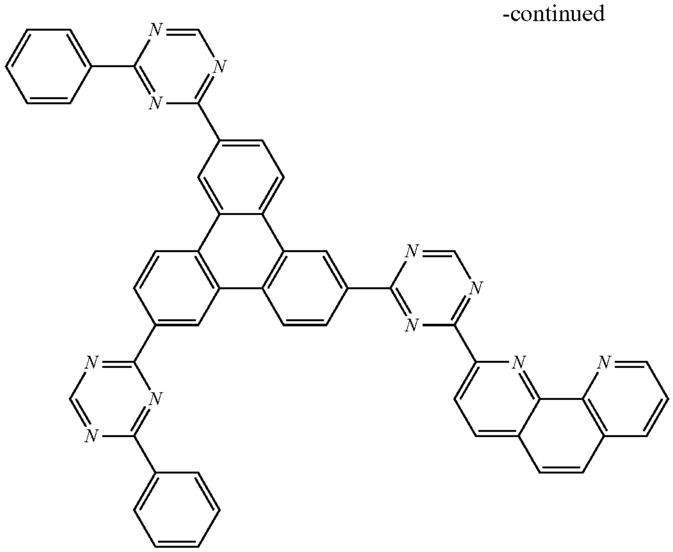
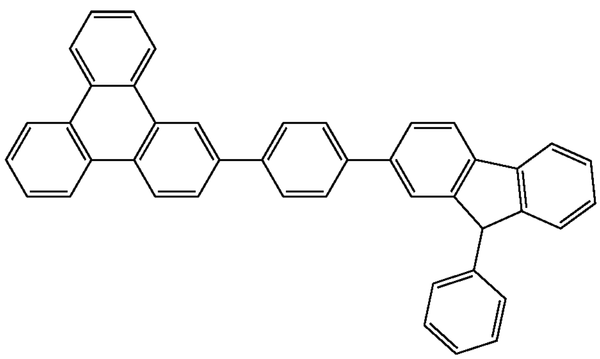
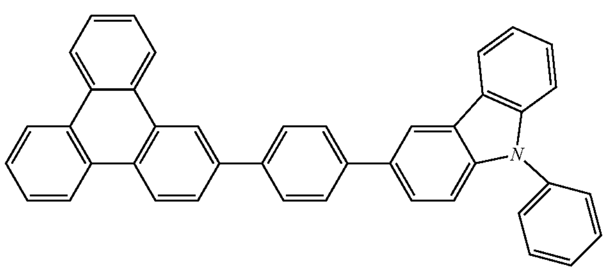
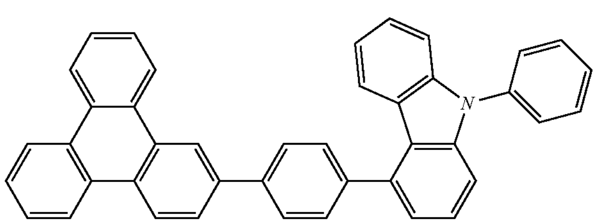
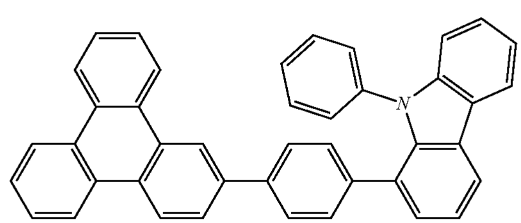

-continued
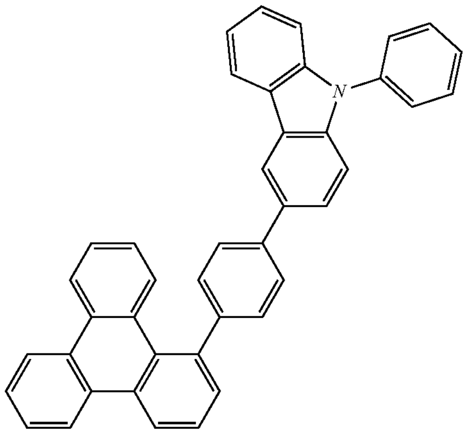
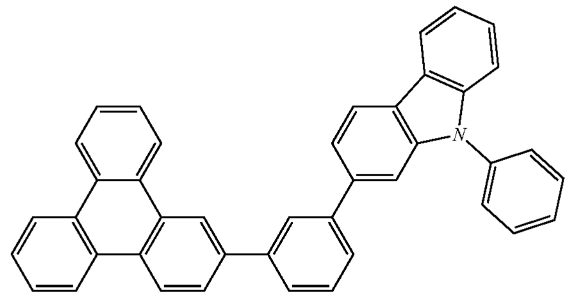
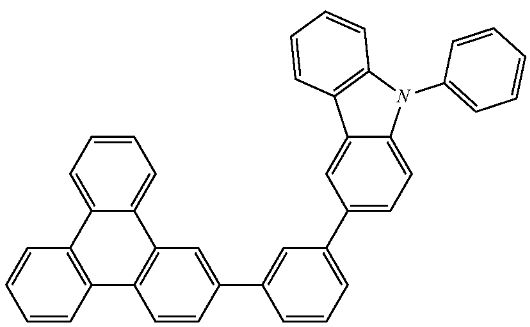
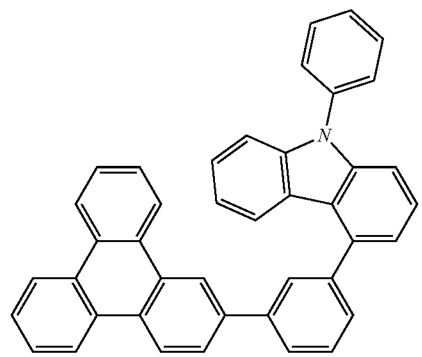
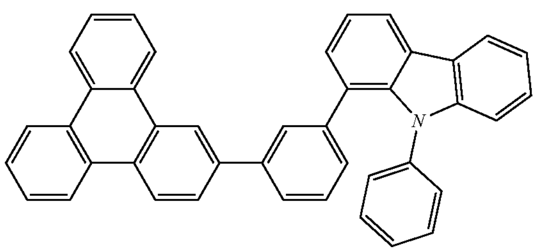
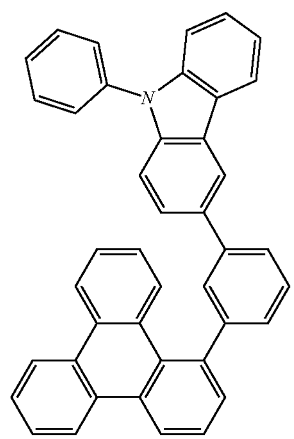
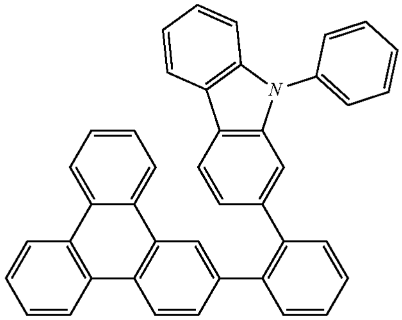
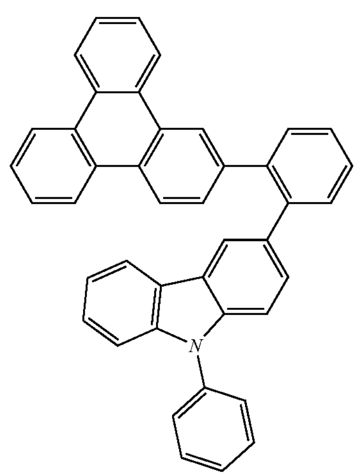

-continued
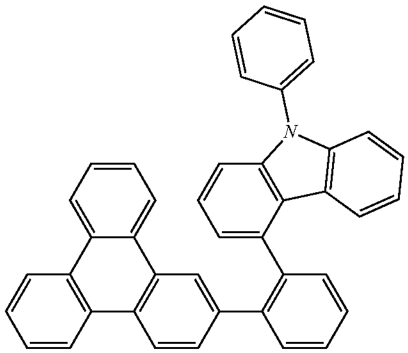
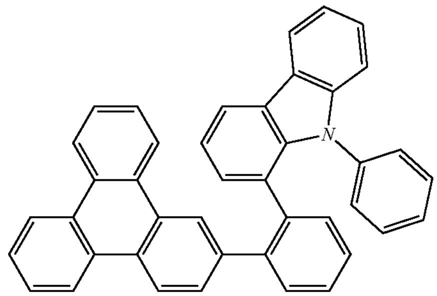
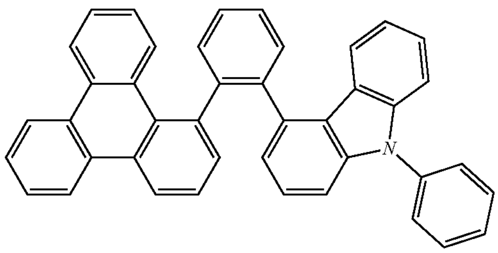
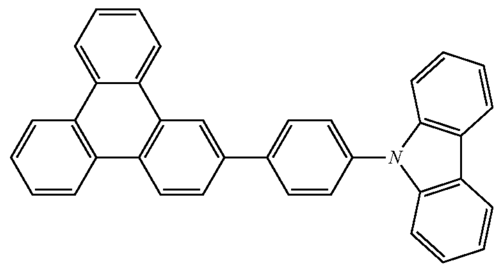
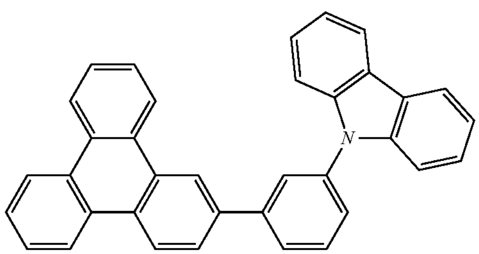
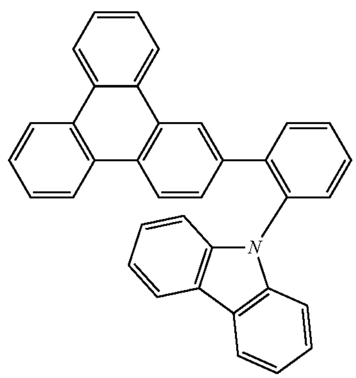
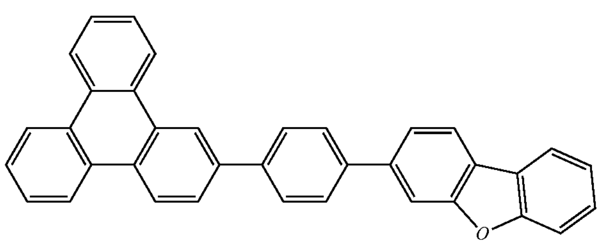
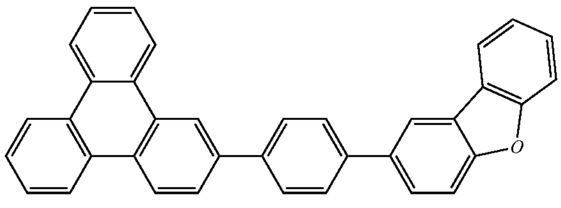
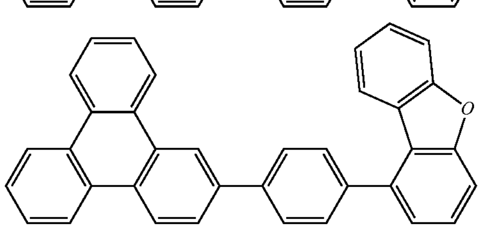
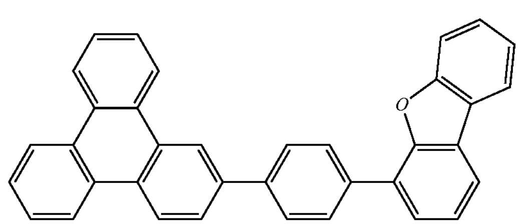

-continued
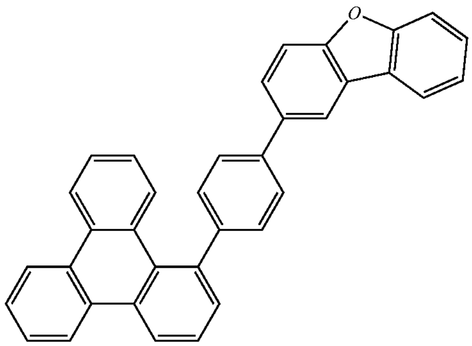
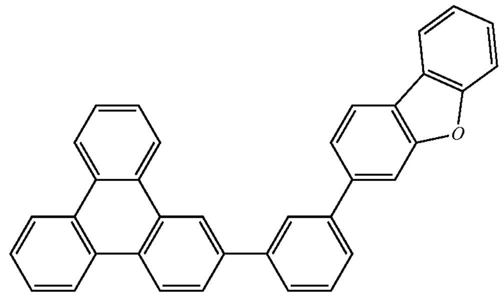
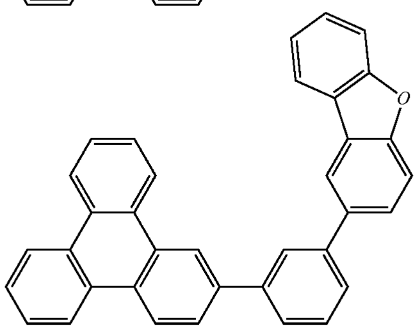
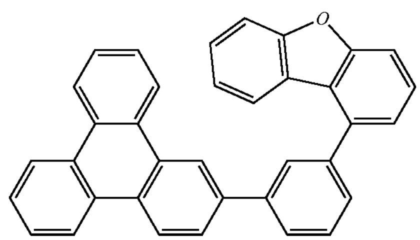
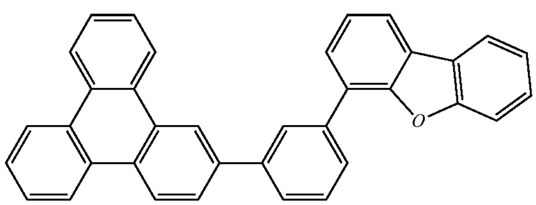
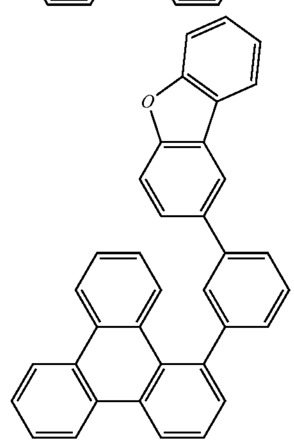
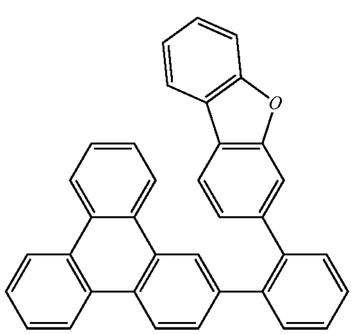
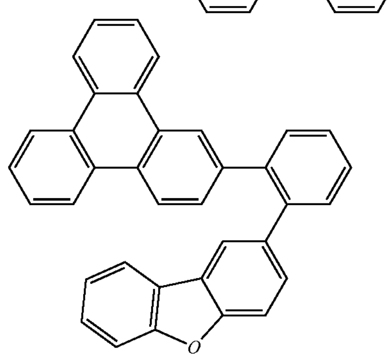
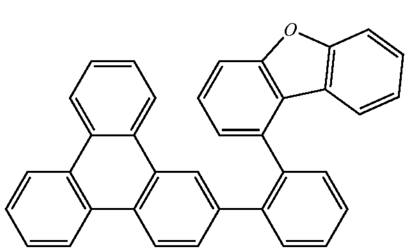
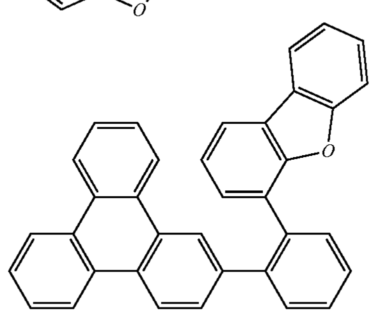

-continued
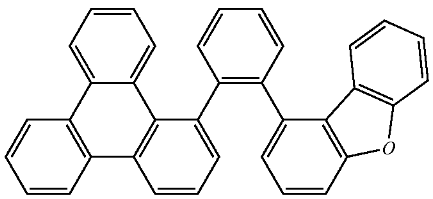
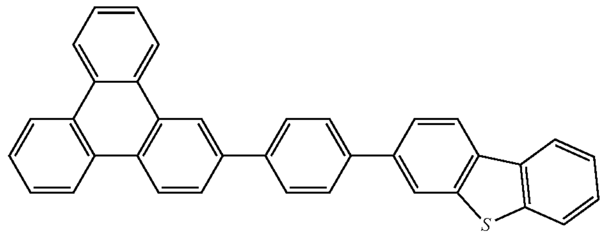
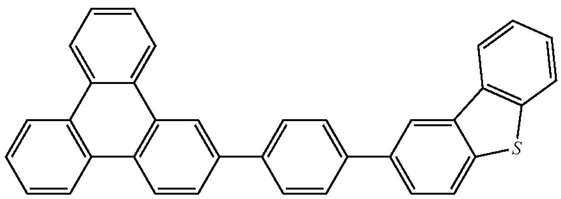
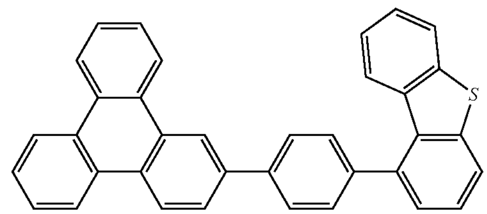
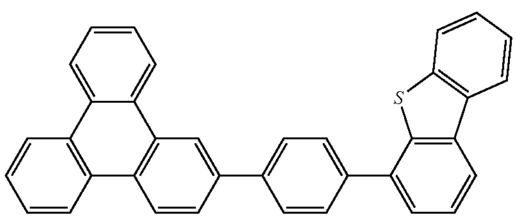
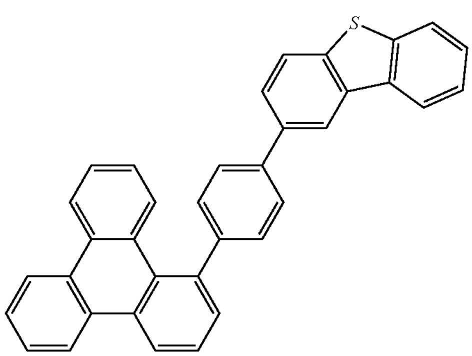
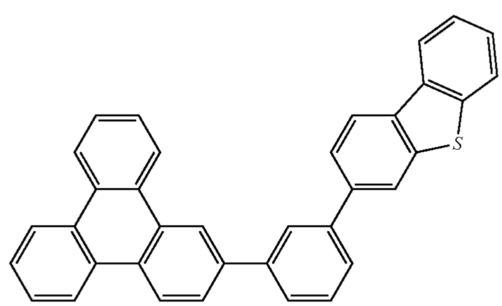
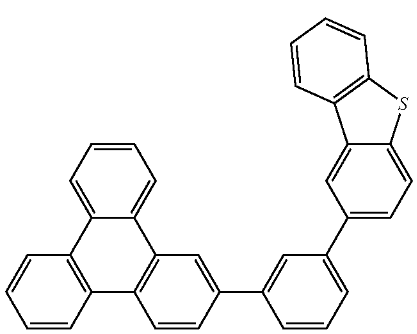
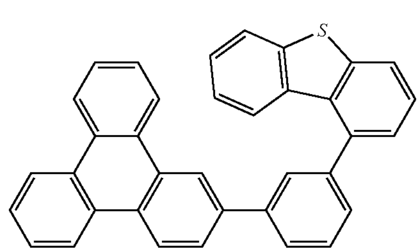

-continued
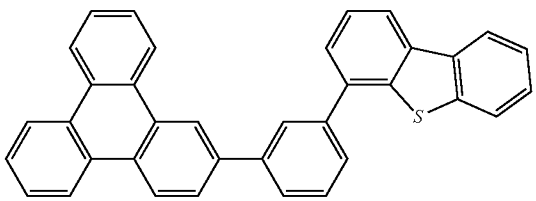
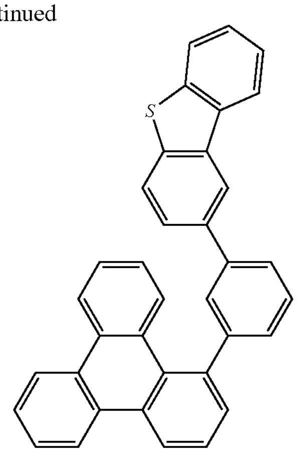
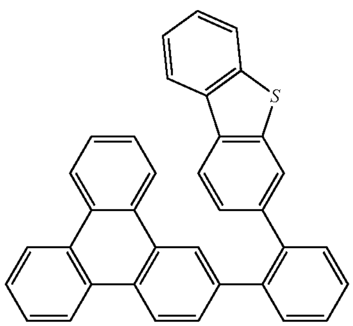
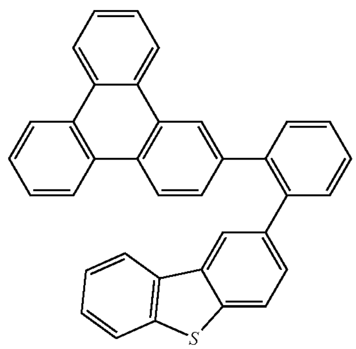
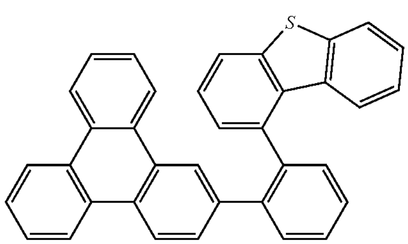
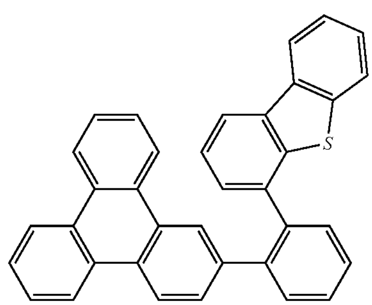
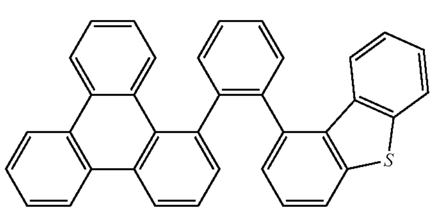
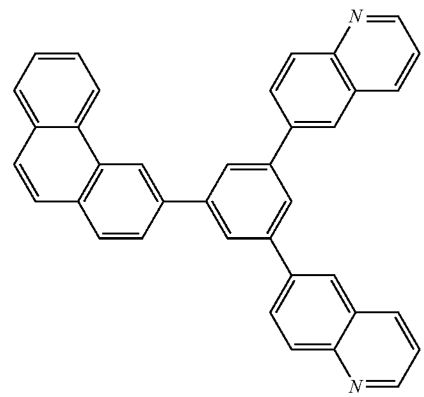

-continued
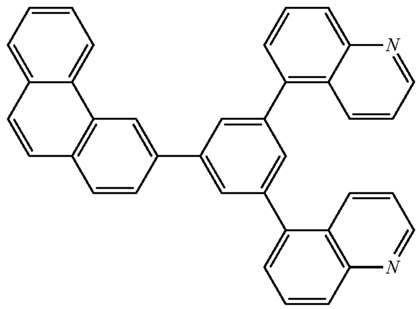
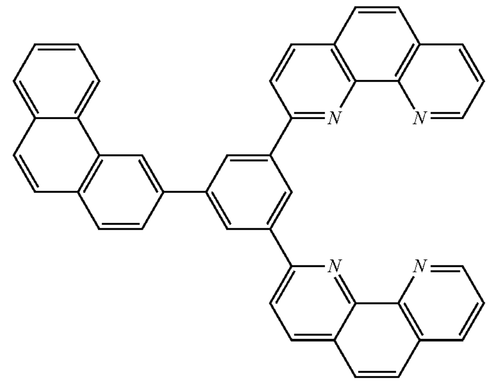
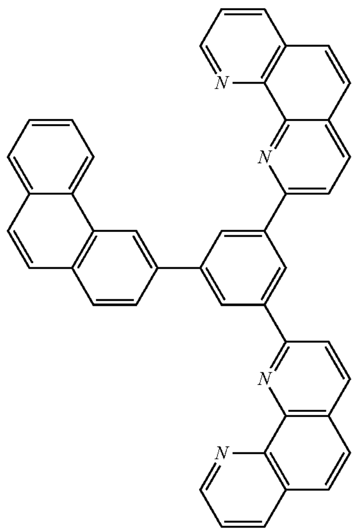
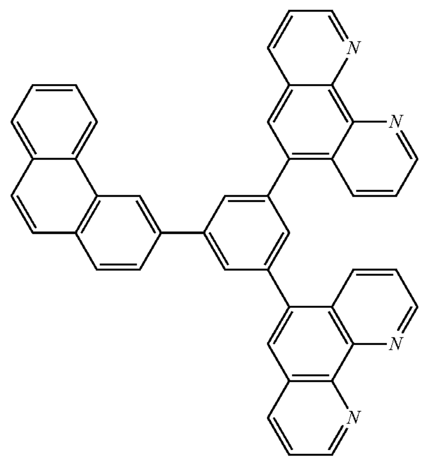
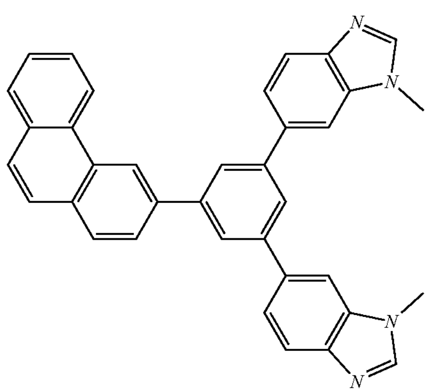
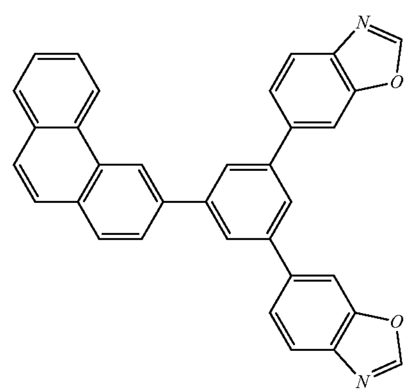
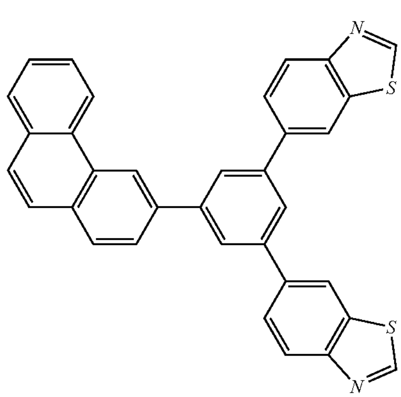
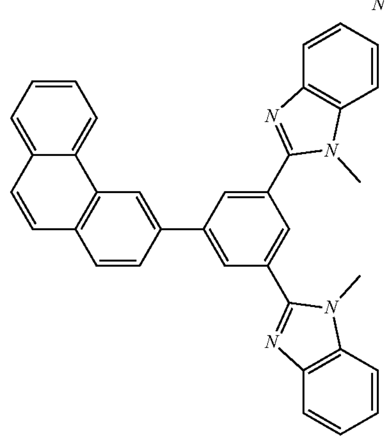

-continued
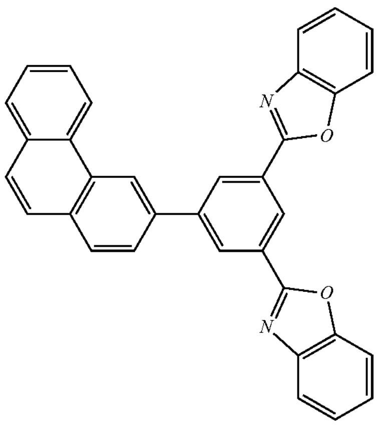
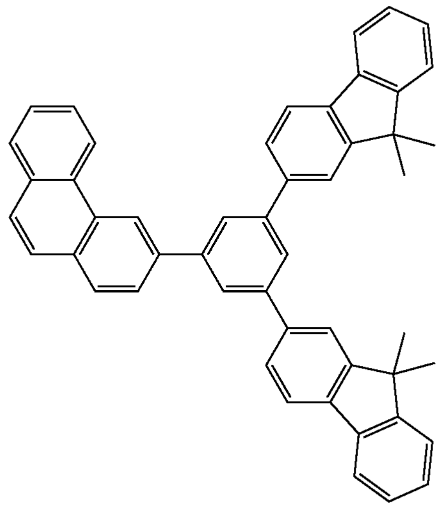
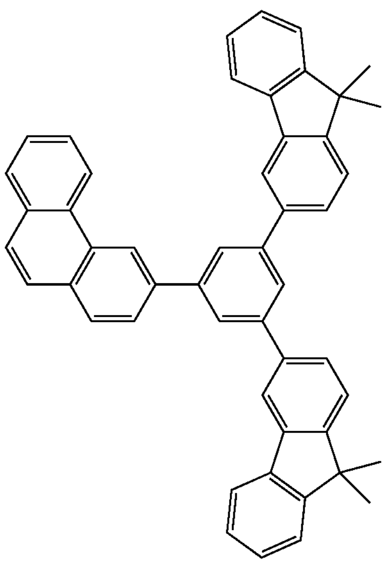
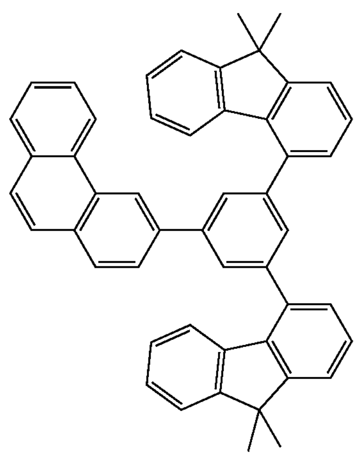
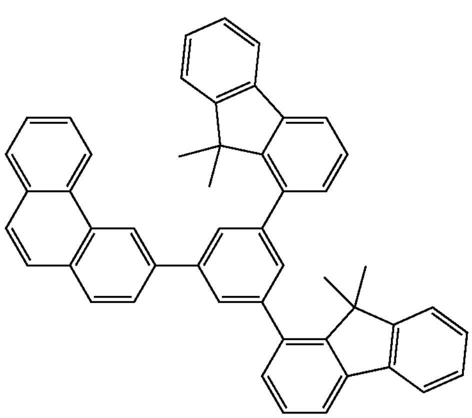
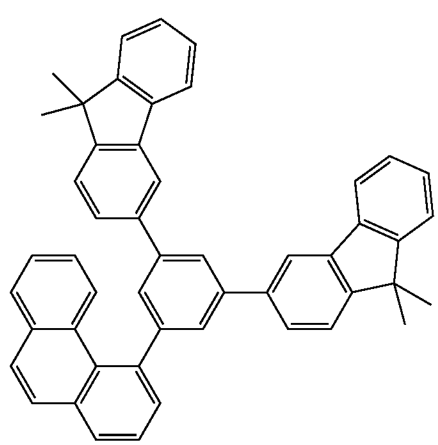

-continued
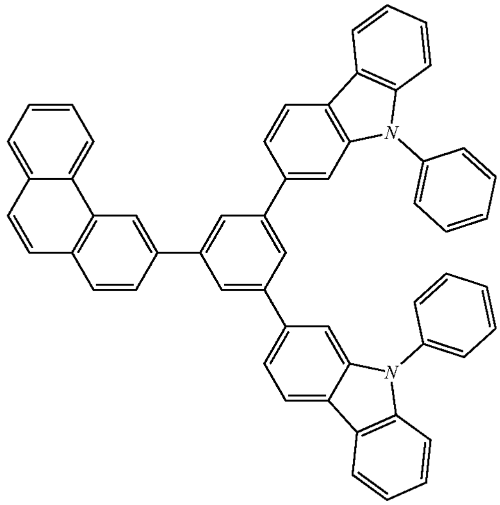
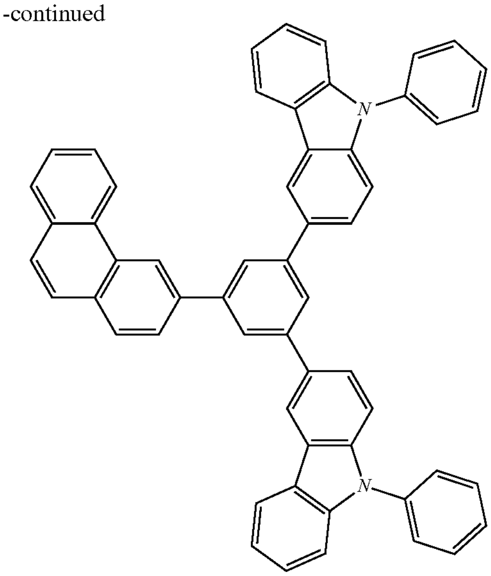
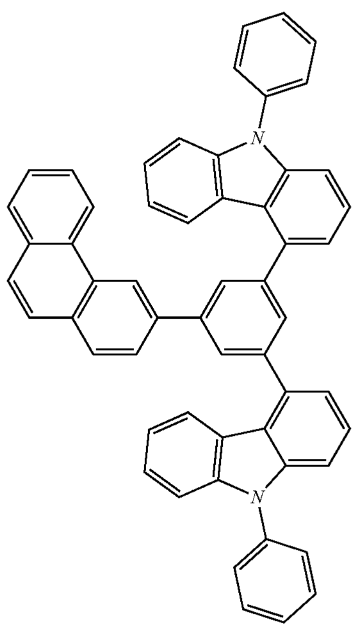
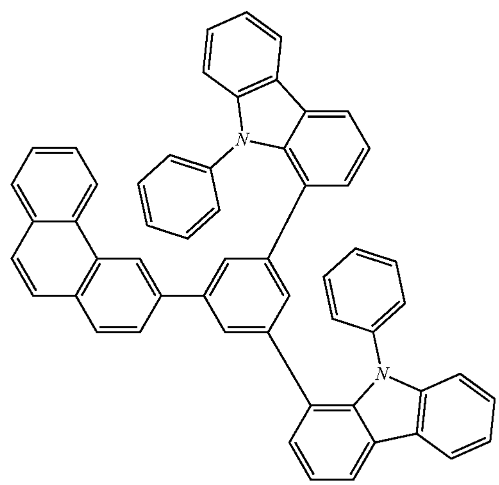
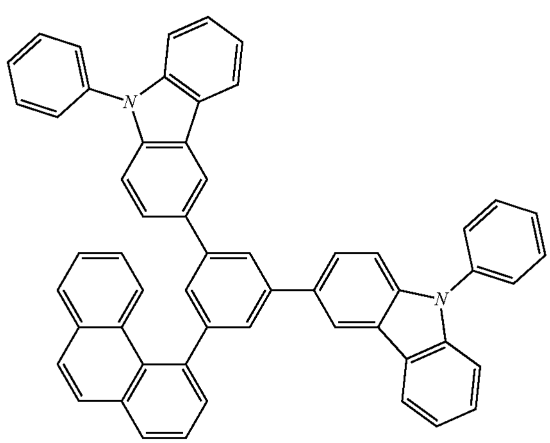
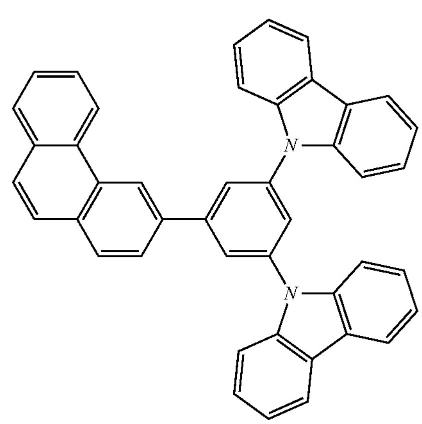

-continued
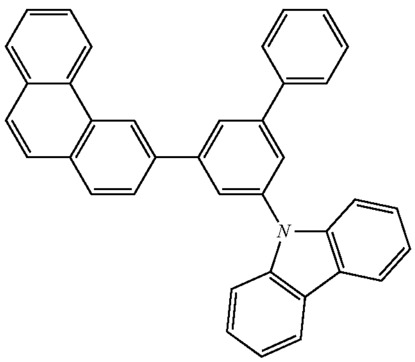
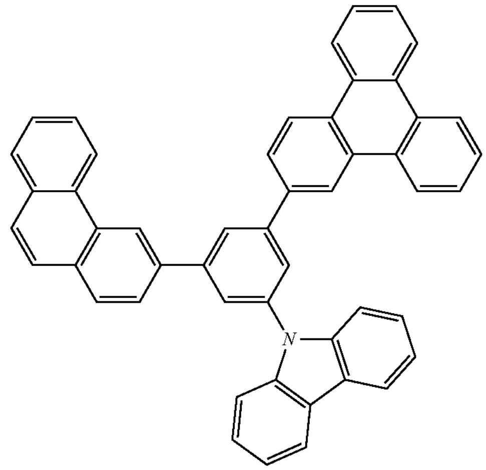
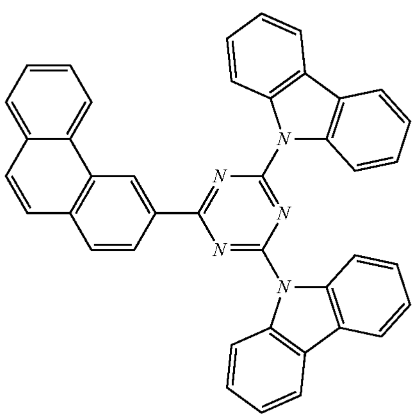
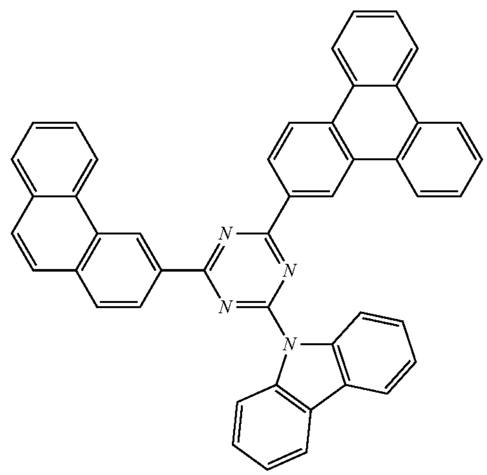
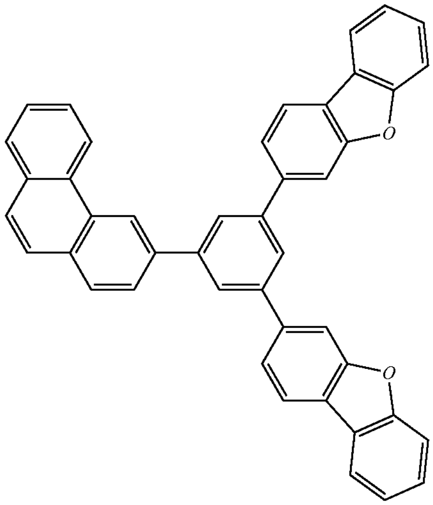
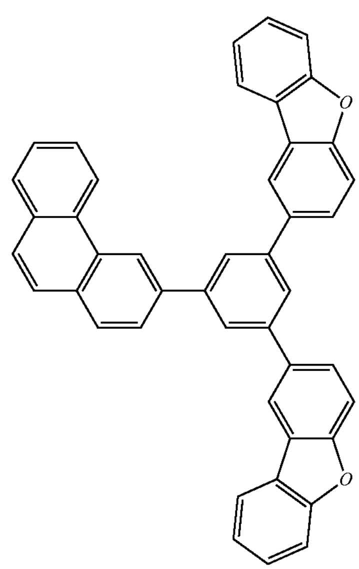

-continued
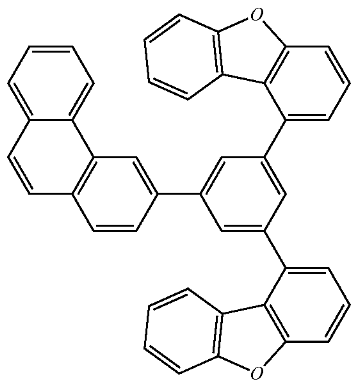
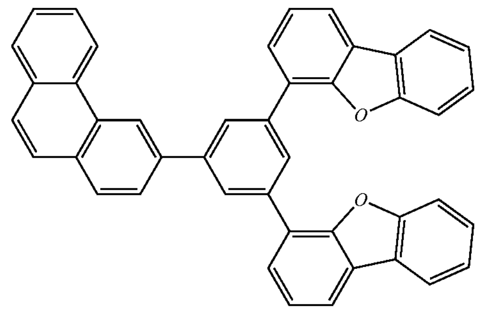
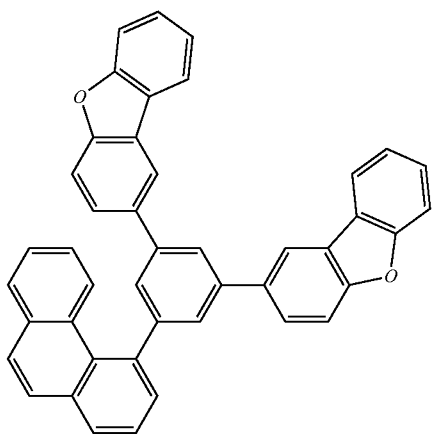
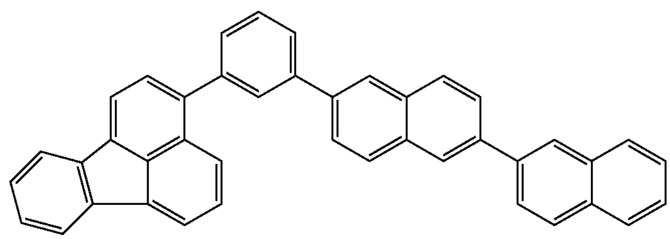
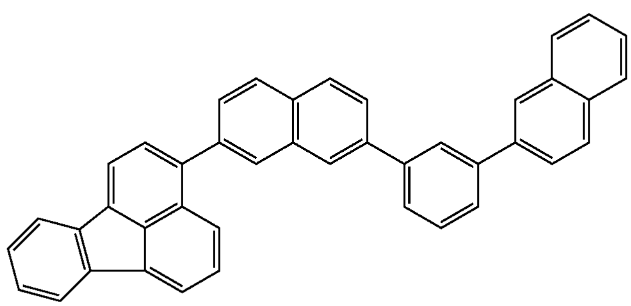
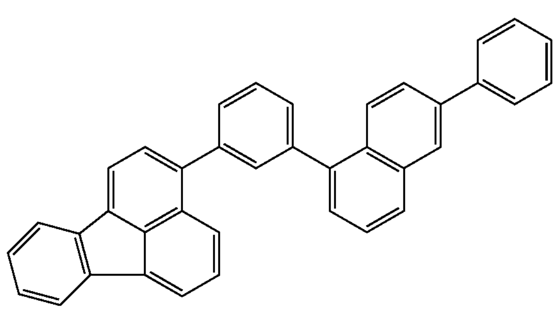
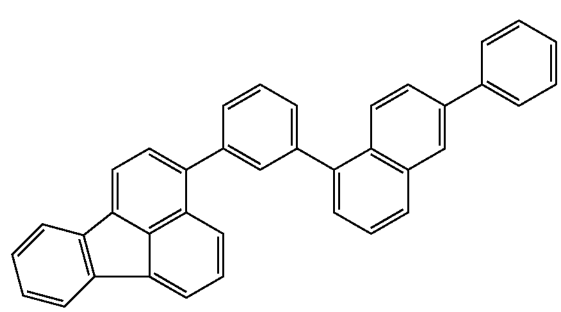

-continued
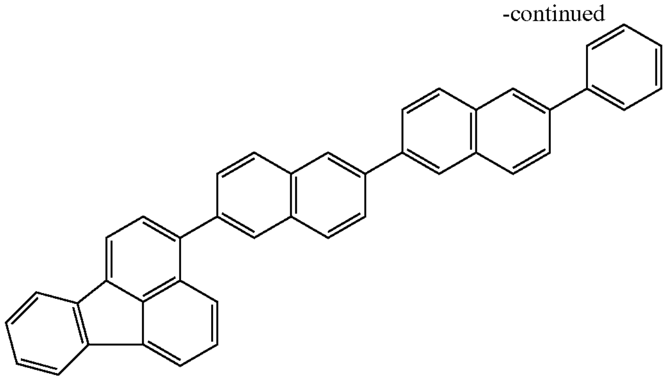
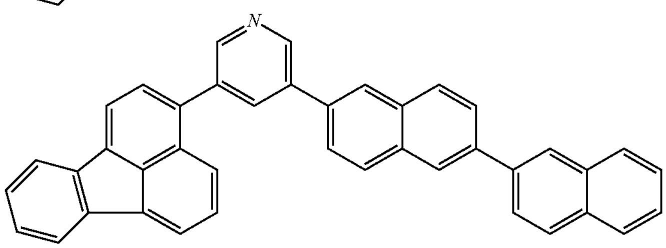
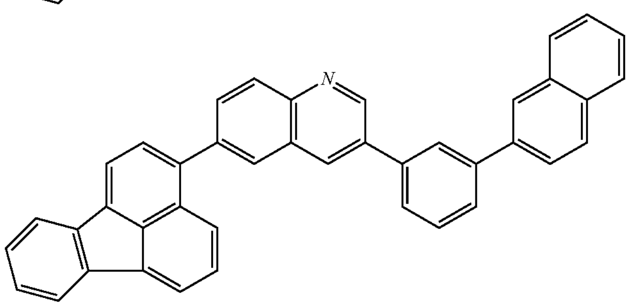
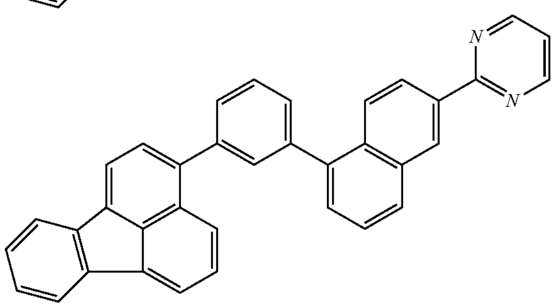
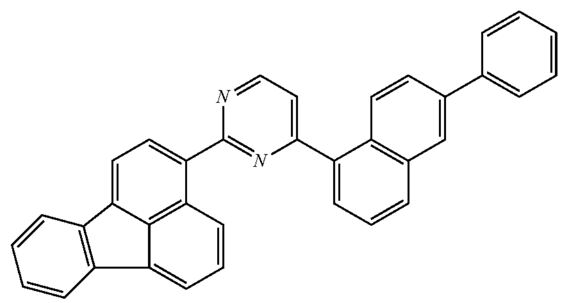
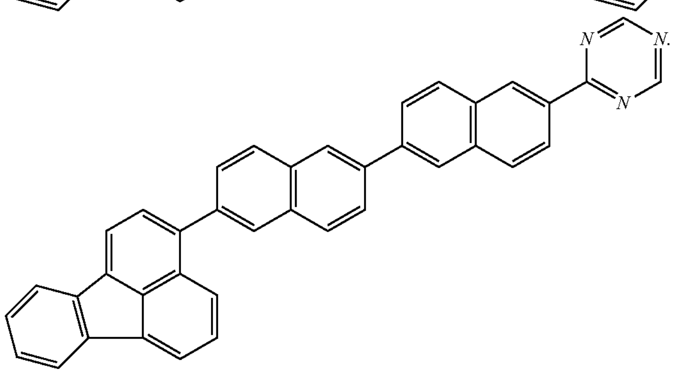
* * * * *